United States Patent
Ono et al.

(10) Patent No.: US 10,038,143 B2
(45) Date of Patent: Jul. 31, 2018

(54) POLYMER COMPOUND, MATERIAL FOR ELECTRONIC ELEMENTS, MATERIAL FOR ORGANIC ELECTROLUMINESCENT ELEMENTS, AND ORGANIC ELECTROLUMINESCENT ELEMENT

(71) Applicant: IDEMITSU KOSAN CO., LTD., Chiyoda-ku (JP)

(72) Inventors: Hidetoshi Ono, Ichihara (JP); Hironori Kawakami, Katsushika-ku (JP); Shigeru Matsuo, Ichihara (JP); Kiyoshi Ikeda, Sodegaura (JP); Masahide Matsuura, Chiba (JP); Akinori Yomogita, Ichihara (JP); Mitsunori Ito, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 561 days.

(21) Appl. No.: 14/428,173

(22) PCT Filed: Sep. 13, 2013

(86) PCT No.: PCT/JP2013/074945
§ 371 (c)(1),
(2) Date: Mar. 13, 2015

(87) PCT Pub. No.: WO2014/042265
PCT Pub. Date: Mar. 20, 2014

(65) Prior Publication Data
US 2015/0249215 A1 Sep. 3, 2015

(30) Foreign Application Priority Data
Sep. 14, 2012 (JP) .................. 2012-203479

(51) Int. Cl.
| | | |
|---|---|---|
| C08G 73/06 | (2006.01) | |
| H01L 51/00 | (2006.01) | |
| C09K 11/06 | (2006.01) | |
| C08G 61/10 | (2006.01) | |
| C08G 61/02 | (2006.01) | |
(Continued)

(52) U.S. Cl.
CPC .......... *H01L 51/0039* (2013.01); *C08G 61/02* (2013.01); *C08G 61/10* (2013.01); *C08G 61/122* (2013.01); *C08G 73/0633* (2013.01); *C08G 73/0672* (2013.01); *C08G 73/0677* (2013.01); *C08G 73/0688* (2013.01); *C09D 165/00* (2013.01); *C09D 179/04* (2013.01); *C09K 11/06* (2013.01); *H01L 51/0035* (2013.01); *H01L 51/0043* (2013.01); *C08G 2261/149* (2013.01); *C08G 2261/1412* (2013.01); *C08G 2261/312* (2013.01); *C08G 2261/3142* (2013.01); *C08G 2261/3221* (2013.01); *C08G 2261/411* (2013.01); *C08G 2261/95* (2013.01); *C09K 2211/145* (2013.01); *C09K 2211/1416* (2013.01); *C09K 2211/1425* (2013.01); *C09K 2211/1458* (2013.01); *C09K 2211/1466* (2013.01); *C09K 2211/1475* (2013.01); *C09K 2211/1483* (2013.01);
(Continued)

(58) Field of Classification Search
CPC .. C08G 61/02; C08G 61/122; C08G 73/0677; C08G 73/0672; C08G 73/0633; C09D 165/00; C09K 11/06; H01L 51/0035; H01L 51/0039; H01L 51/0043; H01L 51/0072; H01L 51/5012; C07D 403/04; C07D 403/10
See application file for complete search history.

(56) References Cited

U.S. PATENT DOCUMENTS

| | | | |
|---|---|---|---|
| 6,368,732 B1 | 4/2002 | Jin et al. | |
| 2002/0093005 A1 | 7/2002 | Sohn et al. | |
(Continued)

FOREIGN PATENT DOCUMENTS

| | | |
|---|---|---|
| JP | 2001-114873 A | 4/2001 |
| JP | 2002-220439 A | 8/2002 |
(Continued)

OTHER PUBLICATIONS

International Search Report dated Dec. 3, 2013 in PCT/JP2013/074945 Filed Sep. 13, 2013.
(Continued)

*Primary Examiner* — Shane Fang
(74) *Attorney, Agent, or Firm* — Oblon, McClelland, Maier & Neustadt, L.L.P.

(57) ABSTRACT

Provided are a polymer compound, which comprises a copolymer containing at least a unit B, and a unit A and/or a unit C referring to repeating units A, B and C, and which has a weight-average molecular weight of from 50,000 to 1,500,000; a material for electronic devices and a material for organic electroluminescent devices comprising the compound; an organic electroluminescent device having an anode, a cathode and an organic thin film layer, wherein at least one organic thin film layer contains the polymer compound; a coating liquid containing the polymer compound and a solvent; and a method for producing an organic electroluminescent device using the coating liquid. Also provided is a polymer compound suitable to a coating method; a material for electronic devices and a material for organic electroluminescent devices comprising the compound; and an organic EL device, a coating liquid and a method for producing an organic EL device using the compound.

12 Claims, No Drawings

(51) Int. Cl.
  *C08G 61/12* (2006.01)
  *C09D 165/00* (2006.01)
  *C09D 179/04* (2006.01)
  *H01L 51/50* (2006.01)
  *H01L 51/56* (2006.01)

(52) U.S. Cl.
  CPC .. *C09K 2211/1491* (2013.01); *H01L 51/0003* (2013.01); *H01L 51/5016* (2013.01); *H01L 51/56* (2013.01)

(56) References Cited

U.S. PATENT DOCUMENTS

| | | |
|---|---|---|
| 2004/0062930 A1 | 4/2004 | Roberts et al. |
| 2006/0155106 A1 | 7/2006 | Roberts et al. |
| 2011/0284929 A1* | 11/2011 | Mori .................. H01L 27/1463 257/231 |
| 2013/0193840 A1 | 8/2013 | Soga et al. |
| 2013/0200349 A1 | 8/2013 | Soga et al. |

FOREIGN PATENT DOCUMENTS

| | | |
|---|---|---|
| JP | 2005-309898 A | 11/2005 |
| JP | 2006-514148 A | 4/2006 |
| JP | 2007-119763 A | 5/2007 |
| JP | 2007-277306 A | 10/2007 |
| JP | 2008-031420 A | 2/2008 |
| JP | 2010-196040 A | 9/2010 |
| WO | WO 2007/133632 A2 | 11/2007 |
| WO | WO 2012/008493 A1 | 1/2012 |

OTHER PUBLICATIONS

Michelle S. Liu, et al., "Development of large band gap host materials for high-energy phosphorescent emitters", Polymeric Materials: Science & Engineering, vol. 92, 2005, pp. 566-567.

Fei Huang, et al., "High-efficiency and color stable blue-light-emitting polymers and devices", Advanced Functional Materials, vol. 17, No. 18, 2007, pp. 3808-3815.

* cited by examiner

POLYMER COMPOUND, MATERIAL FOR ELECTRONIC ELEMENTS, MATERIAL FOR ORGANIC ELECTROLUMINESCENT ELEMENTS, AND ORGANIC ELECTROLUMINESCENT ELEMENT

TECHNICAL FIELD

The present invention relates to a polymer compound, a material for electronic devices and a material for organic electroluminescent devices (hereinafter abbreviated to organic EL devices in some cases) comprising the compound, and to an organic EL device, a coating liquid and a method for producing organic EL devices.

BACKGROUND ART

With respect to electronic devices including organic EL devices, heretofore, in general, a film that contains a material to constitute the electronic device has been formed according to a vapor deposition method. On the other hand, it is also investigated to form a film according to a coating method, but it is in a situation in which a material sufficiently suitable for a coating liquid could not as yet been realized.

For example, there is known a fluorene-carbazole copolymer as described in PTL 1 and NPL 1. The polymer has a small weight-average molecular weight and therefore has a problem in that, when it is used in a coating method, devices are difficult to produce.

Similarly, PTL 2 describes use of a polymer compound having a repeating unit where triazine and carbazole bond directly or indirectly, in a coating method, and PTL 3 describes use of a charge-transporting polymer having a repeating unit in which fluorene and phenylcarbazole bond via a nitrogen atom, also in a coating method.

On the other hand, a polymer compound suitable to a coating method and capable of providing high-performance electronic devices has been desired.

CITATION LIST

Patent Literature

PTL 1: WO2007/133632
PTL 2: JP-A 2010-196040
PTL 3: JP-A 2005-309898

Non-Patent Literature

NPL 1: Polymeric Materials; Science & Engineering 2005, 92, 566

SUMMARY OF INVENTION

Technical Problem

The present invention has been made for solving the above-mentioned problems, and the object thereof is to provide a polymer compound suitable for forming a film by a coating liquid, a material for electronic devices and a material for organic EL devices comprising the compound, as well as an organic EL device, a coating liquid and a method for producing organic EL devices.

Solution to Problem

The present inventors have assiduously studied for the purpose of attaining the above-mentioned object and, as a result, have found that a novel polymer compound which essentially has a repeating unit (unit B) having charge transportability and represented by the following formula (1) or formula (2) and which has, in the main chain thereof, a repeating unit (unit A) that contributes toward solubility improvement and/or a repeating unit (unit C) that contributes toward viscosity improvement, is suitable for a coating method, and have completed the present invention.

Specifically, the present invention provides a polymer compound, which comprises a copolymer at least containing a unit B, and a unit A and/or a unit C referring to the following units A, B and C, and which has a weight-average molecular weight of from 50,000 to 1,500,000.

In the case where the copolymer contains the units A, B and C, the unit A, the unit B and the unit C differ in point of the structure thereof. In the case where the copolymer contains the unit B, and the unit A and/or the unit C, the unit B, and the unit A and/or the unit C differ in point of the structure thereof.

The unit A is a unit containing, in the main chain thereof, a group selected from an aromatic hydrocarbon cyclic group and an aromatic heterocyclic group, and these groups may be substituted.

The unit B is a unit represented by the following formula (1) or (2).

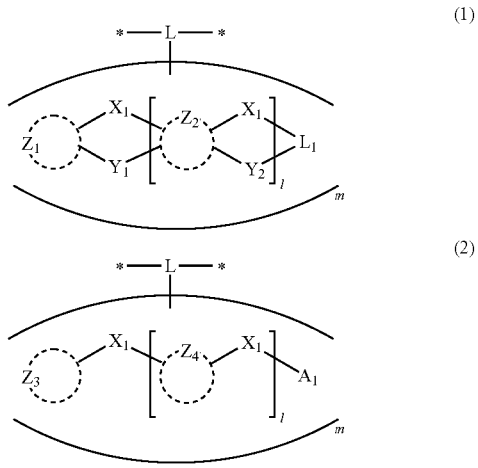

(In the formulae (1) and (2), * indicates the position at which the formula bonds to the unit A, B or C.

L represents a group constituting the polymer main chain while bonding the structure of the formula (1) or the formula (2) except L (parenthesized structure of the formula (1) or the formula (2)) and the polymer main chain, and is a substituted or unsubstituted aromatic hydrocarbon cyclic group, a substituted or unsubstituted aromatic heterocyclic group, or a combination thereof. However, when L is an aromatic heterocyclic group containing an N atom, the number of the N atoms in the atoms constituting one ring of the group is 1 or 2.

$X_1$, $X_2$, $Y_1$ and $Y_2$ each represent a single bond, $CR^1_2$, $NR^1$, O, S, or $SiR^1_2$, $R^1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group, $L_1$ represents a substituted or unsubstituted linking group, $Z_1$, bonding to $X_1$ and $Y_1$, and $Z_4$, bonding to $X_1$ and $X_2$, each represent a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, $Z_2$, bonding to $X_1$, $X_2$, $Y_1$ and $Y_2$, represents a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, $Z_3$, bonding to $X_1$, represents a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, $A_1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group, the formula bonds to L at any of $X_1$, $X_2$, $Y_1$, $Y_2$, $L_1$, and $Z_1$ to $Z_4$.

l indicates an integer of from 0 to 5, when l is 2 or more, the parenthesized moieties may be the same or different, m indicates an integer of from 1 to 50, and when m is 2 or more, the parenthesized moieties may be the same or different.)

The above unit C is a unit constituting the polymer main chain and represented by the following formula (3), (4) or (5). In the case of the formula (5), the formula bonds to the neighboring unit at any of $Z_5$, $Z_6$, $X_3$ and $Y_3$.

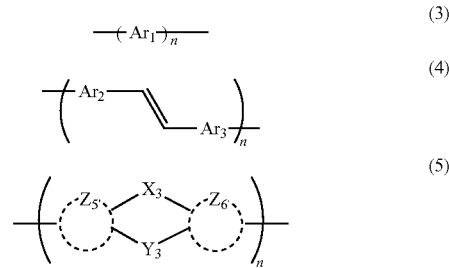

(In the formulae, $Ar_1$ to $Ar_3$ each represent a substituted or unsubstituted aromatic hydrocarbon cyclic group, or a substituted or unsubstituted aromatic heterocyclic group, $X_3$ and $Y_3$ each represent a single bond, $CR^1_2$, $NR^1$, O, S, or $SiR^1_2$, $R^1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group, $Z_5$ and $Z_6$ each represent a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, n indicates an integer of from 1 to 50, and when n is 2 or more, the parenthesized moieties may be the same or different.)

In addition, the present invention also provides a material for electronic devices and a material for organic EL devices that comprises the above-mentioned polymer compound, an organic EL device having an anode, a cathode and an organic thin film layer, and containing the above-mentioned polymer compound in at least one organic thin film layer, a coating liquid containing the above-mentioned polymer compound and a solvent, and a method for producing organic EL devices, which comprises using the above-mentioned coating liquid.

Advantageous Effects of Invention

The polymer compound of the present invention has a weight-average molecular weight and a viscosity suitable for use in a coating method, and is therefore suitable as a material for electronic devices, especially a material for organic EL devices to be used in a coating method, and can form a film necessary for constituting an organic electronic device according to a coating method.

DESCRIPTION OF EMBODIMENTS

The polymer compound of the present invention is a copolymer at least containing, as repeating units of the main chain thereof each having a different structure, the unit B, and the unit A and/or the unit C referring to the following unit A, unit B and unit C, and has a weight-average molecular weight of from 50,000 to 1,500,000.

The unit A is described below. The unit A is a unit for improving the solubility of the copolymer in an organic solvent such as toluene, xylene, anisole, etc.

The unit A is selected from an aromatic hydrocarbon cyclic group and an aromatic heterocyclic group from the viewpoint of securing the charge transportability. Preferably, these groups have a substituent from the viewpoint of solubility improvement.

The aromatic hydrocarbon cyclic group is preferably one having a ring carbon atoms of from 6 to 30, and the specific examples include phenylene group, a biphenylene group, various terphenylene groups, a fluorenylene group, etc. Of those, especially preferred are a phenylene group and a fluorenylene group.

The aromatic heterocyclic group is preferably one having a ring atoms of from 5 to 30, and the specific examples include a residue of a carbazole ring, a dibenzofuran ring, a dibenzopyran rind, a phenothiazine ring, a phenoxazine ring, etc.

As the unit A, also preferred are the following structures.

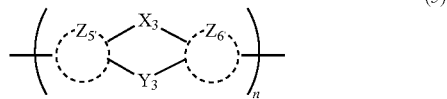

$Ar_1$ is a repeating unit to constitute the main chain, and represents an aromatic hydrocarbon cyclic group having a substituent. The substituent includes a substituted or unsubstituted, linear or branched alkyl group having a carbon number of from 1 to 20, a substituted or unsubstituted cycloalkyl group having a ring carbon atoms of from 3 to 16, a substituted or unsubstituted alkyl ether group having a carbon number of from 1 to 20, a substituted or unsubstituted alkoxy group having a carbon number of from 1 to 20, a substituted or unsubstituted cycloalkoxy group having a ring carbon atoms of from 3 to 10, and a substituted silyl group substituted with an alkyl group and/or an aryl group.

$X_3$ and $Y_3$ each represent a single bond, $CR^2{}_2$, $NR^2$, O, S, or $SiR^2{}_2$, $R^2$ represents a substituted or unsubstituted, linear or branched alkyl group having a carbon number of from 1 to 20, a substituted or unsubstituted cycloalkyl group having a ring carbon atoms of from 3 to 16, a substituted or unsubstituted alkyl ether group having a carbon number of from 1 to 20, a substituted or unsubstituted alkoxy group having a carbon number of from 1 to 20, a substituted or unsubstituted cycloalkoxy group having a ring carbon atoms of from 3 to 10, or a substituted silyl group substituted with an alkyl group and/or an aryl group.

In the case of the formula (5), the formula bonds to the neighboring repeating unit at any of $Z_5$, $Z_6$, $X_3$ and $Y_3$ to form the main chain. $Z_5$ and $Z_6$ each represent a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group.

As specific examples of the above-mentioned groups, there are mentioned the groups mentioned above, or the groups to be mentioned hereinunder in the section of describing the unit A.

As specific examples of these structures, preferably mentioned are the following structures.

In the following structures, the wavy line indicates a bond. The wavy line shown separately below means that the bond may be at any position of the ring. R represents a substituent, and the formula may have plural substituents.

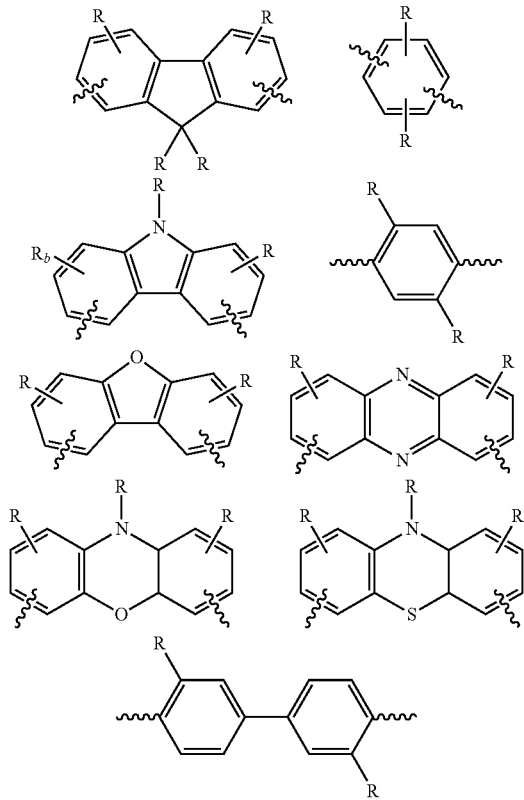

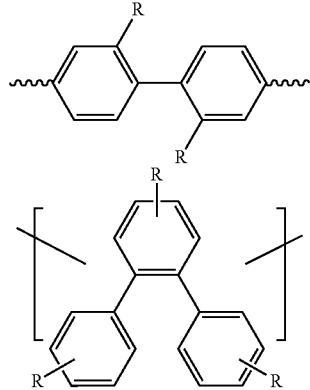

In the unit A, examples of the substituent (R) with which the aromatic hydrocarbon cyclic group and the aromatic heterocyclic group may be substituted include a substituted or unsubstituted, linear or branched alkyl group having a carbon number of from 1 to 20, a substituted or unsubstituted cycloalkyl group having a ring carbon atoms of from 3 to 16, a linear or branched alkyl ether group having a carbon number of from 1 to 20, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 10, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 3 to 30, a substituted or unsubstituted alkylamino group, a substituted or unsubstituted arylamino group, a substituted silyl group substituted with one or more selected from alkyl and aryl, a halogen atom, a nitro group, a cyano group, and a hydroxyl group.

In this description, "a carbon number of from a to b" in the expression of "a substituted or unsubstituted group XX having a carbon number of from a to b" (including the expression that is substantially the same as above) does not contain the carbon number of the substituent when the group XX is substituted therewith.

From the viewpoint of solubility improvement, preferred are an alkyl group and a bulky group. Concretely, preferred are a substituted or unsubstituted linear or branched alkyl group having a carbon number of from 1 to 20, a substituted or unsubstituted cycloalkyl group having a ring carbon atoms of from 3 to 16, an alkyl group having a carbon number of from 1 to 4 and having one or more phenyl groups, a cycloalkyl group having a ring carbon atoms of from 3 to 16 which is substituted with an alkyl group having a carbon number of from 1 to 6 or is unsubstituted, a linear or branched alkyl ether group having a carbon number of from 1 to 20, and a substituted silyl group substituted with one or more groups selected from alkyl and aryl.

Examples of the linear or branched alkyl group having a carbon number of from 1 to 20 include a methyl group, an ethyl group, an n-propyl group, an isopropyl group, an n-butyl group, an isobutyl group, a sec-butyl group, a tert-butyl group, a 2-ethylbutyl group, an n-pentyl group, a 2-propylpentyl group, a 3-ethylpentyl group, an n-hexyl group, a 2-ethylhexyl group, a 5-ethylhexyl group, an n-heptyl group, a 4-propylheptyl group, a 5-ethylheptyl group, a 6-methylheptyl group, an n-octyl group, a 5-propyloctyl group, a 6-ethyloctyl group, a 7-methyloctyl group, an n-nonyl group a 6-propylnonyl group, a 7-ethylnonyl group, an n-decyl group, a 6-propyldecyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, a cyclopentylmethyl group, a cyclohexylmethyl group, a cyclohexylethyl group, a triphenylmethyl group, a 1,2,2-triphenylethyl group, a 1,1,1-triphenylethyl group, a trimethylsilylmethyl group, a triphenylsilylmethyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, etc. Preferred is an unsubstituted linear or branched alkyl group having a carbon number of from 3 to 20, for example, a propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, a 2-ethylhexyl group.

Examples of the cycloalkyl group having a ring carbon atoms of from 3 to include a cyclopropyl group, a 1-methylcyclopropyl group, a 2-methylcyclopropyl group, a cyclobutyl group, a 1-methylcyclobutyl group, a 2-methylcyclobutyl group, a 3-methylcyclobutyl group, a 2,2-dimethylcyclopropyl group, a 2,3-dimethylcyclopropyl group, a cyclopentyl group, a cyclohexyl group, a 4-fluorocyclohexyl group, a 1-adamantyl group, a 2-adamantyl group, a 1-norbornyl group, a 2-norbornyl group, etc. These groups are preferred from the viewpoint of solubility improvement. The substituent for these groups includes an alkyl group having a carbon number of from 1 to 6, and a halogen atom.

The linear or branched alkyl ether group having a carbon number of from 1 to 20 includes, for example, an oxymethyl group, an oxypropyl group, an oxybutyl group, their oligomers, etc. These groups are preferred from the viewpoint of solubility improvement.

Examples of the aryl group having a ring carbon atoms of from 6 to 30 include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a biphenyl-2-yl group, a biphenyl-3-yl group, a biphenyl-4-yl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl-4-yl group, a 4"-t-butyl-p-terphenyl-4-yl group, a fluoren-1-yl group, a fluoren-2-yl group, a fluoren-3-yl group, a fluoren-4-yl group, etc.

Above all, preferred are a phenyl group, a 1-naphthyl group, a 2-naphthyl group, a 1-anthryl group, a 2-anthryl group, a 9-anthryl group, a biphenyl-2-yl group, a biphenyl 3-yl group, a biphenyl-4-yl group, a p-terphenyl-4-yl group, a p-terphenyl-3-yl group, a p-terphenyl-2-yl group, an o-tolyl group, an m-tolyl group, a p-tolyl group, a fluoren-2-yl group, a fluoren-3-yl group; and more preferred are a phenyl group, a 1-naphthyl group, a 2-naphthyl group, an m-tolyl group, a p-tolyl group, a fluoren-2-yl group, a fluoren-3-yl group. The substituent for these groups includes a dibenzofuranyl group, a pyridyl group, a phenylthiophenyl group, a diphenylamino group, an alkyl group having a carbon number of from 1 to 8, a halogen atom, a cyano group.

Examples of the alkoxy group having a carbon number of from 1 to 20 are represented by —OY, in which examples of Y include those of the above-mentioned alkyl group. The alkoxy group is, for example, a methoxy group or an ethoxy group.

Examples of the cycloalkoxy group having a ring carbon atoms of from 3 to 10 are represented by —OY, in which examples of Y include those of the above-mentioned cycloalkyl group. The cycloalkoxy group is, for example, a cyclopentyloxy group or a cyclohexyloxy group.

Examples of the aryloxy group having a ring carbon atoms of from 6 to 30 are represented by —OY, in which examples of Y include those of the above-mentioned aromatic hydrocarbon ring. The aryloxy group is, for example, a phenoxy group.

The aralkyl group having a carbon number of from 7 to 40 is represented by —Y—Z, in which examples of Y are those of the alkylene group corresponding to examples of the above-mentioned alkyl group, and examples of Z are those of the above-mentioned aryl group. The aryl moiety of the aralkyl group preferably has a ring carbon atoms of from 6 to 30. The carbon number of the alky moiety is preferably from 1 to 10, particularly preferably from 1 to 6. For example, the group is a benzyl group, a phenylethyl group or a 2-phenylpropan-2-yl group.

Examples of the heteroaryl group having a ring atoms of from 3 to 30 include a 1-pyrrolyl group, a 2-pyrrolyl group, a 3-pyrrolyl group, a pyrazinyl group, a 2-pyridinyl group, a 3-pyridinyl group, a 4-pyridinyl group, a 2-pyrimidyl group, a 4-pyrimidyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-dibenzofuranyl group, a 4-dibenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin- 9-yl group, a 1,8-phenanthrolin-10-yl group, a, 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, a 2-thienyl group, a 3-thienyl group, a 2-benzothiophenyl group, a 3-thiophenyl group, a 4-thiophenyl group, a 5-thiophenyl group, a 6-thiophenyl group, a 7-thiophenyl group, a 1-isothiophenyl group, a 3-isothiophenyl group, a 4-isothiophenyl group, a 5-isothiophenyl group, a 6-isothiophenyl group, a 7-isothiophenyl group, a 2-dibenzothiophenyl group, a 4-dibenzothiophenyl group, etc. Of those, preferred are a 1-pyrrolyl group, a 2-pyrrolyl group, a 3-pyrrolyl group, a 1-carbazolyl group, a 2-carbazolyl group, a 3-carbazolyl group, a 4-carbazolyl group, a 9-carbazolyl group, a 2-dibenzofuranyl group, a 4-dibenzofuranyl group, a 2-dibenzothiophenyl group, a 4-dibenzothiophenyl group, a 2,2-bipyridin-4-yl group, a 2,2-bipyridin-6-yl group, a 2,2'2',2"-terpyridin-4'-yl group, a 2,2':6',2"-terpyridin-4'-phenyl-4-yl group, a benzothiazol-4-yl group, a benzothiazol-5-yl group, a trans-stilben-4-yl group, a 2,2'-bithiophen-3-yl group, a 2,2'-bithiophen-5-yl group, a 3,4-ethylenedioxythiophen-2-yl group, a 7-(2-thienyl)-2,1,3-benzothiadiazol-4-(2-thienyl-5-yl) group, a thienothiophenyl group, etc. Further, the group may also be a group having a structure where a carbazolyl group and a benzene ring bond at 2 sites, and may be an azacarbazolyl group, a benzocarbazolyl group, or a dibenzocarbazolyl group. In the case of a benzocarbazolyl group or a dibenzocarbazolyl group, the benzene ring may form a condensed ring at any position of [a], [b] or [c] of the carbazole ring, and two benzene rings may bond at the position [c] to form a structure where the benzene rings bond to each other. In place of the benzene ring, a naphthalene ring may be condensed with a carbazole ring to form the group employable here. In addition, further mentioned are an azadibenzofuranyl group, an azadibenzothiophenyl group, a 9,9-dimethyldibenzosilole group, an aza-9,9-dimethyldibenzosilole group, a 9,9-diphenyldibenzosilole group, an aza-9,9-diphenyldibenzosilole group, a benzodithiophenyl group, a benzodifuranyl group. The substituent for these groups includes a phenyl group, an alkyl group having a carbon number of from 1 to 8, and a halogen atom.

The alkylamino group includes a monoalkylamino group and a dialkylamino group, and preferred is a dialkylamino group. In the amino group, the alkyl moiety may be the same as the above-mentioned alkyl group. In the mono- or dialkylamino group, preferably, the alkyl moiety has a carbon number of from 1 to 20.

The arylamino group includes a monoarylamino group, a diarylamino group and an alkylarylamino group. Preferred are a diarylamino group and an alkylarylamino group. In the mono- or diarylamino group, preferably, the carbon number of the aryl moiety is from 6 to 30. Examples of the aryl group bonding to the nitrogen atom include those of the above-mentioned aryl group.

As the substituted silyl group substituted with one or more selected from alkyl and aryl, examples of the alkyl group and the aryl group bonding to the silicon atom include those of the above-mentioned aryl group and alkyl group. The alkyl groups with which the silyl group is substituted may be the same or different. Similarly, the aryl groups with which the silyl group is substituted may be the same or different. Further, the silyl group may be substituted with an aryl group and an alkyl group as combined. Of those, preferred are a trialkylsilyl group, a triarylsilyl group, a dialkylarylsilyl group and an alkyldiarylsilyl group, from the viewpoint of solubility improvement. Concretely, the trialkylsilyl group includes a trimethylsilyl group, a triethylsilyl group, an ethyldimethylsilyl group, a tripropylsilyl group, a propyldimethylsilyl group, a tributylsilyl group, a t-butyldimethylsilyl group, a tripentylsilyl group, a triheptylsilyl group, a trihexylsilyl group, etc. Preferred are a trimethylsilyl group, a triethylsilyl group, an ethyldimethylsilyl group.

The triarylsilyl group includes a triphenylsilyl group, a trinaphthylsilyl group, a diphenylbenzylsilyl group, etc. Preferred is a triphenylsilyl group. The dialkylarylsilyl group and the alkyldiarylsilyl group include a dimethylphenylsilyl group, a diethylphenylsilyl group, a diphenylmethylsilyl group, an ethyldiphenylsilyl group, etc. Preferred are a diphenylmethylsilyl group and an ethyldiphenylsilyl group, The halogen atom includes a fluorine atom, a chlorine atom and a bromine atom.

Preferred substituents in the unit A include a substituted or unsubstituted linear or branched alkyl group having a carbon number of from 1 to 20, a substituted or unsubstituted cycloalkyl group having a ring carbon atoms of from 3 to 16, a substituted or unsubstituted alkyl ether group having a carbon number of from 1 to 20, a substituted or unsubstituted alkoxy group having from 1 to 20 carbon atoms, a substituted or unsubstituted cycloalkoxy group having a ring carbon atoms of from 3 to 10, a substituted silyl group substituted with an alkyl group and/or an aryl group, and a bulky substituent to be mentioned hereinunder.

Structural examples of the alkyl group or the cycloalkyl group as the substituent are mentioned below.

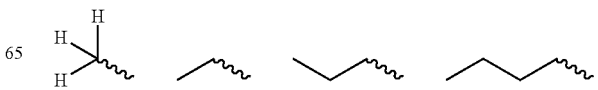

-continued

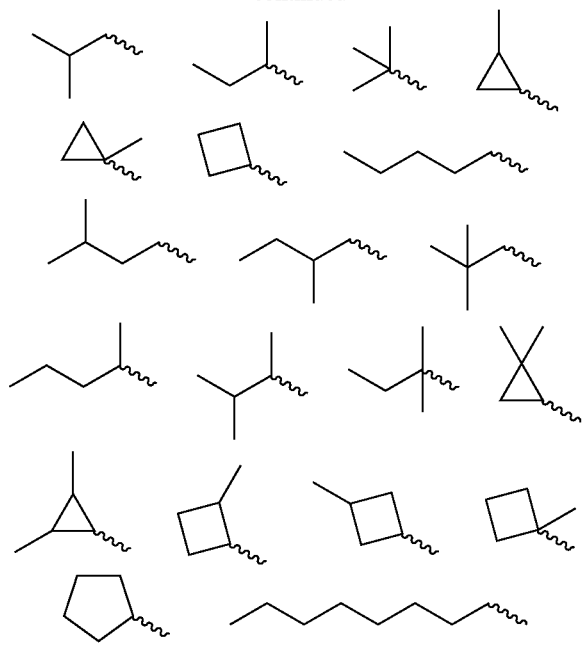

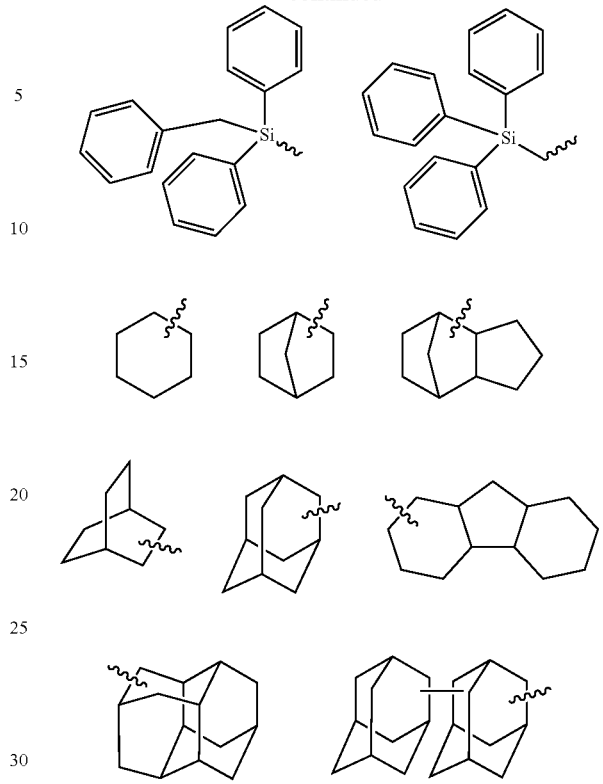

Structural examples of the alkyl ether group as the substituent are as mentioned below.

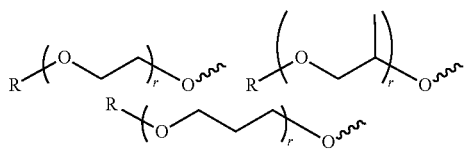

R represents a substituent, and r indicates an integer of from 1 to 4.

Structural examples of the bulky substituent are as mentioned below.

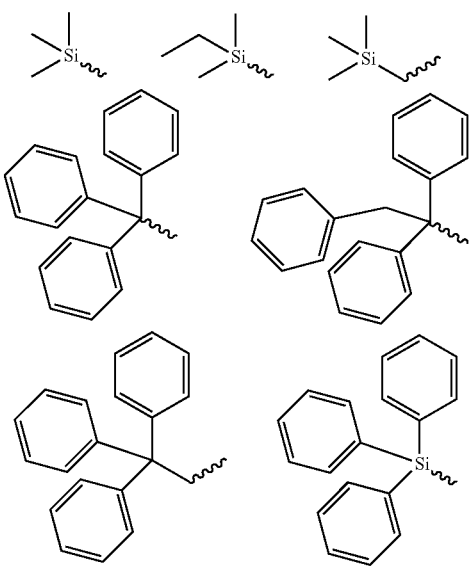

Preferably, the unit A has an unsubstituted alkyl group having a carbon number of from 3 to 16, an alkyl group having one or more phenyl group and having a carbon number of from 1 to 4, a cycloalkyl group having a ring carbon atoms of from 3 to 16 that is substituted with an alkyl group having a carbon number of from 1 to 6 or is unsubstituted, a linear or branched alkyl ether group having a carbon number of from 1 to 20, or a substituted silyl group substituted with one or more groups selected from alkyl and aryl, from the viewpoint of the solubility.

Next described is the unit B.

The unit B is derived from a monomer having charge transportability, and is a unit for imparting charge transportability to the polymer compound, and is represented by the following formula (1) or (2).

The unit B is a unit that contributes toward at least either of improvement of electron transportability, improvement of hole transportability or impartation of bipolarity. The unit may be a residue of a group having electron transportability, hole transportability or bipolarity. Specific structures that contribute toward the functions are shown in the section of describing the groups described later.

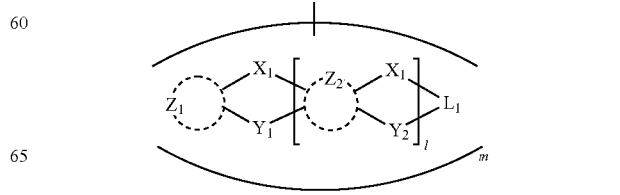

(1)

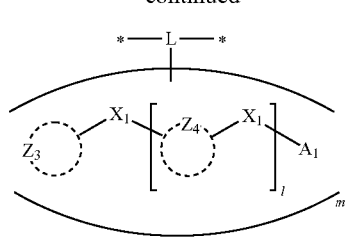

(2)

In the formulae (1) and (2), * indicates the position at which the formula bonds to the unit A, B or C. Two or more units B's may be adjacent to bond to each other.

L represents a unit constituting the polymer chain, and is a linking group to bond the structure of the formula (1) or the formula (2) except L (parenthesized structure of the formula (1) or the formula (2)) and the polymer main chain, and is a substituted or unsubstituted aromatic hydrocarbon cyclic group, a substituted or unsubstituted aromatic heterocyclic group, or a combination thereof. However, when L is an aromatic heterocyclic group containing an N atom, the number of the N atoms in the atoms constituting one ring of the group is 1 or 2. When an aromatic hetero ring containing 3 or more N atoms in one ring forms a main chain, the electron acceptability would be too strong, thereby inhibiting the rapid electron movement, and consequently, the compound of the type is unsuitable for a material for electronic devices such as a material for organic electroluminescent devices, etc.

The unit B is a unit contributing toward electron transportability, and therefore, excepting the case of forming a binary copolymer with the unit C, it is unsuitable to introduce a group contributing toward solubility such as an alkyl group as the substituent for L (in general, the group does not contribute toward charge transportability). Even in the case of a binary copolymer with the unit C, it is still unsuitable to introduce a short-chain alkyl group such as a methyl group or the like not contributing toward solubility, as the substituent for L.

Preferably, L is a substituted or unsubstituted benzene ring, pyridine ring, pyrimidine ring or a structure represented by the following general formula that forms a main chain with bonding at the 1,3-positions, from the viewpoint of electron transportability.

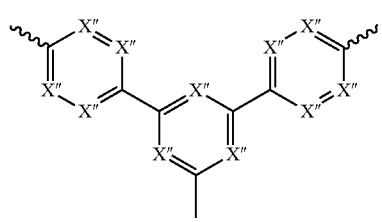

(a)

(X" independently represents N or CH. (X")'s on one aromatic ring are not N at the same time.) However, when L is a benzene ring, preferably, the 2-position of the benzene ring is unsubstituted as described above.

As described hereinunder, m indicates an integer of from 1 to 50; and when m is 1, L has a structure having three bonds, and when m is 2, L has a structure having four bonds. With the increase in m, the number of the bonds of L increases.

The aromatic hydrocarbon cyclic group represented by L is preferably one having a ring carbon atoms of from 6 to 30, and the aromatic heterocyclic group is preferably one having a ring atoms of from 5 to 30. L may have plural aromatic hydrocarbon cyclic groups or aromatic heterocyclic groups, or may be a combination of an aromatic hydrocarbon cyclic group and an aromatic heterocyclic group.

As examples of the aromatic hydrocarbon cyclic group and the aromatic heterocyclic group, there are mentioned the specific examples of the above-mentioned substituent (R) that is made to be a trivalent or more polyvalent one. Concretely, the following structures are mentioned. The group includes isomers of the following structures. In the following structures, the wavy line indicates a bond to the polymer main chain, and "-" indicates a bond to the unit of the above formula (1) or (2) except L.

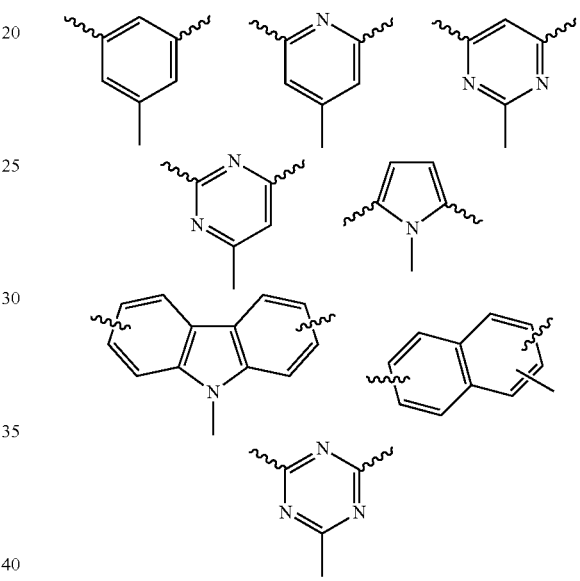

In the following specific examples, $X_0$ represents a part of the above-mentioned formula (1) or (2) except L, and includes the same examples as those of the above-mentioned substituent (R). In the following structures, the wavy line indicates a bond to the polymer main chain.

As shown in the following specific examples, L may have a part (linking group) not constituting the main chain. As the linking group of the type, there are mentioned a substituted or unsubstituted aromatic hydrocarbon cyclic group, a substituted or unsubstituted aromatic heterocyclic group, and a combination thereof, such as those described hereinabove in the section of describing L.

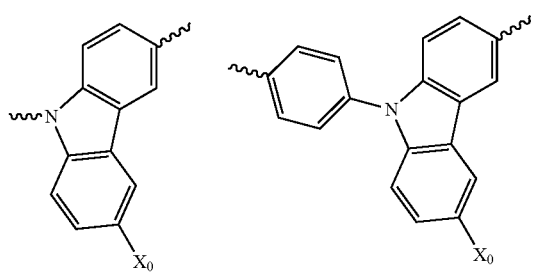

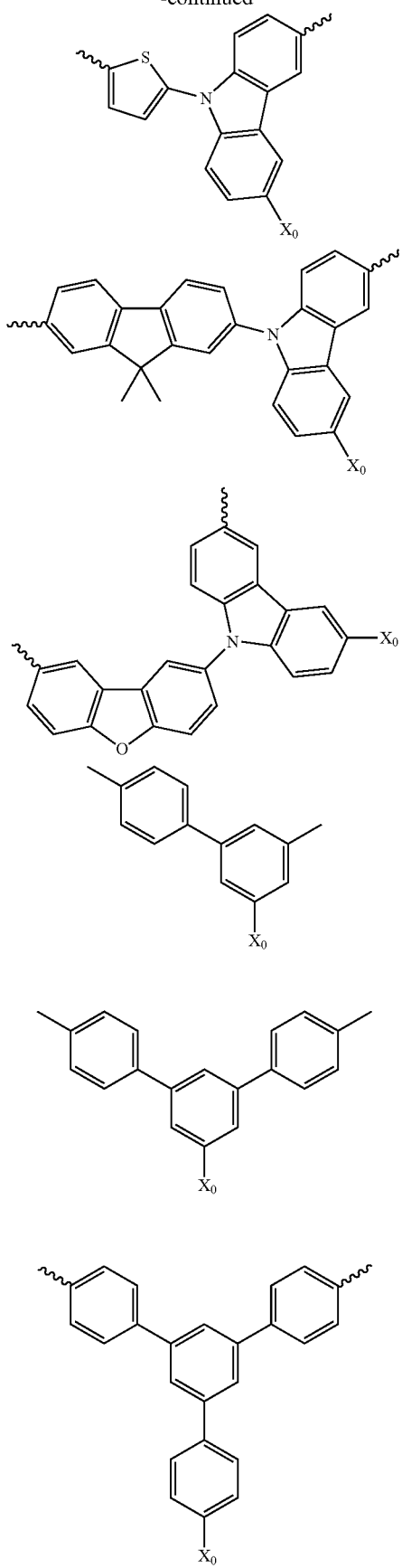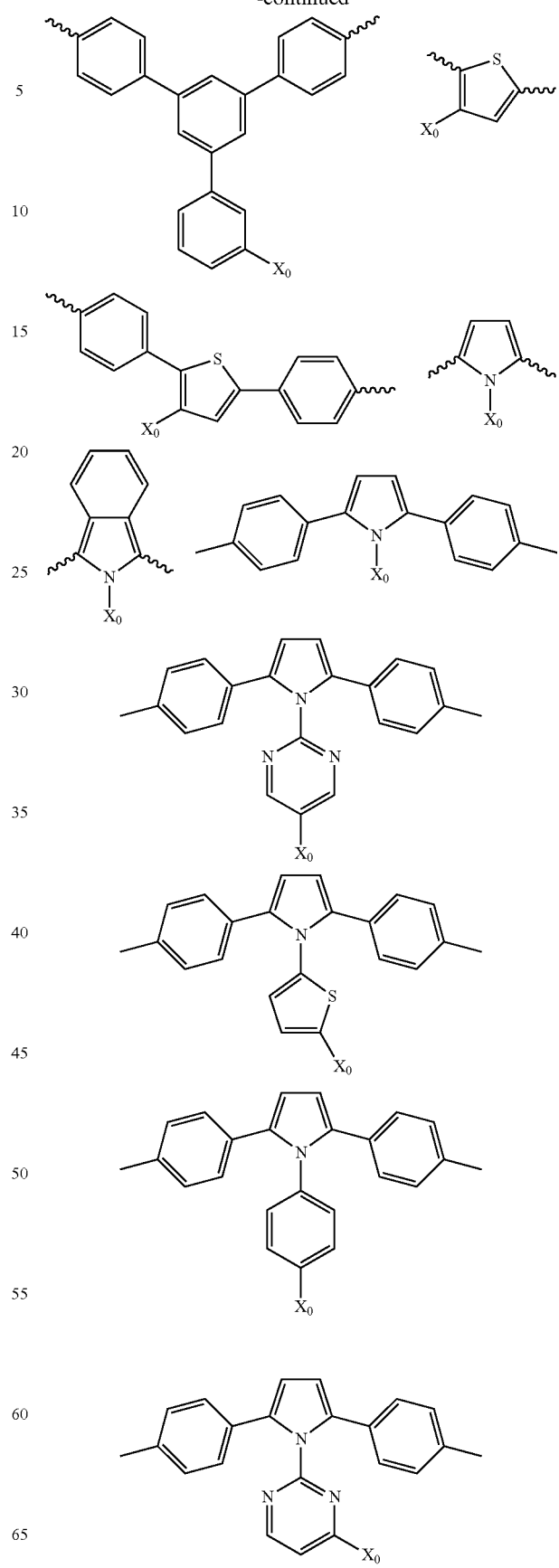

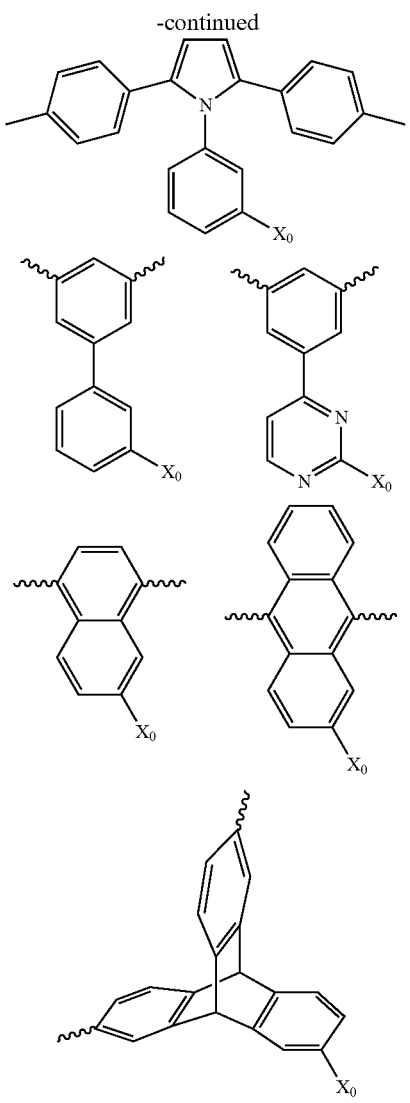

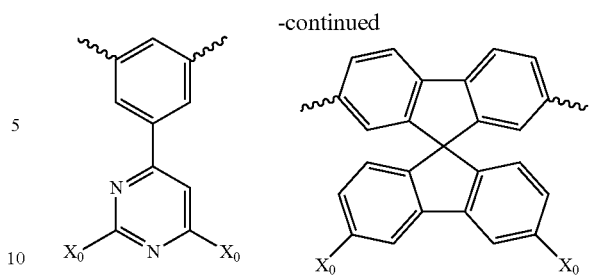

Next described are the parenthesized structures in the formulae (1) and (2).

$X_1$, $X_2$, $Y_1$ and $Y_2$ each represent a single bond, $CR^1_2$, $NR^1$, O, S, or $SiR^1_2$, $R^1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group. With respect to $X_1$, $X_2$, $Y_1$ and $Y_2$, $R^1$ may bond to L.

In this description, "hydrogen atom" includes isotopes each having a different number of neutrons, or that is, protium, deuterium and tritium. This interpretation is not limited to the hydrogen atom of $R^1$ but shall similarly apply to all the hydrogen atoms existing in the compound of the present invention.

As examples of the alkyl group, the cycloalkyl group, the aromatic hydrocarbon cyclic group and the aromatic heterocyclic group of $R^1$, there are mentioned the same examples as those of the alkyl group, the cycloalkyl group, the aryl group and the heteroaryl group of the substituent (R) in the above-mentioned unit A. As examples of the substituted or unsubstituted substituent, there are mentioned the same examples as those of the substituent of the above-mentioned unit A.

$L_1$ represents a substituted or unsubstituted divalent linking group, and is composed of atoms selected from C, N and S. For example, there are mentioned —C—C—, —C=C—, —C—C=, —C=N—, —C—S—, —N—S— (in accordance with the valence thereof, C, N and S may have hydrogen atoms bonding thereto, or may be substituted with a substituent, and as examples of the substituent, there are mentioned the same examples as those of the above-mentioned unit A), etc. The group may also be a linking group that has a linking form of forming a condensed ring with the cyclic structure formed by a part of $Z_2$, or a part of $X_2$, $Y_2$, and $L_1$. In this case, preferred is a substituted or unsubstituted divalent aliphatic hydrocarbon cyclic group, a substituted or unsubstituted divalent aliphatic heterocyclic group, a substituted or unsubstituted divalent aromatic hydrocarbon cyclic group, or a substituted or unsubstituted divalent aromatic heterocyclic group. Concretely, there are mentioned the groups to be described for $Z_1$ to $Z_4$ hereinunder.

$Z_1$, bonding to $X_1$ and $Y_1$, and $Z_4$, bonding to $X_1$ and $X_2$, each represent a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, $Z_2$, bonding to $X_1$, $X_2$, $Y_1$ and $Y_2$, represents a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group, Z₃, bonding to X₁, represents a substituted or unsubstituted aliphatic hydrocarbon cyclic group, a substituted or unsubstituted aliphatic heterocyclic group, a substituted or unsubstituted aromatic hydrocarbon cyclic group, or a substituted or unsubstituted aromatic heterocyclic group.

Of the above-mentioned $Z_1$ to $Z_4$, the aliphatic hydrocarbon cyclic group is preferably one having a ring carbon atoms of from 3 to 16, for example, a group derived from cyclopropane, cyclobutane, cyclopentane, cyclohexane, norbornene, adamantane, etc.

Of the above-mentioned $Z_1$ to $Z_4$, the aliphatic heterocyclic group is preferably one having a ring atoms of from 5 to 16, including, for example, the groups derived from a ring obtained by substituting the ring-forming carbon atom in the above-mentioned aliphatic hydrocarbon rings with a hetero atom such as N, S, O or the like. For example, there are mentioned pyrrolidine and piperidine.

Of the above-mentioned $Z_1$ to $Z_4$, the aromatic hydrocarbon cyclic group is preferably one having a ring carbon atoms of from 6 to 30, and includes the groups derived from the examples of the above-mentioned aryl groups having a ring carbon atoms of from 6 to 30, for example, cyclopentadiene, benzene, naphthalene, anthracene, phenanthrene, etc.

Of the above-mentioned $Z_1$ to $Z_4$, the aromatic heterocyclic group is preferably one having a ring atoms of from 5 to 30, and includes the groups derived from a ring obtained by substituting the ring-forming carbon atom in the above-mentioned aromatic hydrocarbon rings with a hetero atom such as N, S, O or the like, and the groups derived from the examples of the above-mentioned heteroaryl group having a ring atoms of from 3 to 30.

As the substituent for $Z_1$ to $Z_4$, there are mentioned the same examples as those for the above-mentioned unit A. $Z_1$ to $Z_4$ may have a structure in which the substituent for a phenylene group or the like therein bonds to L.

The unit B is a unit of increasing hole transportability or electron transportability, controlling the balance between electron transportability and hole transportability, and imparting bipolarity as having both a hole-transporting site and an electron-transporting site, to thereby contribute toward charge transportability. Accordingly, as the substituent in the unit, preferred are an aryl group such as a phenyl group or the like, a heteroaryl group such as a pyridyl group or the like, and a cyano group. On the other hand, in the case of a polymer compound formed of the unit B and the unit C, it is desirable that the unit B additionally has a function of solubility improvement, and in this case, as preferred examples of the substituent, there are mentioned the groups described to be preferred in the unit A hereinabove. In an embodiment where the substituent for solubility improvement bonds to L in the formula (1) or (2), the influence of the substituent on the charge movement in the main chain is great, and therefore, preferred is an embodiment where the substituent bonds to any other part than L.

$A_1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group, as examples of the alkyl group, the cycloalkyl group, the aromatic hydrocarbon cyclic group and the aromatic heterocyclic group of $A_1$, there are mentioned the same examples as those of the alkyl group, the cycloalkyl group, the aryl group and the heteroaryl group of the substituent (R) in the above-mentioned unit A, as examples of the substituted or unsubstituted substituent, there are mentioned the same examples as those of the substituent in the above-mentioned unit A. Further, as the substituent, there are also mentioned the substituents for the above-mentioned $Z_1$ to $Z_4$. As described above, from the viewpoint of charge transportability, $A_1$ is preferably an aromatic hydrocarbon cyclic group or an aromatic heterocyclic group.

In the case where the formula bonds to L at any of $X_1$, $X_2$, $Y_1$, $Y_2$, $L_1$, and $Z_1$ to $Z_4$, the valence increases by 1. The embodiments of the present invention also include an embodiment where a substituent of $X_1$, $X_2$, $Y_1$, $Y_2$, $L_1$, and $Z_1$ to $Z_4$, bonds to L.

l indicates an integer of from 0 to 5. When l is 2 or more, the parenthesized moieties may be the same or different. In the formula (1), l is preferably 0 or 1. When l is 2 or more and when the B unit content is large, then the solubility may lower owing to the rigid structure thereof. In the formula (2), l is preferably 0, 1 or 2.

m indicates an integer of from 1 to 50, and preferably from 1 to 2. When m is 2 or more, the parenthesized moieties may be the same or different. When m is 3 or more, the weight-average molecular weight of the compound could not reach 50,000 or more depending on the structure of L.

The parenthesized group in the formula (1) or the formula (2) is preferably a substituted or unsubstituted nitrogen-containing aromatic 6-membered ring, a substituted or unsubstituted condensed aromatic hetero ring, a substituted or unsubstituted condensed aromatic hydrocarbon ring, or a substituted or unsubstituted terphenyl group, from the viewpoint of charge transportability. For example, introducing a nitrogen-containing aromatic 6-membered ring may increase electron transportability. Introducing a condensed aromatic hetero ring may improve hole transportability.

As the condensed aromatic hetero ring, there are mentioned a substituted or unsubstituted carbazolyl group, a substituted or unsubstituted dibenzofuranyl group, a substituted or unsubstituted dibenzothiophenyl group, a substituted or unsubstituted benzimidazolyl group, and a substituted or unsubstituted pyridyl group. Introducing an aromatic ring substituted with a cyano group may improve electron transportability.

Preferably, the structure except the main chain in the above-mentioned formula (1) or formula (2) is a structure to be mentioned below, since the triplet energy might be increased or the hole transportability might be improved.

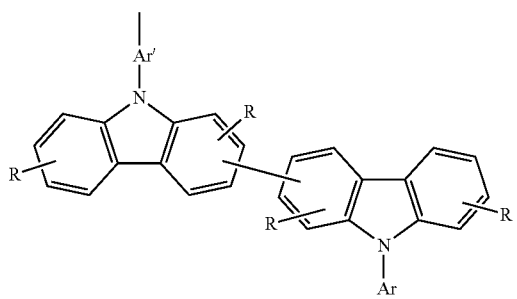

Unit B

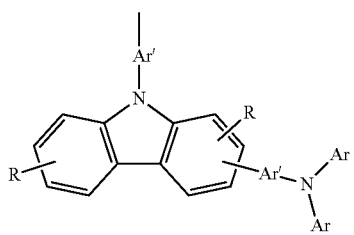

Unit B

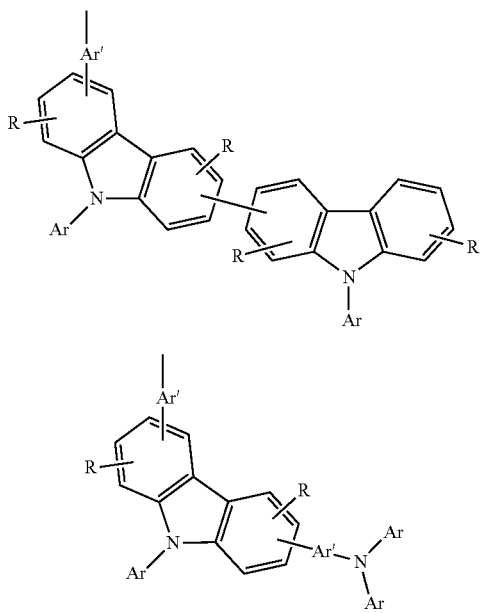

Unit B

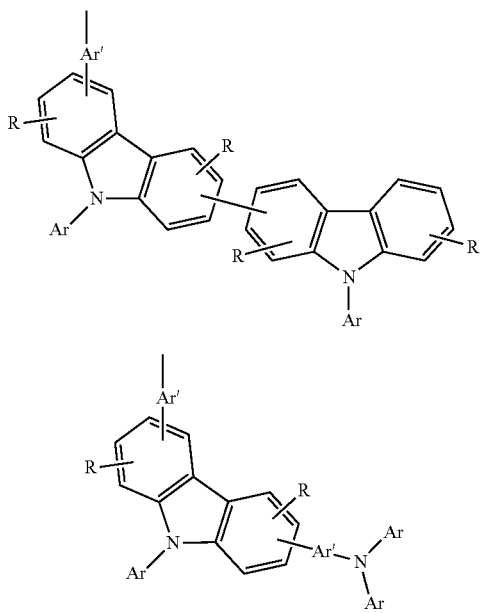

Unit B (In the formulae, "unit B" indicates the main chain part in L in the formula (1). R represents a substituted or unsubstituted, linear or branched alkyl group having a carbon number of from 1 to 20, a substituted or unsubstituted cycloalkyl group having a ring carbon atoms of from 3 to 16, a substituted or unsubstituted alkyl ether group having a carbon number of from 1 to 20, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 10, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 3 to 30, a substituted or unsubstituted alkylamino group, a substituted or unsubstituted arylamino group, a substituted silyl group substituted with an aryl group and/or an alkyl group, a halogen atom, a nitro group, a cyano group or a hydroxyl group, Ar represents a substituted or unsubstituted monovalent aromatic hydrocarbon cyclic group having a ring carbon atoms of from 6 to 30, or a substituted or unsubstituted monovalent aromatic heterocyclic group having a ring atoms of from 5 to 30, Ar' represents a substituted or unsubstituted divalent aromatic hydrocarbon cyclic group having a ring carbon atoms of from 6 to 30, or a substituted or unsubstituted divalent aromatic heterocyclic group having a ring atoms of from 5 to 30.)

As examples of R, there are mentioned those mentioned hereinabove as the groups in the unit A. Preferred examples of the groups are those mentioned in the section of the unit B.

Examples of Ar are the same as those described in the section of the aromatic hydrocarbon cyclic group and the aromatic hydrocarbon cyclic group of $A_1$ in the above-mentioned unit B and having a carbon number adaptable to the case, and examples of Ar' are the same as those described in the section of the aromatic hydrocarbon cyclic group and the aromatic hydrocarbon cyclic group of $A_1$ in the above-mentioned unit B, modified to be divalent groups and having a carbon number adaptable to the case.

As specific examples of the parenthesized moiety in the unit B, there are mentioned the following structures. In the following structures, the wavy line indicates a bond, and "-" indicates a methyl group.

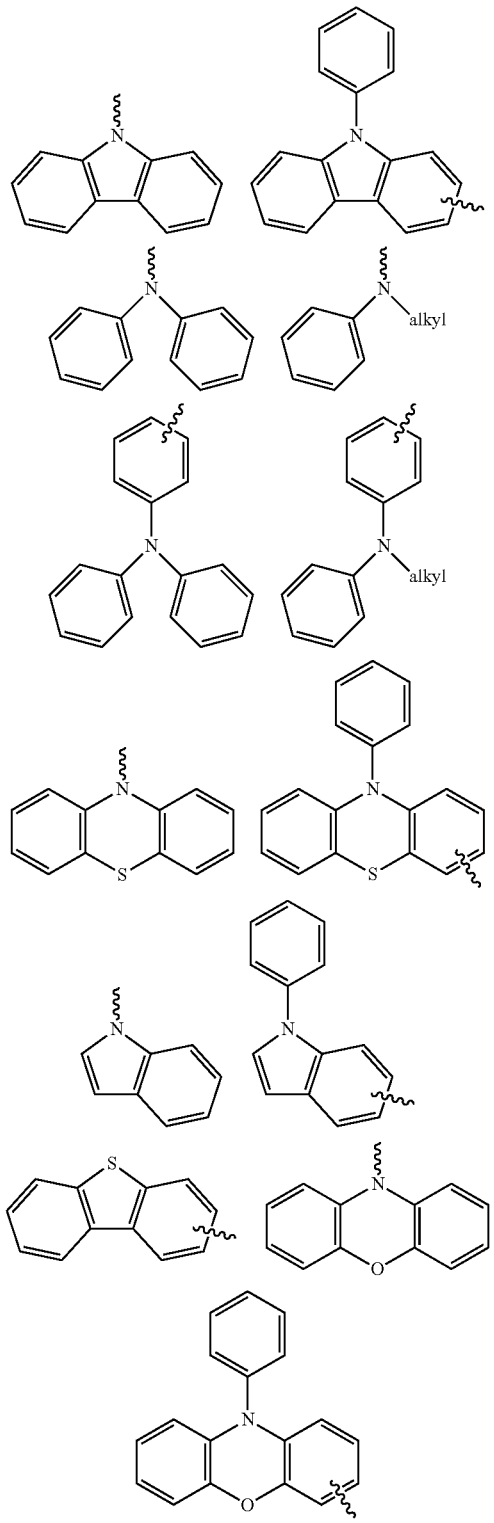

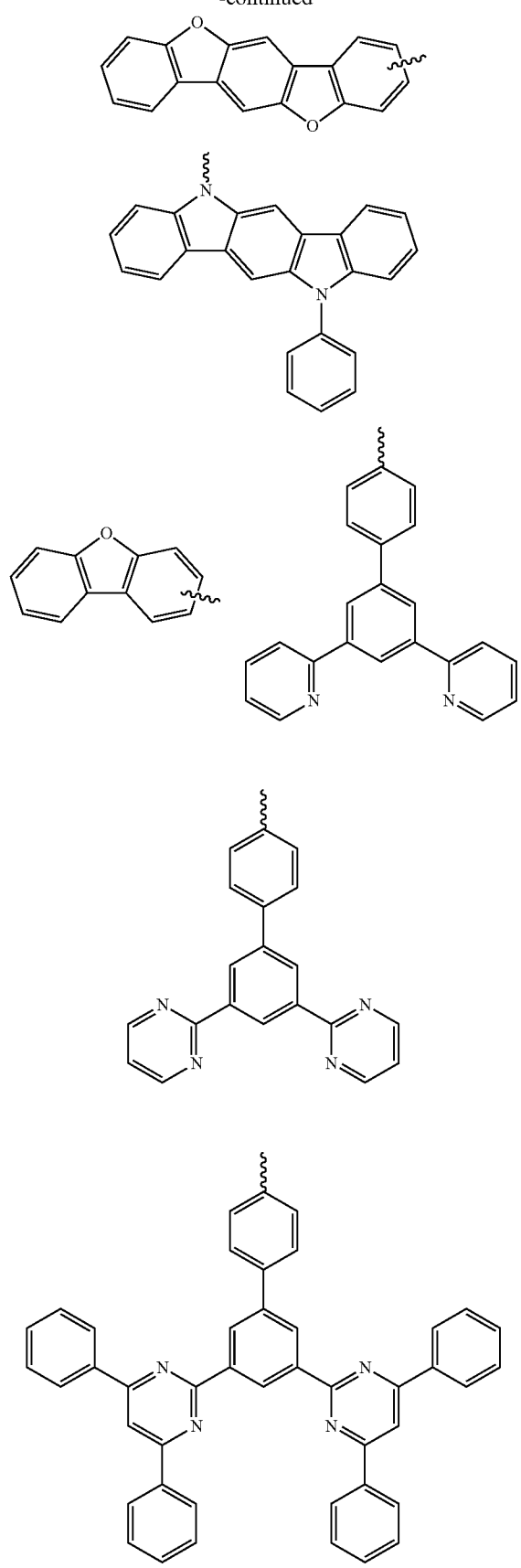
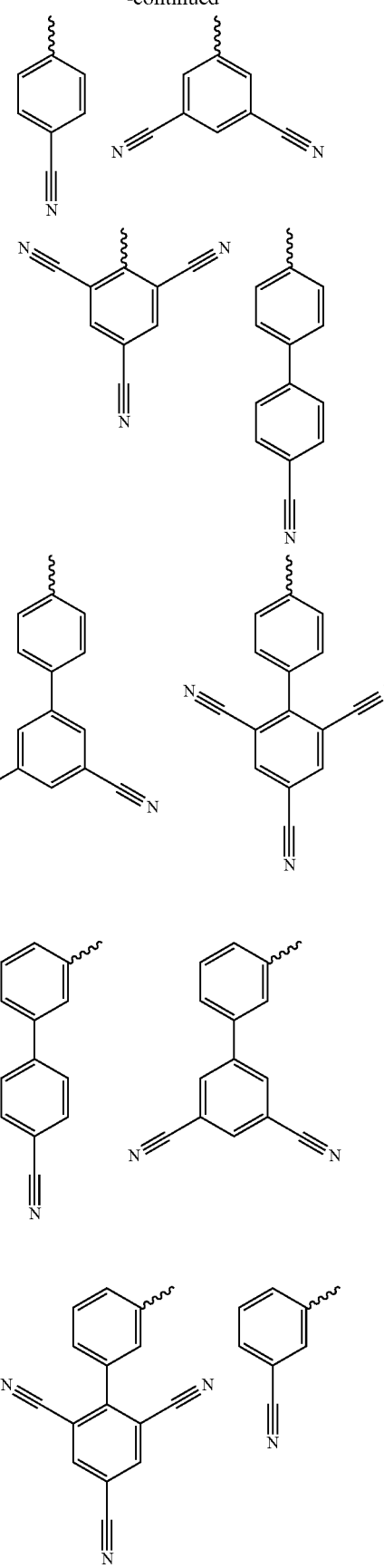

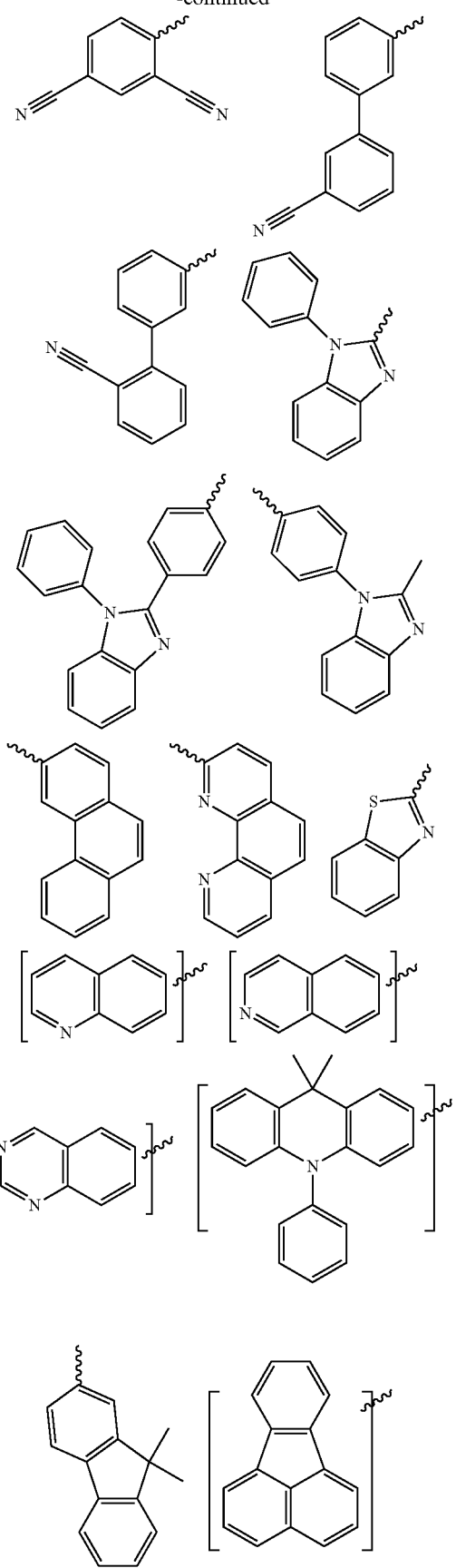
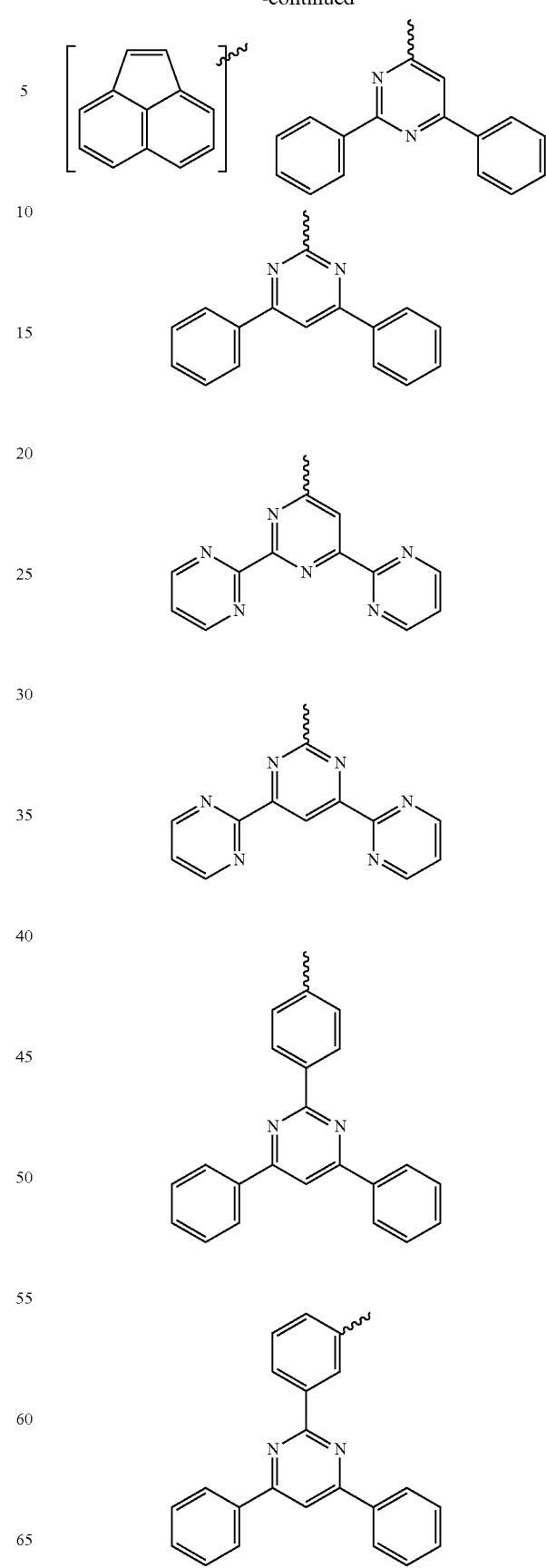

27
-continued
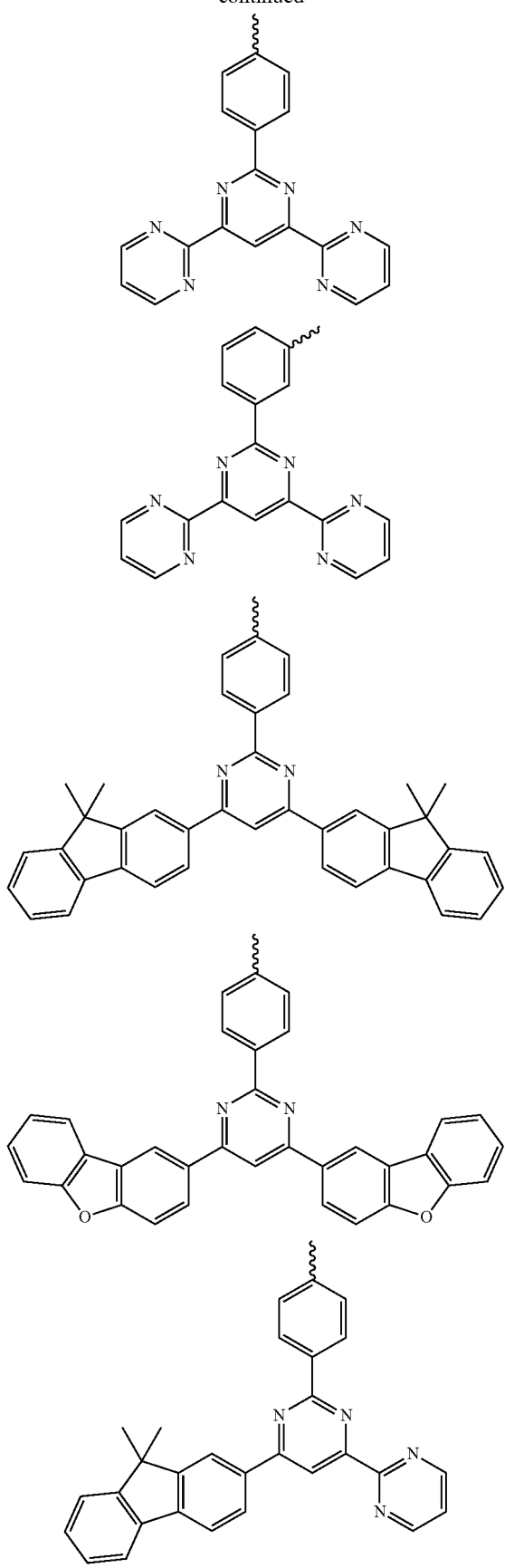
28
-continued
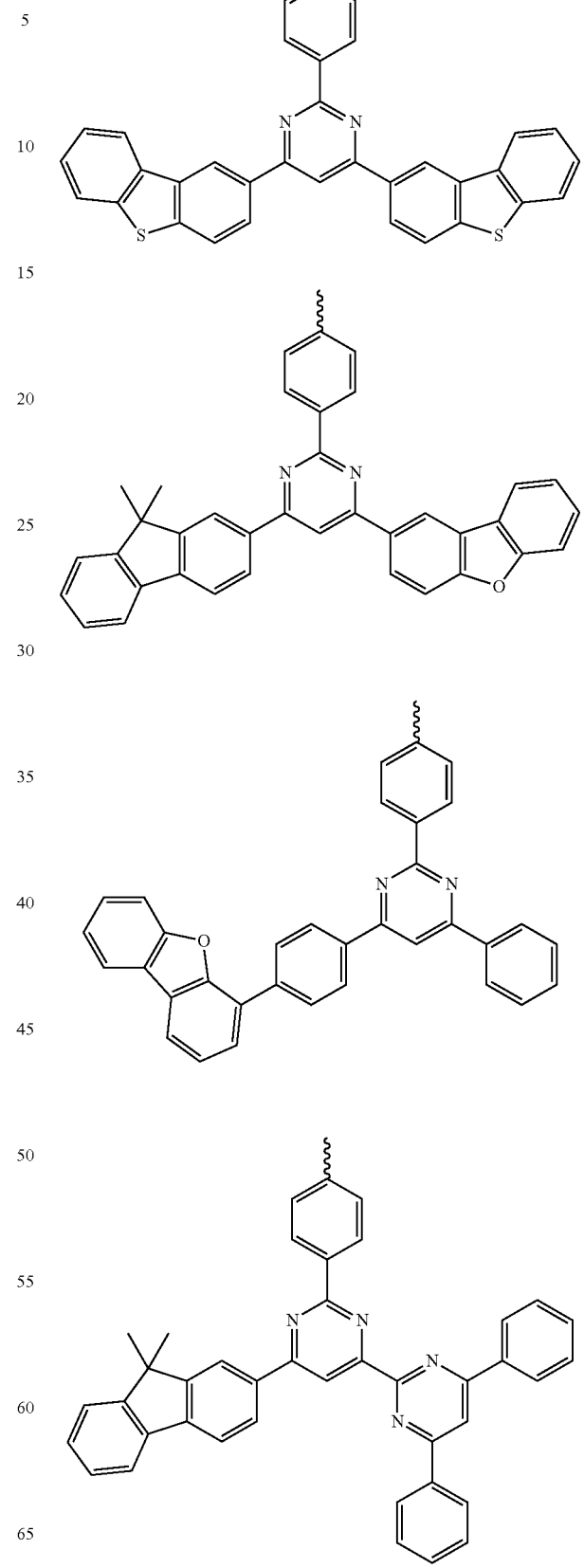

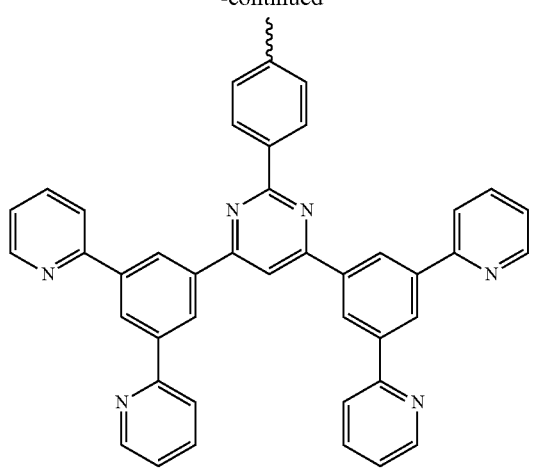
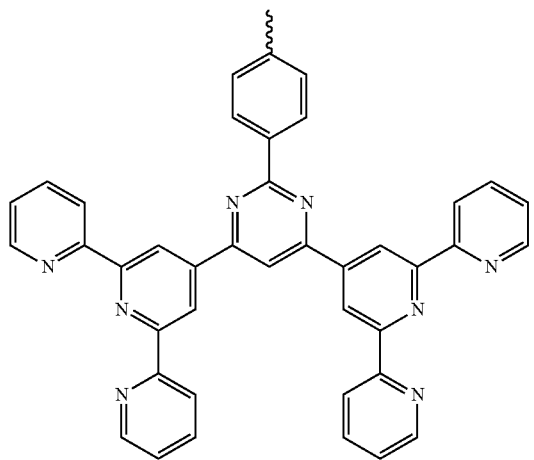
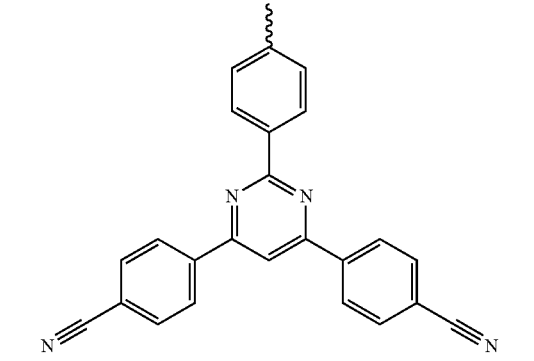
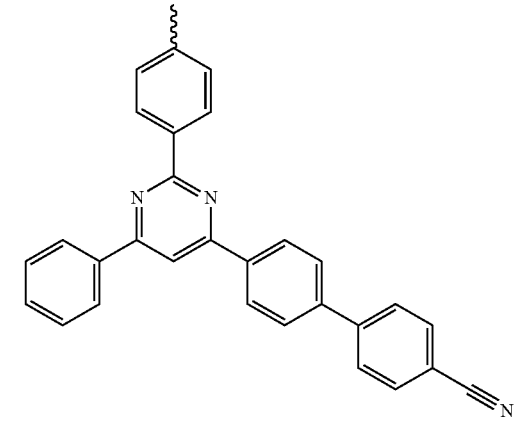
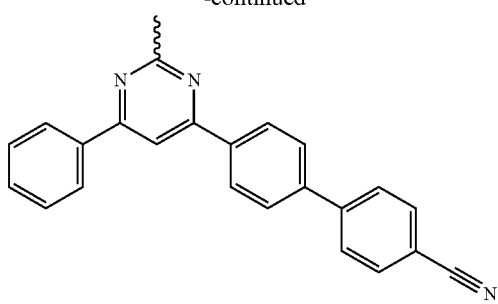
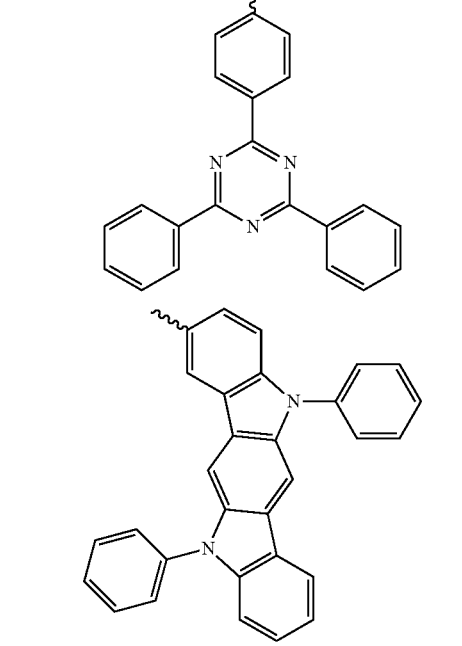
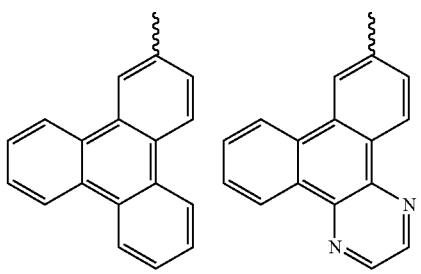
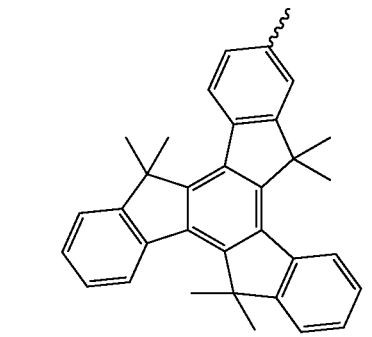

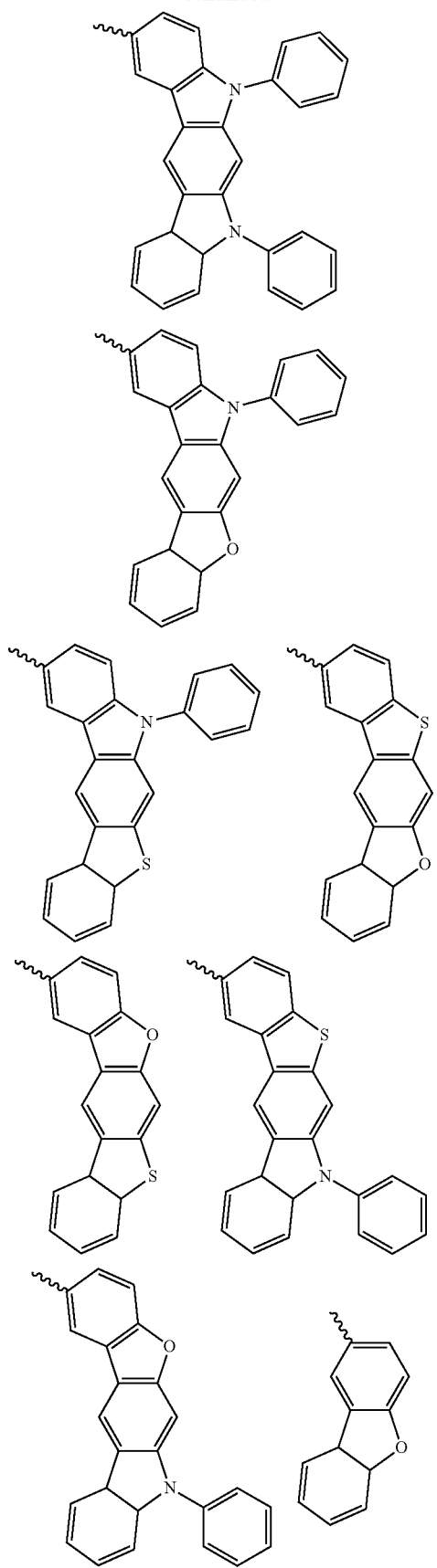
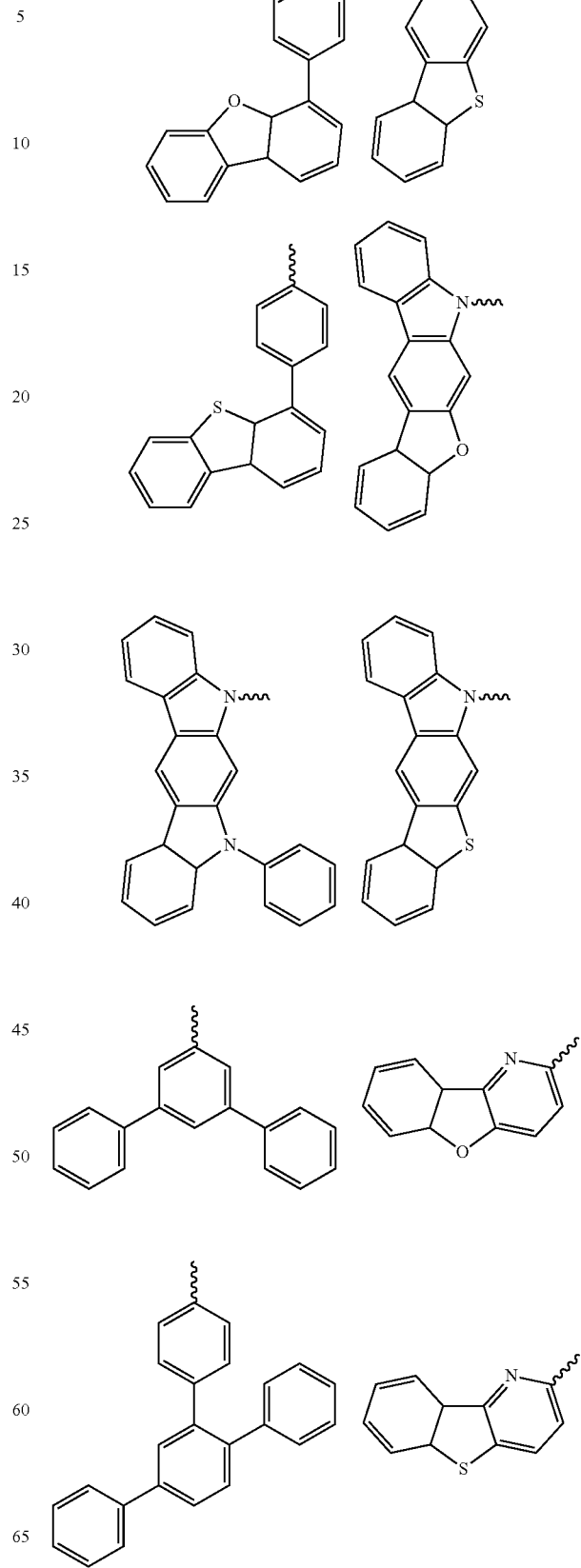

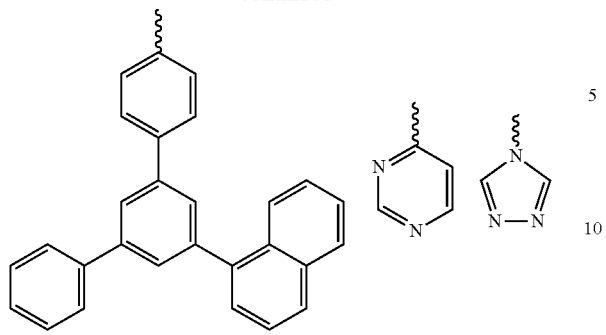
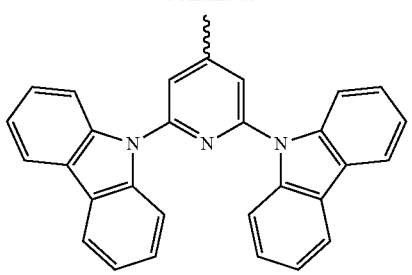
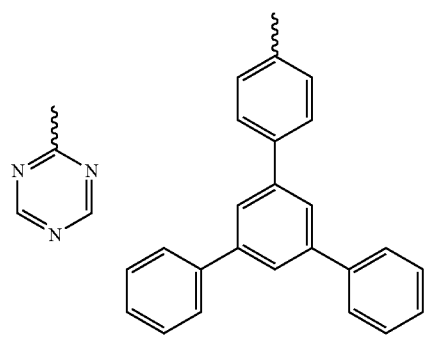
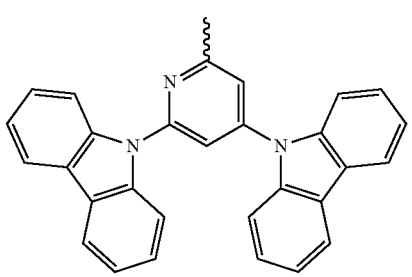
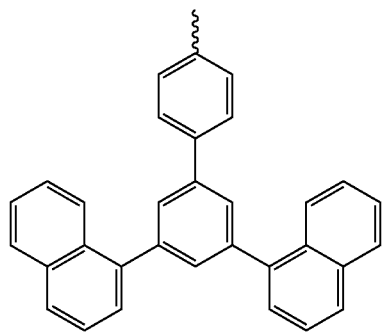
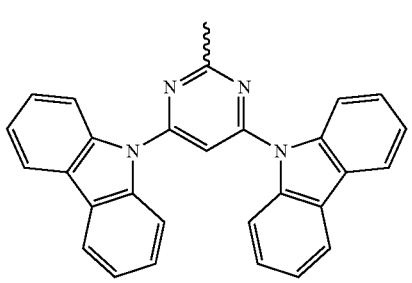
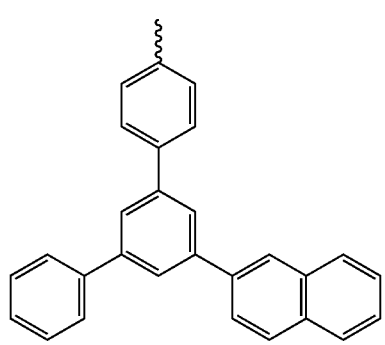
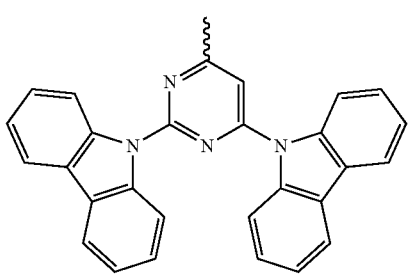
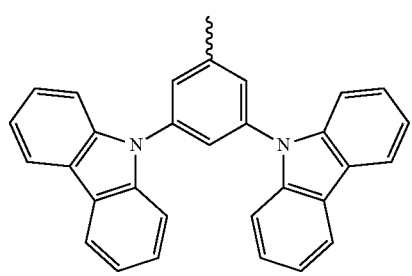
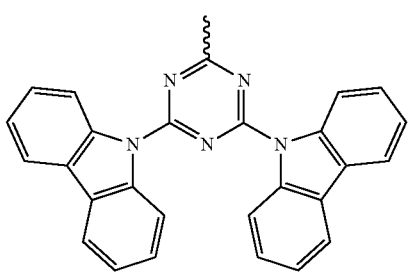

35
-continued
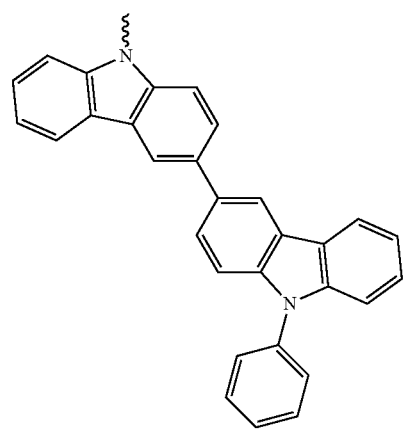
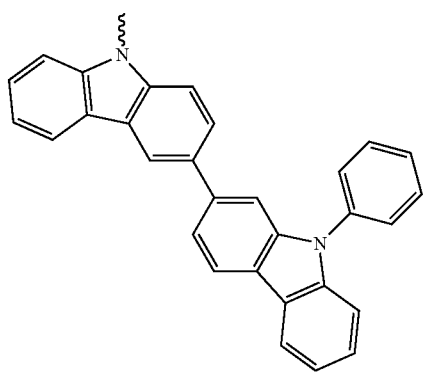
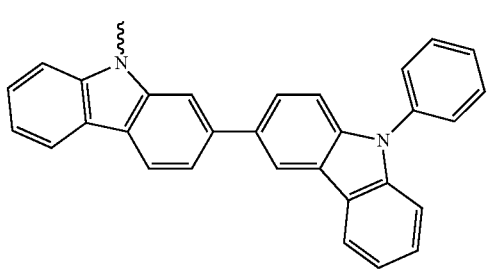
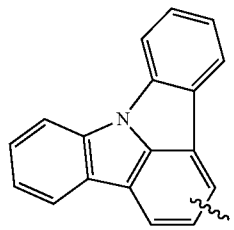
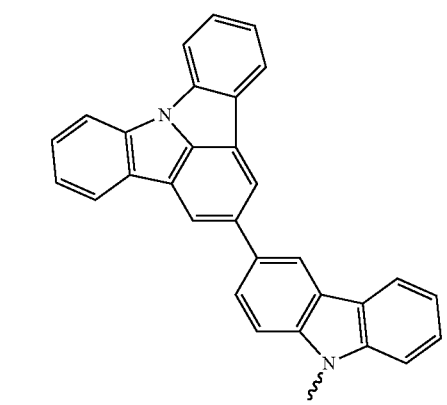
36
-continued
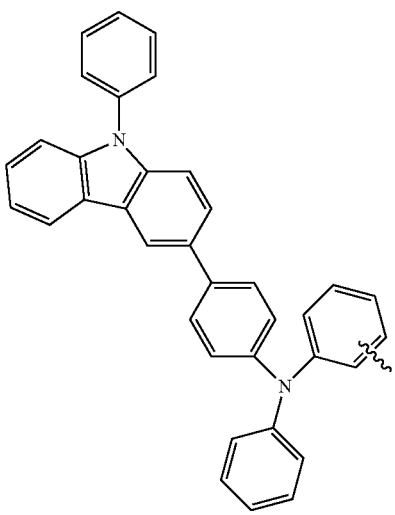
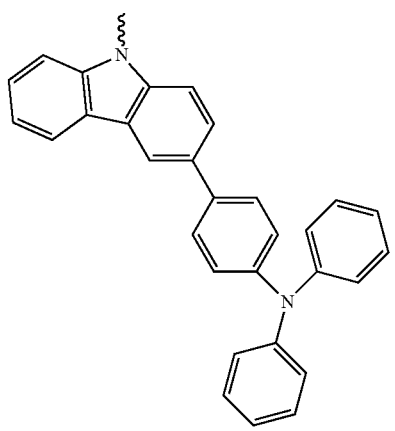
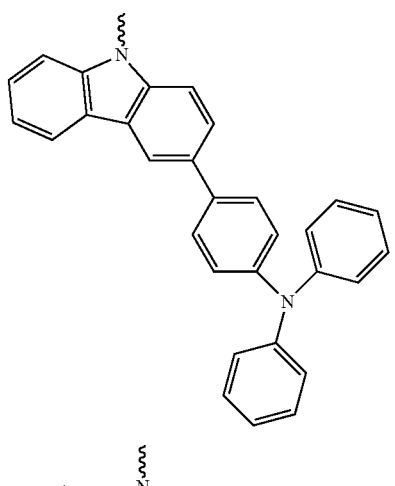
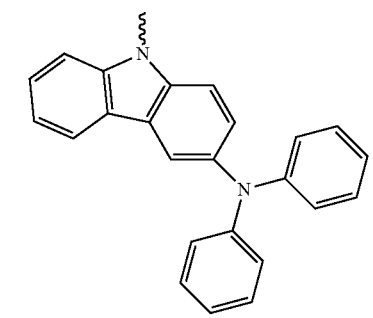

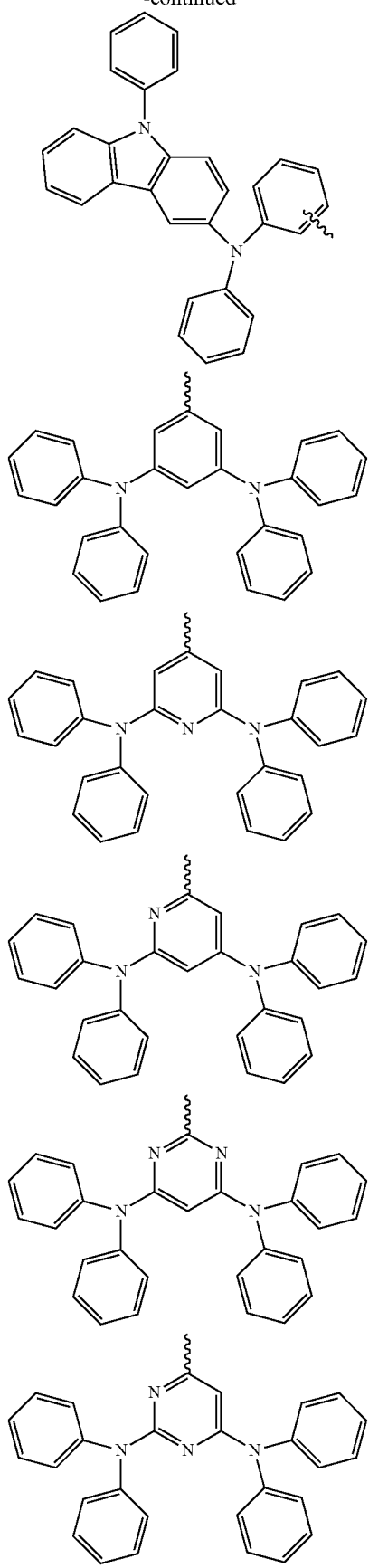
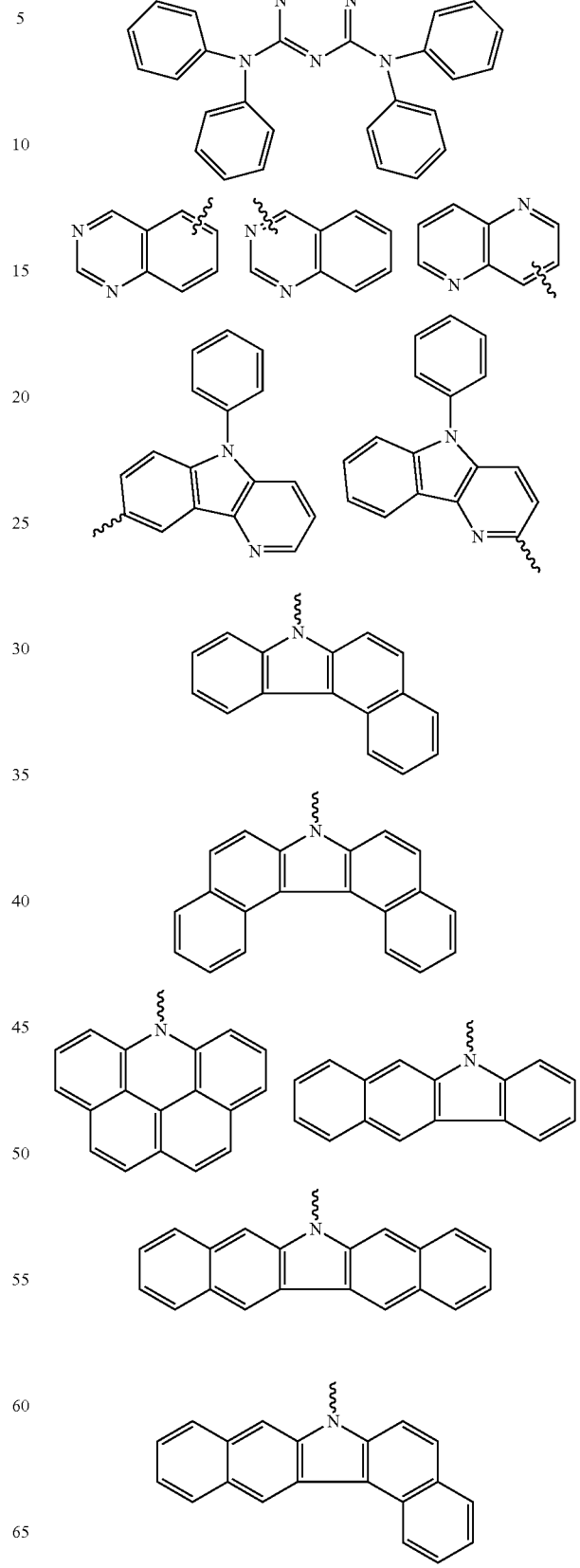

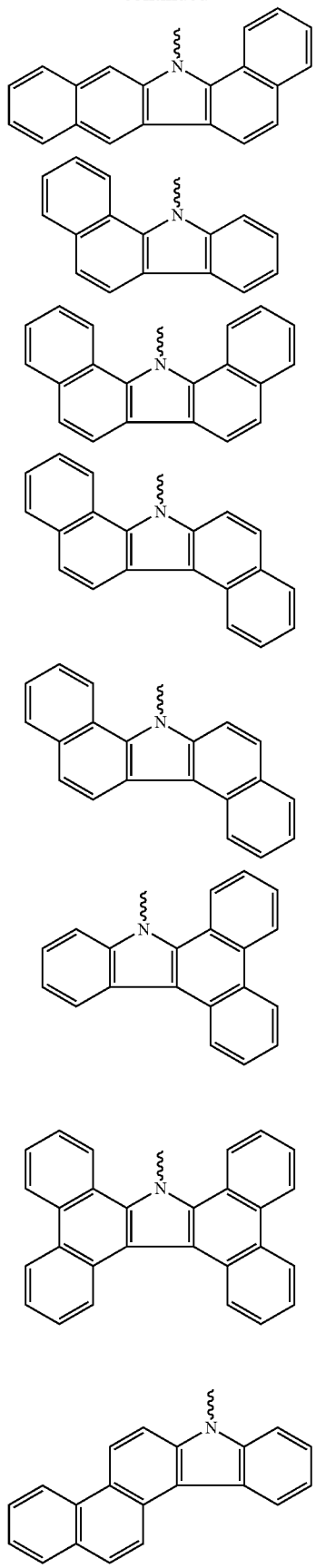
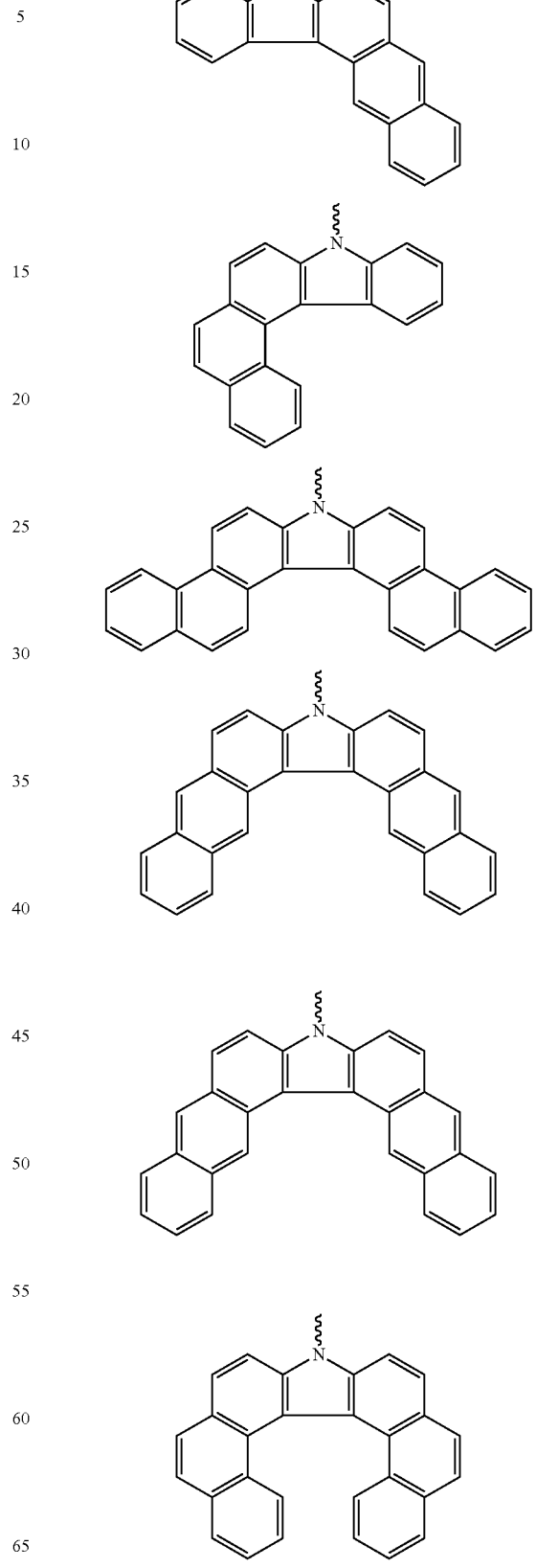

41
-continued
42
-continued
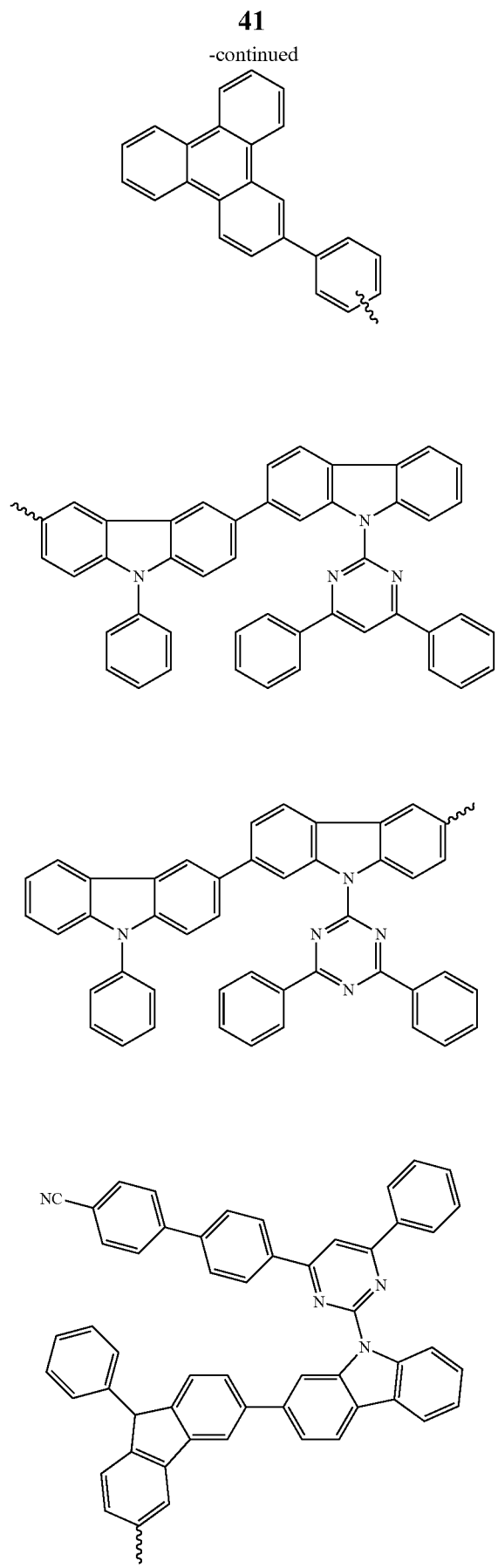
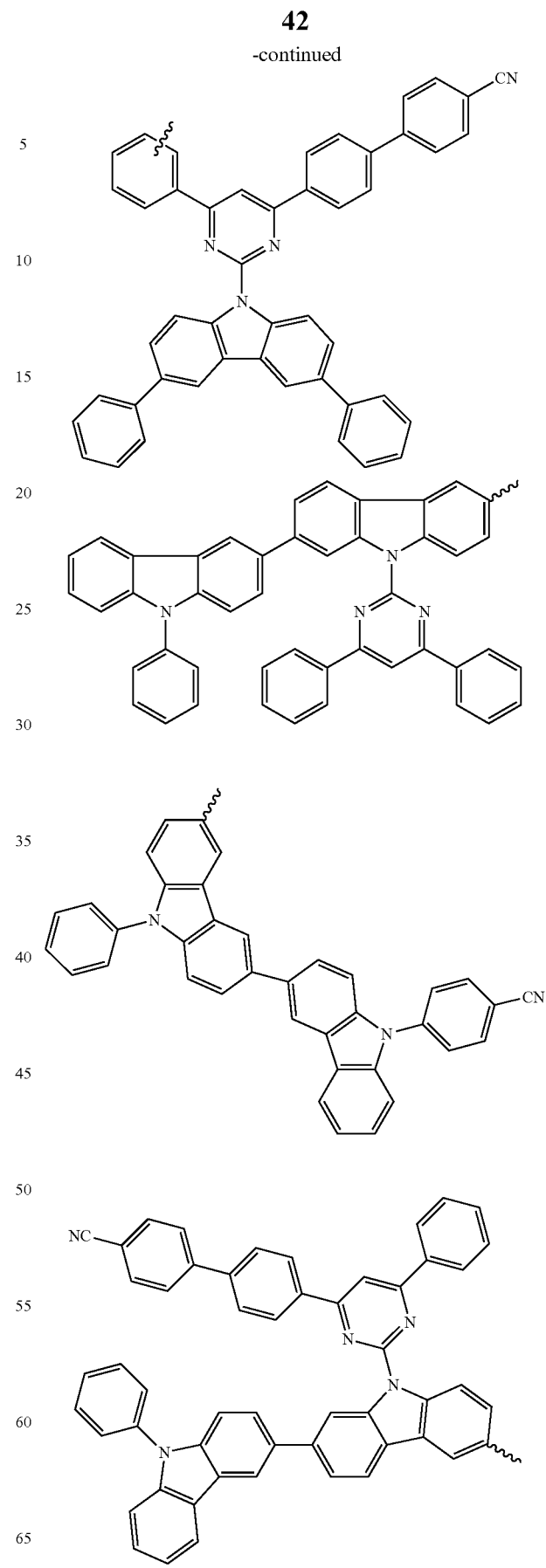

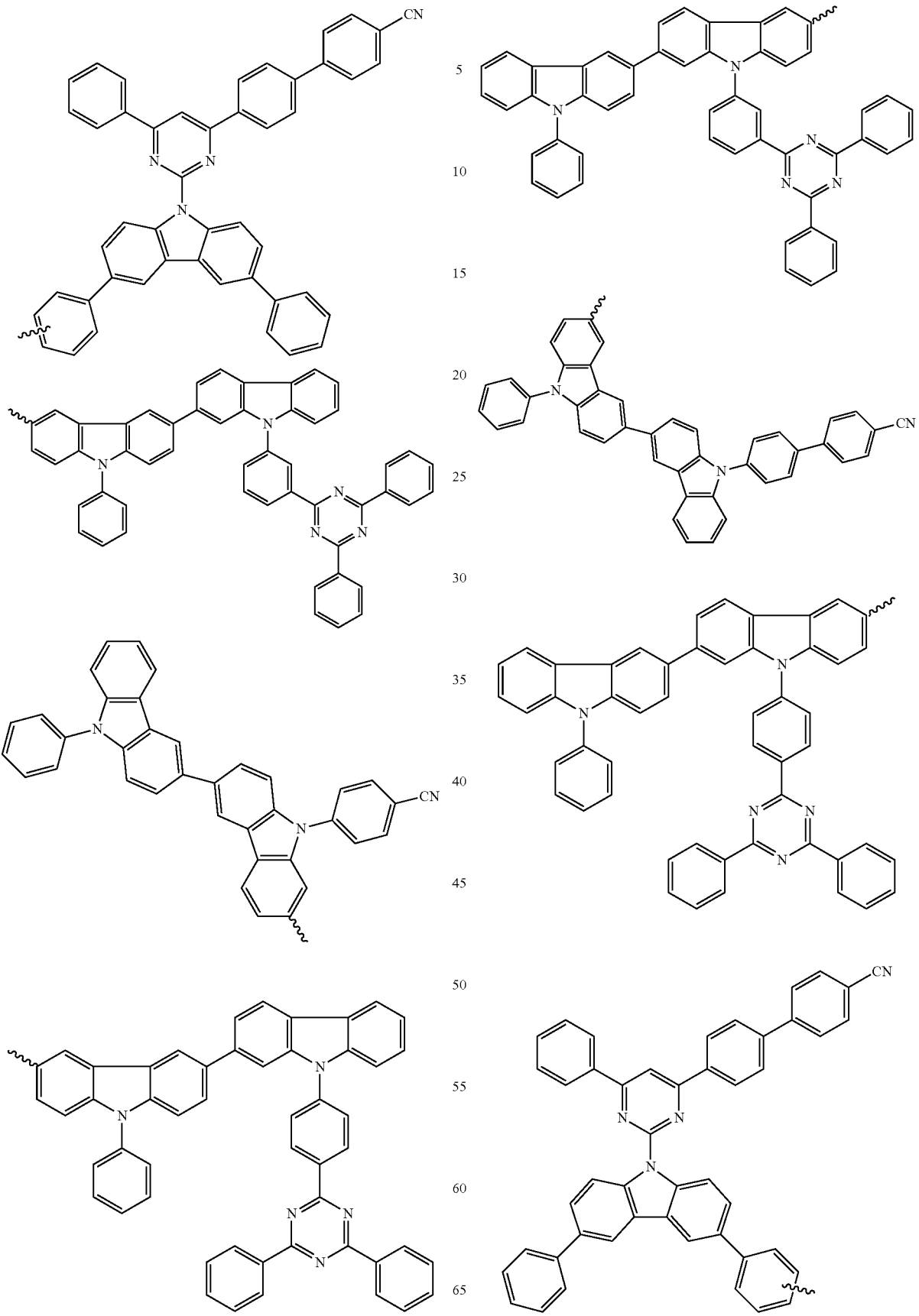

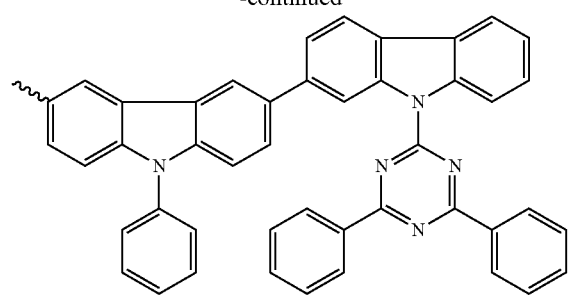
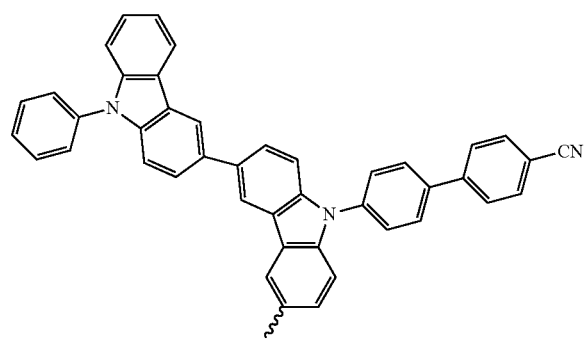
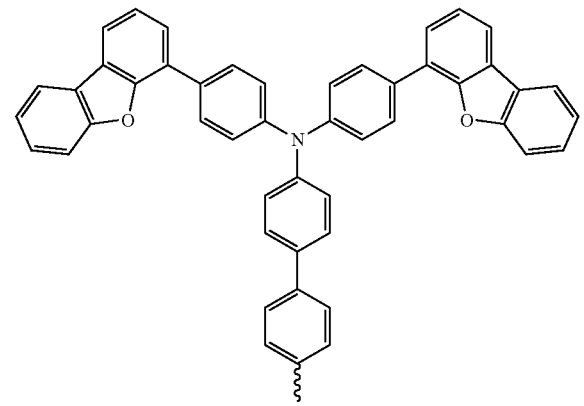
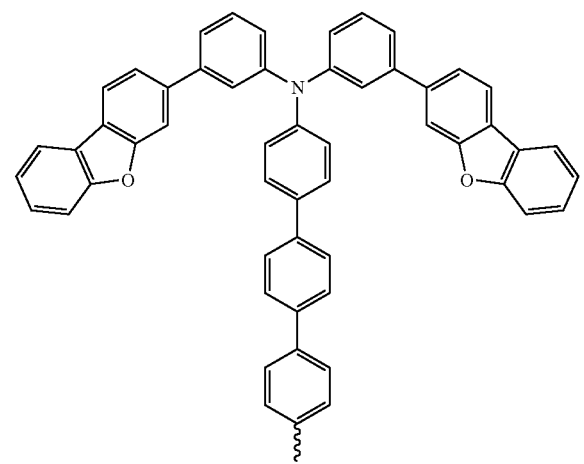
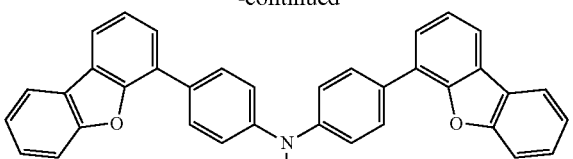
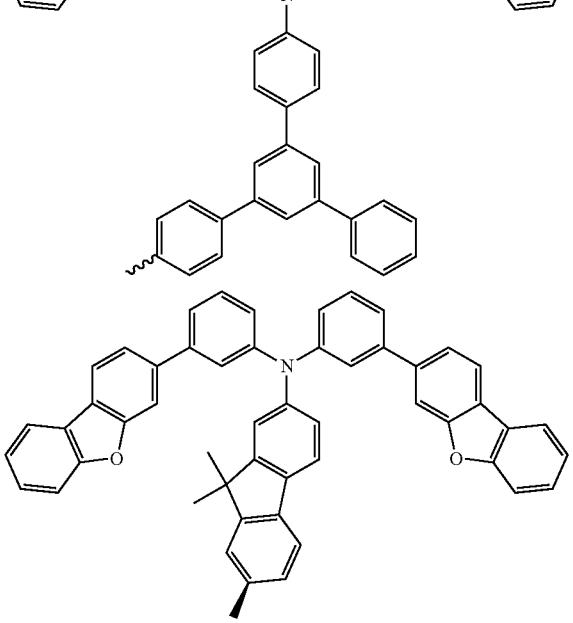
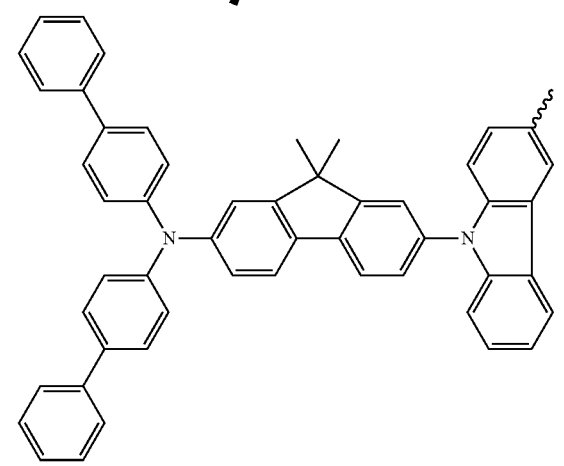
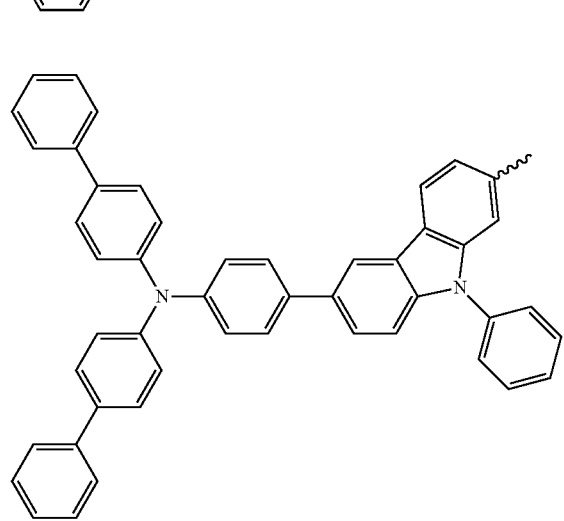

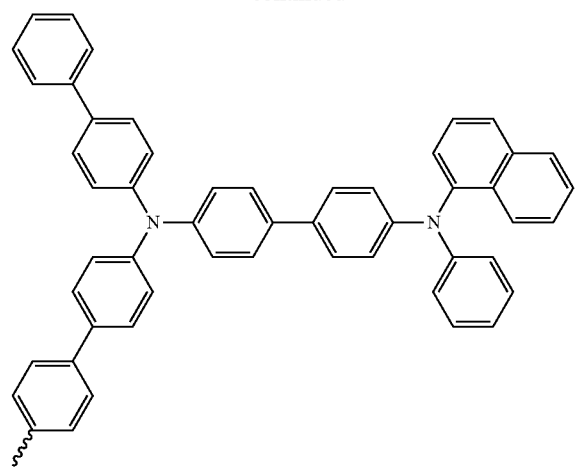
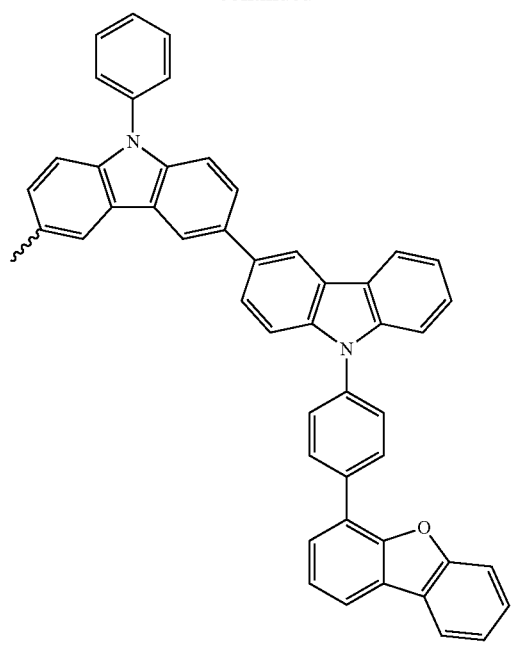
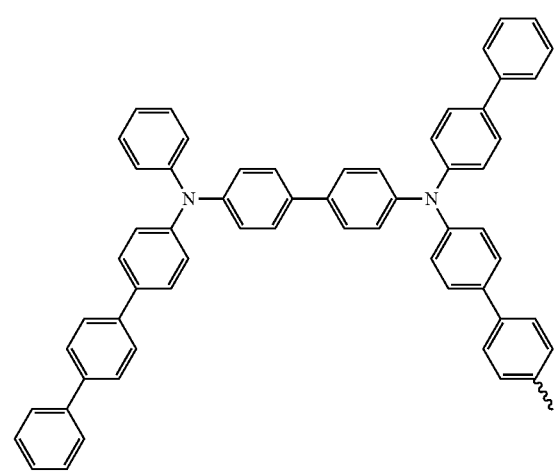
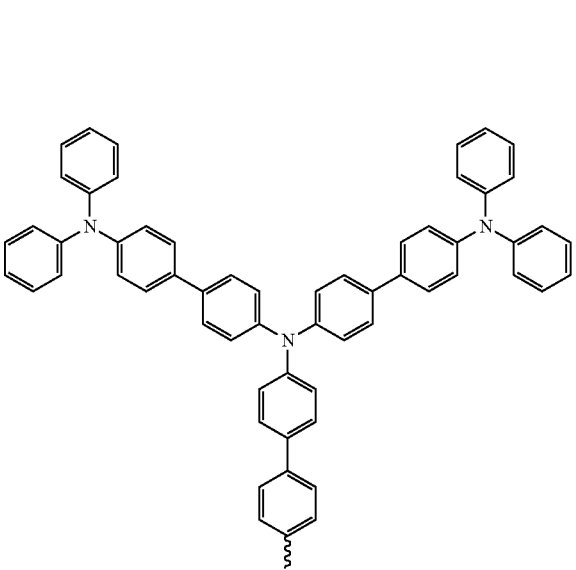
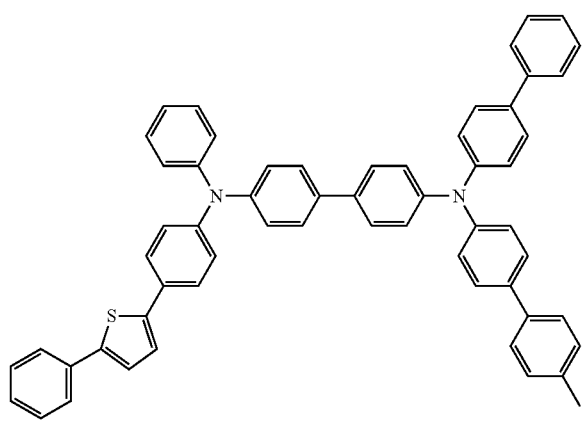
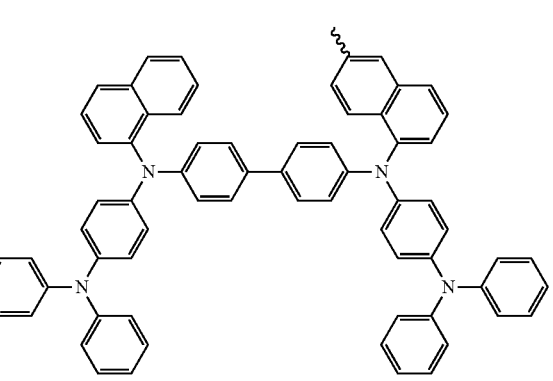

-continued
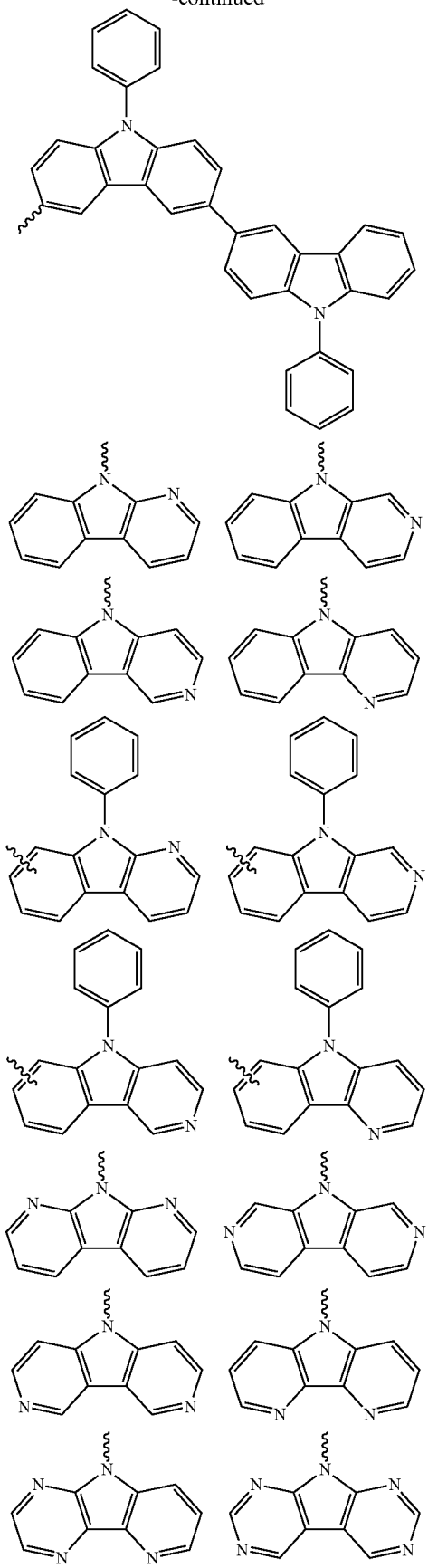
-continued
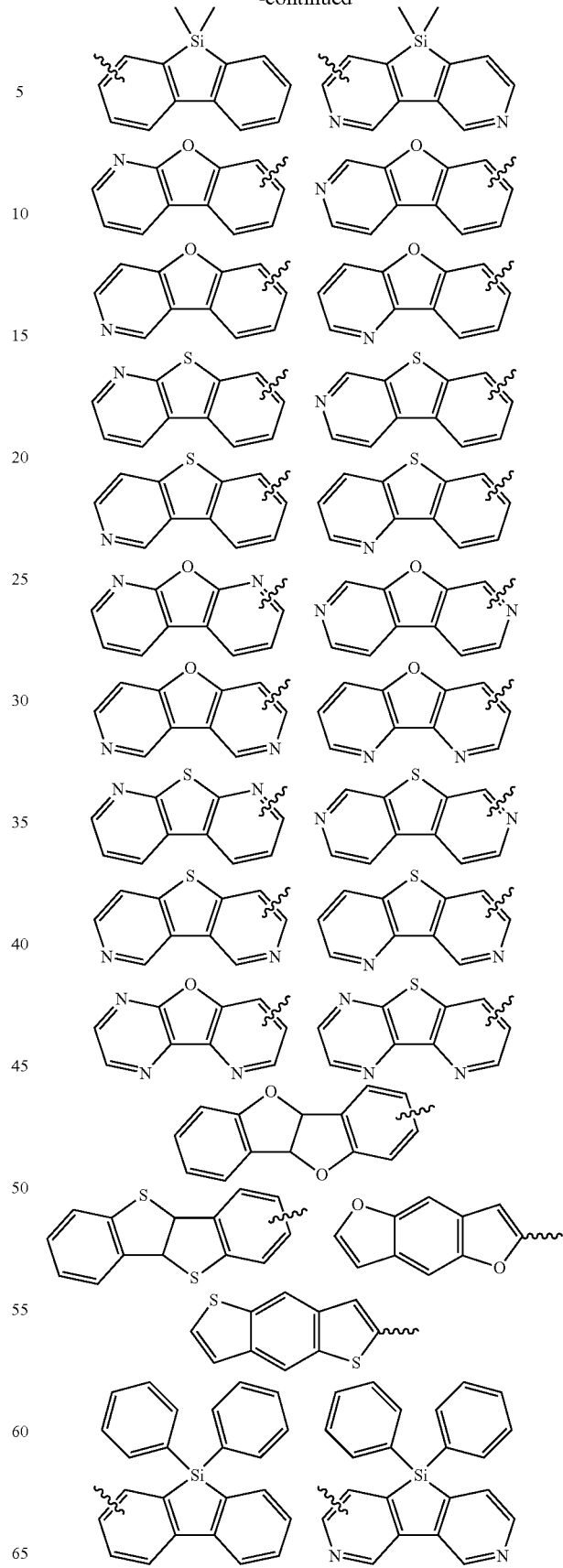

The parenthesized structure in the above-mentioned formula (2) includes a dicyclic structured condensed ring containing a hetero ring, such as quinoline, isoquinoline, quinoline, isoquinoline, isobenzofuran, quinazoline, quinoxaline, benzimidazole.

Next described is the unit C. The unit C increases the linearity of the polymer compound. As having an increased linearity, the interaction to the solution containing the polymer compound increases and therefore the solution viscosity increases. Owing to the entanglement of the polymer compound molecules, the unit has another effect of increasing the viscosity. The effect becomes remarkable with the increase in the molecular weight.

Accordingly, the unit C preferably has a linear structure in which the polymer chain extends in the opposite directions (180°).

The unit C is a unit that constitutes the polymer main chain and represented by the following formula (3), (4) or (5).

(3)

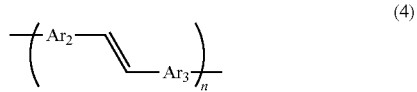
(4)

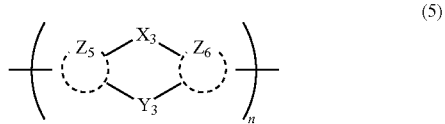
(5)

The above $Ar_1$ to $Ar_3$ each represent a substituted or unsubstituted aromatic hydrocarbon cyclic group, or a substituted or unsubstituted aromatic heterocyclic group.

As examples of the aromatic hydrocarbon cyclic group and the aromatic heterocyclic group, there are mentioned the examples of the aryl group and the heteroaryl group of the substituent (R) in the above-mentioned unit A, in which the groups are converted into divalent ones. As examples of the substituted or unsubstituted substituent, there are mentioned the same examples as those of the substituent of the above-mentioned unit A. The unit C is preferably unsubstituted form the viewpoint of securing the linear structure thereof. In a case of requiring a substituent from the viewpoint of improving the stability of the polymer compound, preferred is a non-bulky group having little influence on the linear structure, such as a phenyl group, a methyl group or the like. In a case of a copolymer formed of the unit B and the unit C, the copolymer may be composed of two pairs of units comprising B—C bonds, in which a substituent for solubility improvement may be introduced into one B-C unit alone to thereby secure good solubility and improved solution viscosity. In the formulae (3), (4) and (5), n may be 2 or more, and a substituent for solubility improvement may be introduced into only one repeating unit therein so as to secure good solubility and improved solution viscosity.

$X_3$ and $Y_3$ each represent a single bond, $CR^1_2$, $NR^1$, O, S, or $SiR^1_2$, $R^1$ represents a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group.

As examples of the alkyl group, the cycloalkyl group, the aromatic hydrocarbon cyclic group and the aromatic heterocyclic group of $R^1$, there are mentioned the same examples as those of the alkyl group, the cycloalkyl group, the aryl group and the heteroaryl group of the substituent (R) in the above-mentioned unit A, and as examples of the substituted or unsubstituted substituent, there are also mentioned the same examples as those of the substituent in the unit A. Also in this case, preferred is a non-bulky group having little influence on the linear structure, such as a phenyl group, a methyl group or the like.

$Z_5$ and $Z_6$ each represent a substituted or unsubstituted divalent aliphatic hydrocarbon cyclic group, a substituted or unsubstituted divalent aliphatic heterocyclic group, a substituted or unsubstituted divalent aromatic hydrocarbon cyclic group, or a substituted or unsubstituted divalent aromatic heterocyclic group, and as examples of these groups, there are mentioned the same examples as those of $Z_1$.

n indicates an integer of from 1 to 50, and is preferably from 1 to 5. When n is 2 or more, the parenthesized moieties may be the same or different.

In the formula (5), when $X_3$, $Y_3$, and $Z_5$ to $Z_6$ bond to -, the valence increases by 1. When they bond to two -'s, the valence increases by 2. The formula (5) is not limited to a tricyclic condensed ring. In the formula, $Z_5$ and $Z_6$ may take a condensed ring thereby providing a tetracyclic condensed ring or a pentacyclic or more polycyclic condensed ring having two bonds which is exemplified hereinunder.

Preferably, the formulae (3) to (5) have any structure of the following formulae (1) to (10). In those cases, the polymer chain extends in the opposite directions (180°) and therefore the formulae may have a structure nearer to a linear structure, and consequently the cases are preferred from the viewpoint of increasing the viscosity.

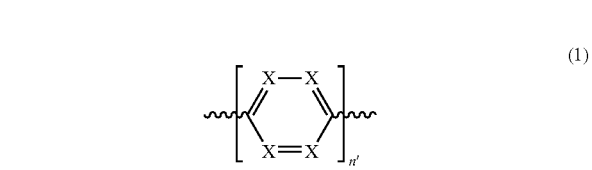
(1)

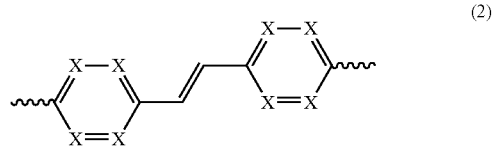
(2)

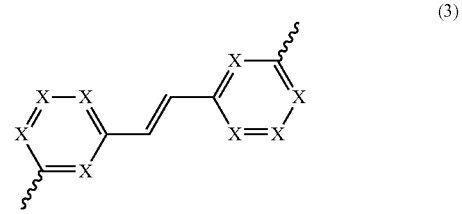
(3)

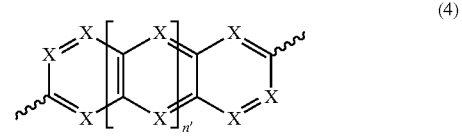
(4)

(5)
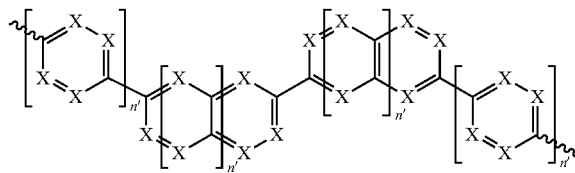

(6)
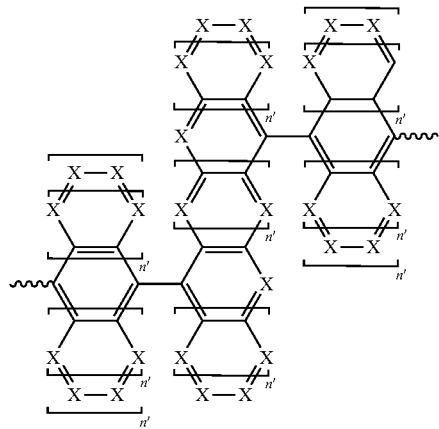

(7)
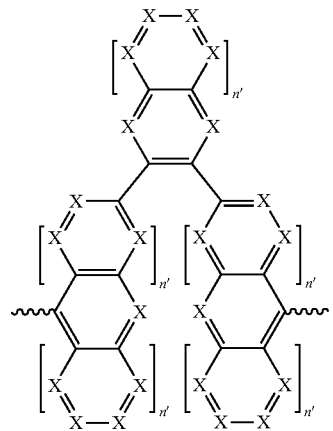

(8)
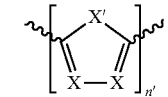

(9)
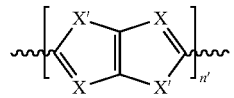

(10)
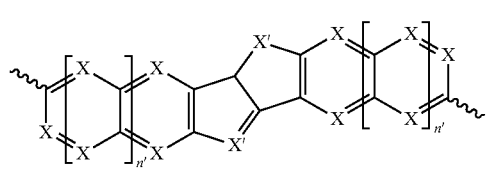

In the formulae, X represents $CR^3$, X' represents $CR^3{}_2$, a nitrogen atom (in a divalent case, $NR^3$), a phosphorus atom (in a divalent case, $PR^3$), PO (in a divalent case, $P(=O)R^3$), O in a divalent case, S in a divalent case, or $SiR^3{}_2$ in a divalent case, $R^3$ represents a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon atoms of from 6 to 30, or a substituted or unsubstituted heteroaryl group having a ring atoms of from 5 to 30. Plural $R^3$'s may bond to form a ring. n' indicates an integer of from 0 to 5. However, when n' is 0 and when a ring is not formed, n' is an integer of from 1 to 5.

As the substituted or unsubstituted alkyl group having a carbon number of from 1 to 20, the substituted or unsubstituted cycloalkyl group having a ring carbon atoms of from 3 to 16, the substituted or unsubstituted aryl group having a ring carbon atoms of from 6 to 30, and the substituted or unsubstituted heteroaryl group having a ring atoms of from 5 to 30, concretely mentioned are the groups mentioned for the above-mentioned substituent (R). Preferred are the groups described in the section of describing the unit C.

As specific examples of the parenthesized moiety in the unit C, the following structures are mentioned. In the following structures, the wavy line indicates a bond, and R represents a substituent.

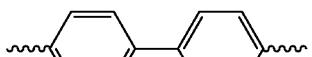

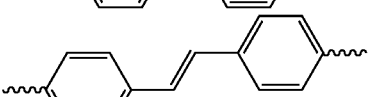

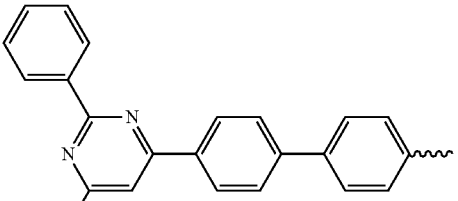

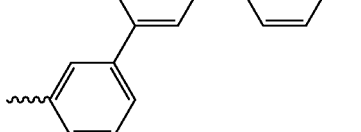

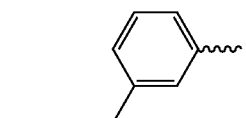

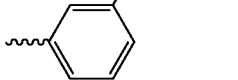

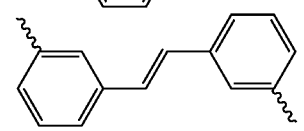

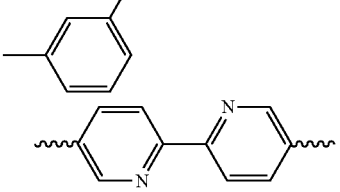

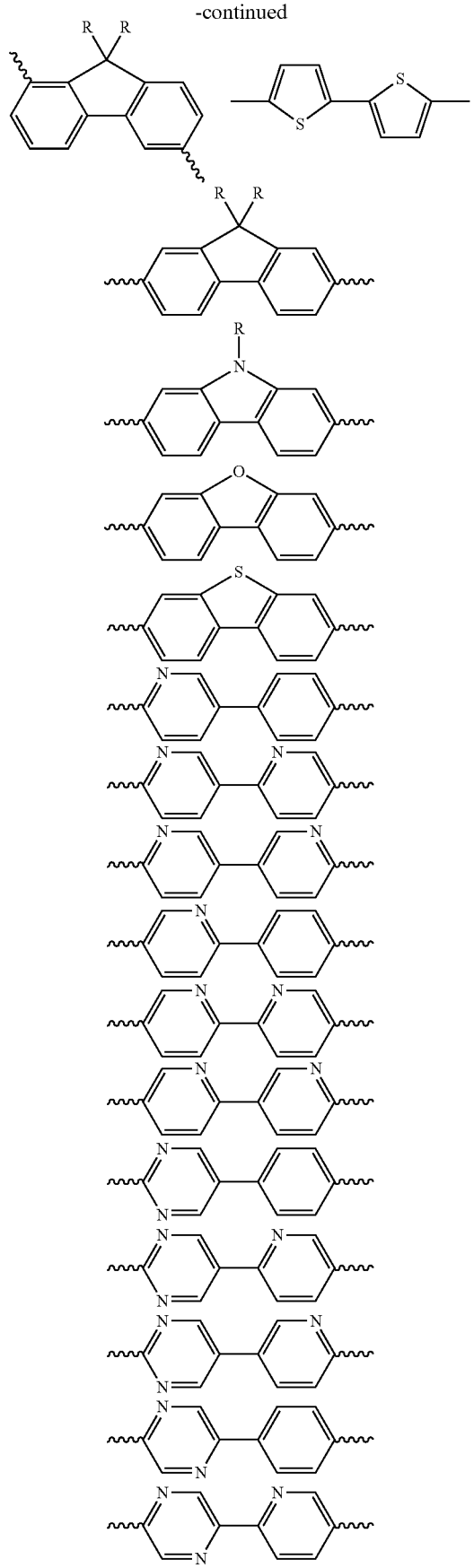
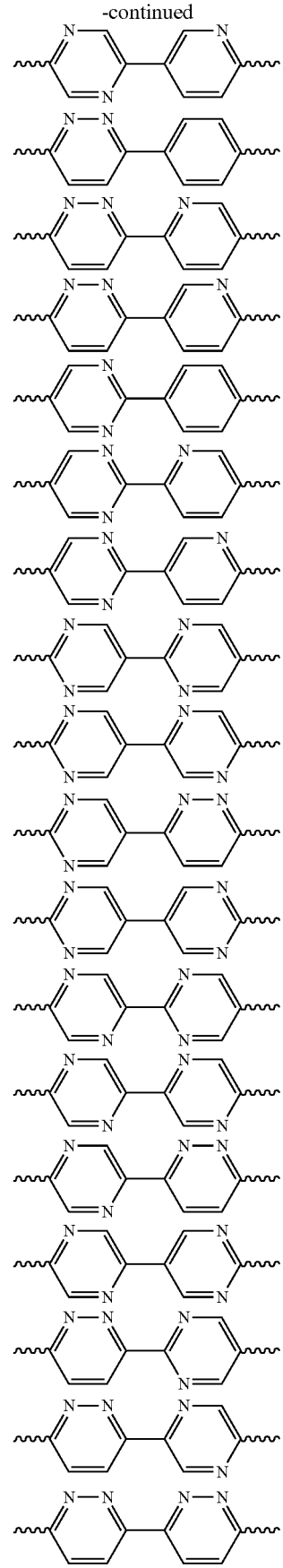

-continued
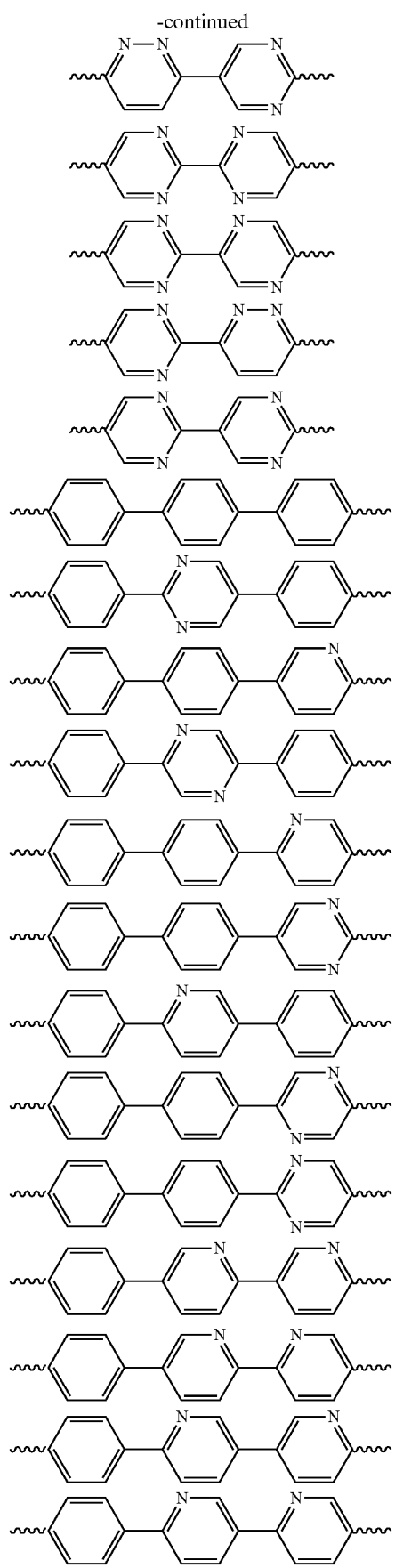
-continued
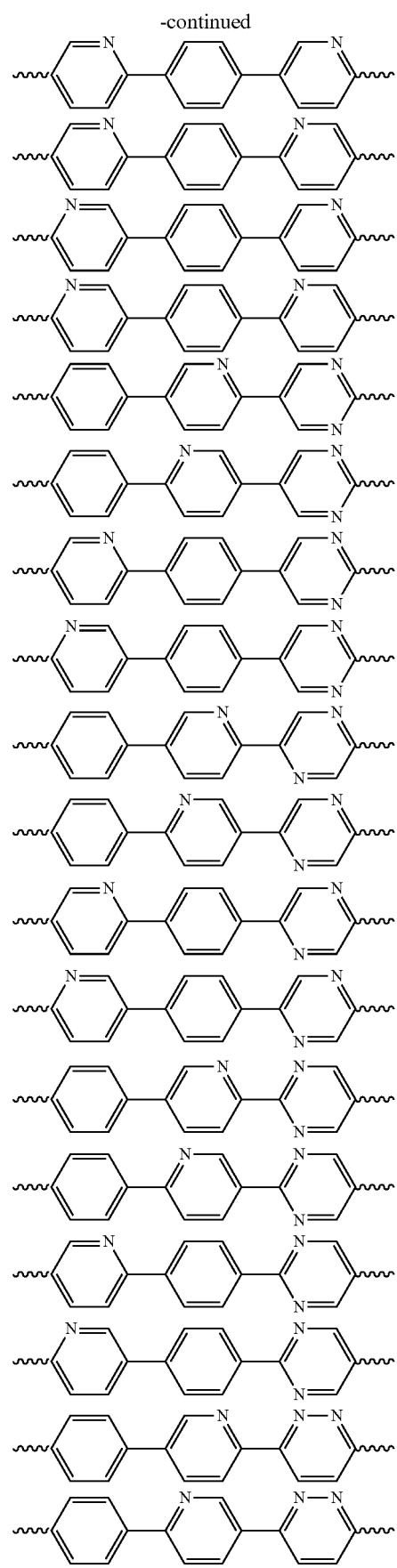

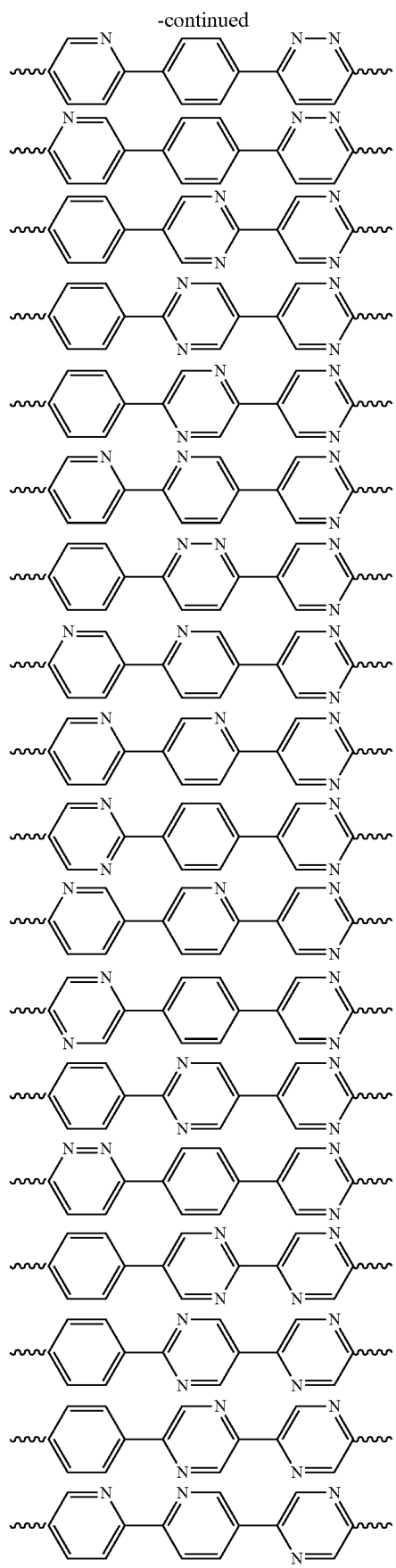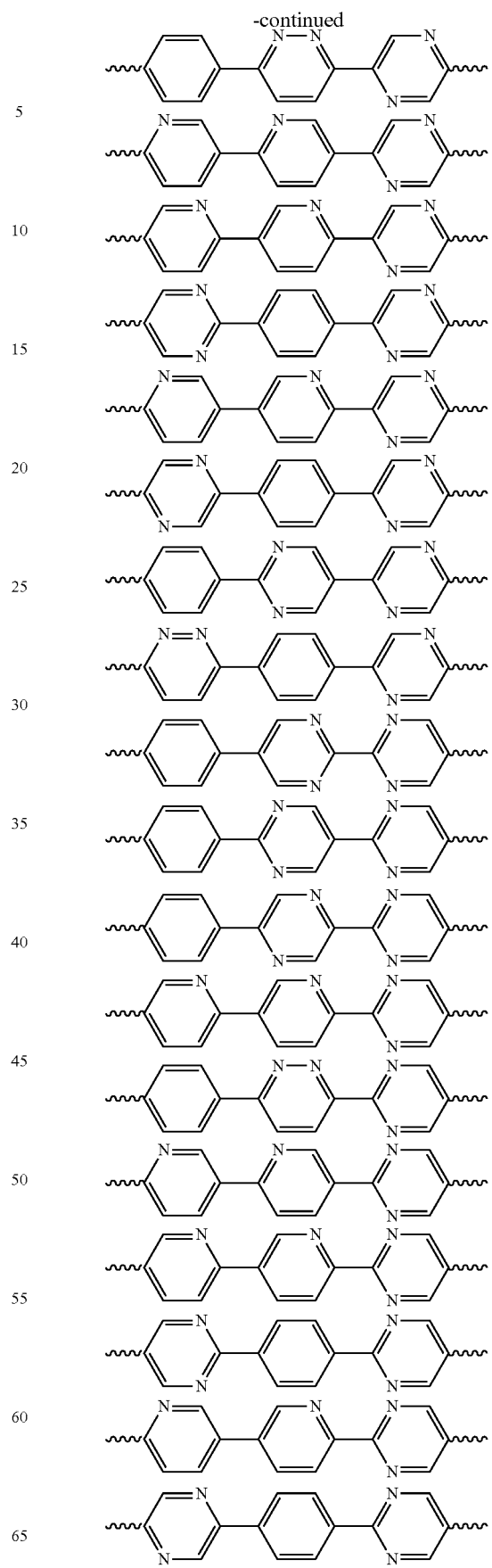

-continued
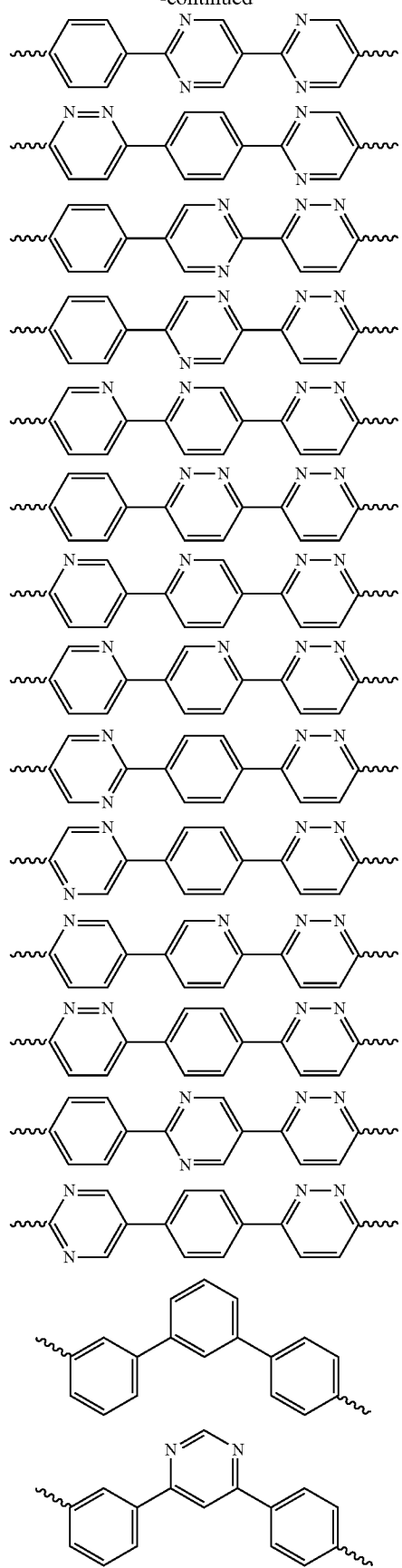
-continued
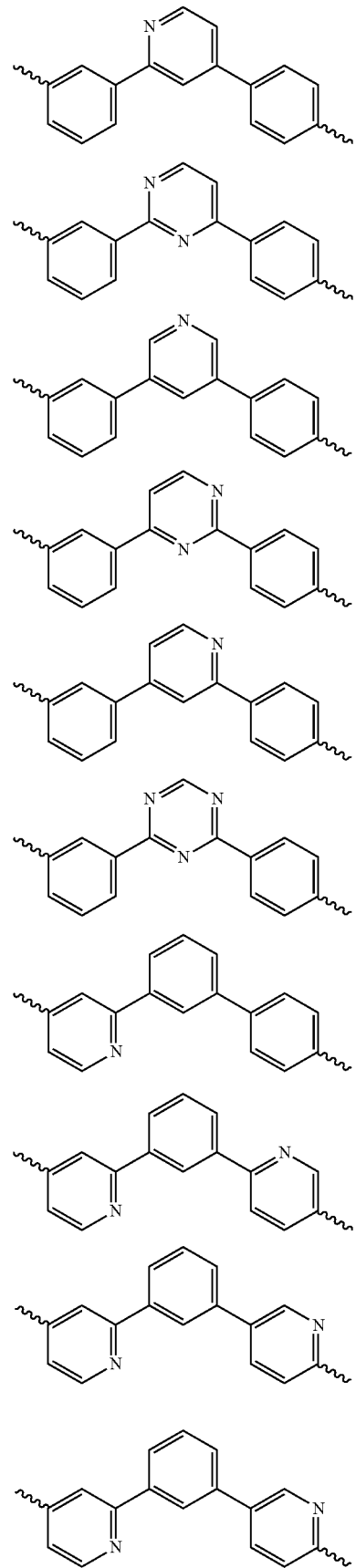

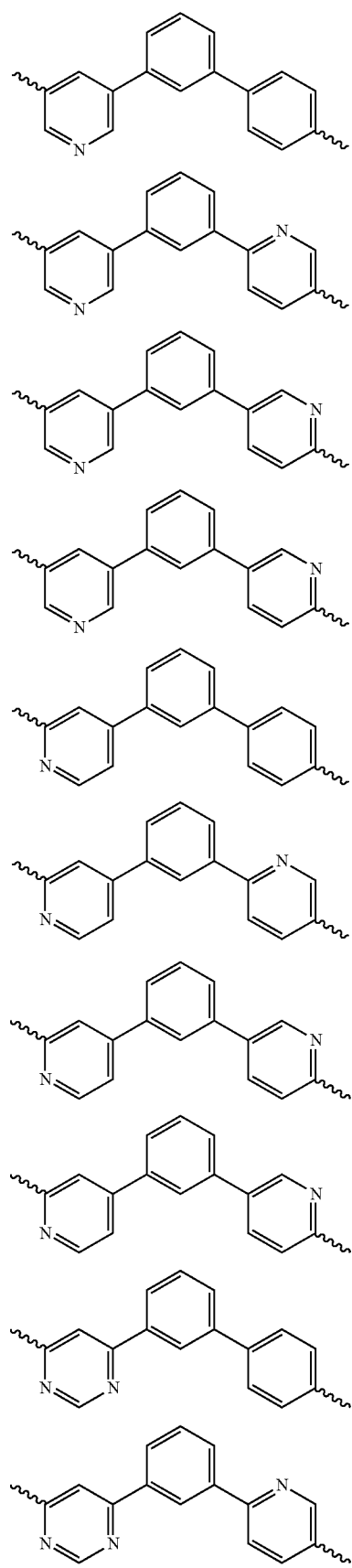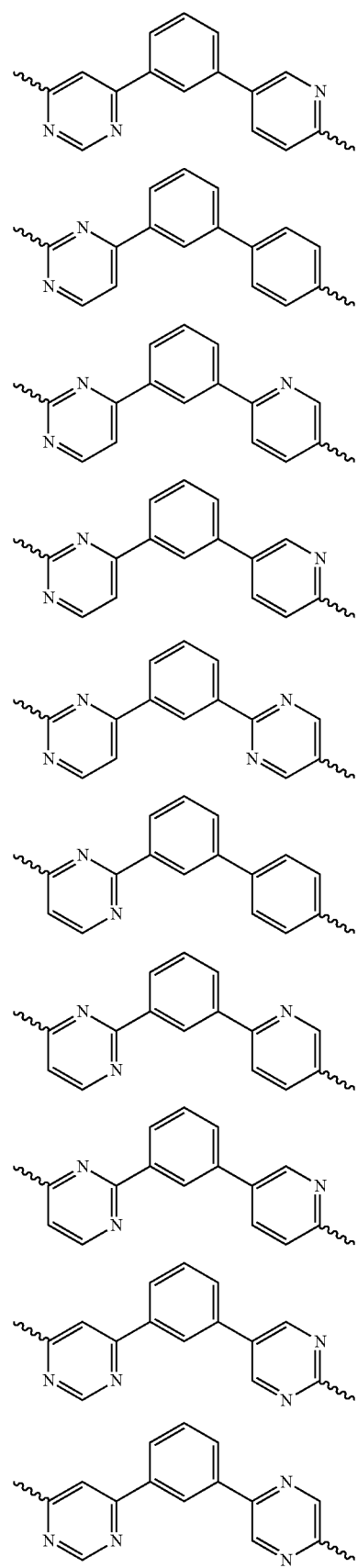

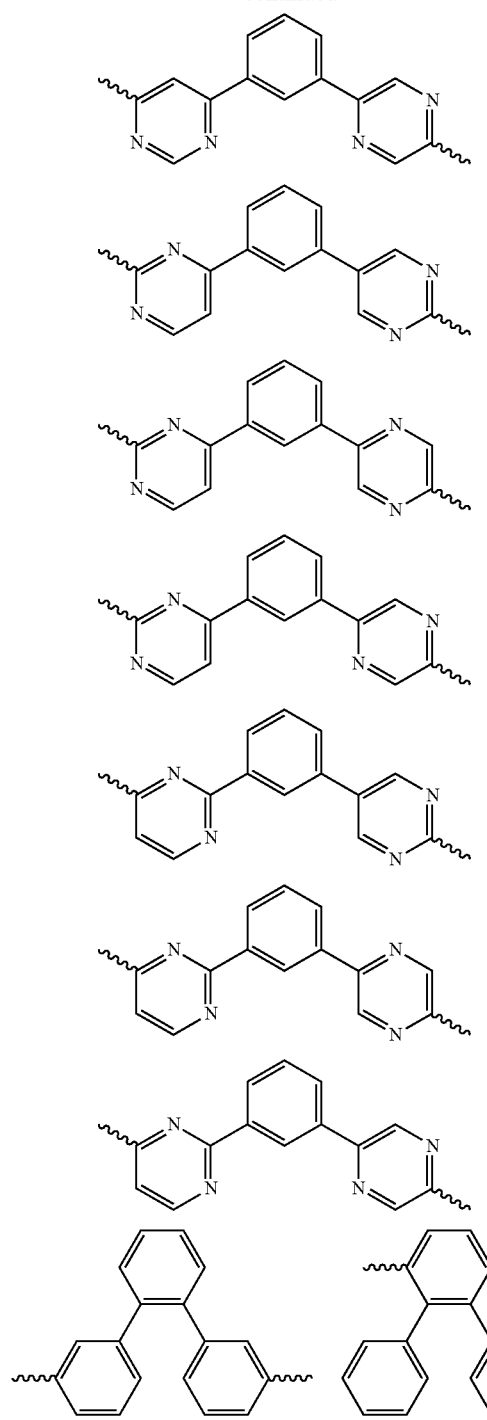
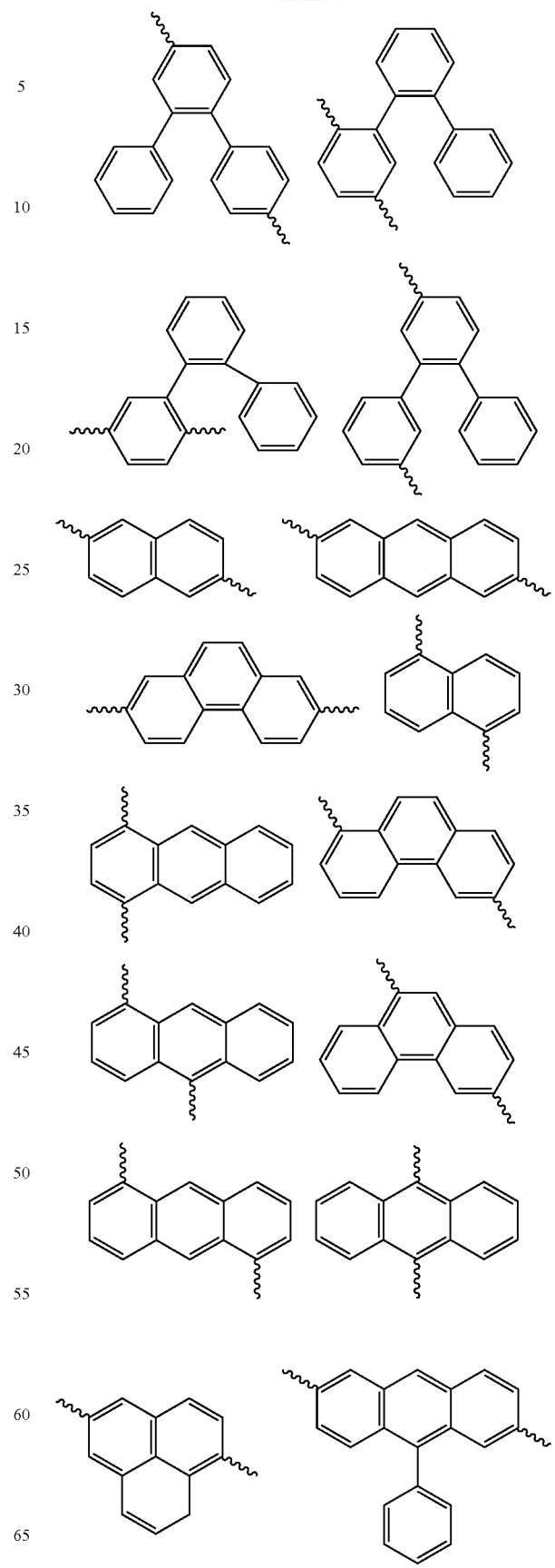

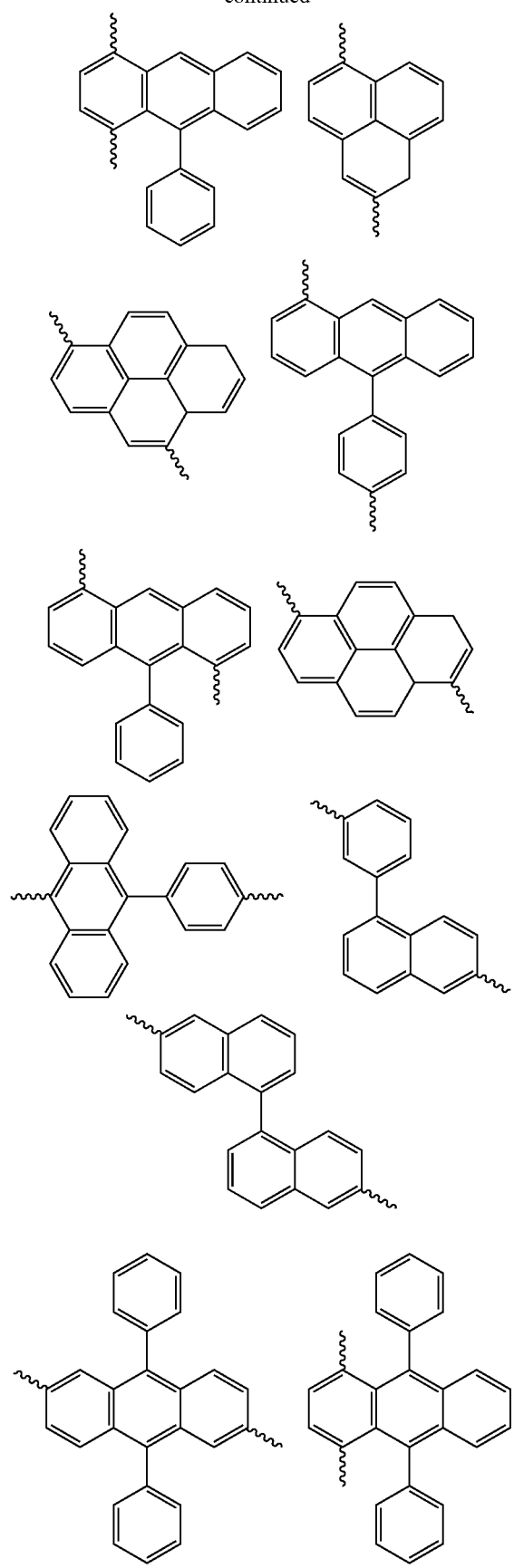
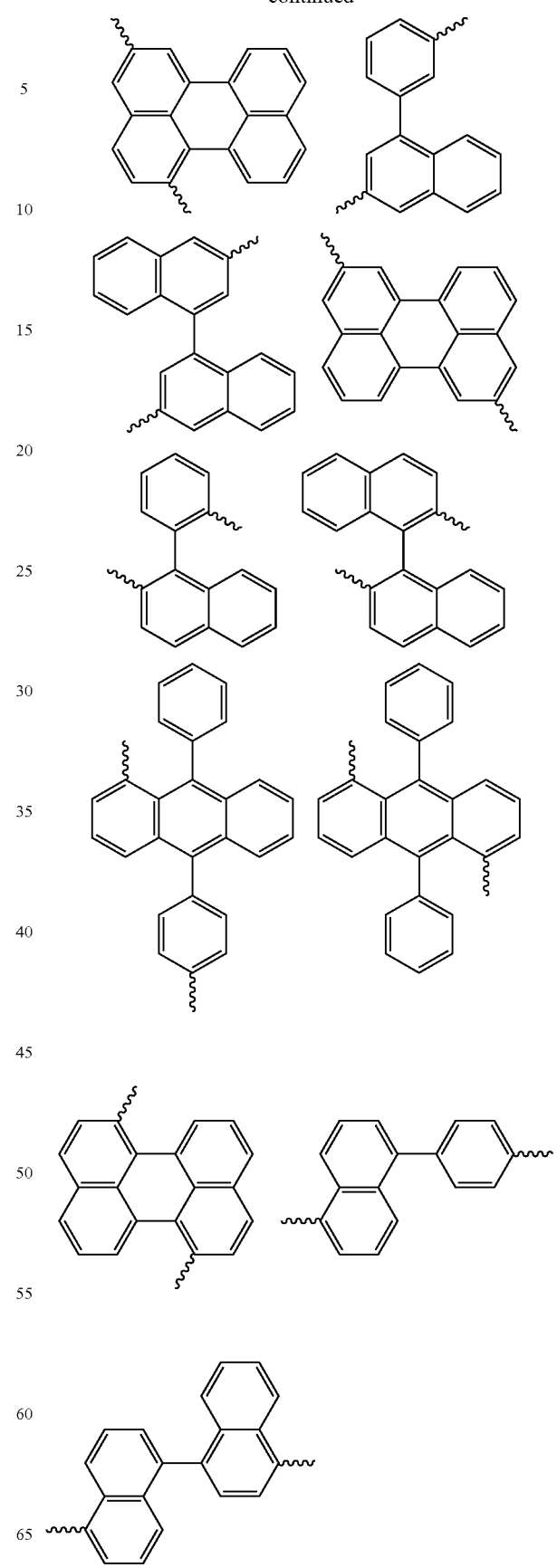

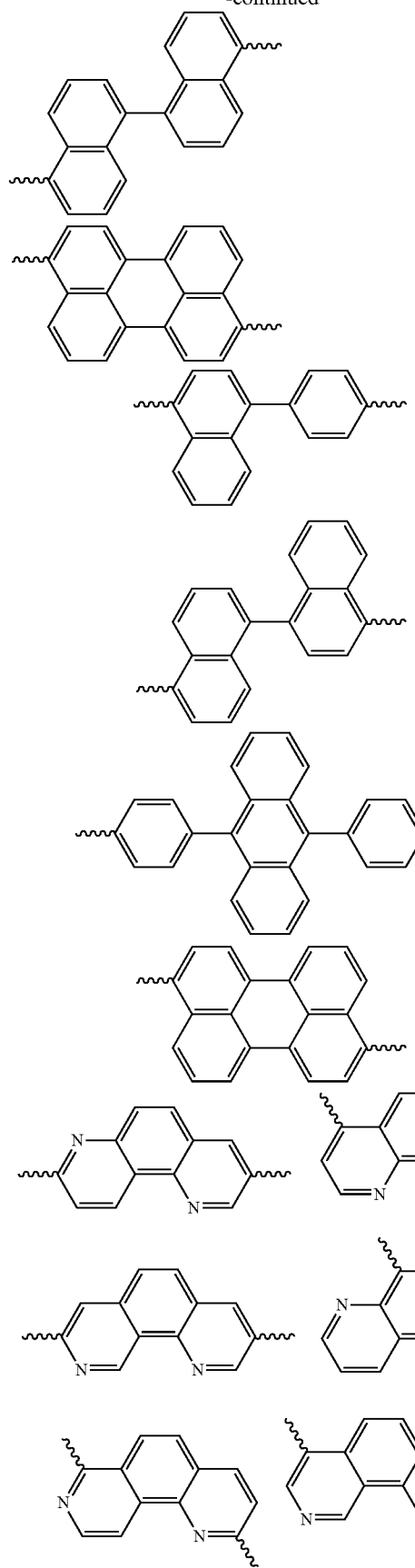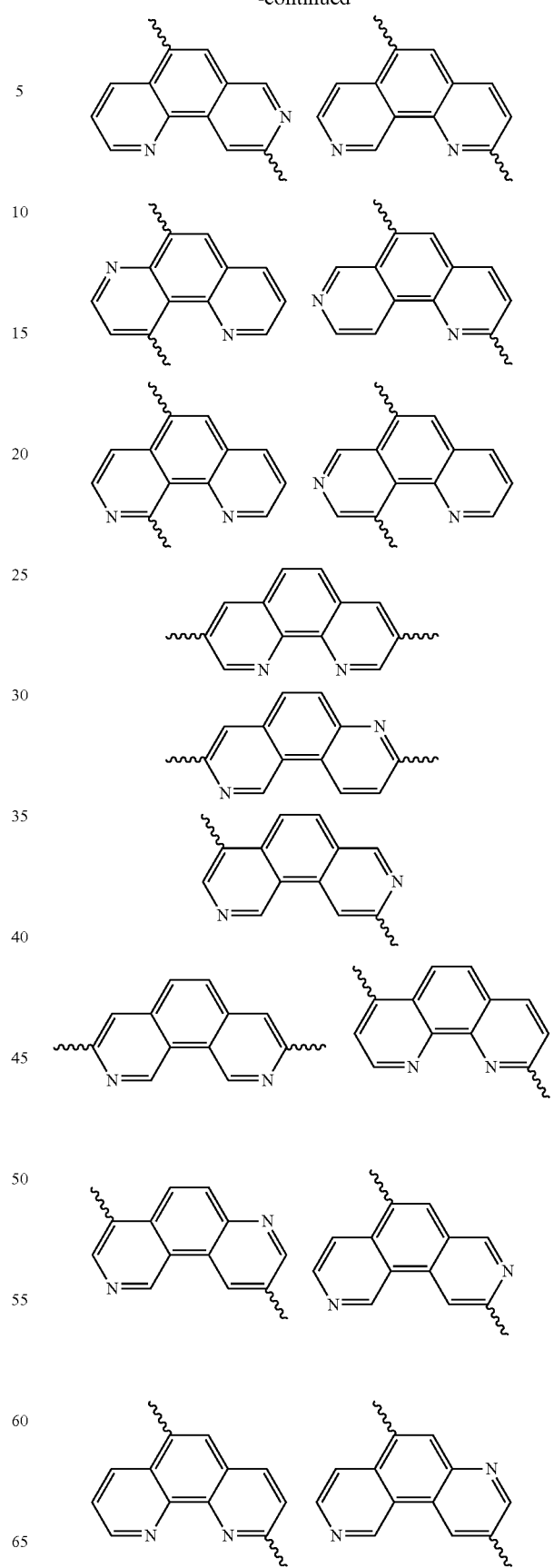

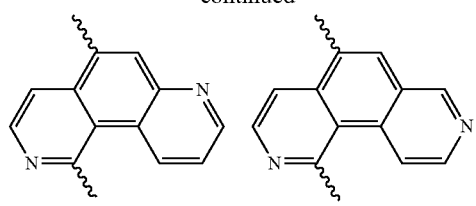
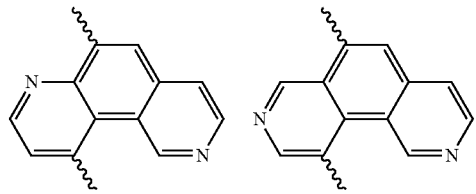
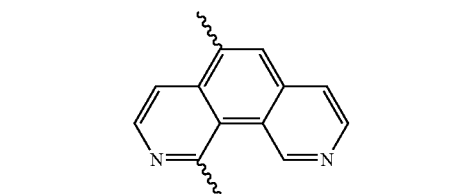
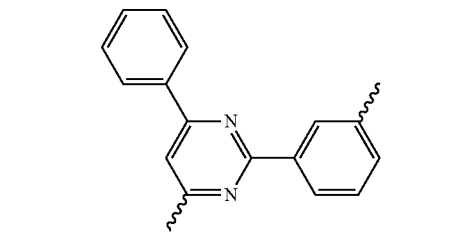
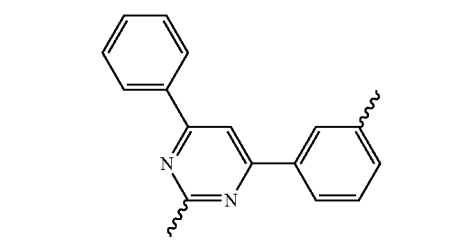
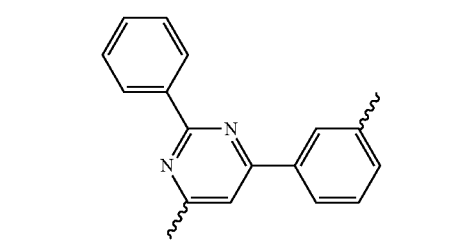
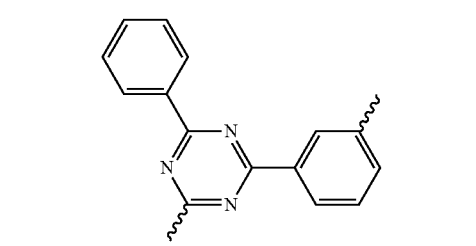
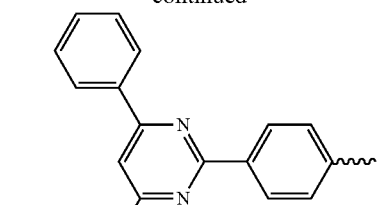
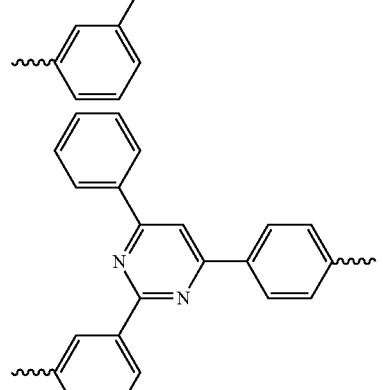
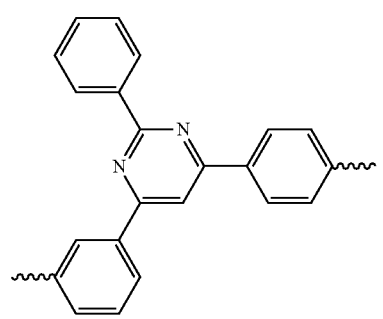
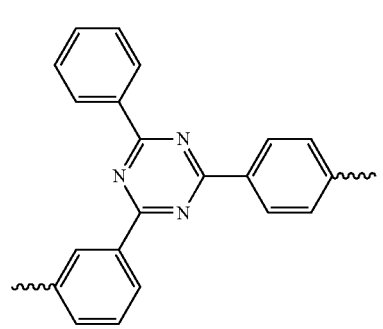
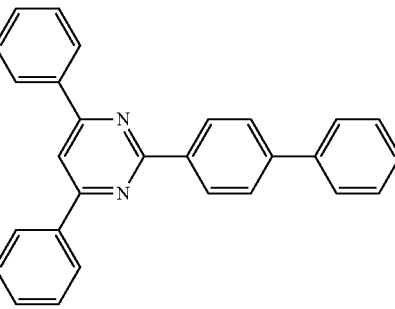

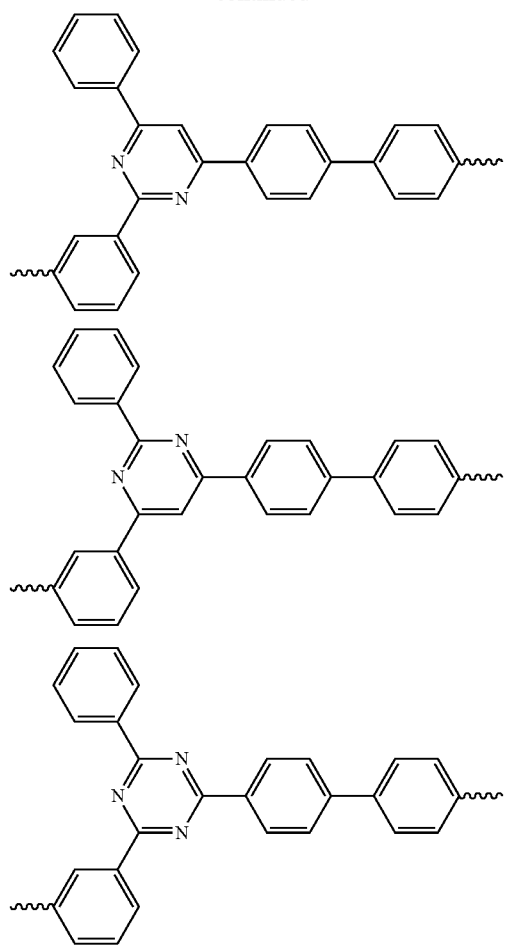
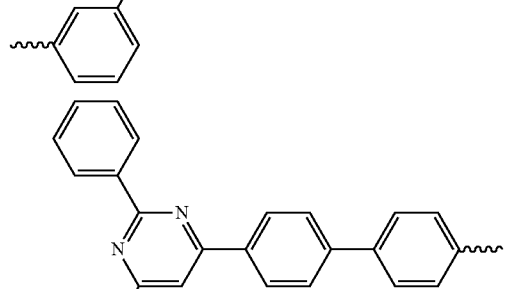
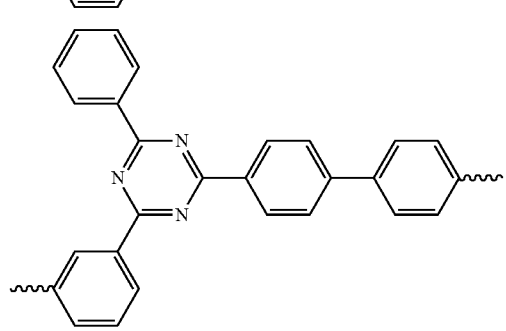
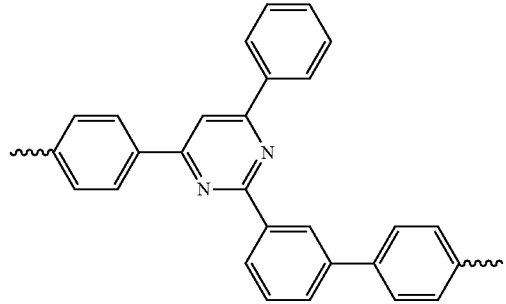
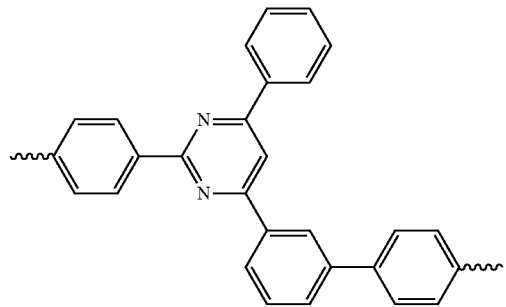
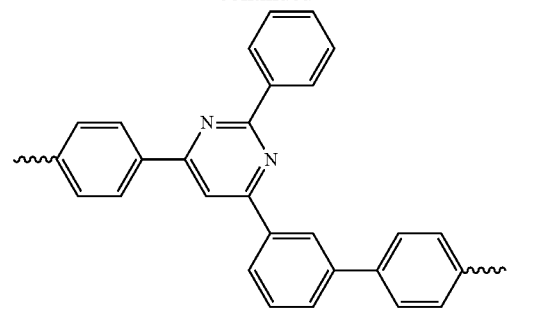
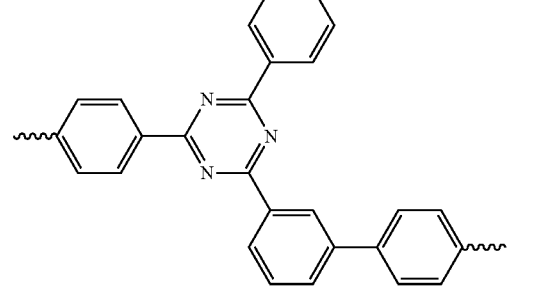
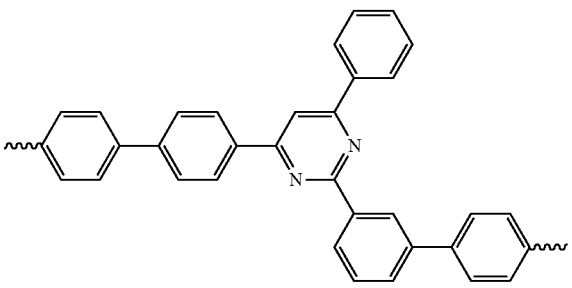
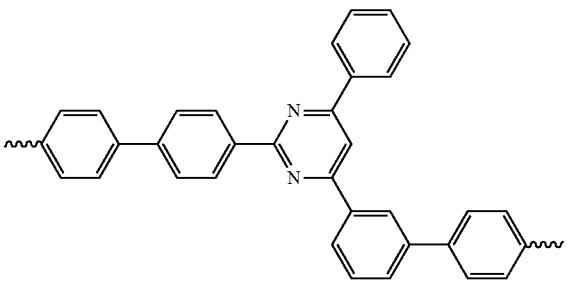
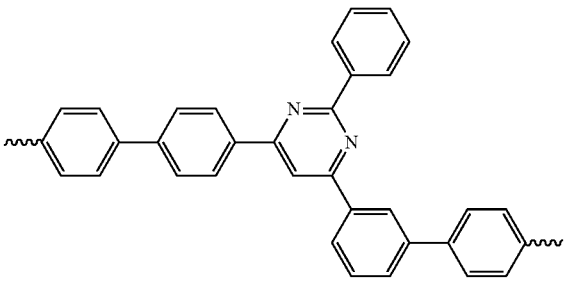
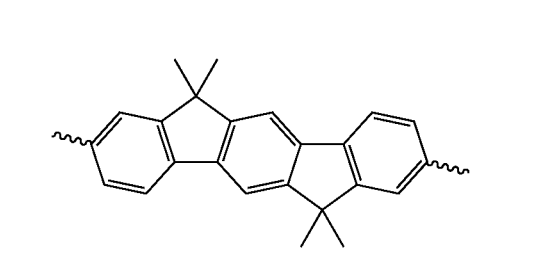

75
-continued
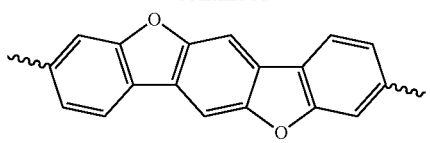
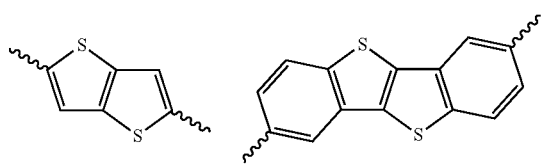
76
-continued
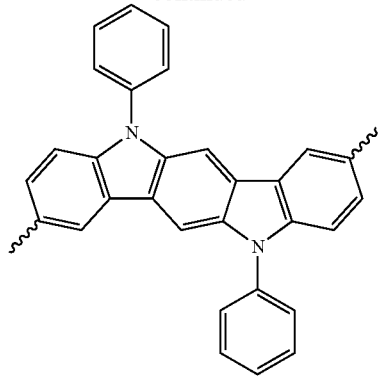
Not specifically defined, the copolymerization structure of the polymer compound of the present invention includes an alternate copolymer structure and a random copolymer structure.
The repeating units of the alternate copolymer structures include, for example, the following structures.
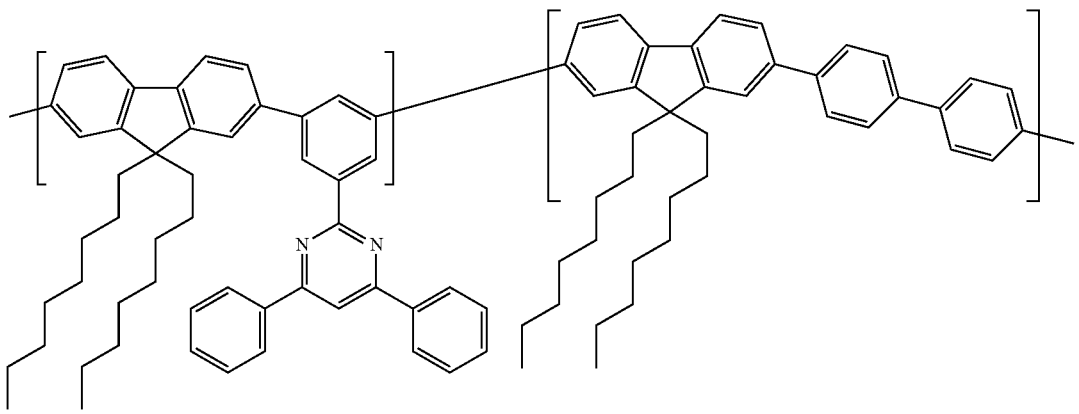
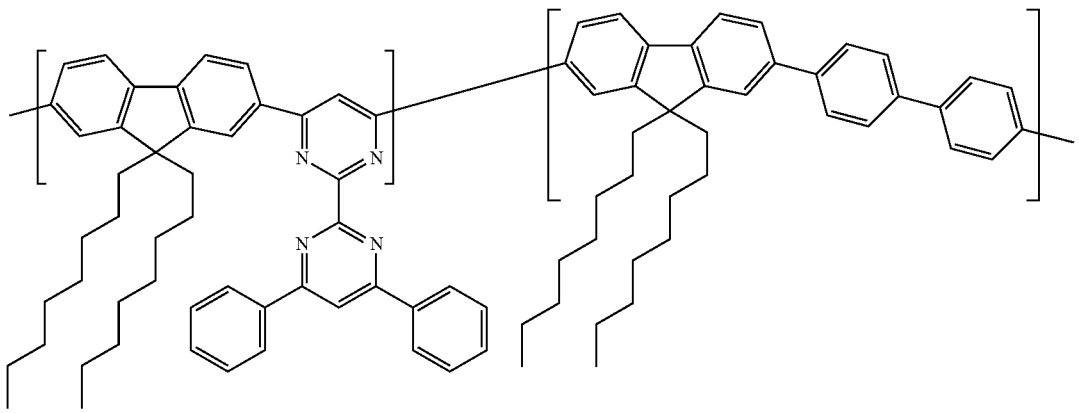

-continued
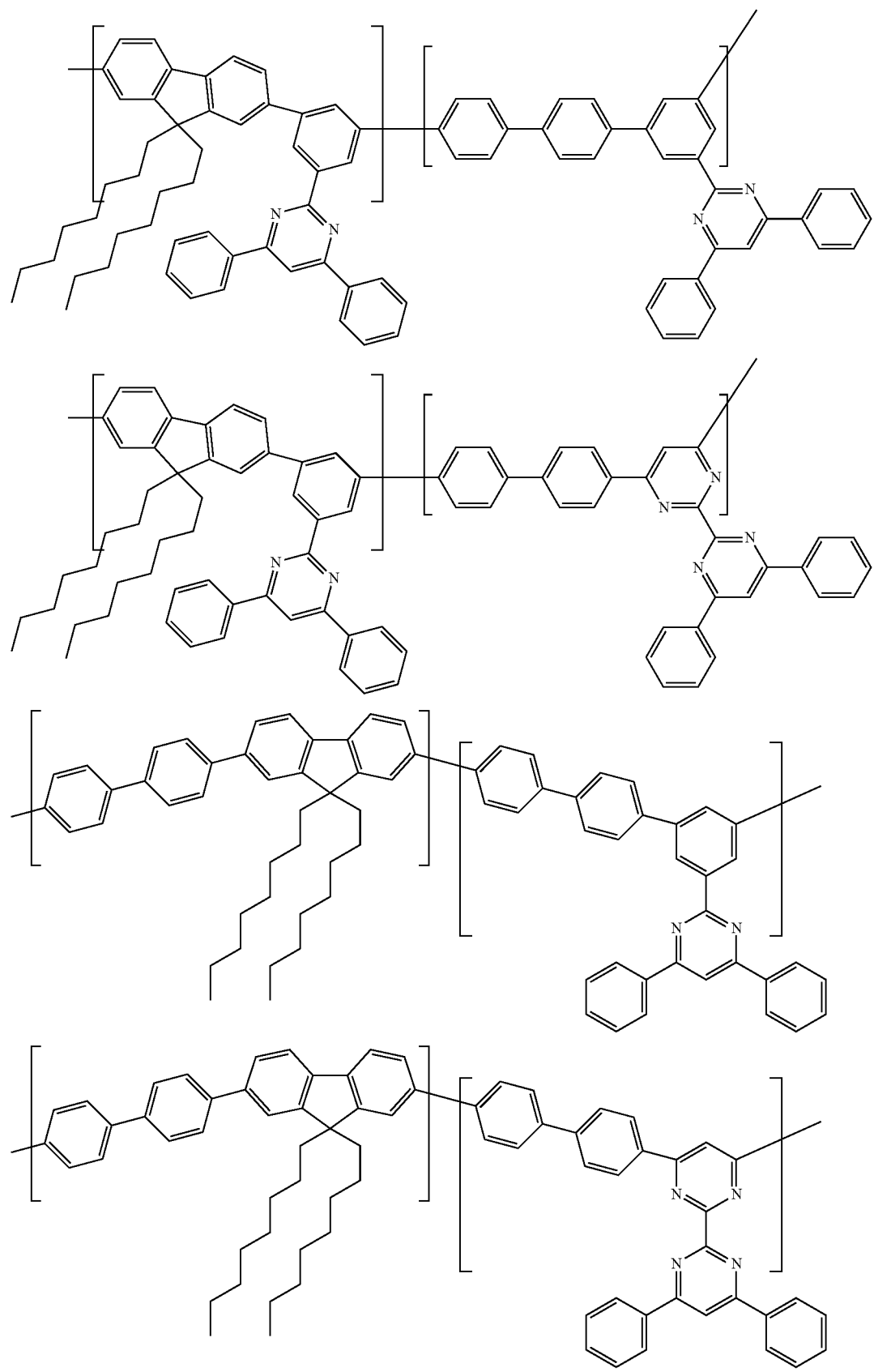

-continued
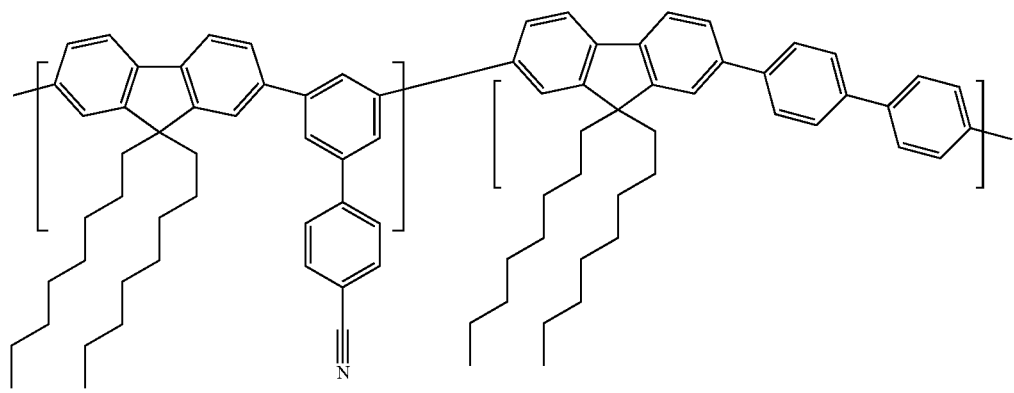
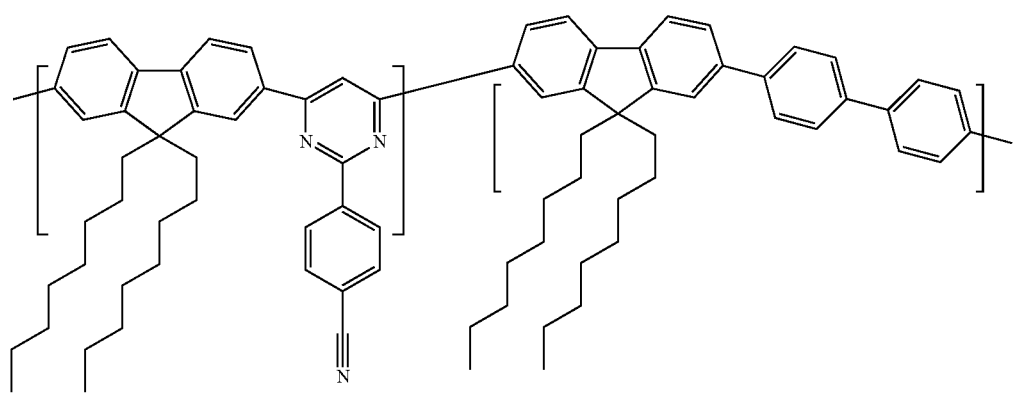
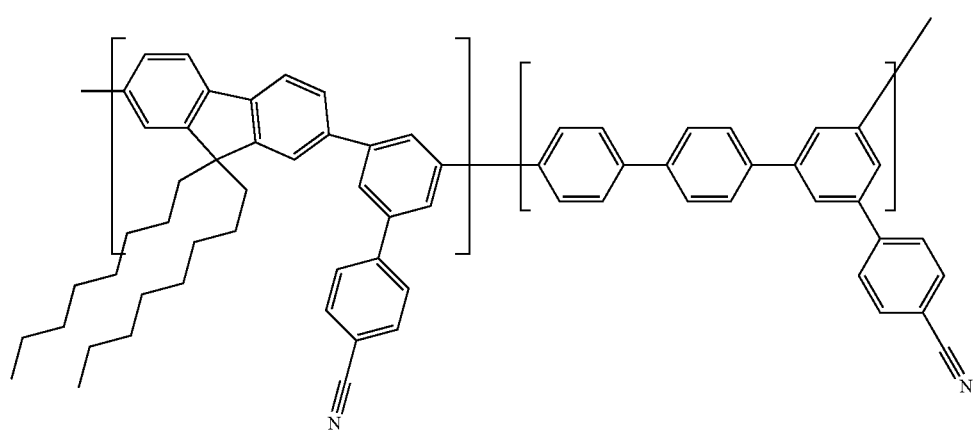
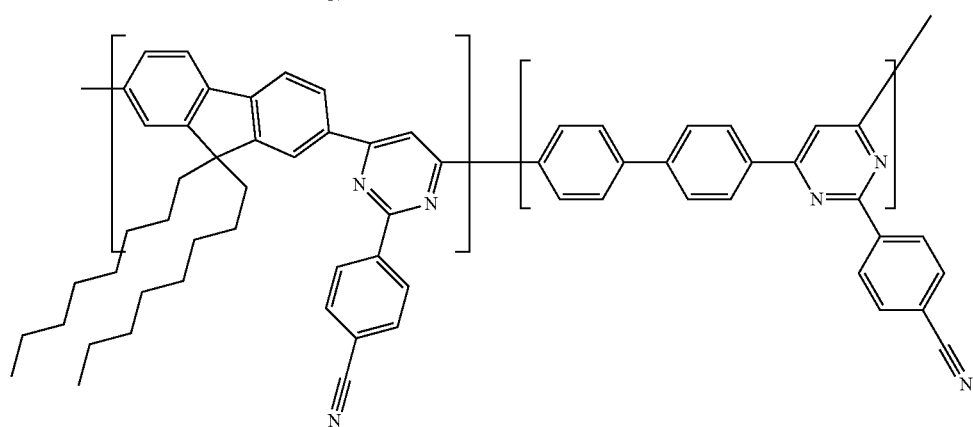

-continued
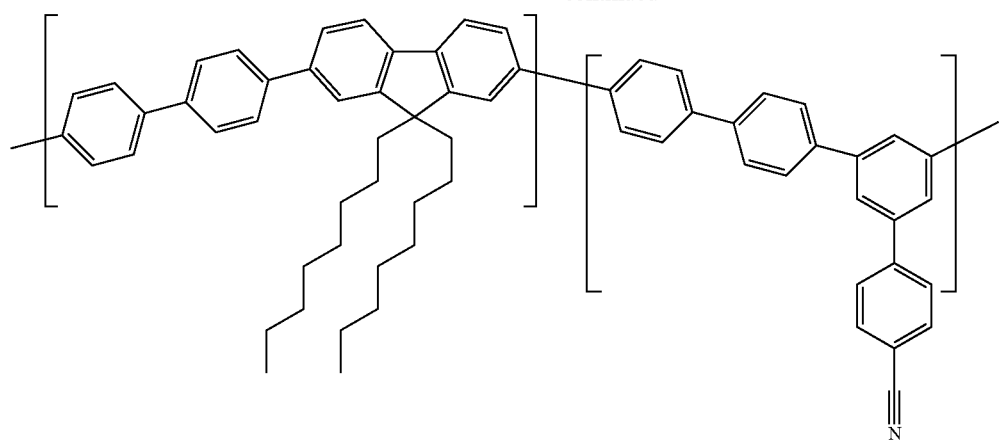
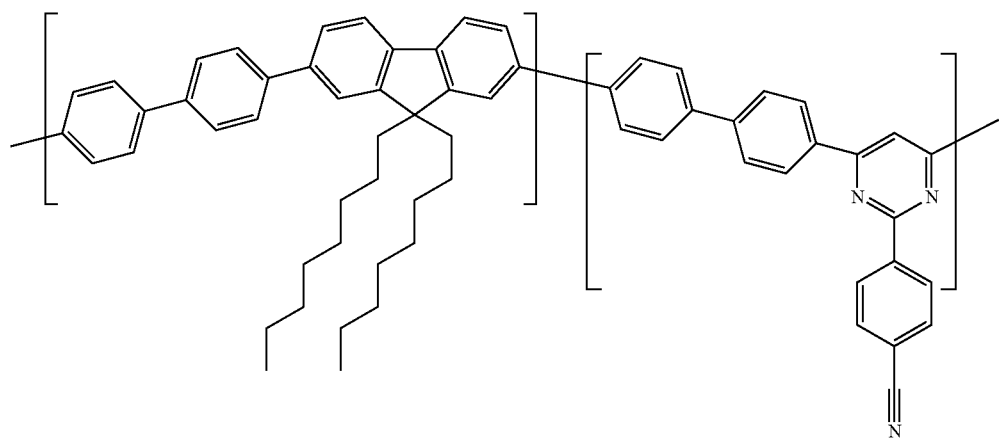
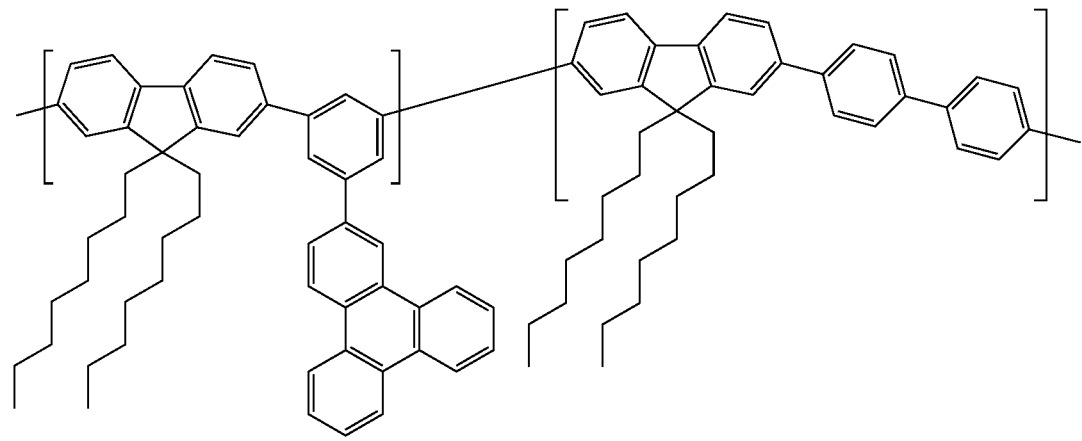

-continued
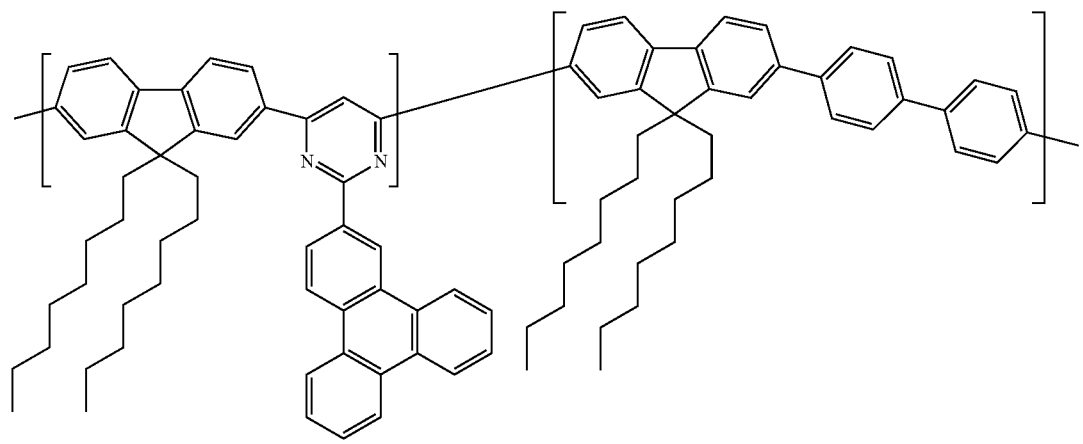
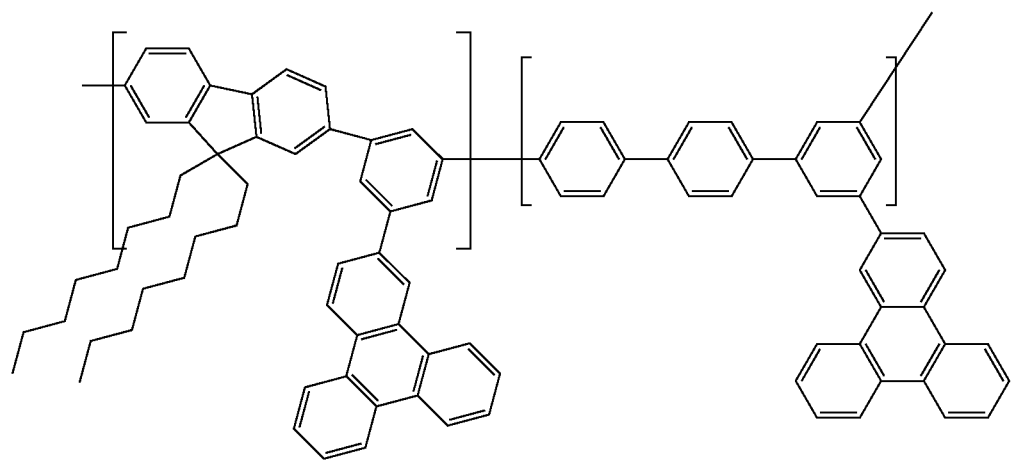
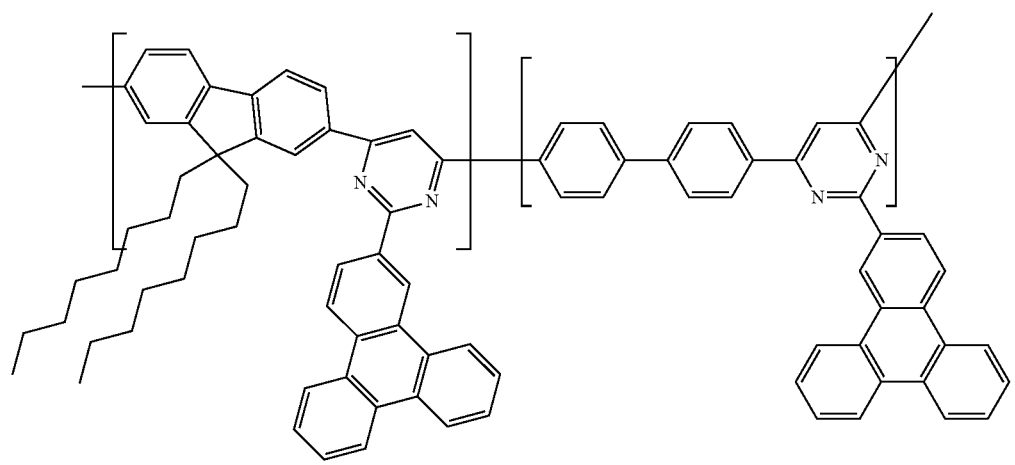

85 86
-continued
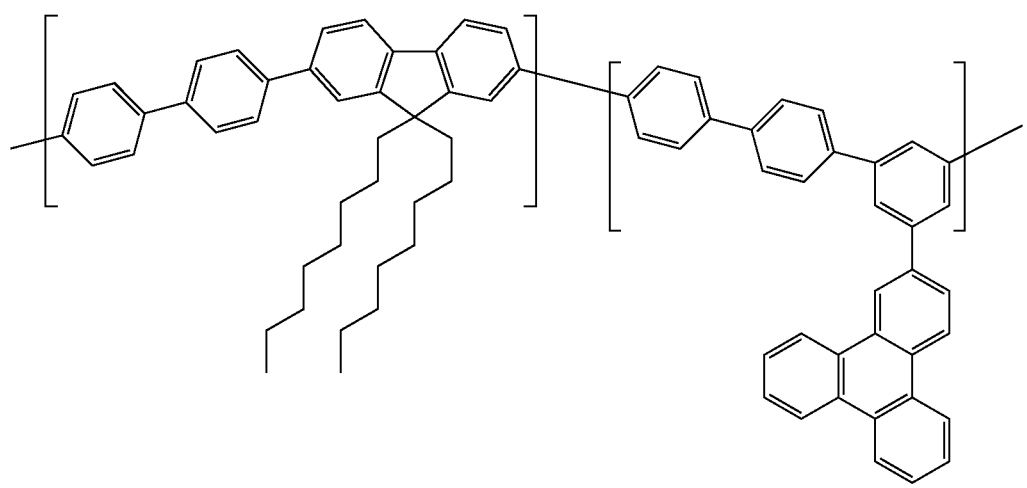
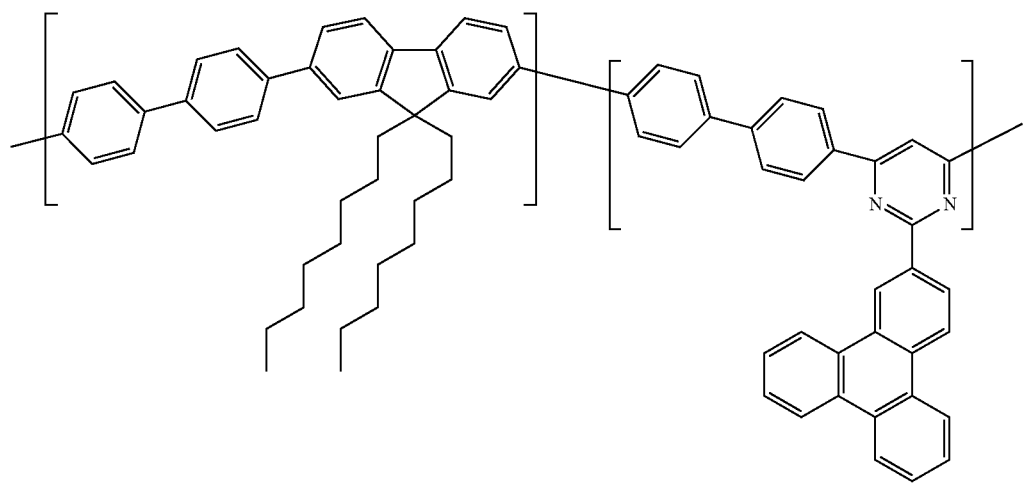
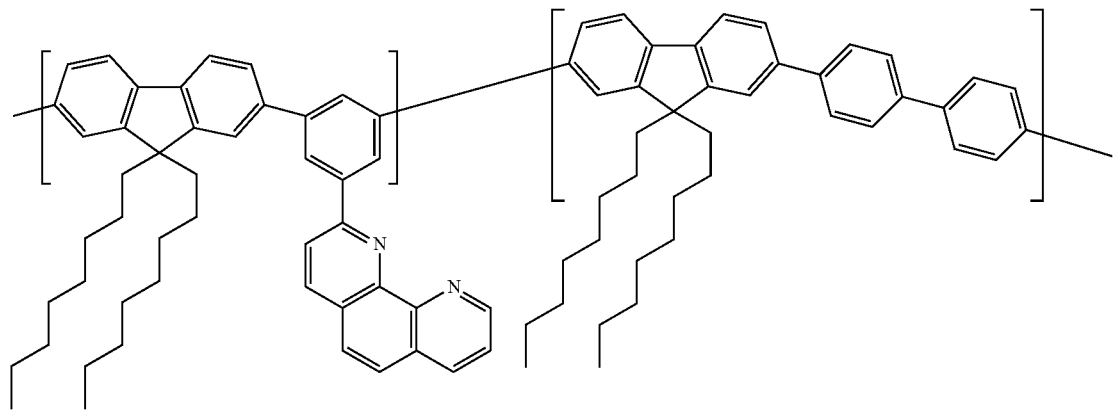

-continued
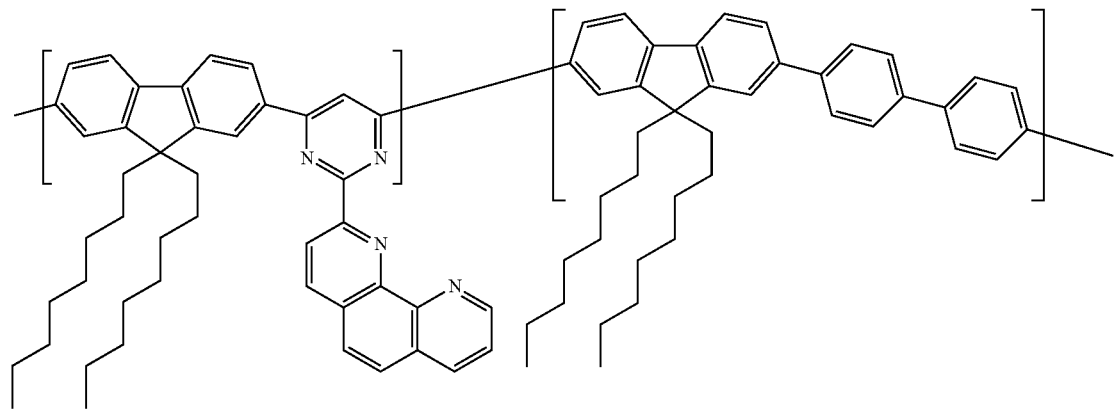
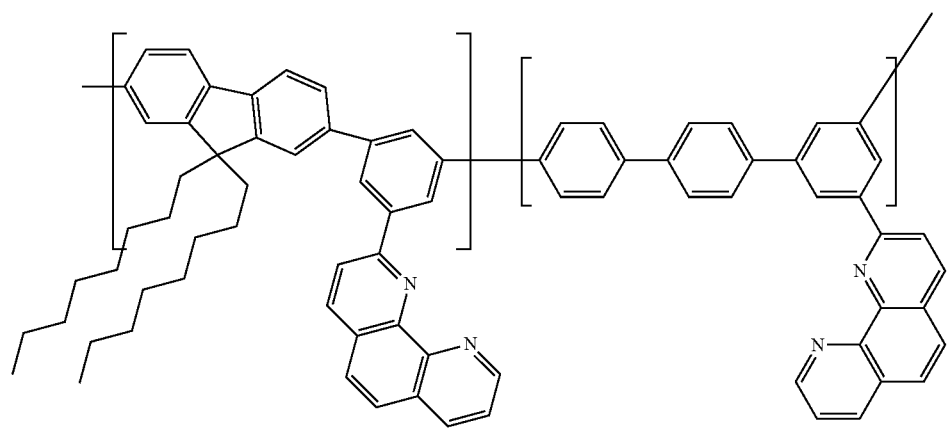
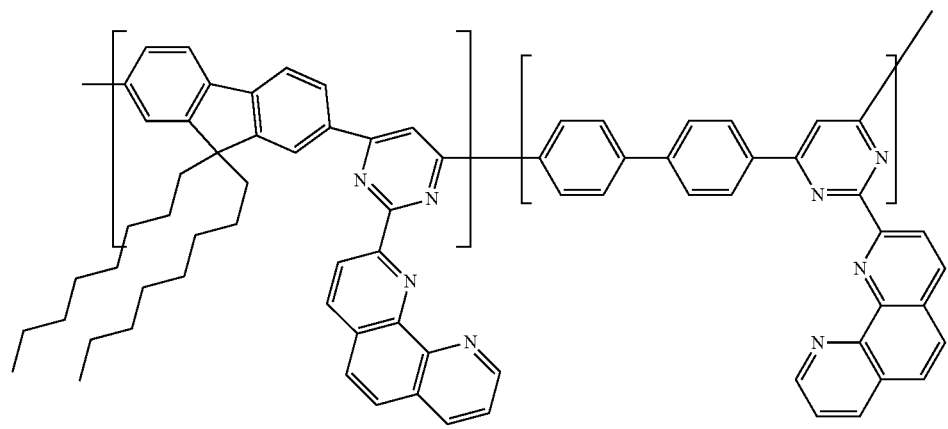
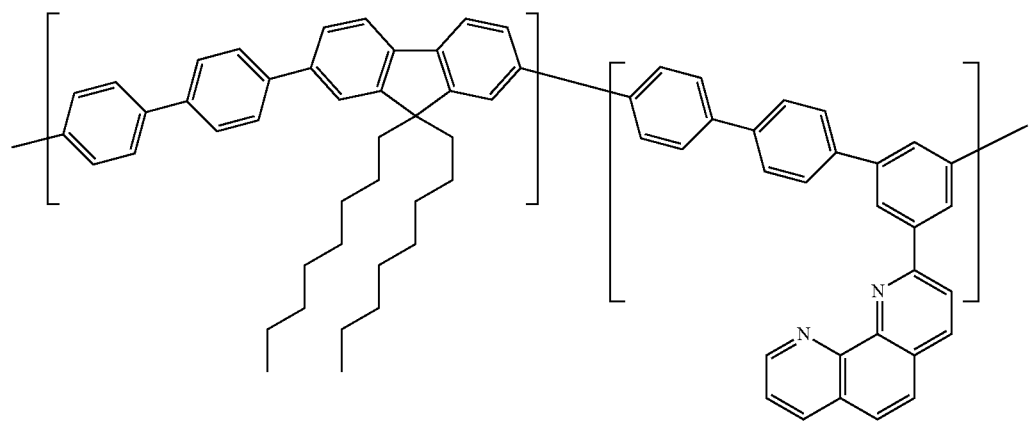

-continued
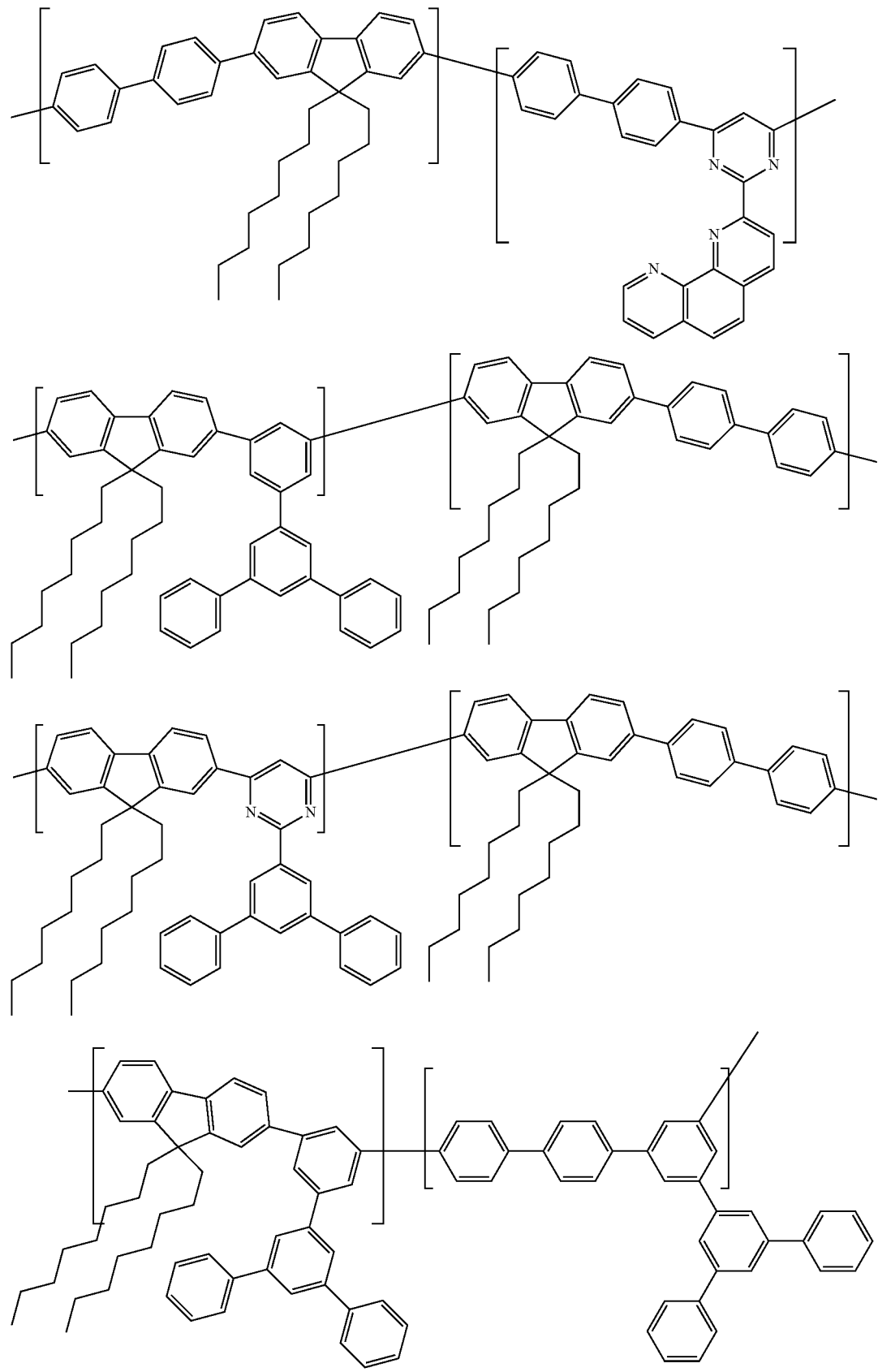

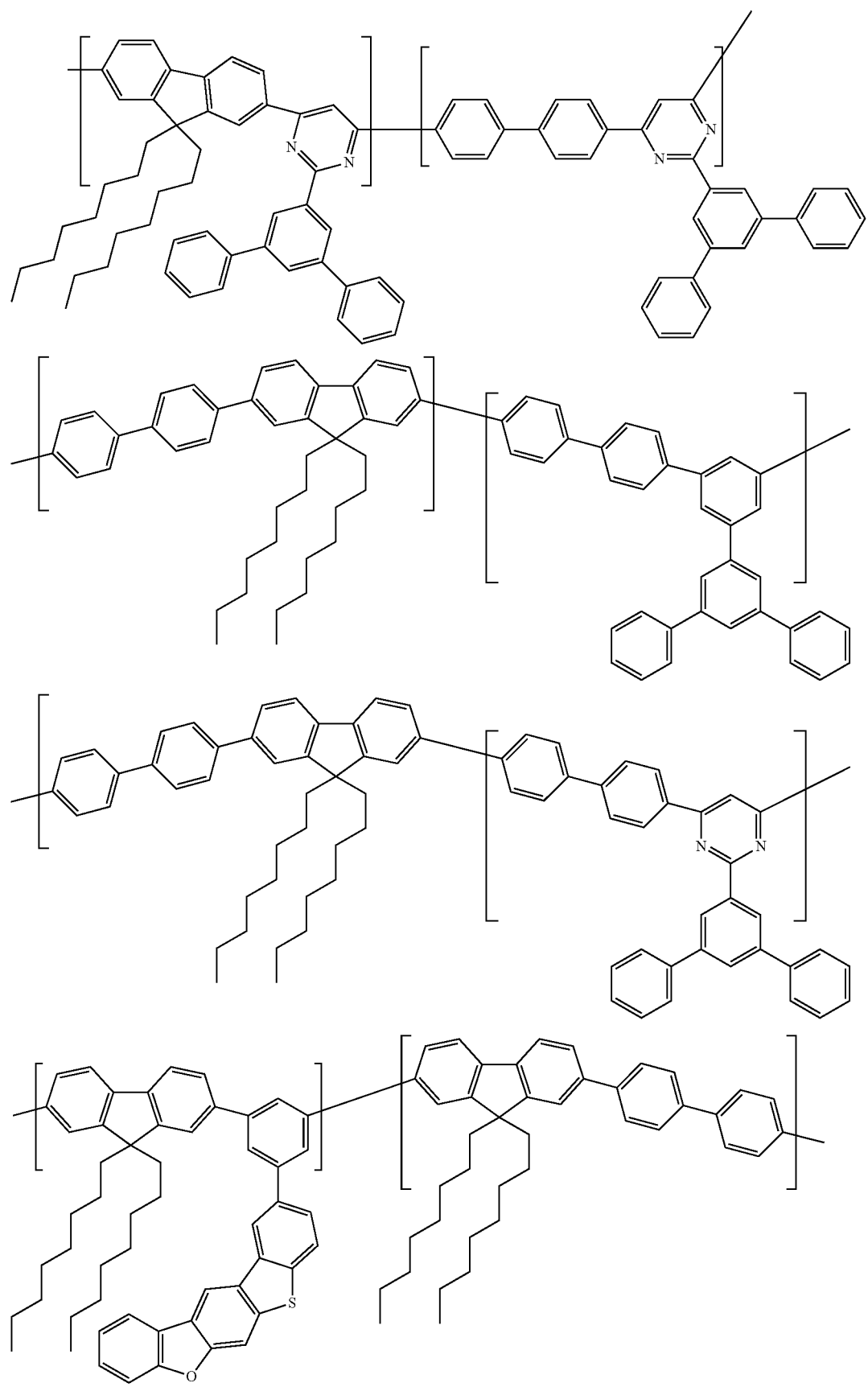

-continued
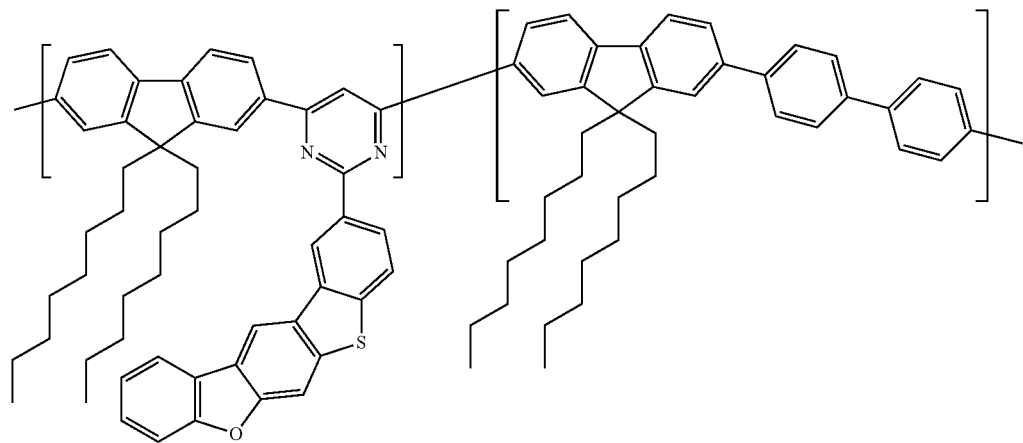
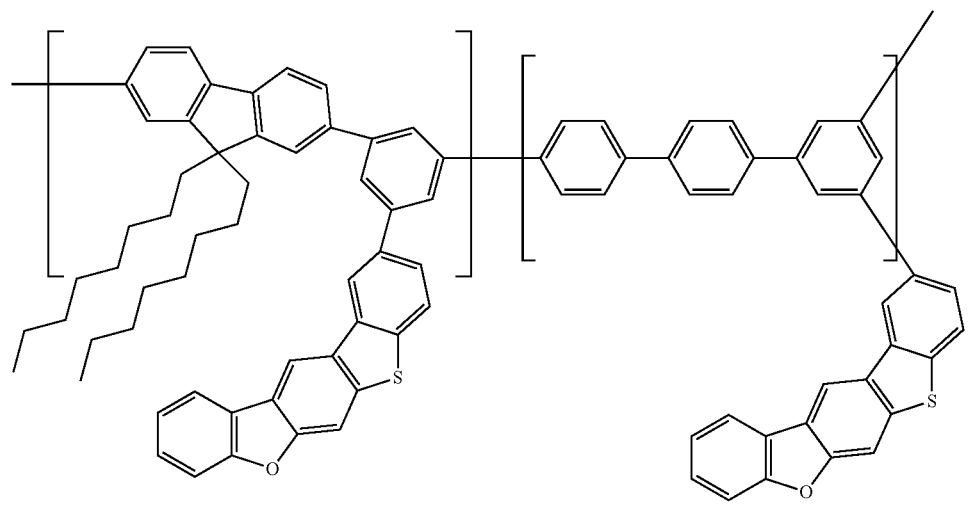
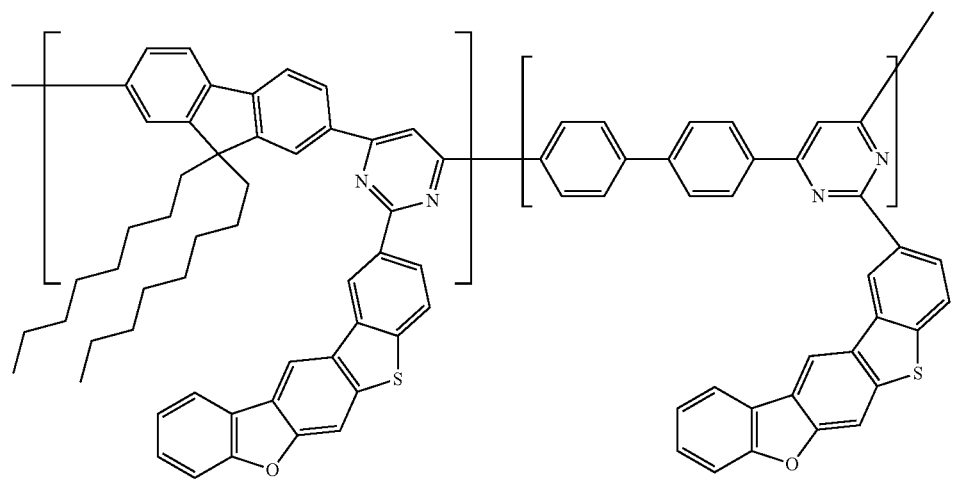

-continued
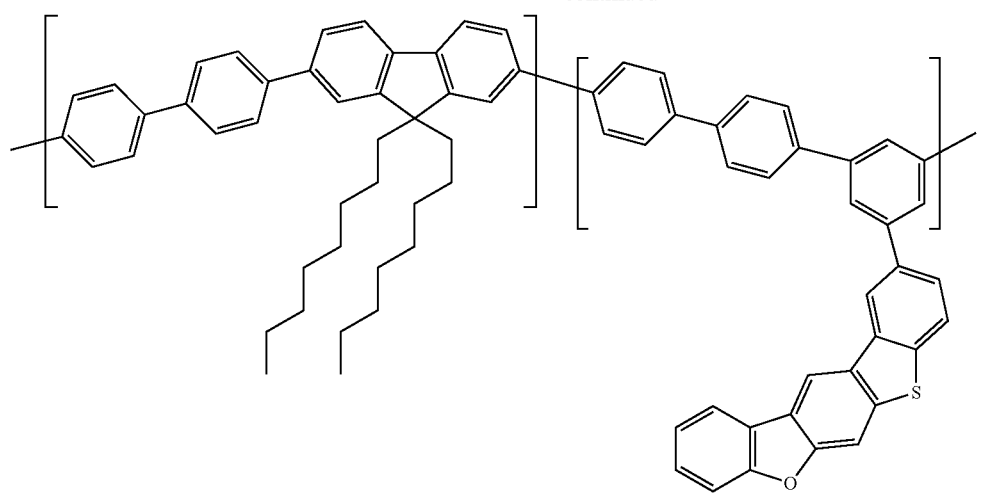
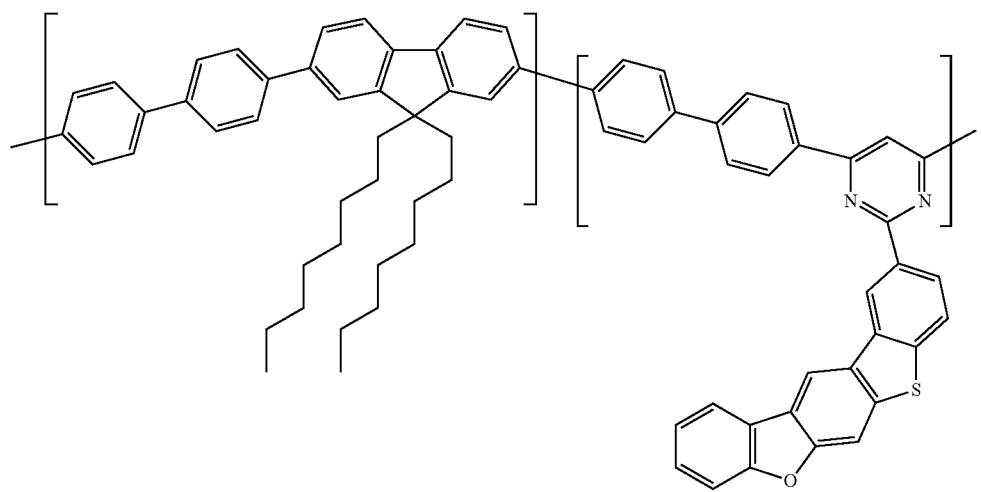
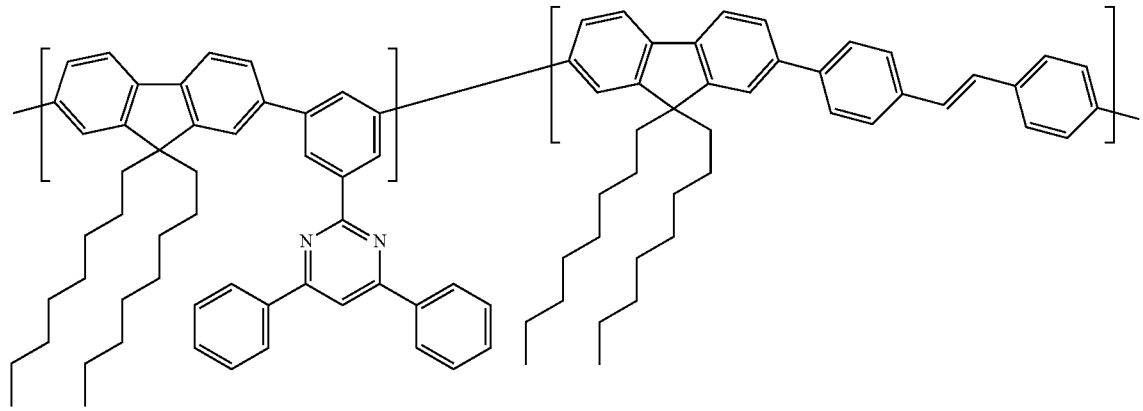

-continued
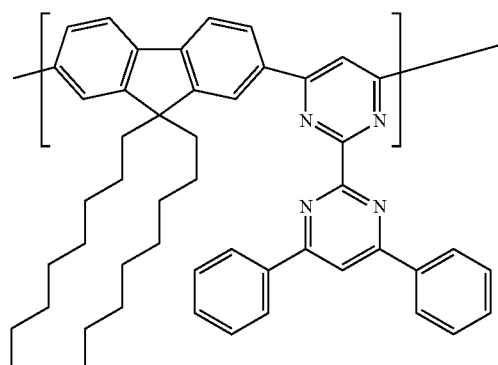 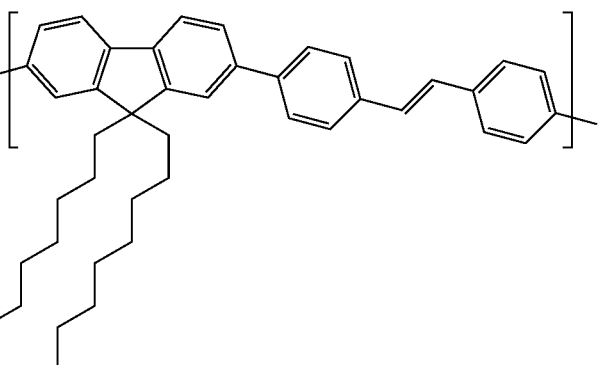
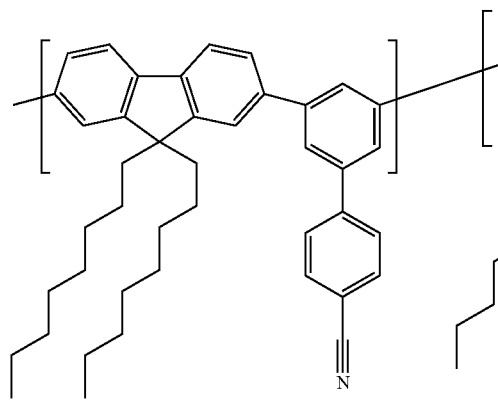 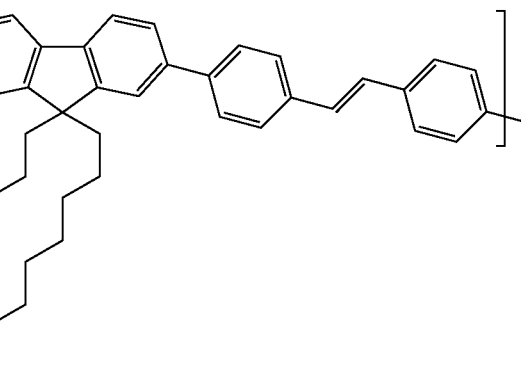
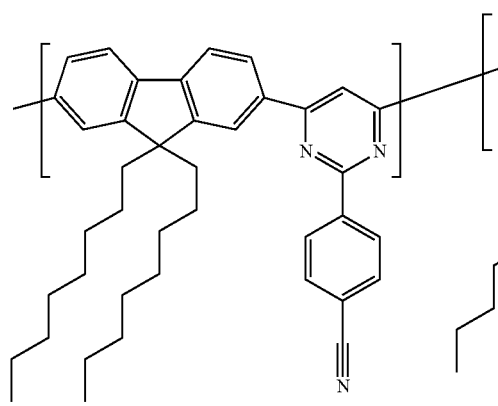 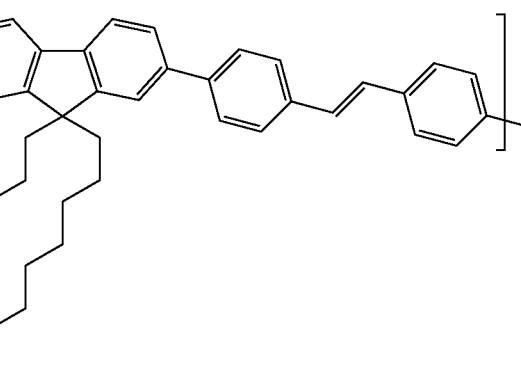
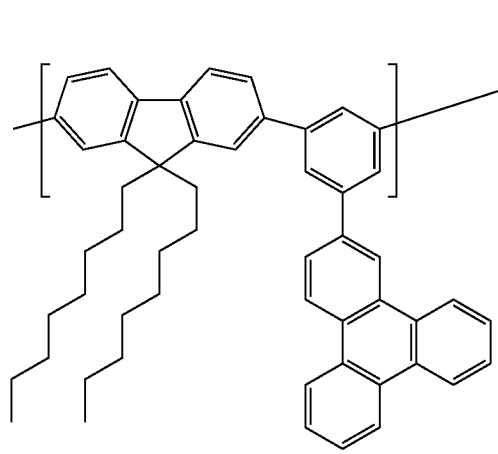 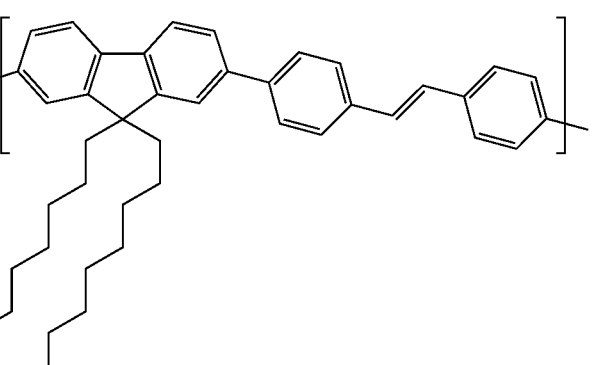

-continued
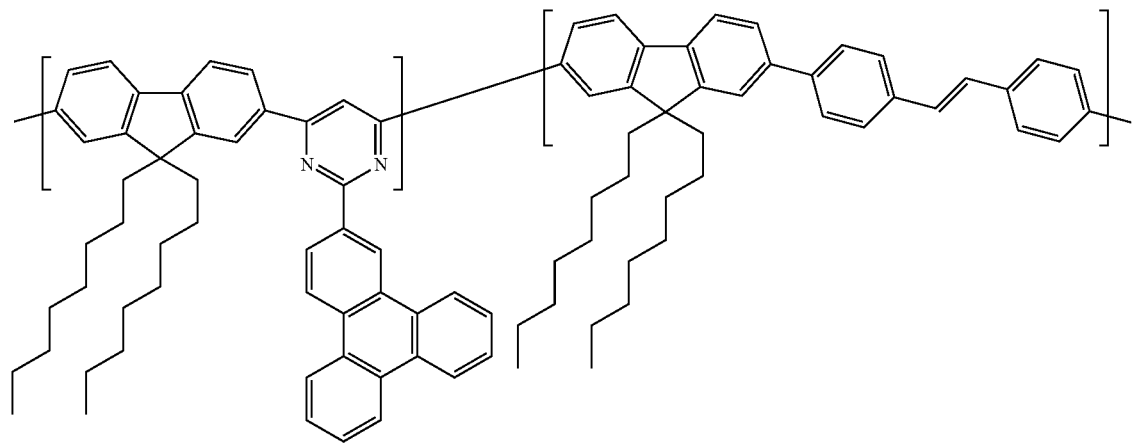
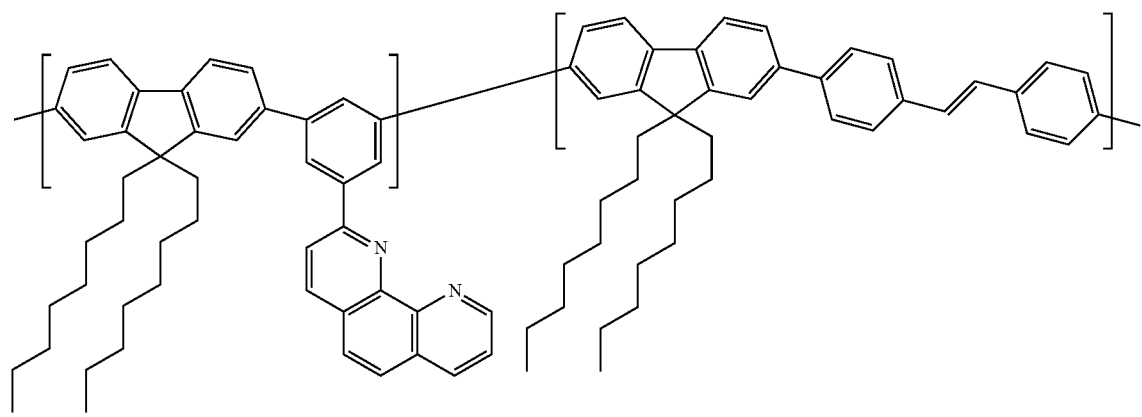
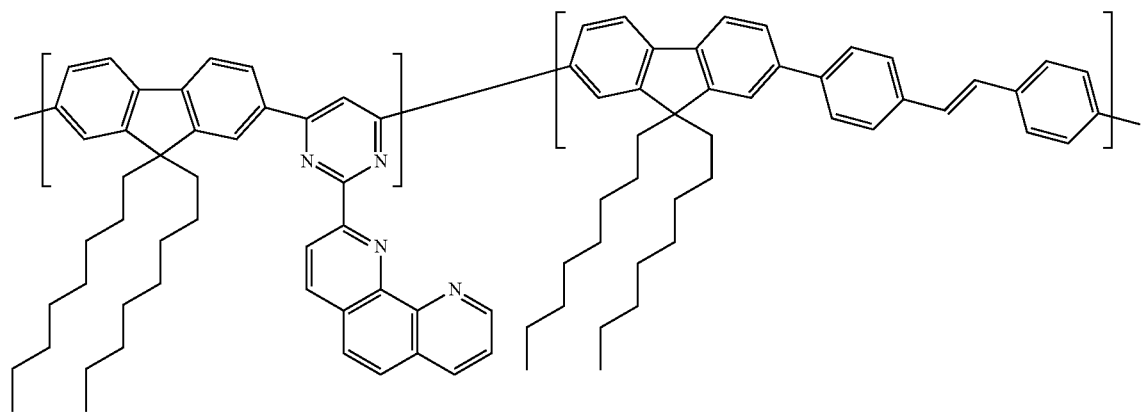
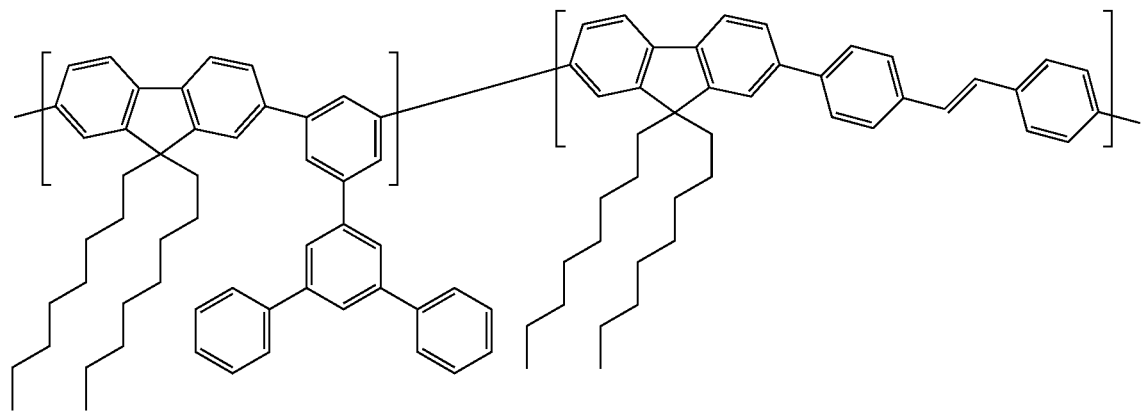

-continued
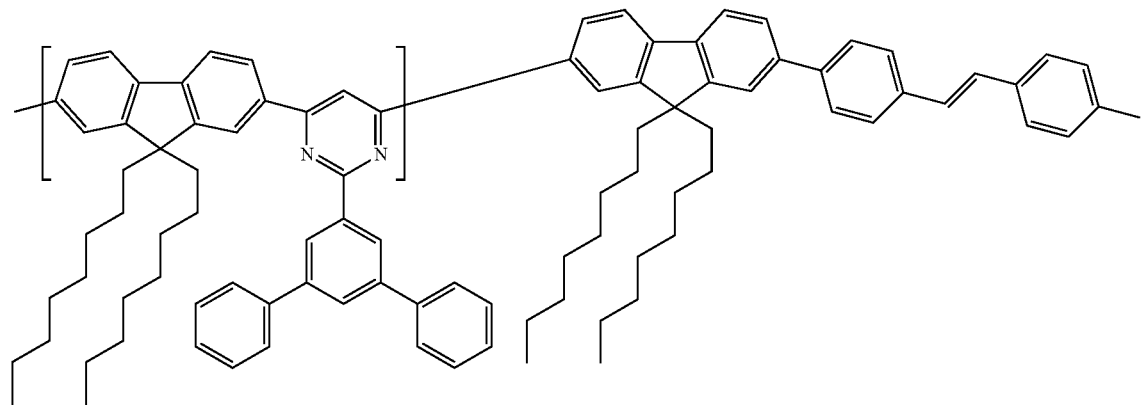
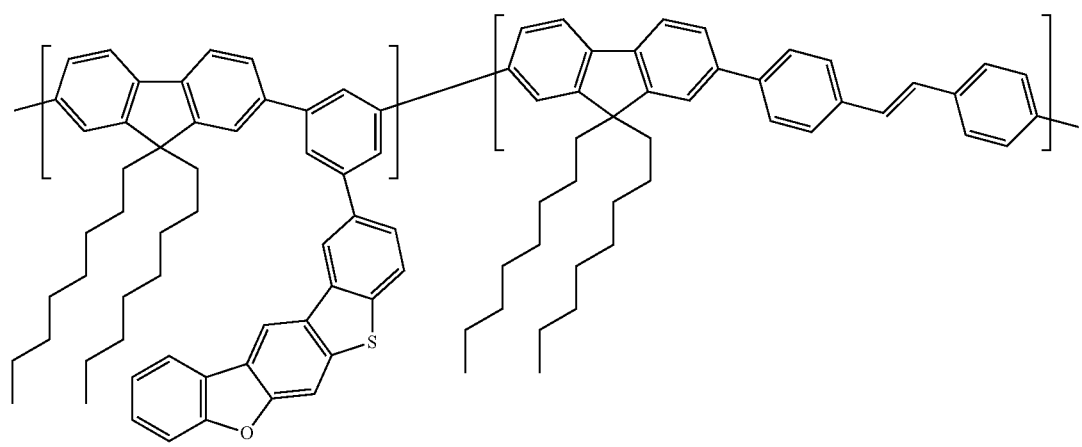
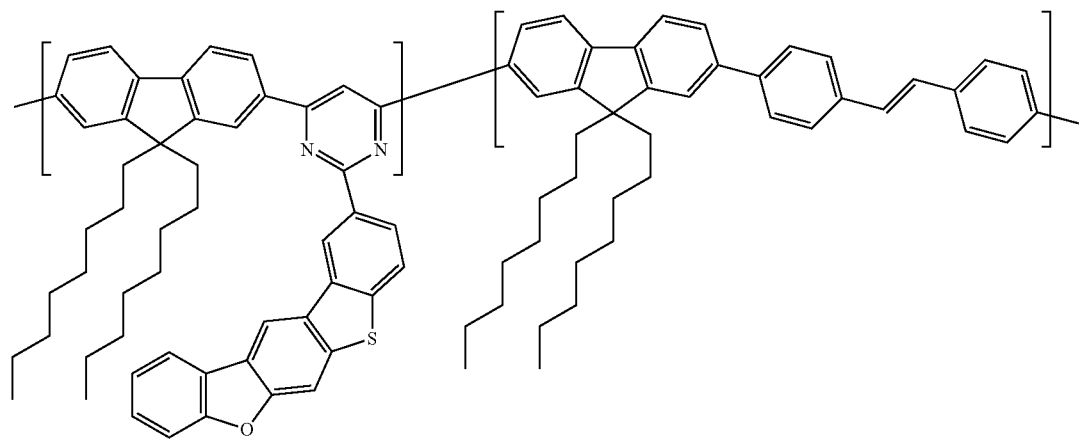
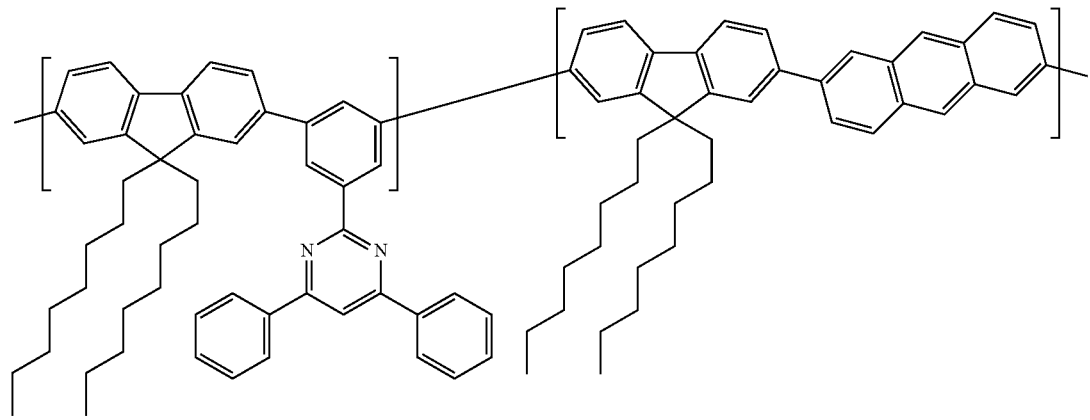

103                                      104
-continued
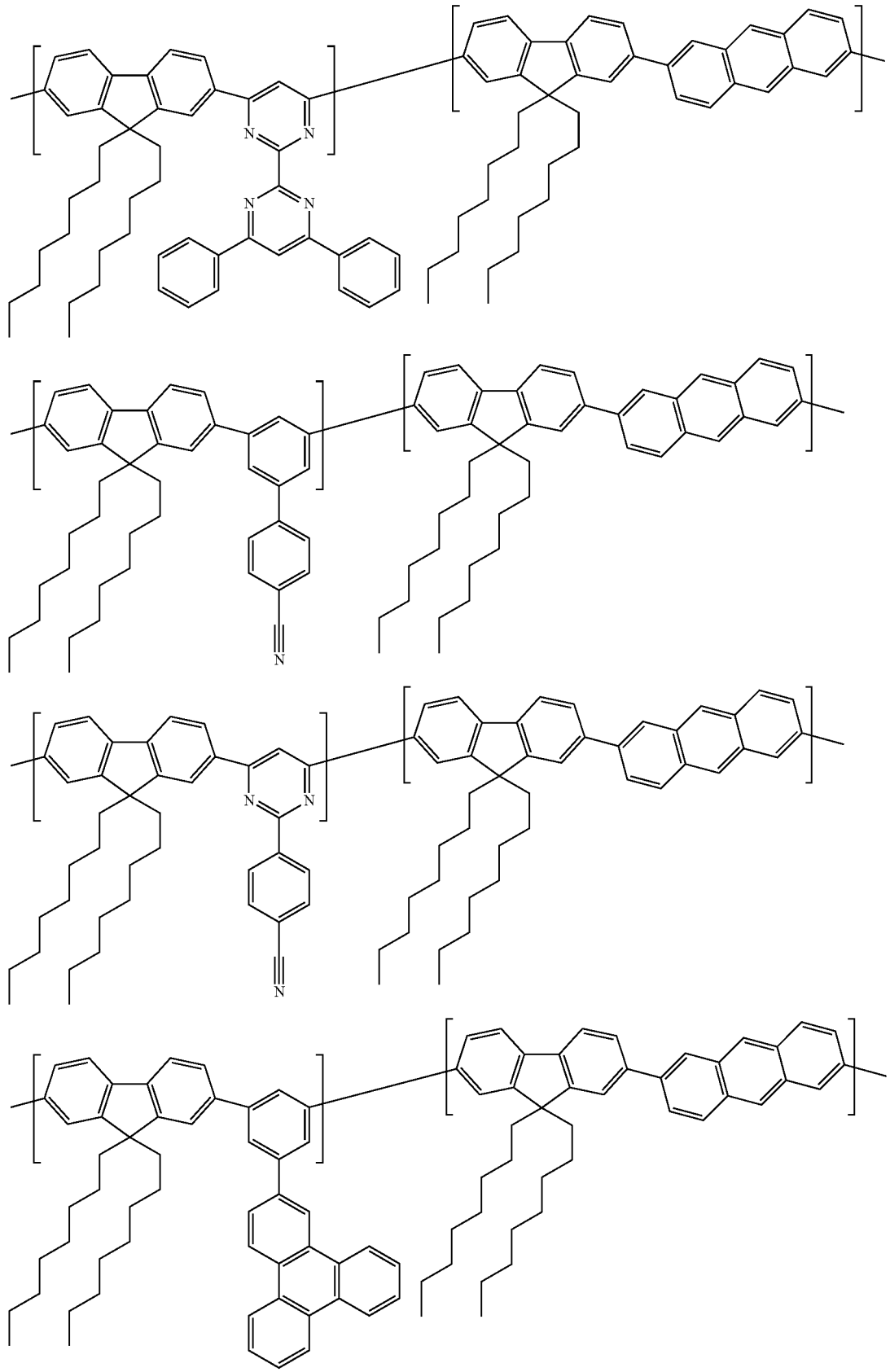

105
106
-continued
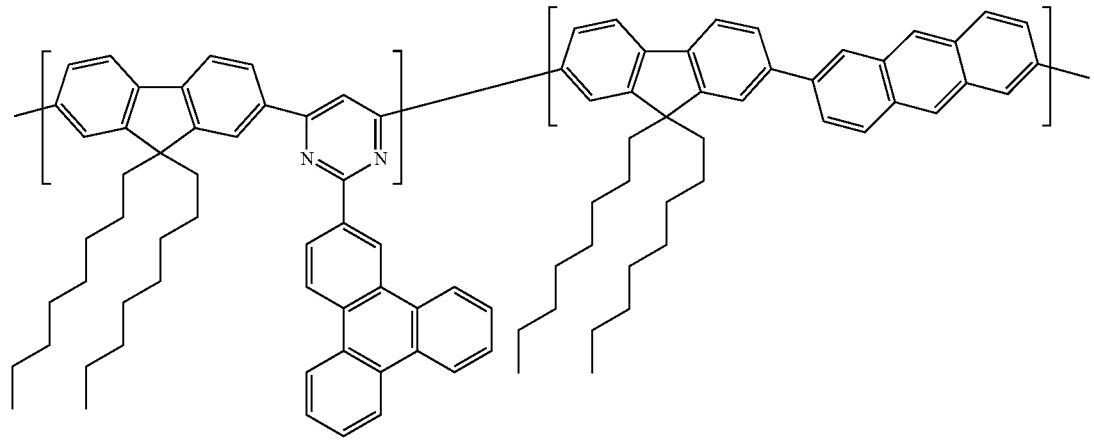
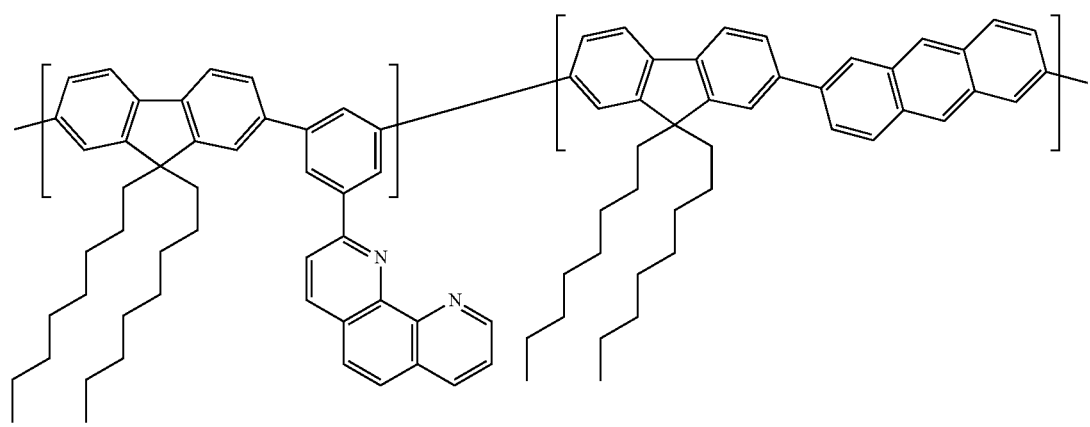
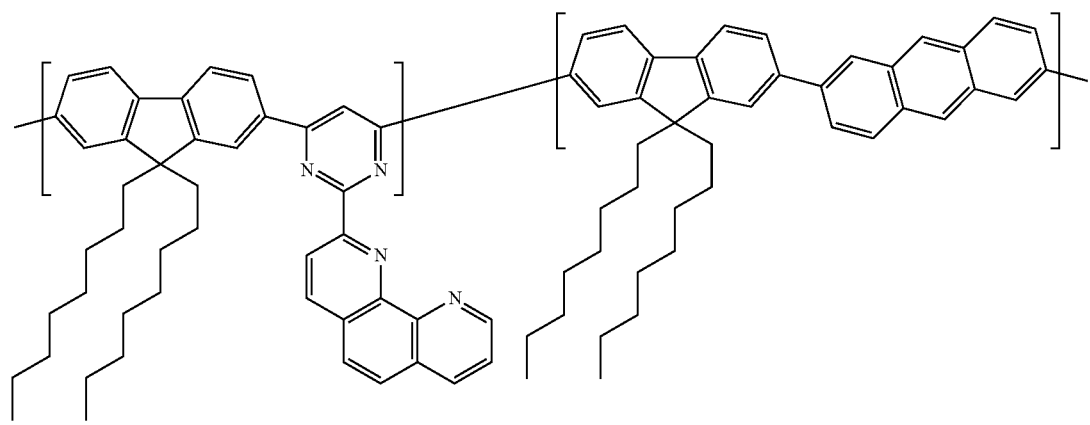
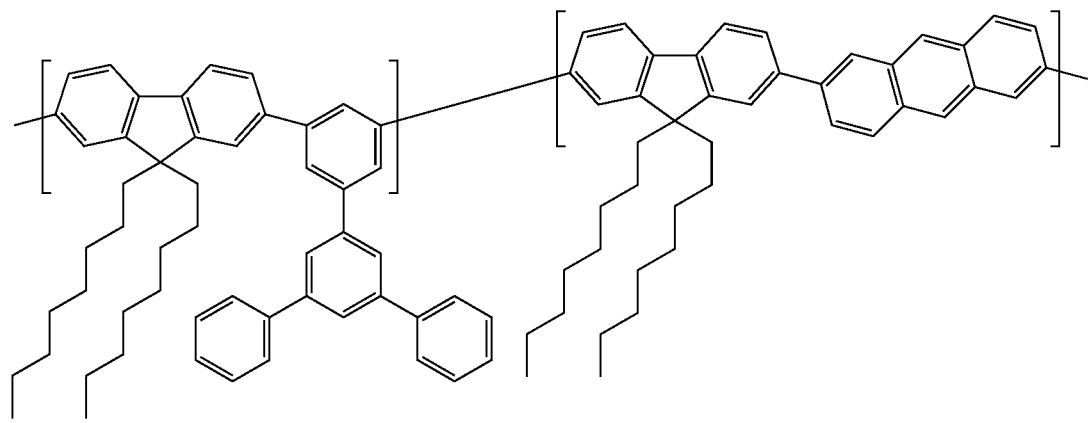

-continued
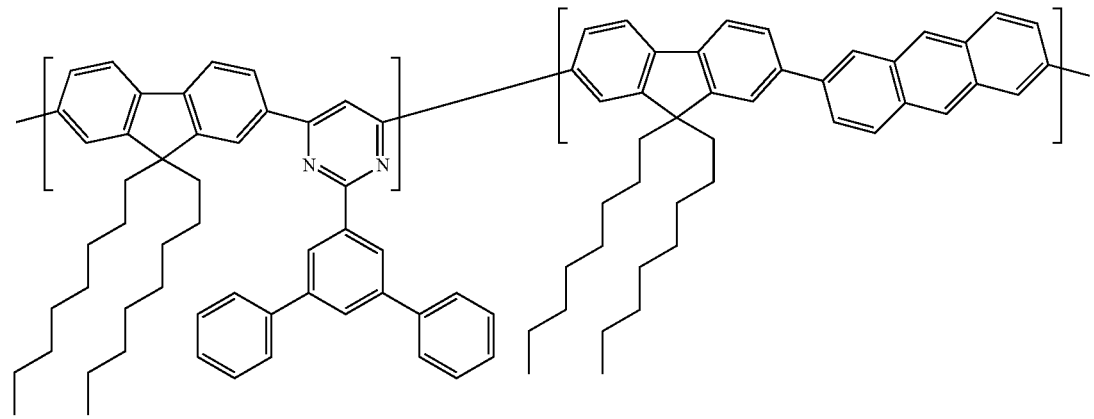
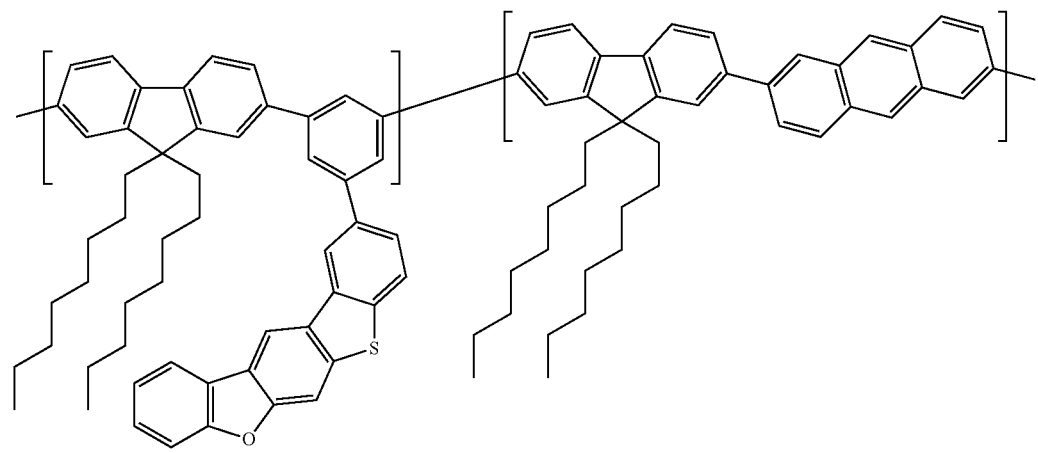
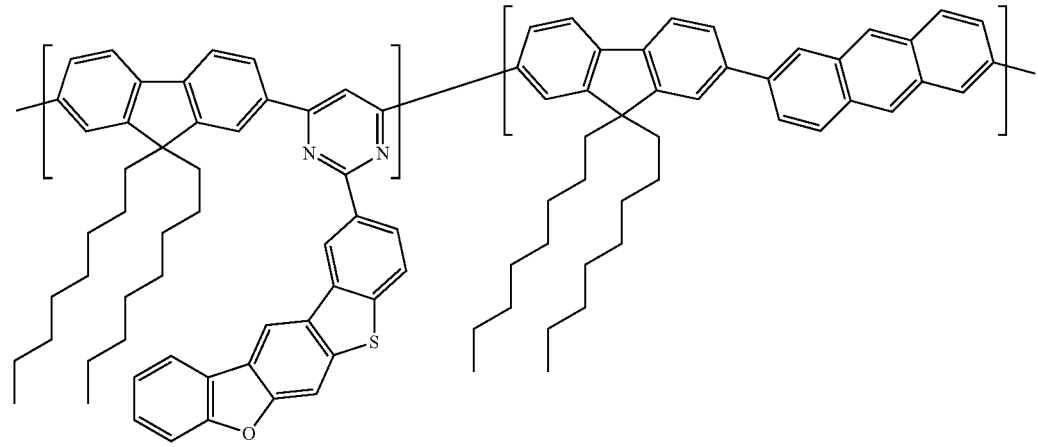

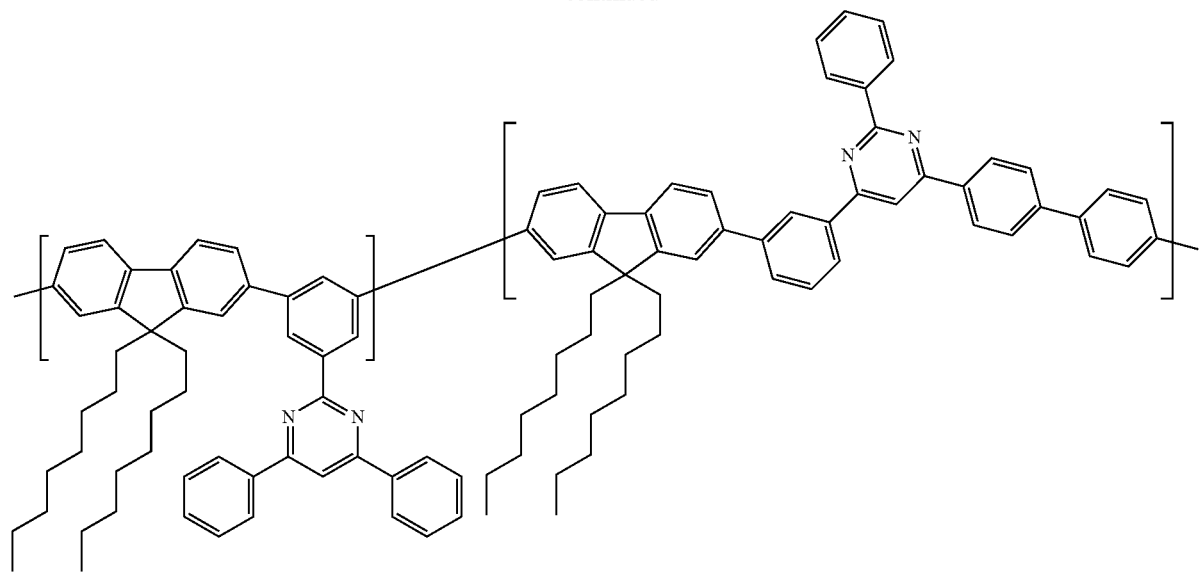
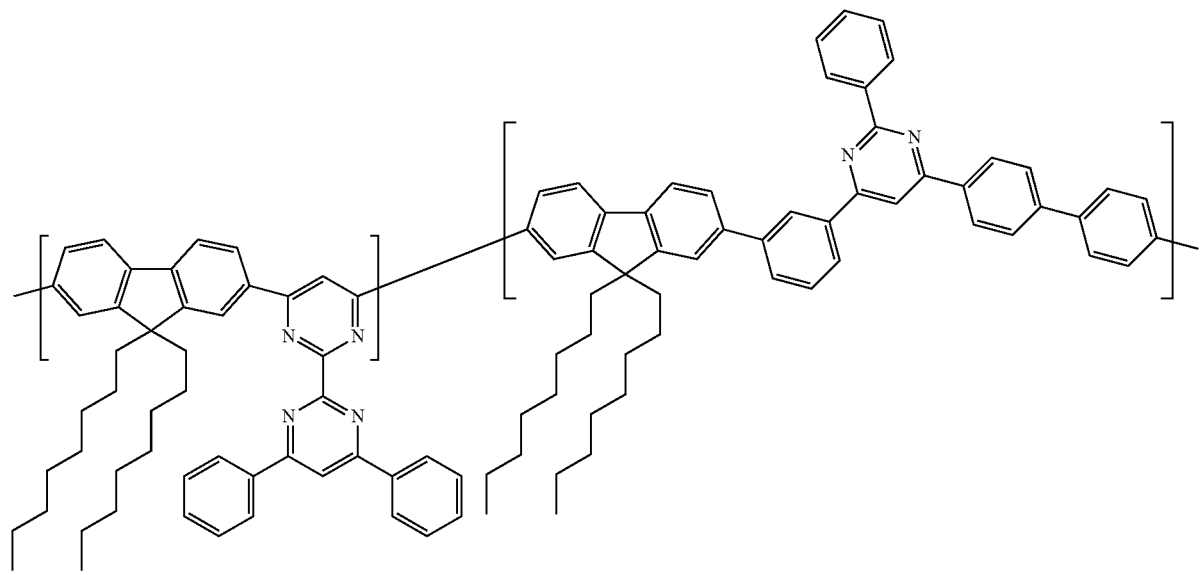
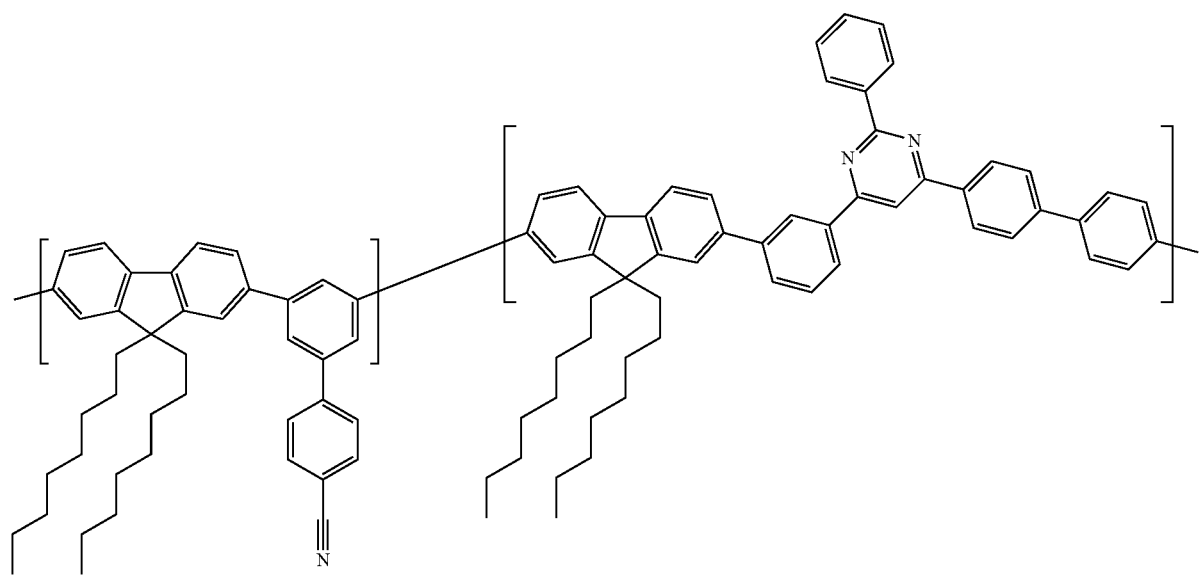

111 112
-continued
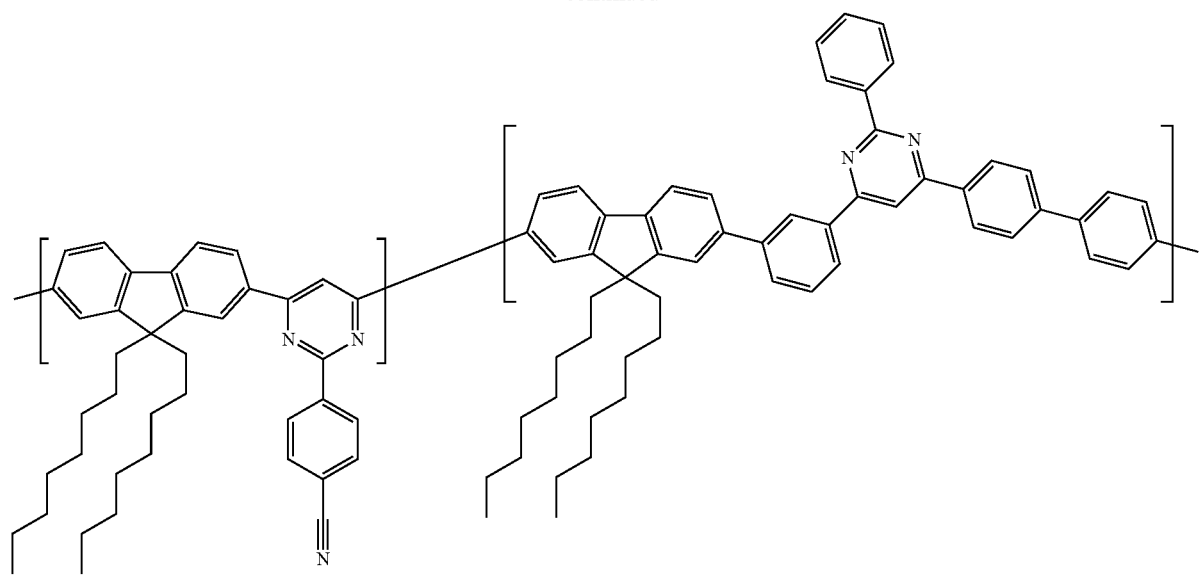
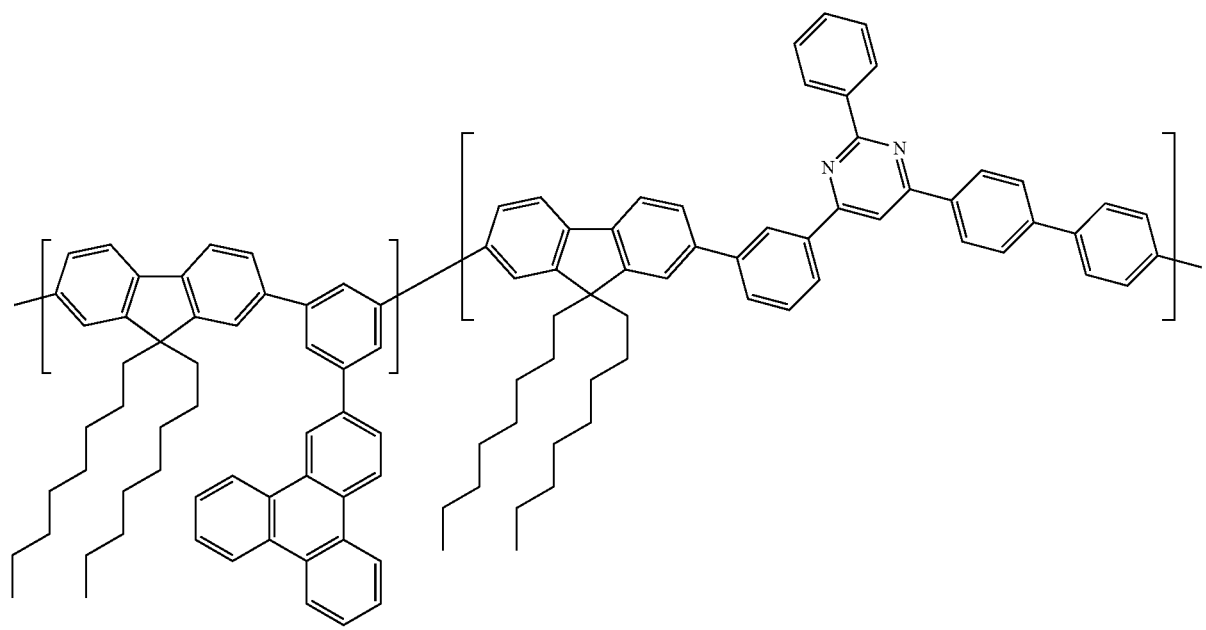

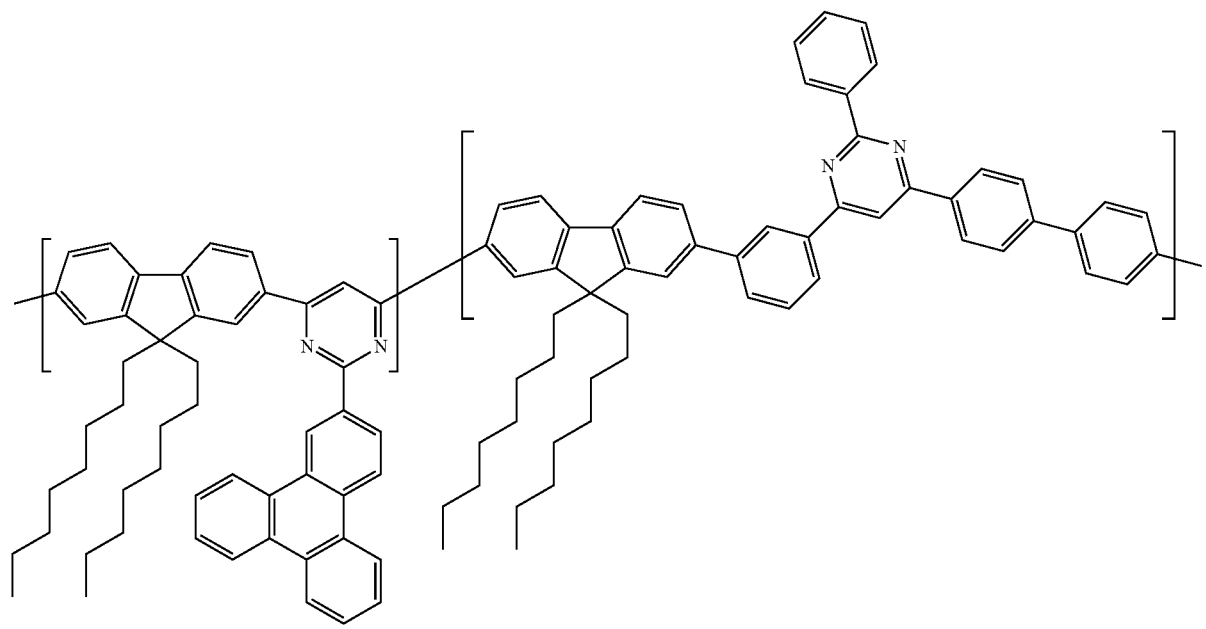
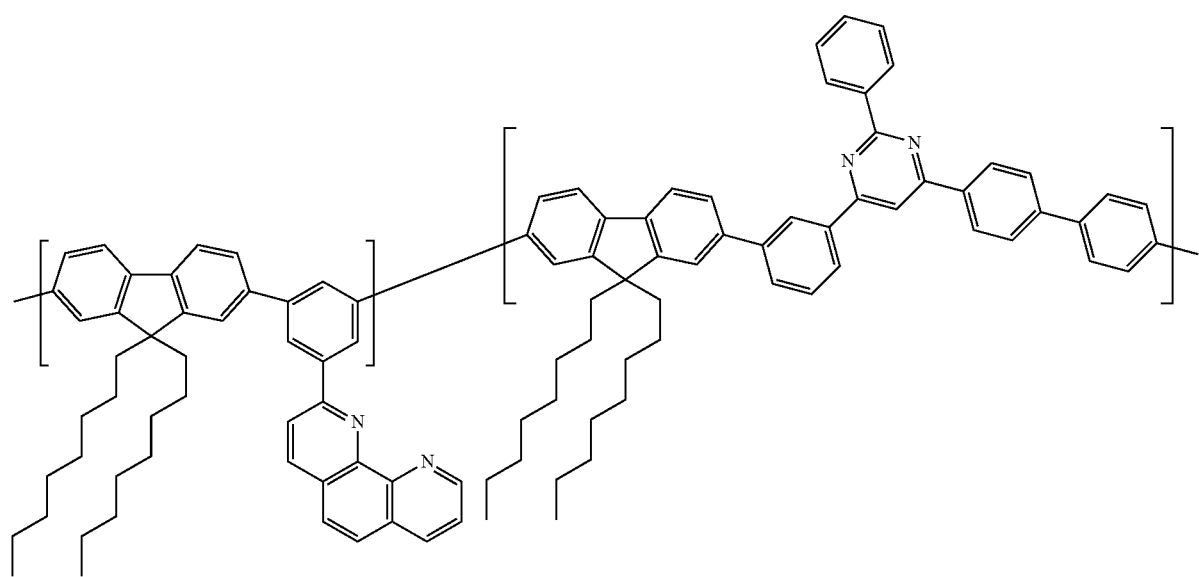

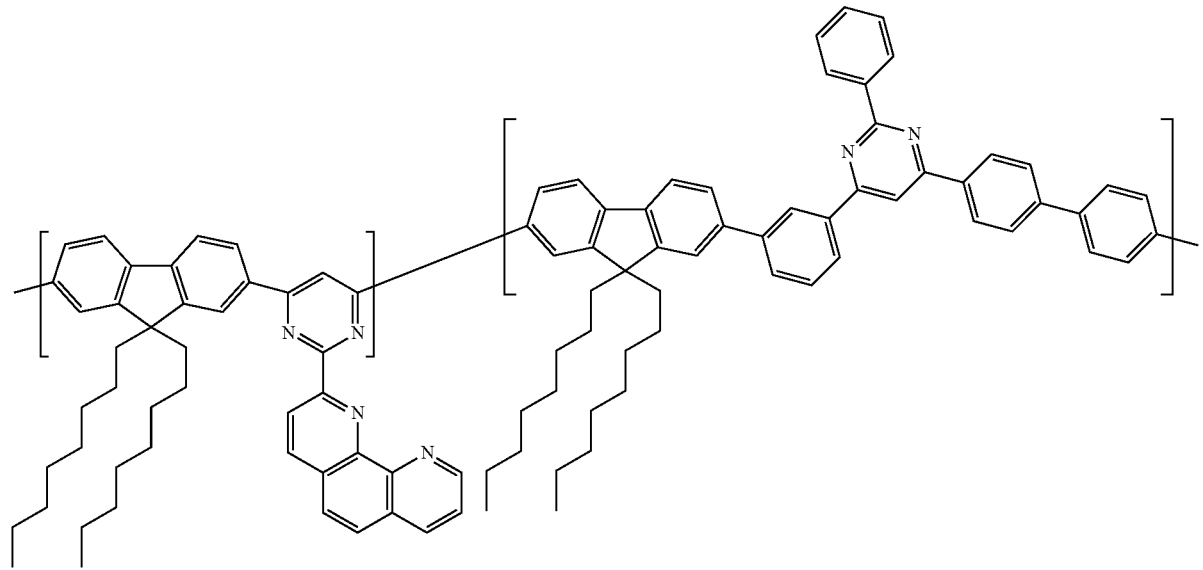
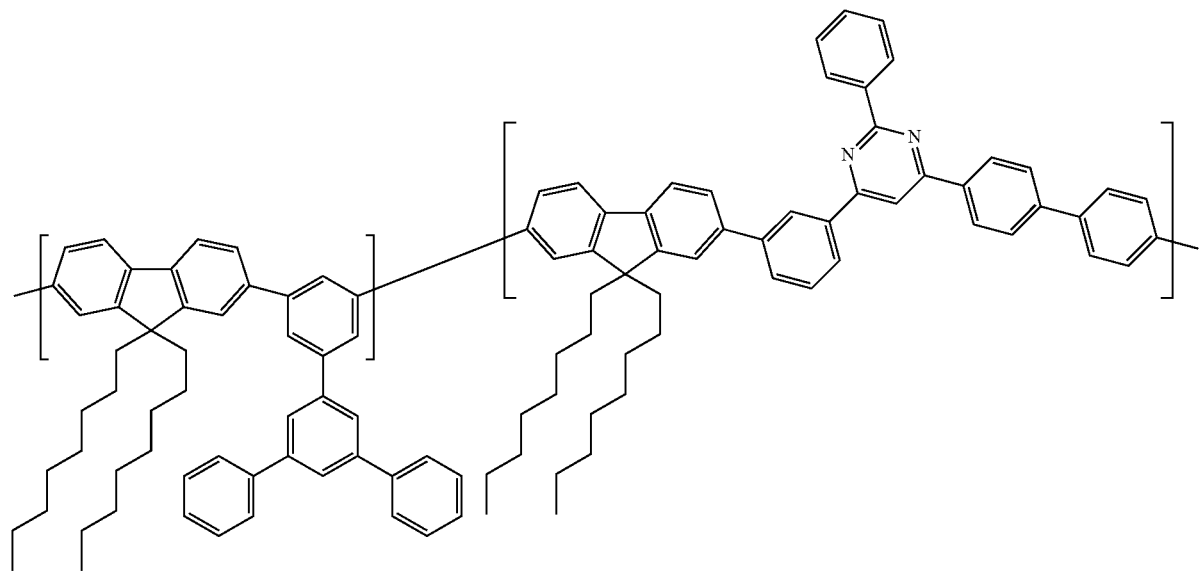
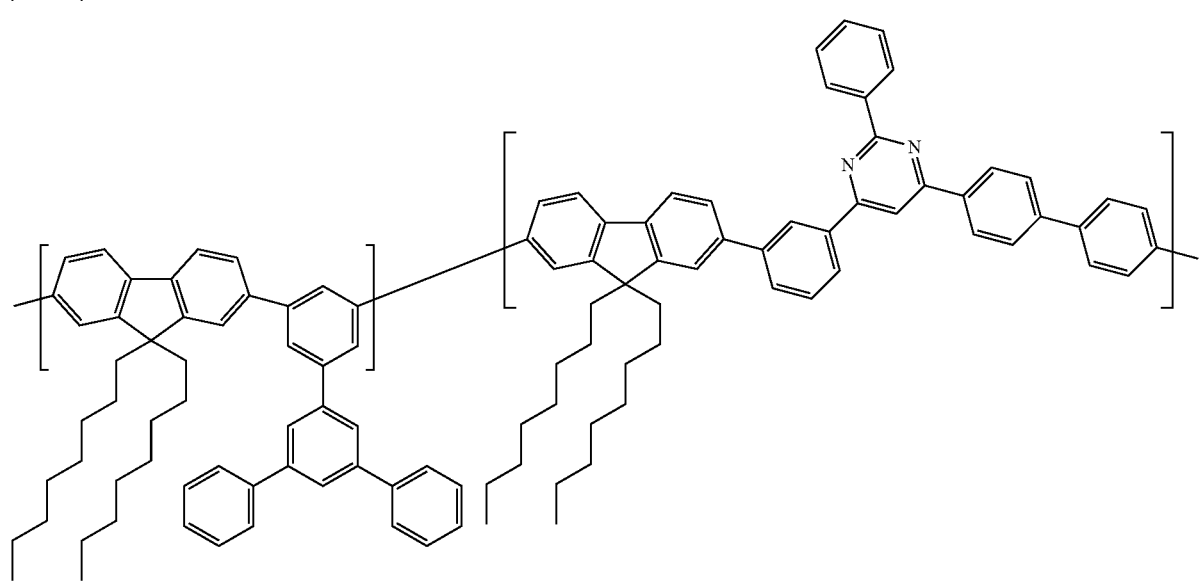

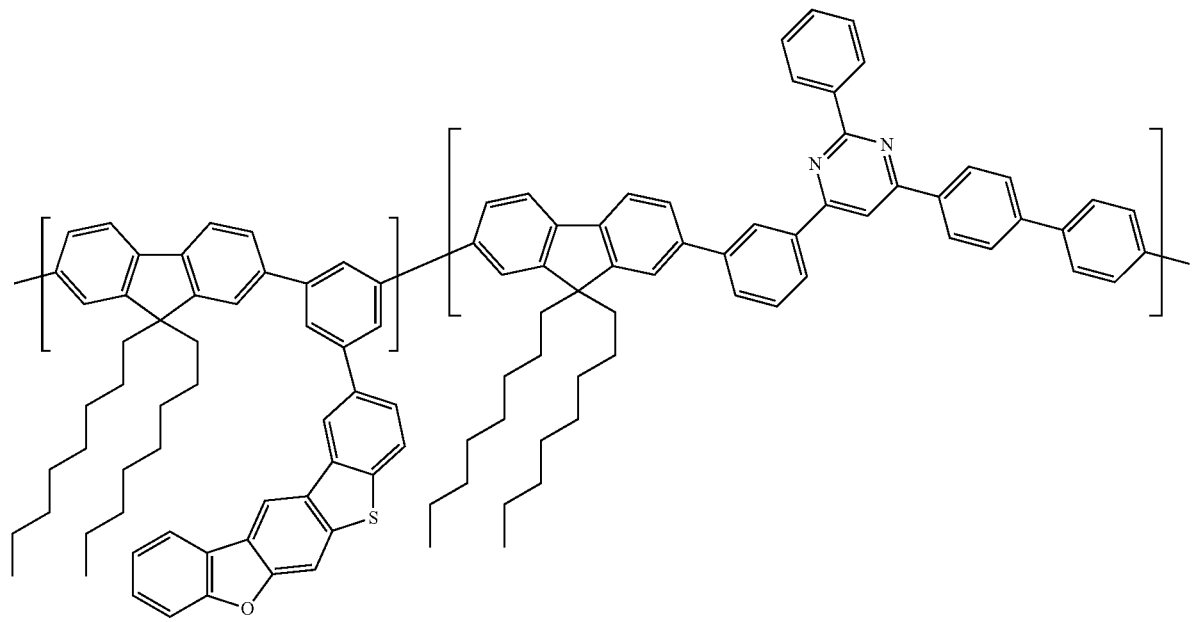
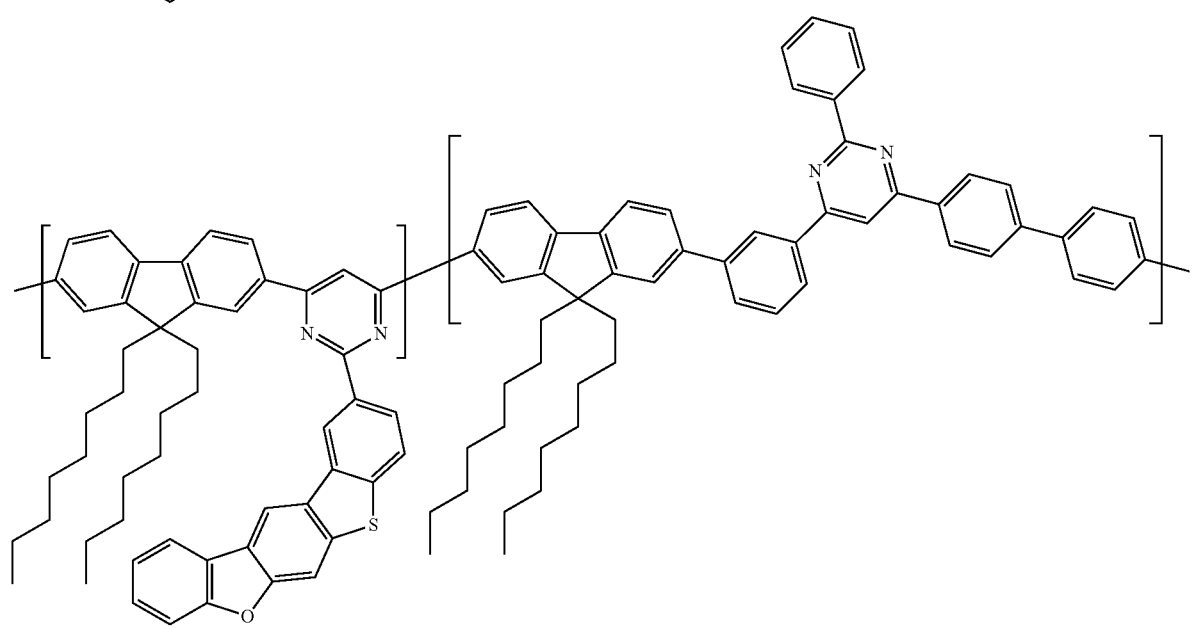
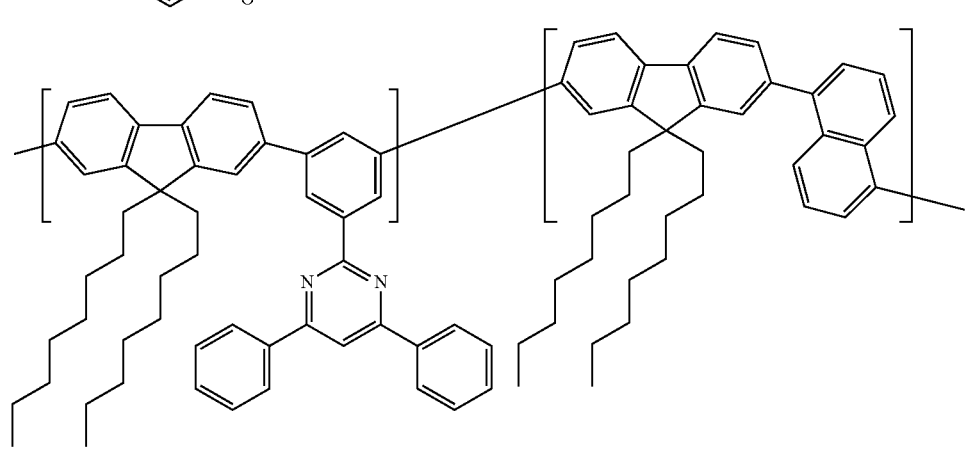

-continued
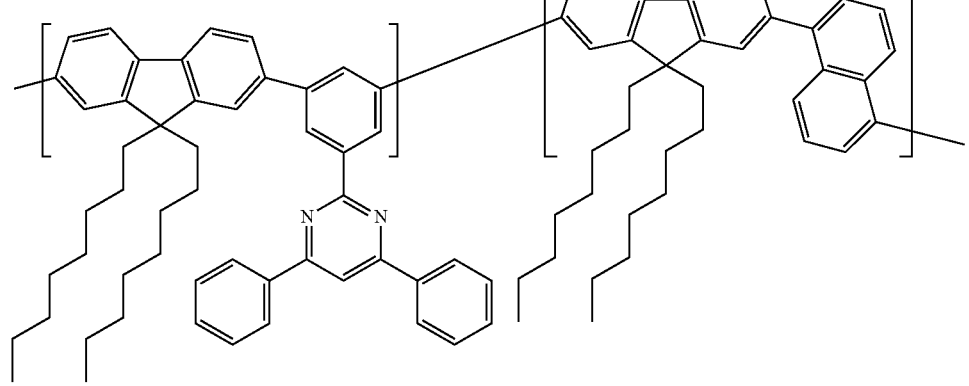
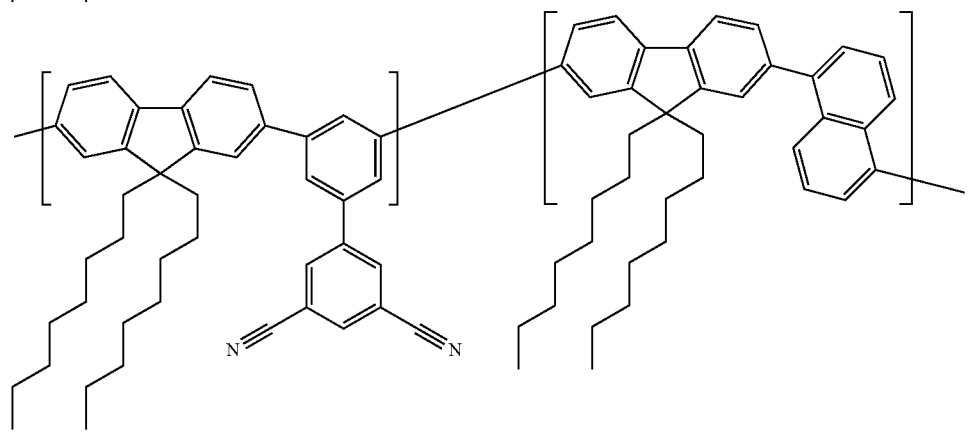
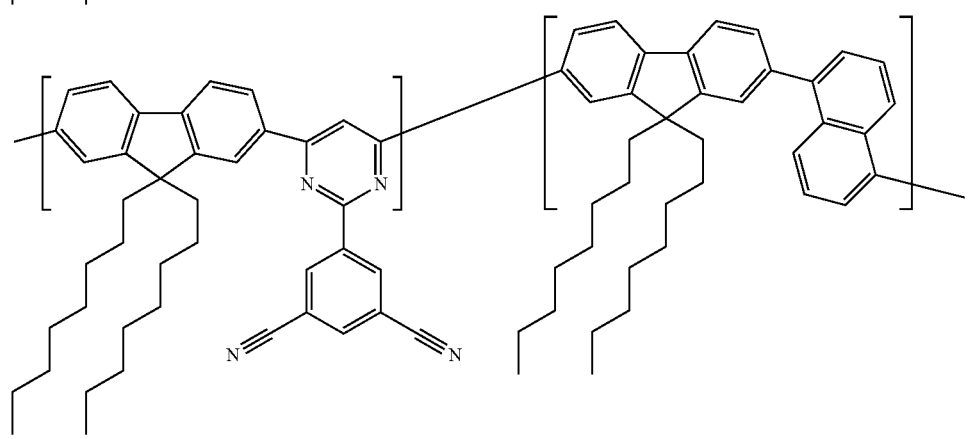
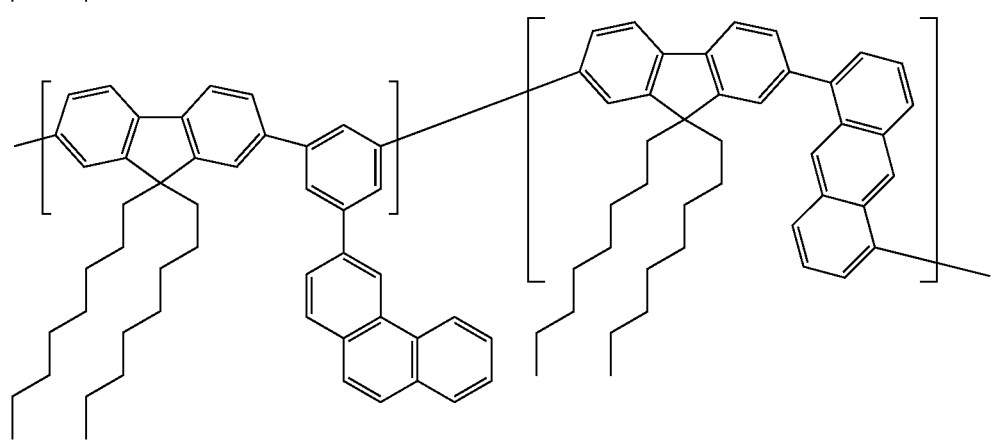

-continued
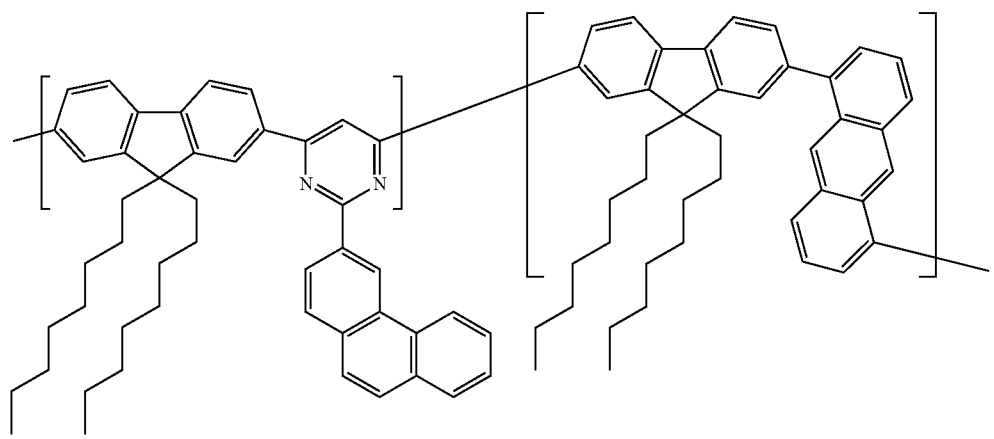
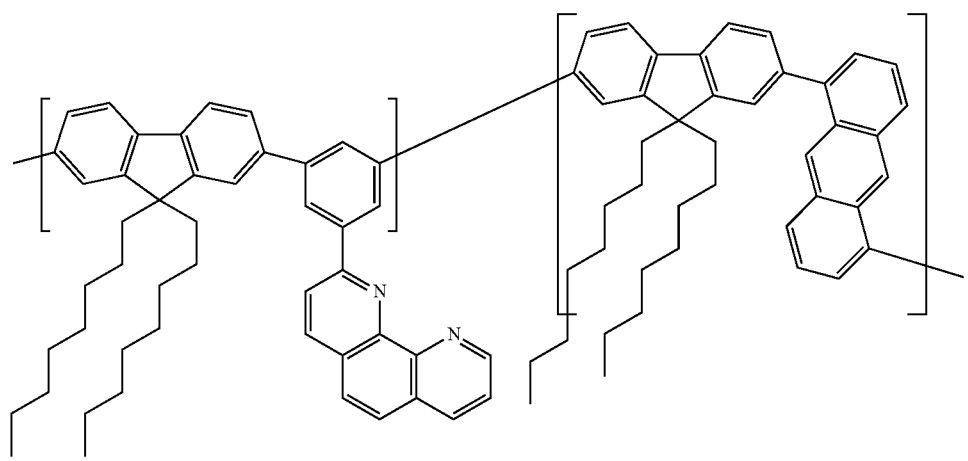
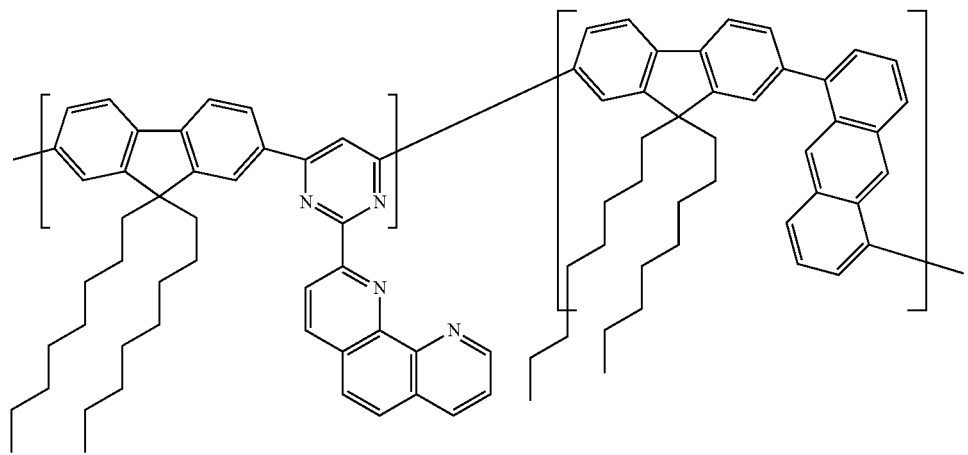

-continued
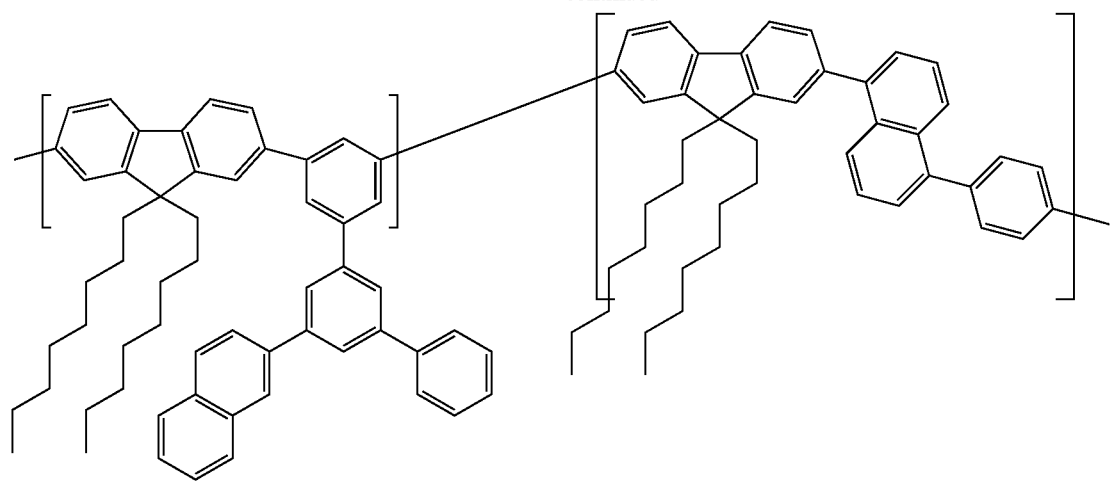
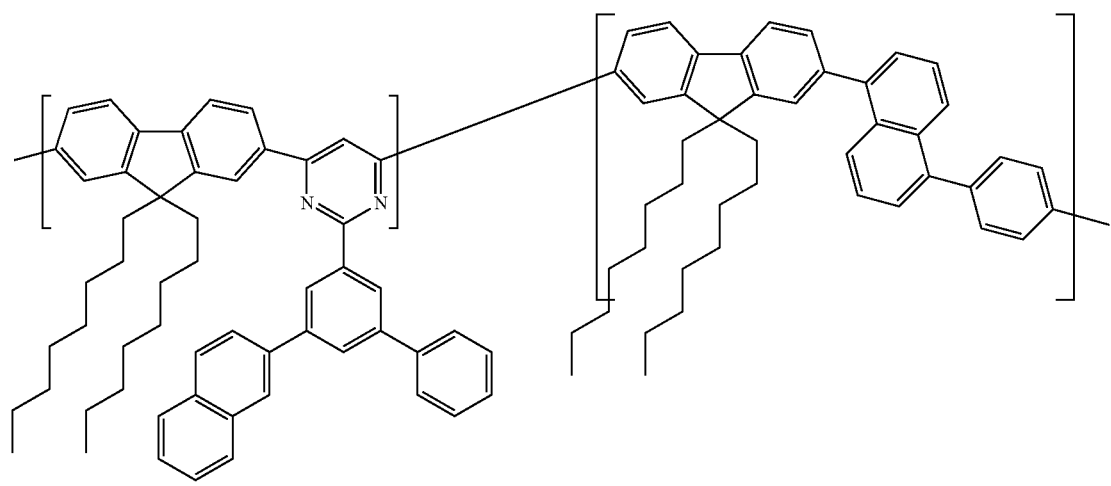
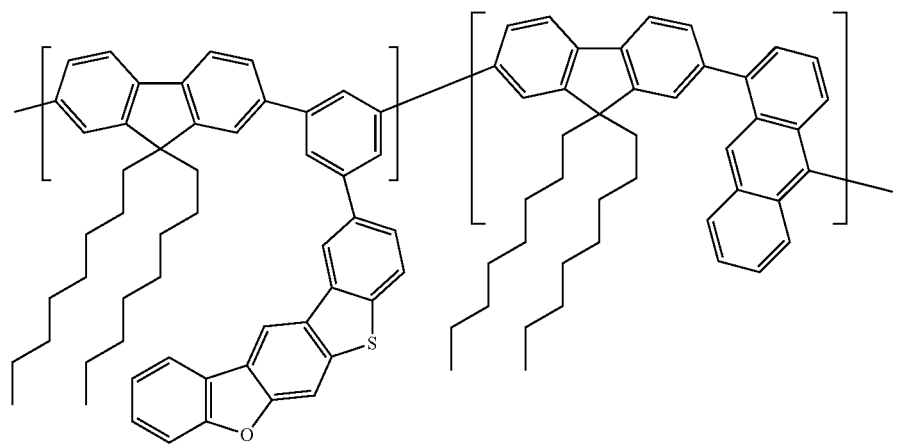

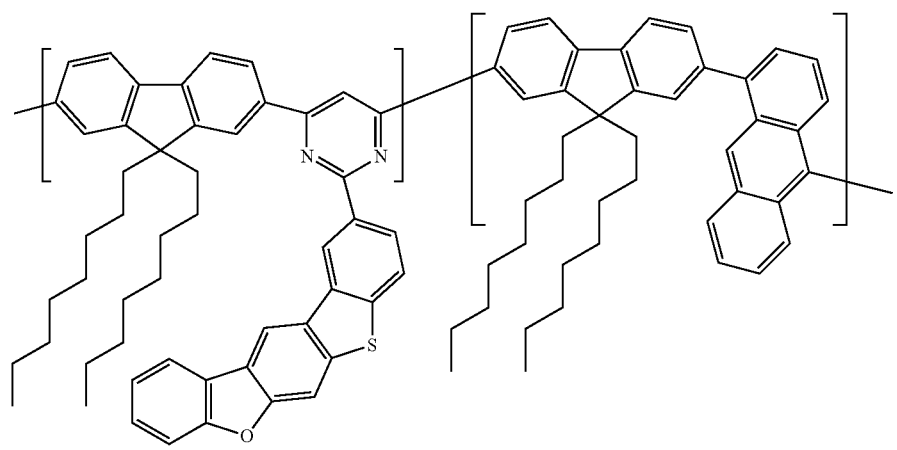
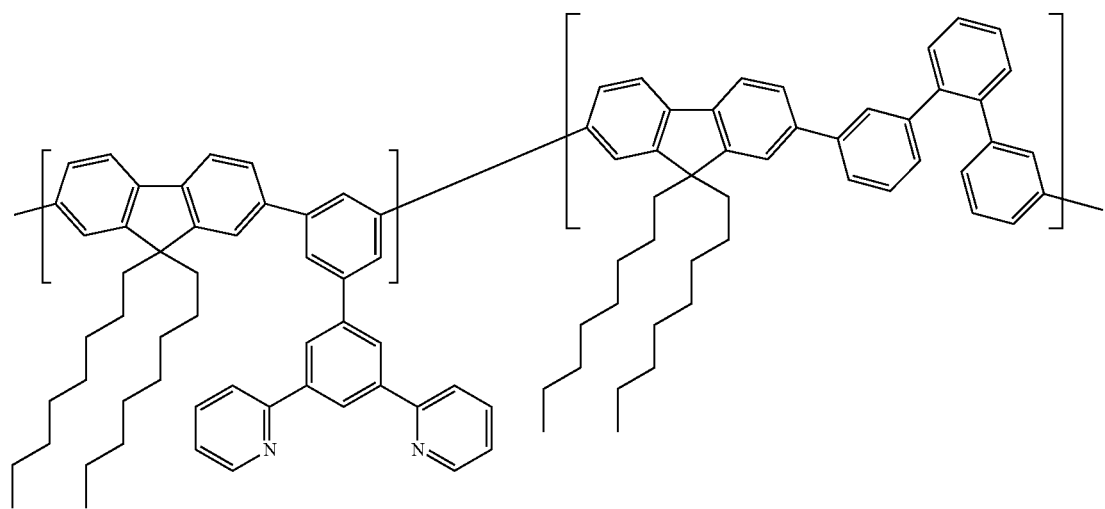
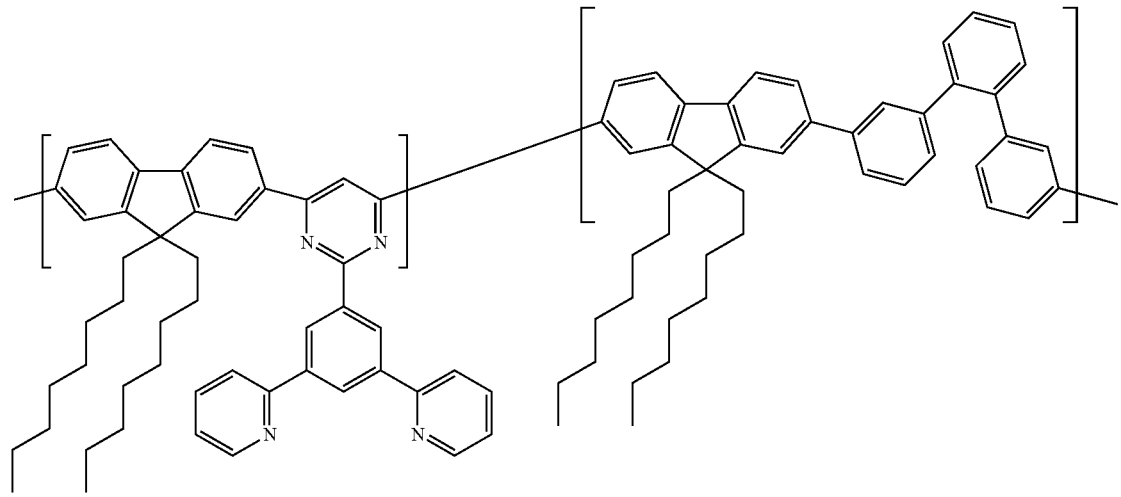

-continued
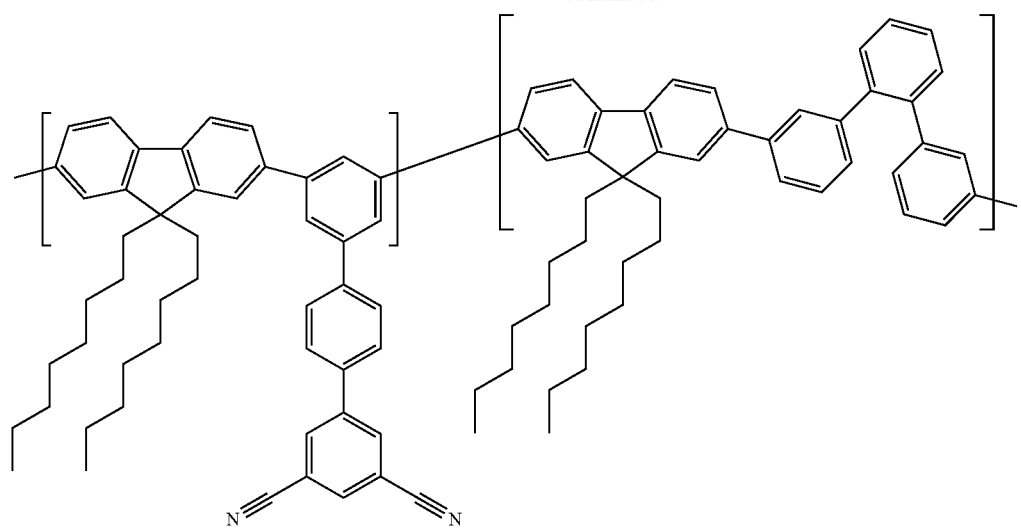
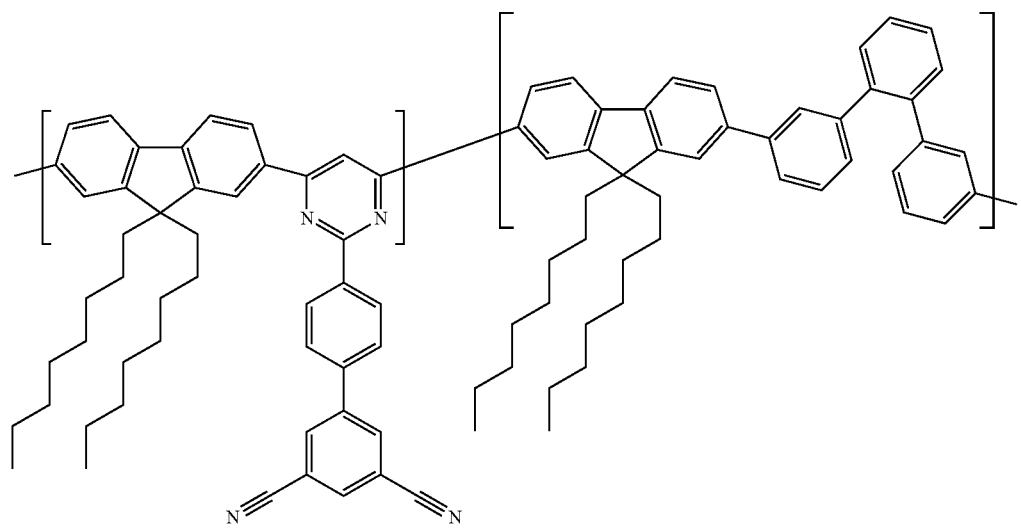
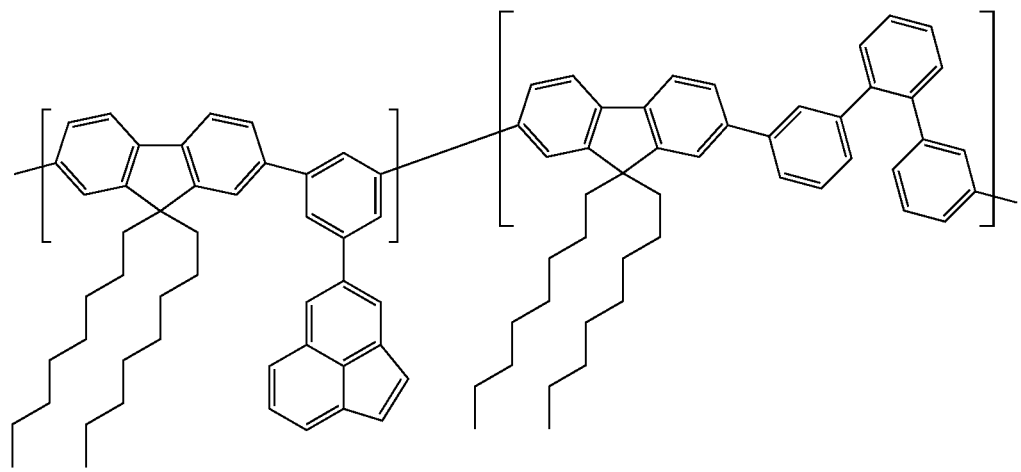

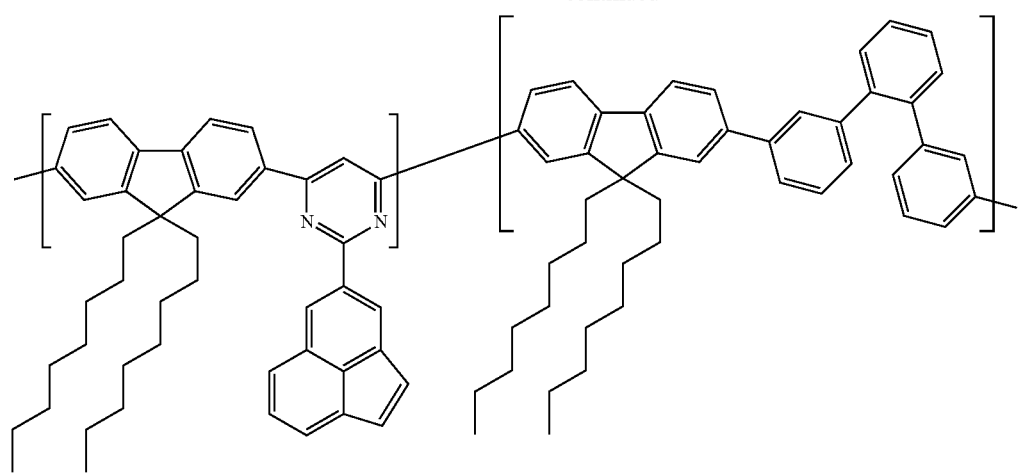
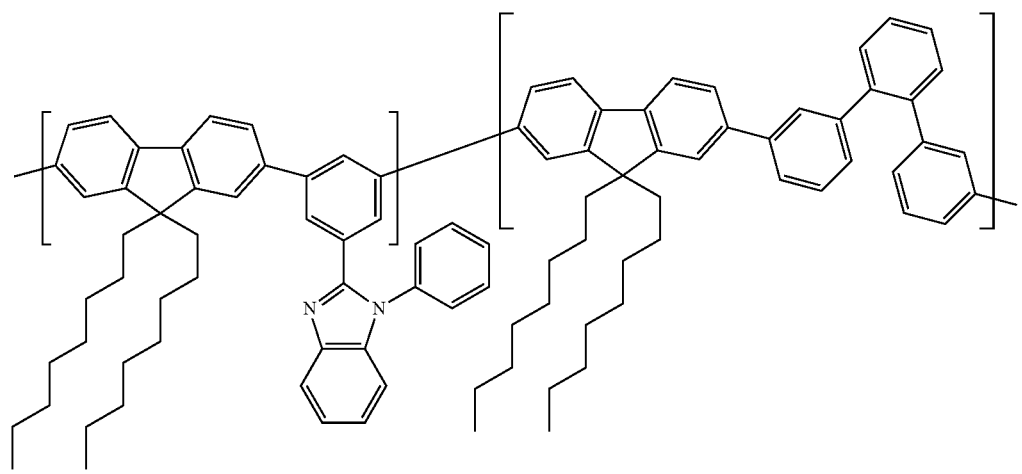
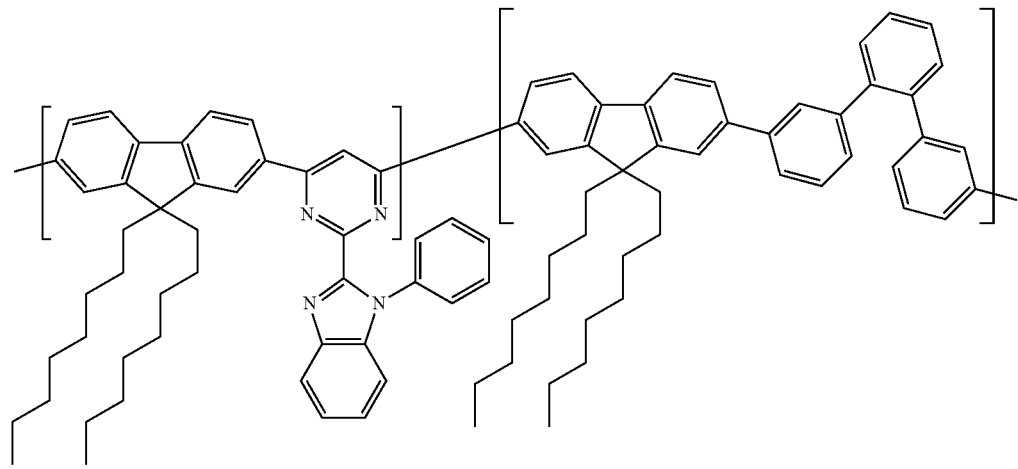

-continued
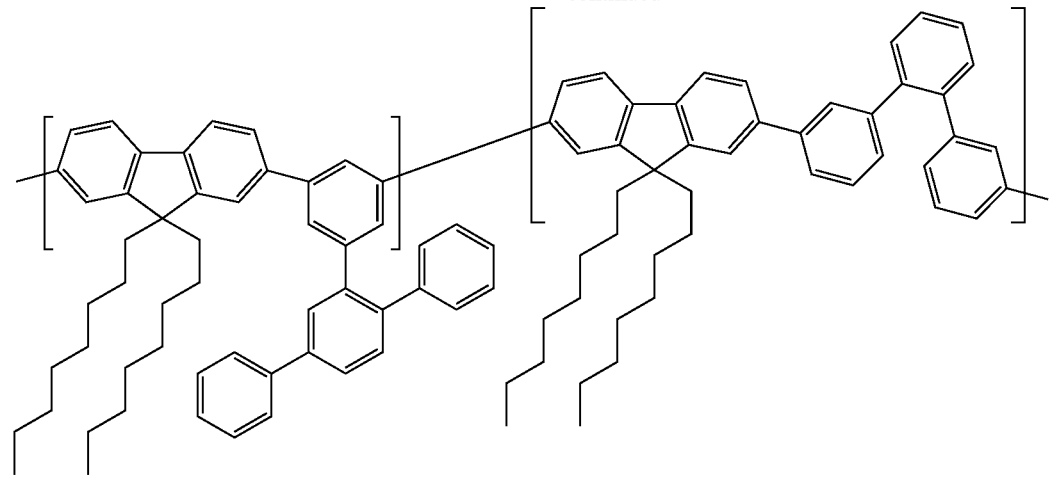
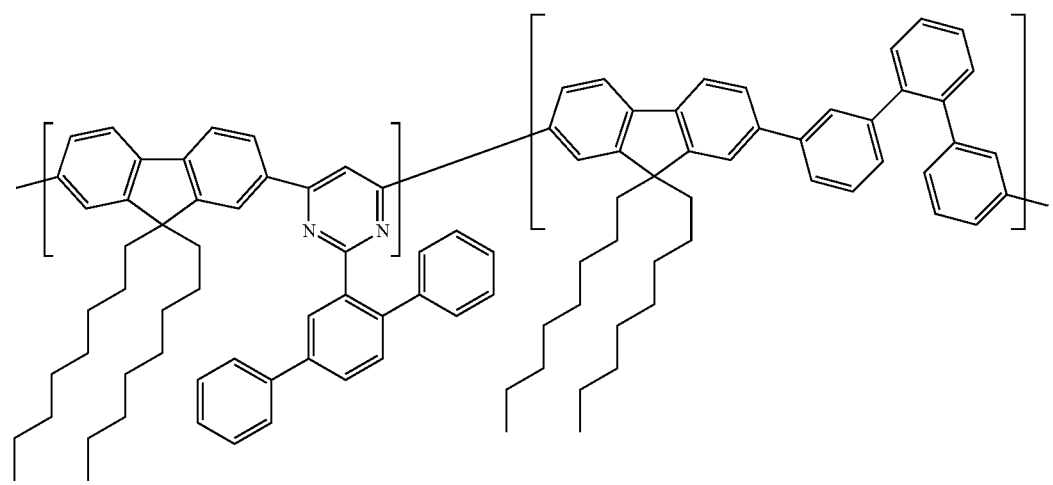
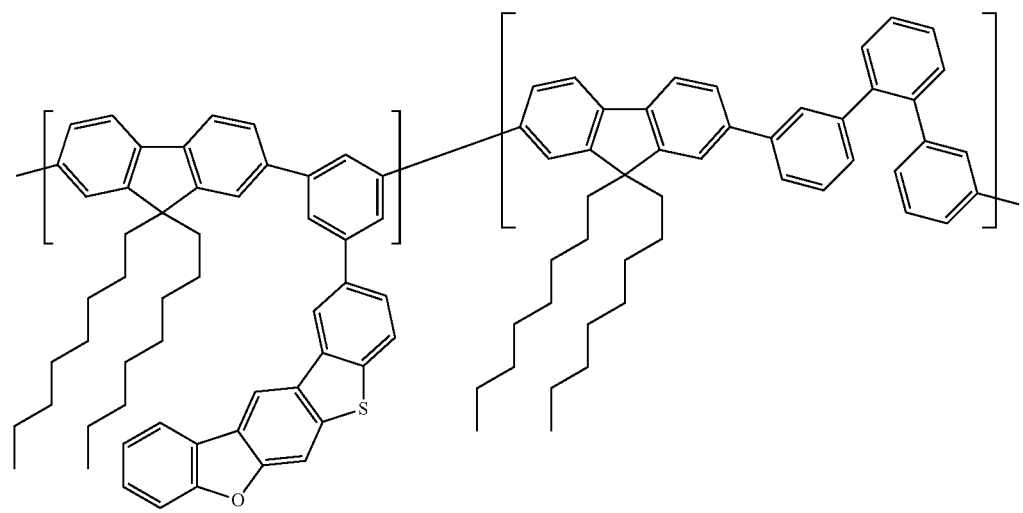

133
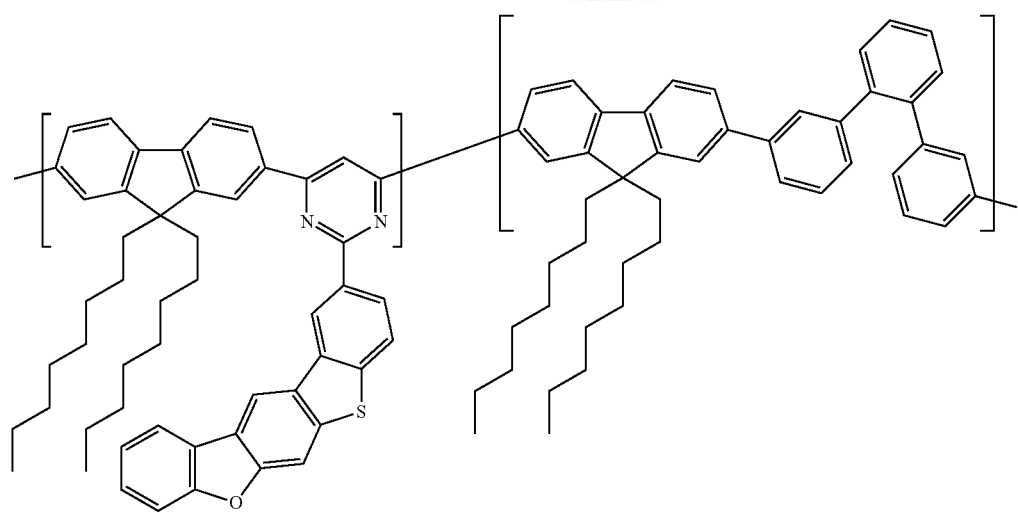
134
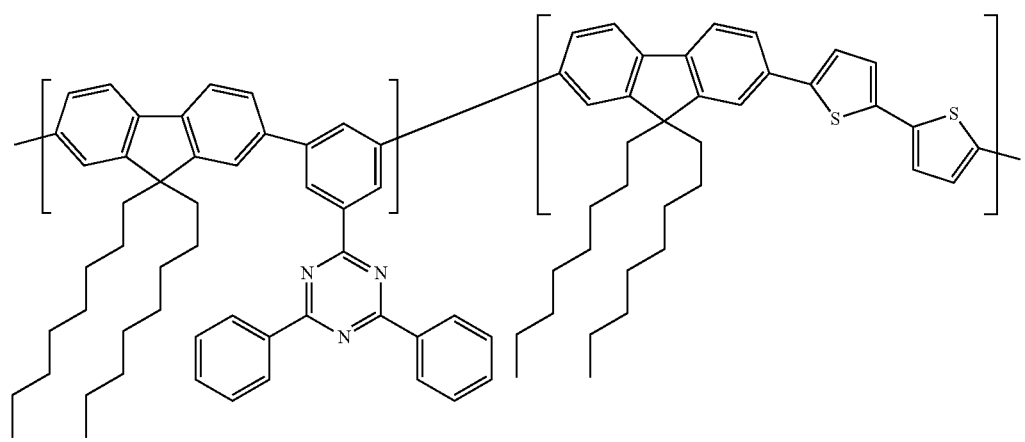
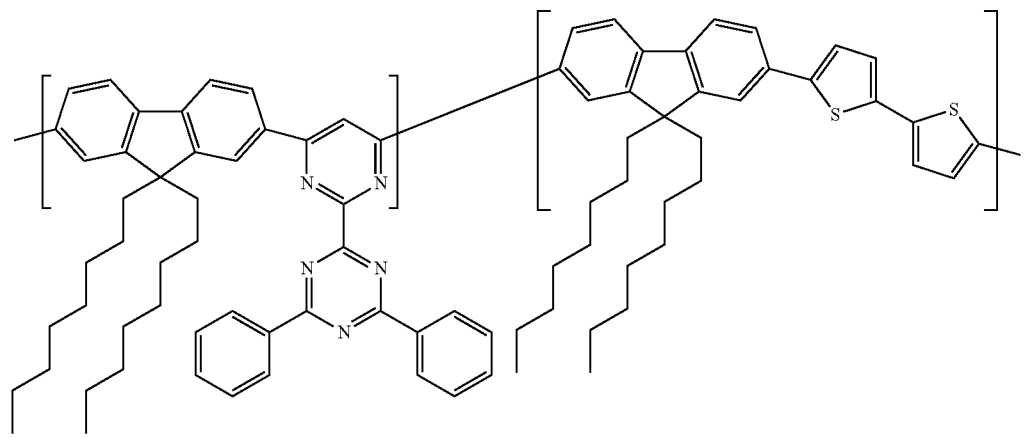

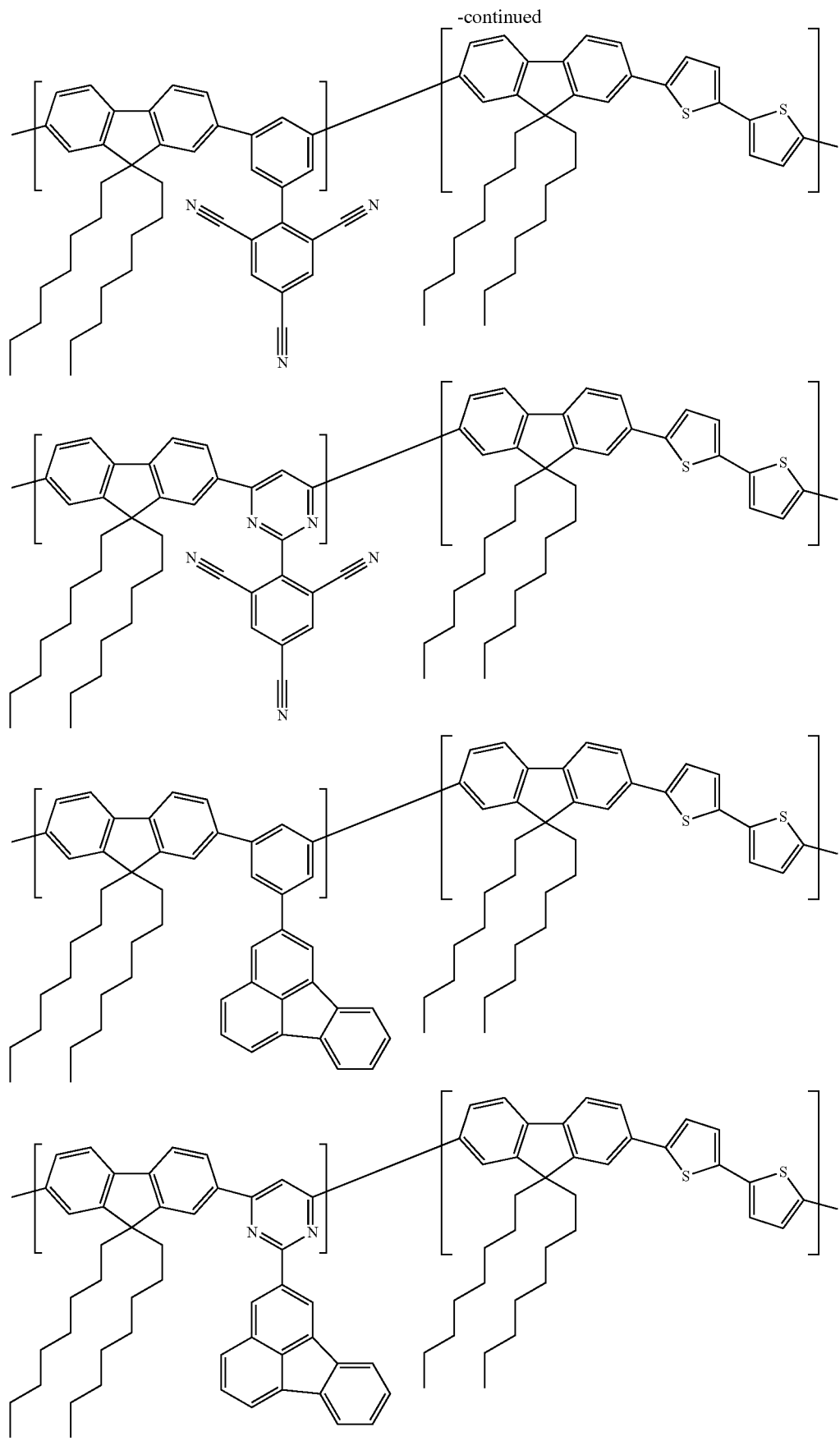

-continued
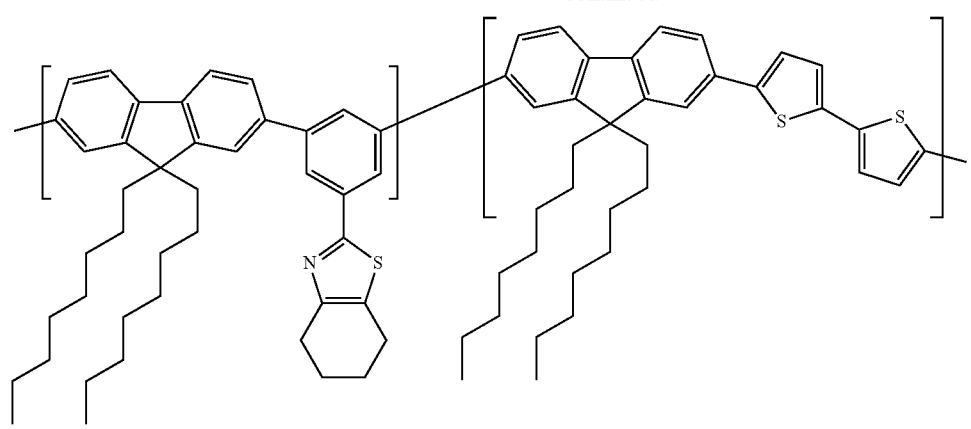
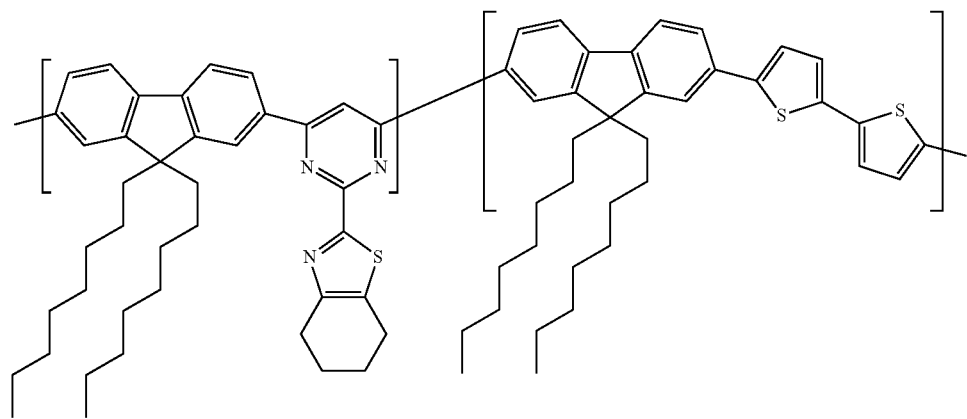
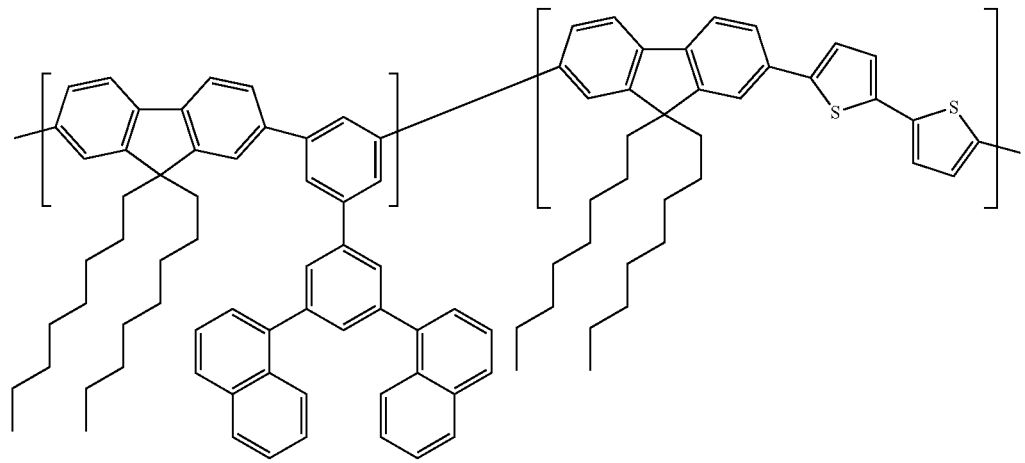

-continued
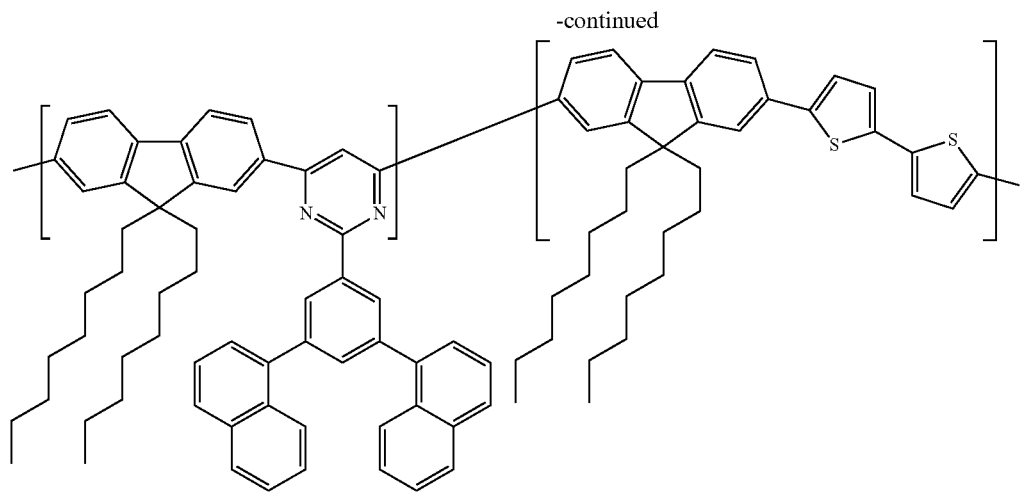
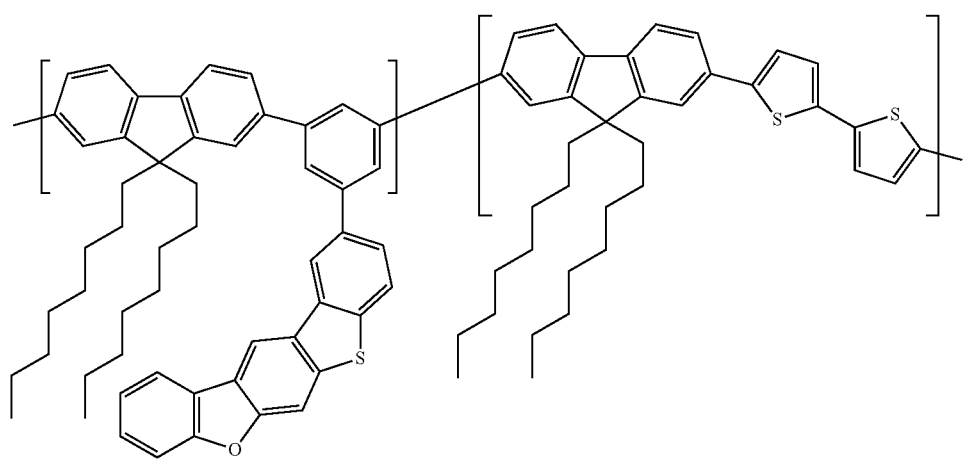
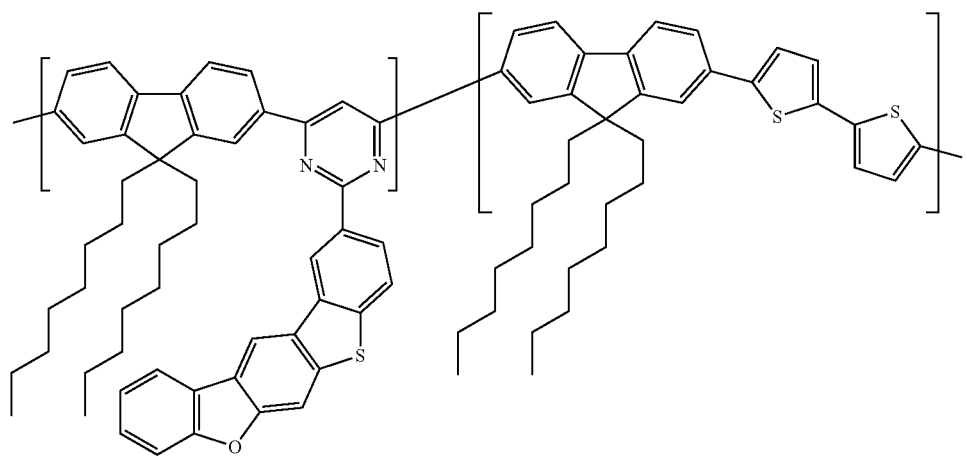

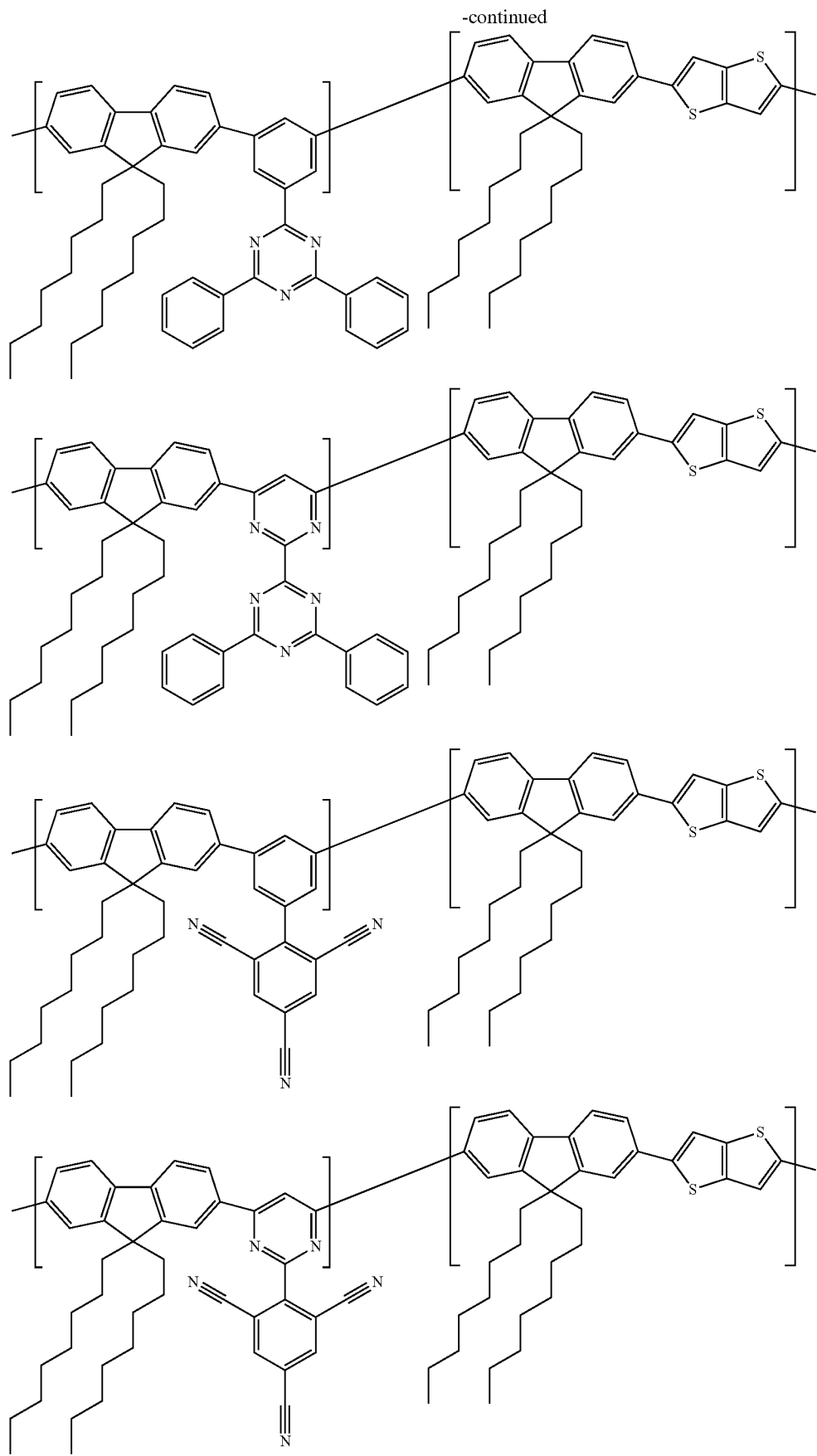

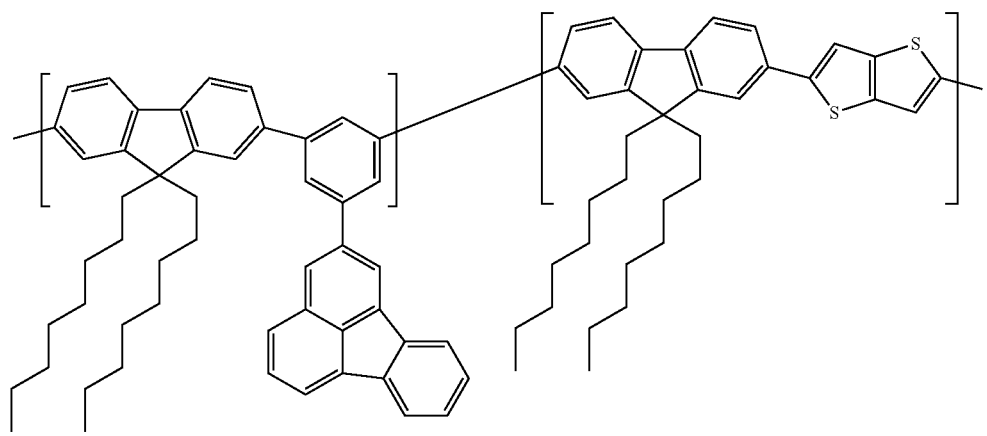
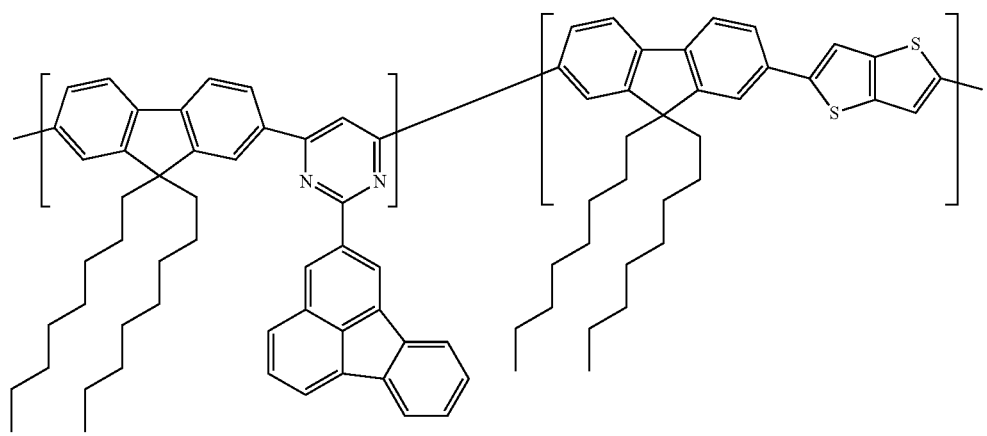
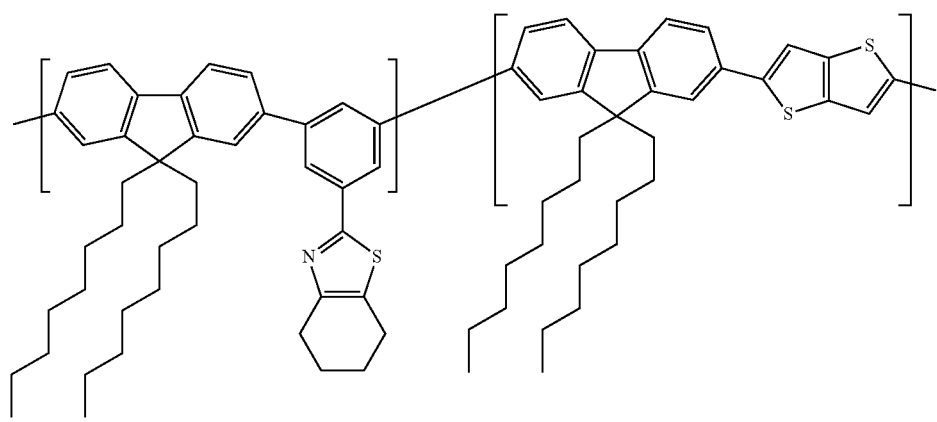
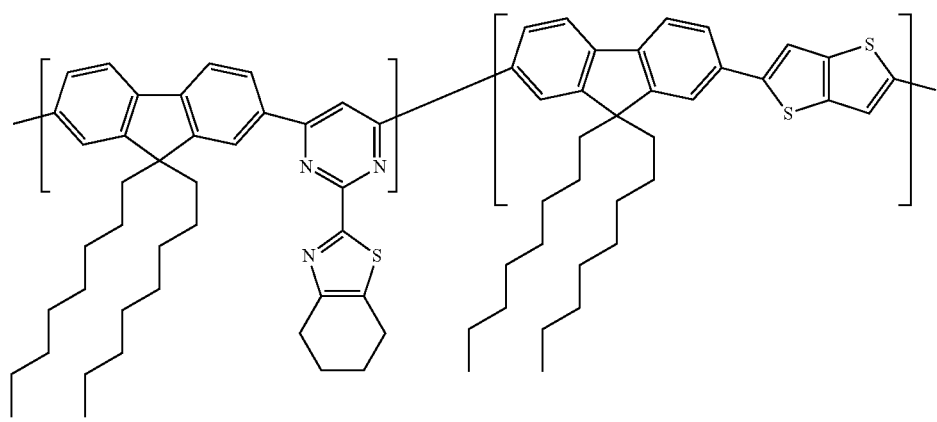

-continued
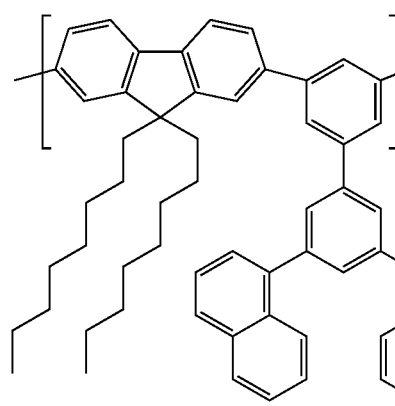 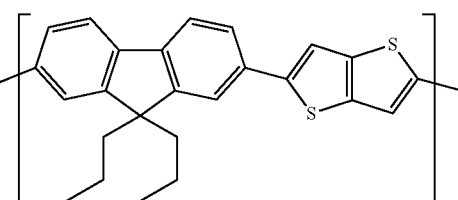
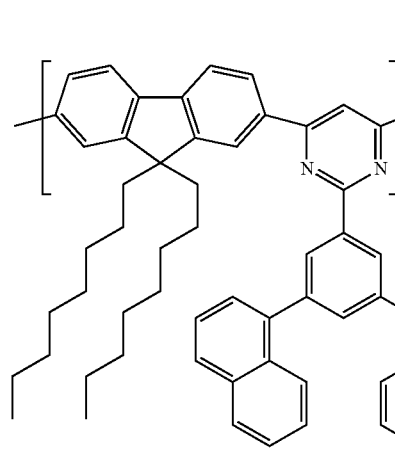 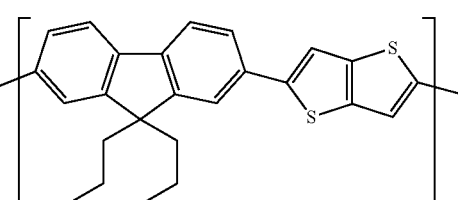
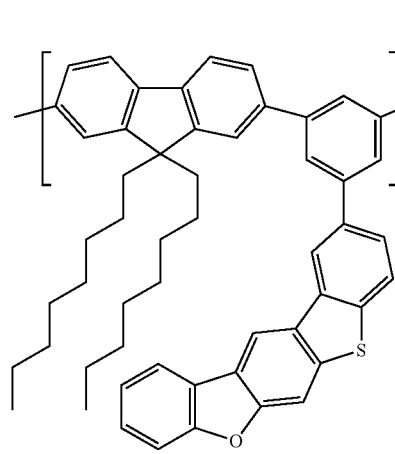 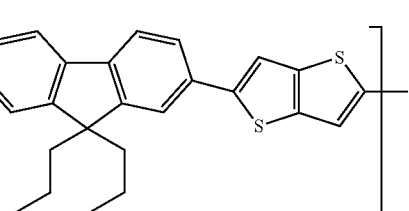

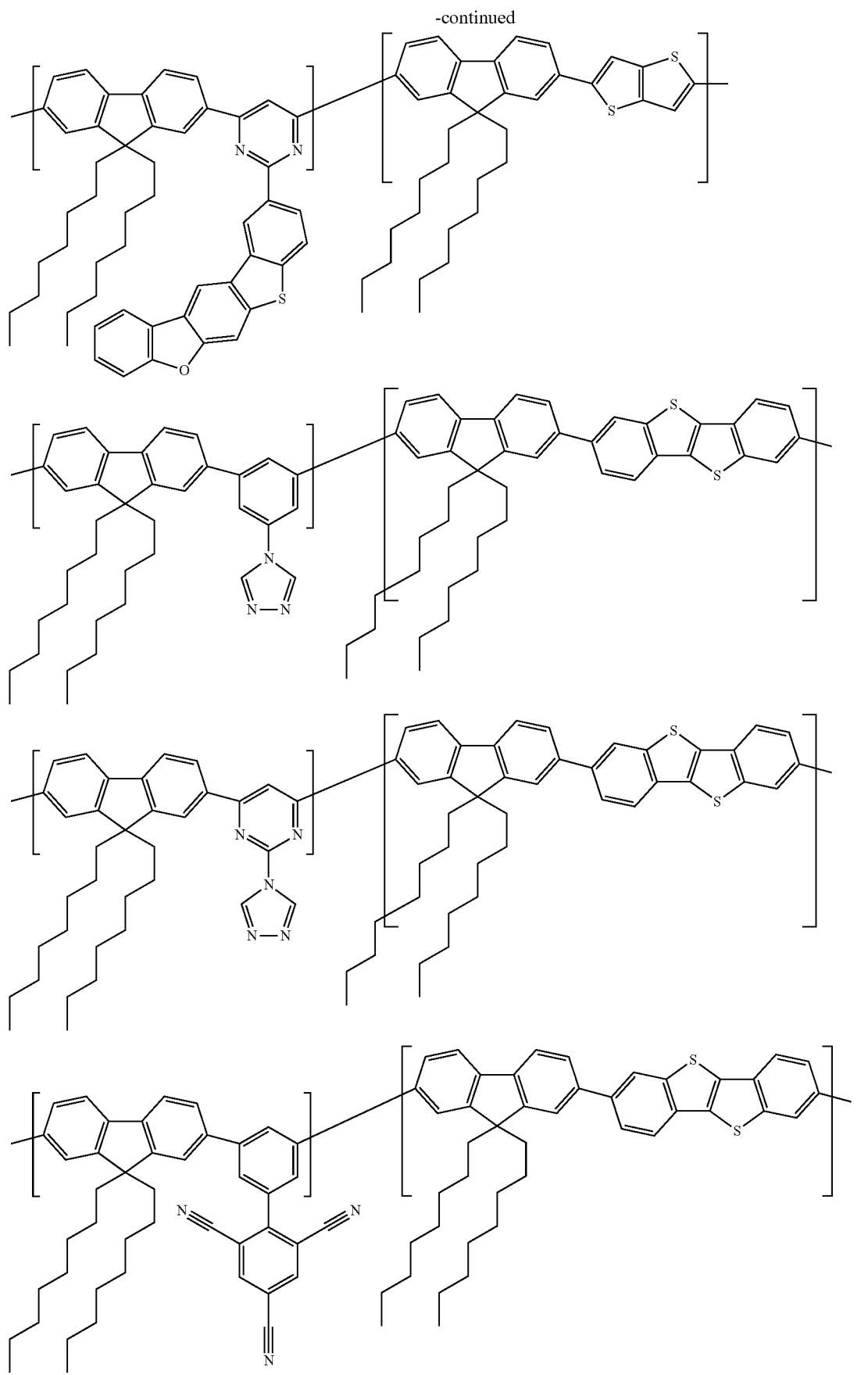

-continued
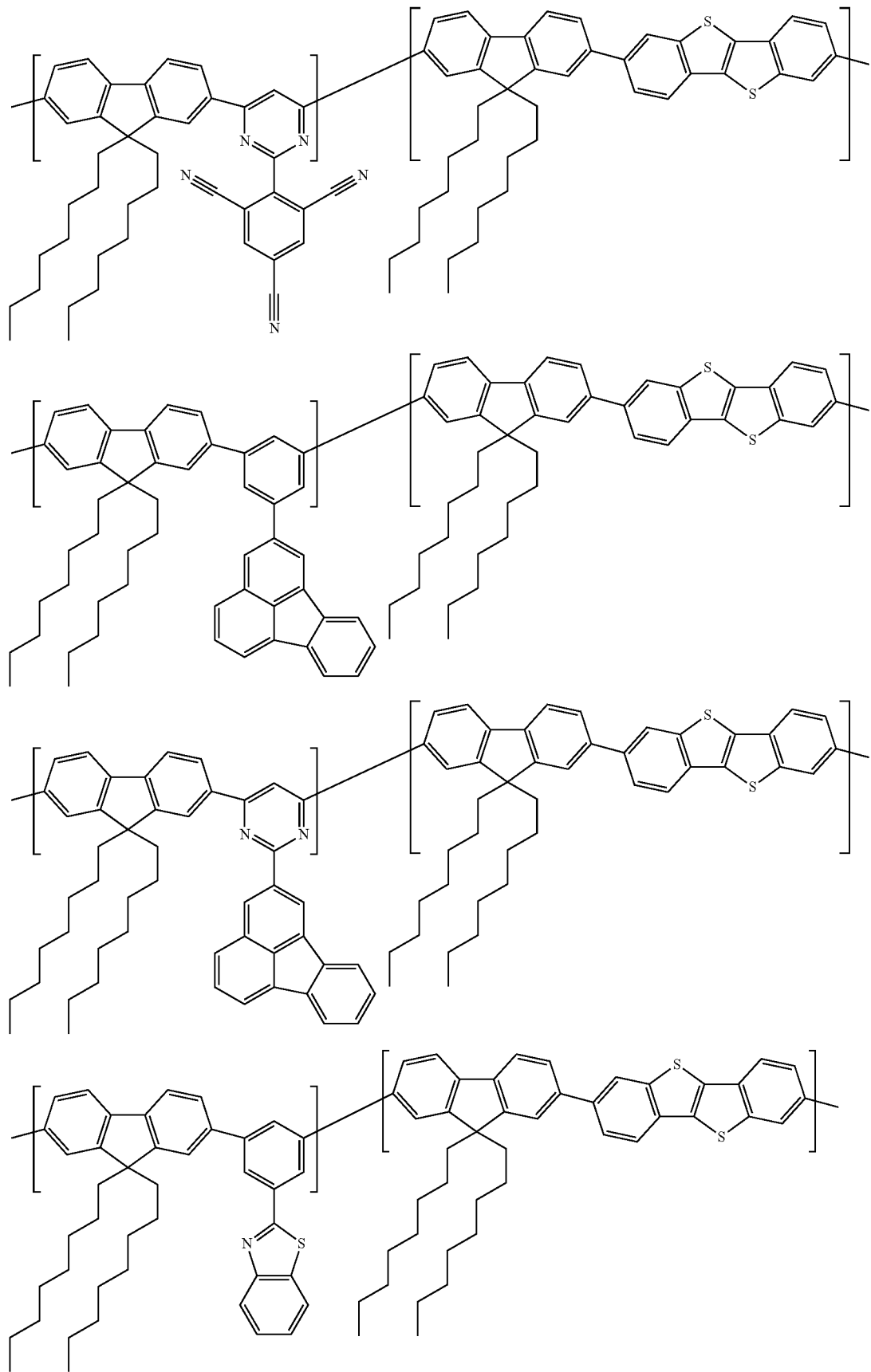

-continued
151
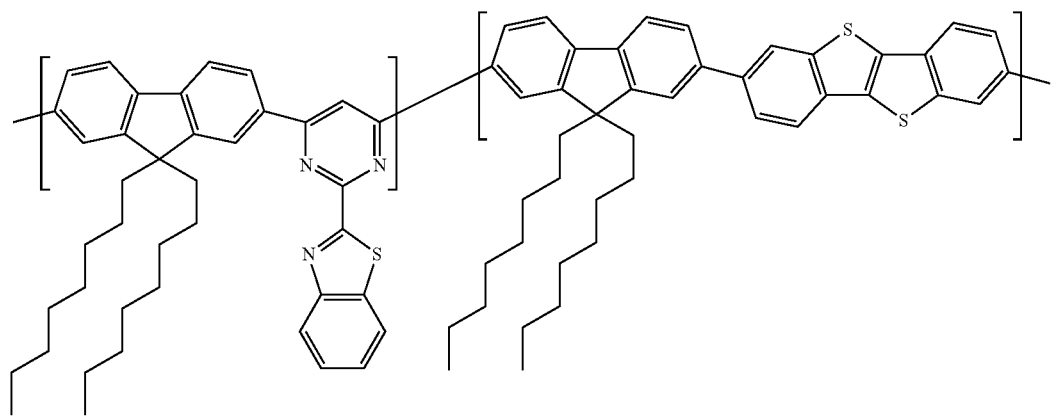
152
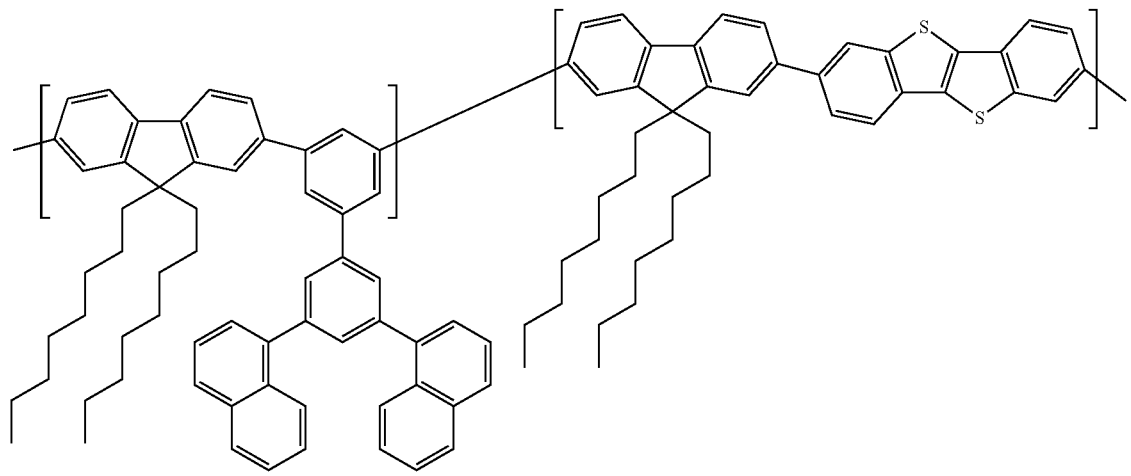
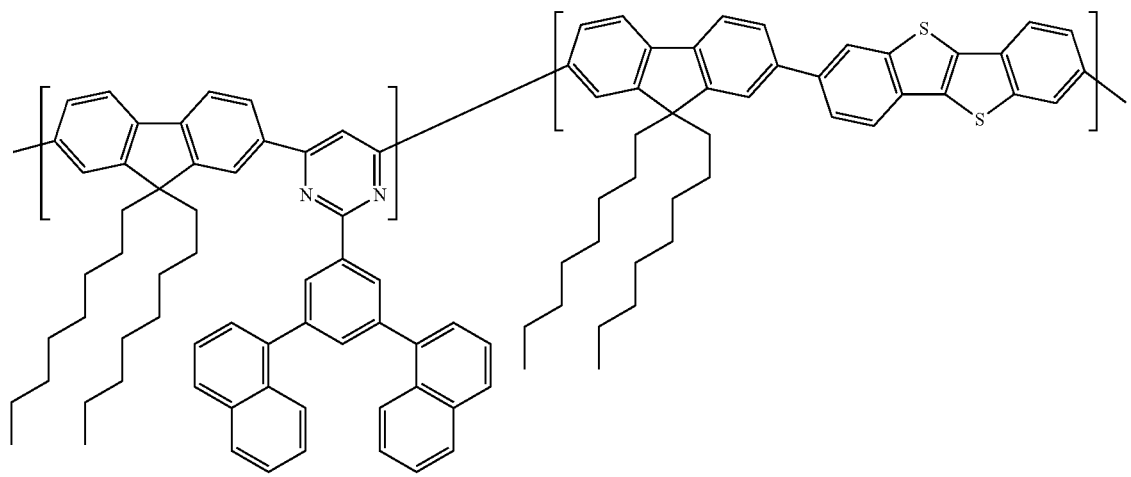

-continued
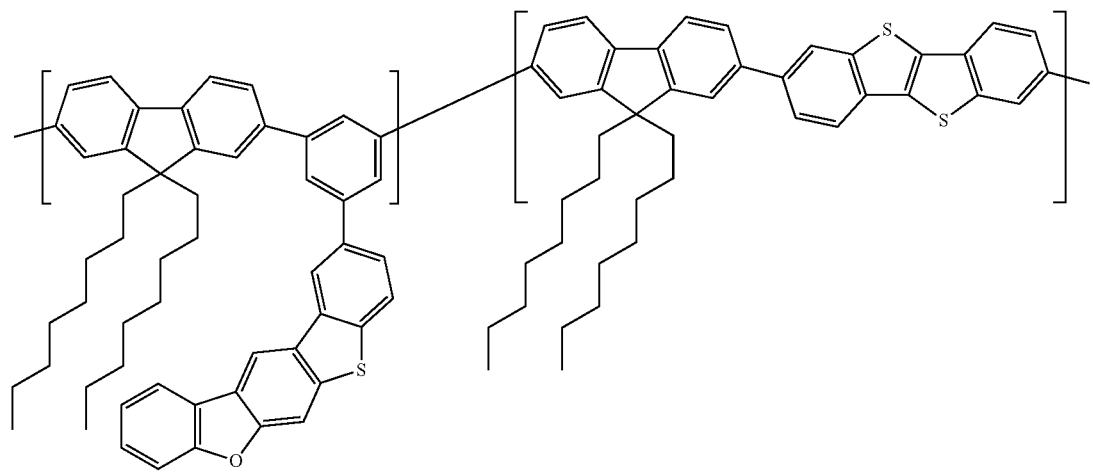
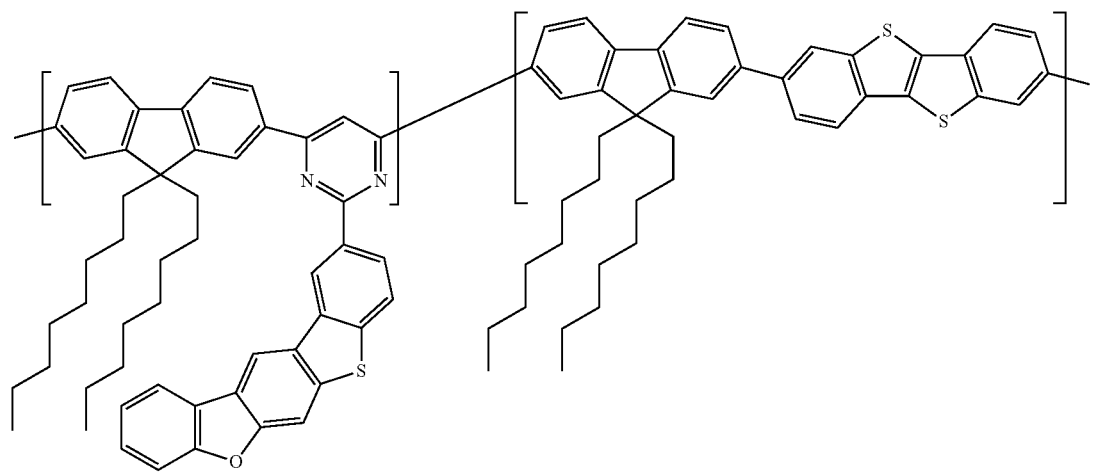
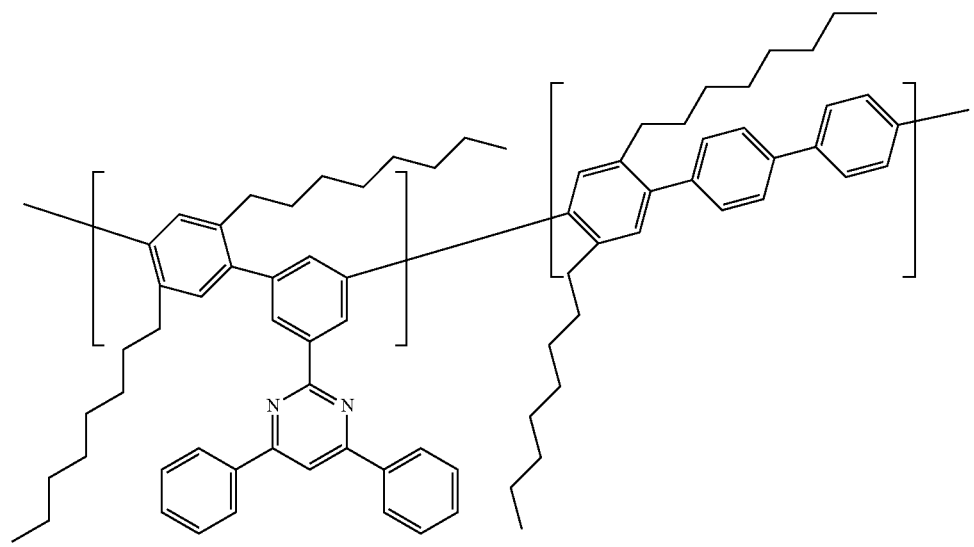

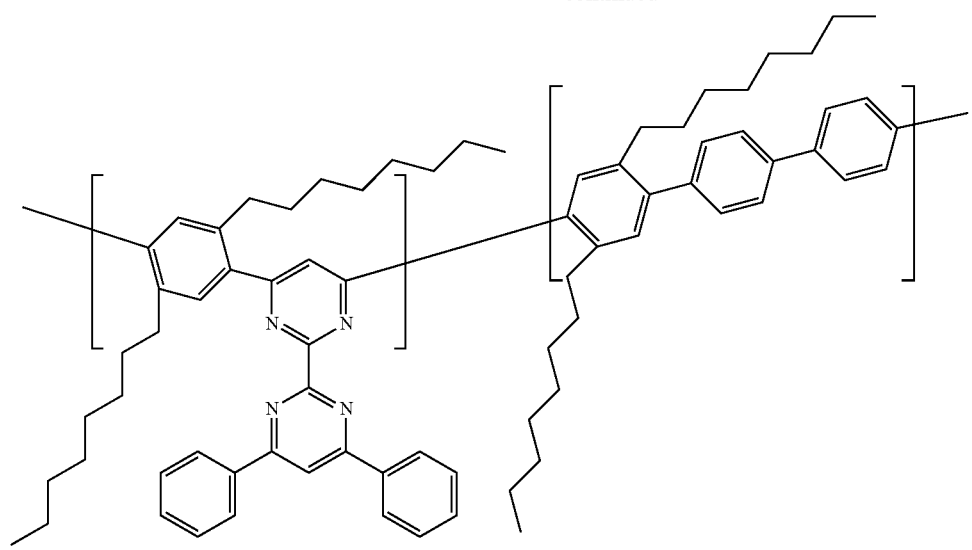
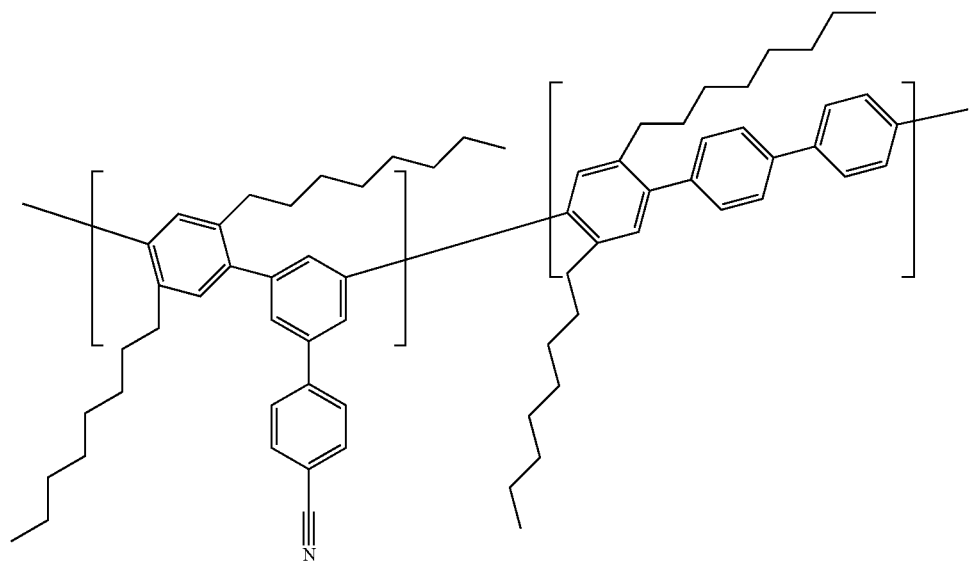
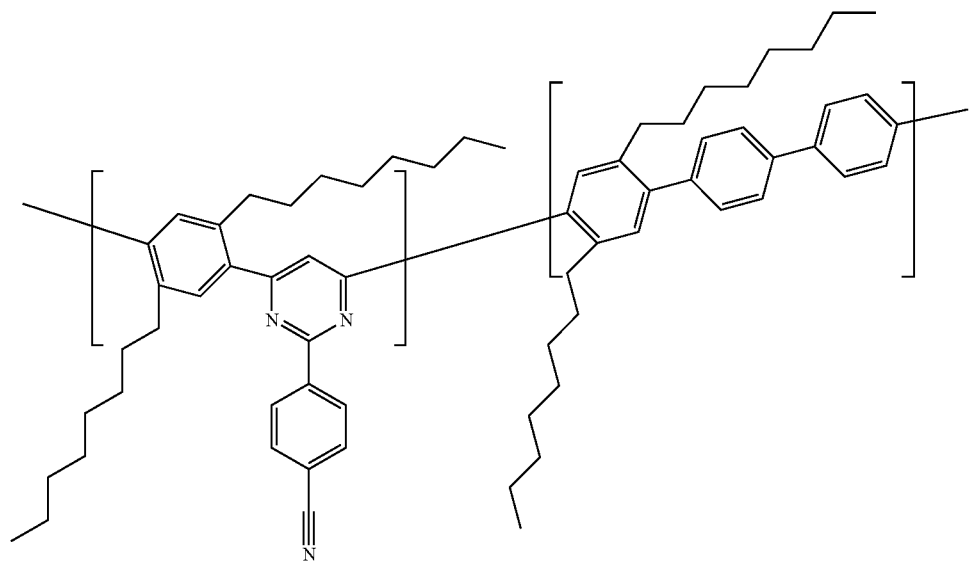

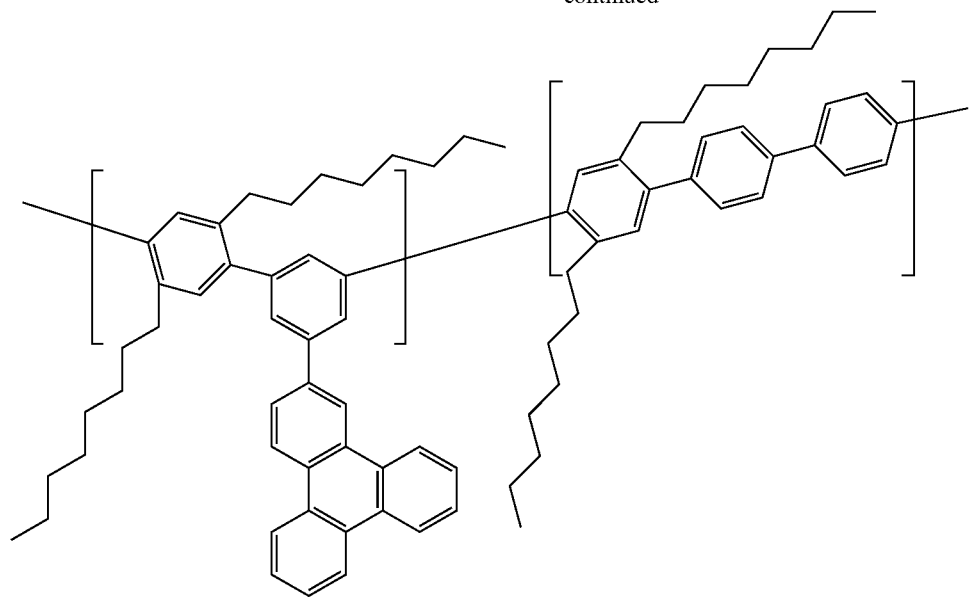
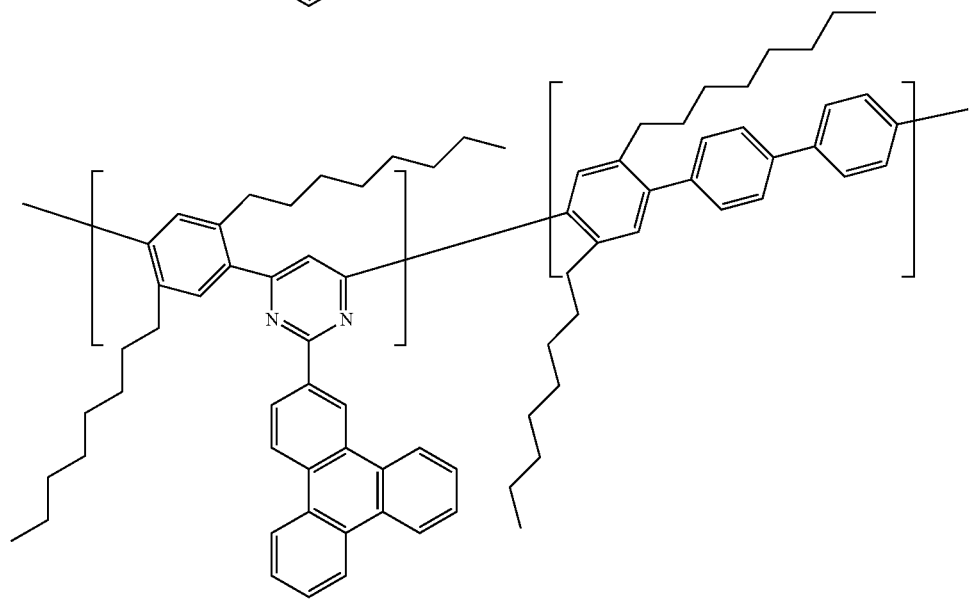
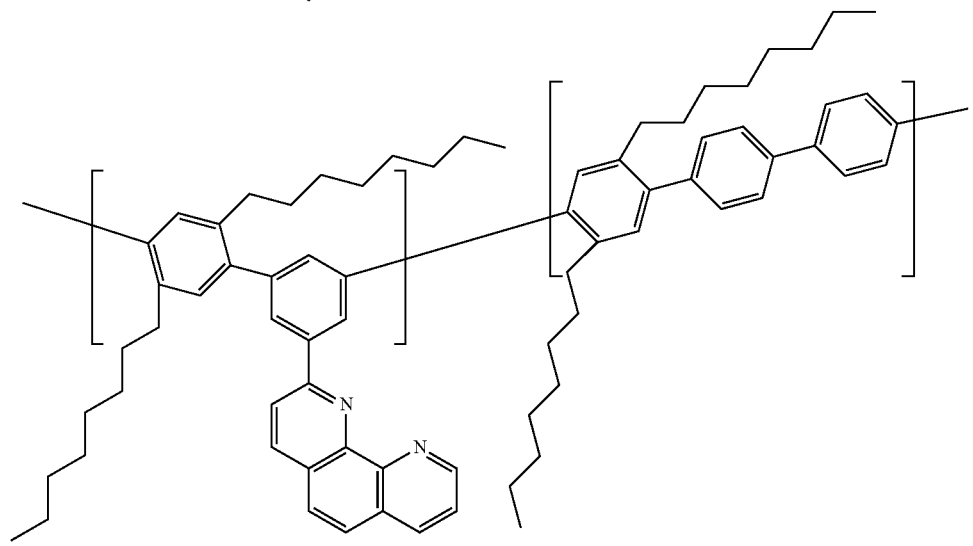

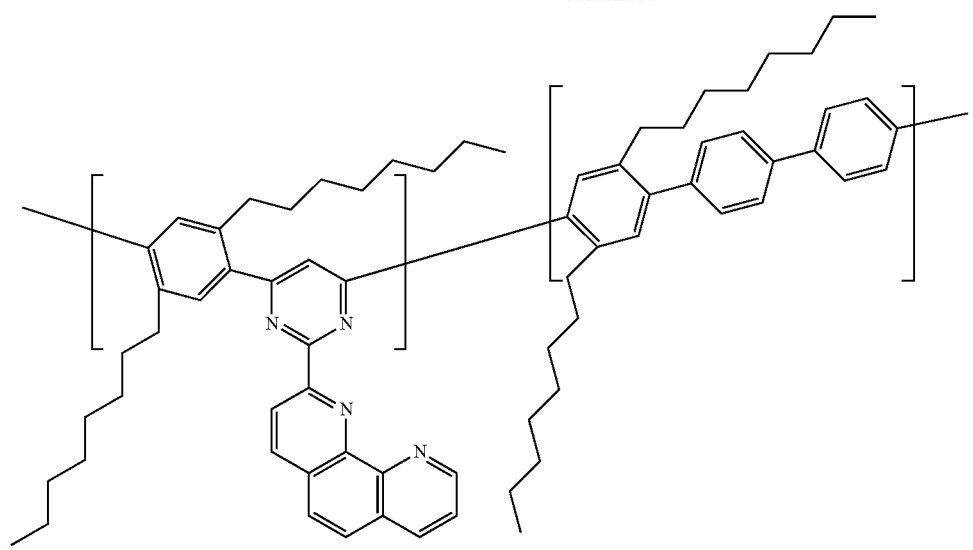
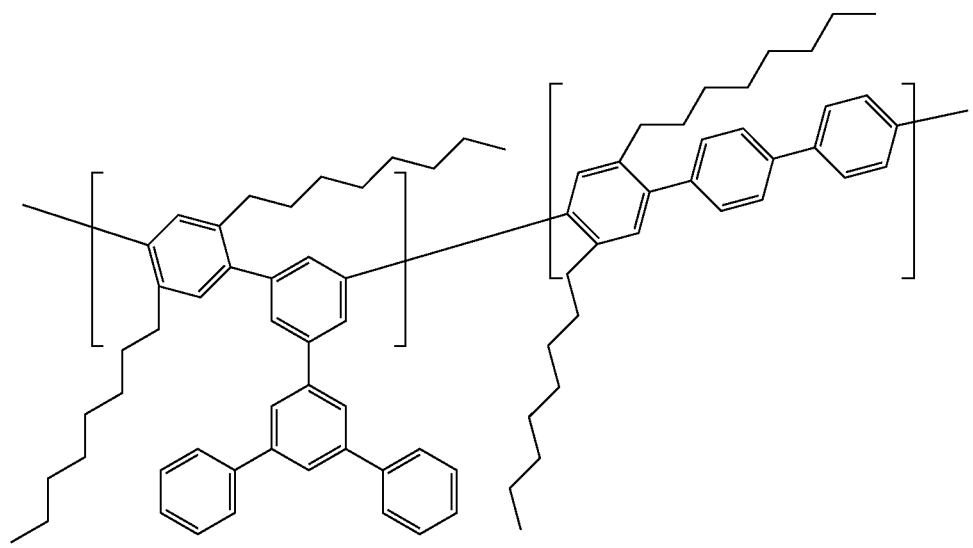
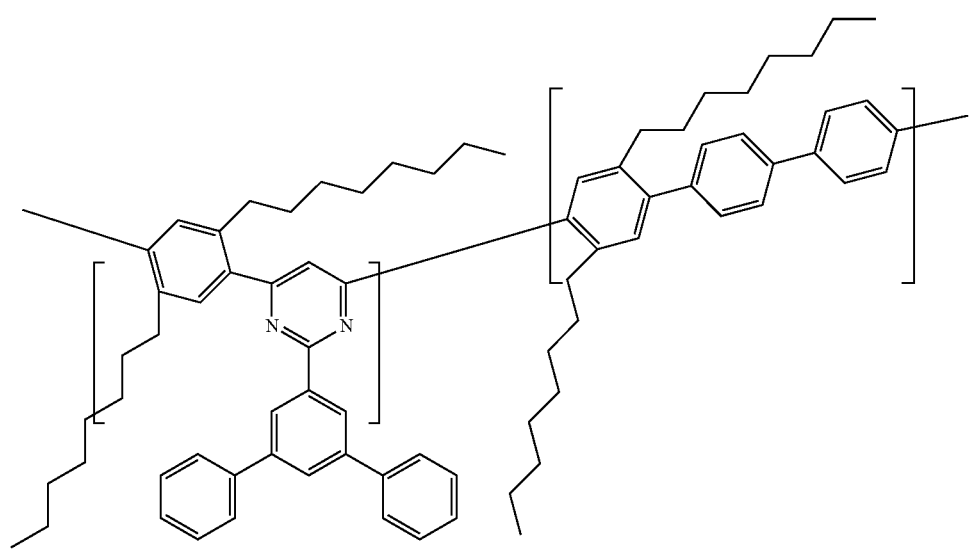

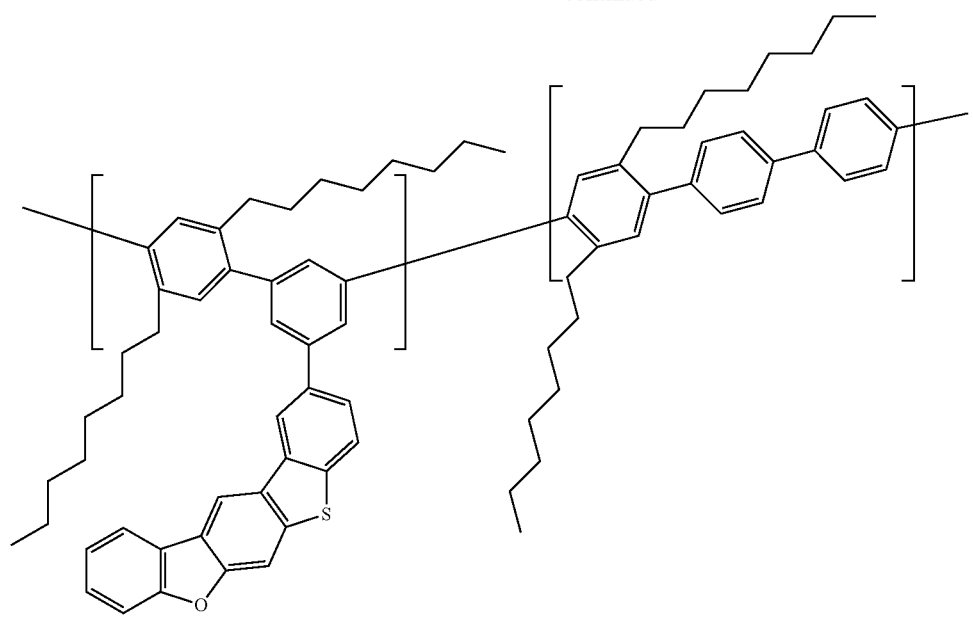
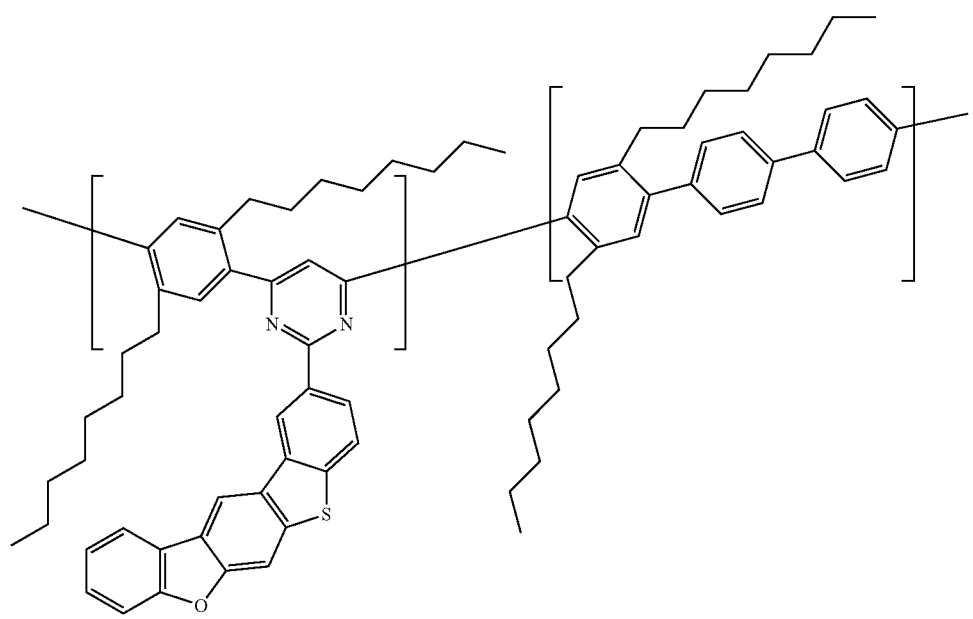

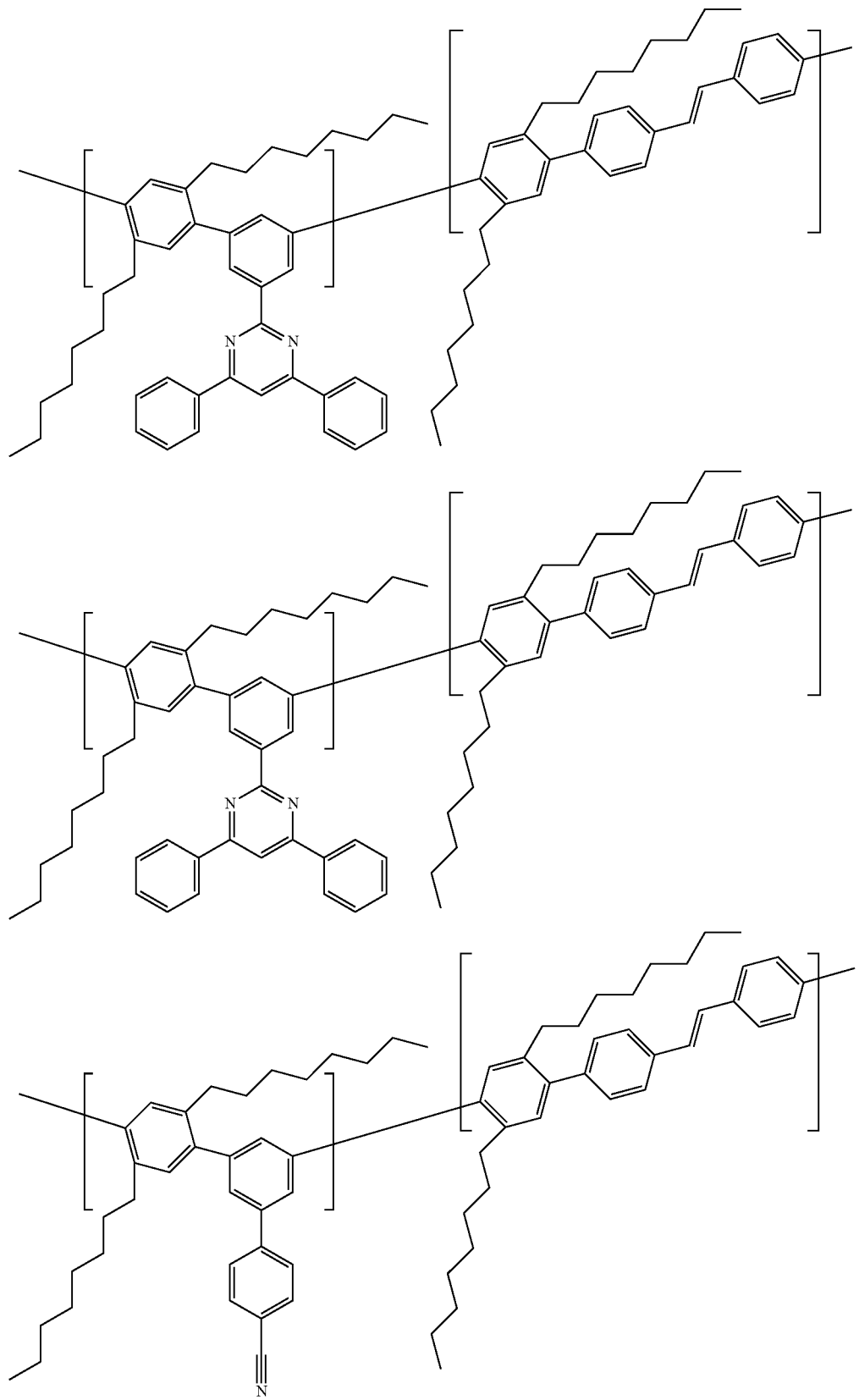

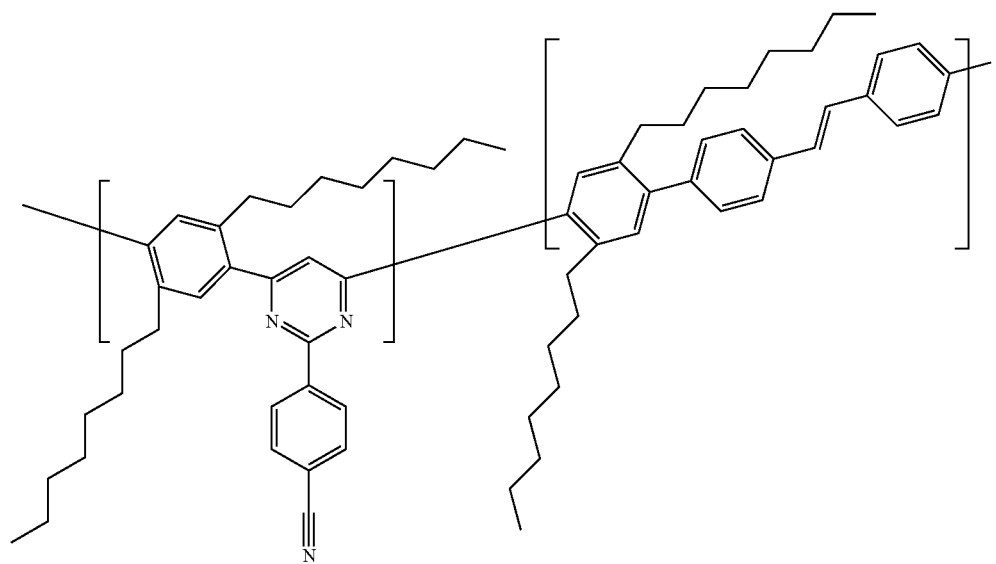
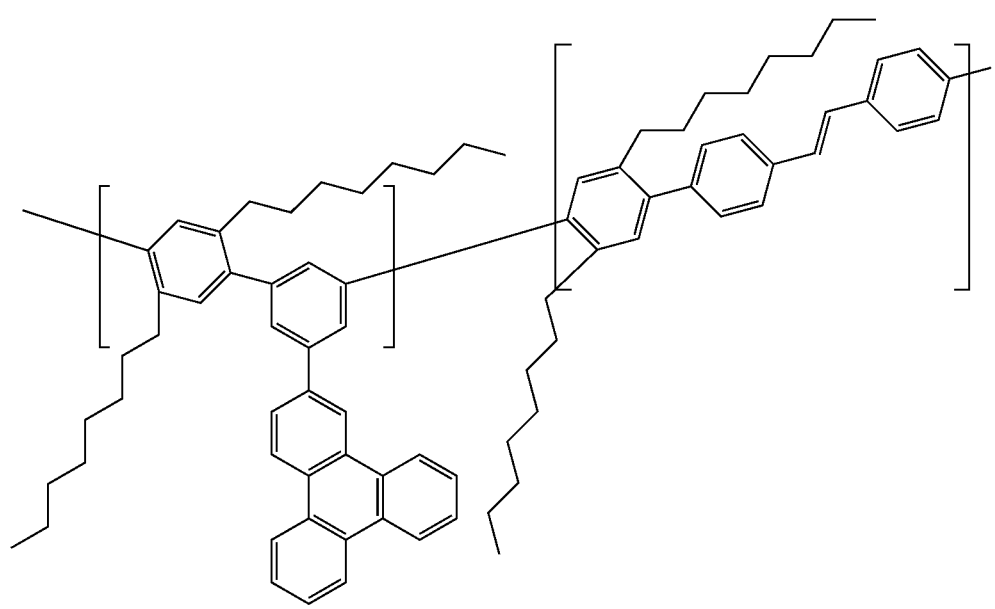

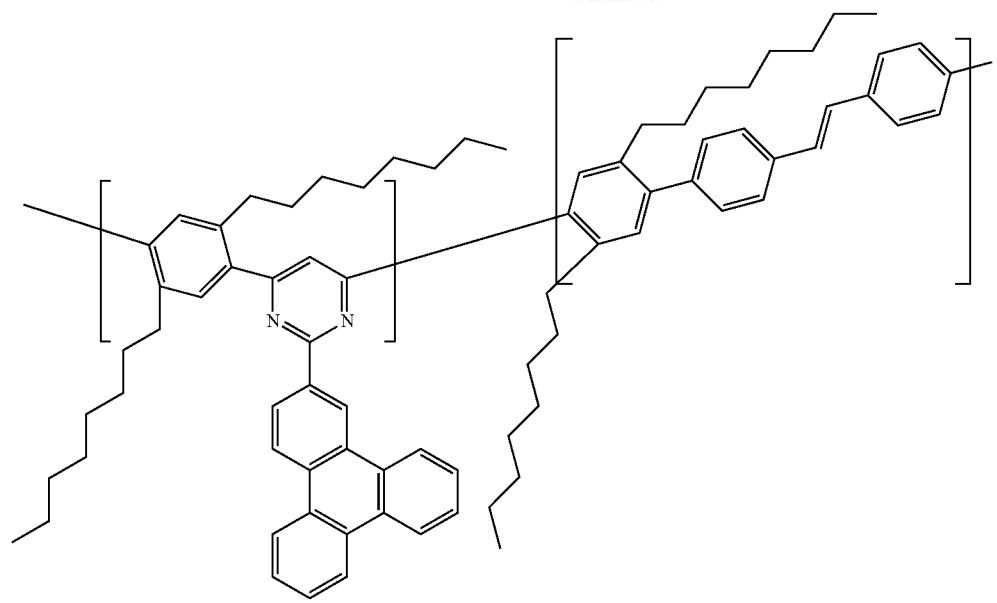
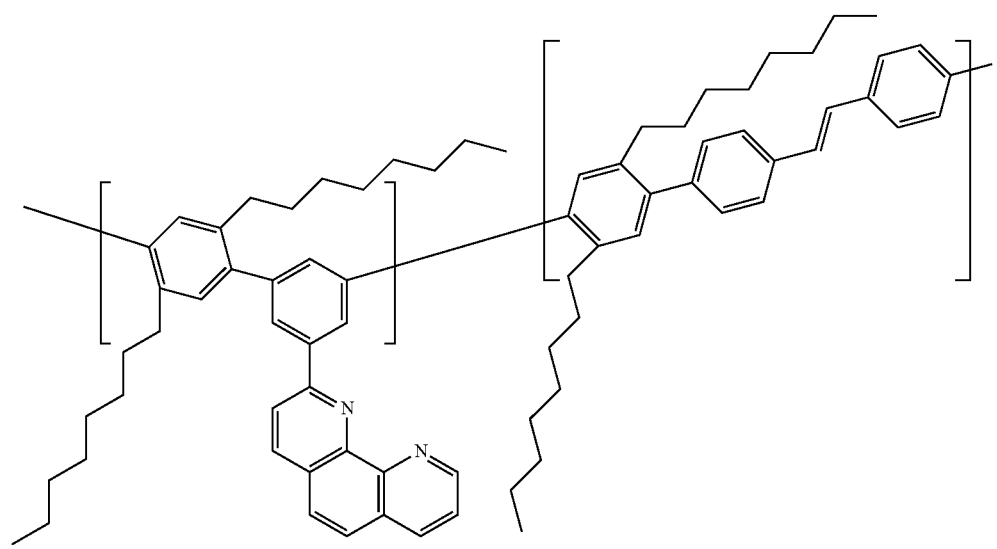
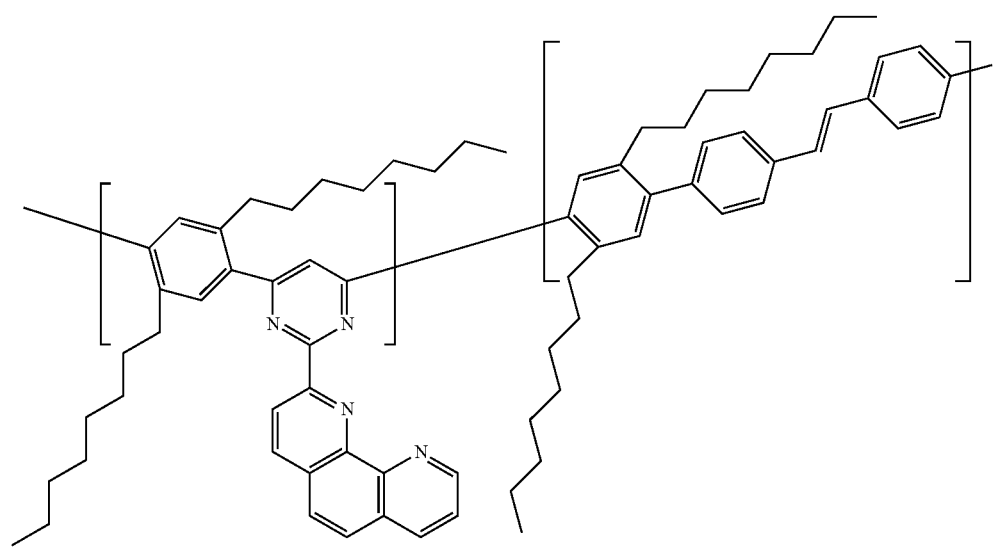

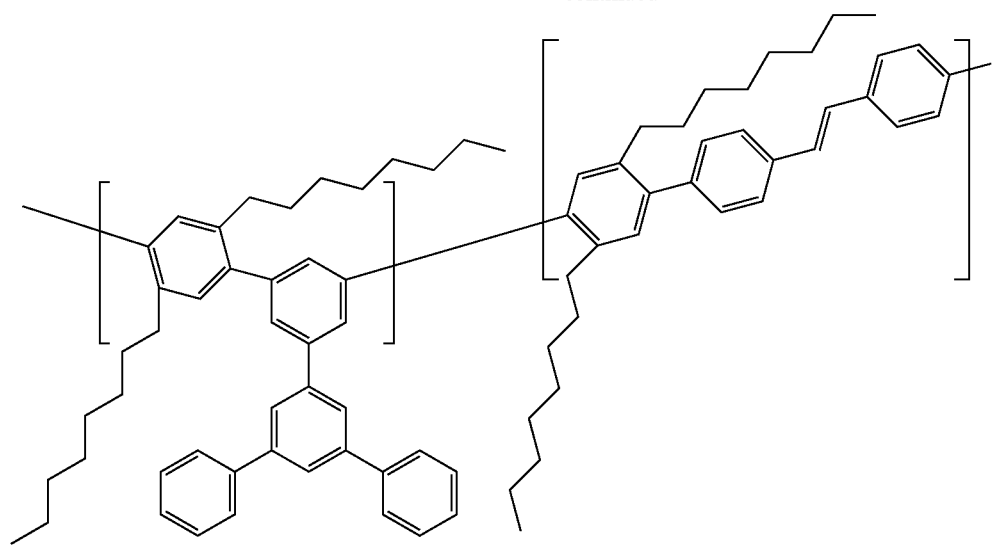
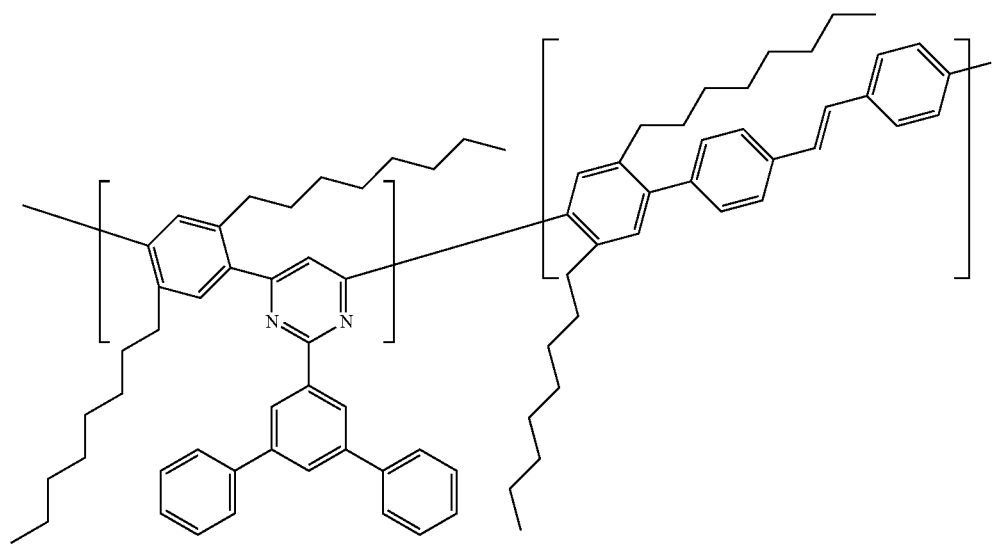
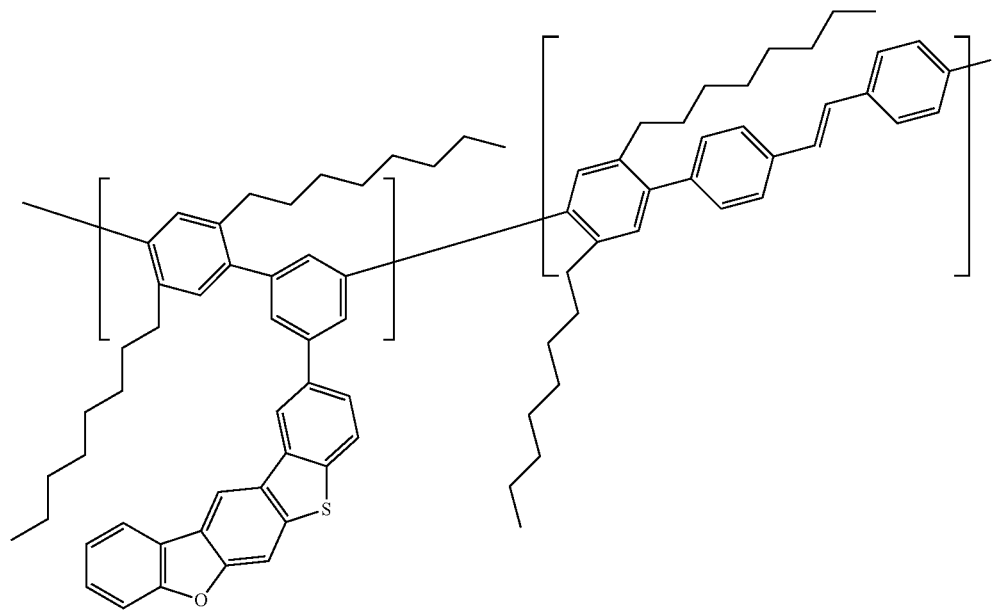

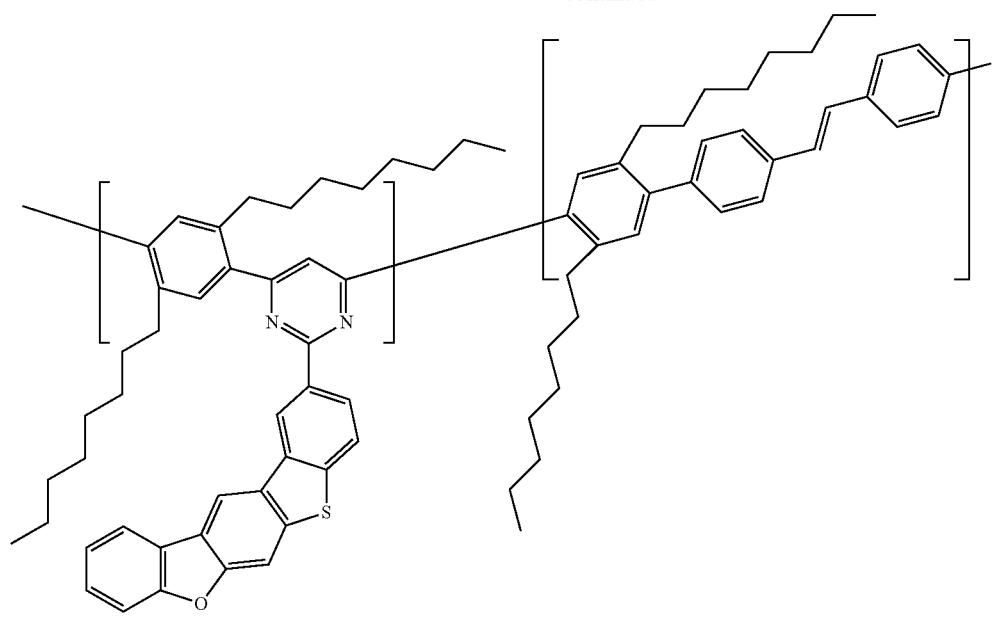
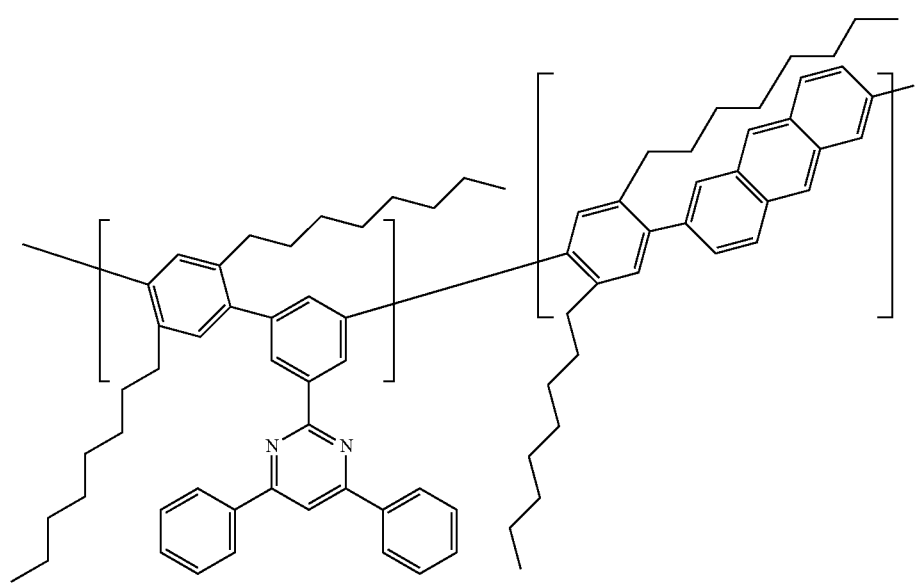

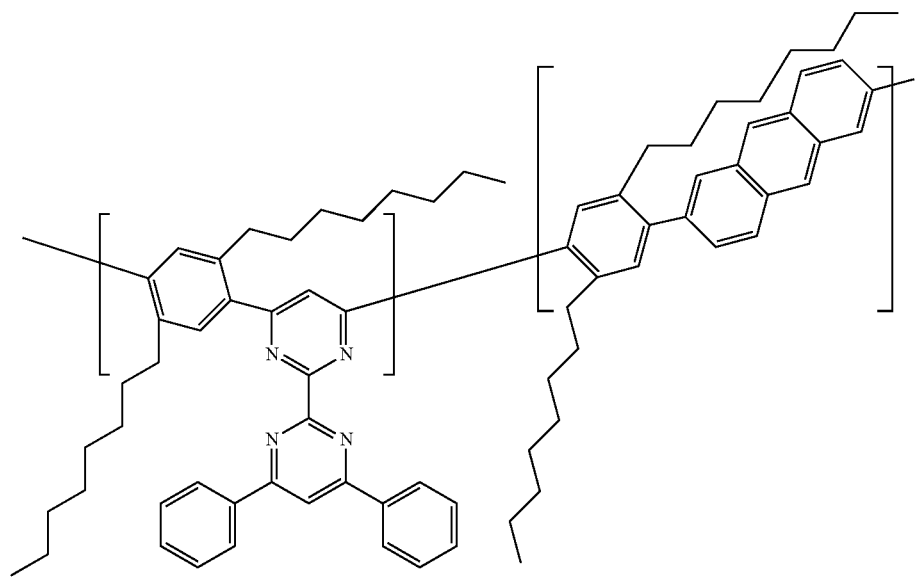
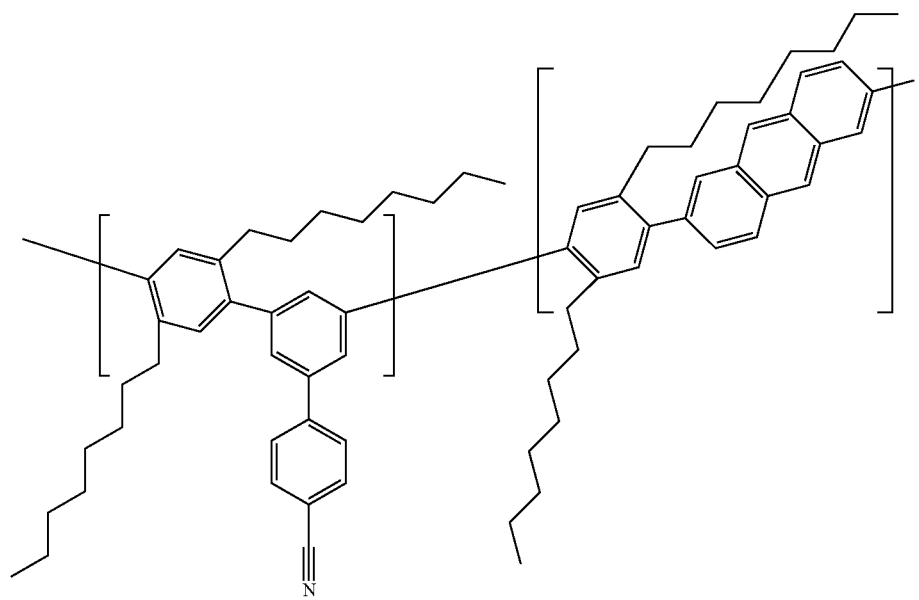

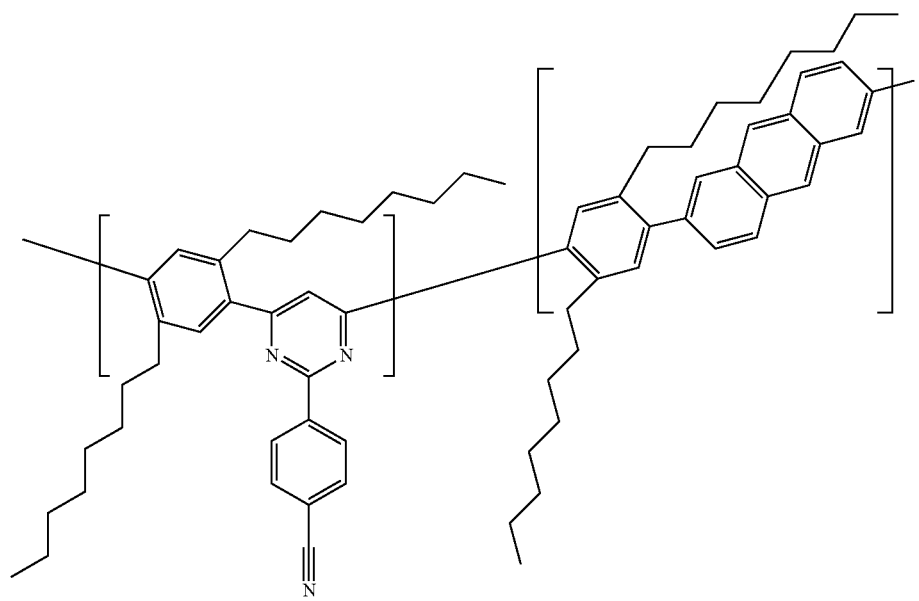
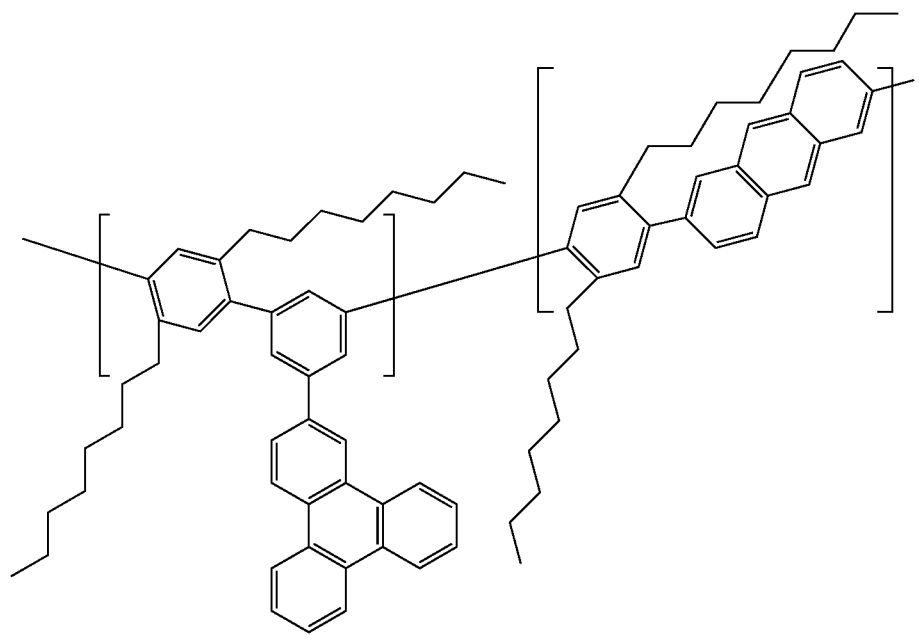

-continued
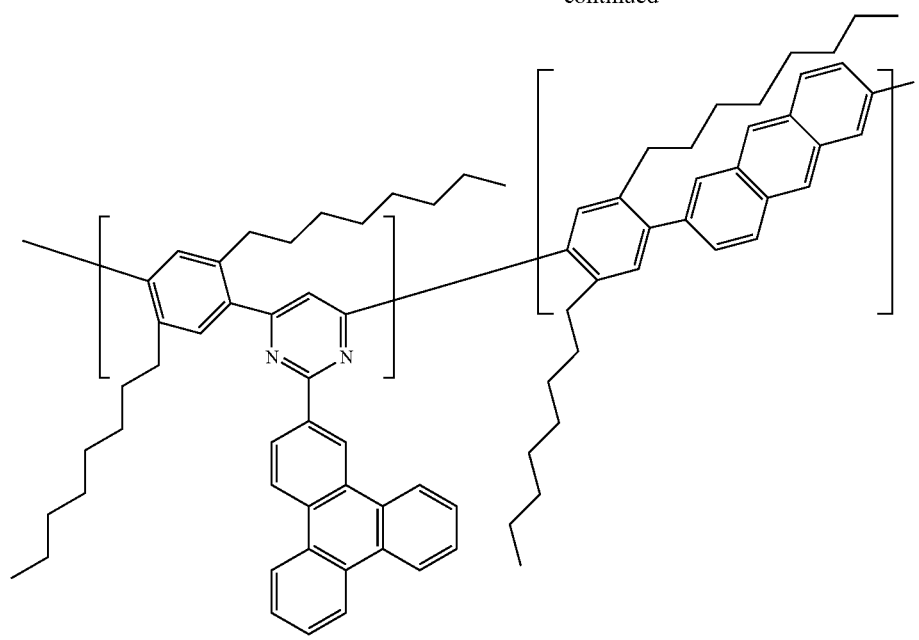
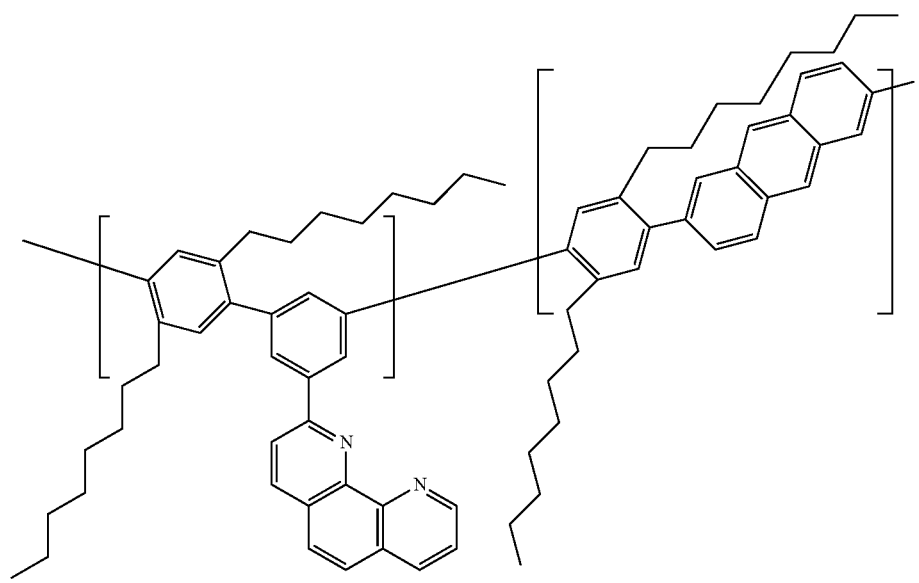

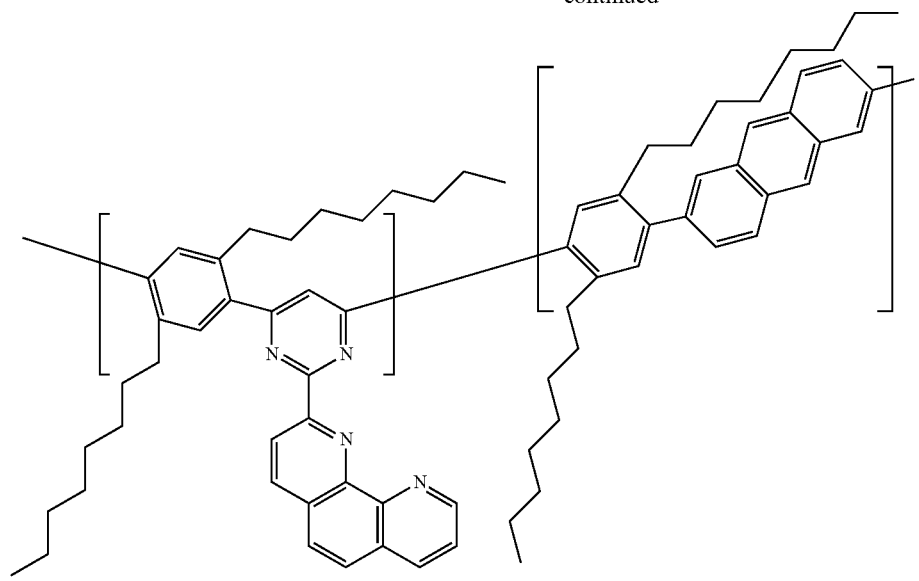
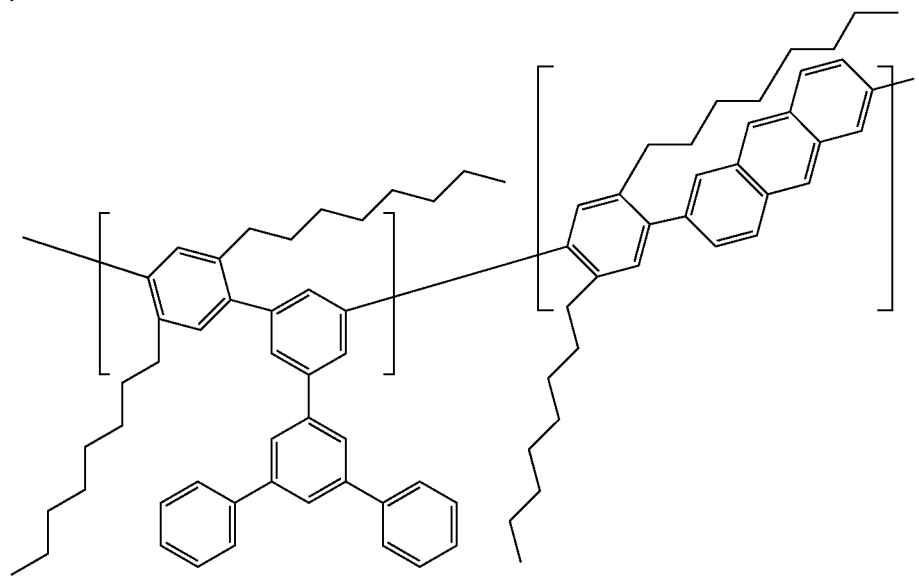
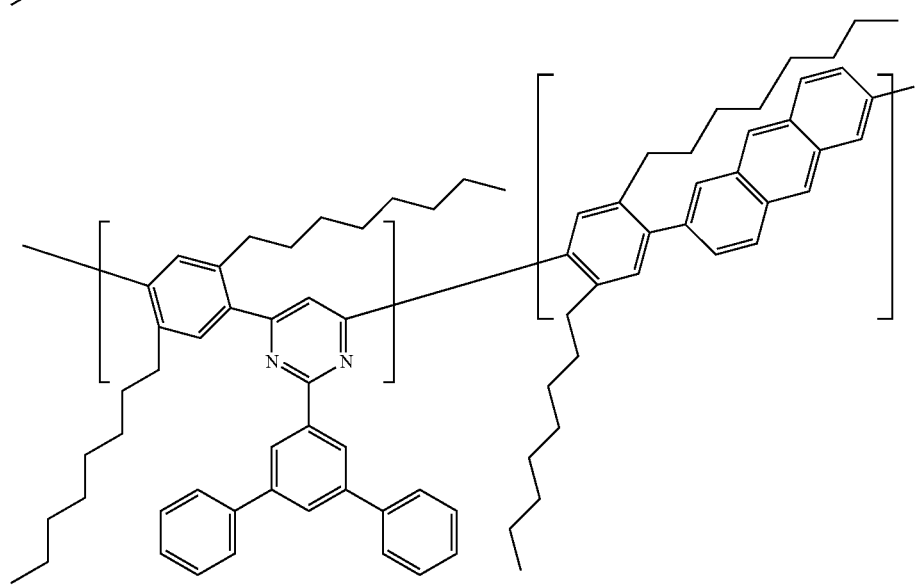

-continued
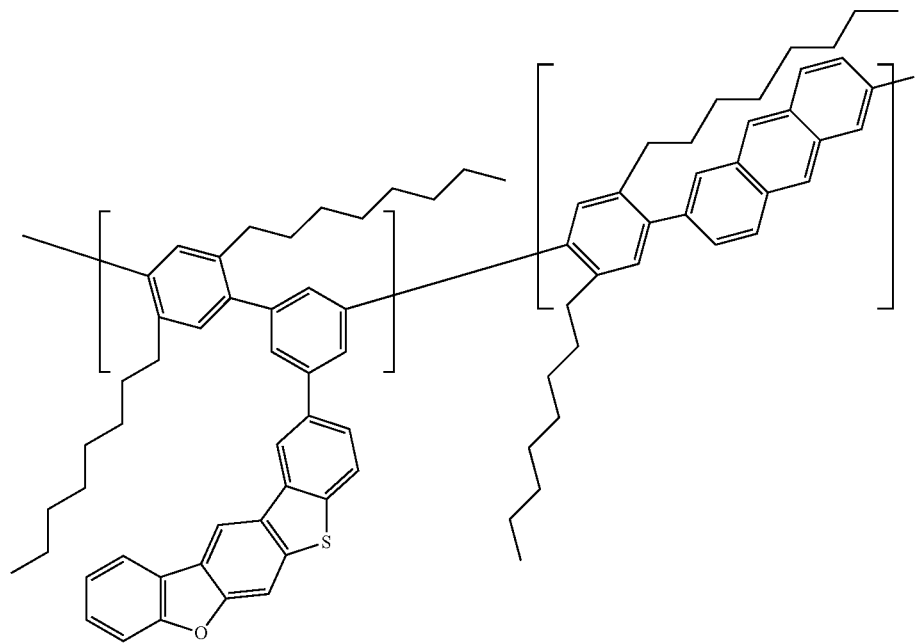
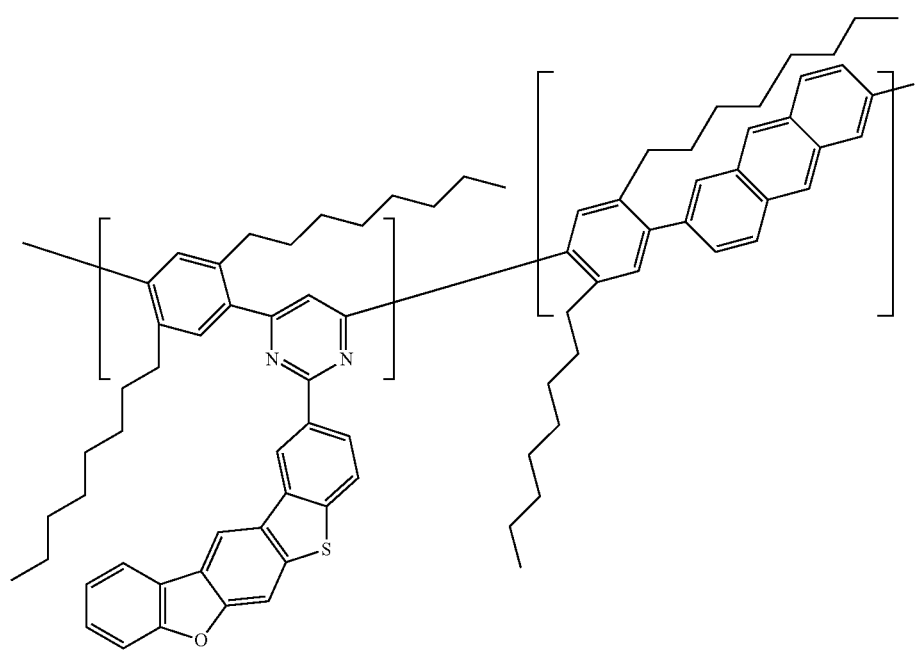

183
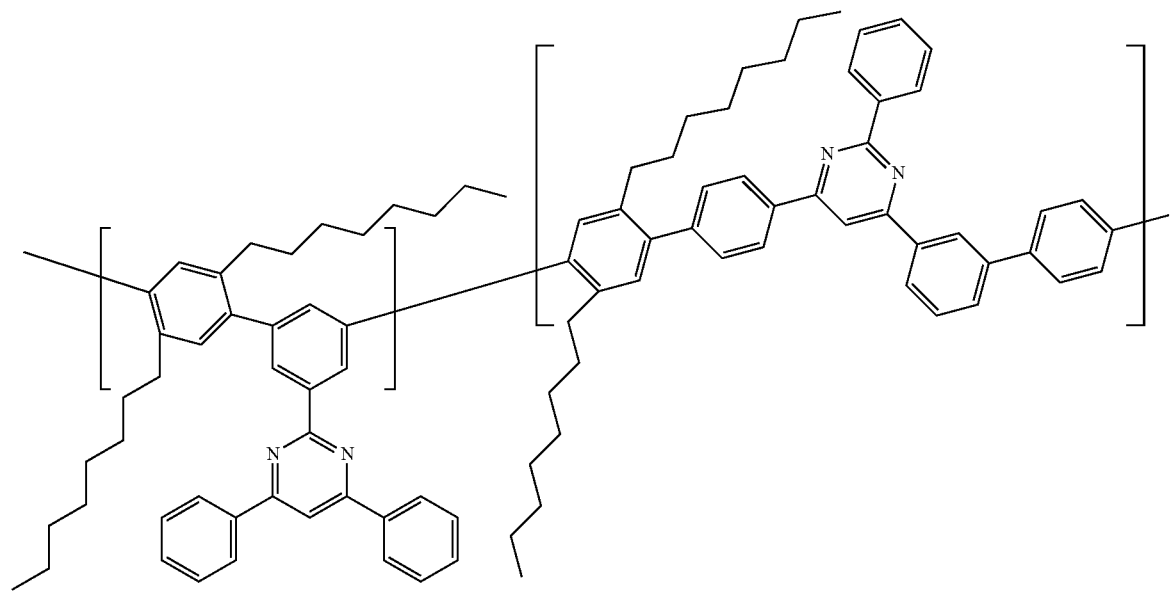
184
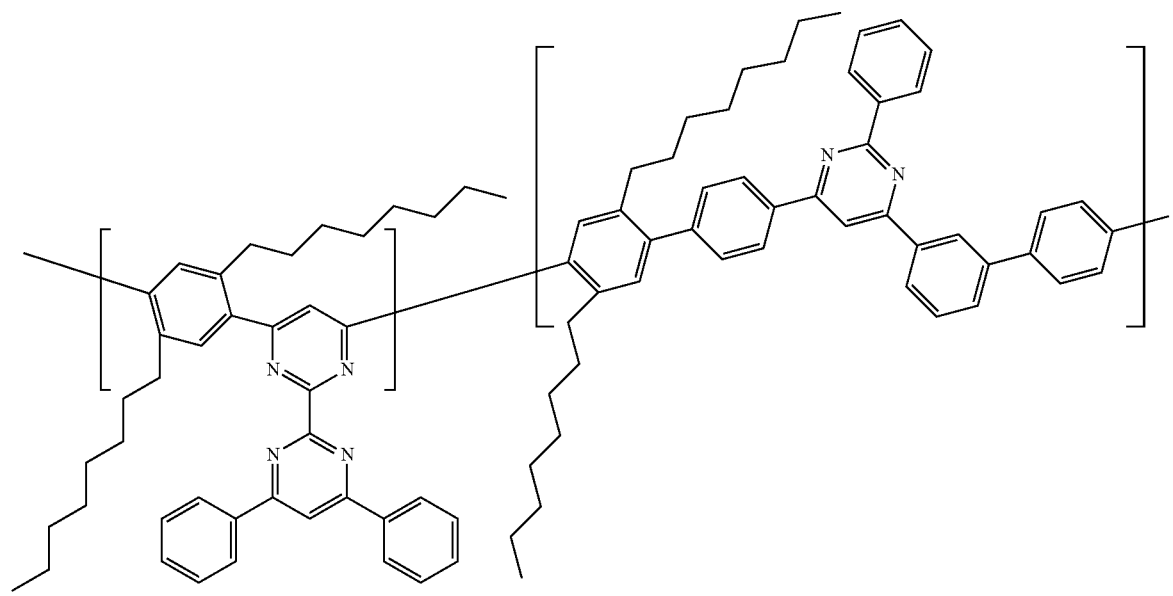

185
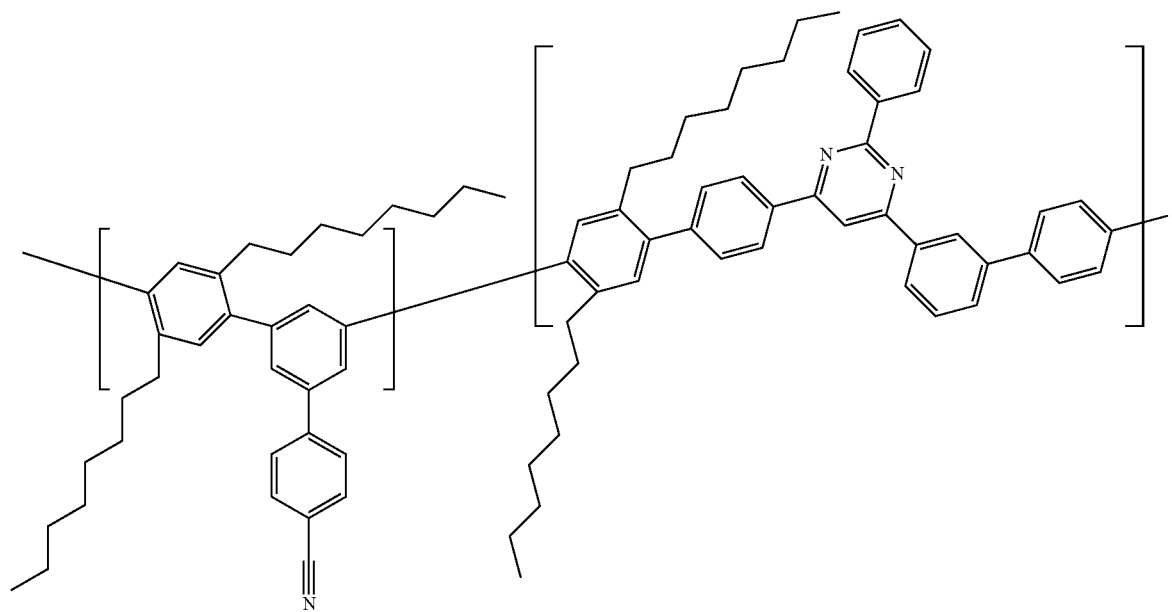
186
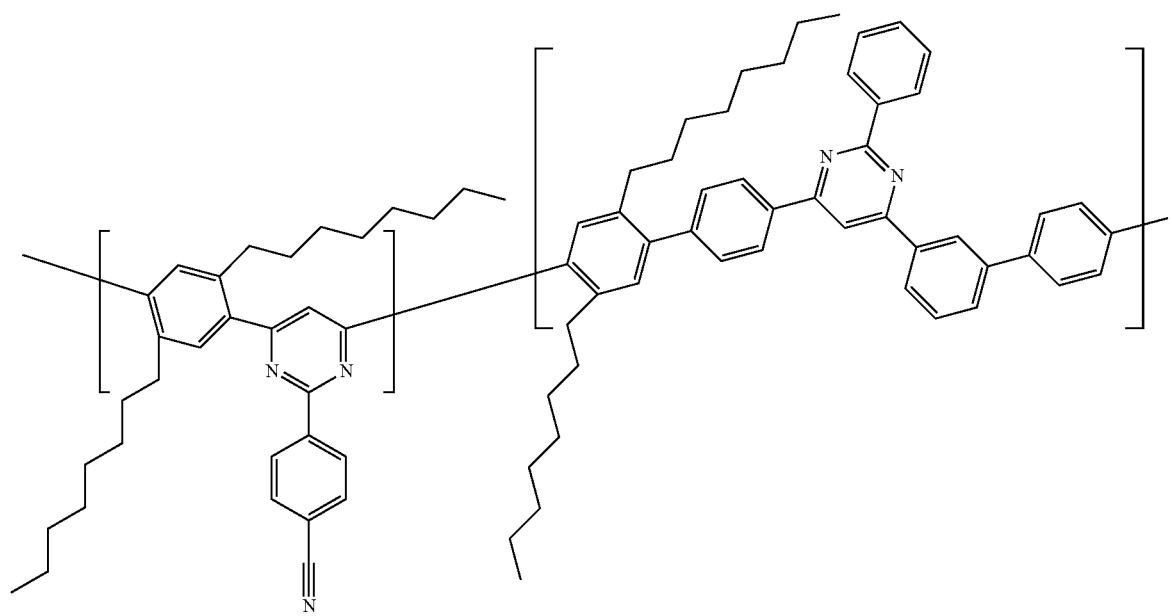

187
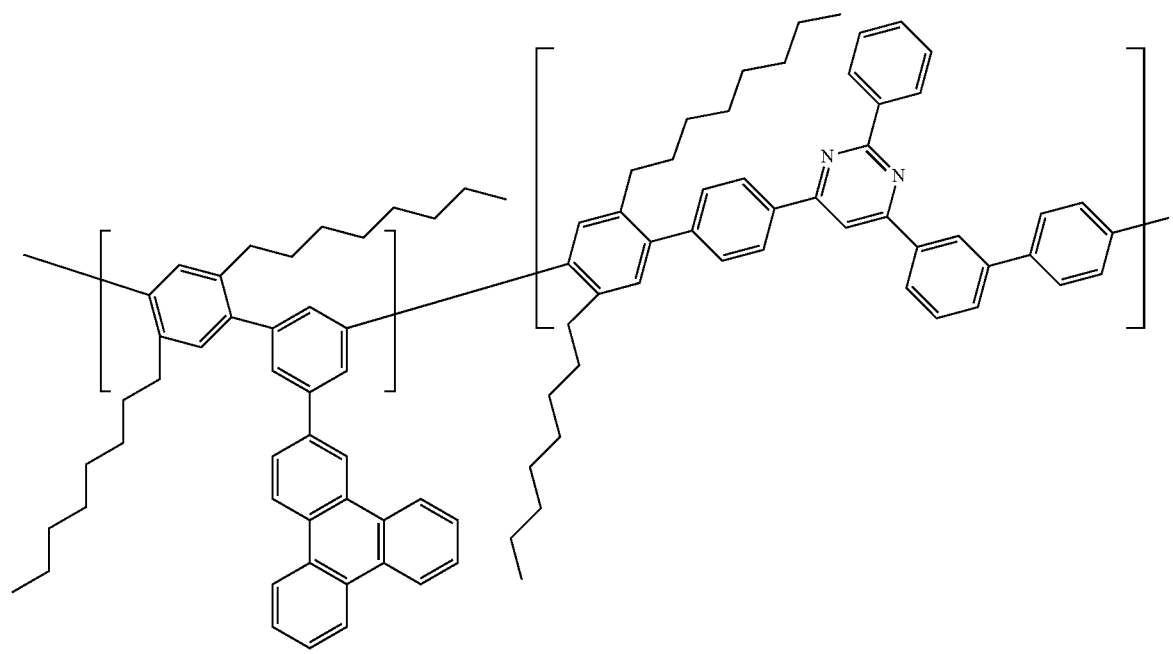
188
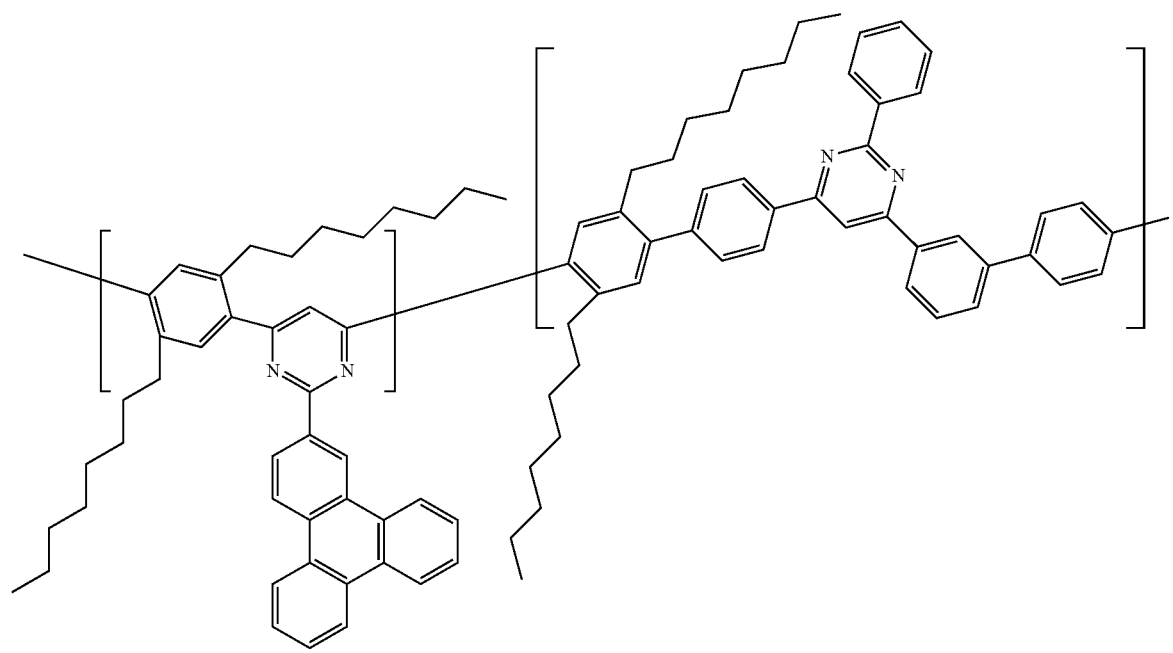

189
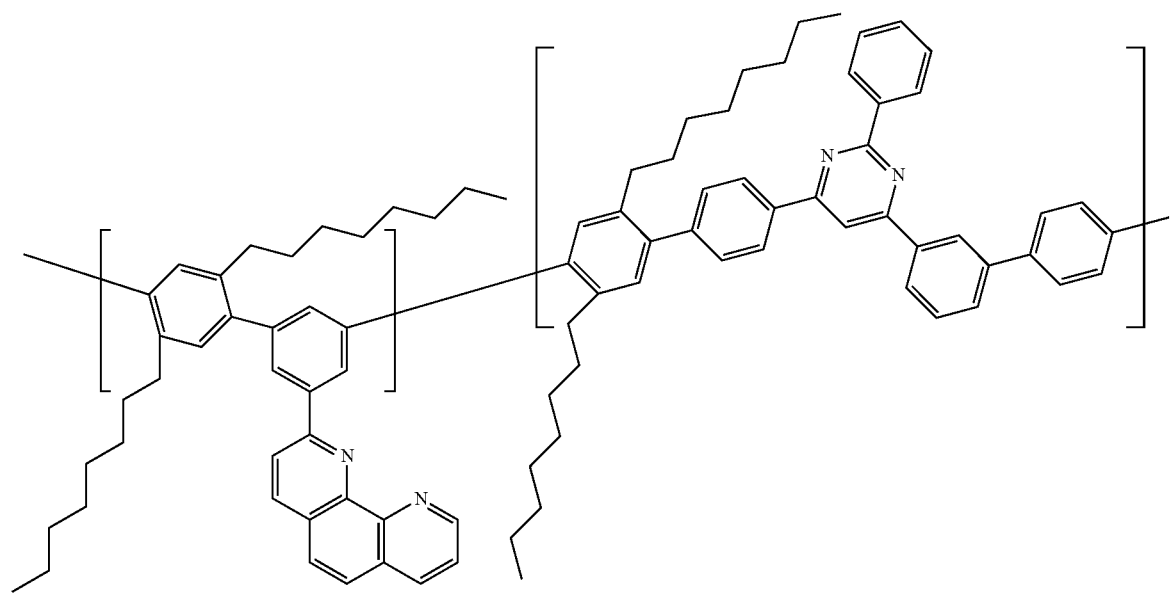
190
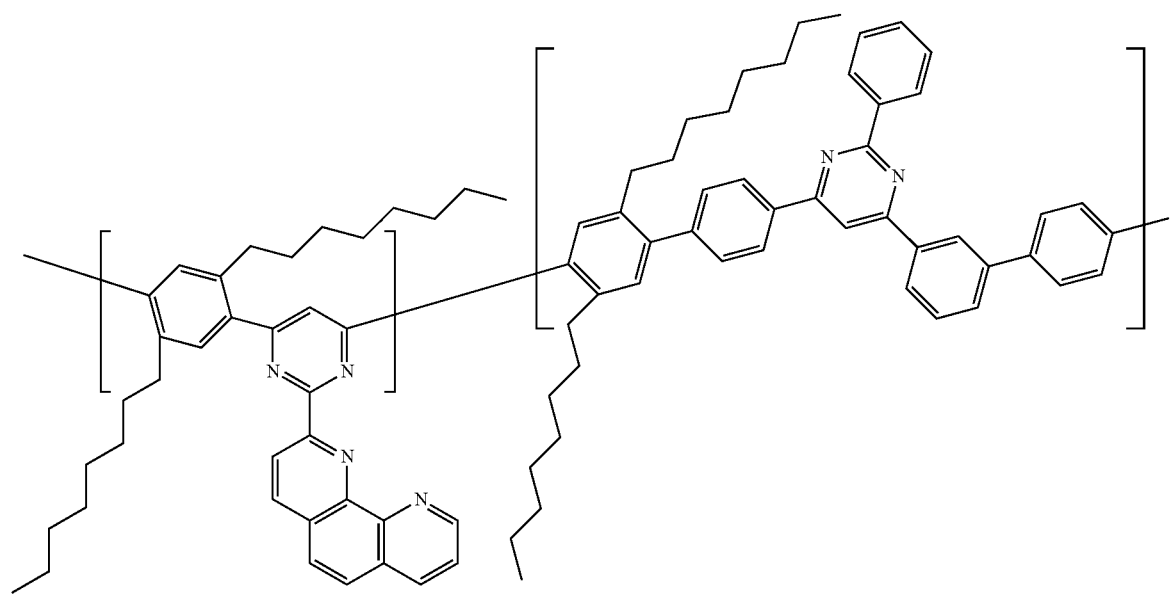

191
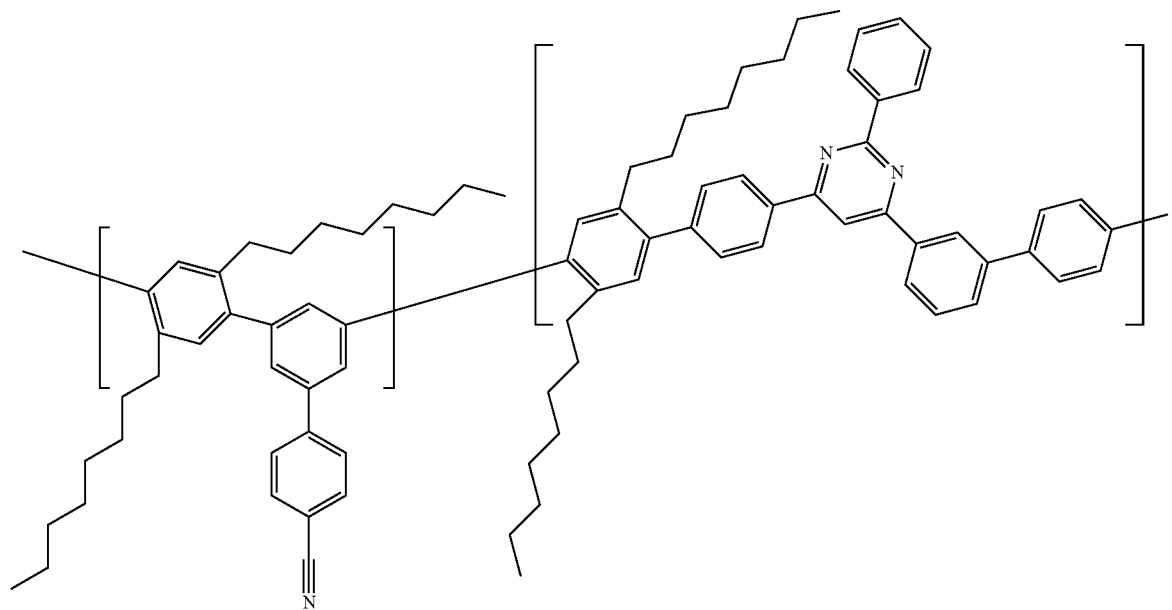
192
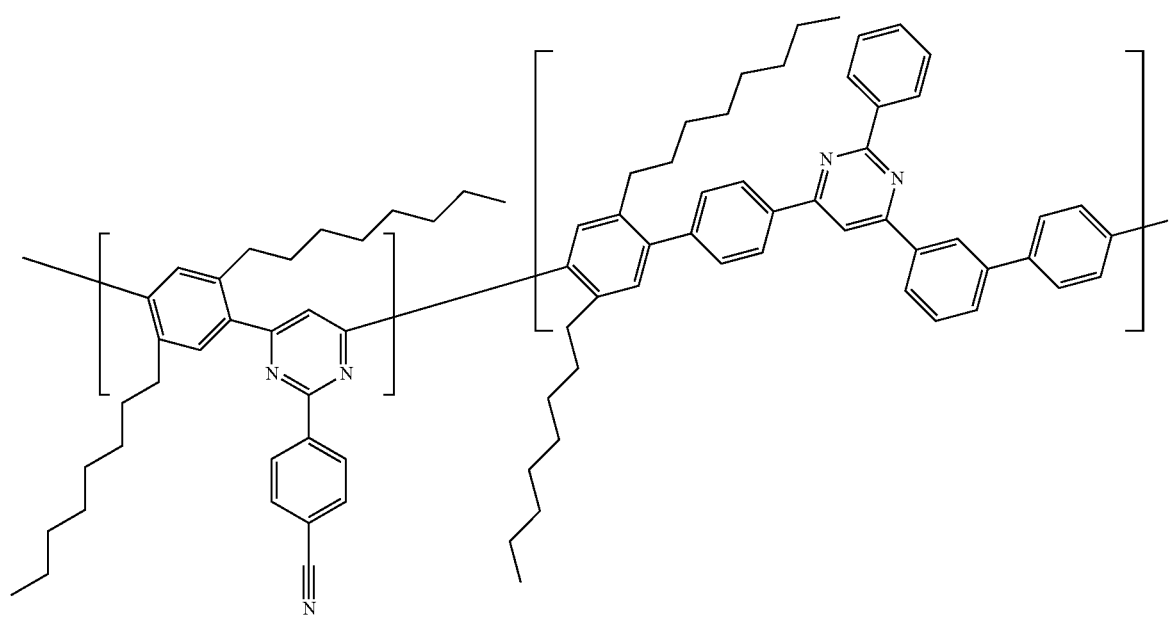

193 194
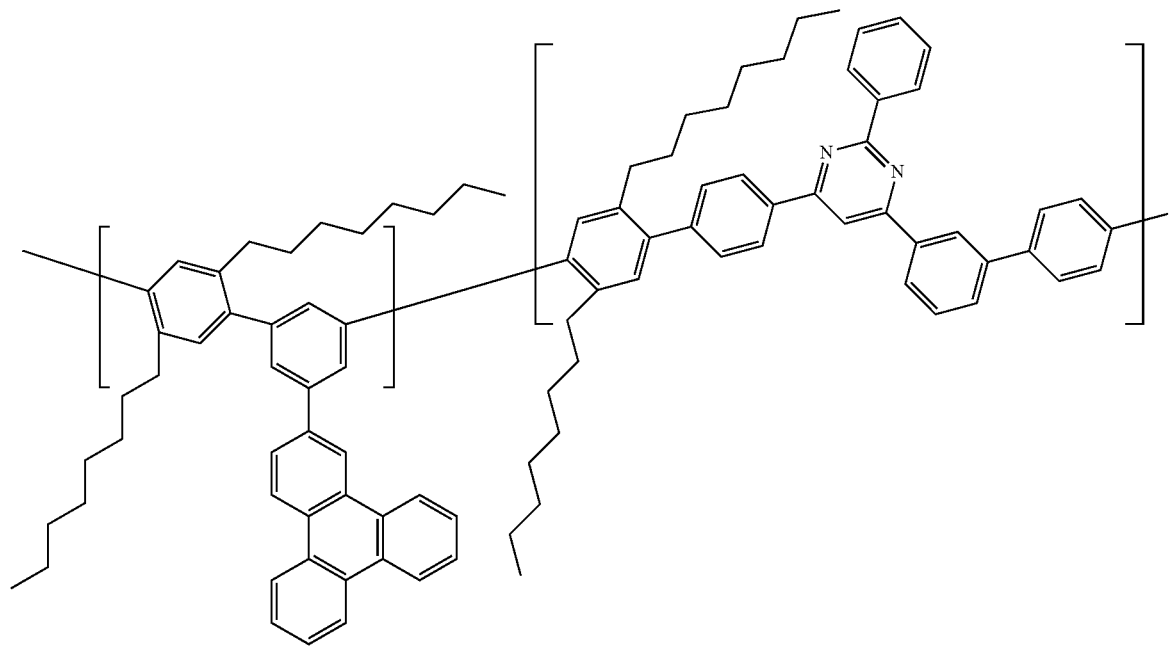
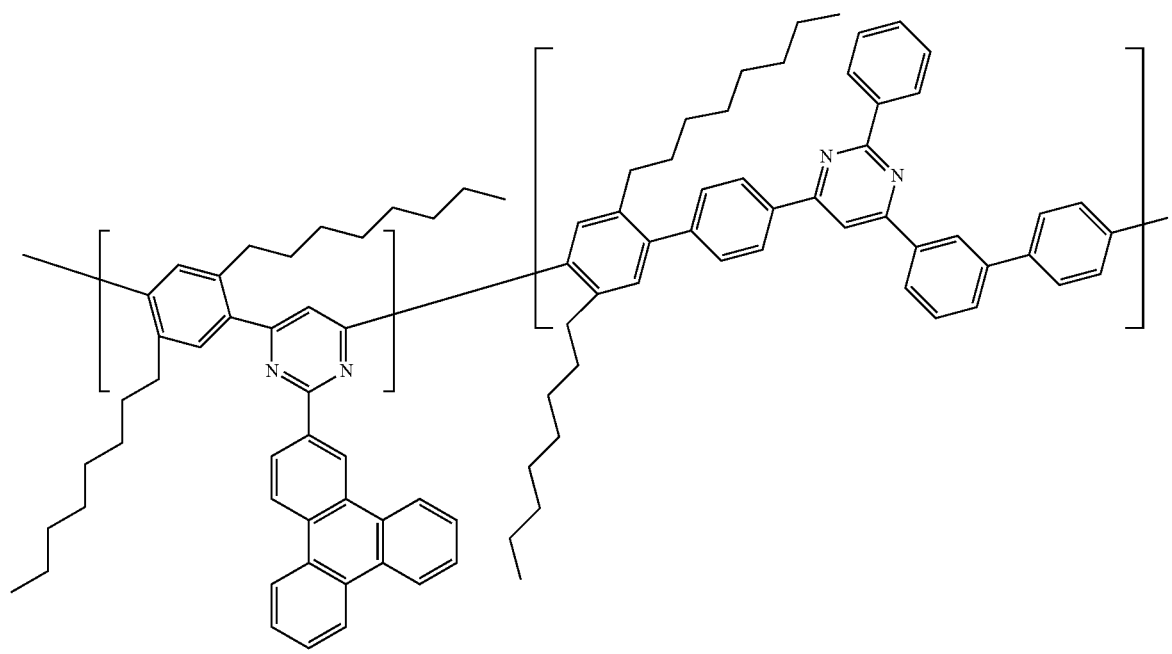

-continued
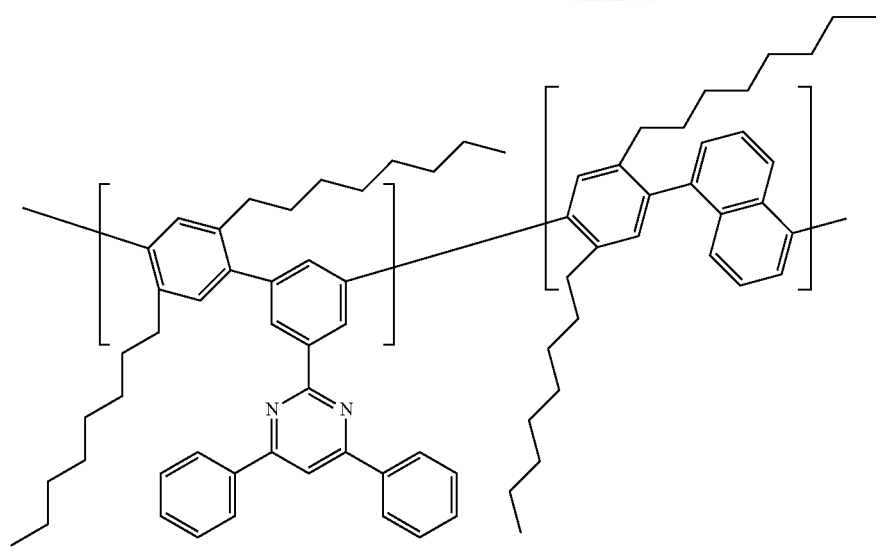
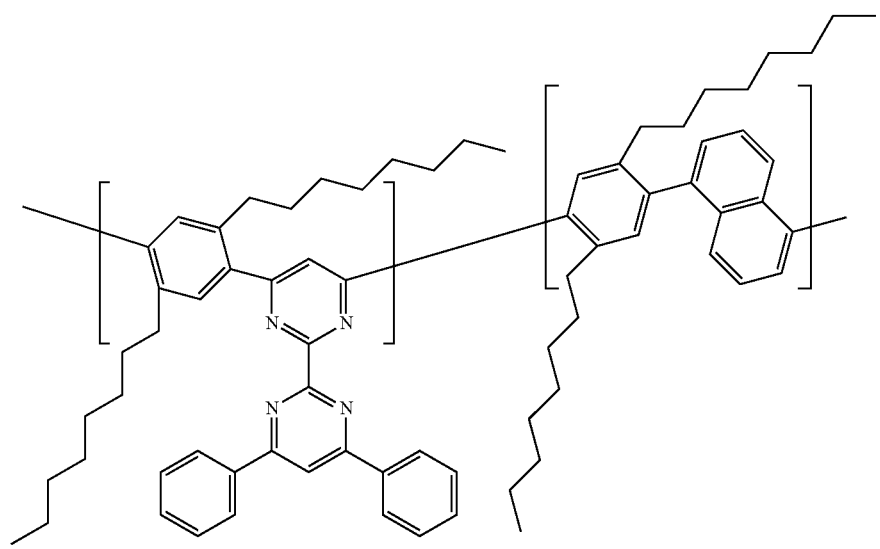
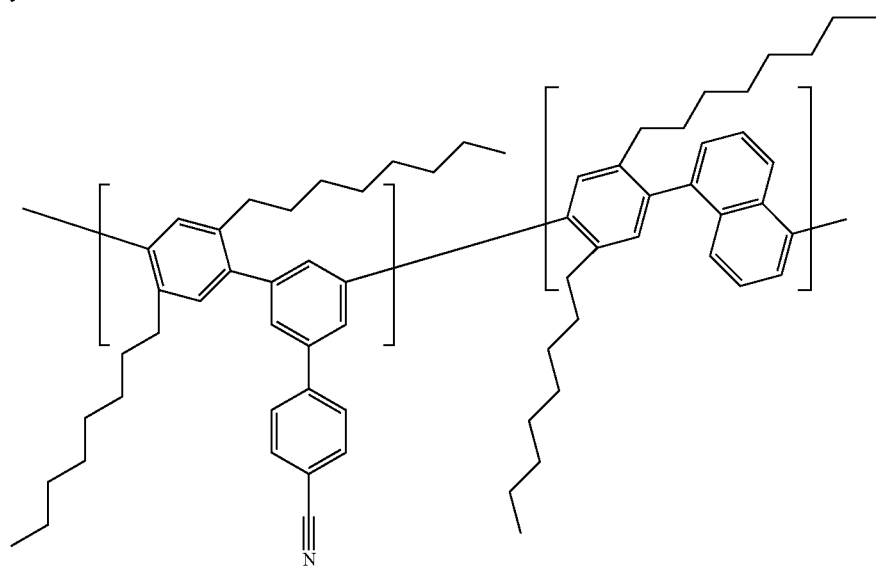

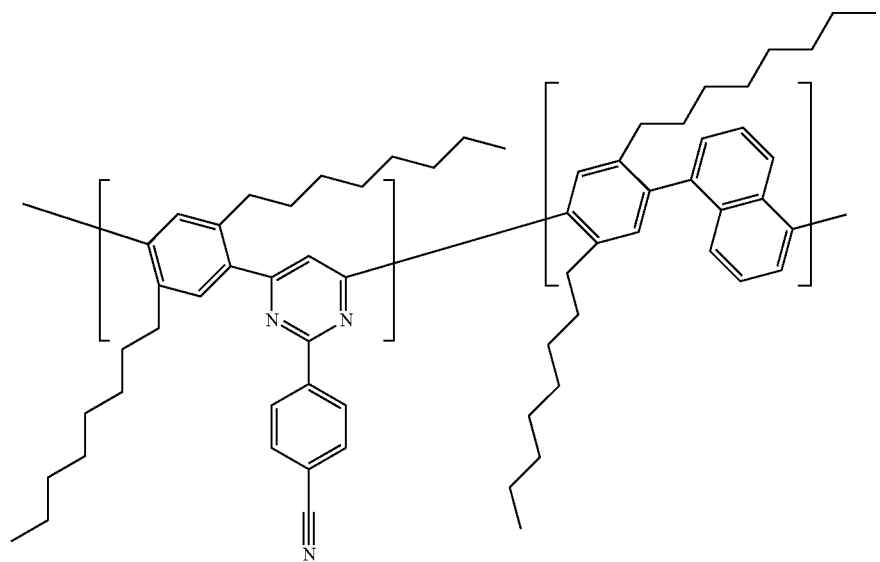
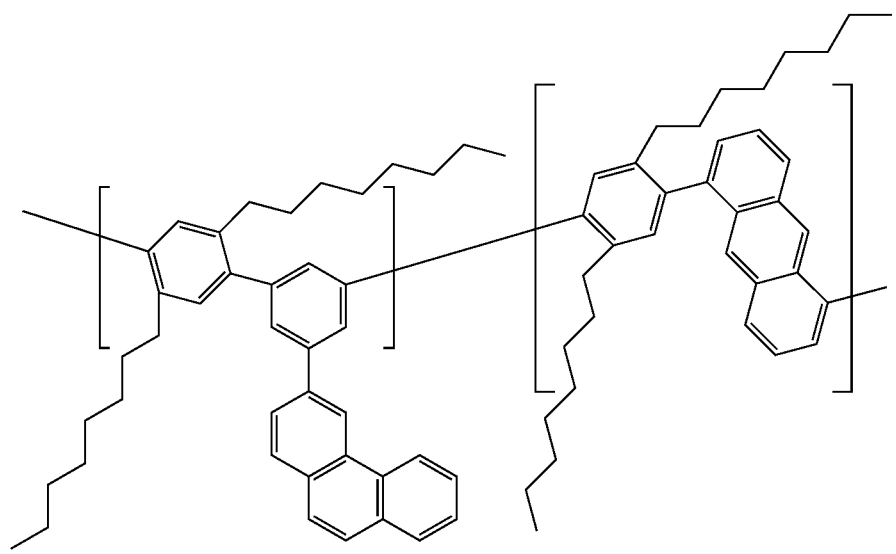
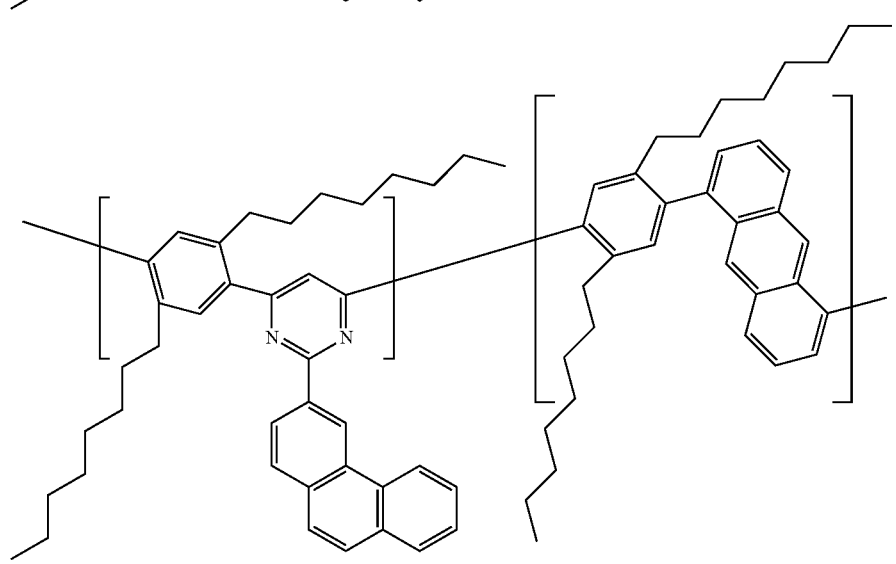

-continued
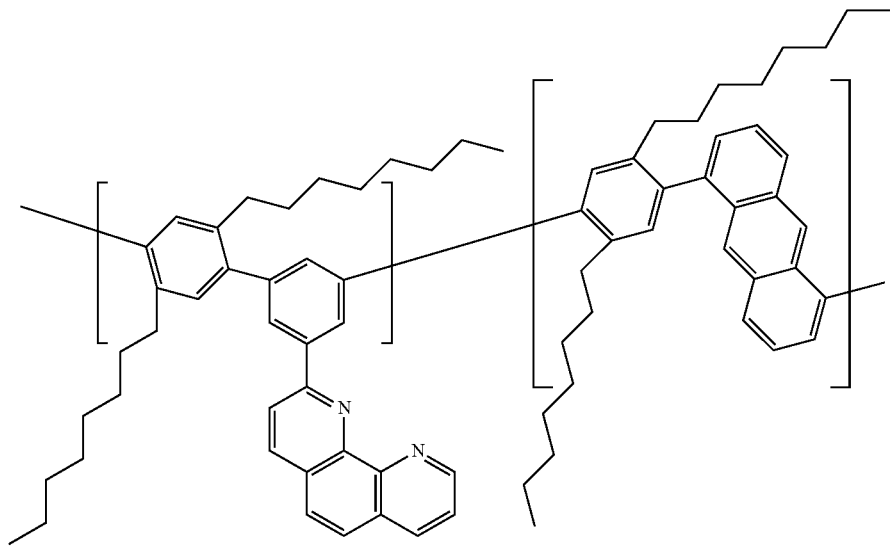
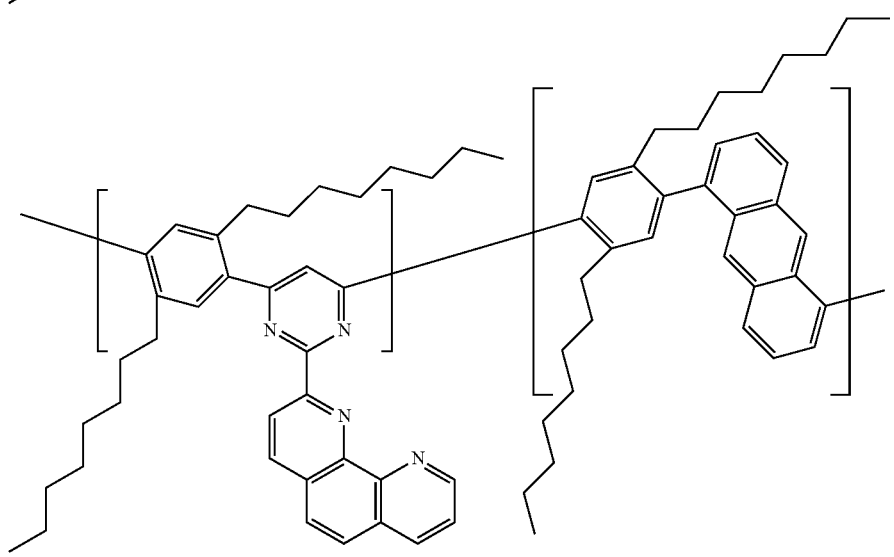
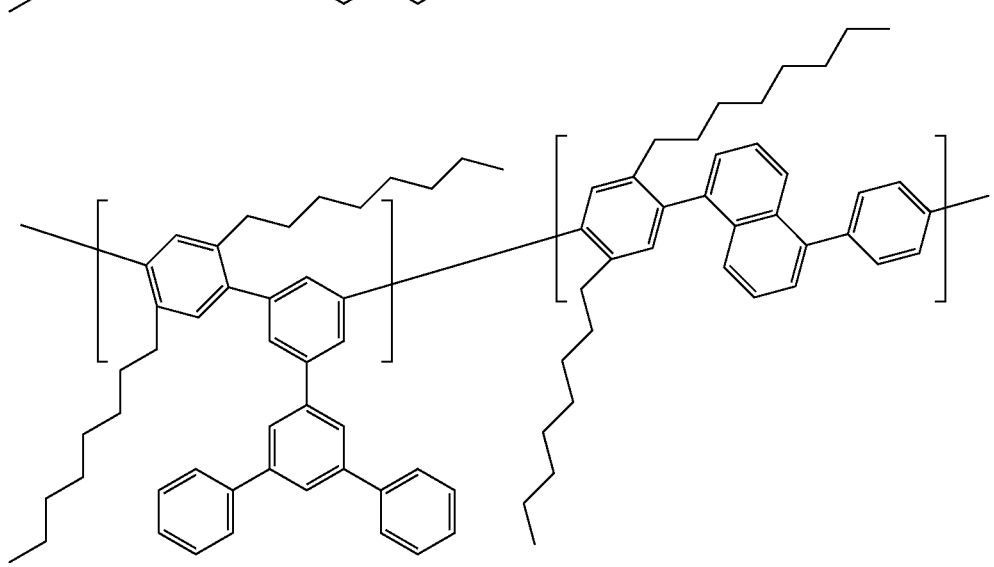

201
202
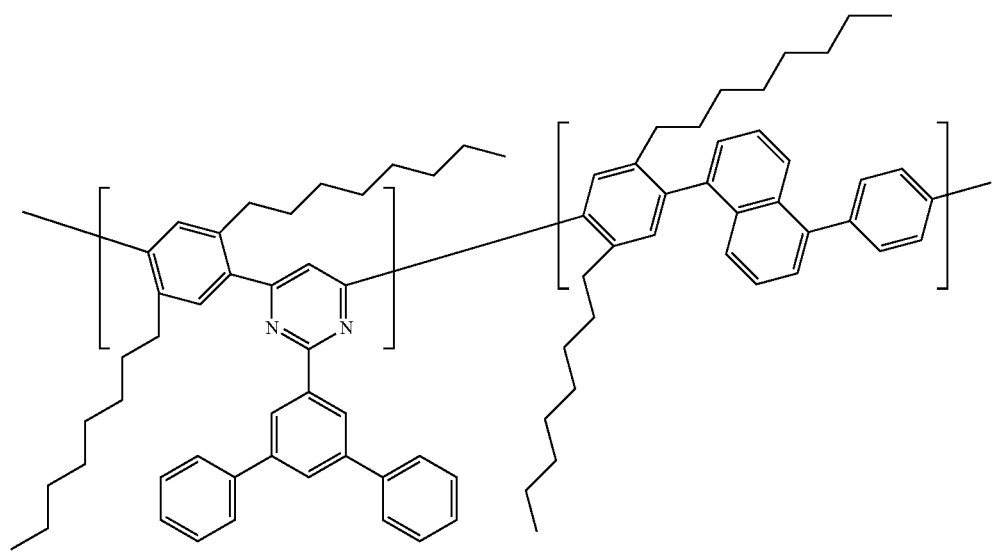
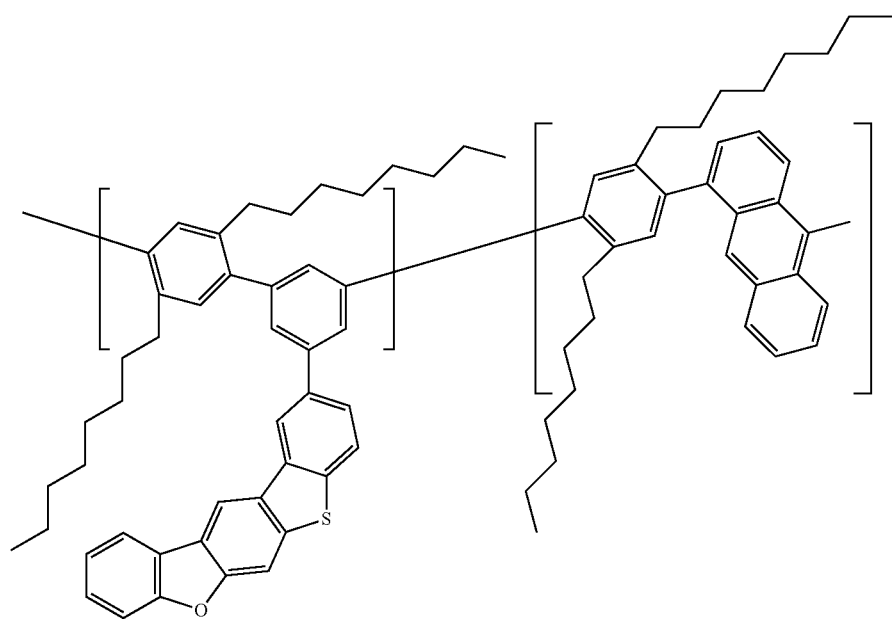

-continued
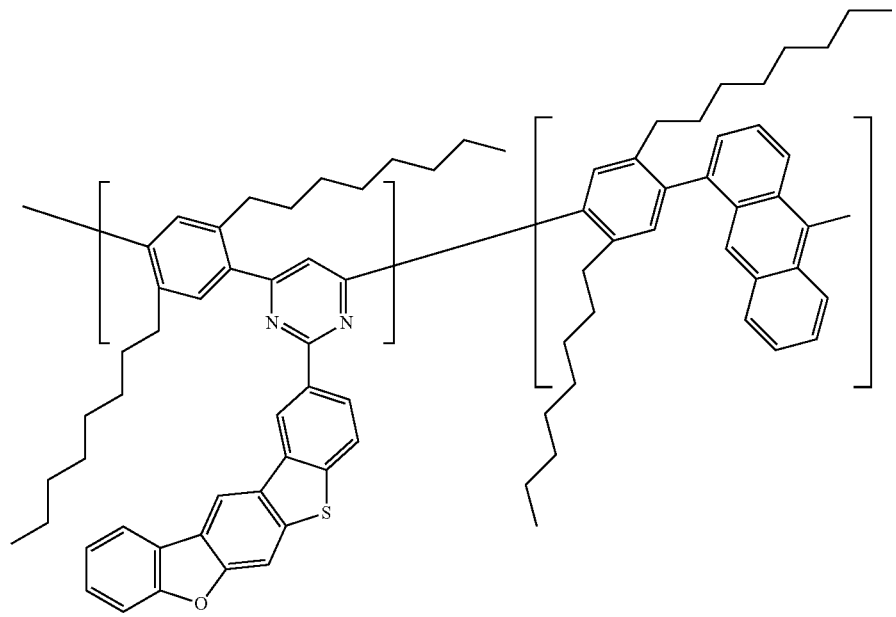
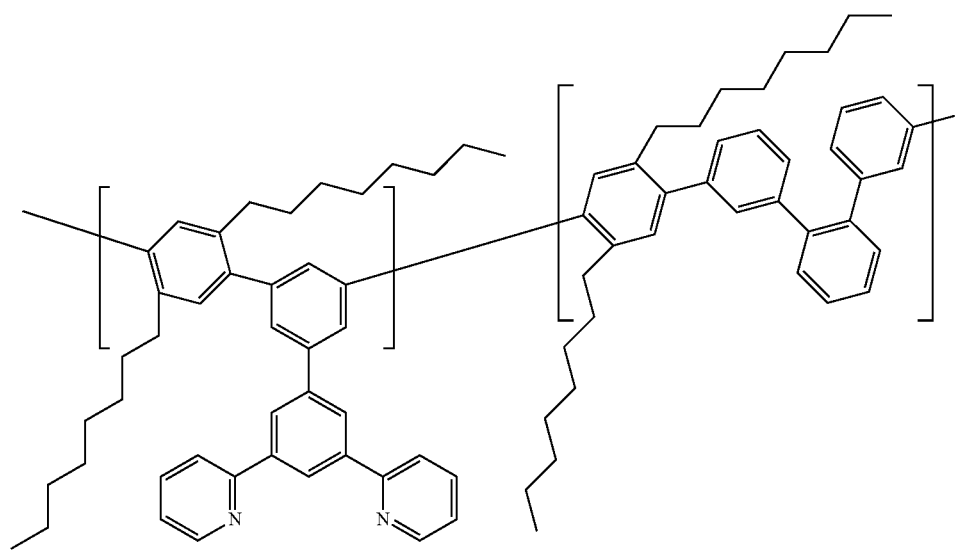
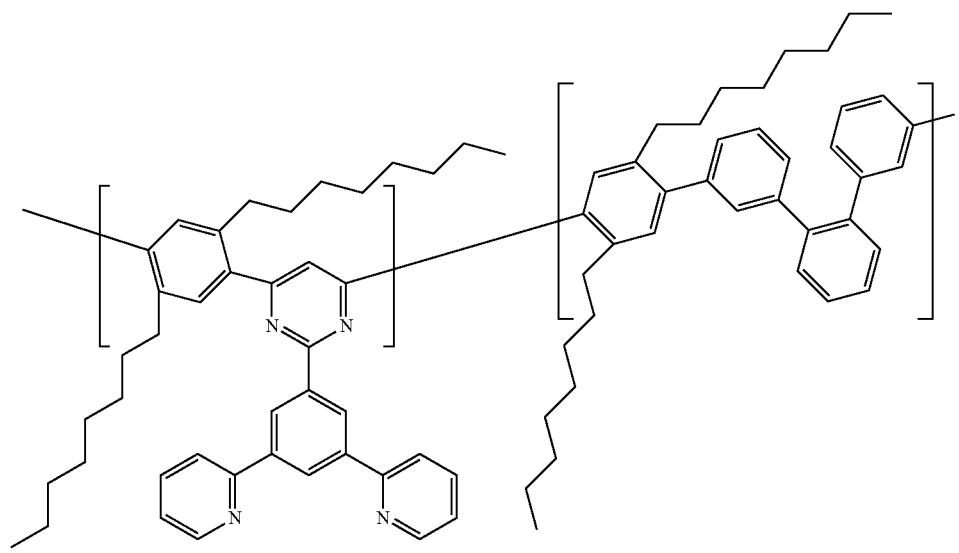

205
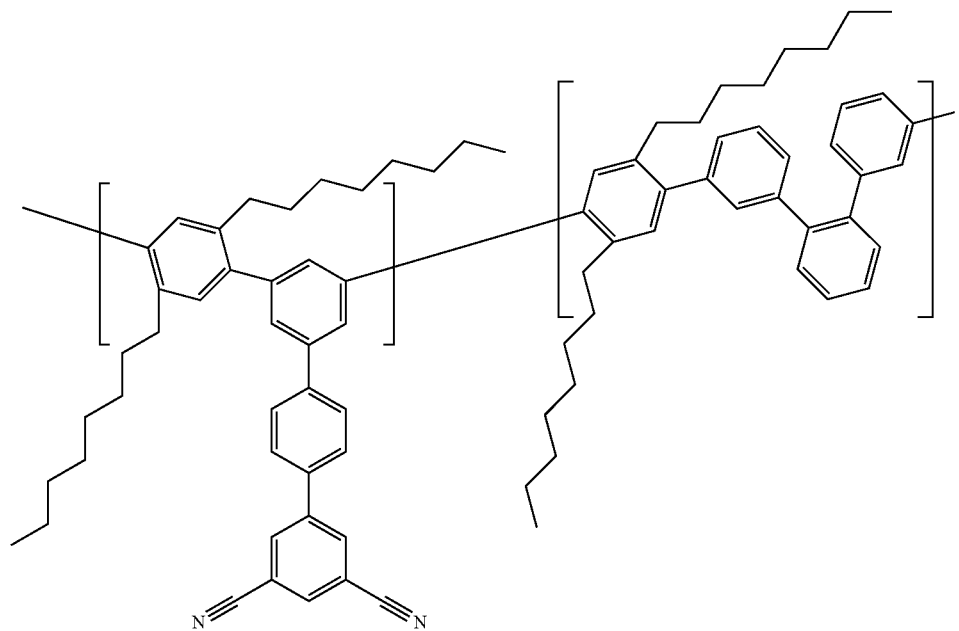
206
-continued
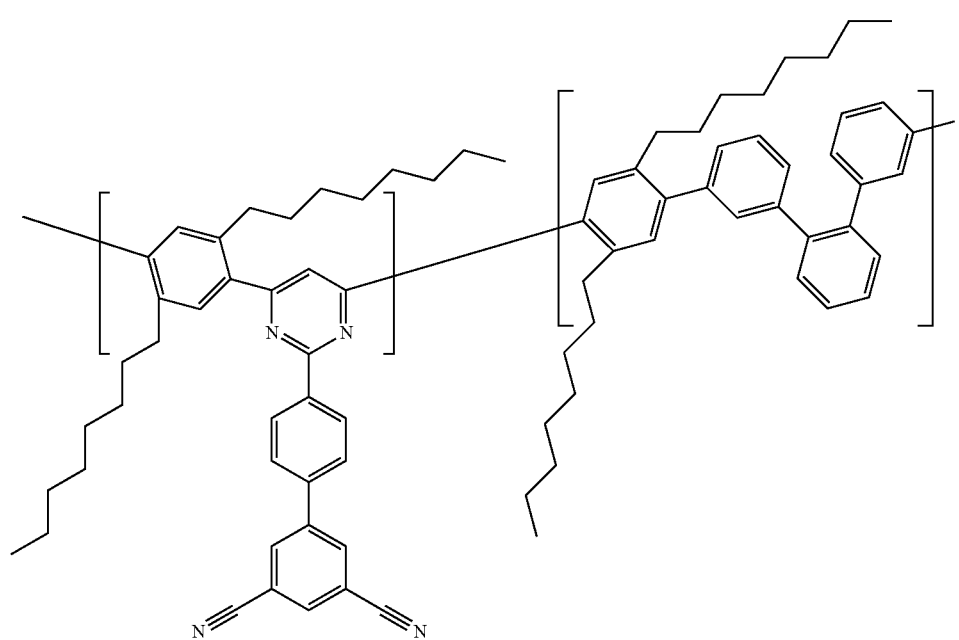

-continued
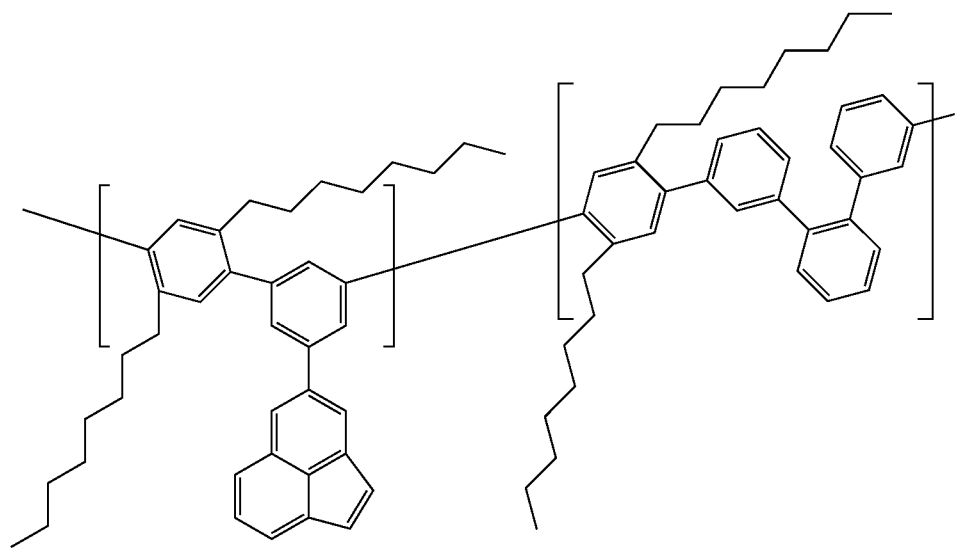
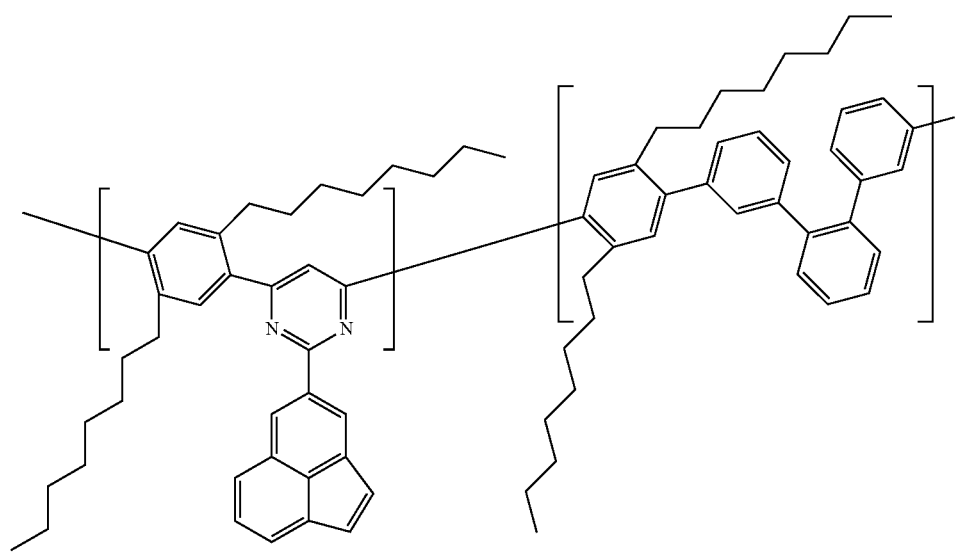
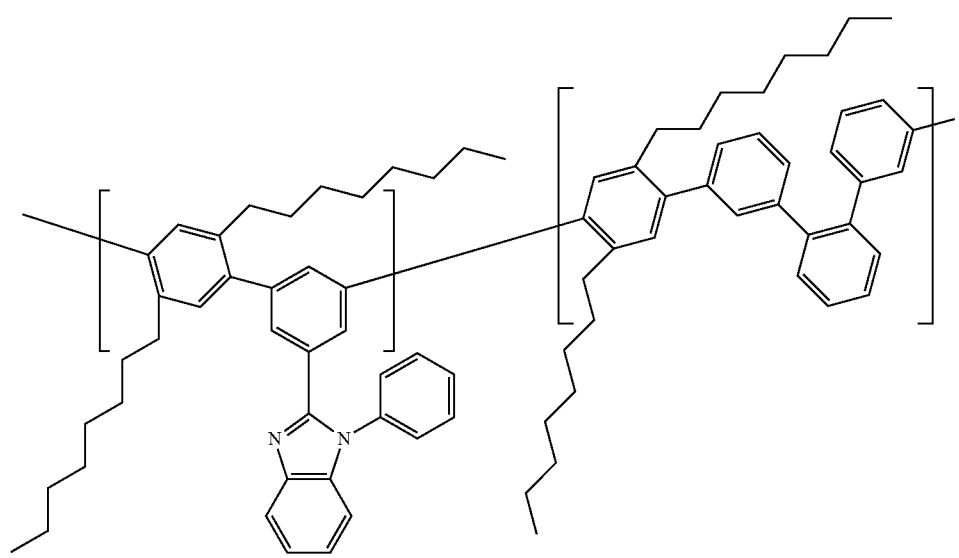

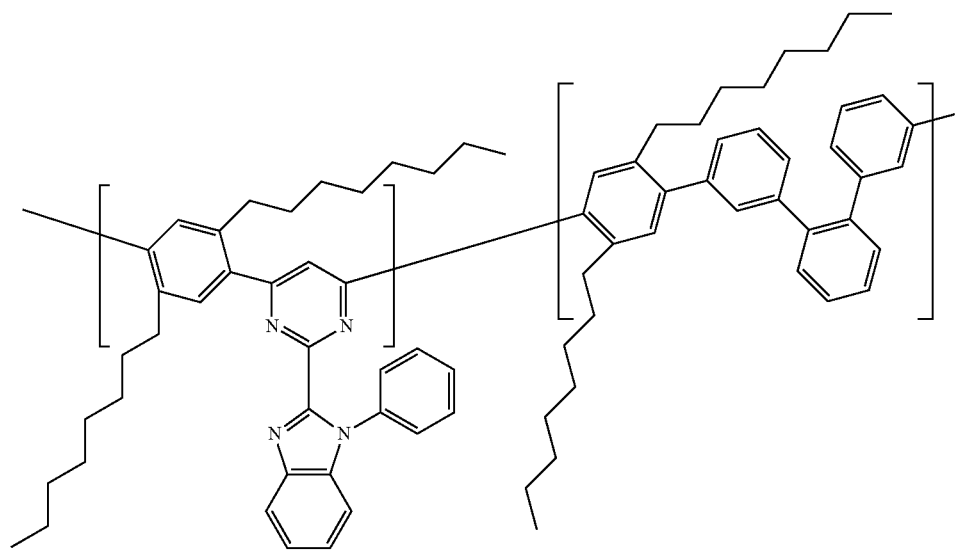
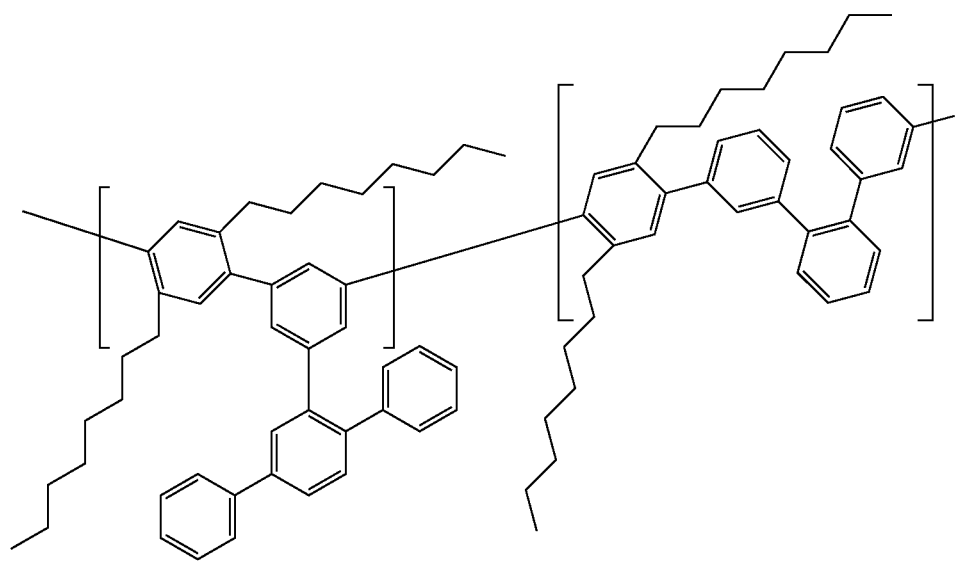
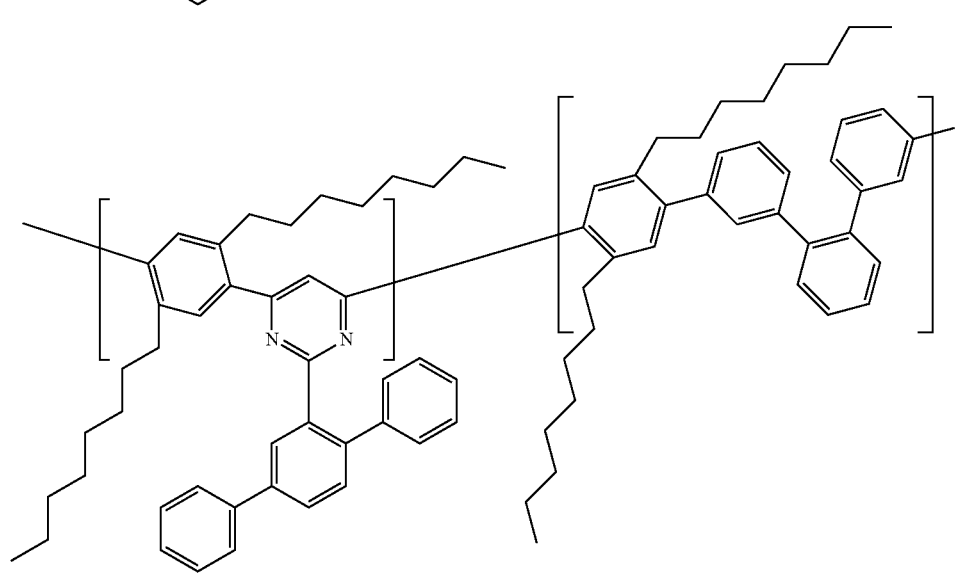

211
212
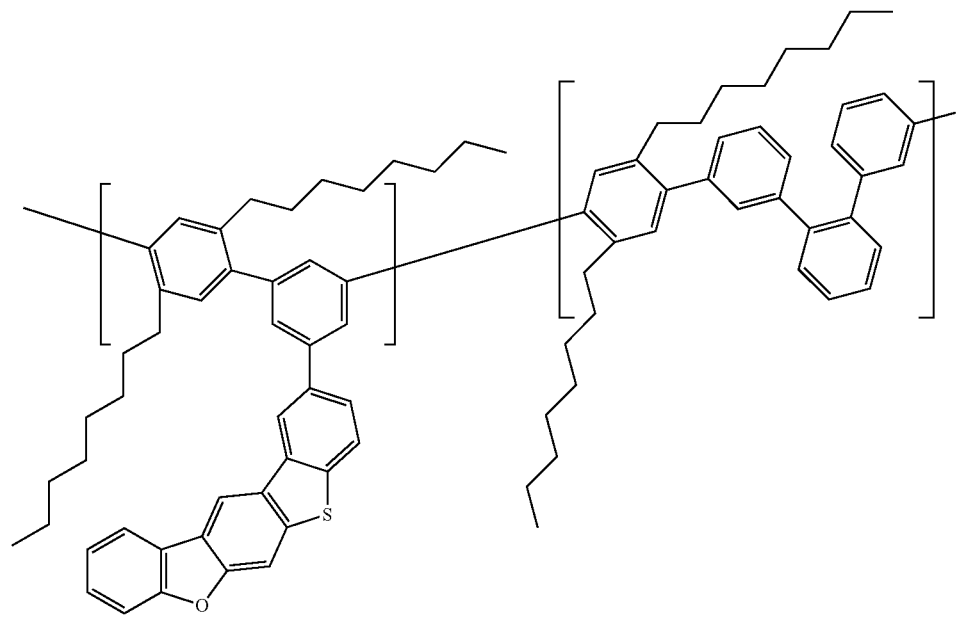
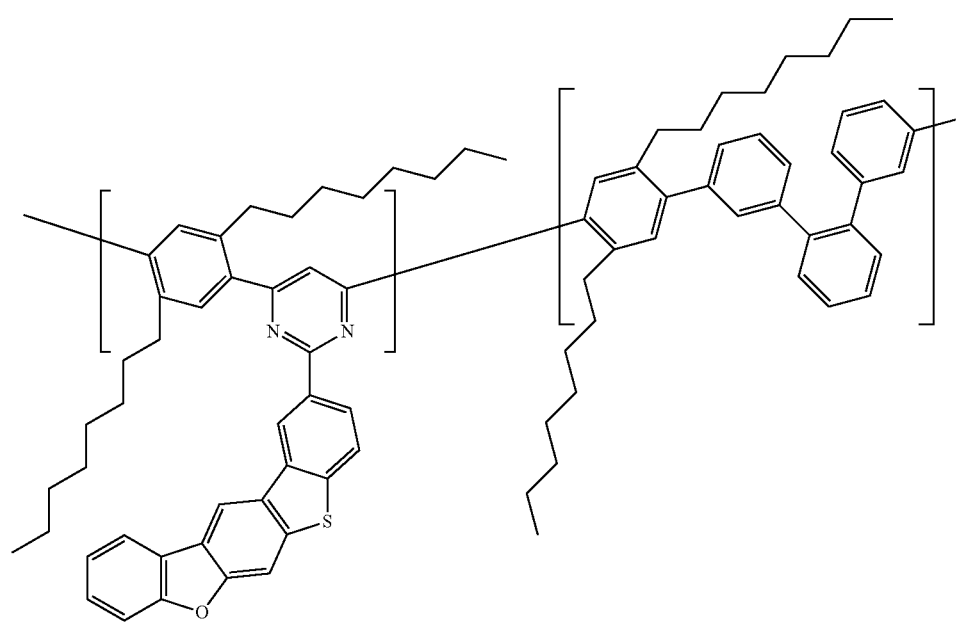

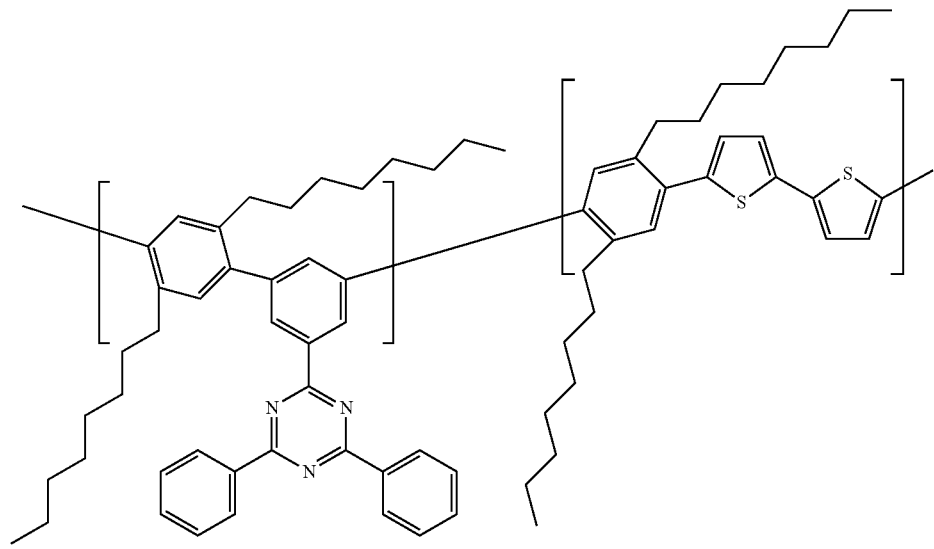
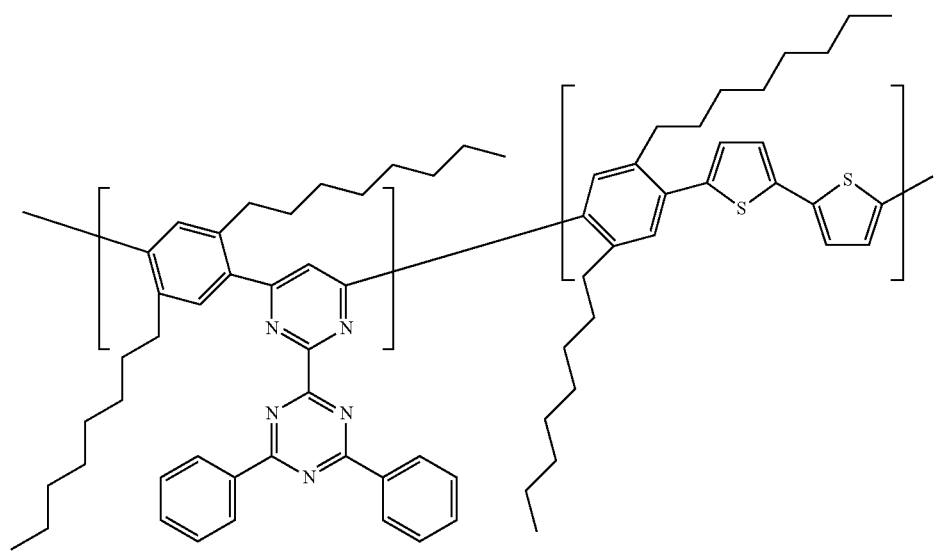
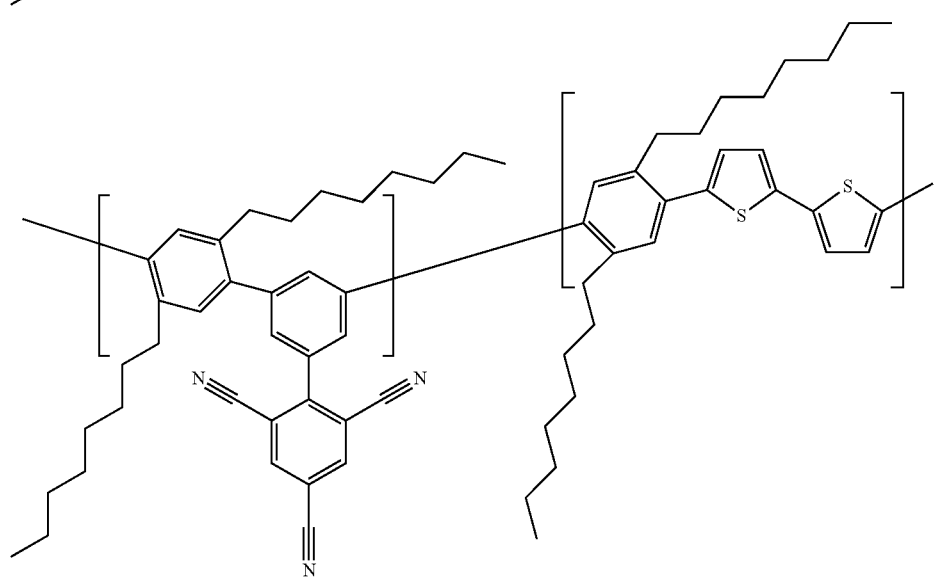

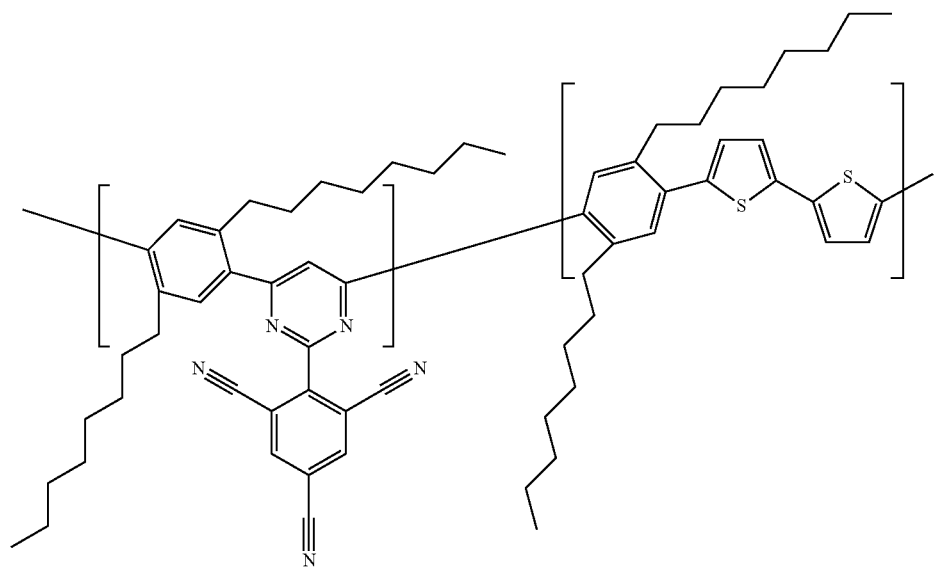
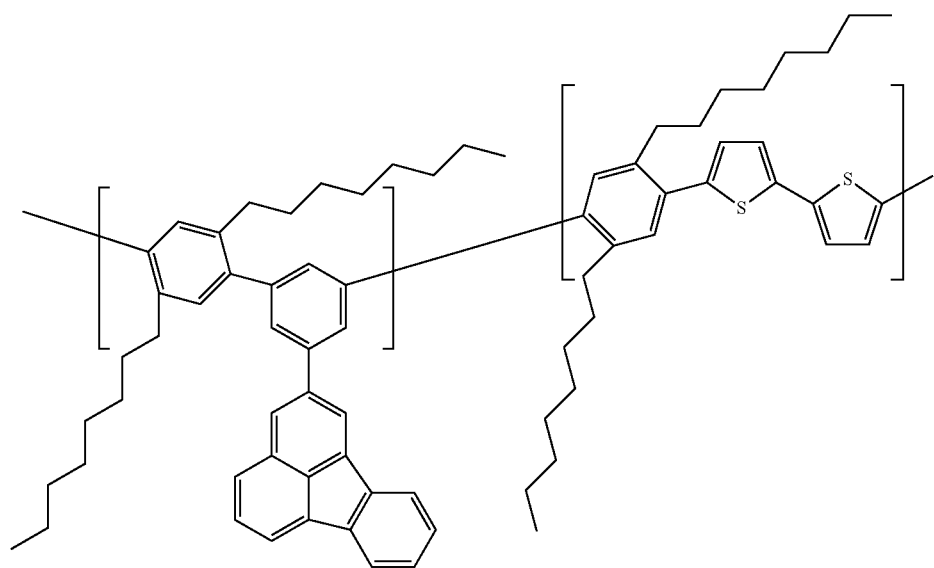
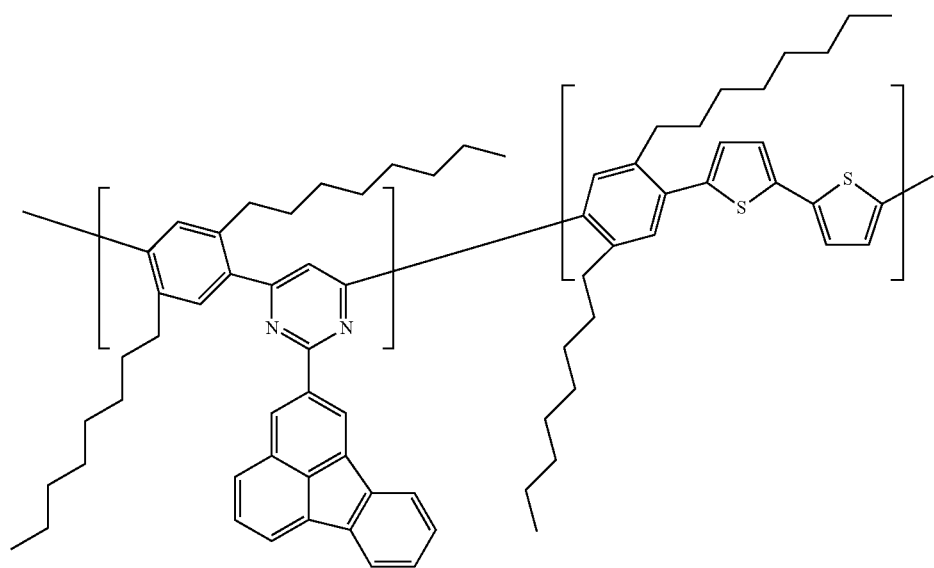

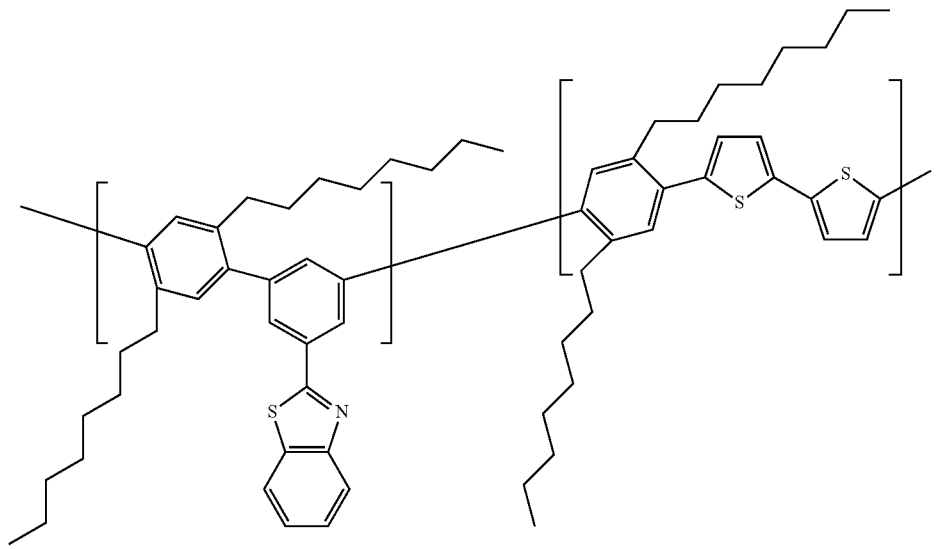
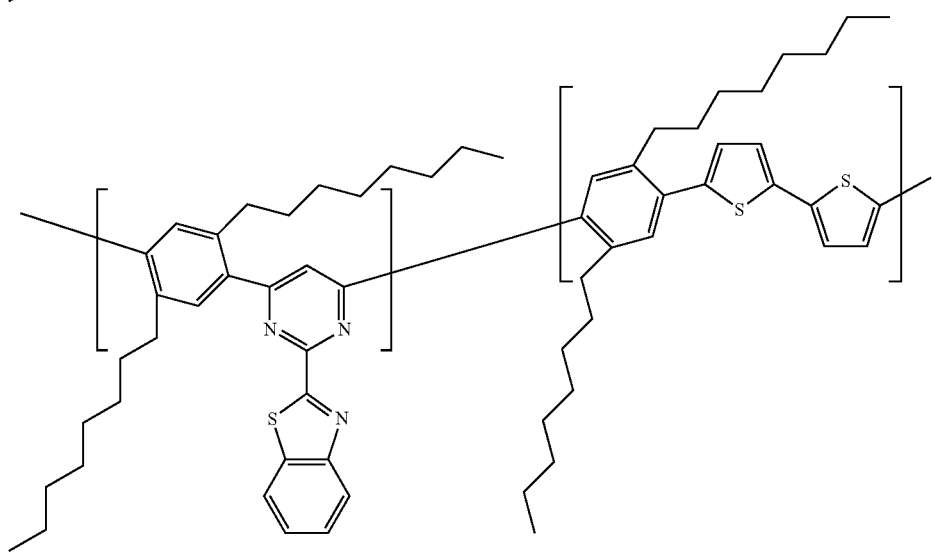
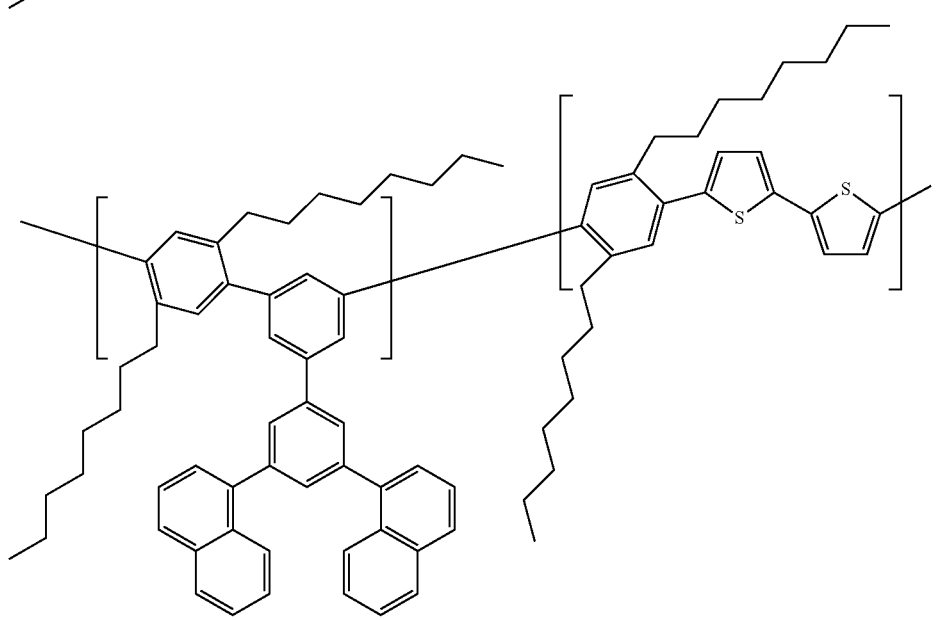

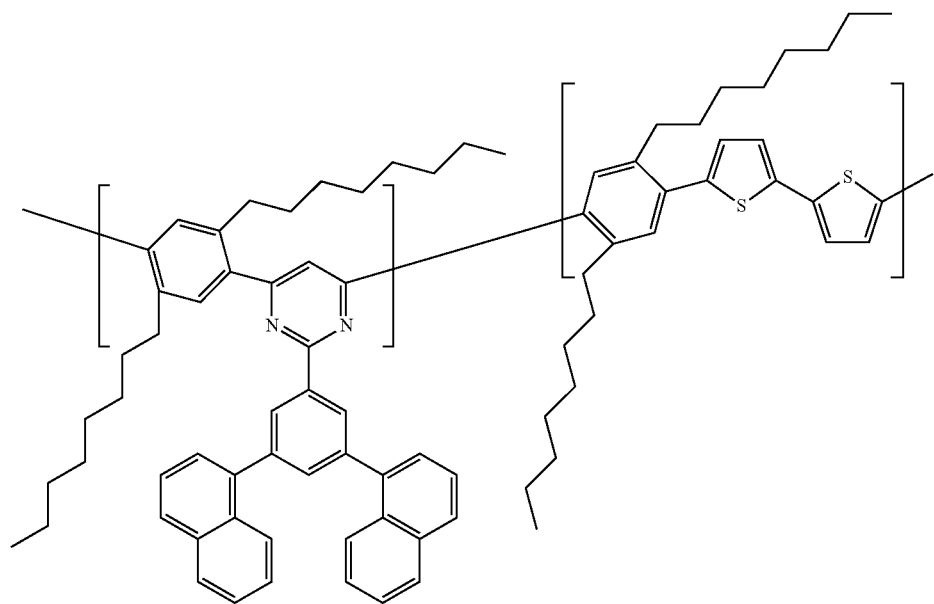
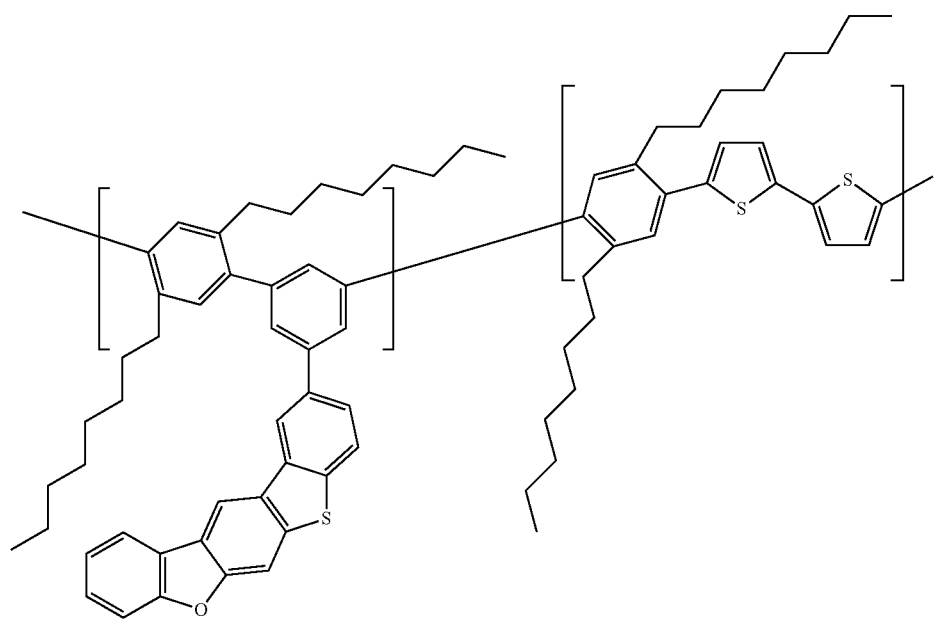

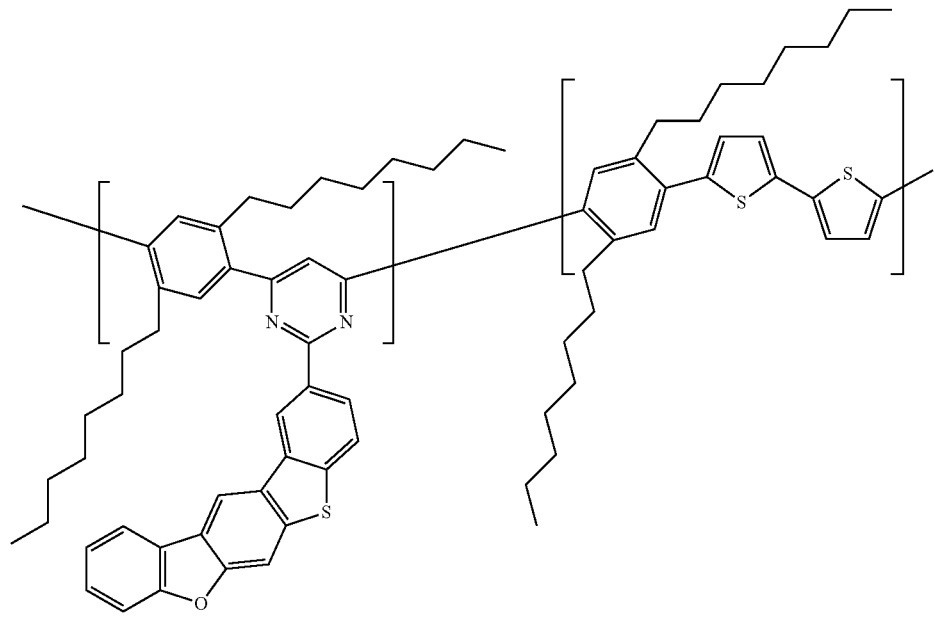
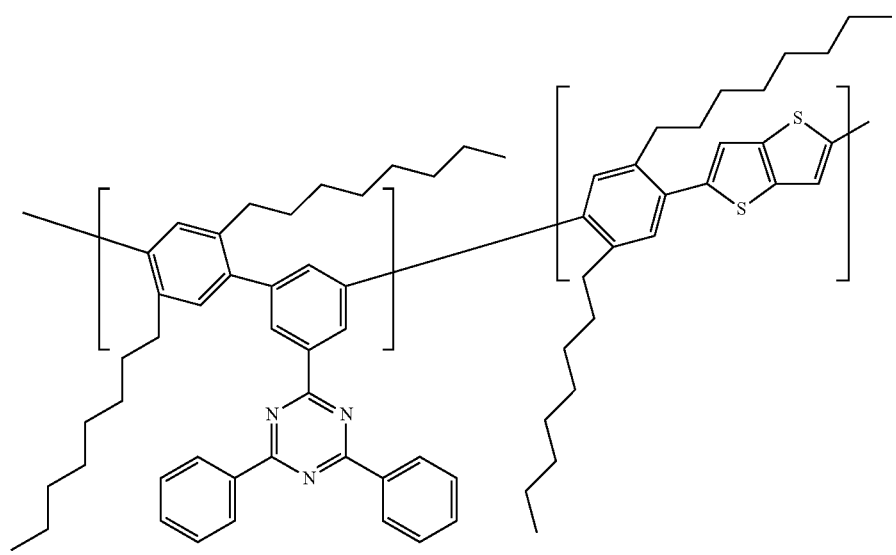
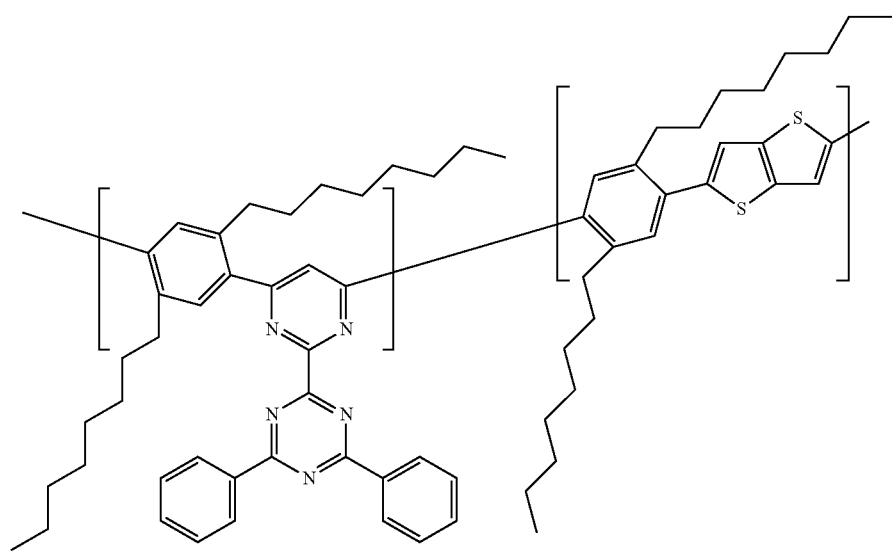

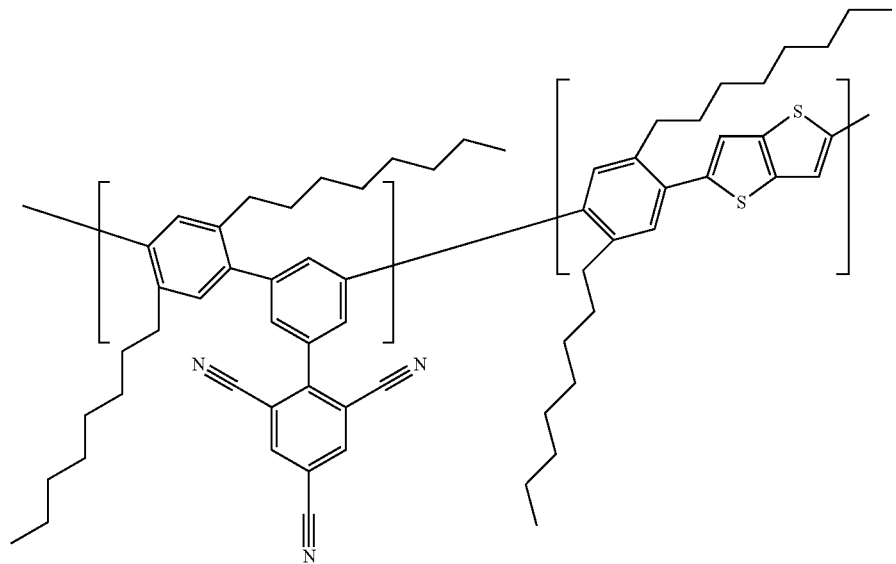
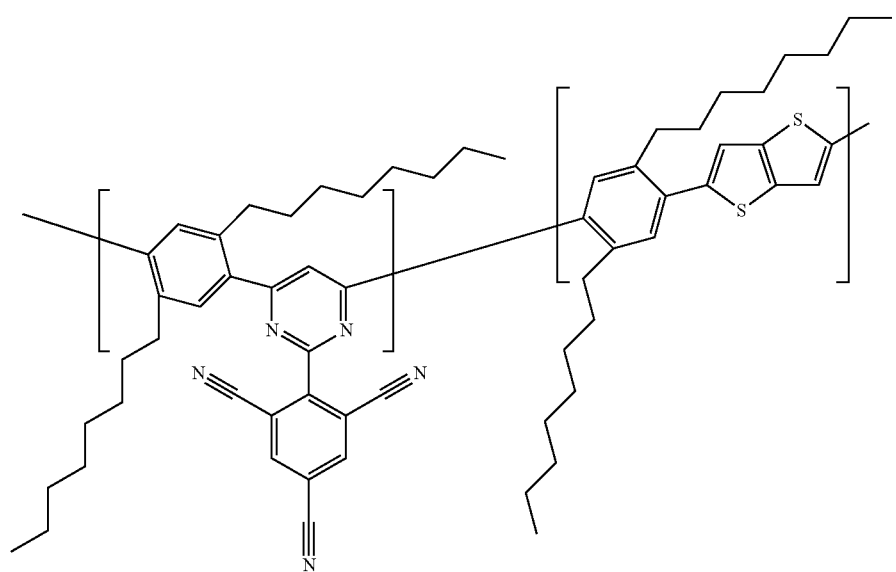
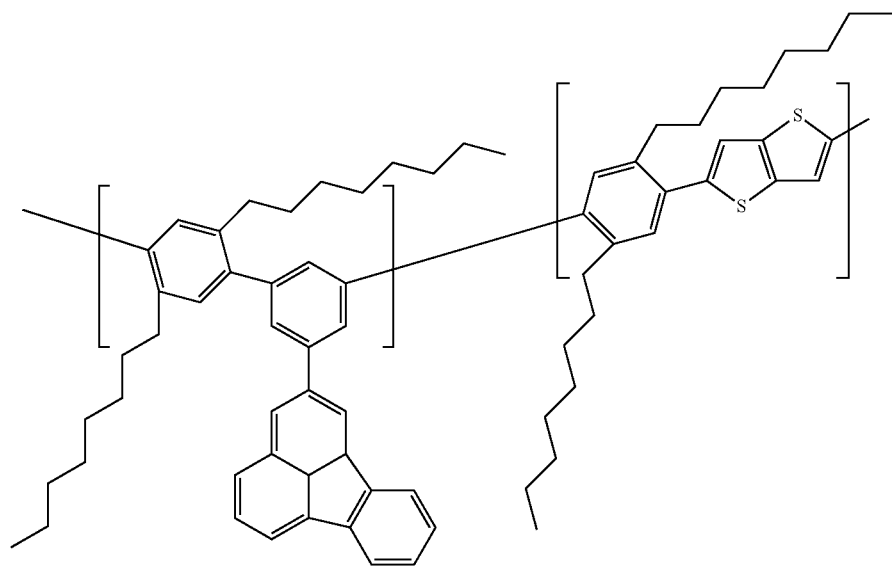

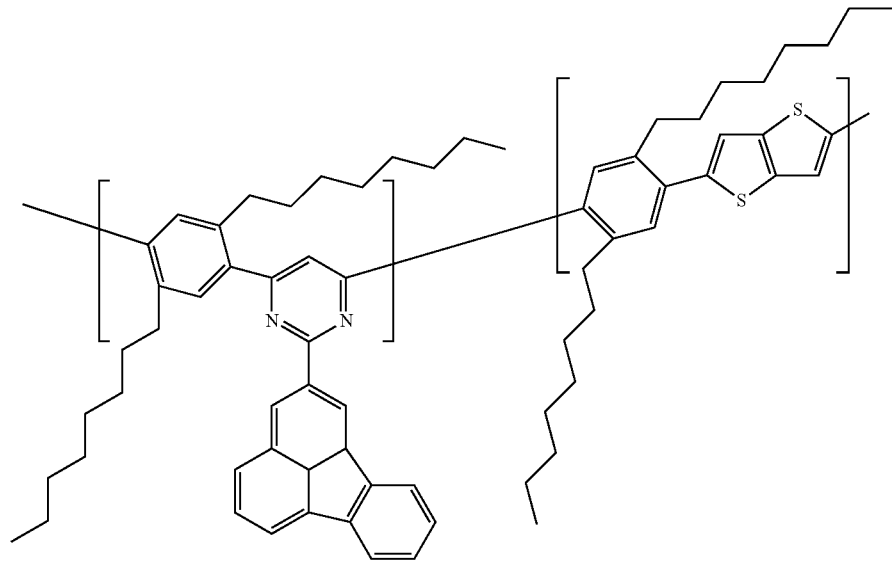
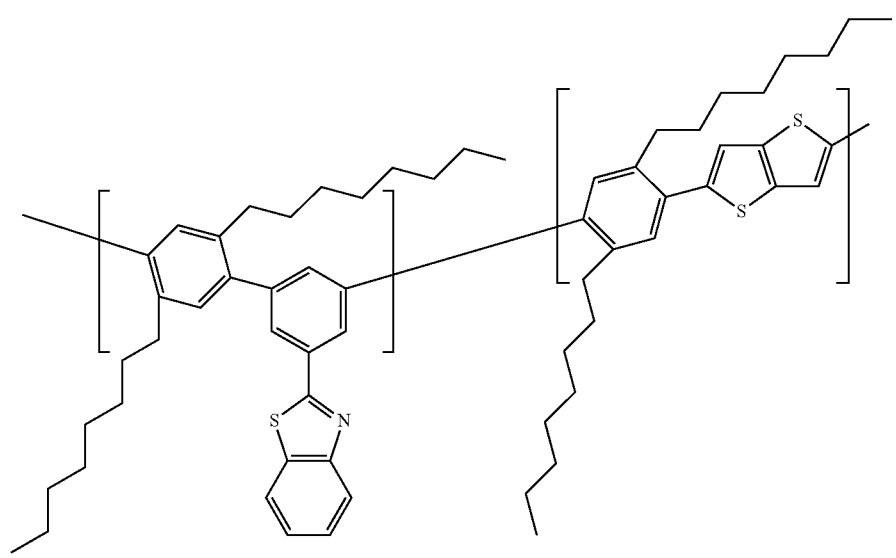
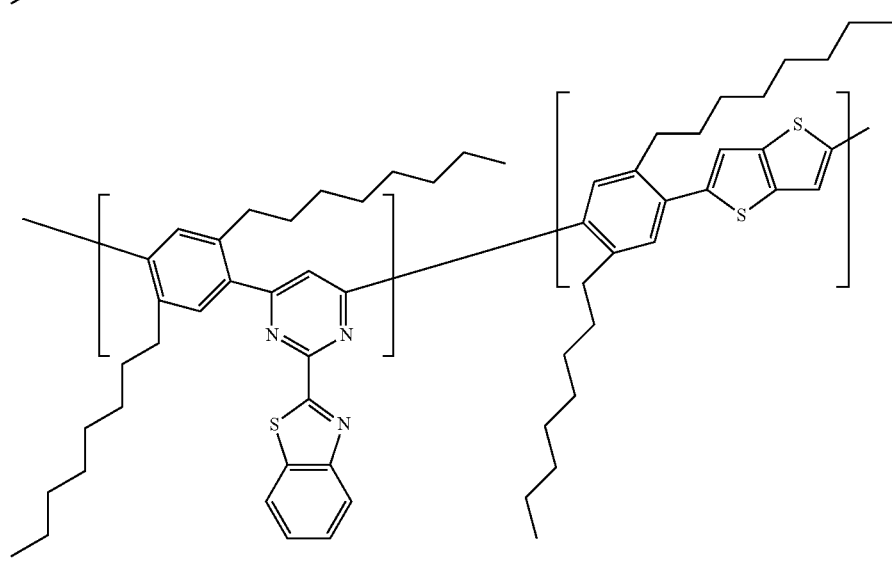

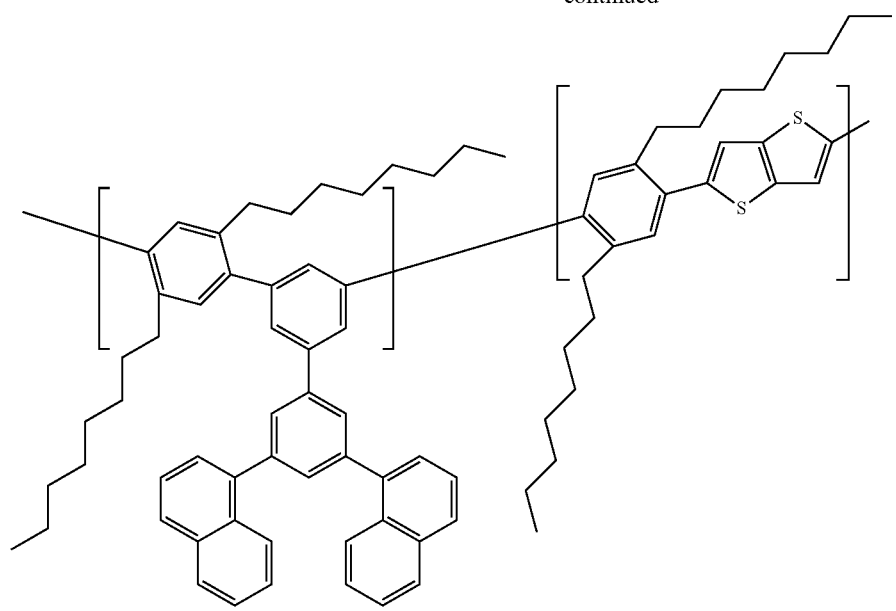
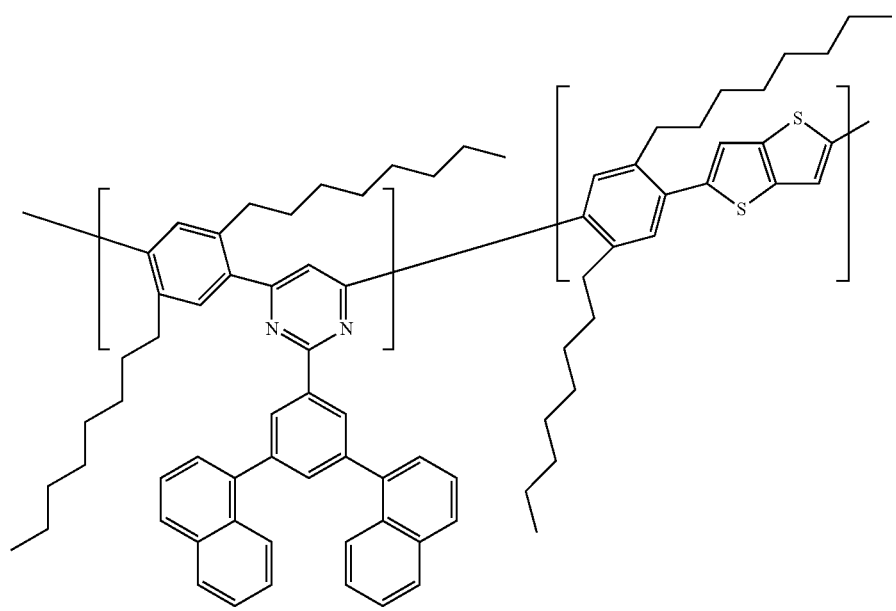

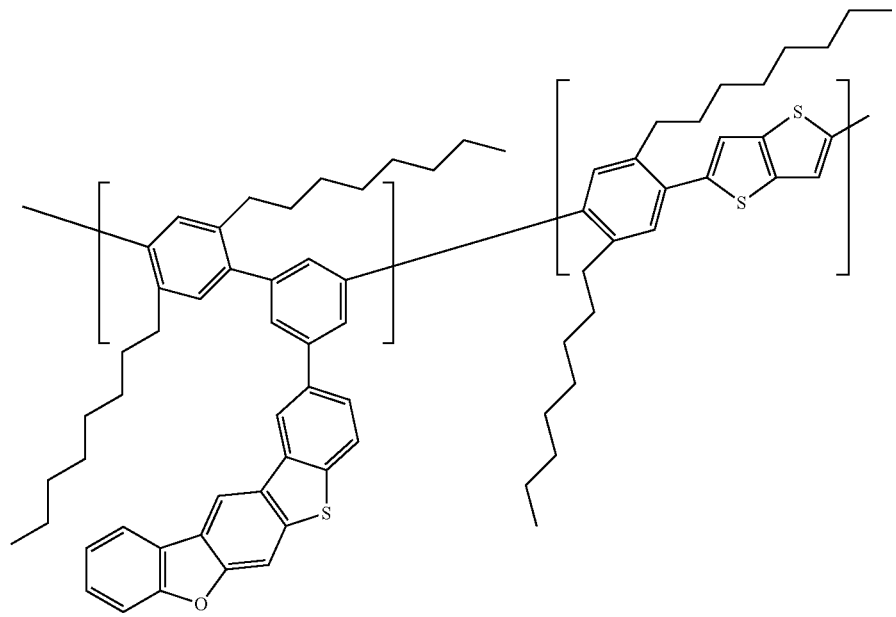
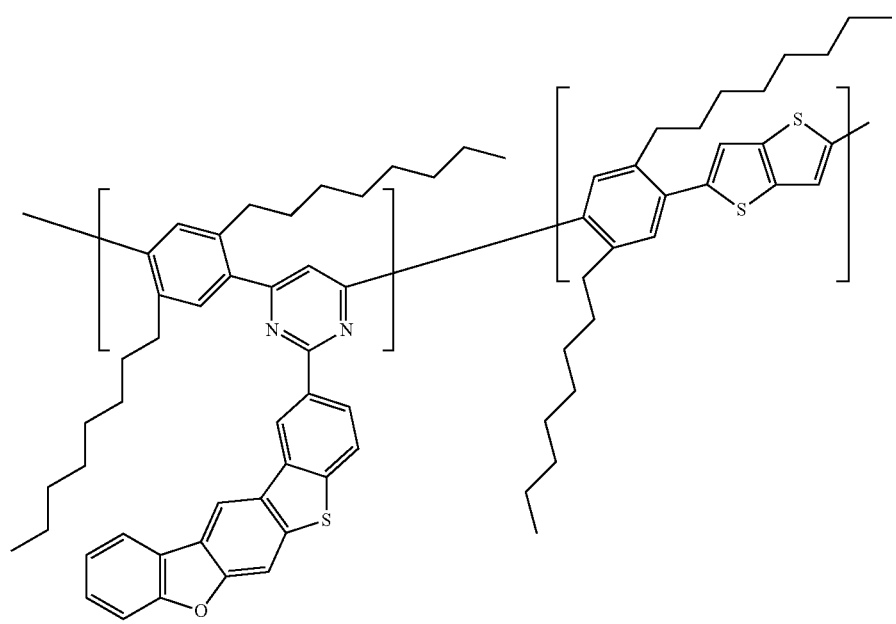

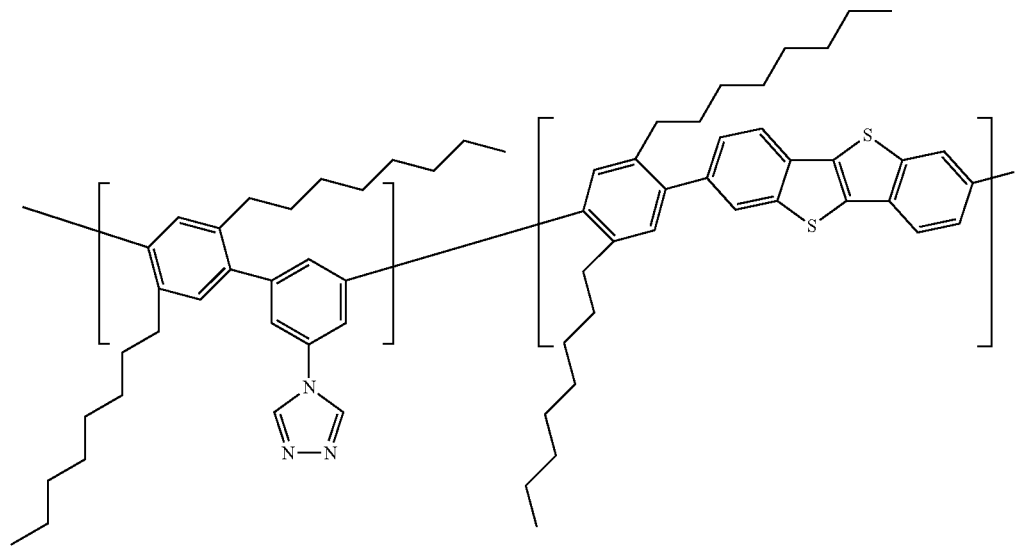
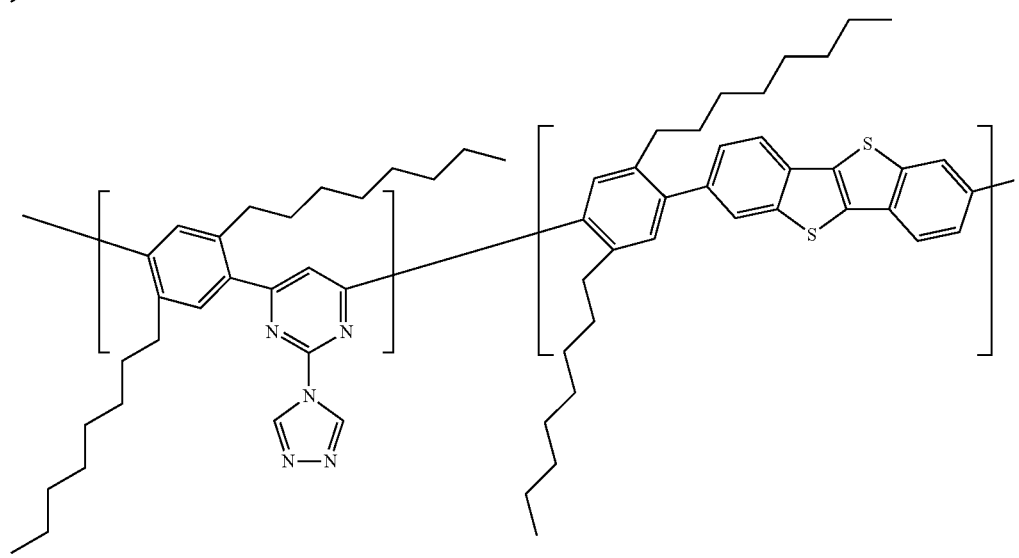
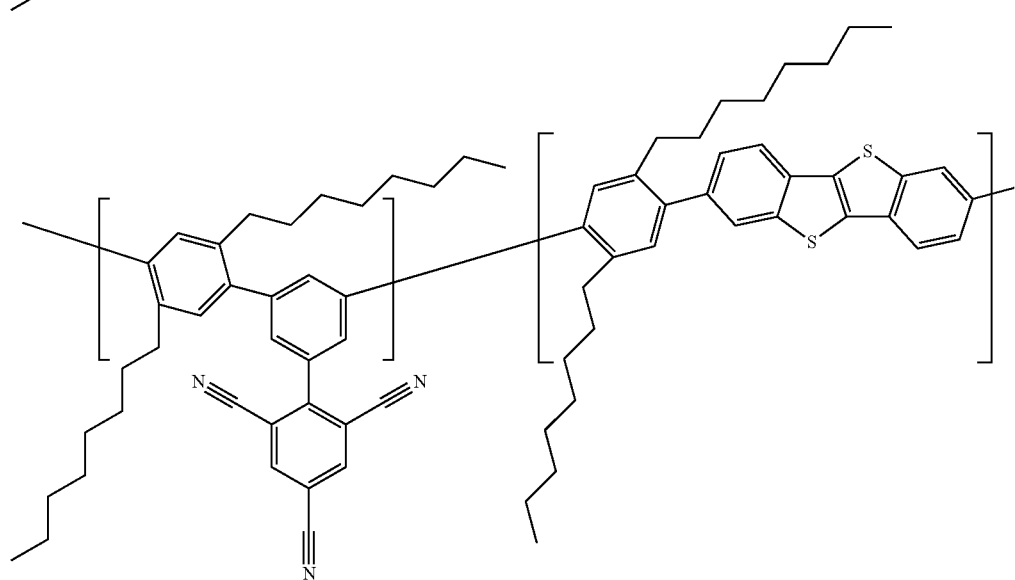

-continued
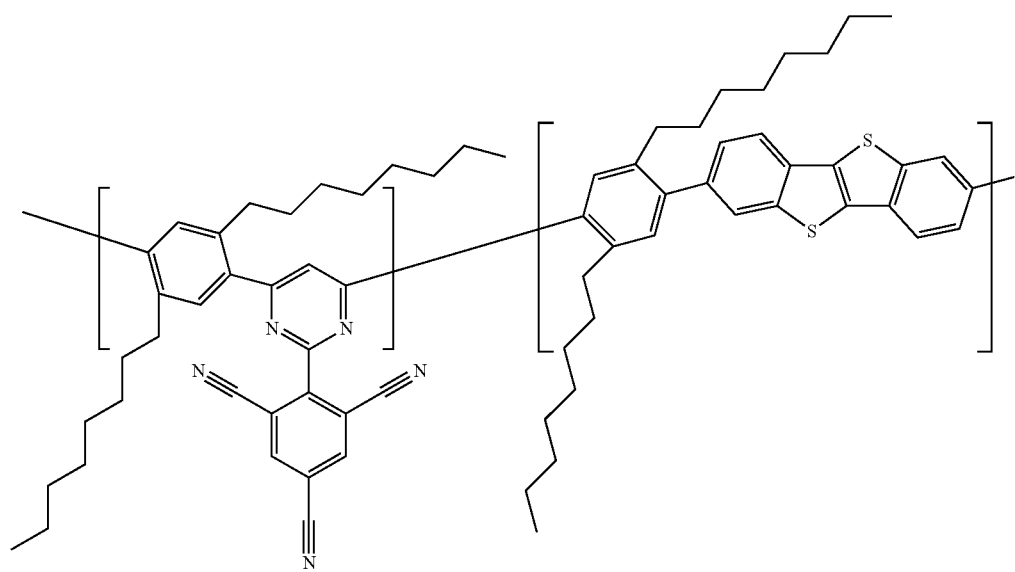
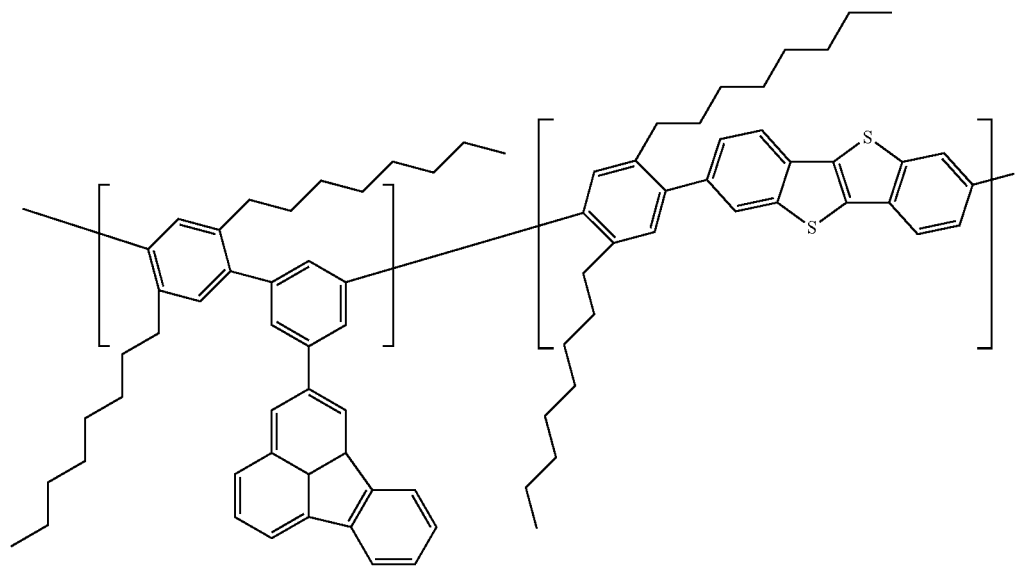
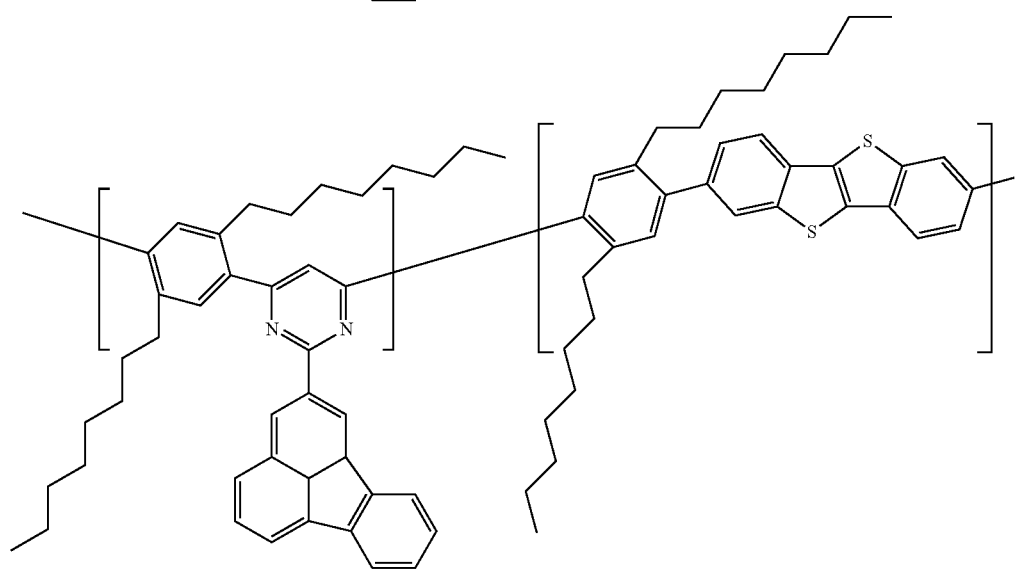

-continued
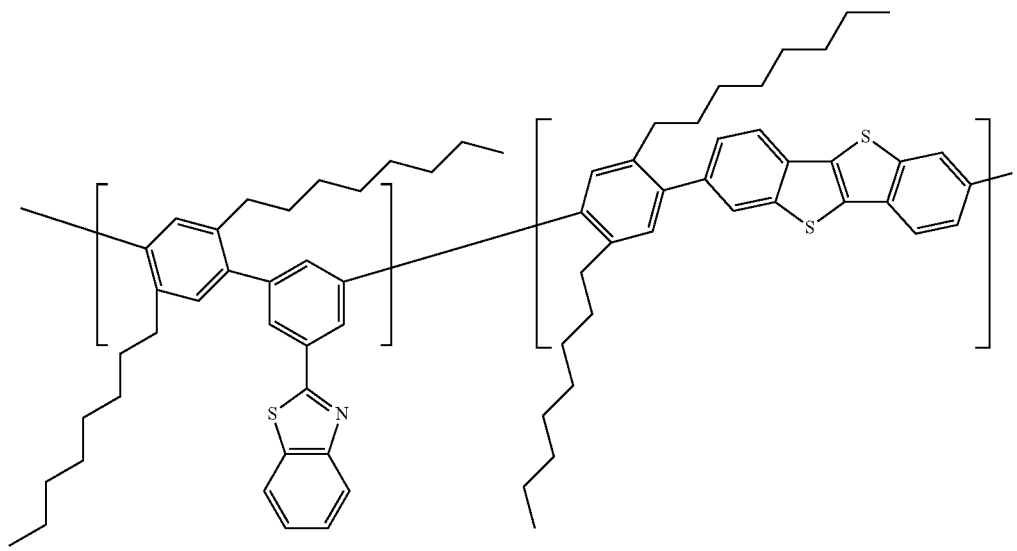
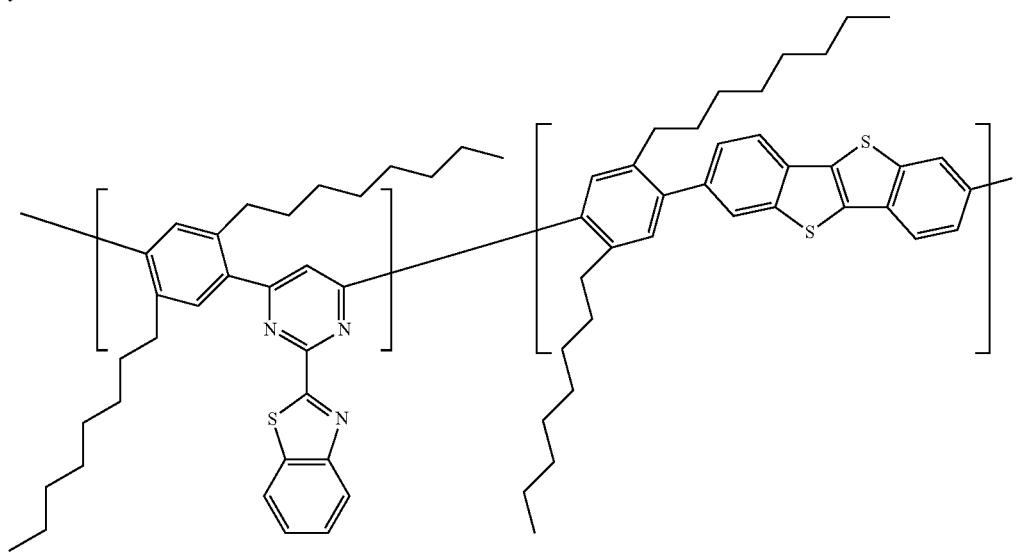
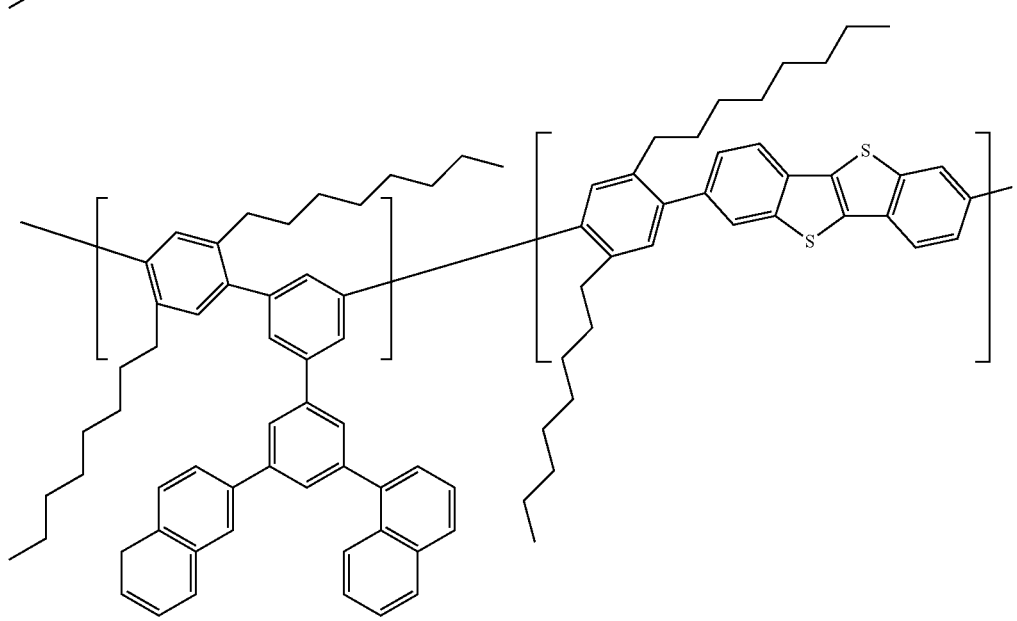

-continued
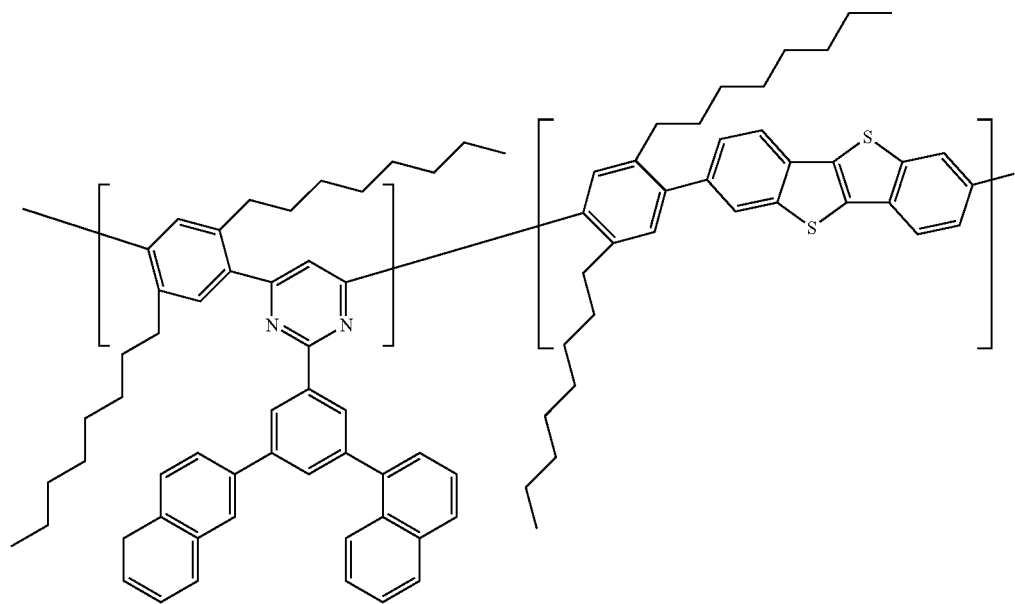
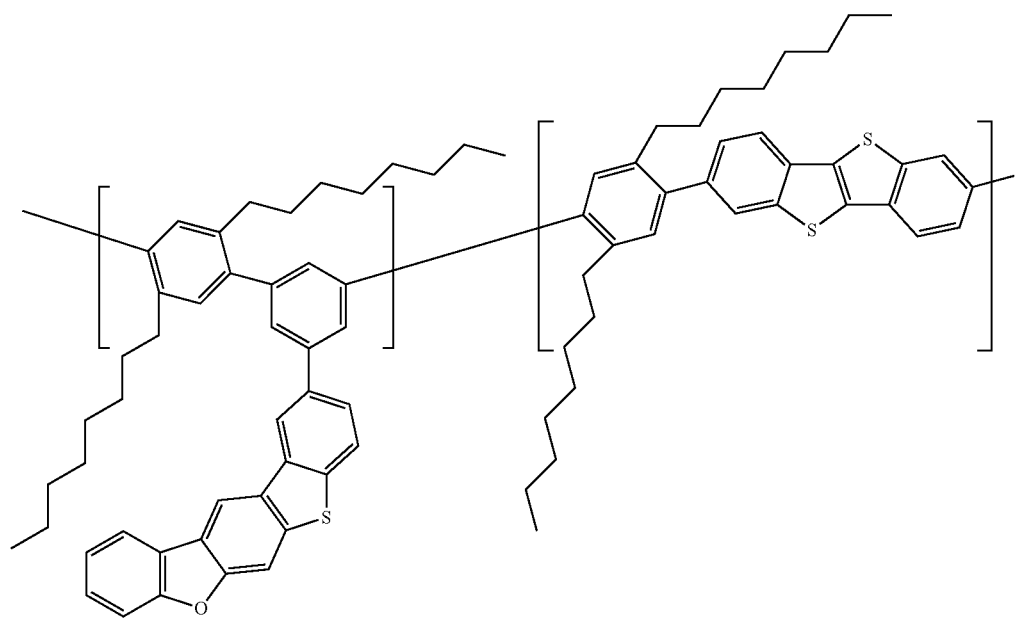

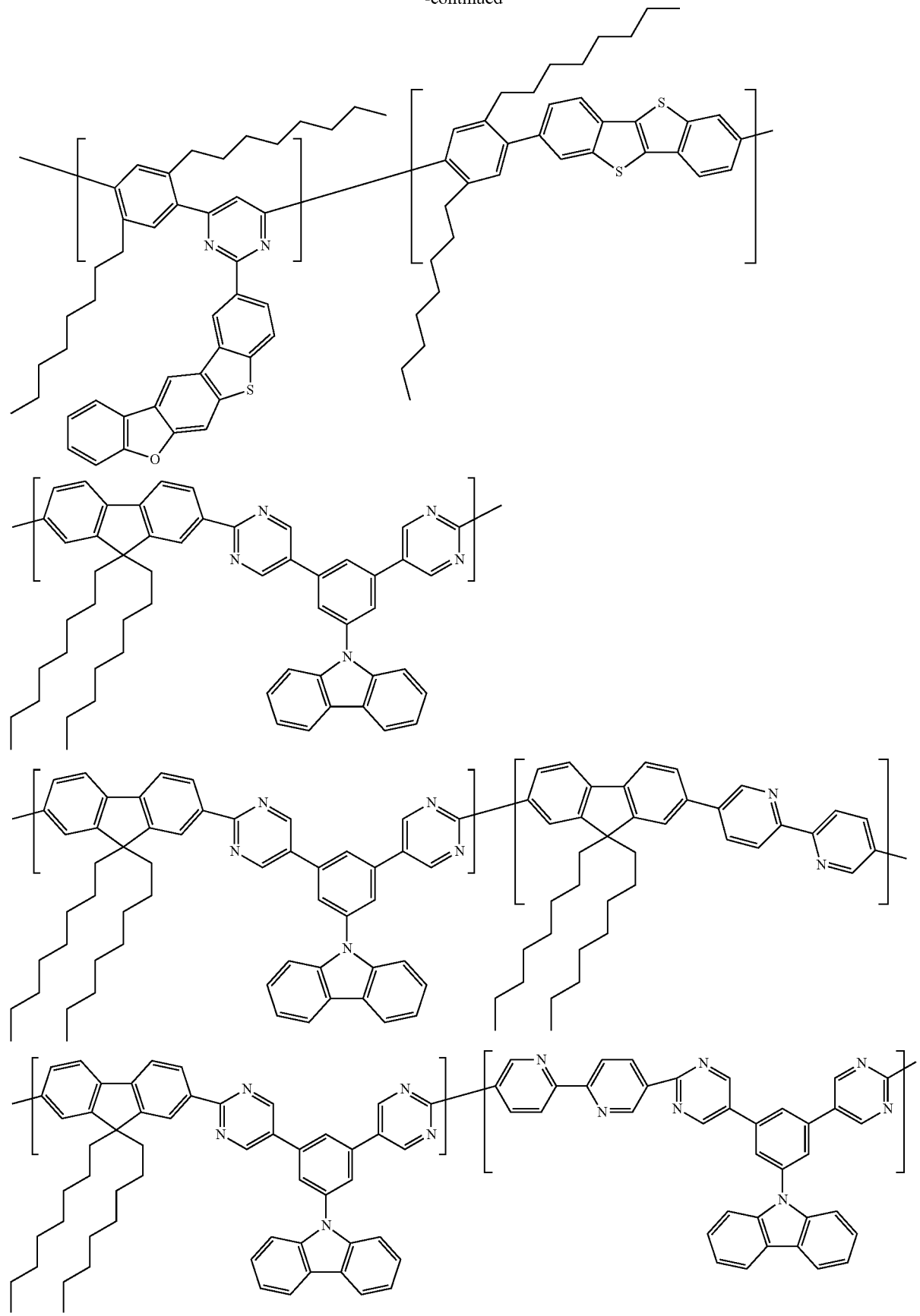
-continued

-continued
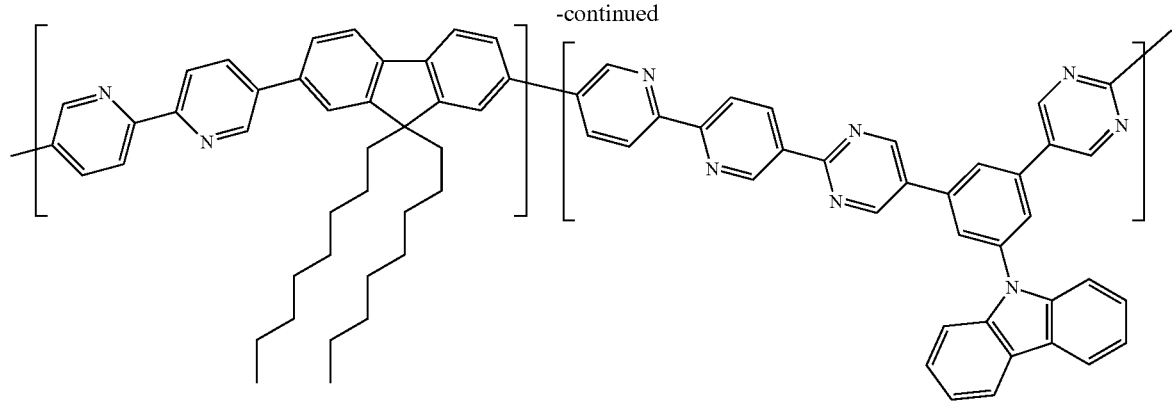
The repeating units of the random copolymer structures include, for example, the following structures.
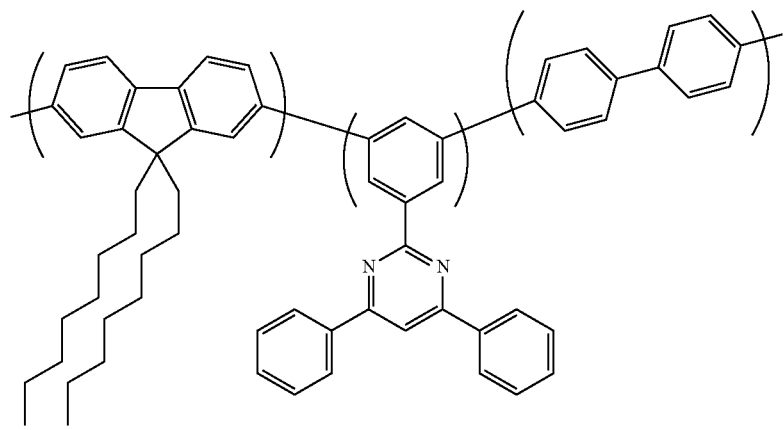
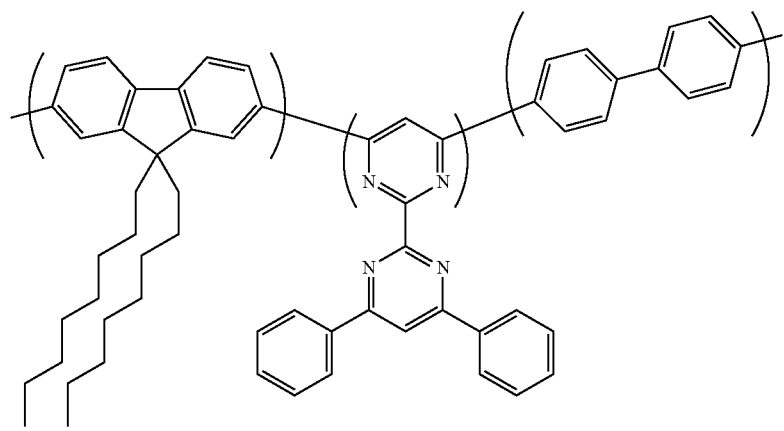

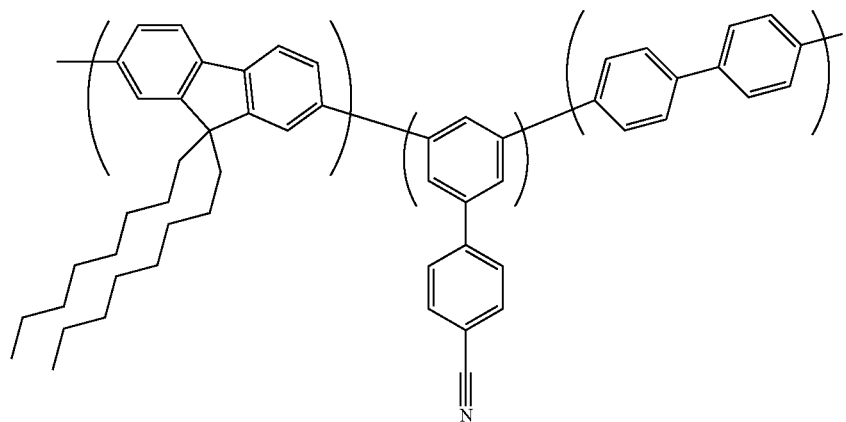
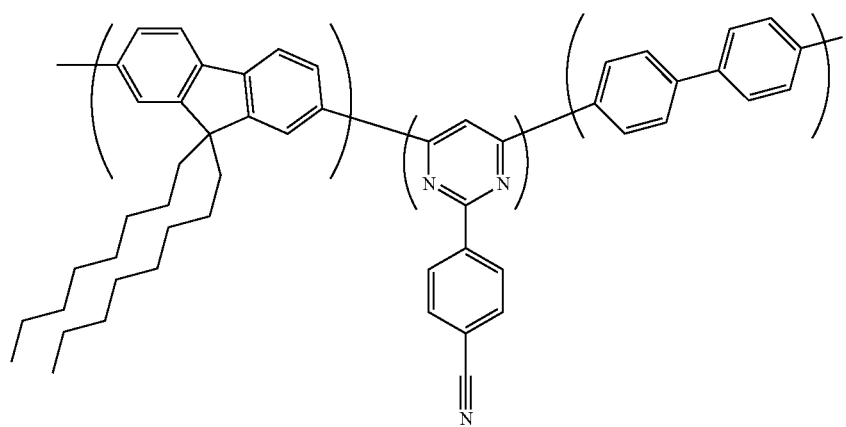
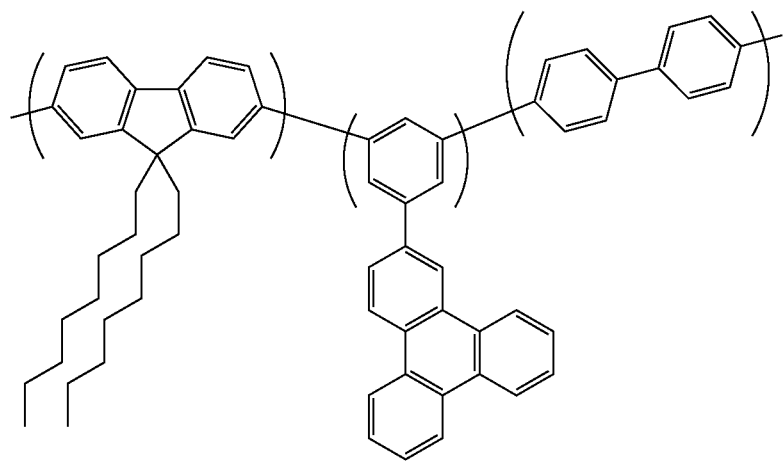

-continued
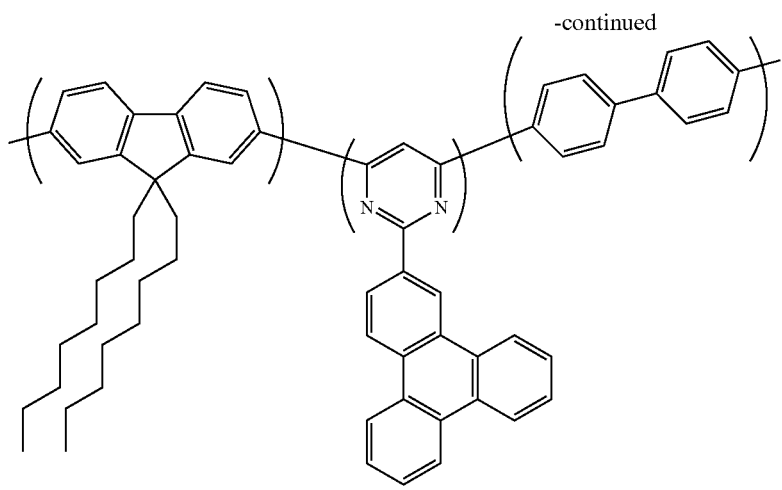
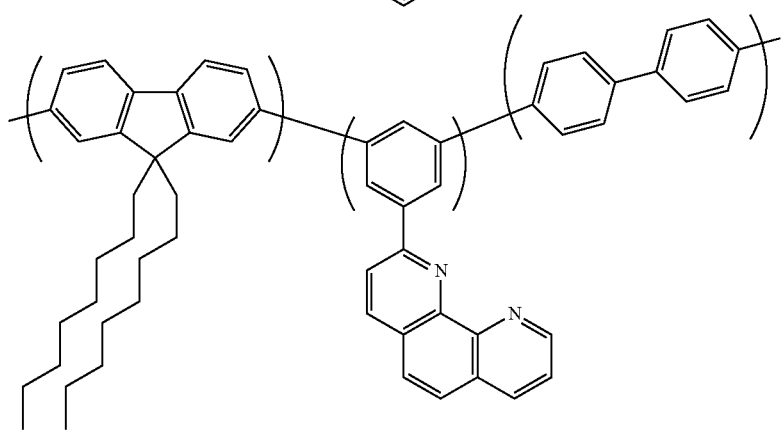
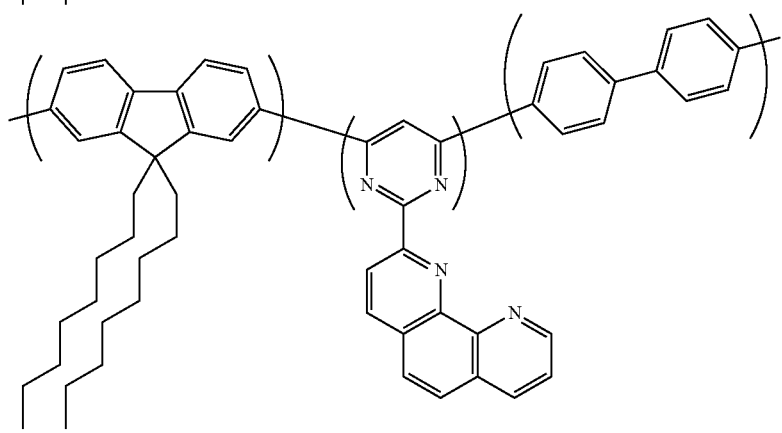
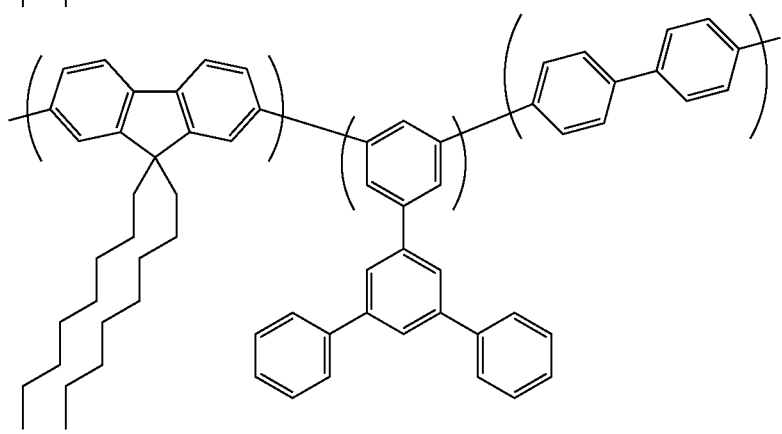

-continued
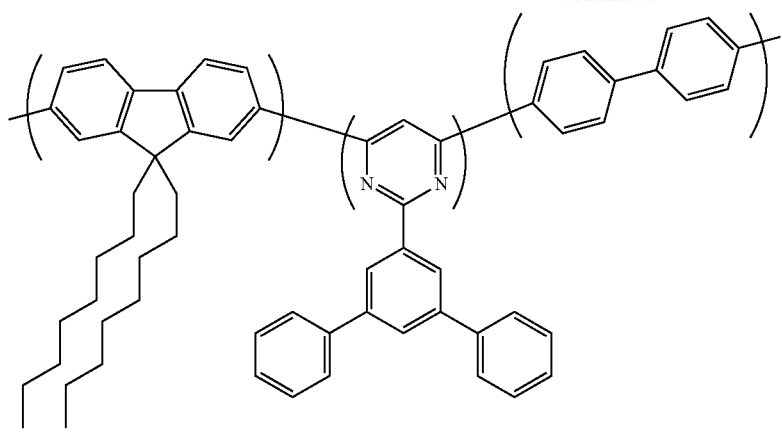
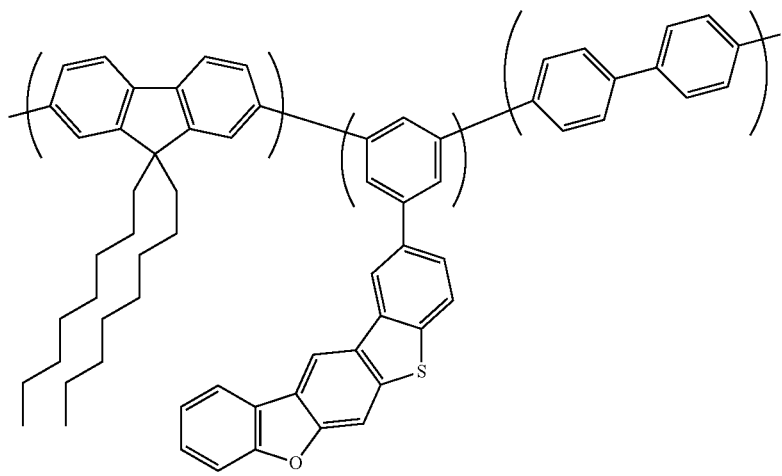
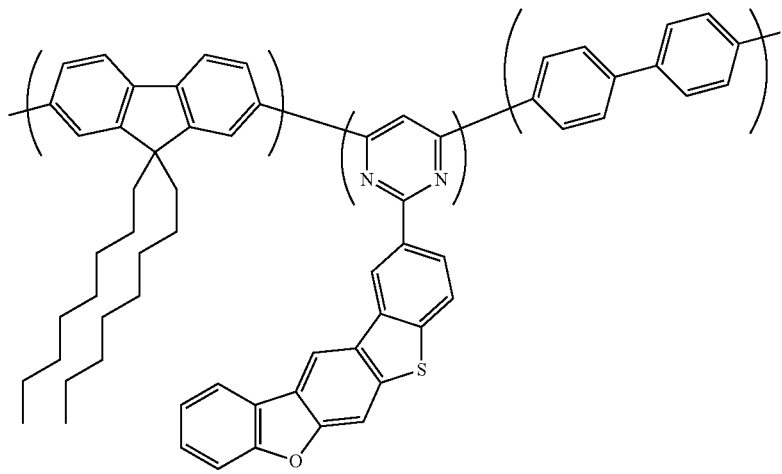

-continued
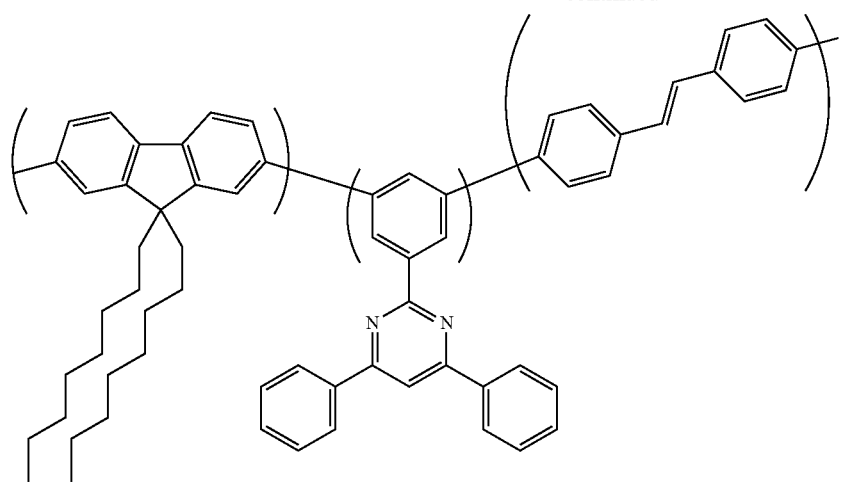
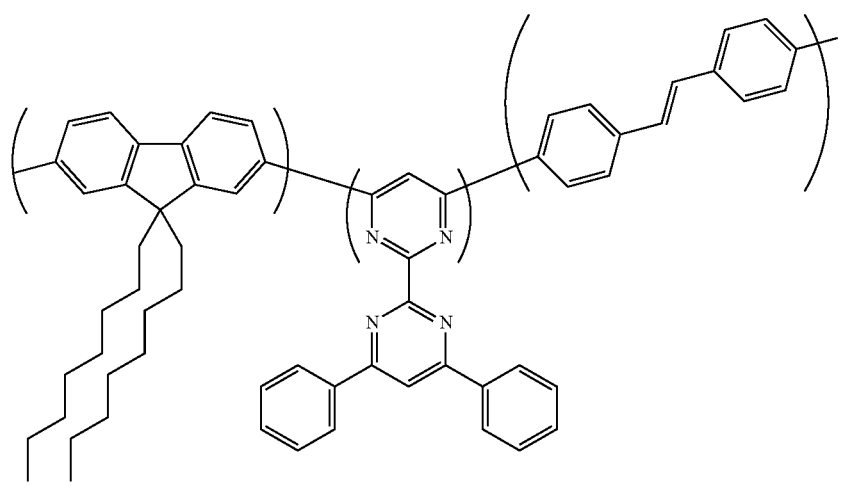
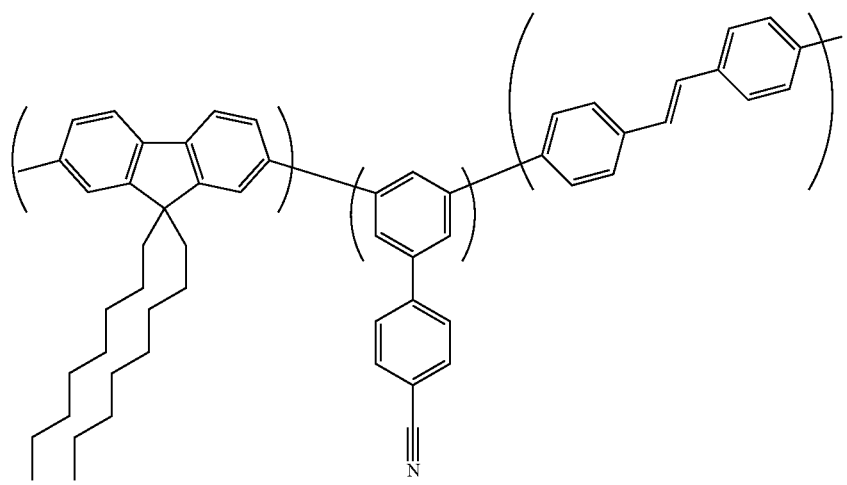

-continued
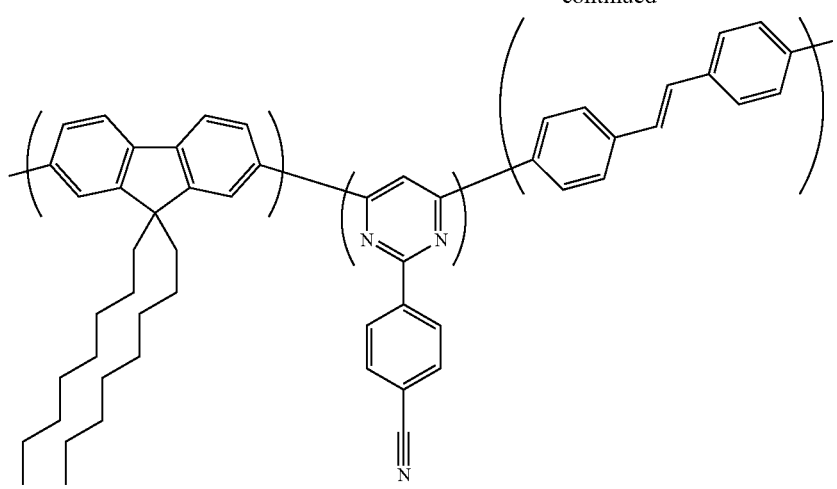
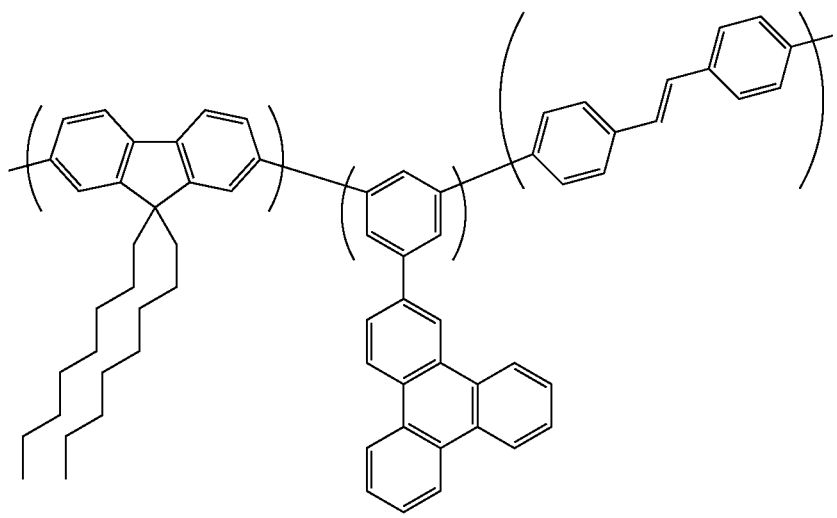
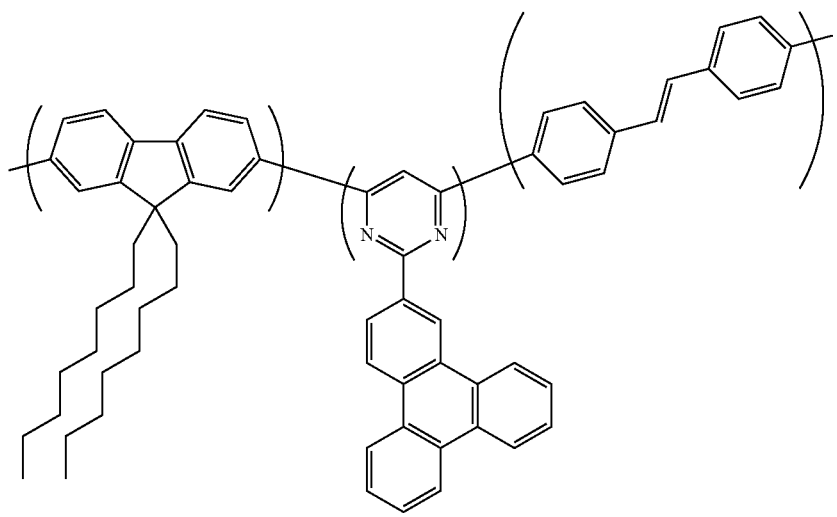

-continued
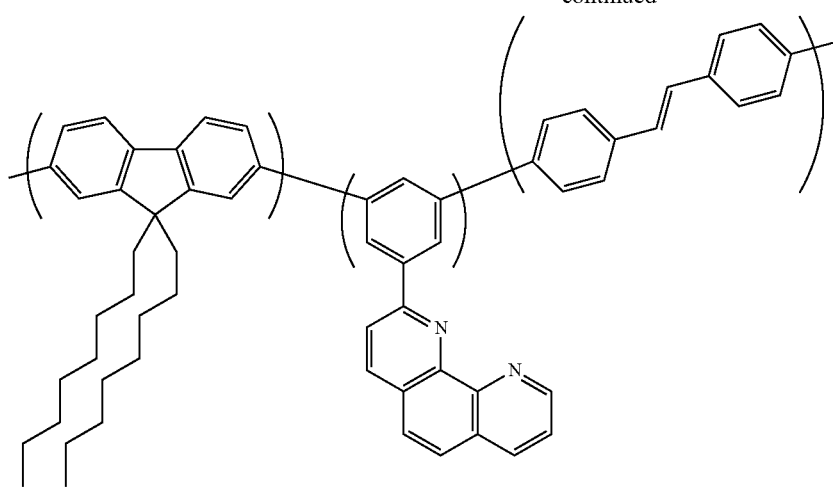
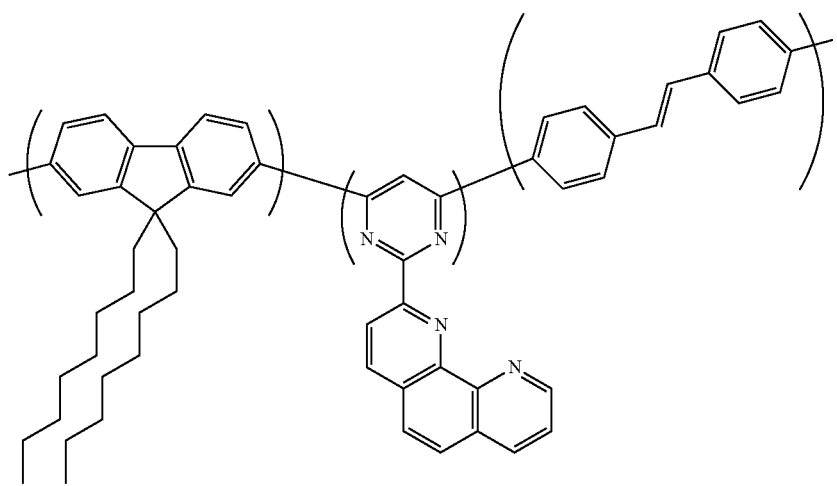
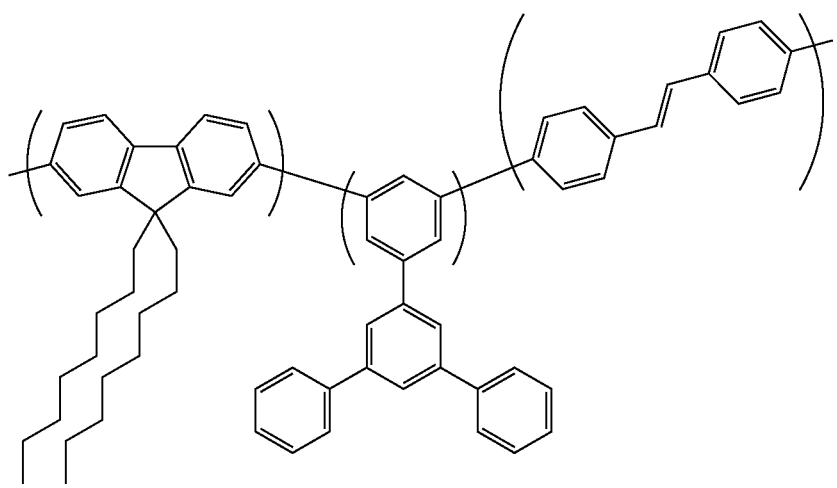

-continued
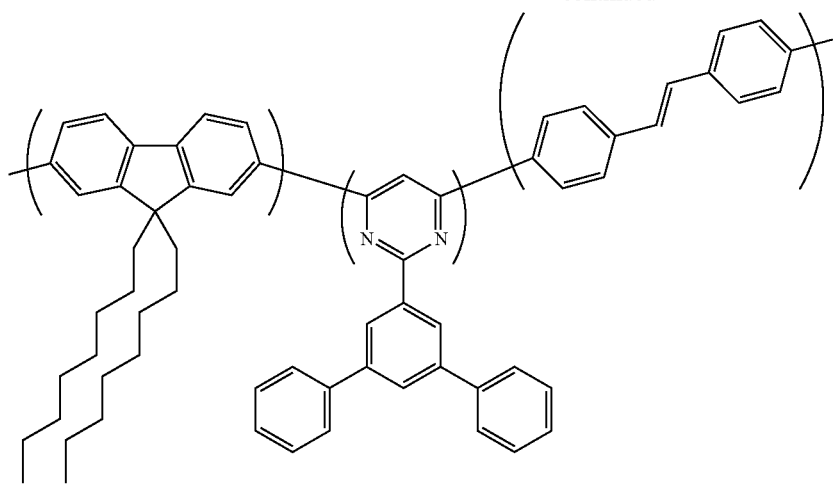
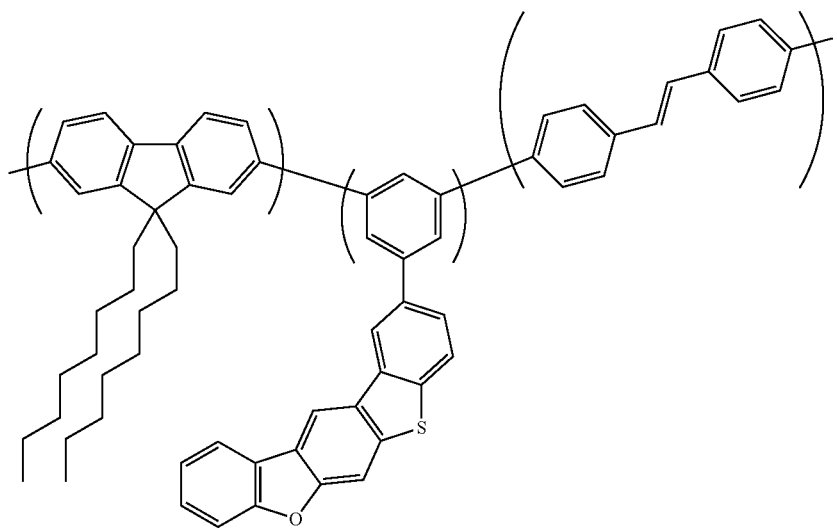
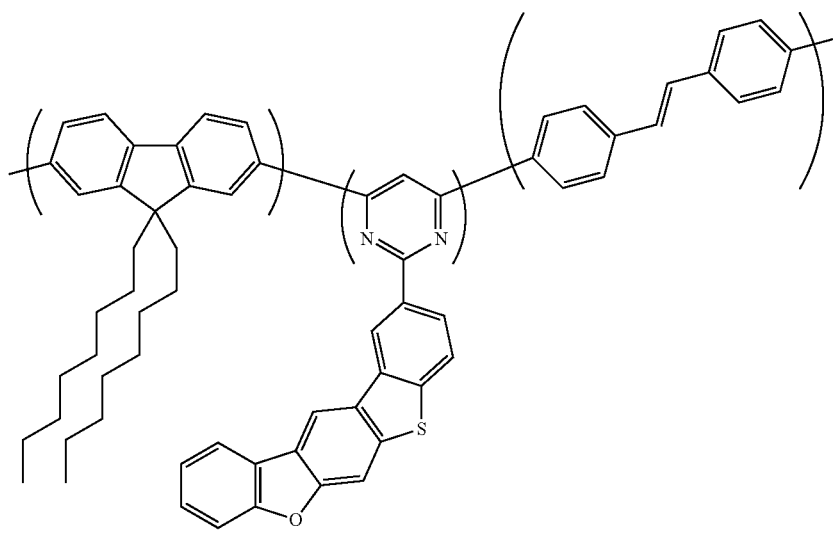

-continued
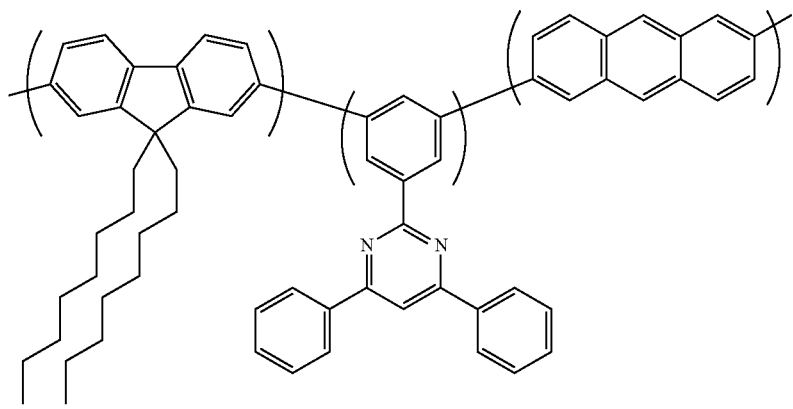
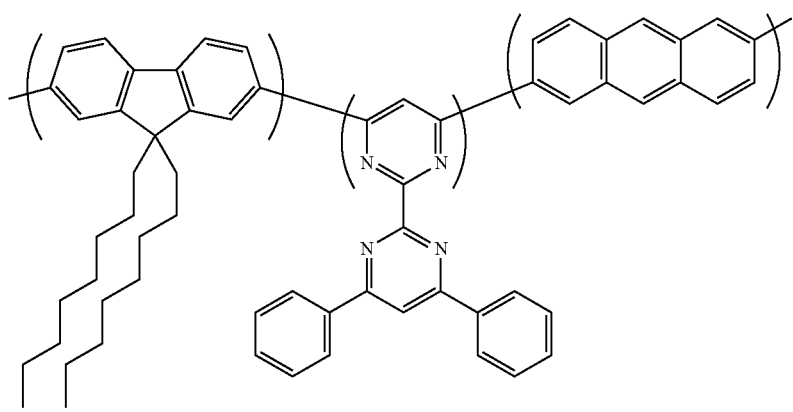
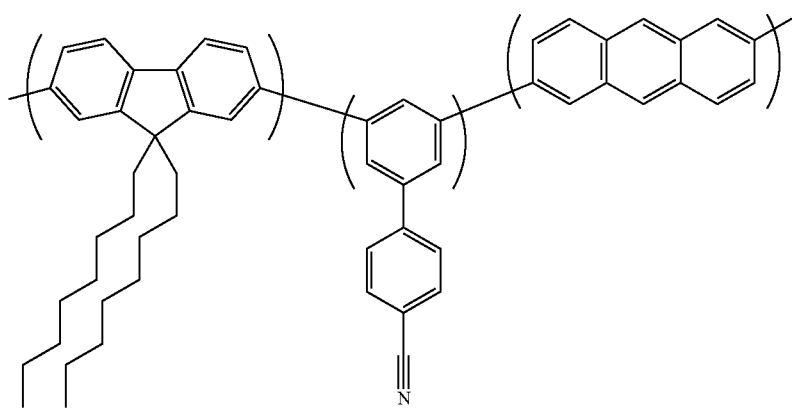
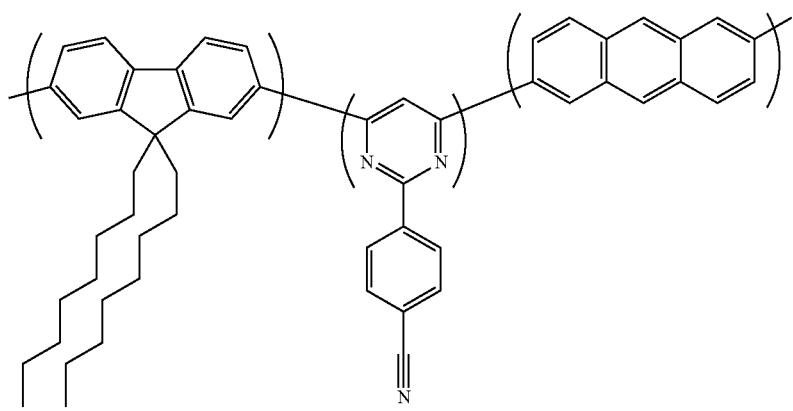

-continued
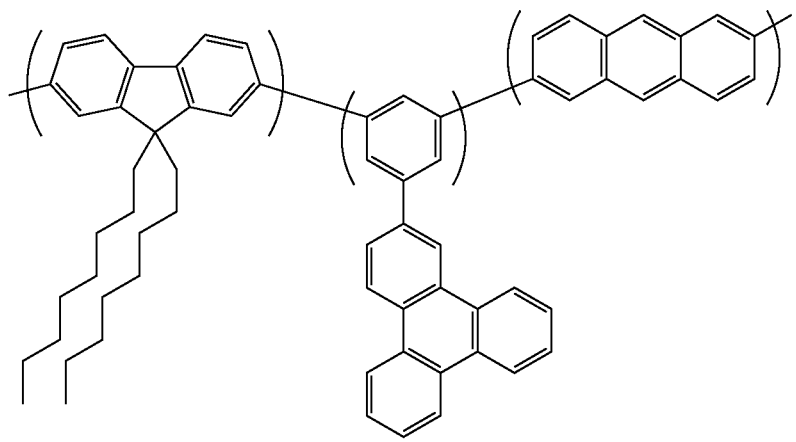
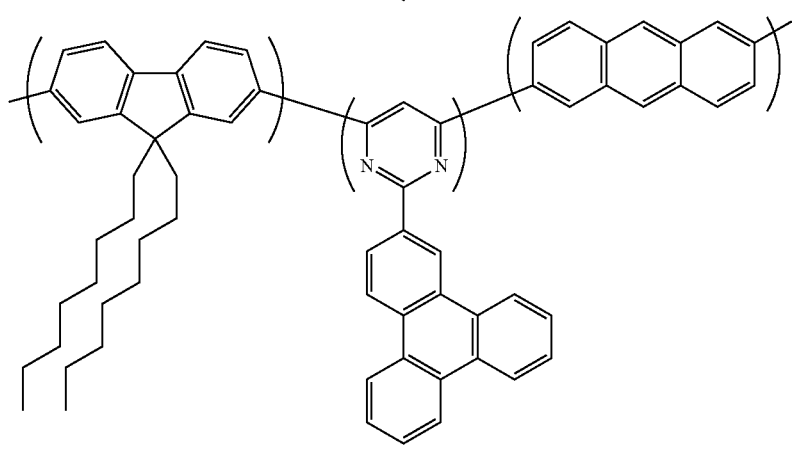
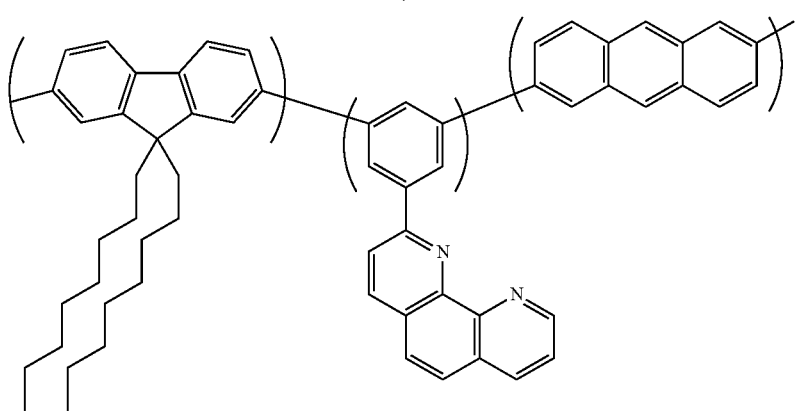
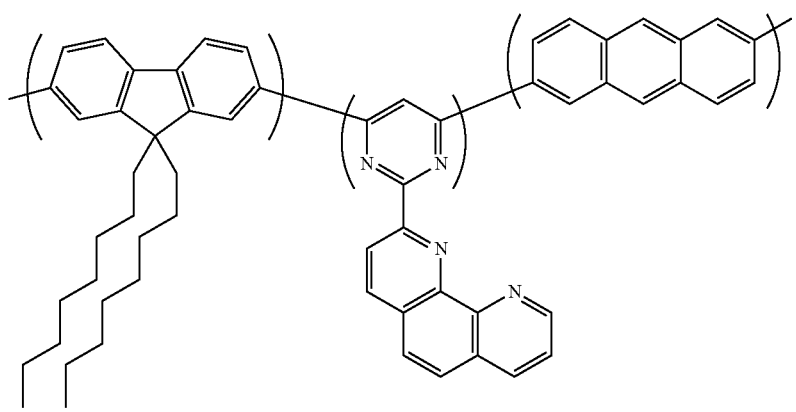

-continued
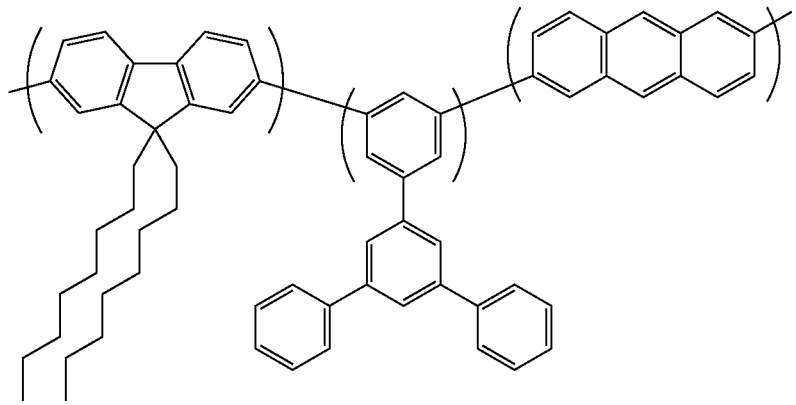
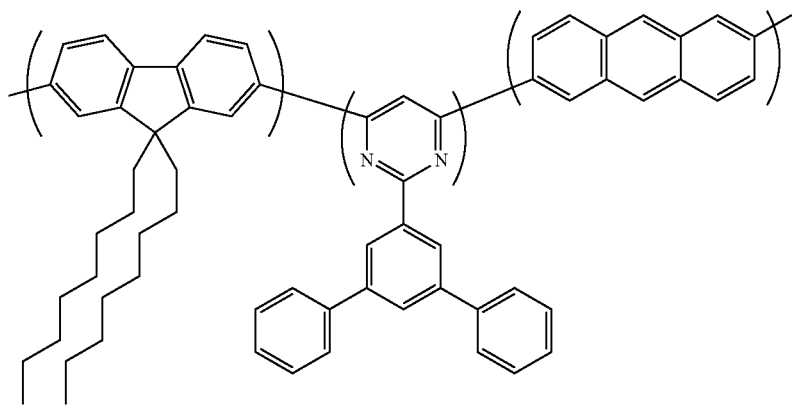
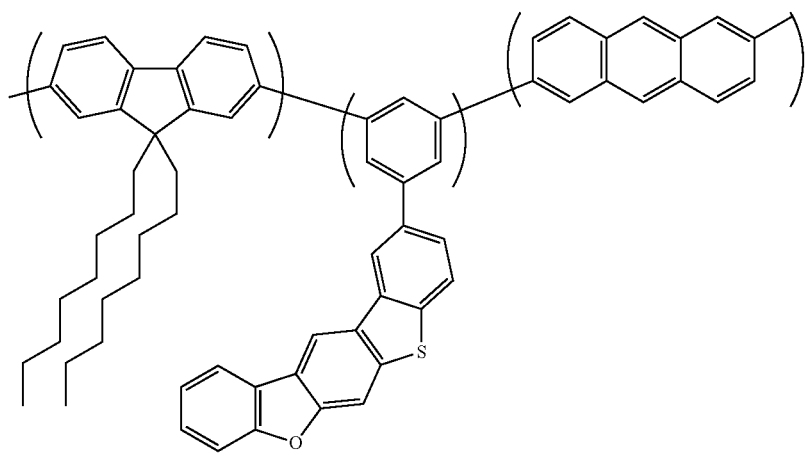
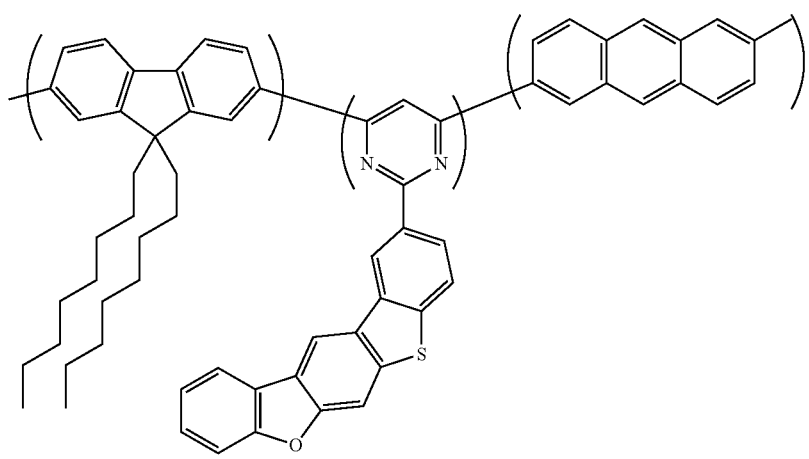

-continued
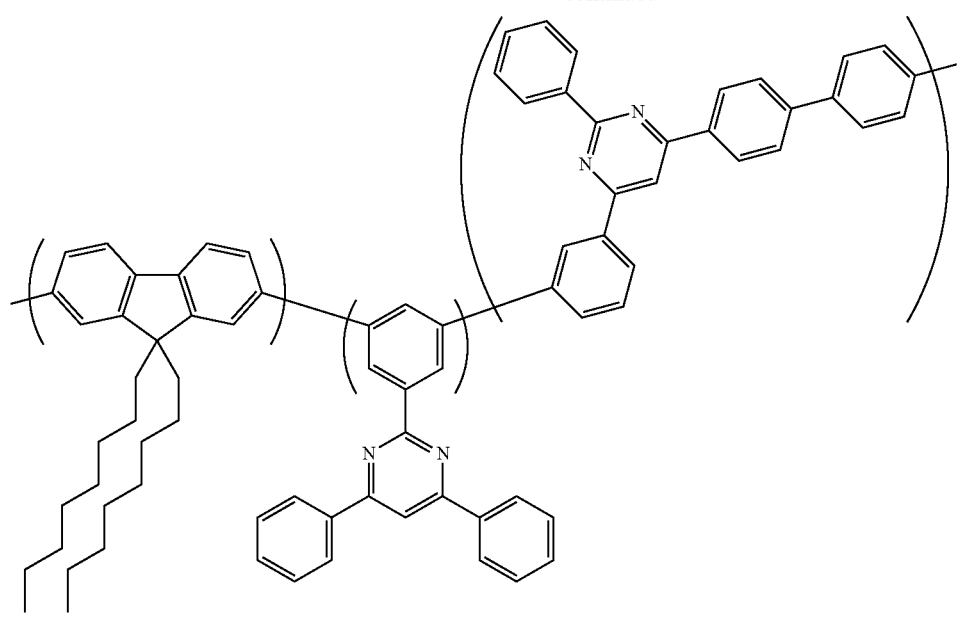
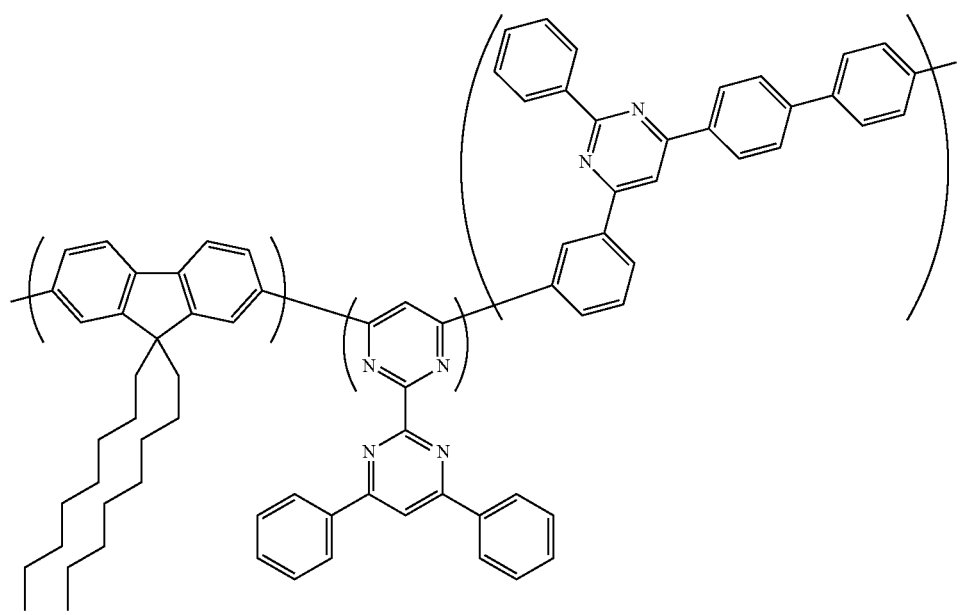

-continued
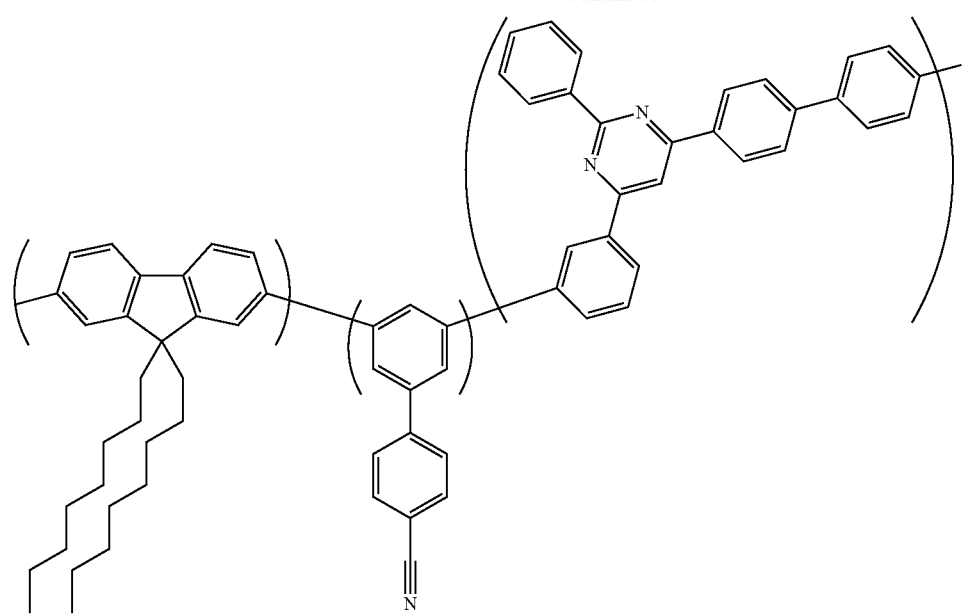
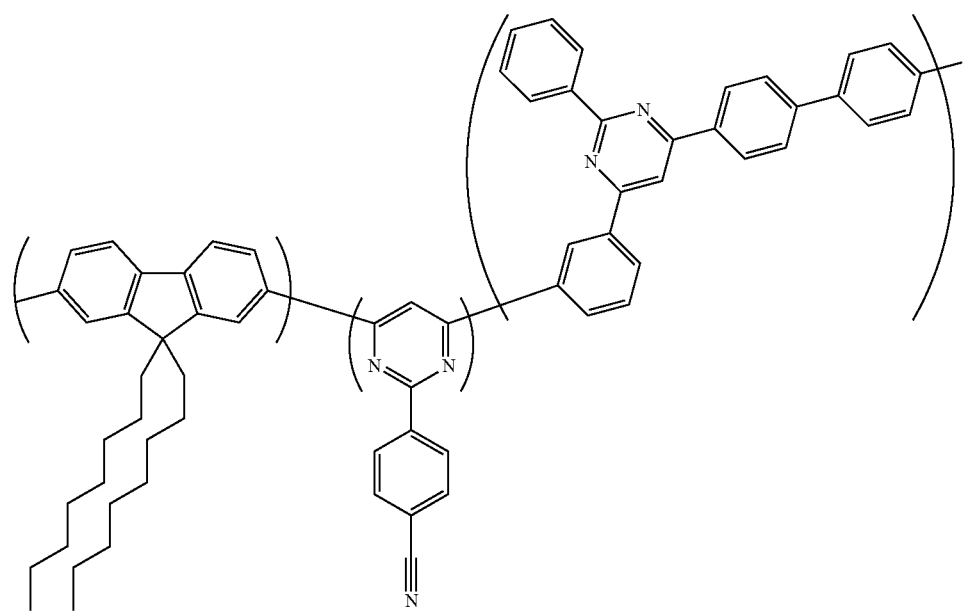

-continued
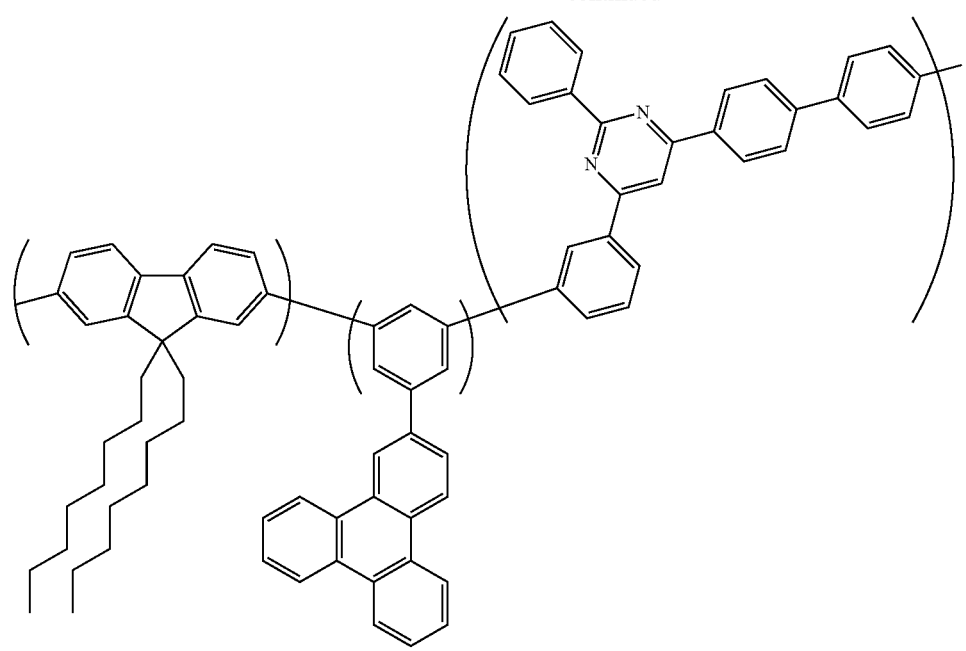
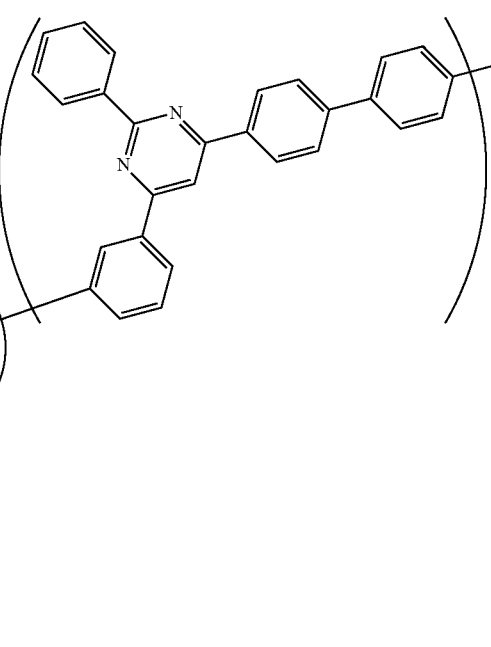

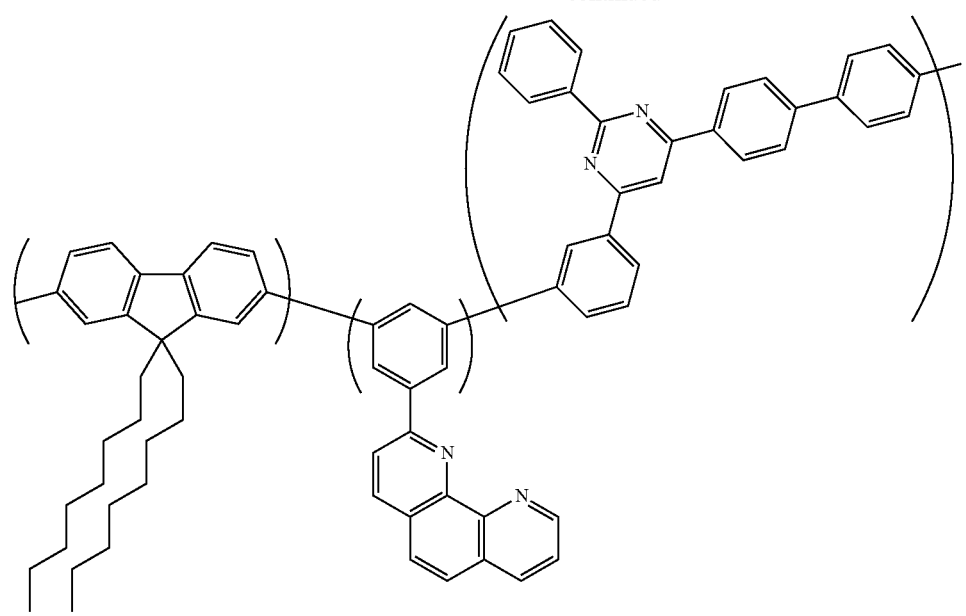
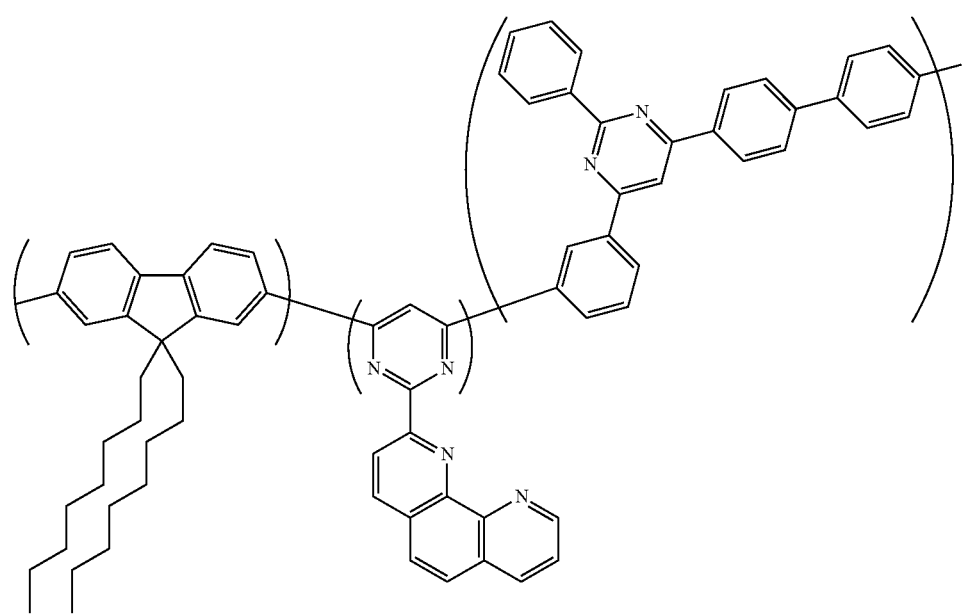

-continued
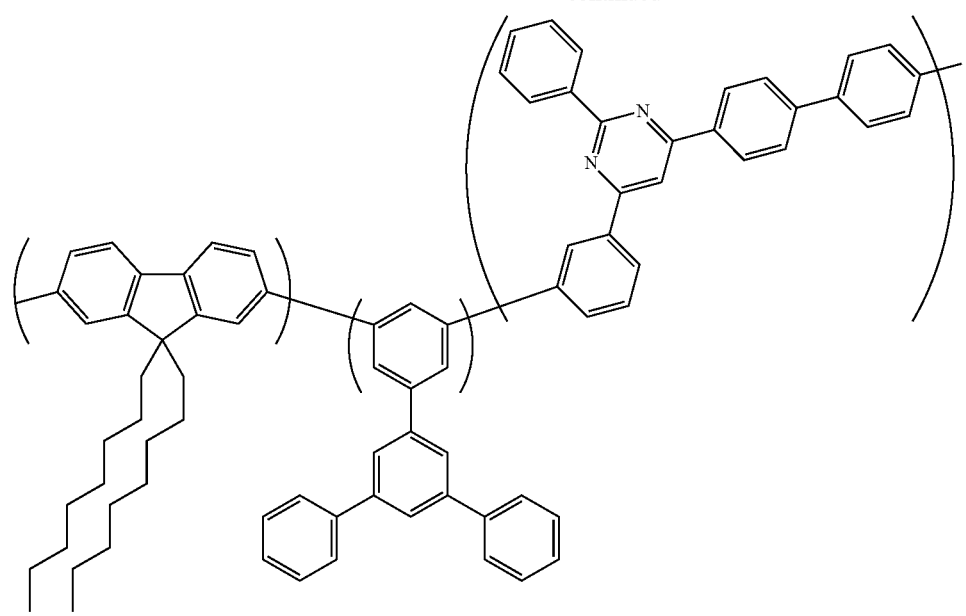
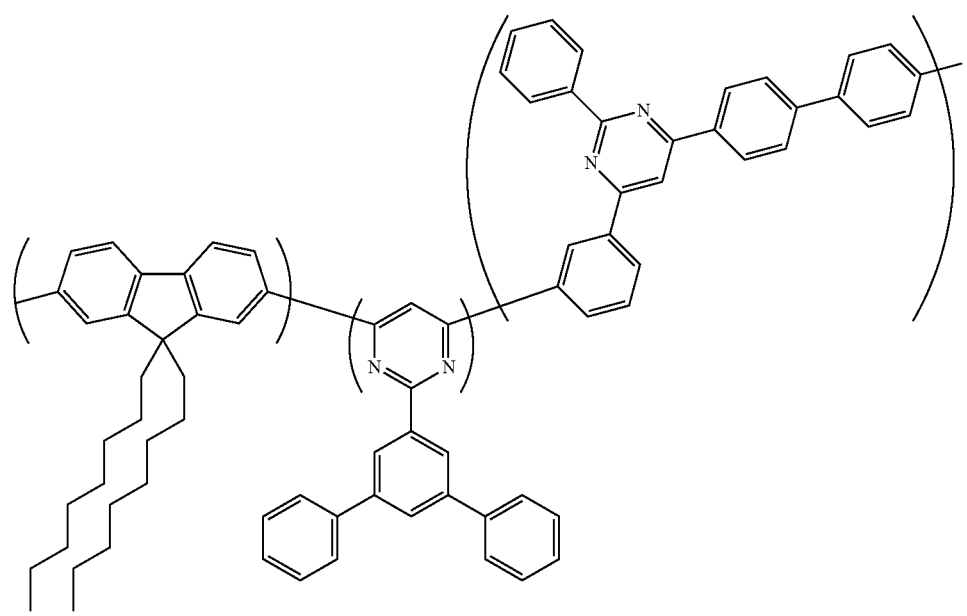

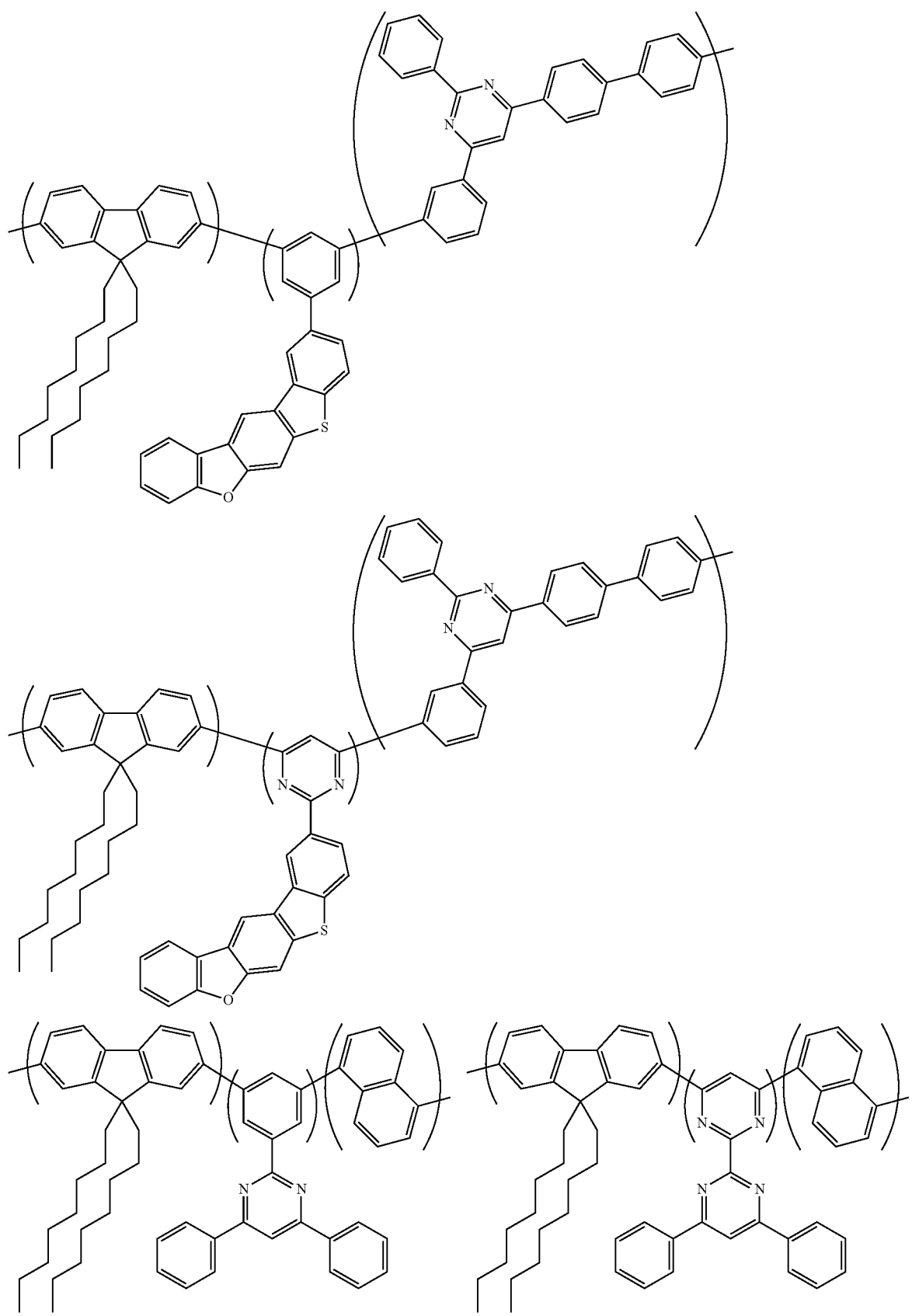

275      276
-continued
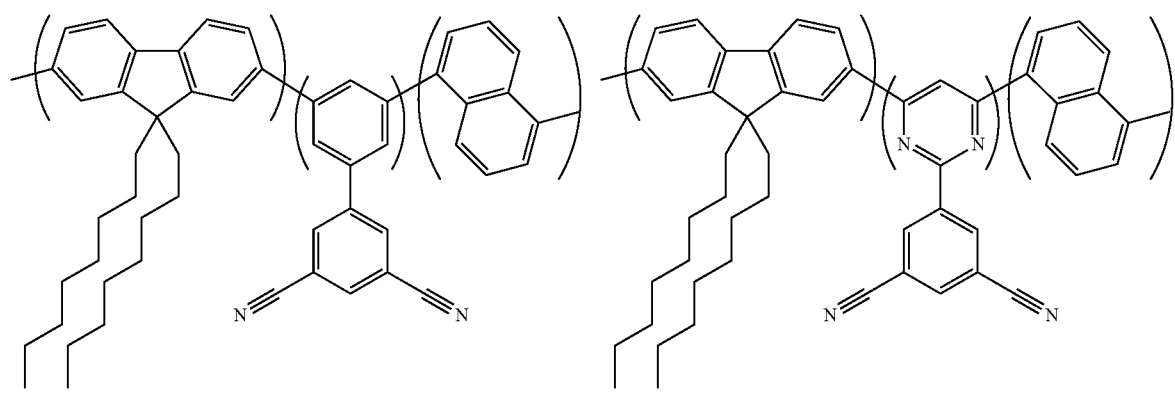

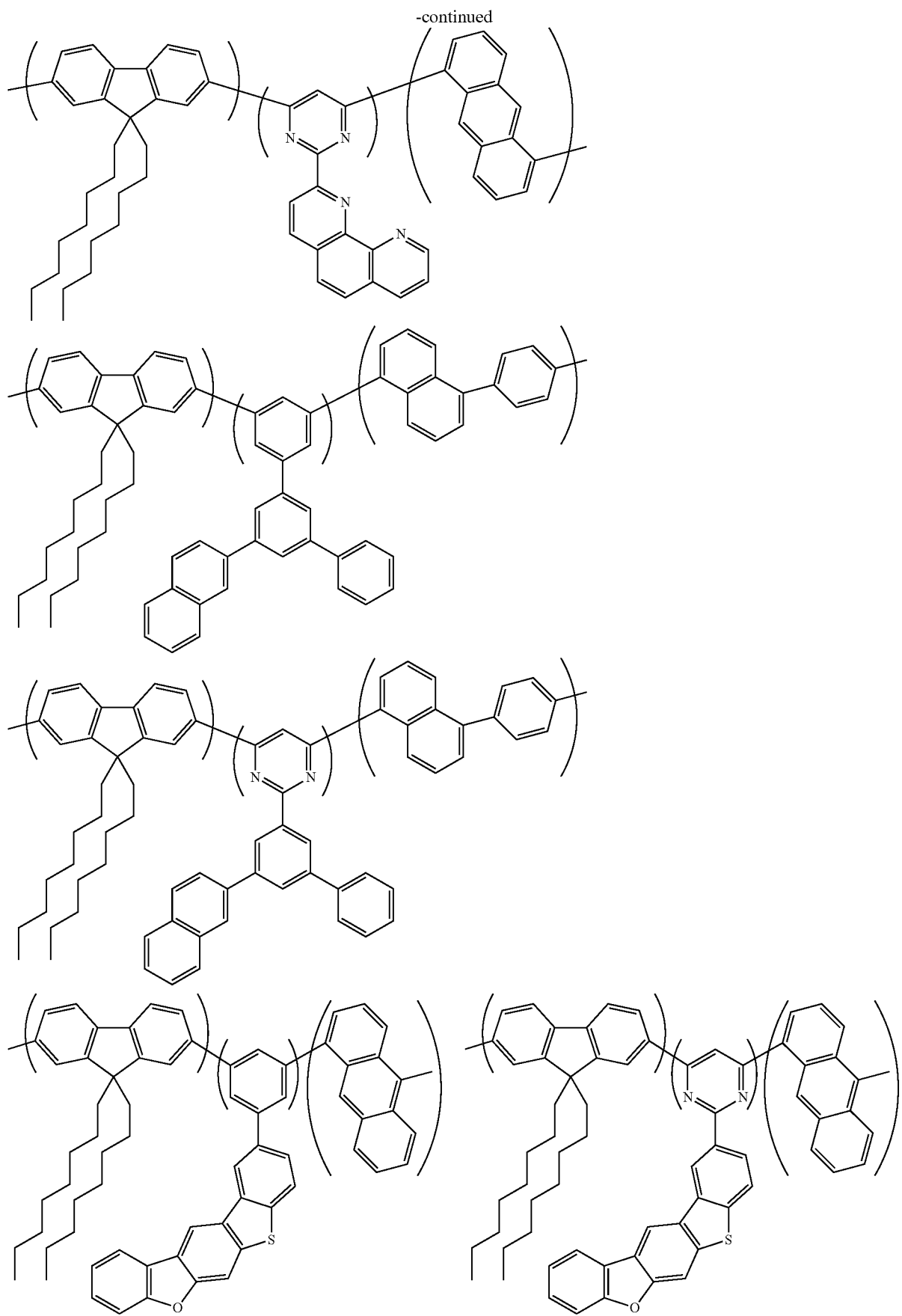

-continued
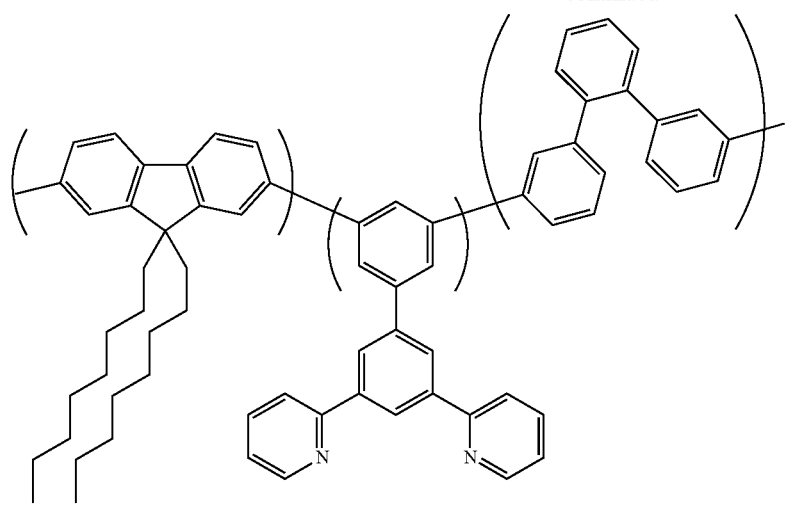
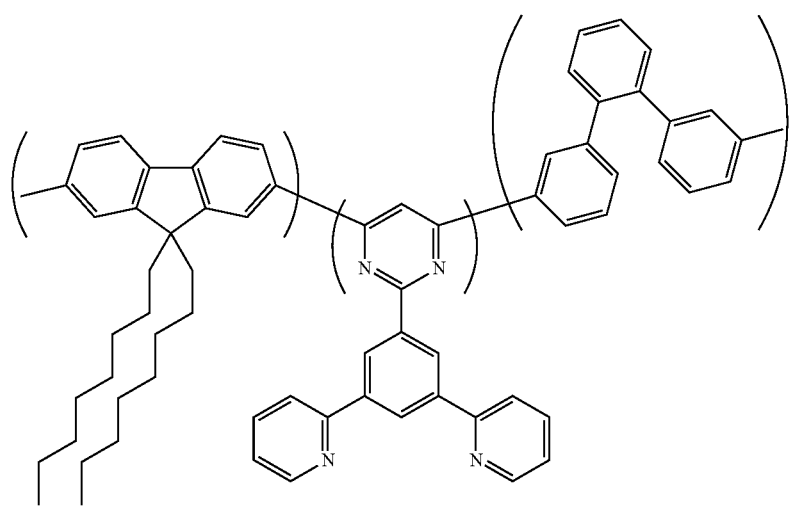
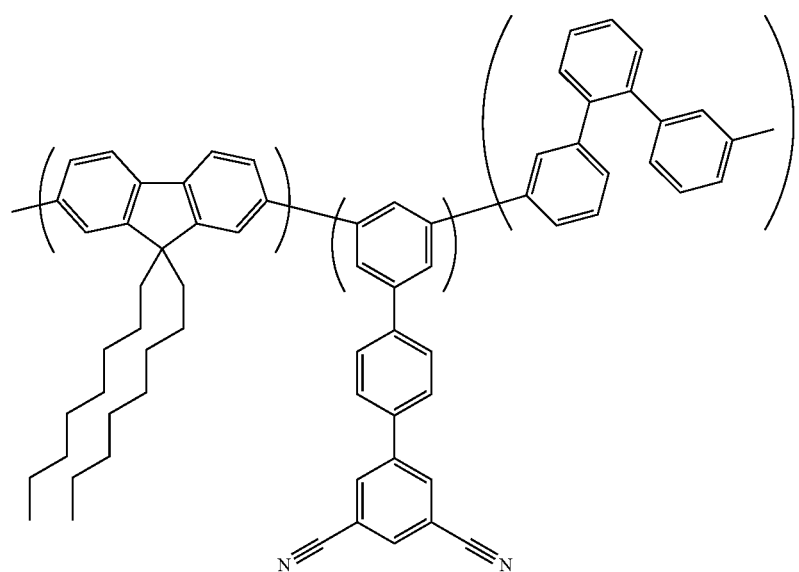

-continued
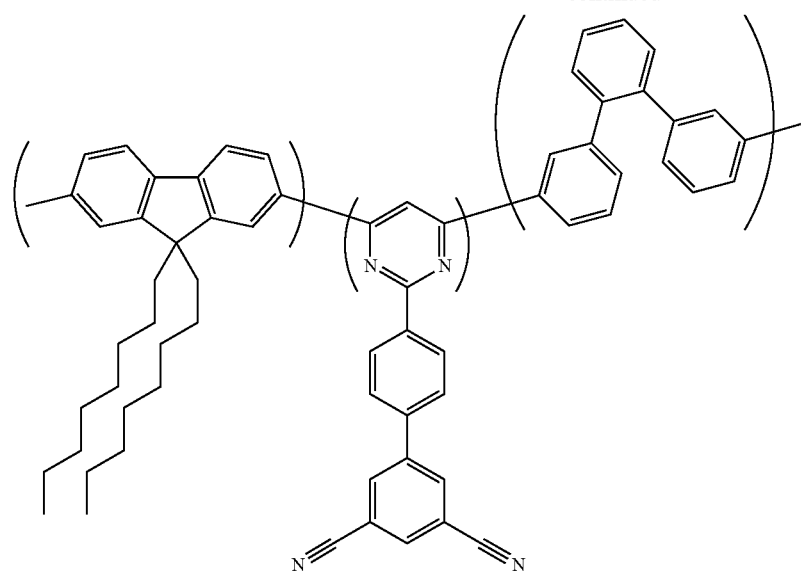
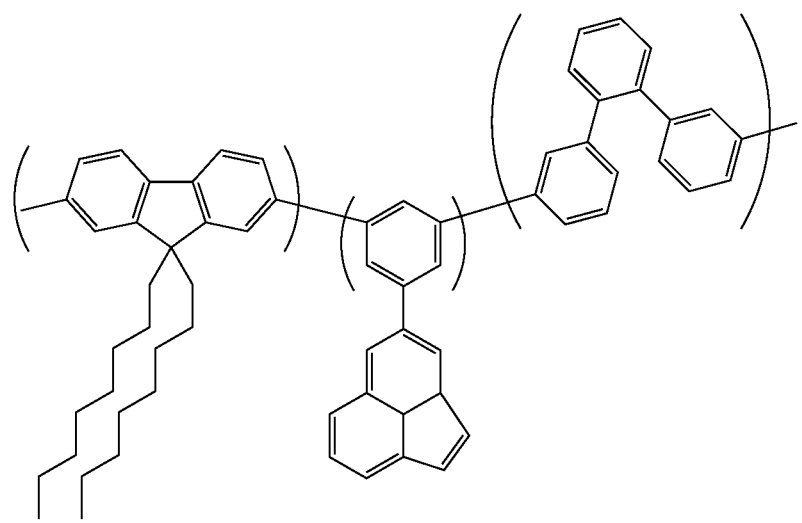
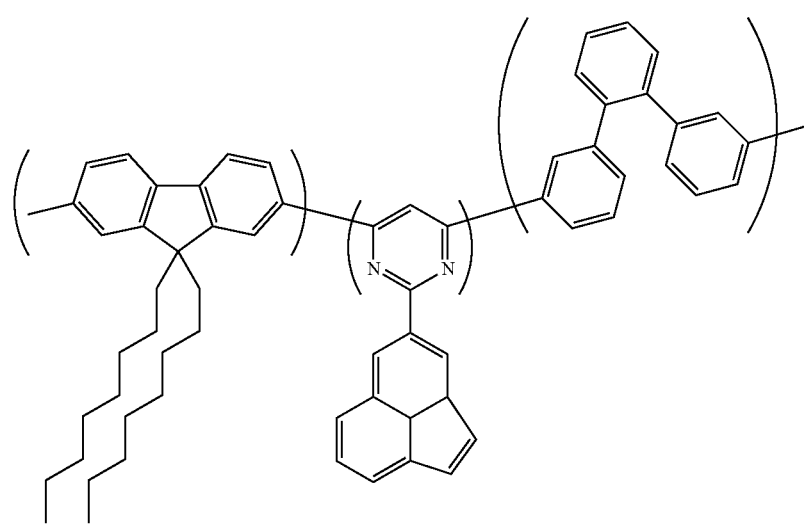

-continued
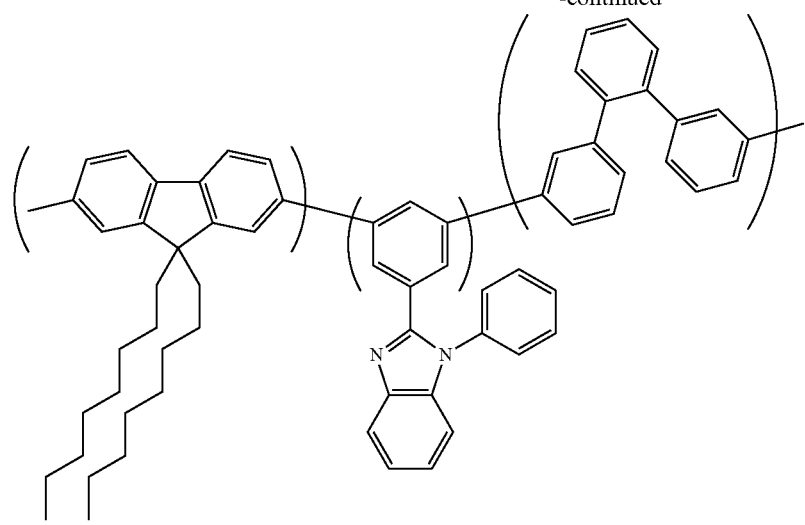
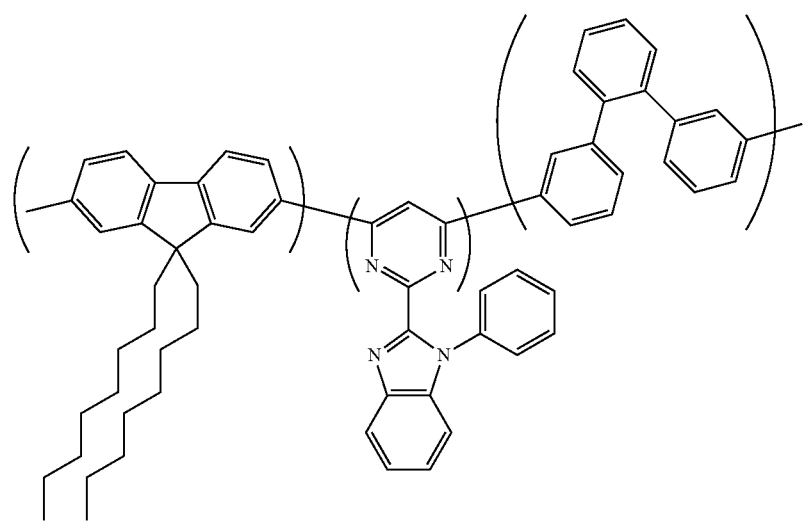
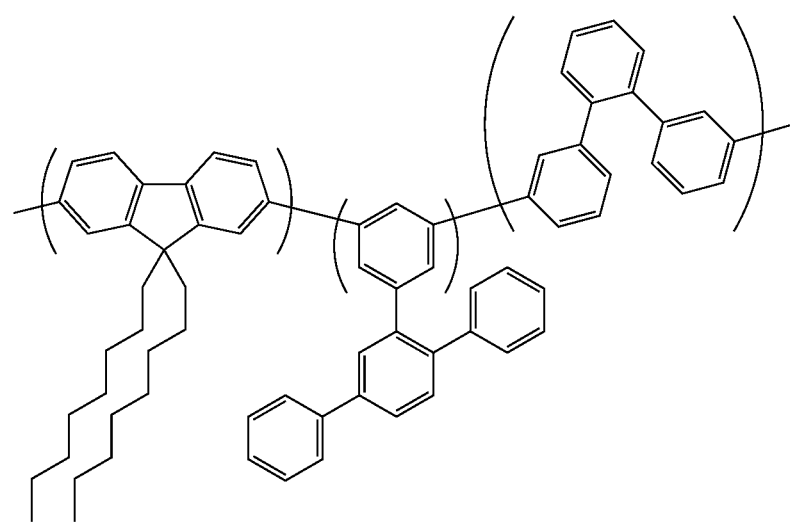

-continued
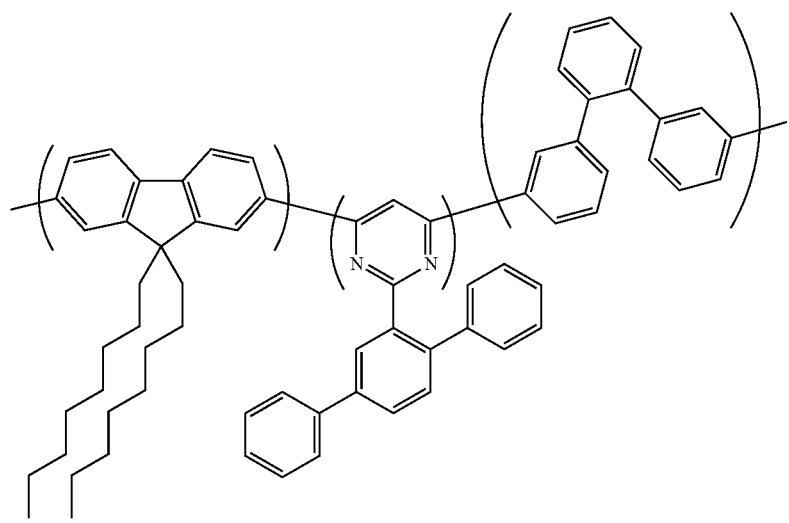
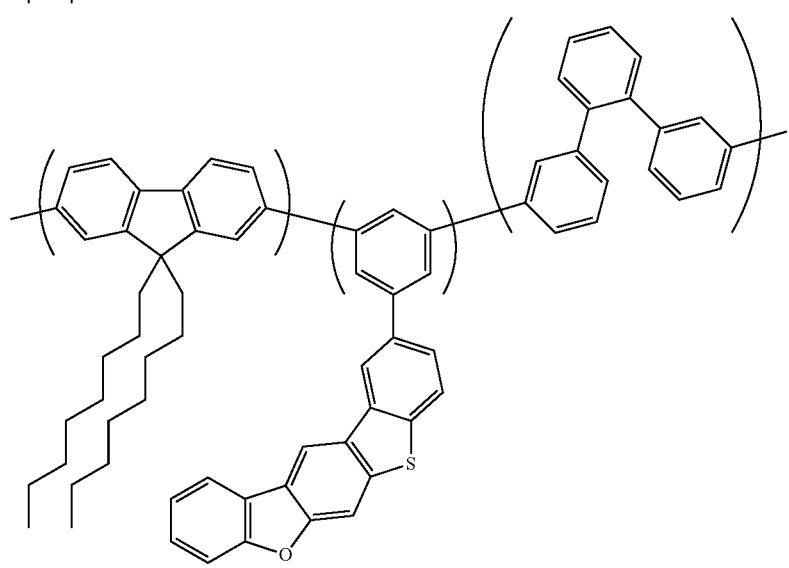
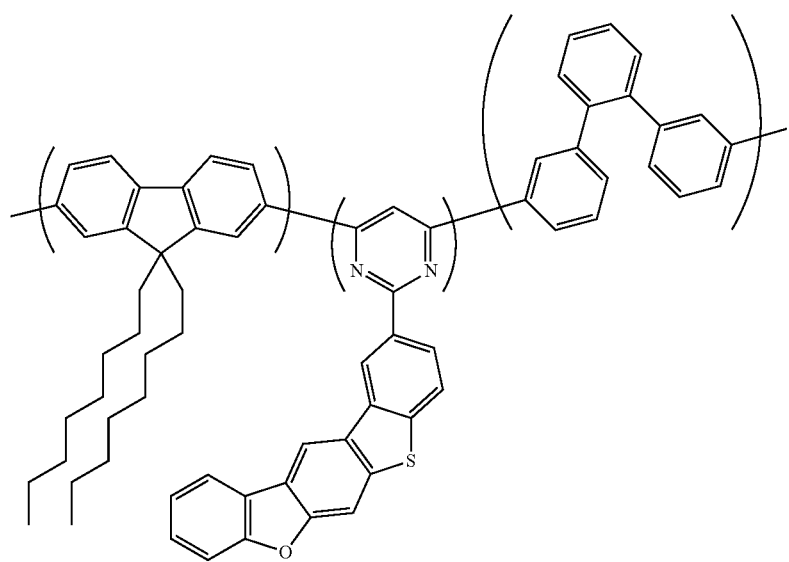

-continued
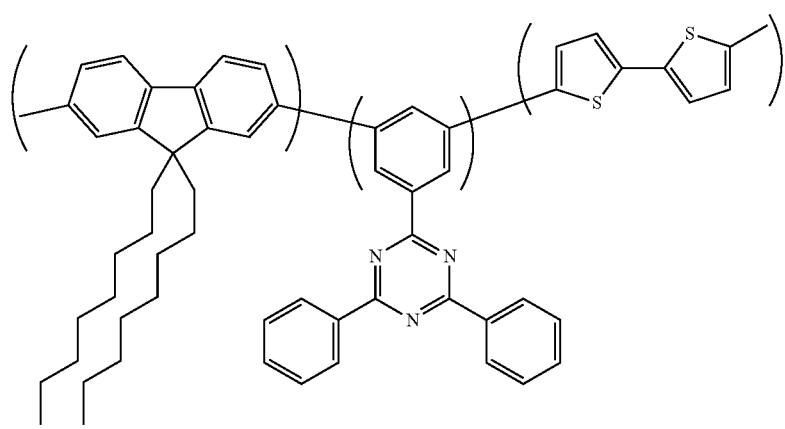
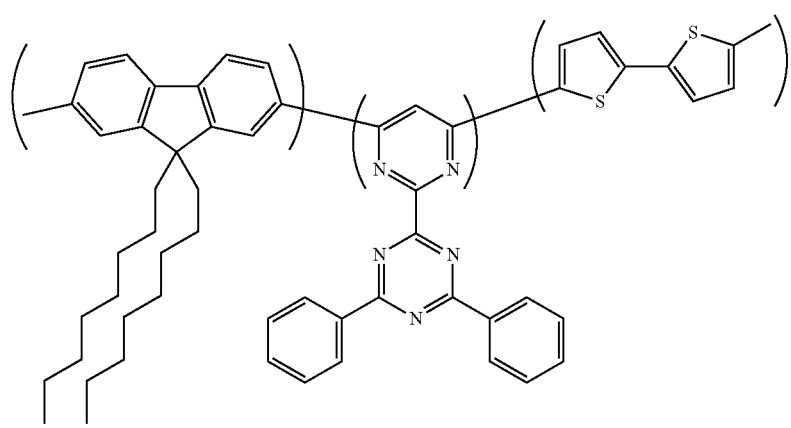
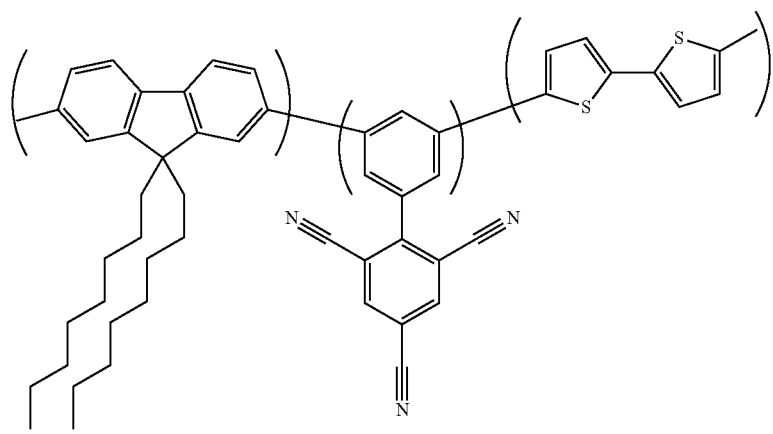
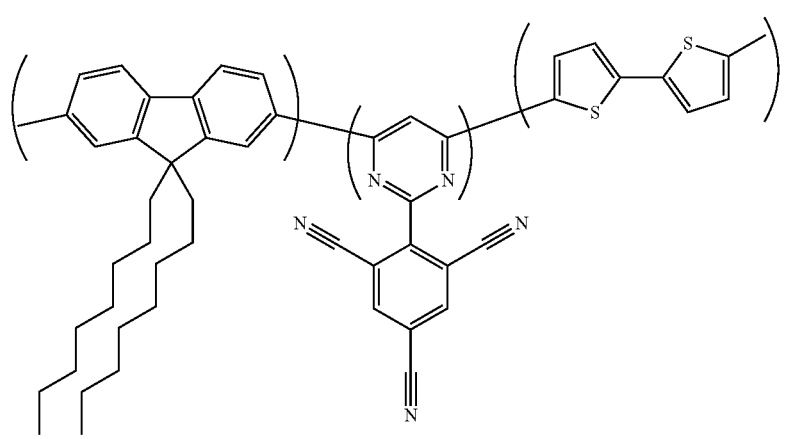

-continued
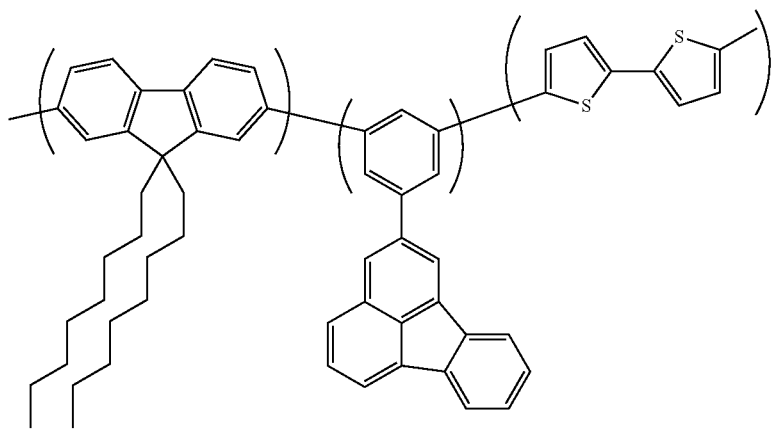
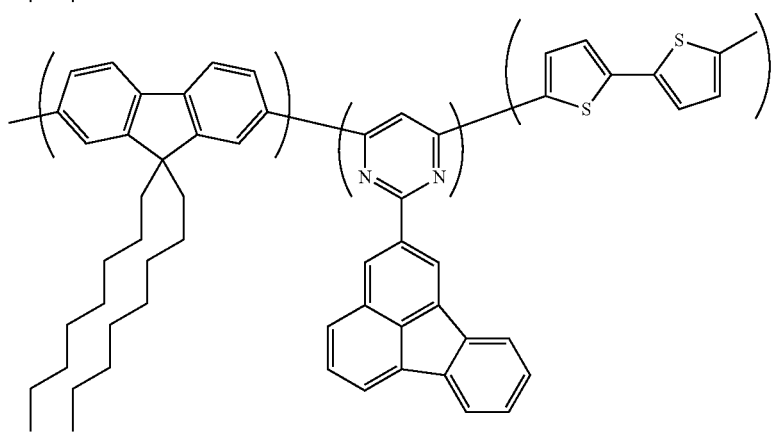
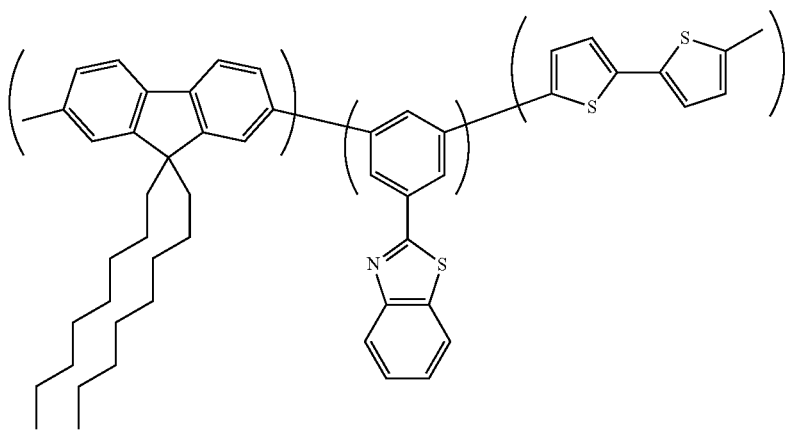
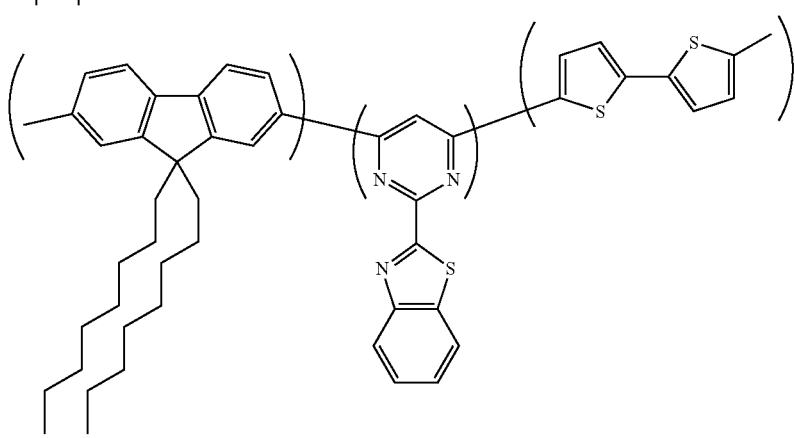

-continued
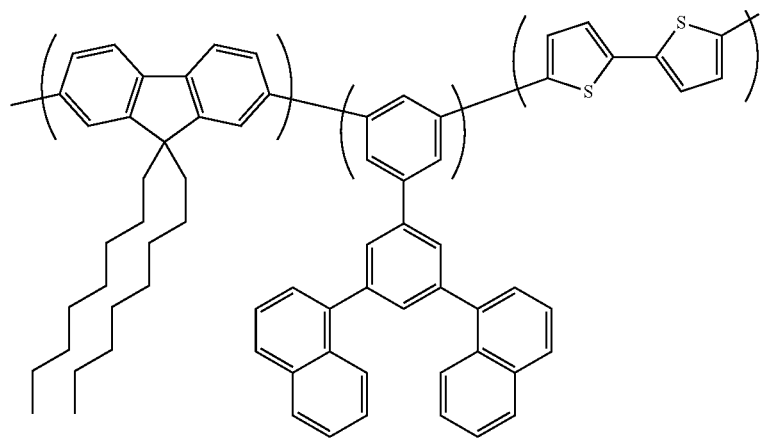
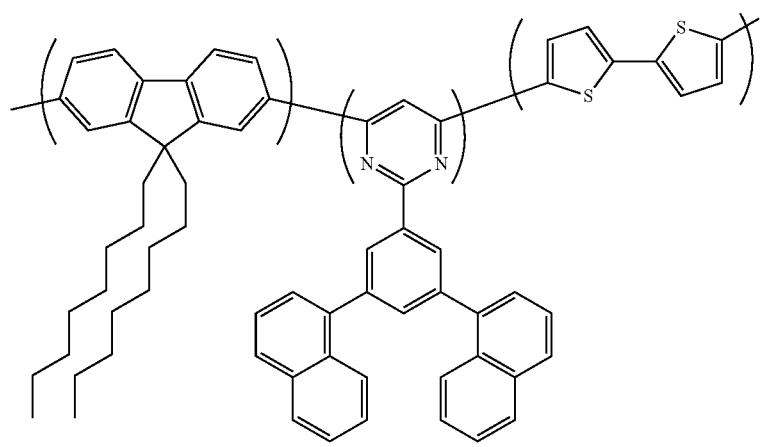
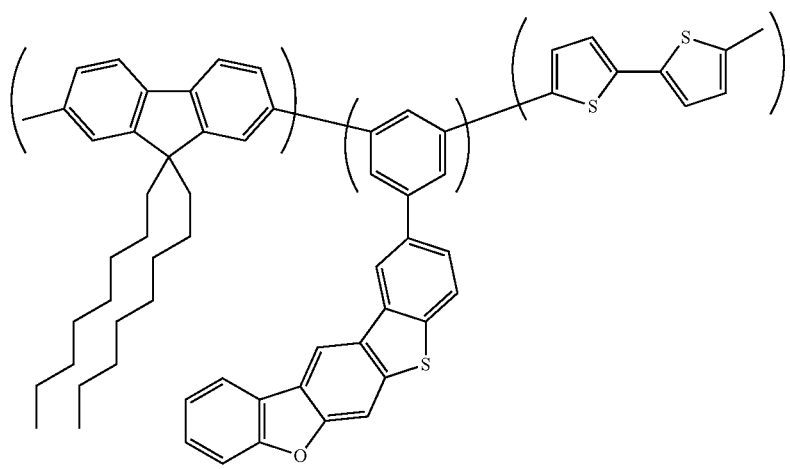

-continued
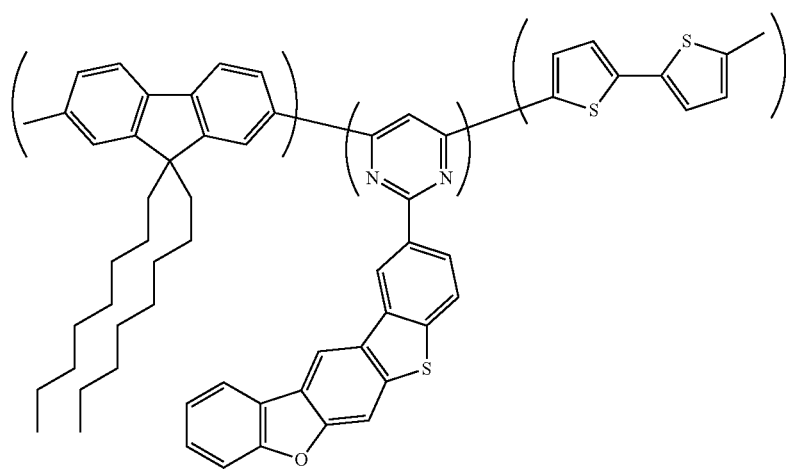
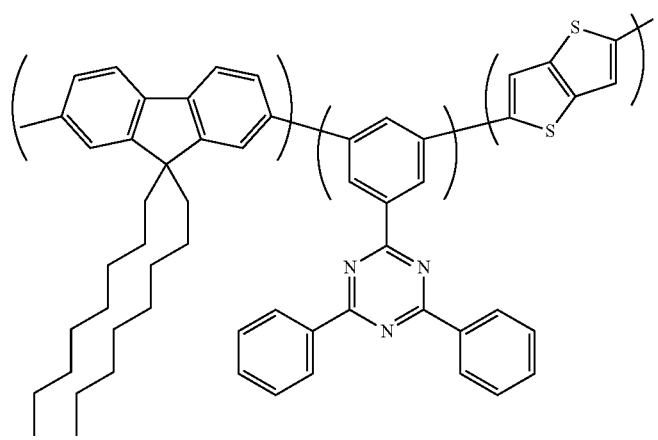
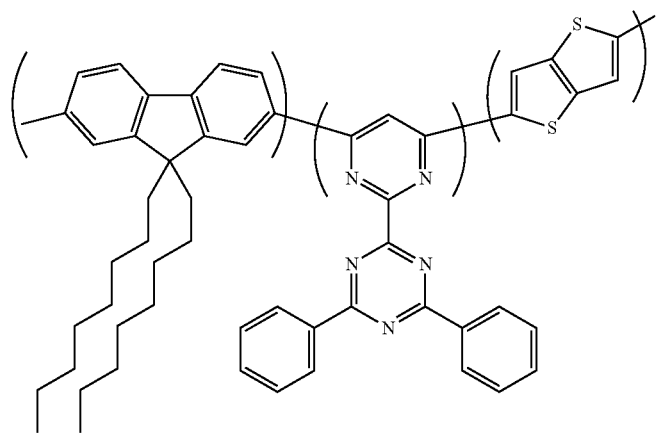

-continued
| 295 | 296 |
|---|---|
| 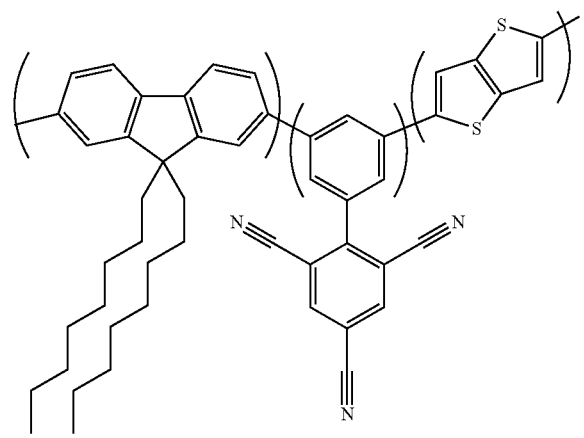 | 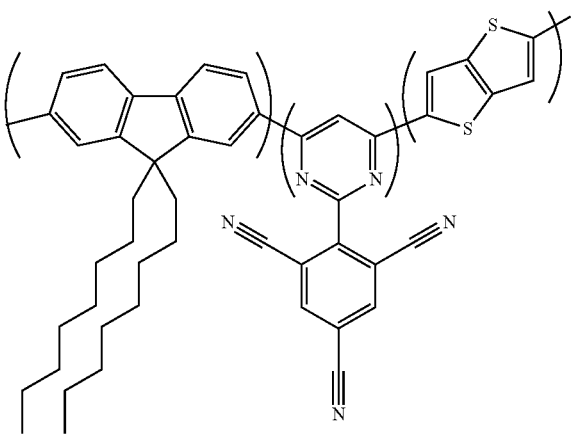 |
| 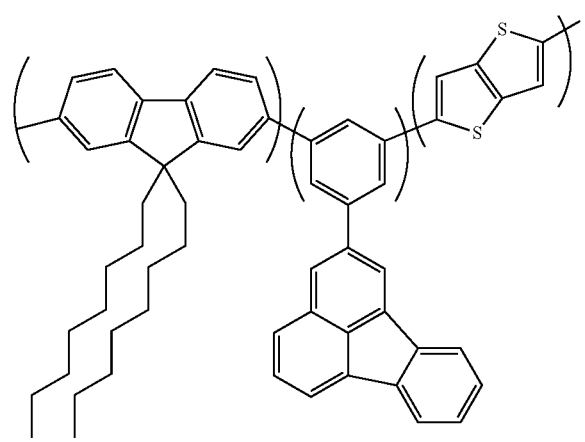 | 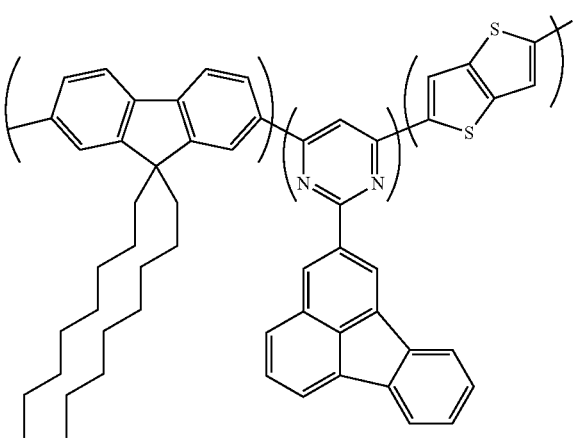 |
| 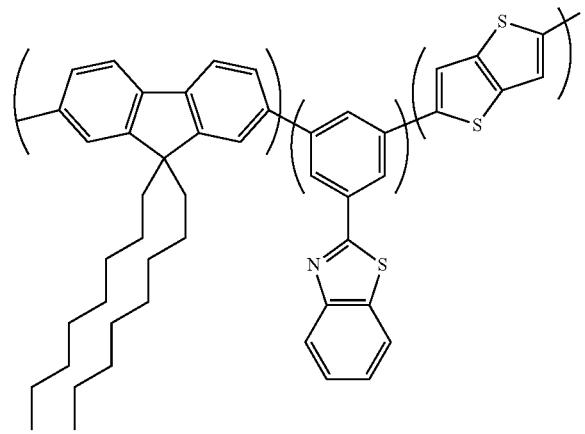 | 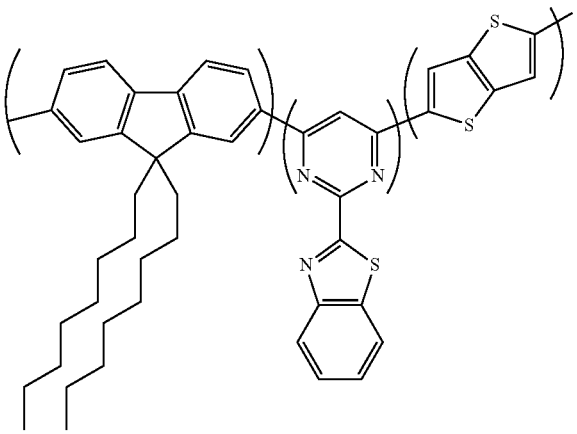 |

-continued
297
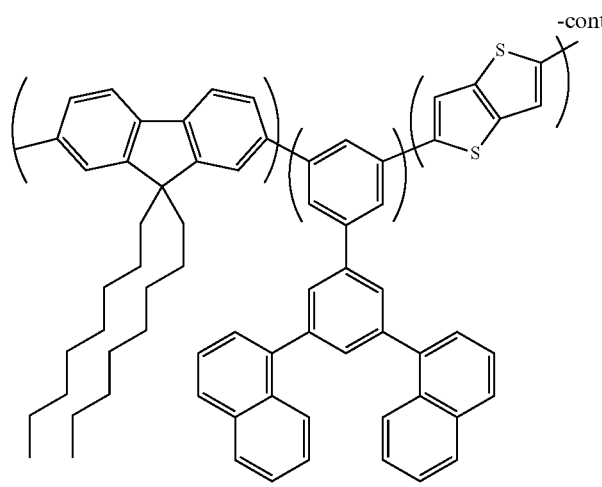
298
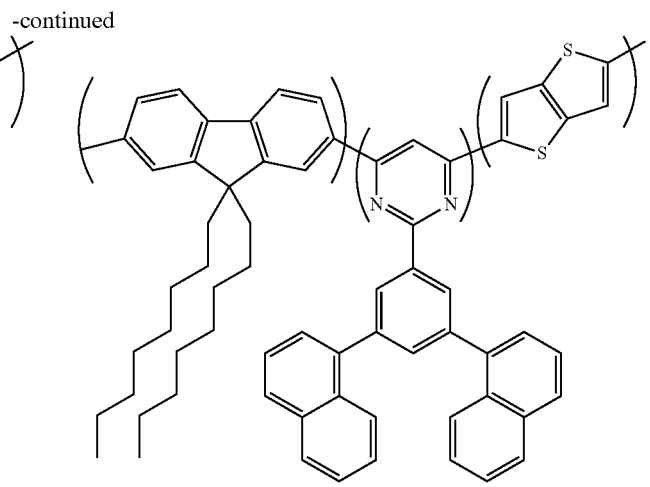
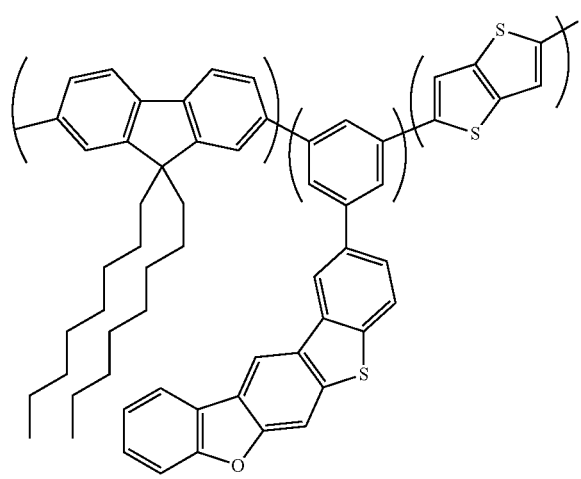
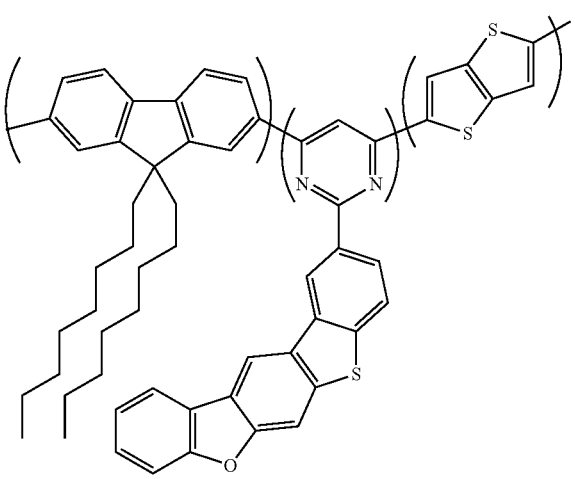
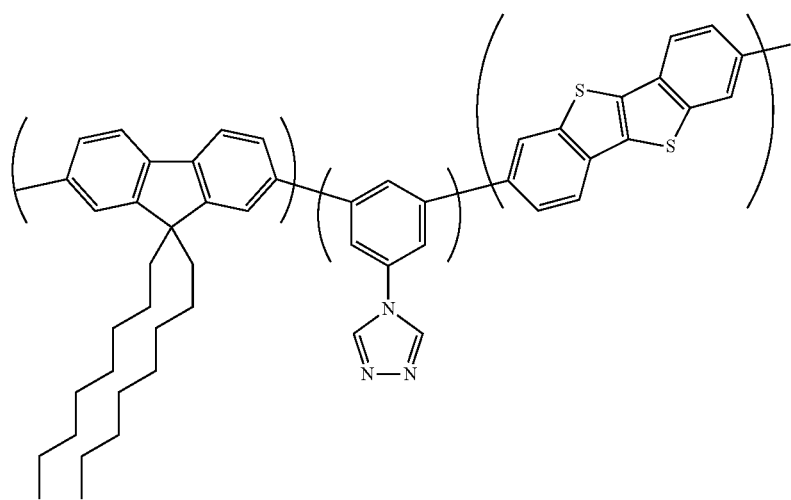

-continued
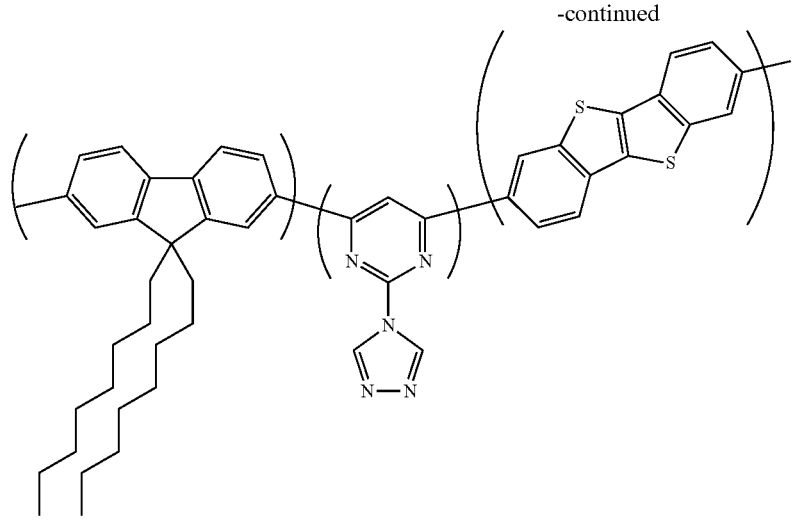
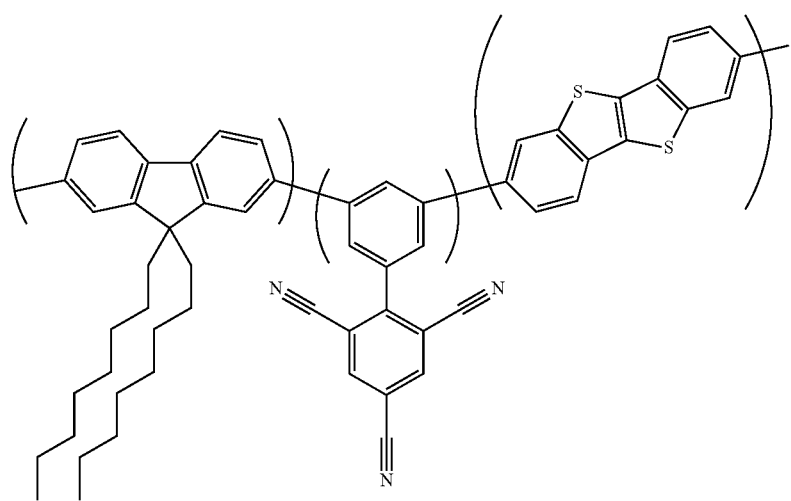
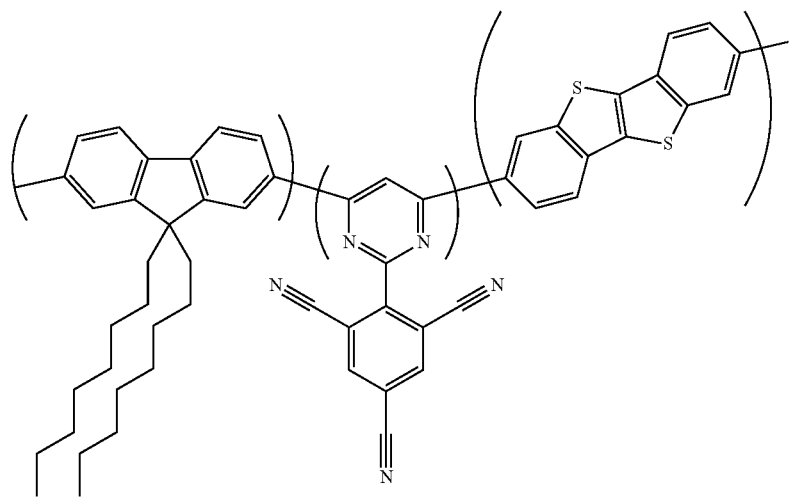

-continued
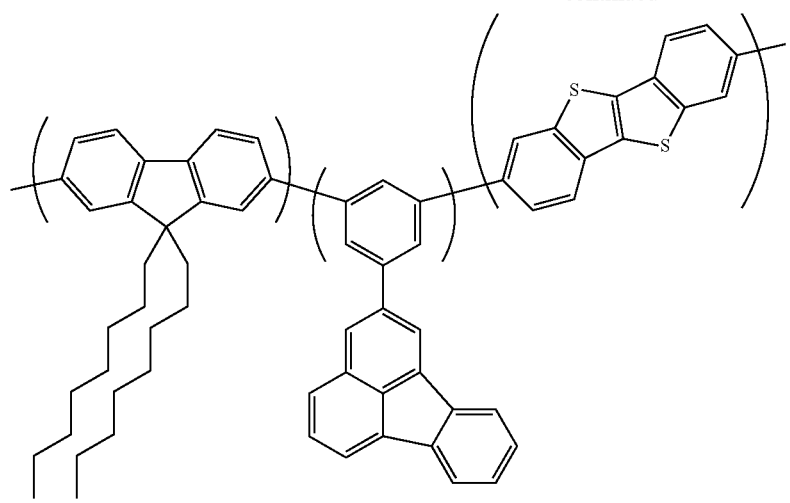
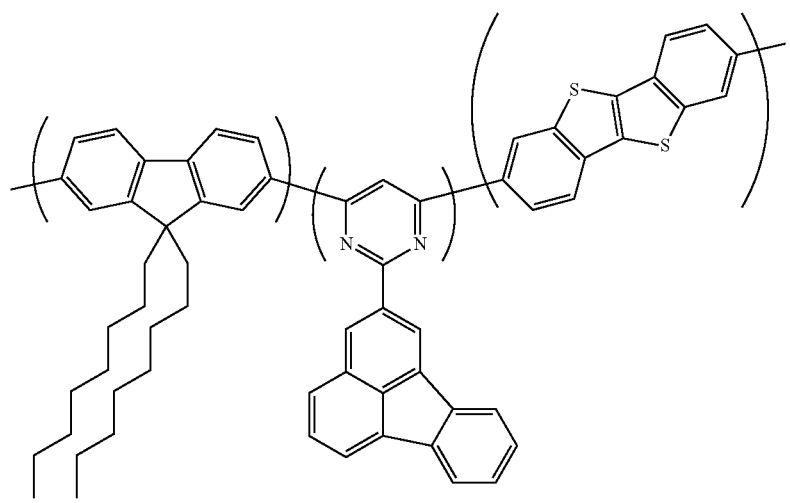
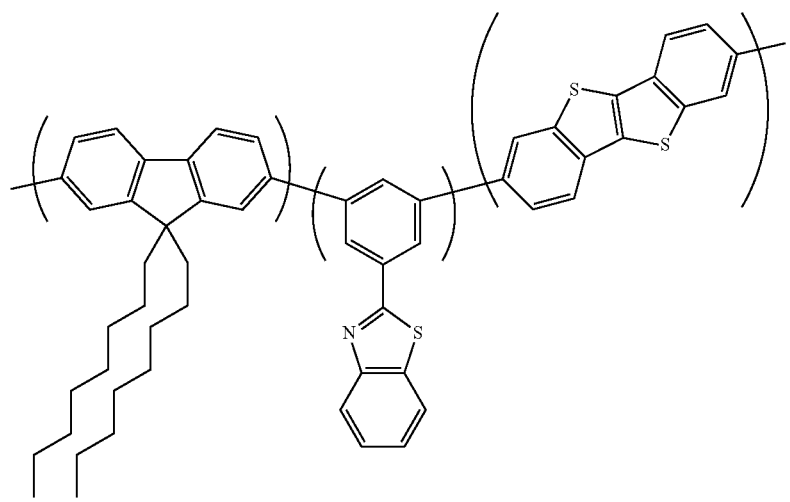

-continued
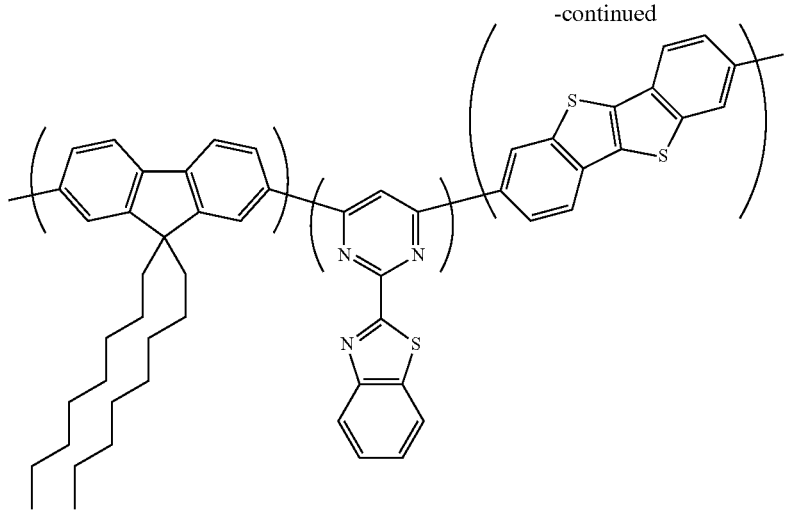
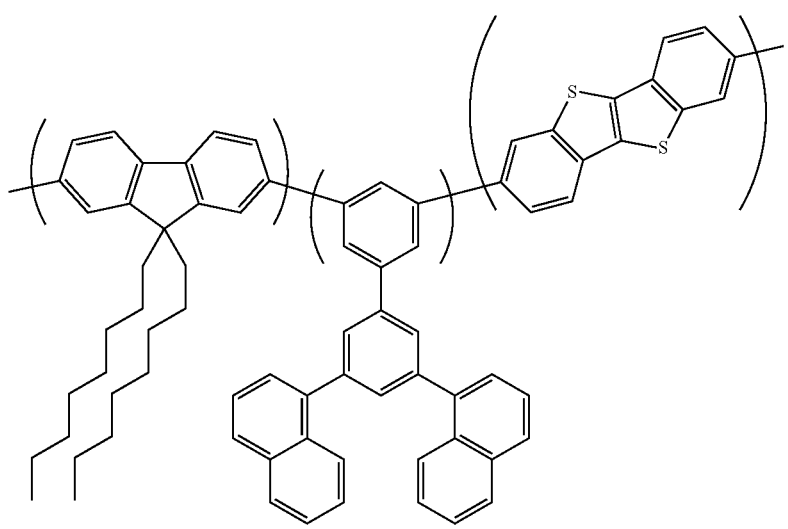
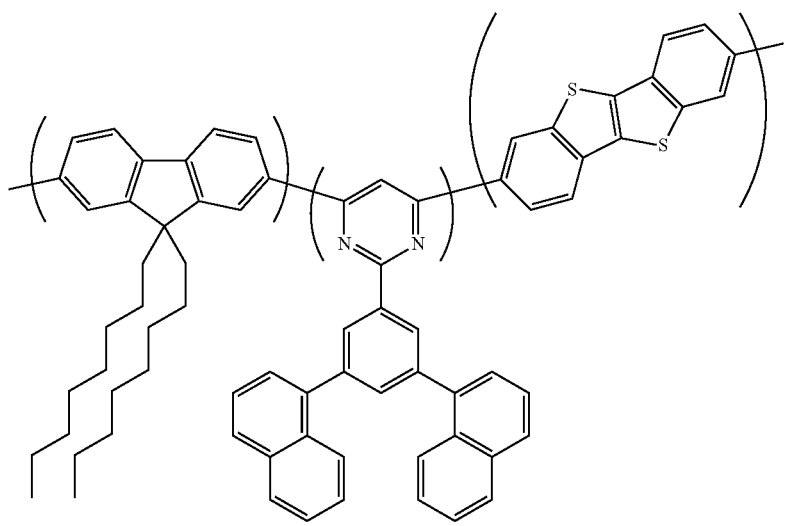

-continued
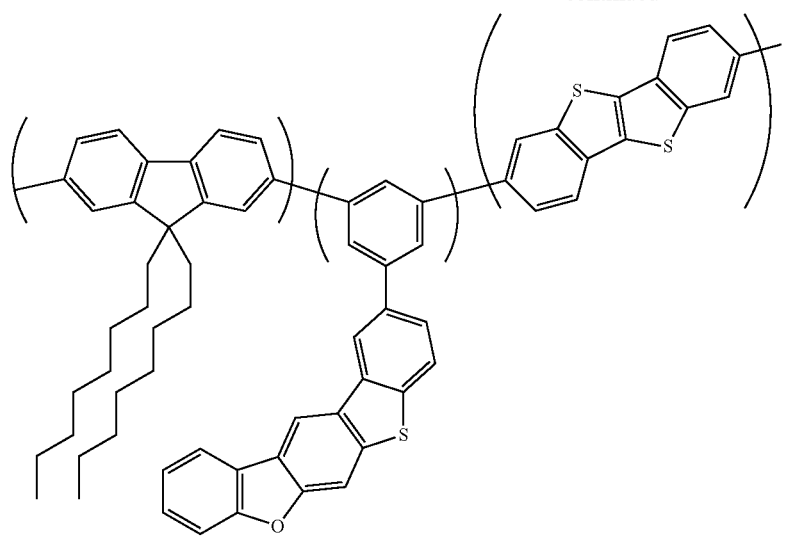
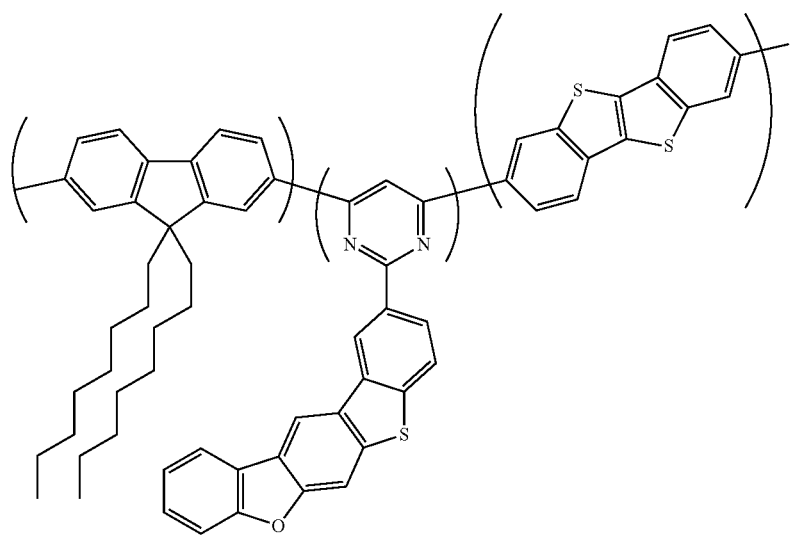
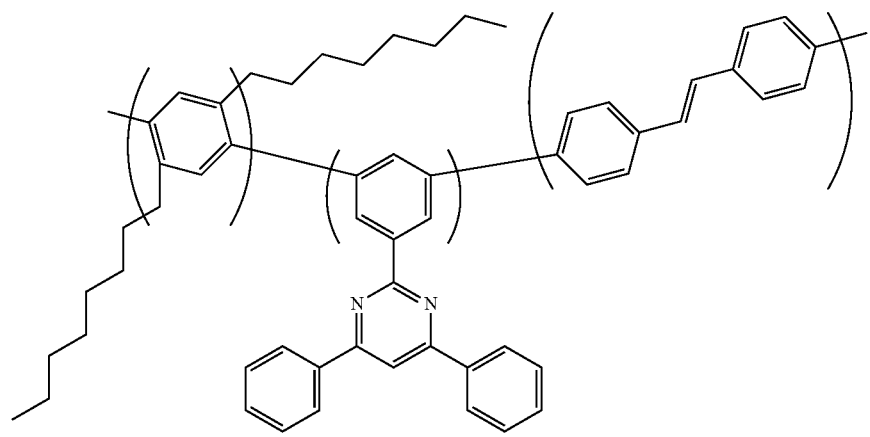

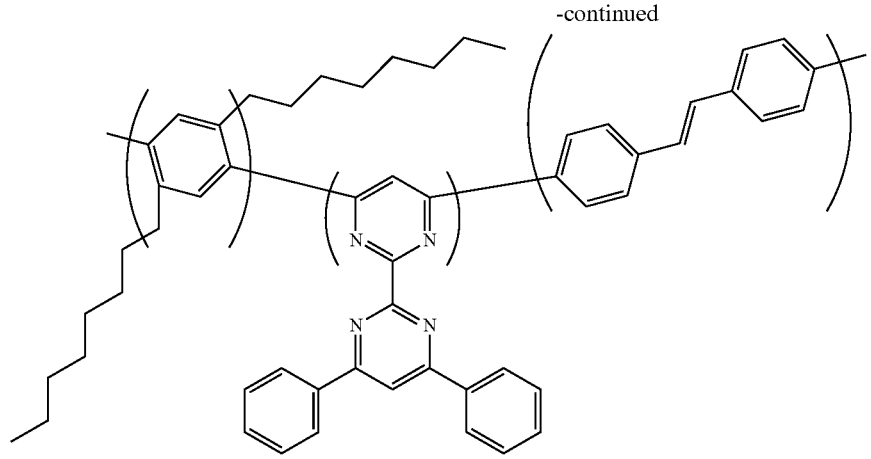
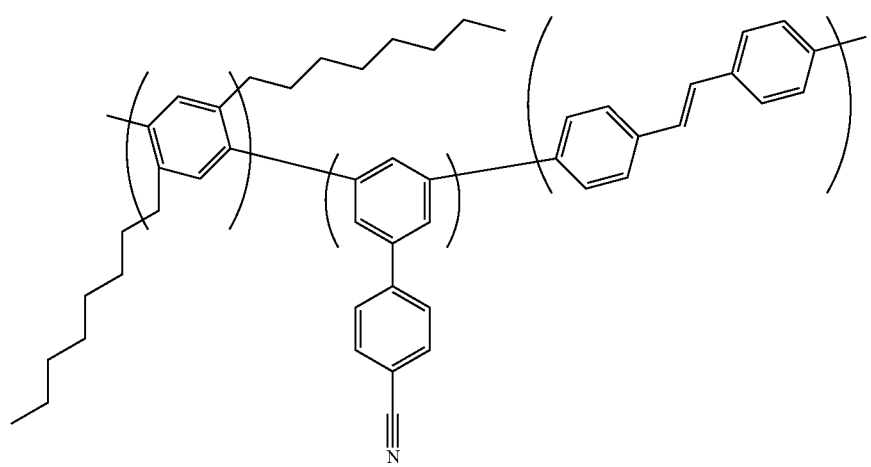
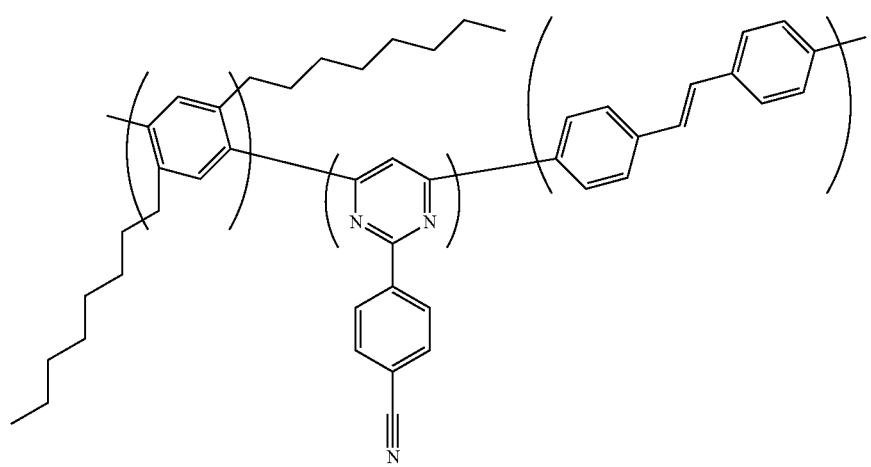

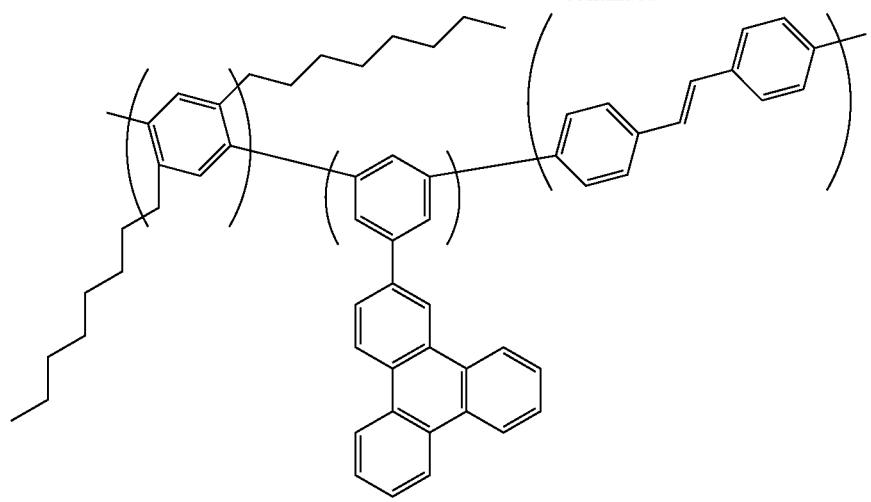
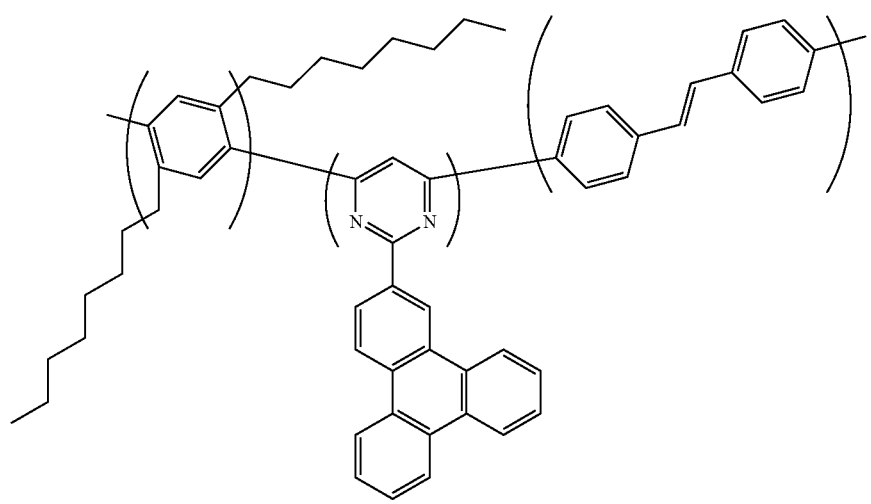
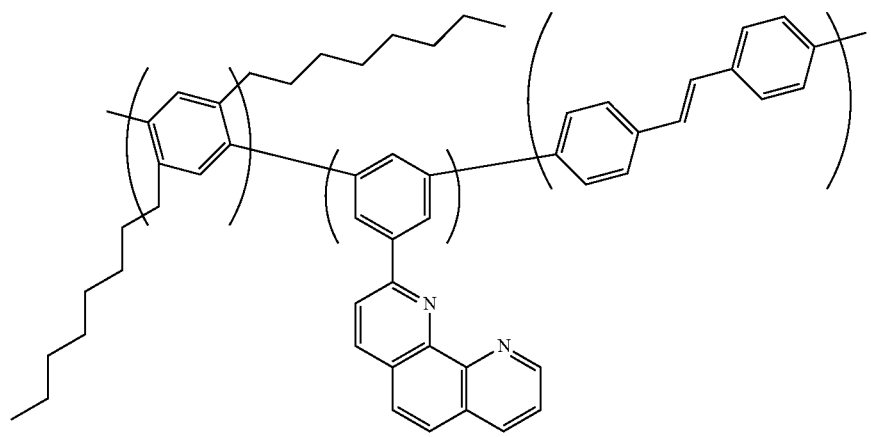

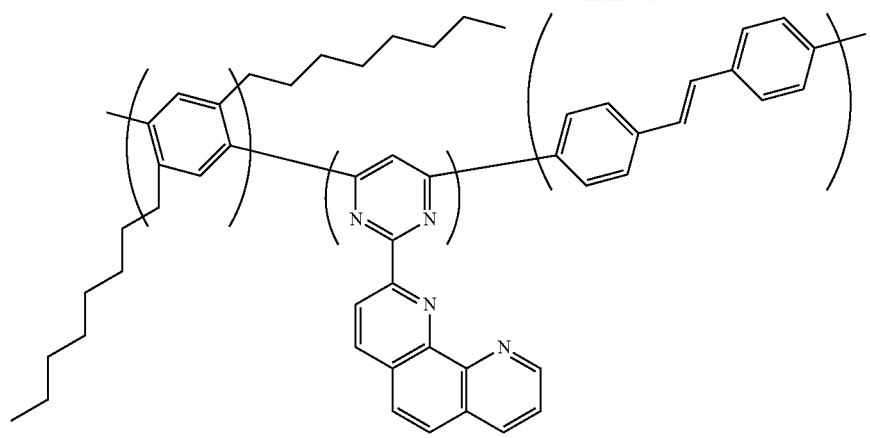
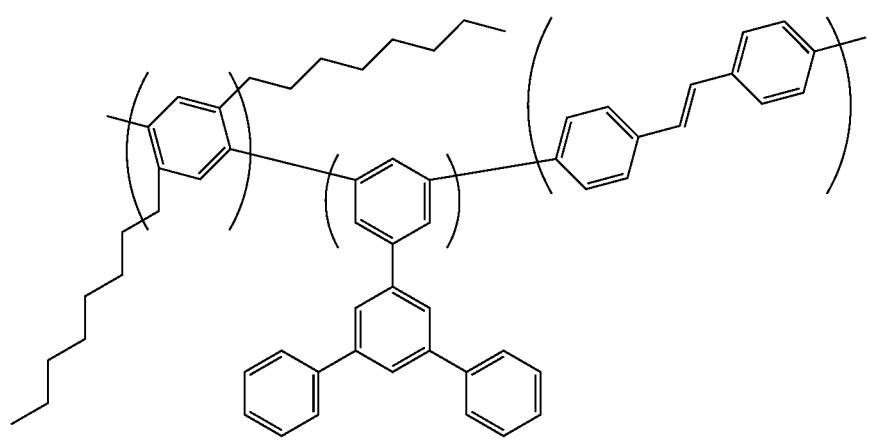
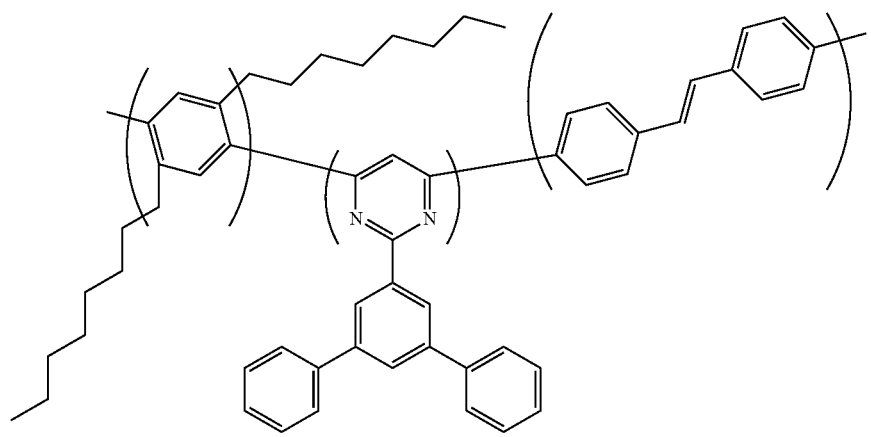

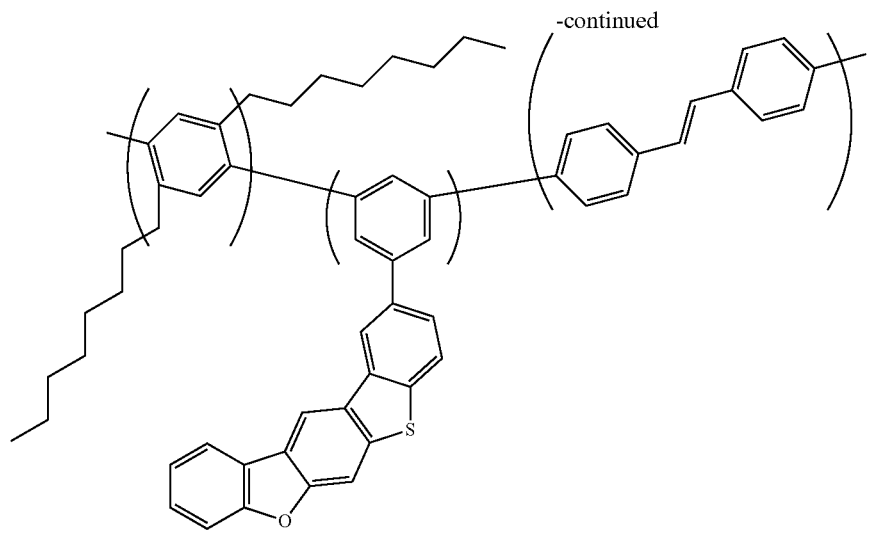
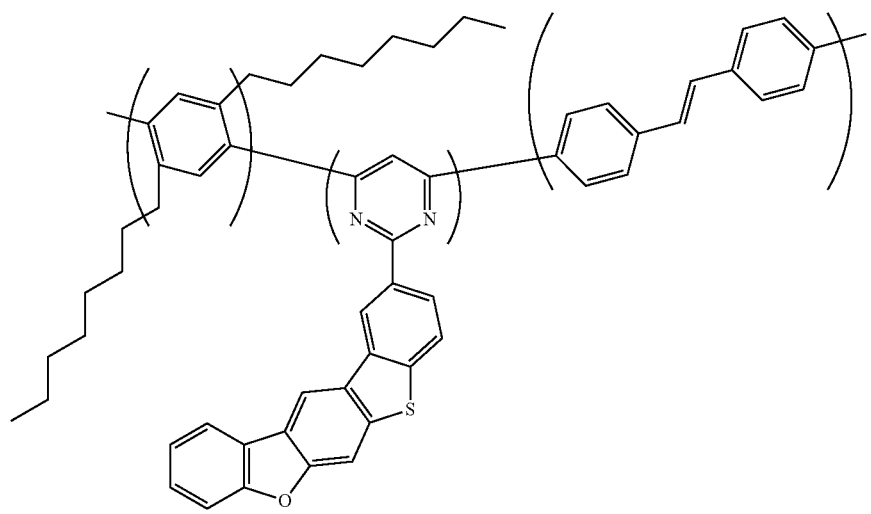
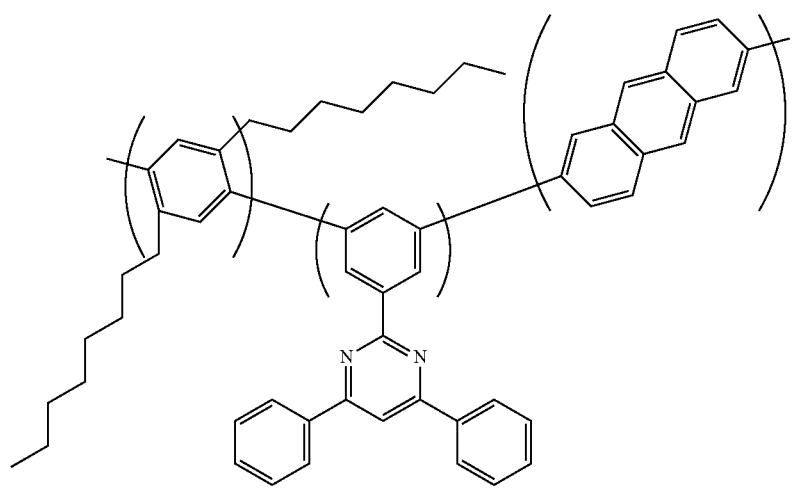

-continued
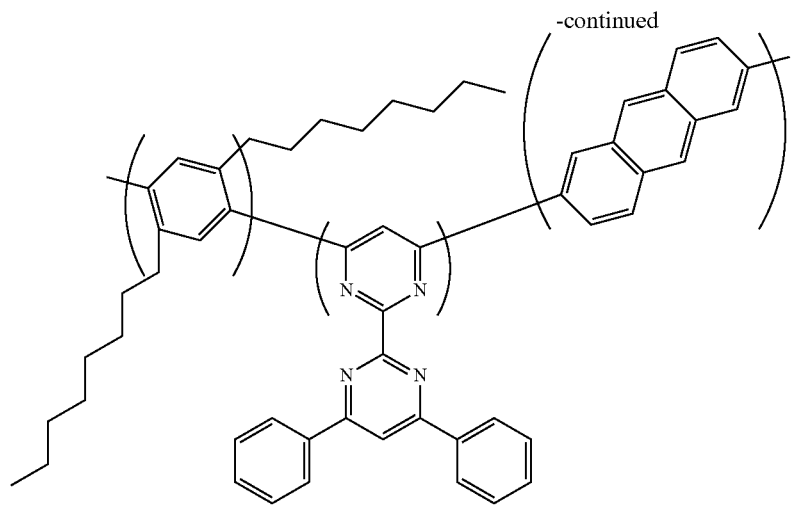
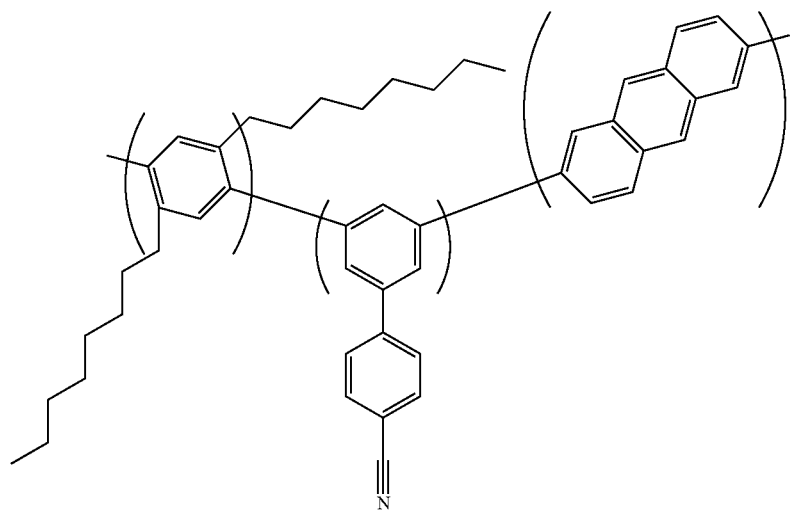
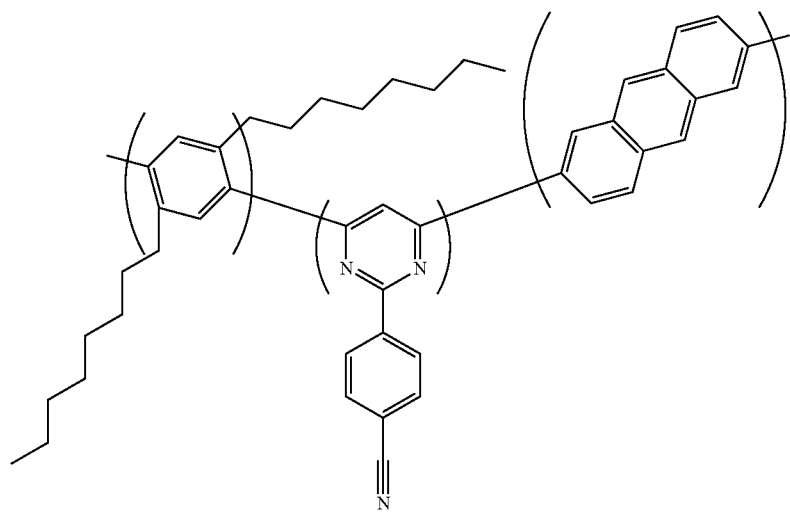

-continued
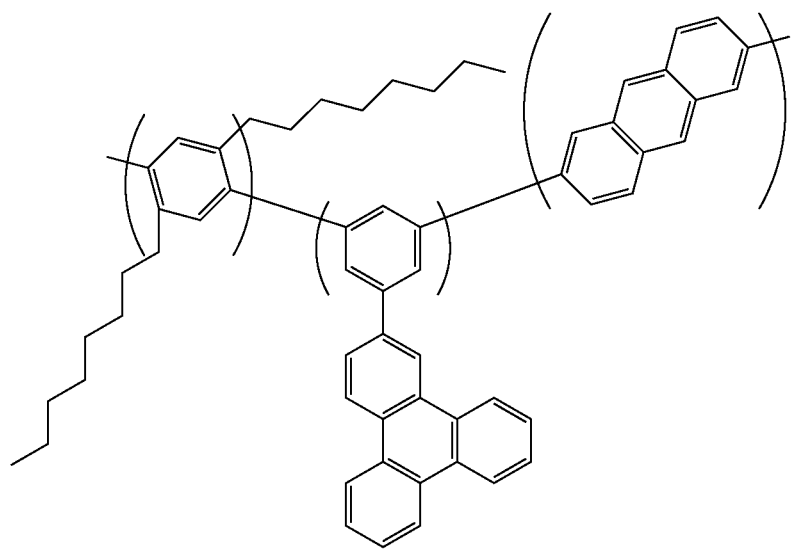
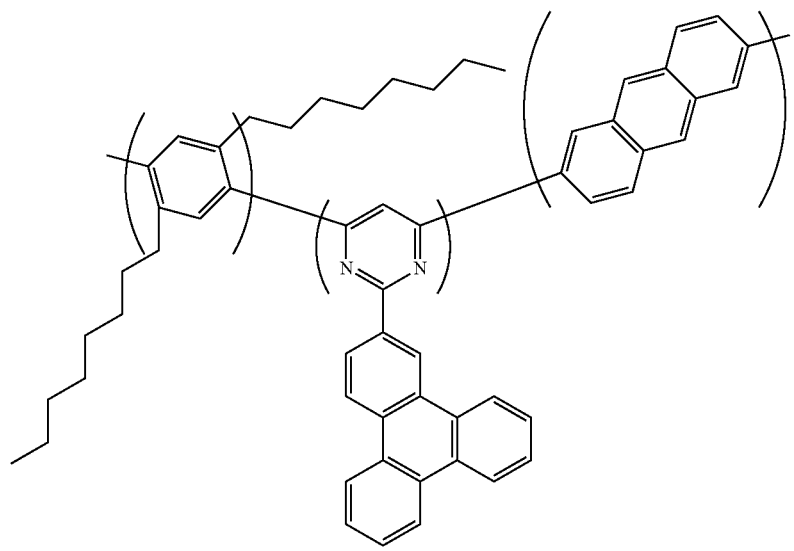
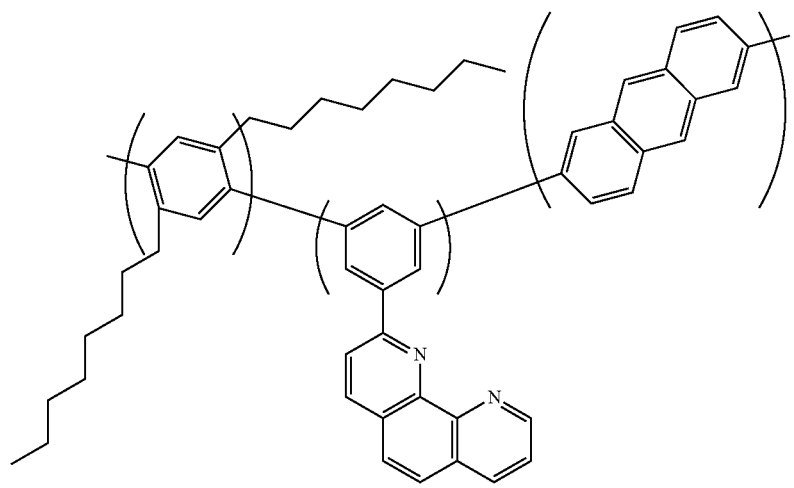

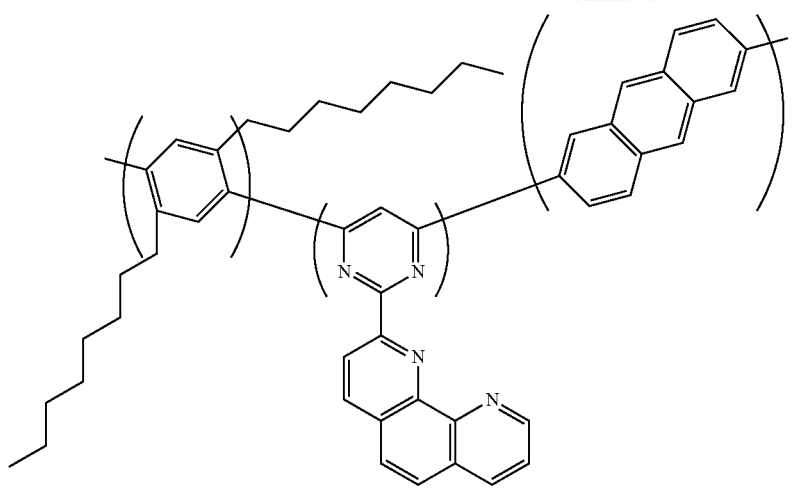
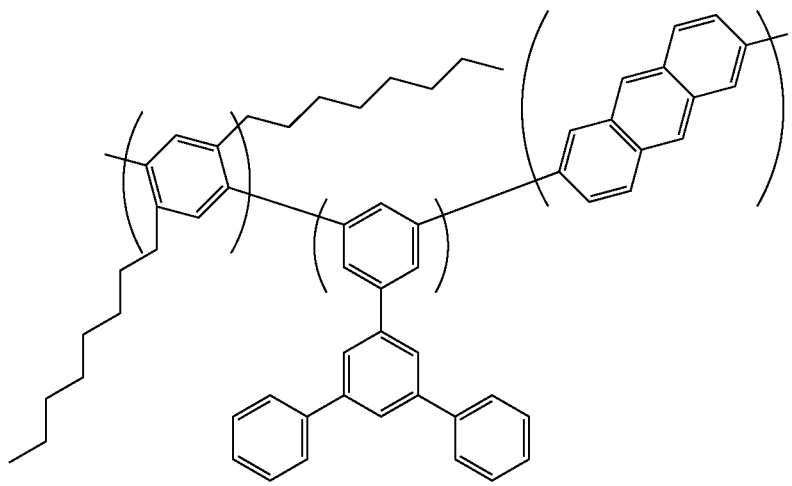
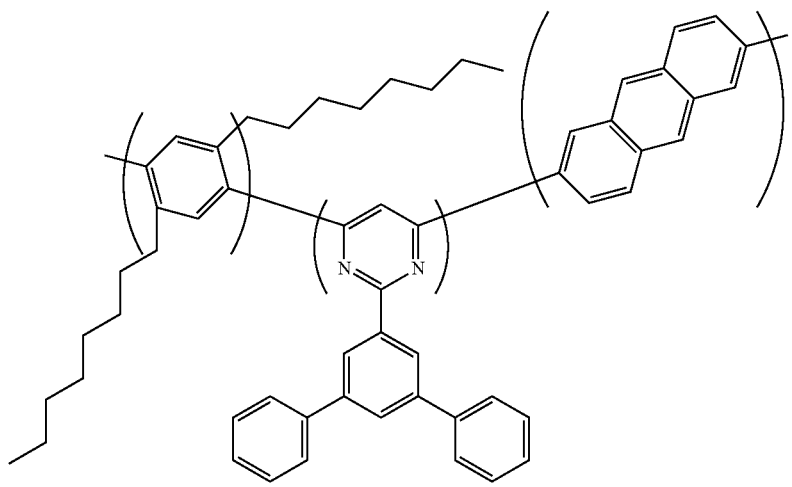

-continued
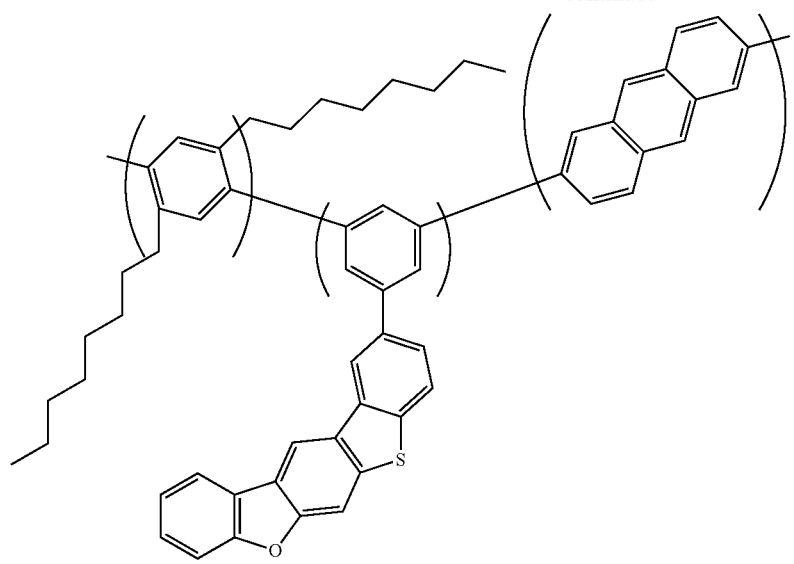
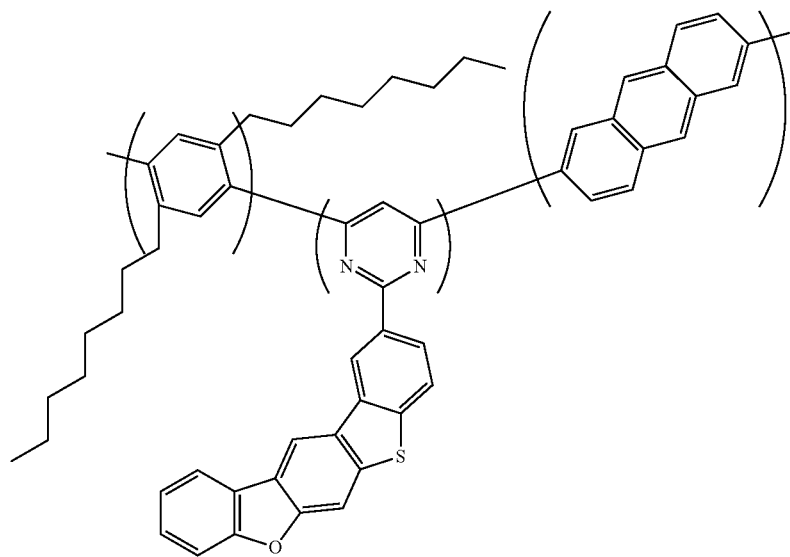
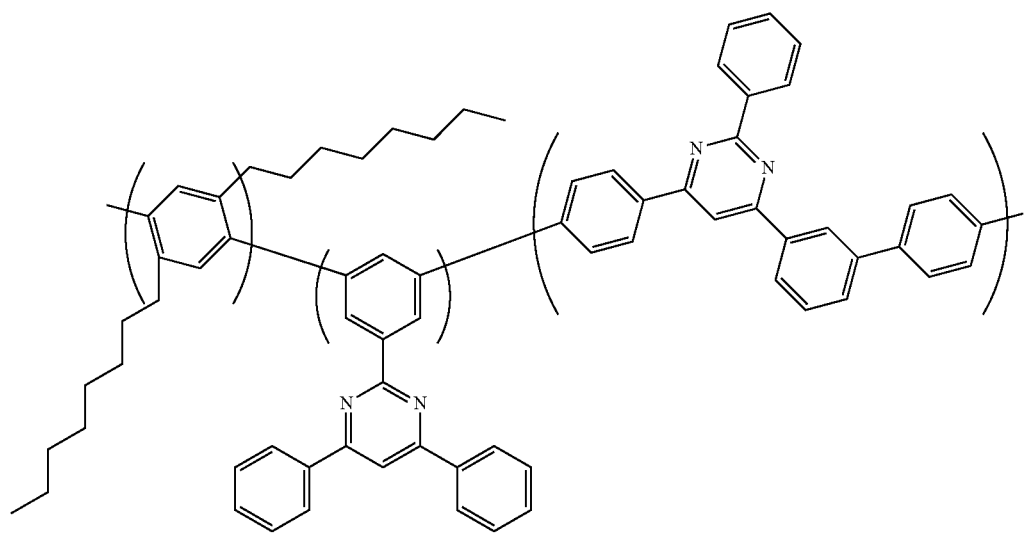

-continued
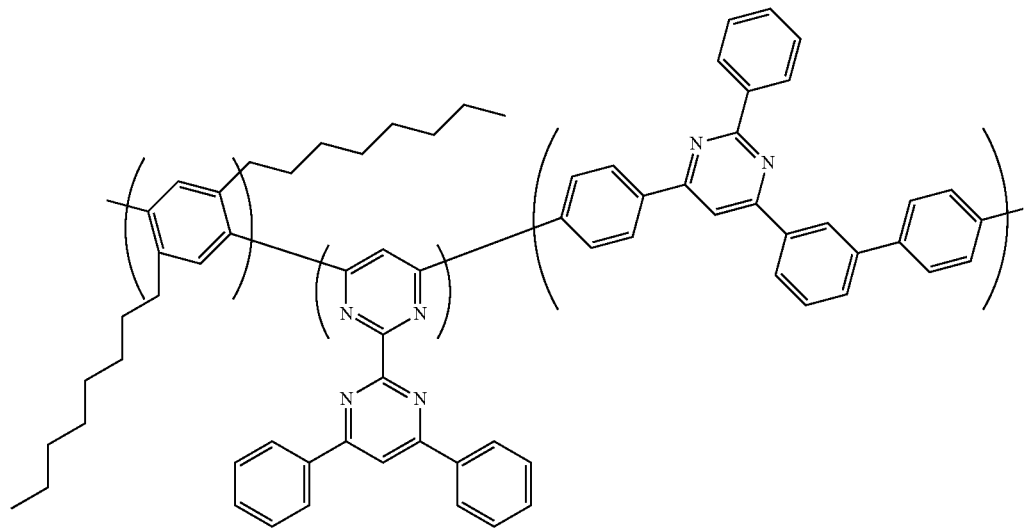
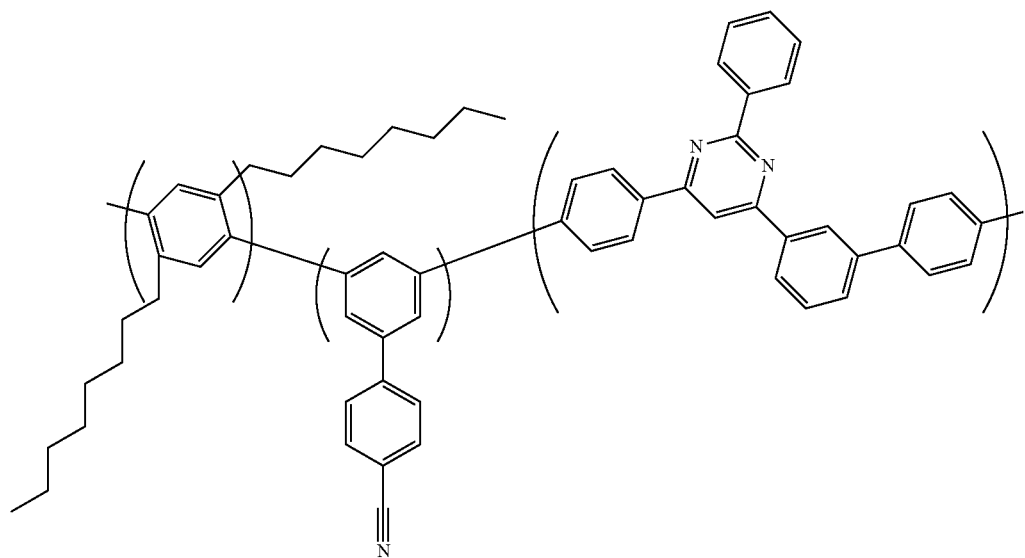
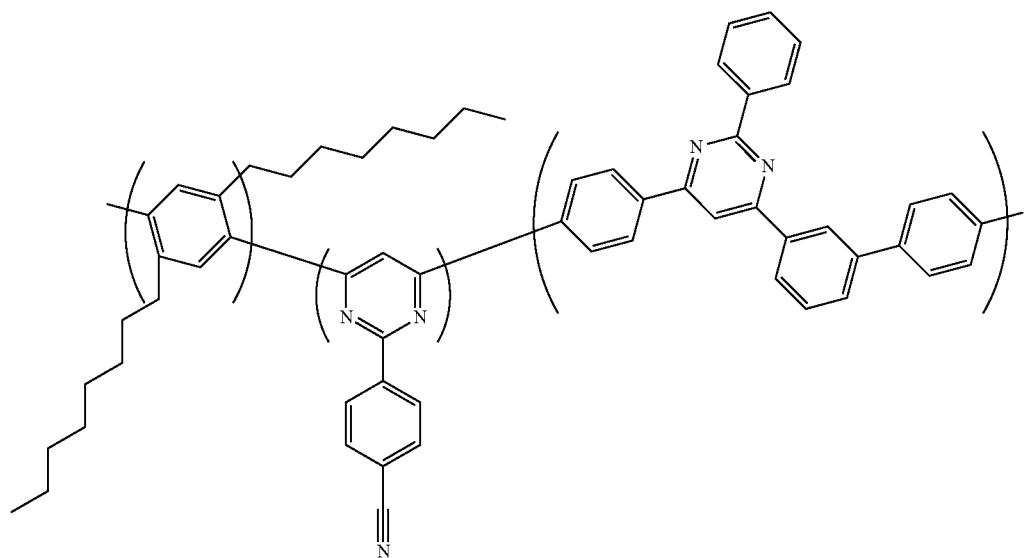

-continued
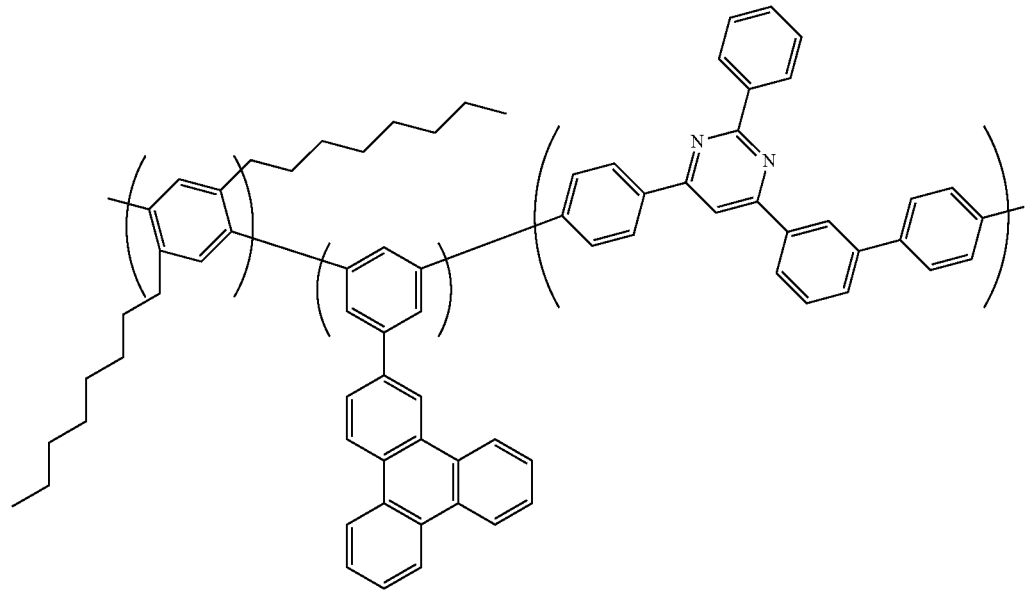
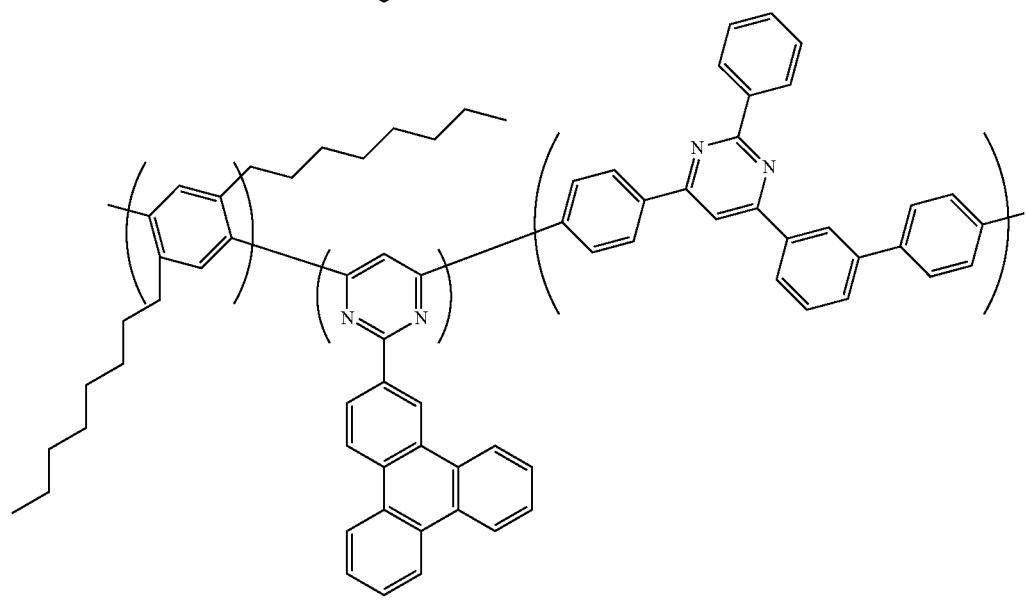
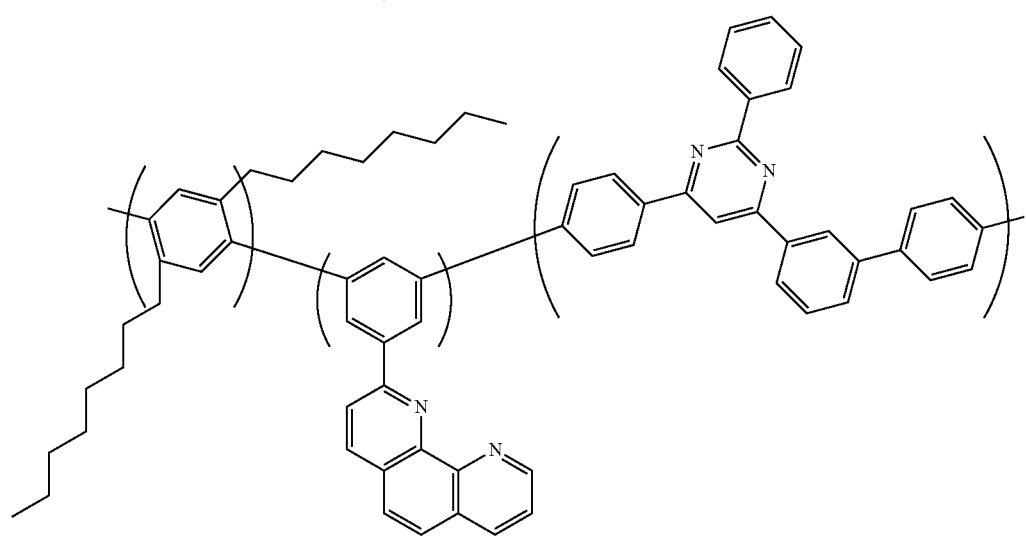

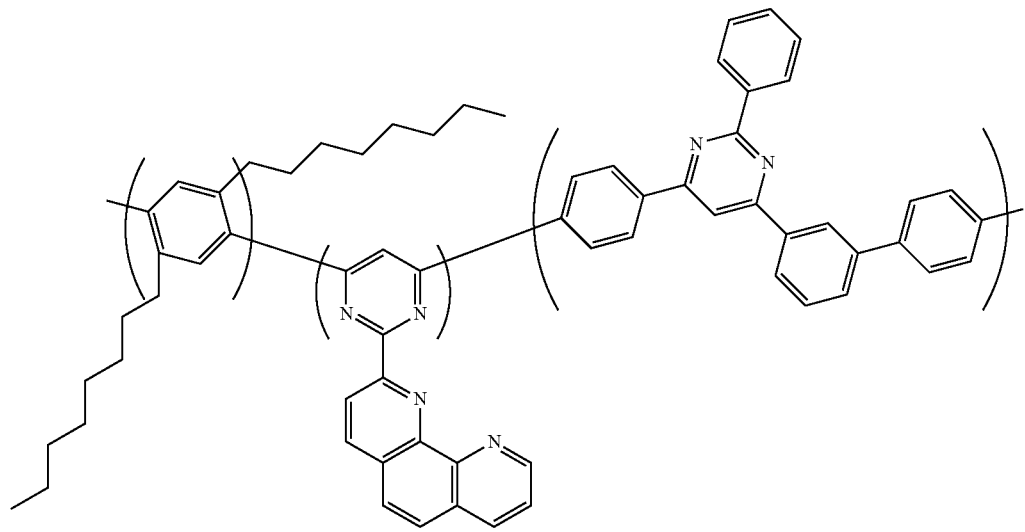
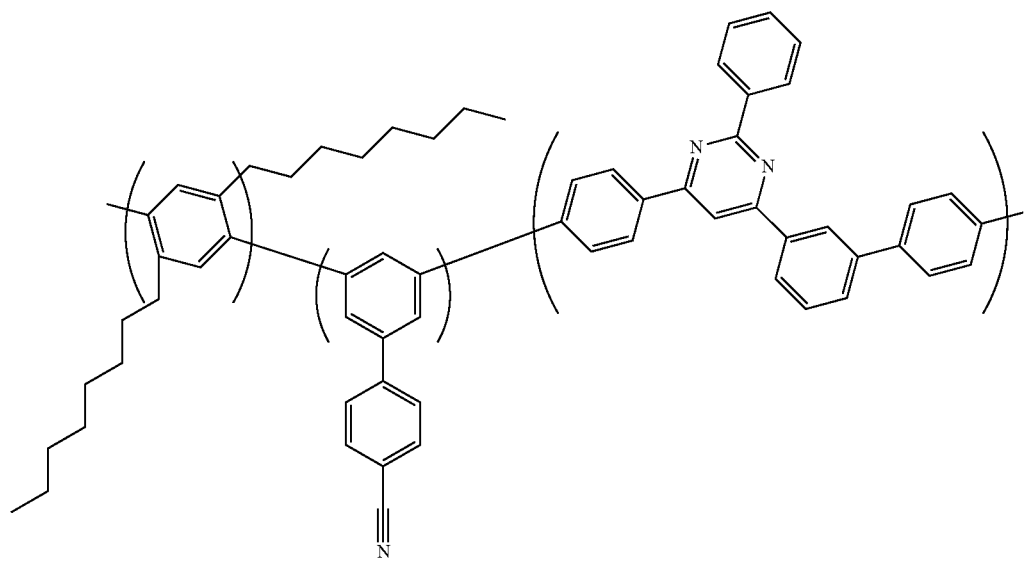
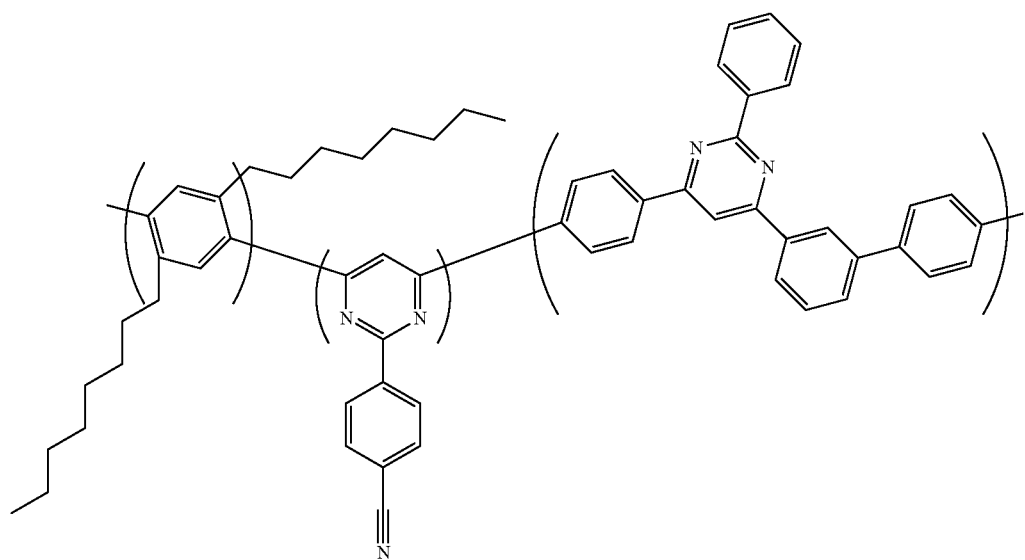

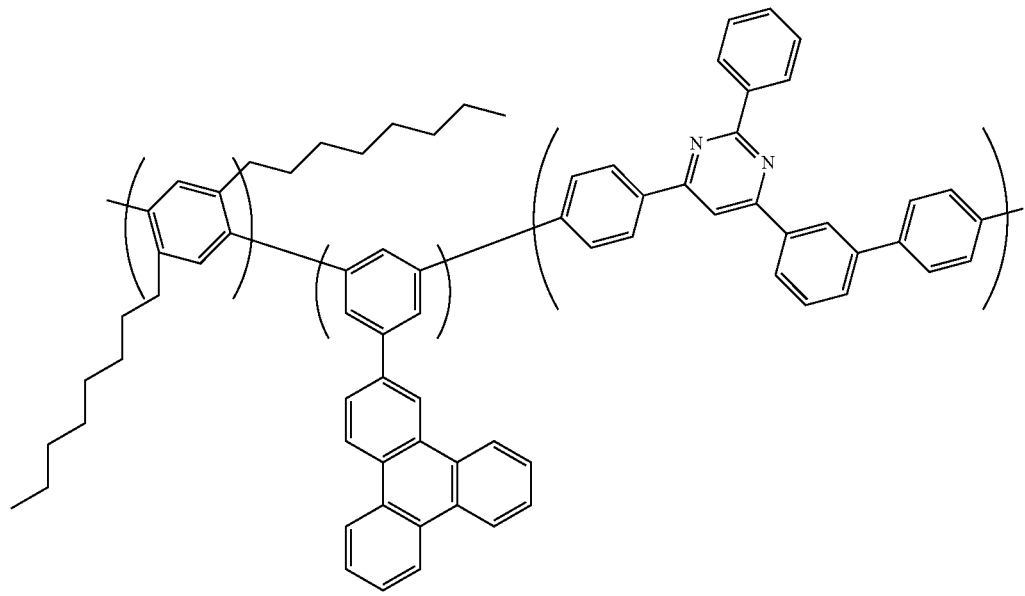
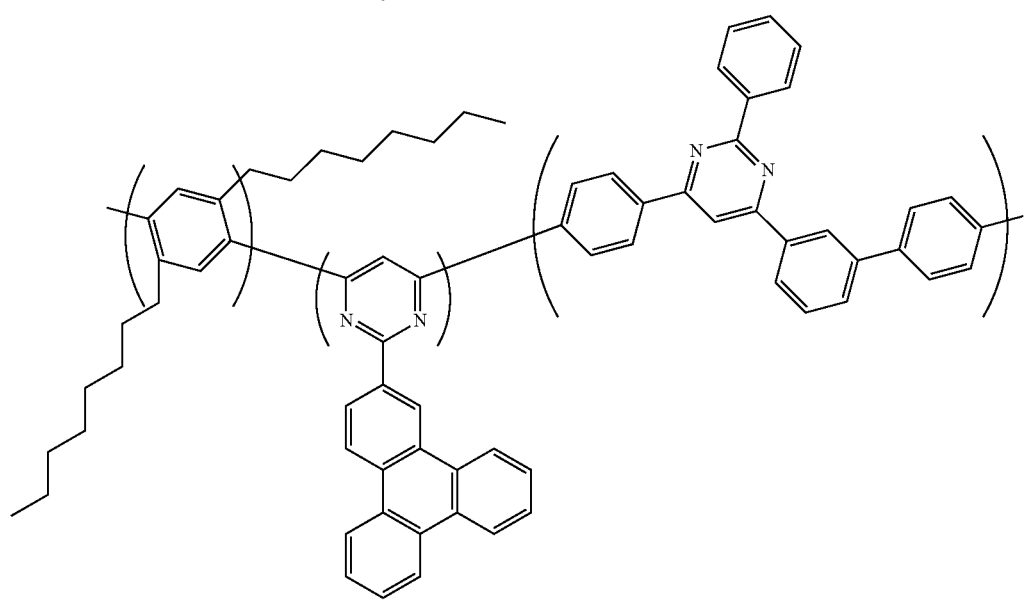
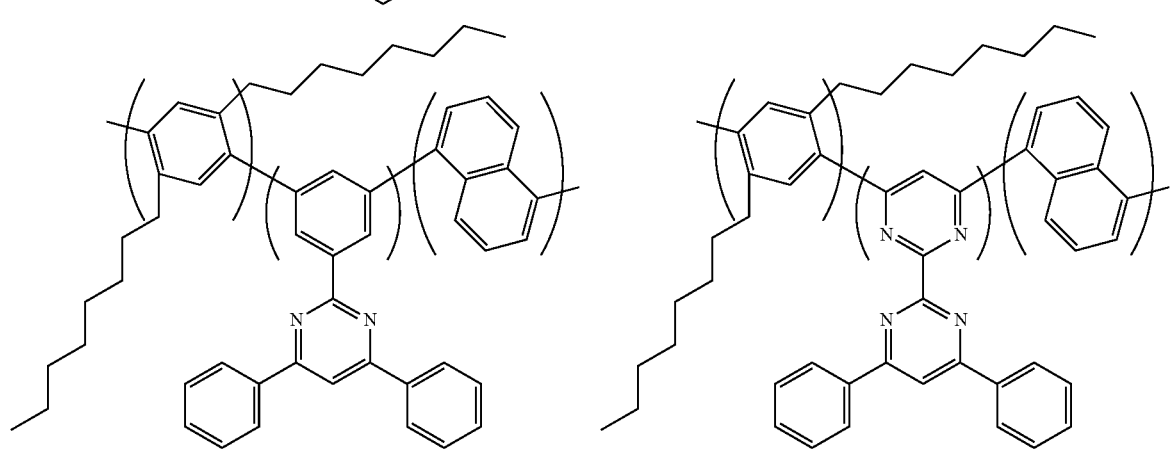

331 332
-continued
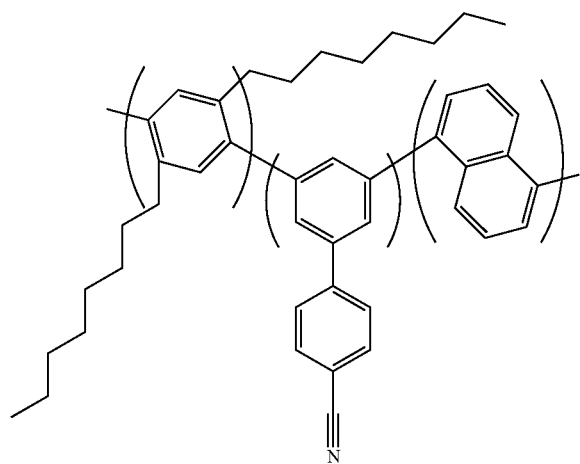
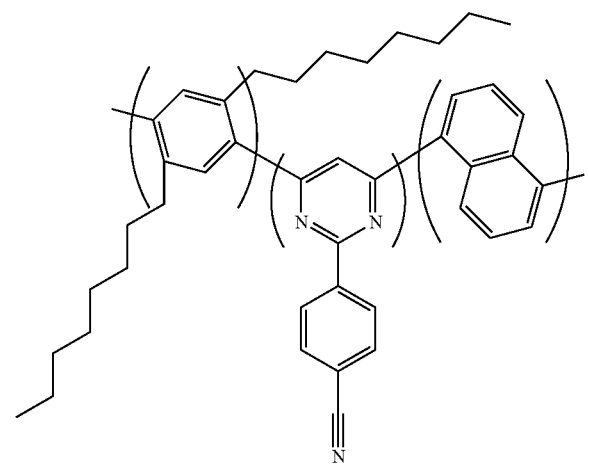
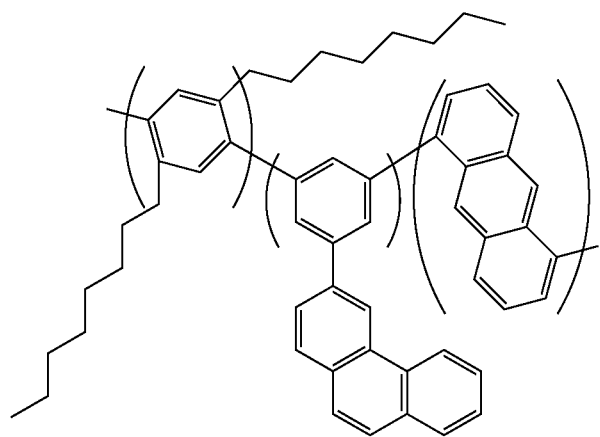
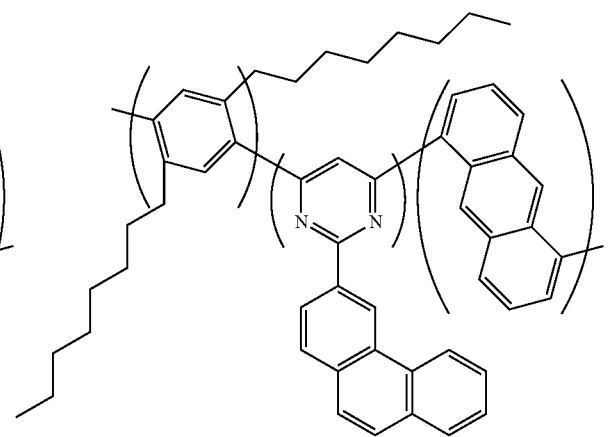
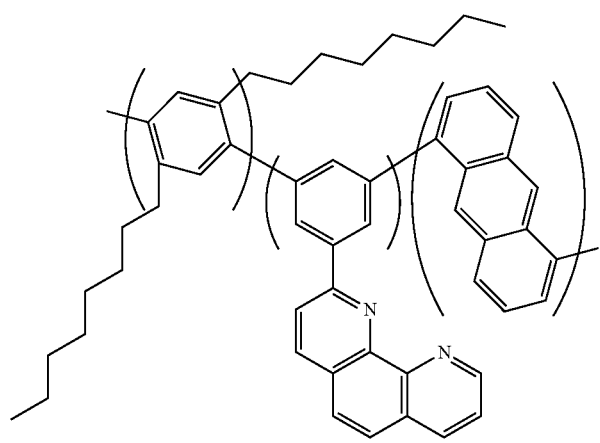
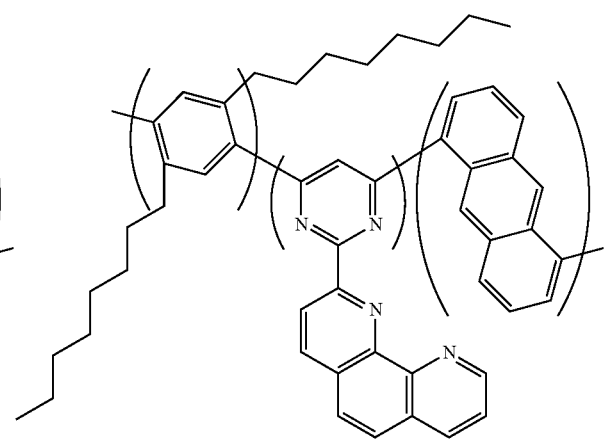

333
334
-continued
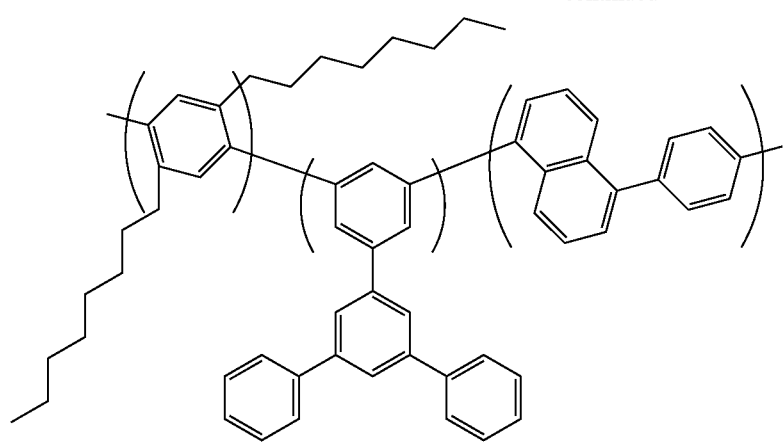
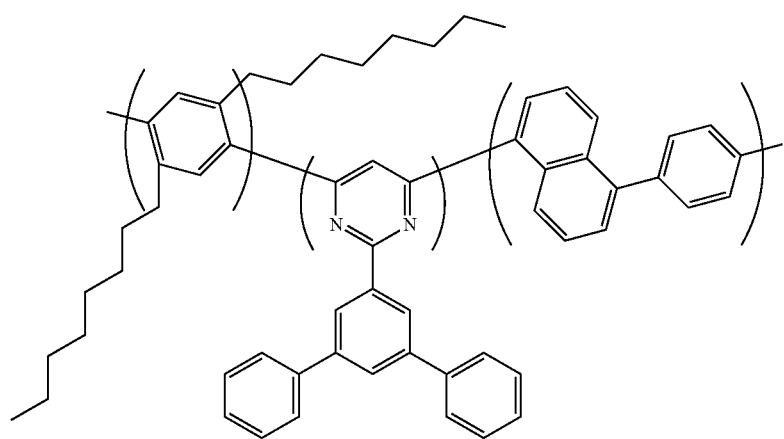
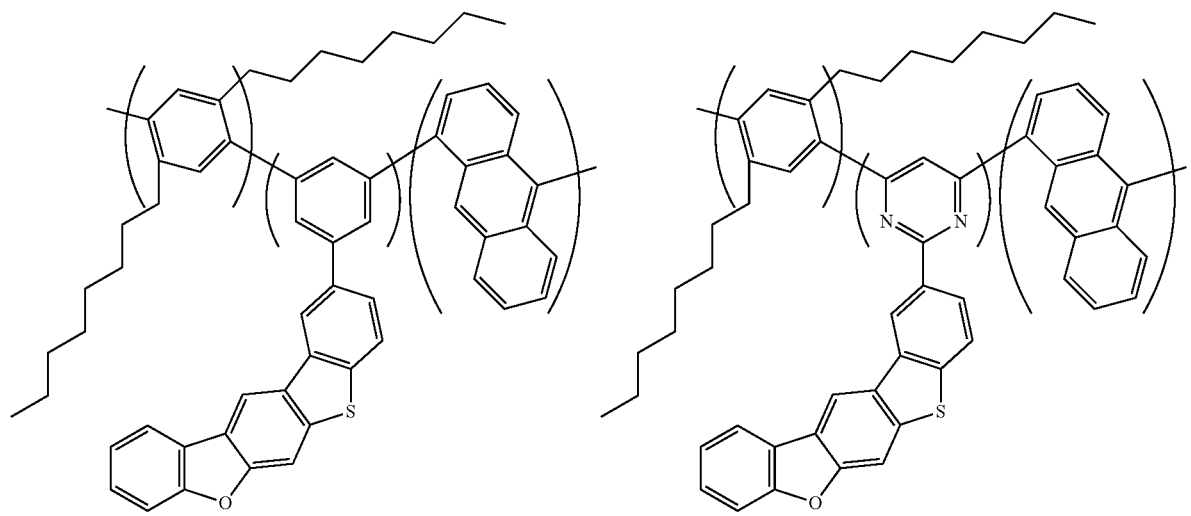

-continued
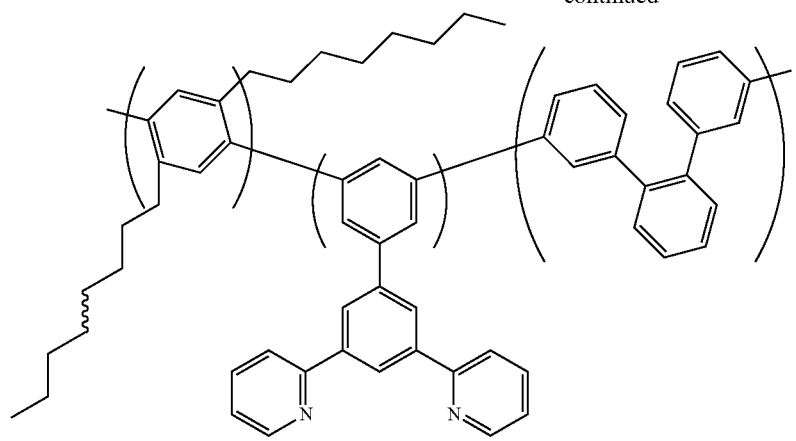
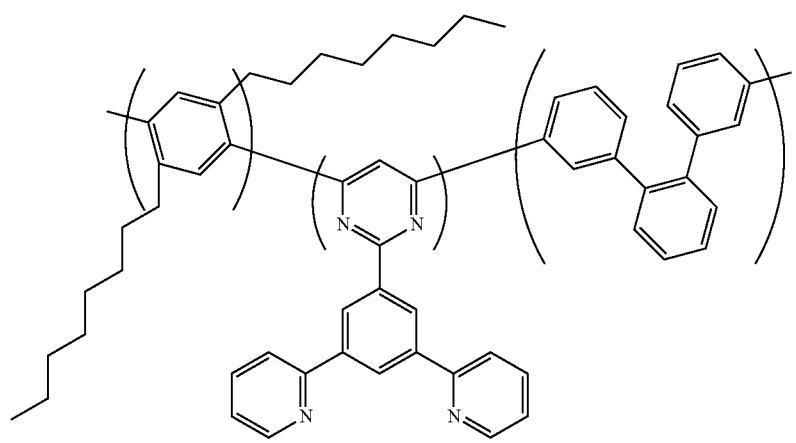
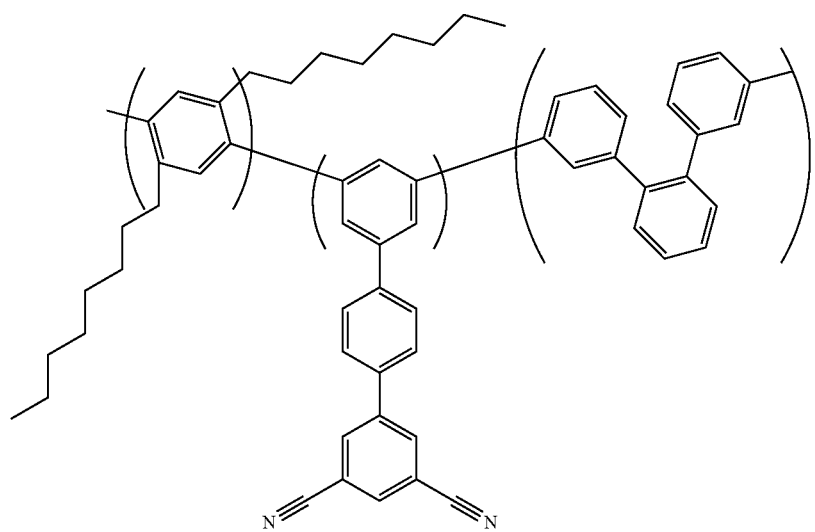

-continued
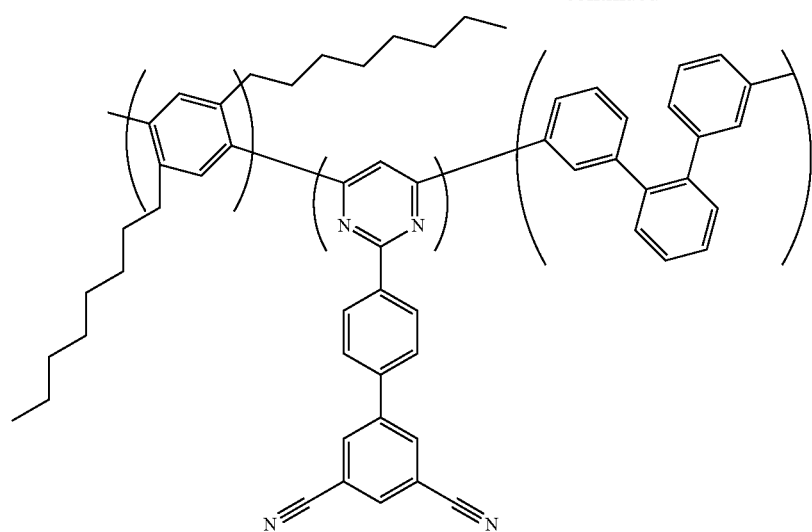
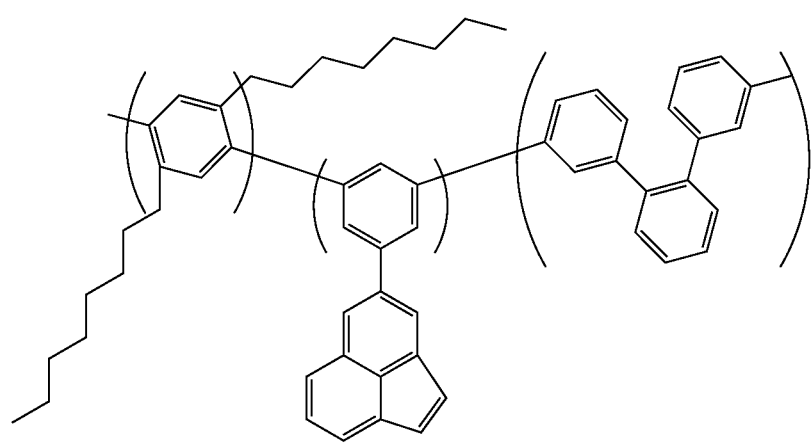
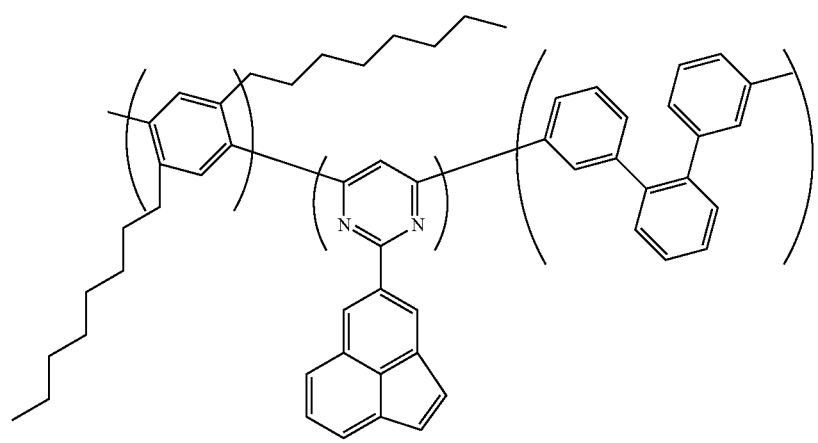

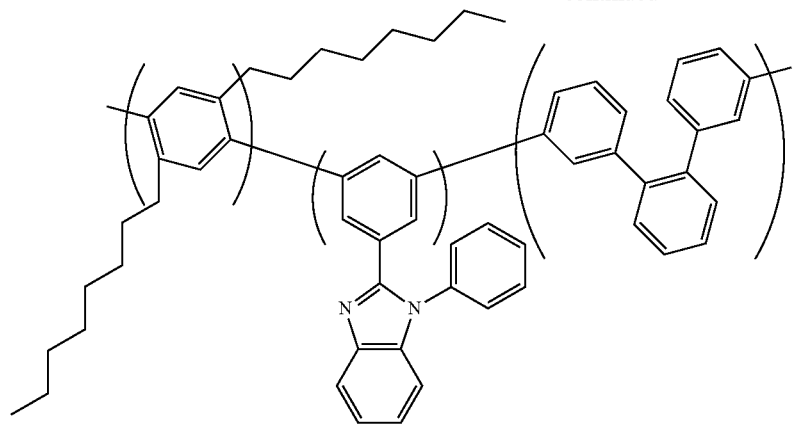
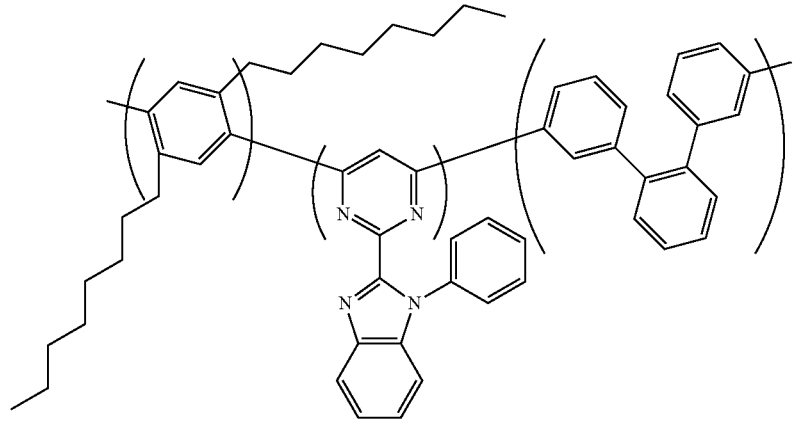
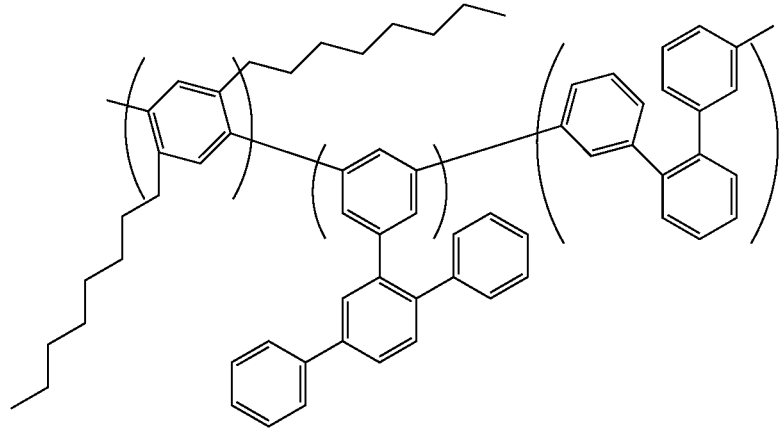
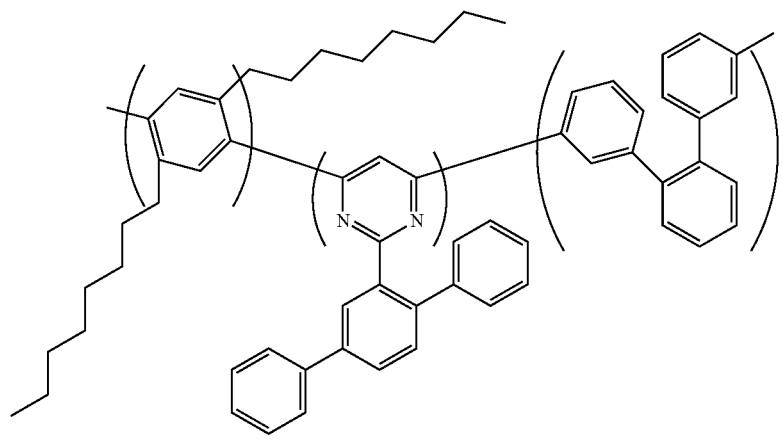

-continued
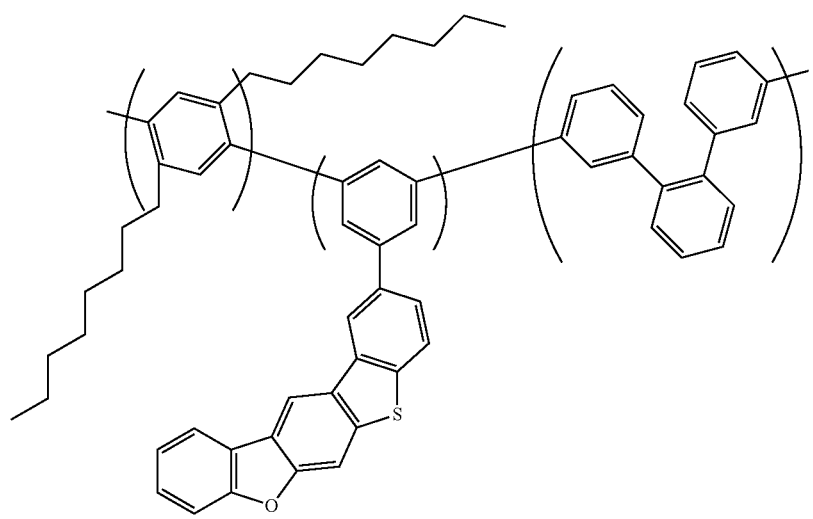
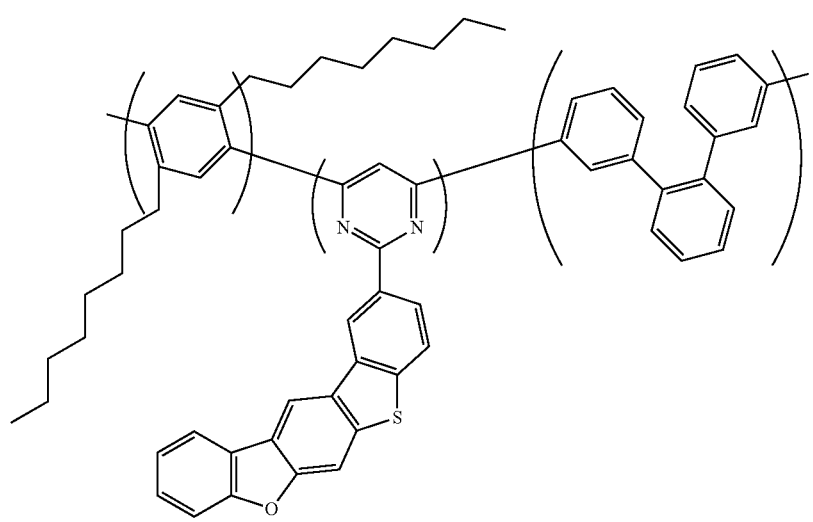
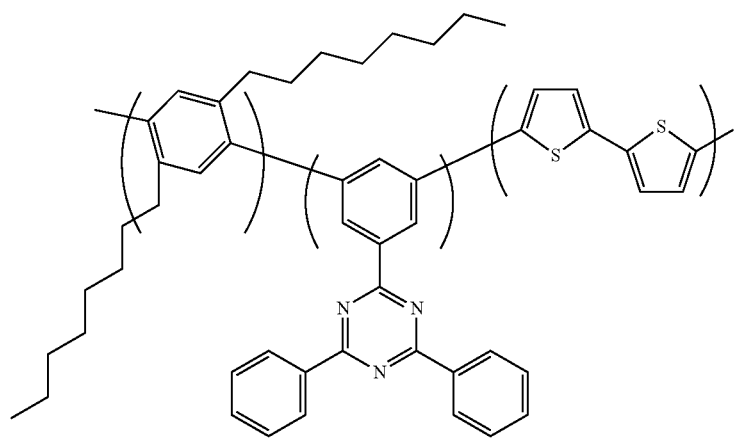

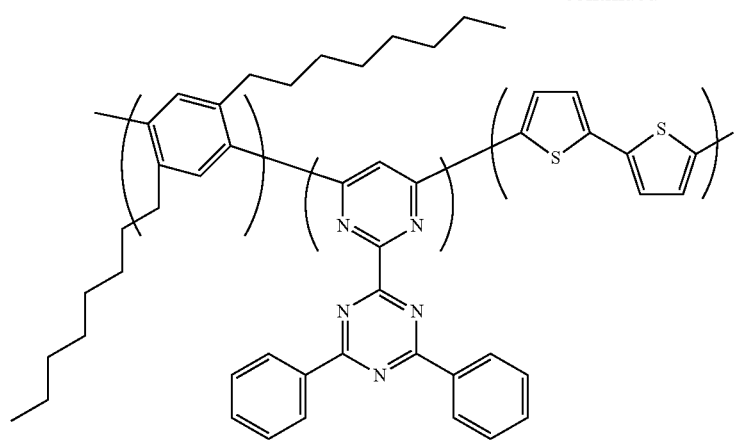
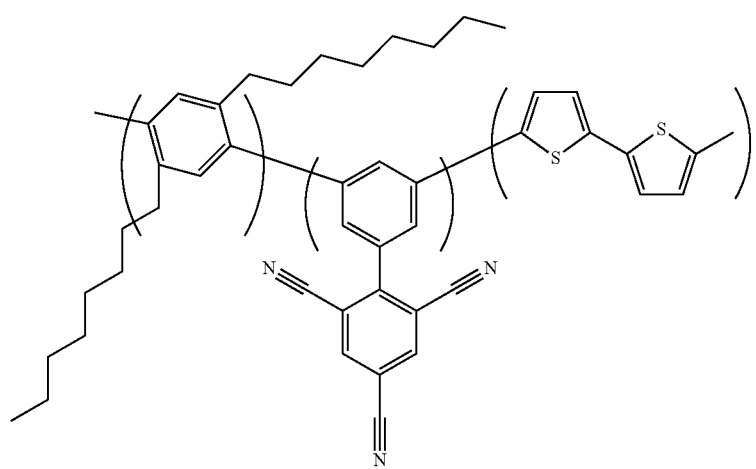
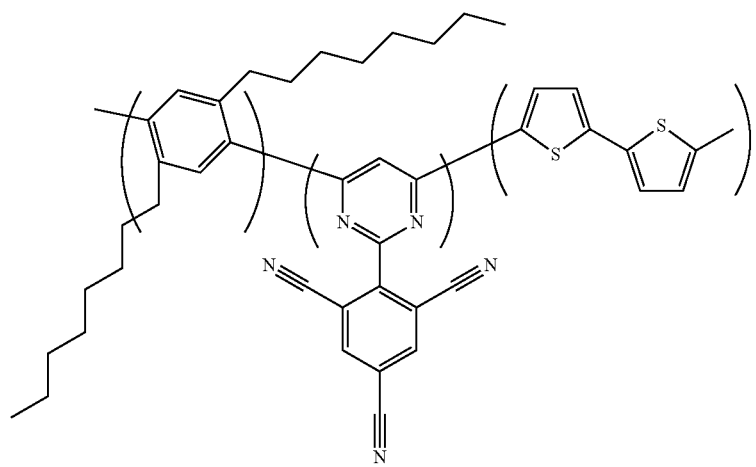

-continued
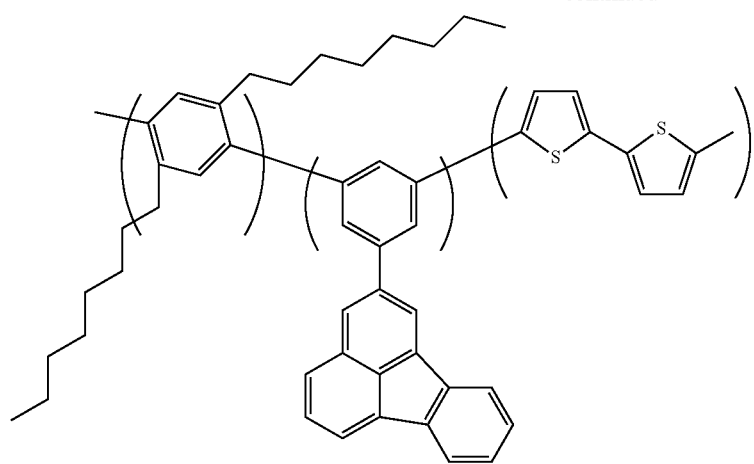
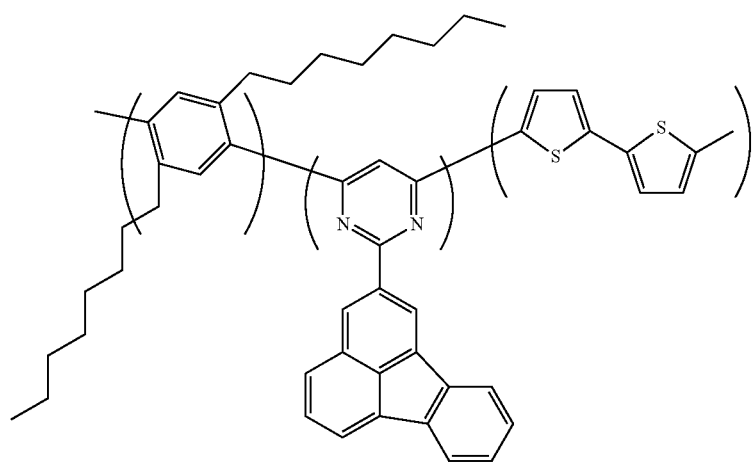
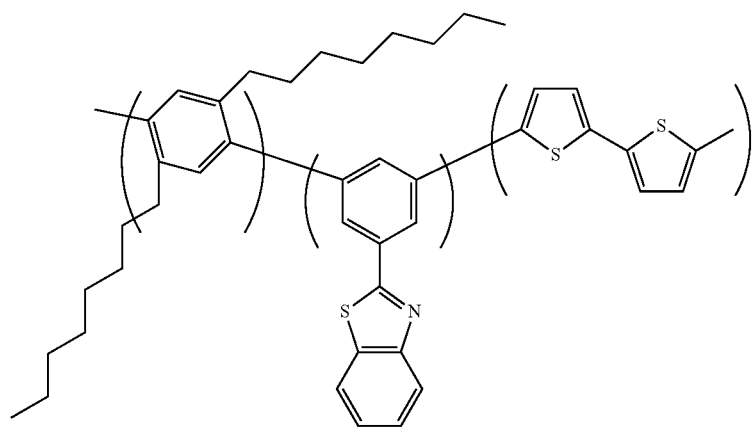

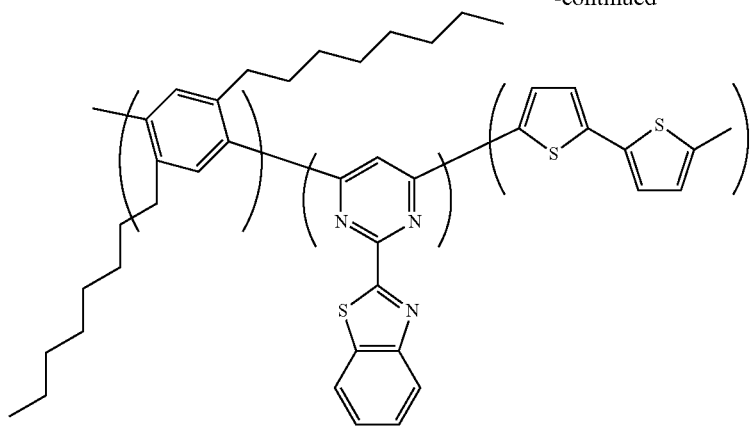
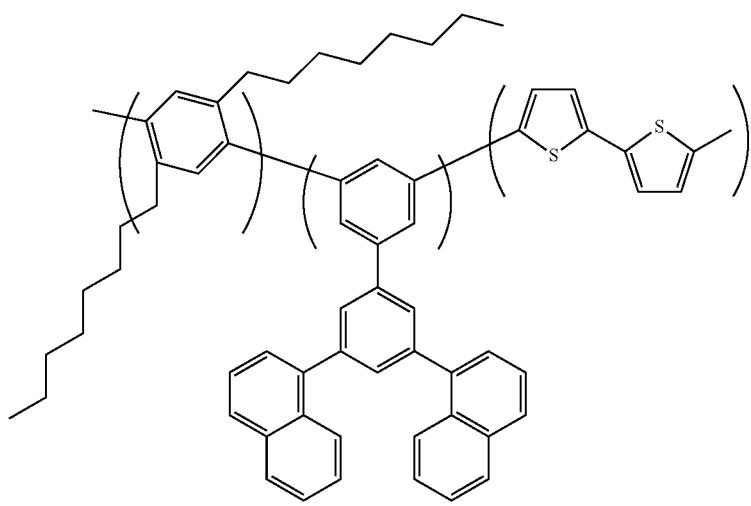
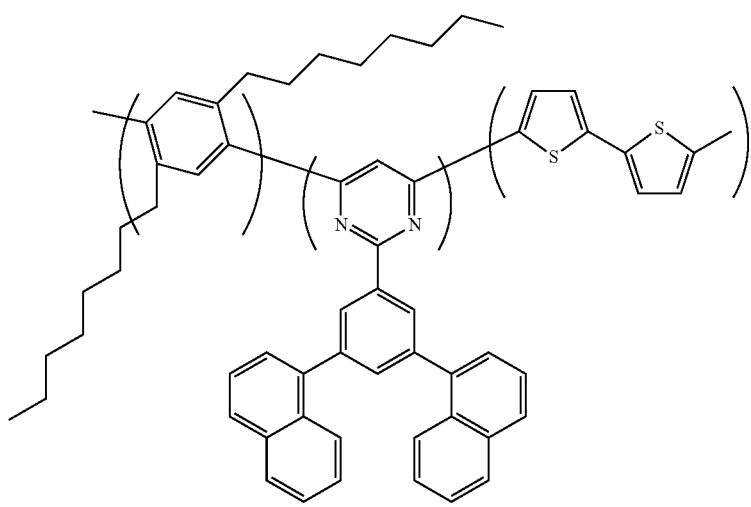

349
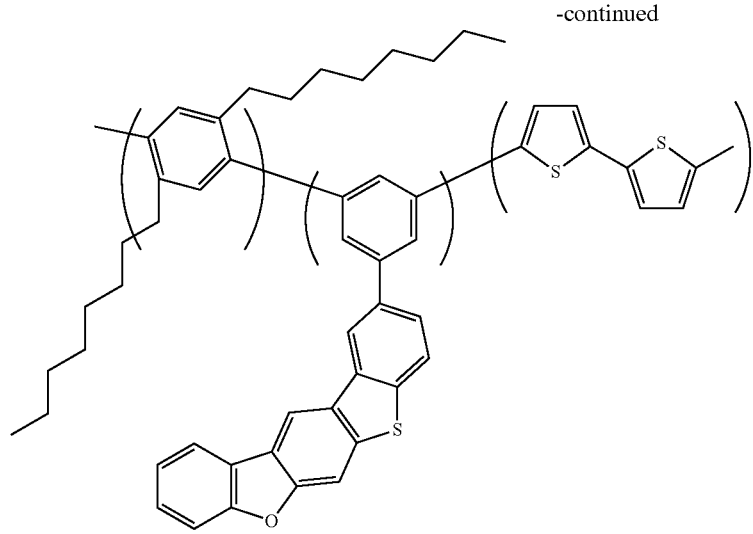
350
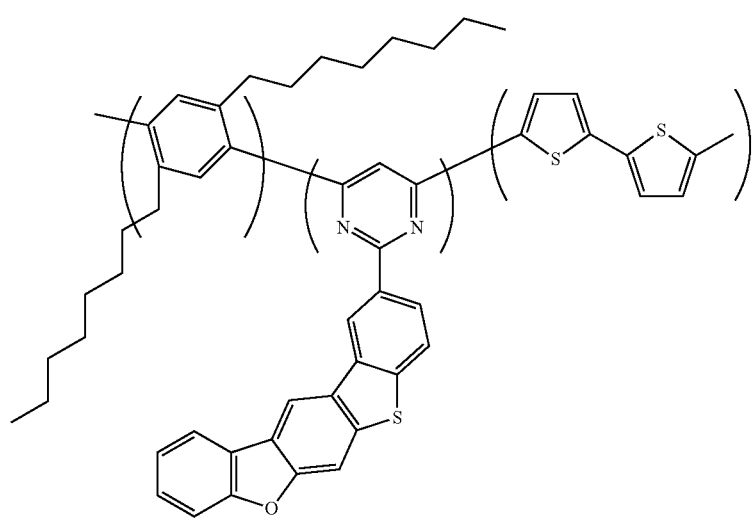
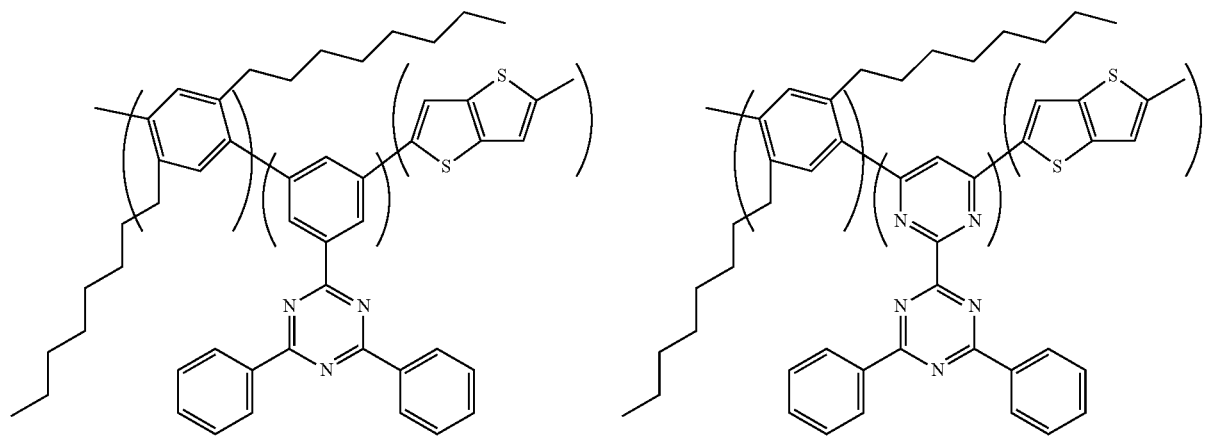

351  352
-continued
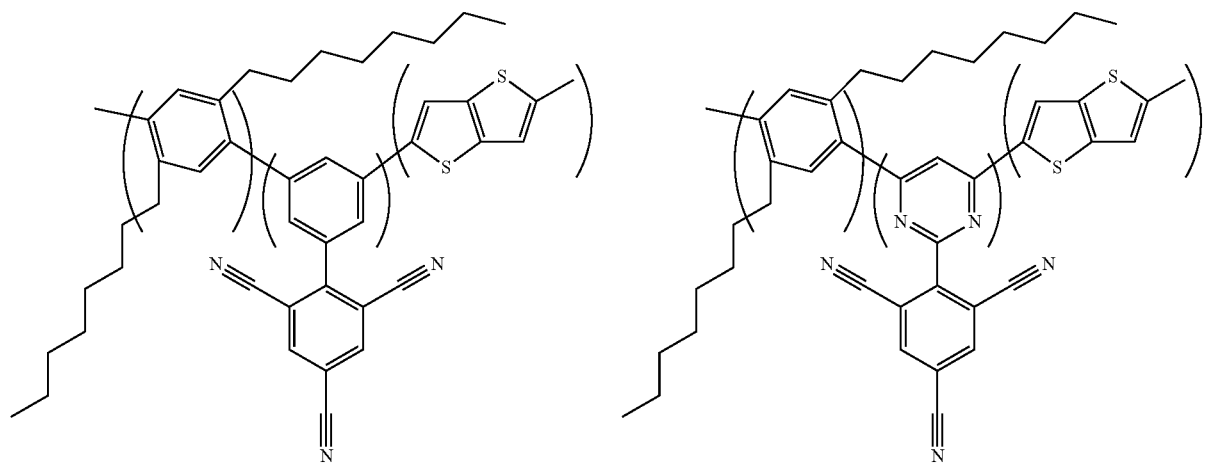
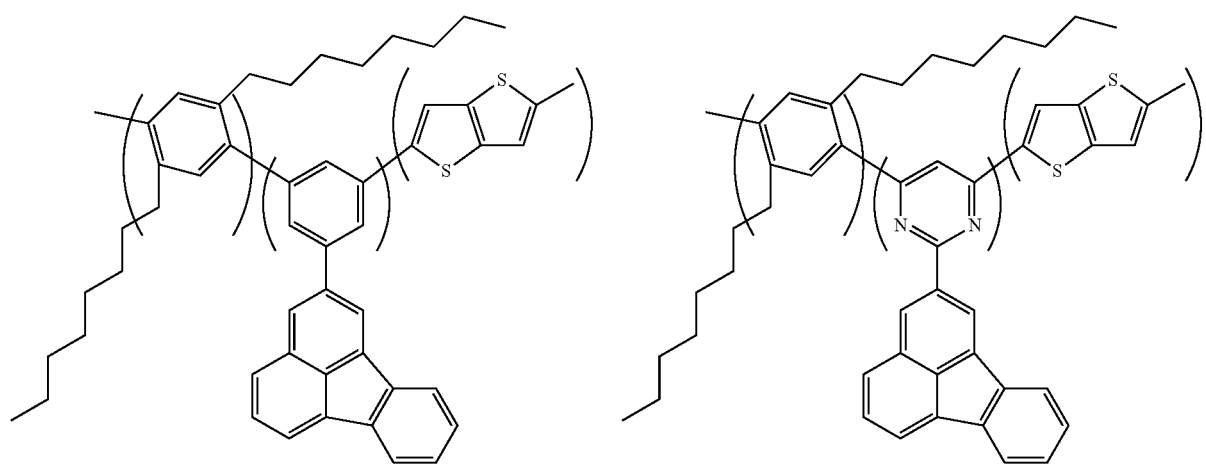
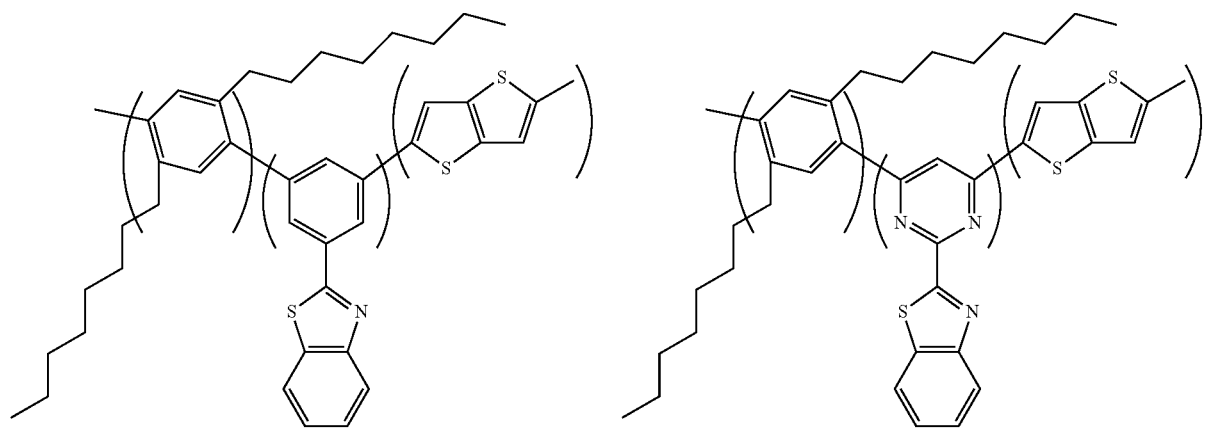

-continued
353 354
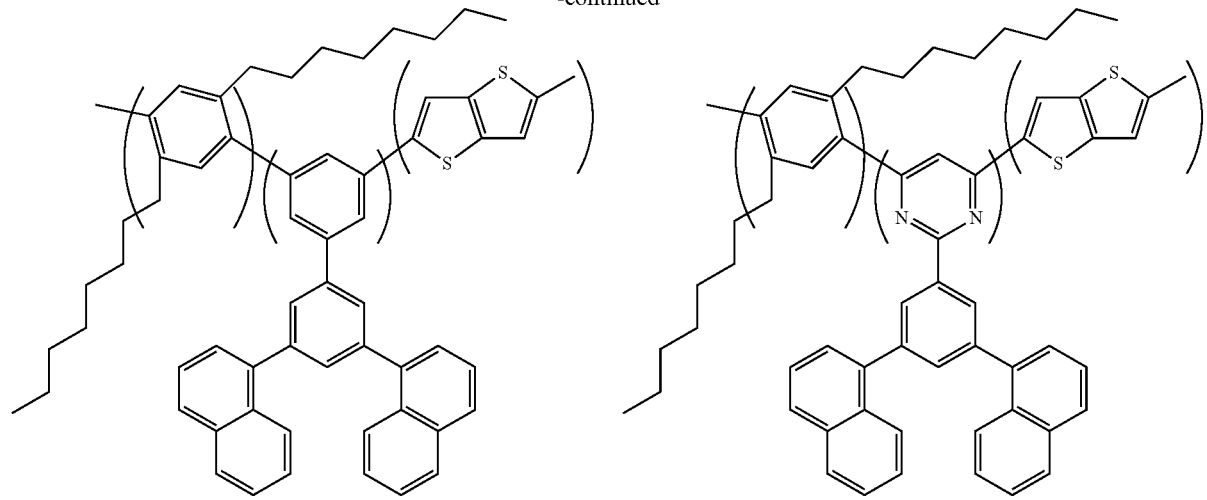
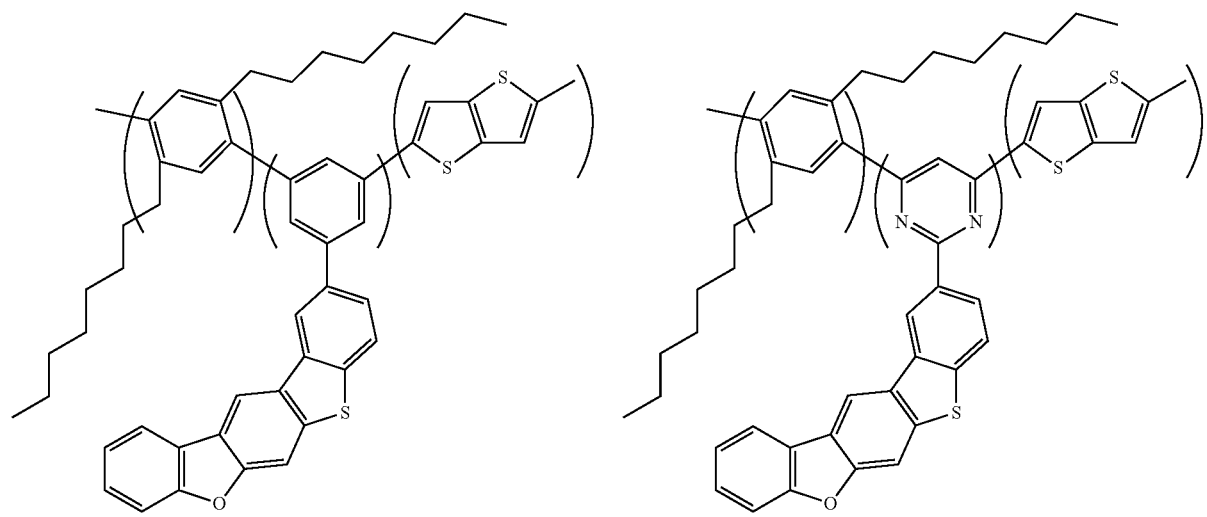
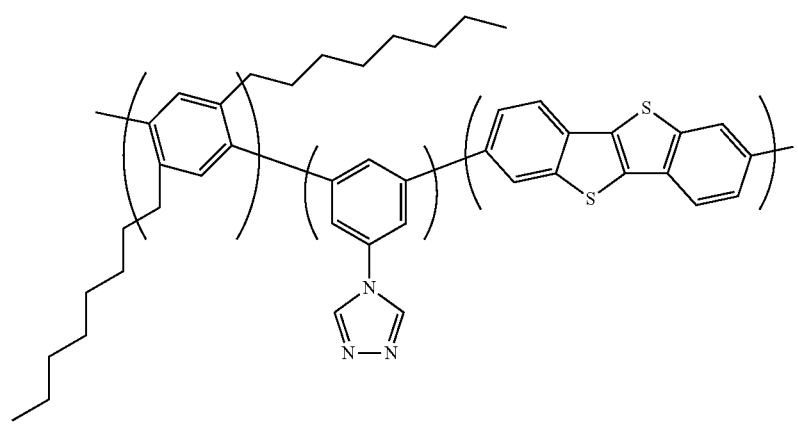

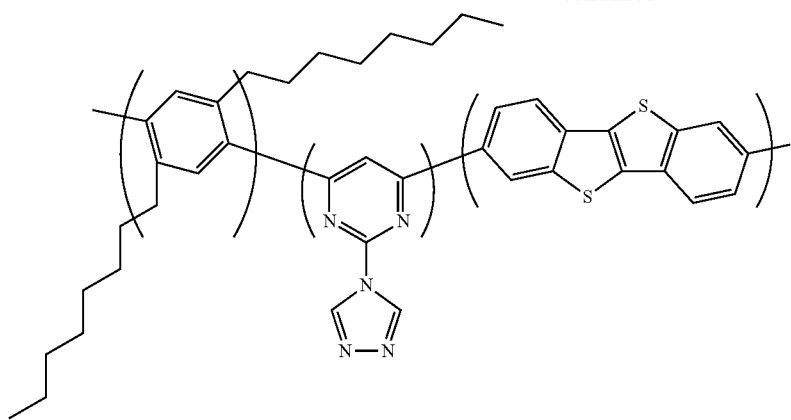
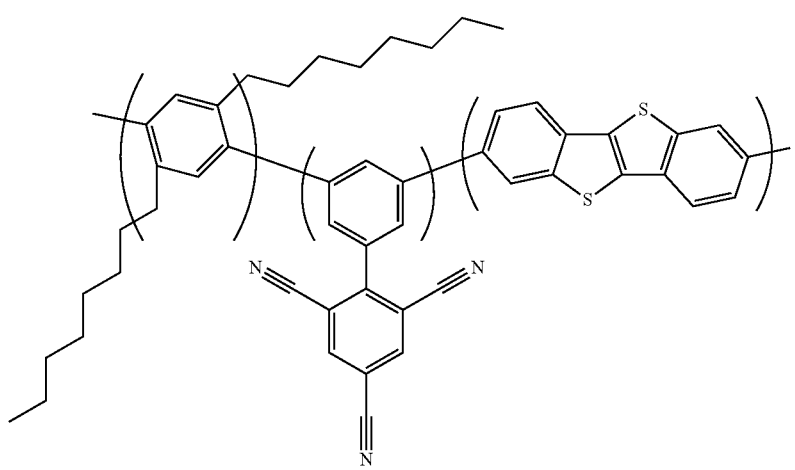
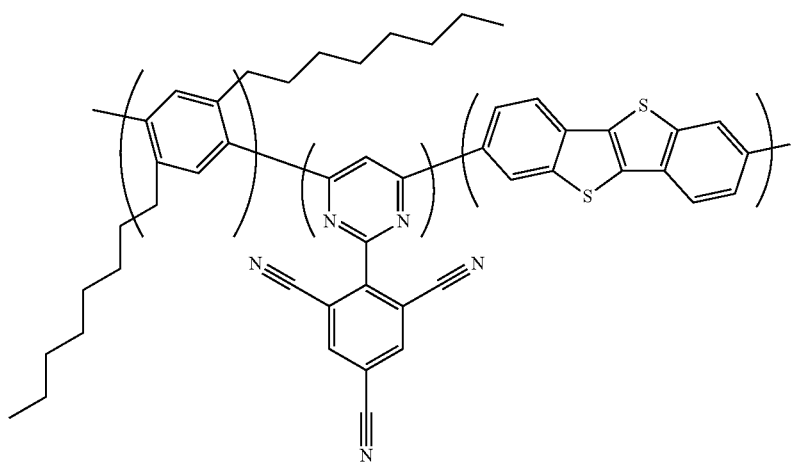

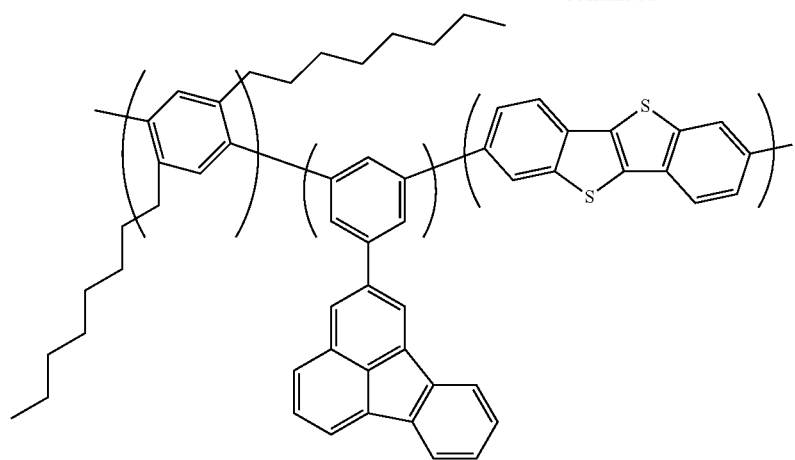
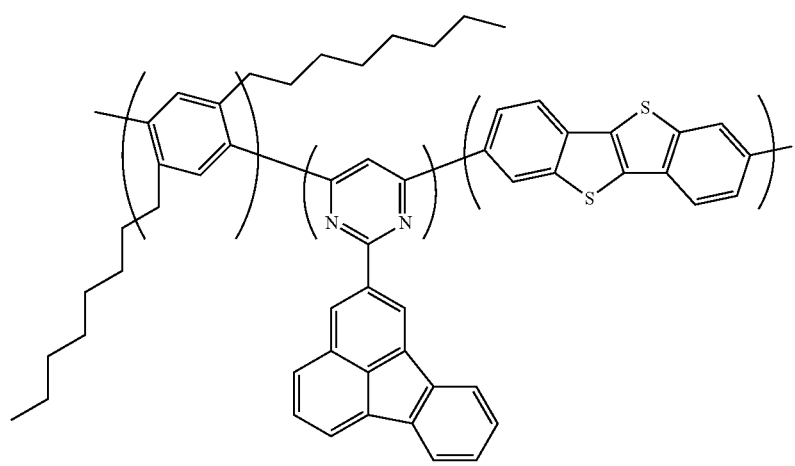
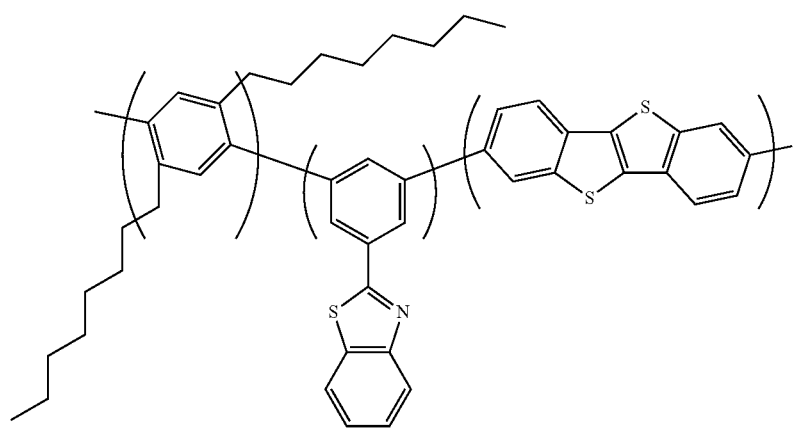

-continued
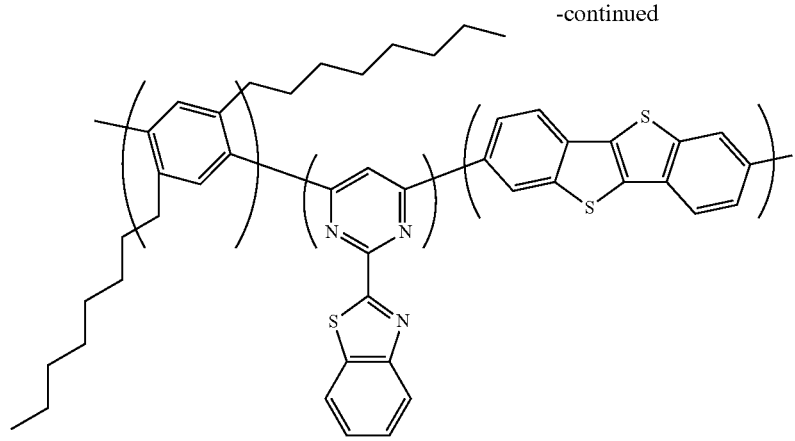
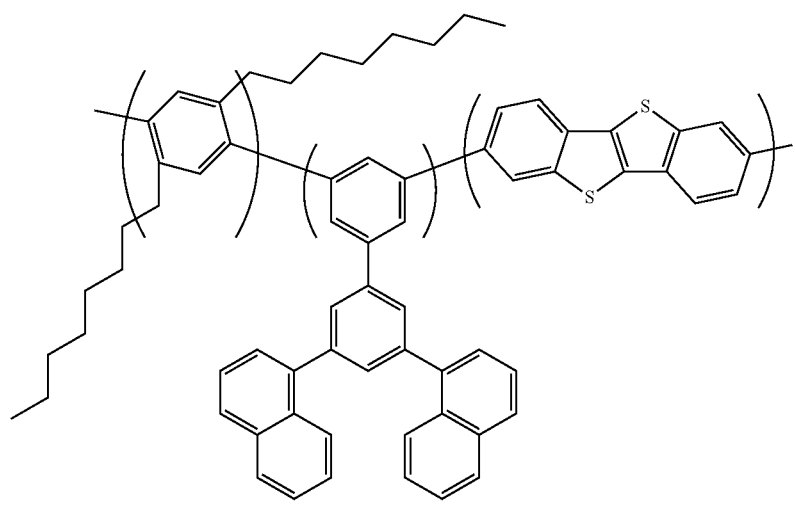
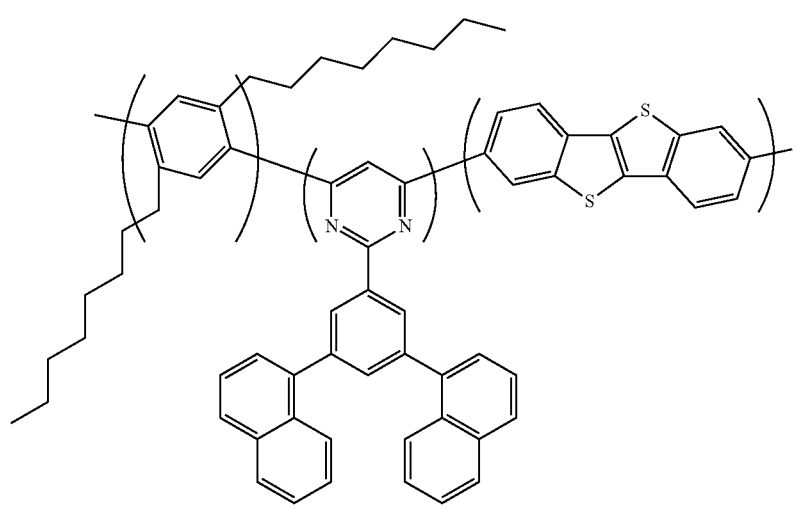

-continued
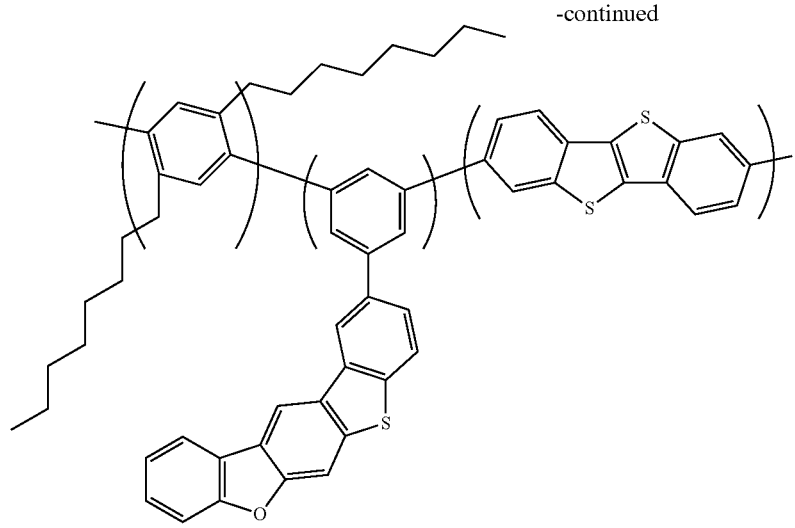
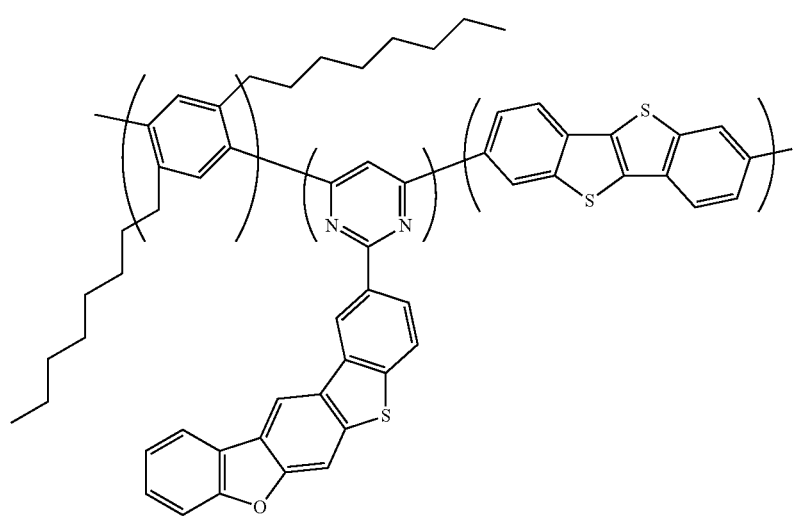
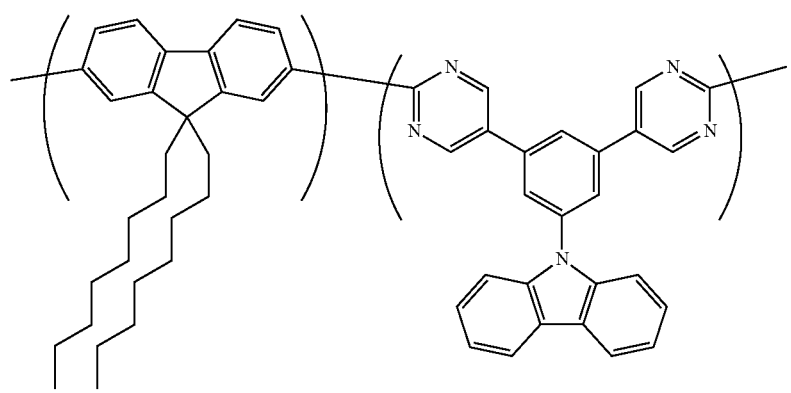

363 364
-continued
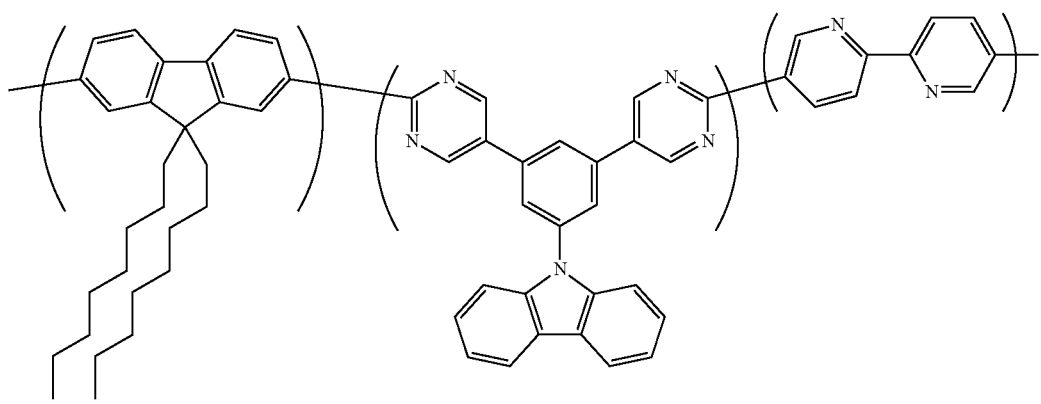
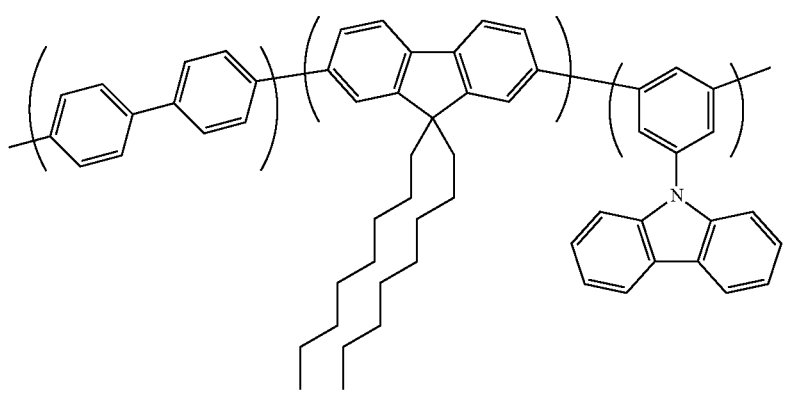
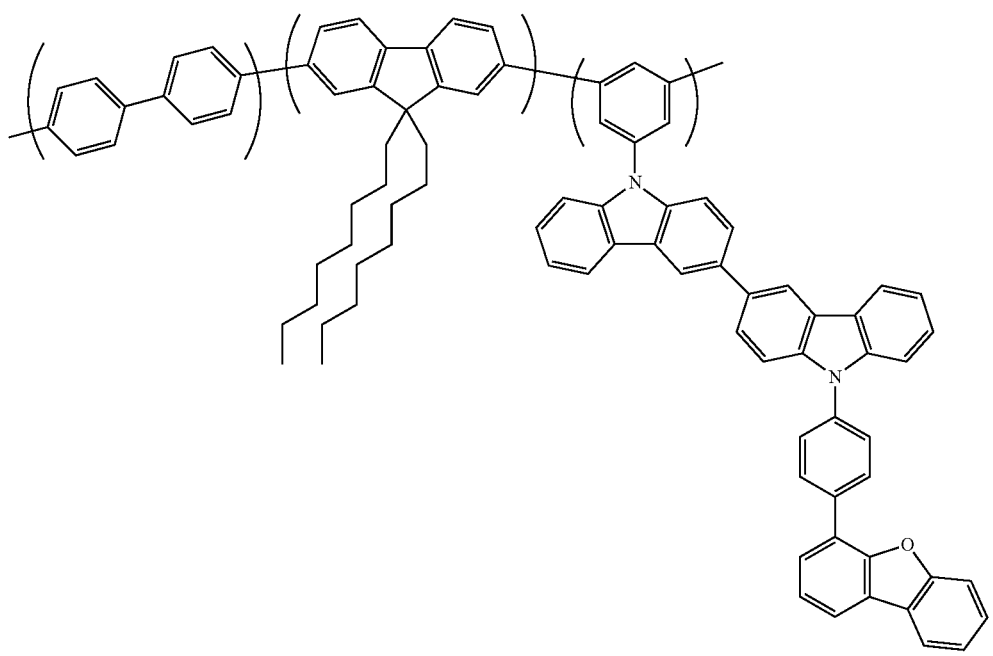

-continued
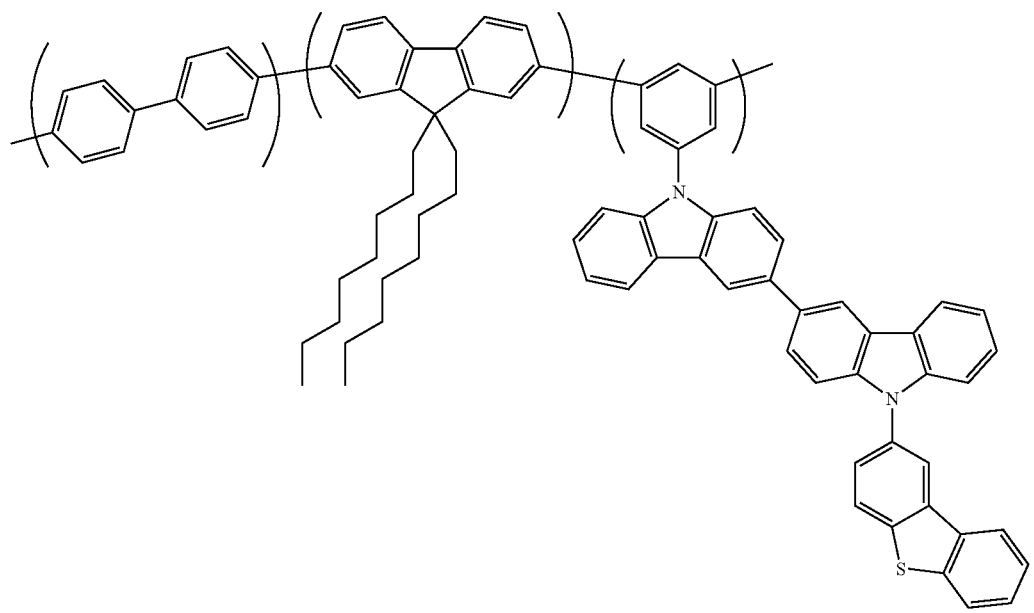
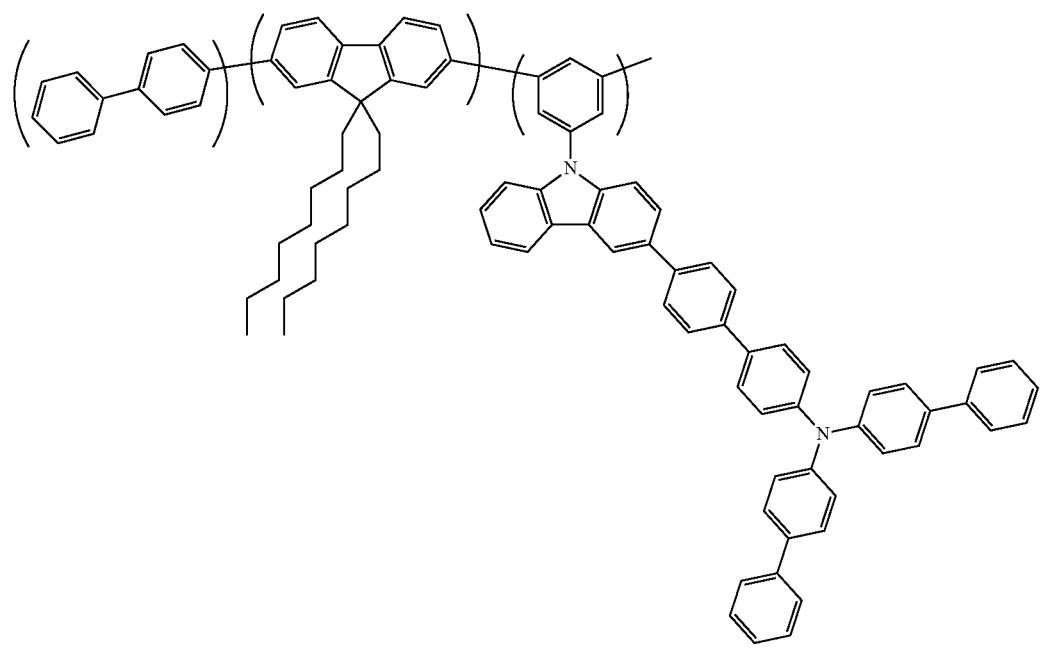

-continued
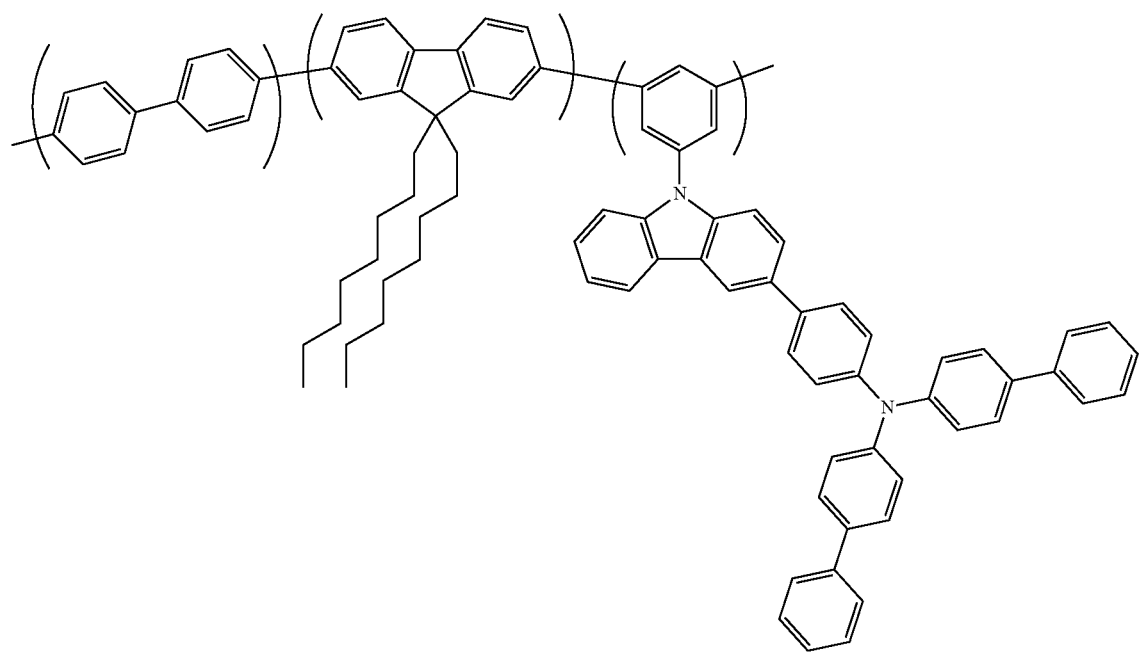
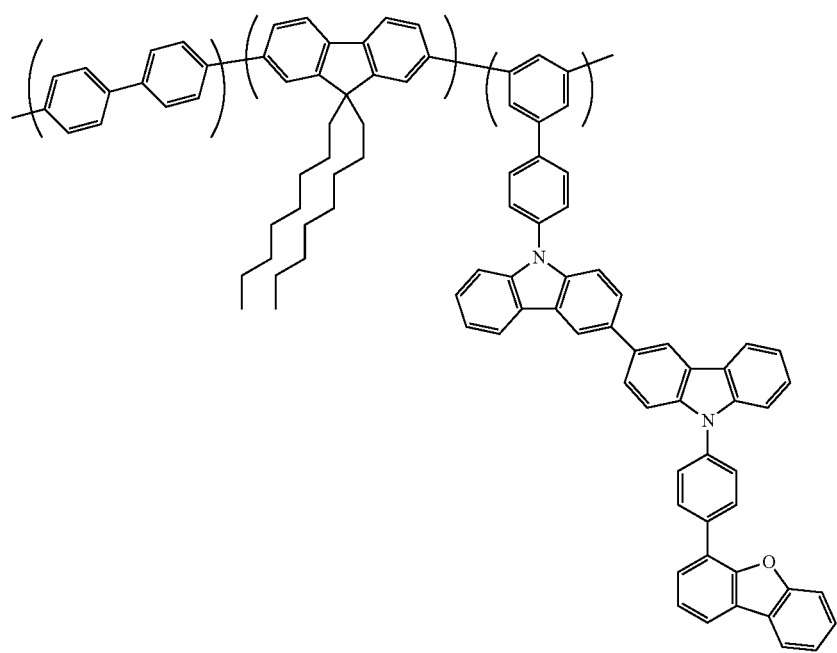

-continued
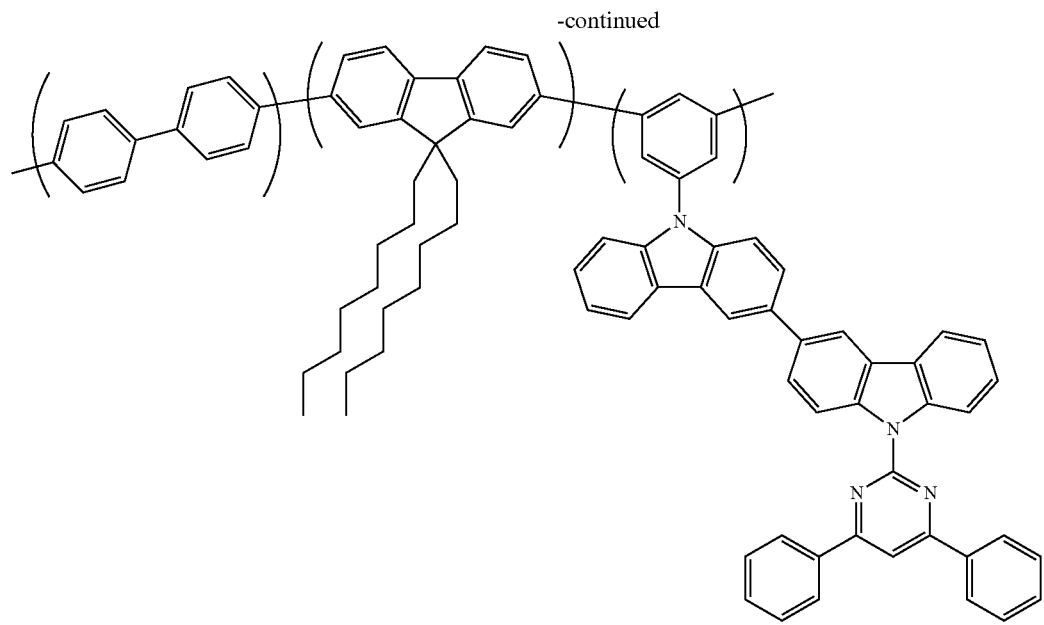
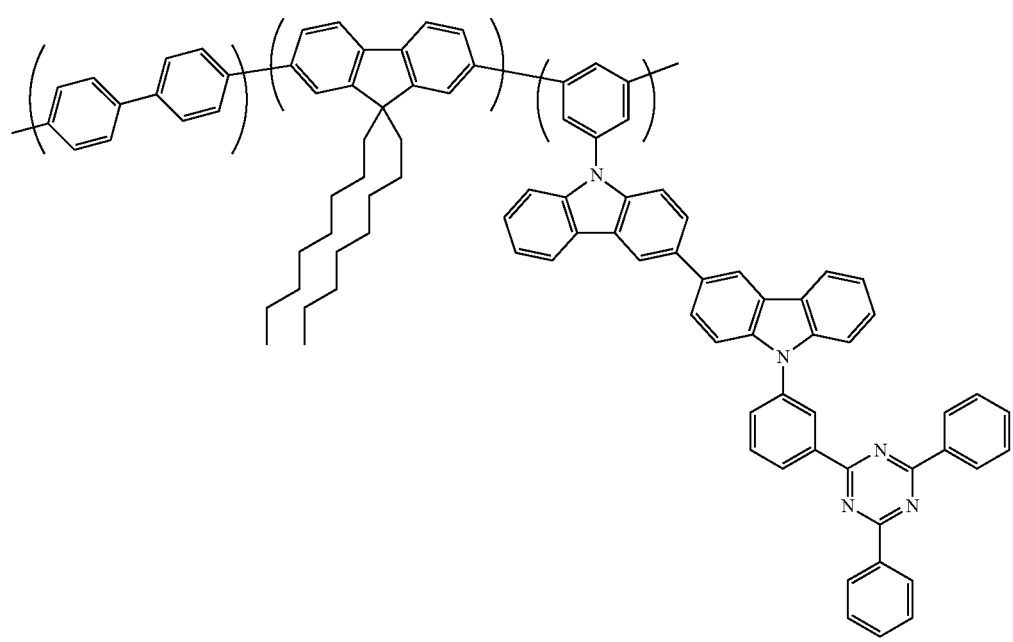
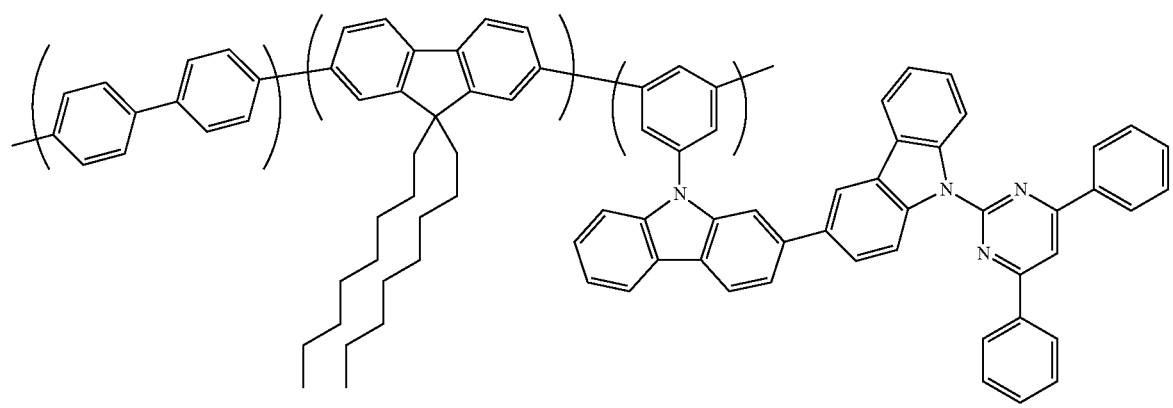

371
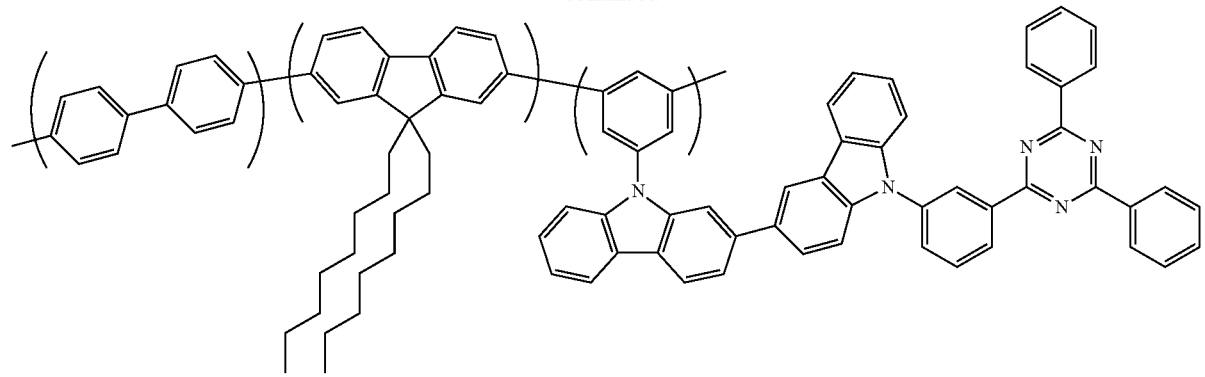
-continued
372
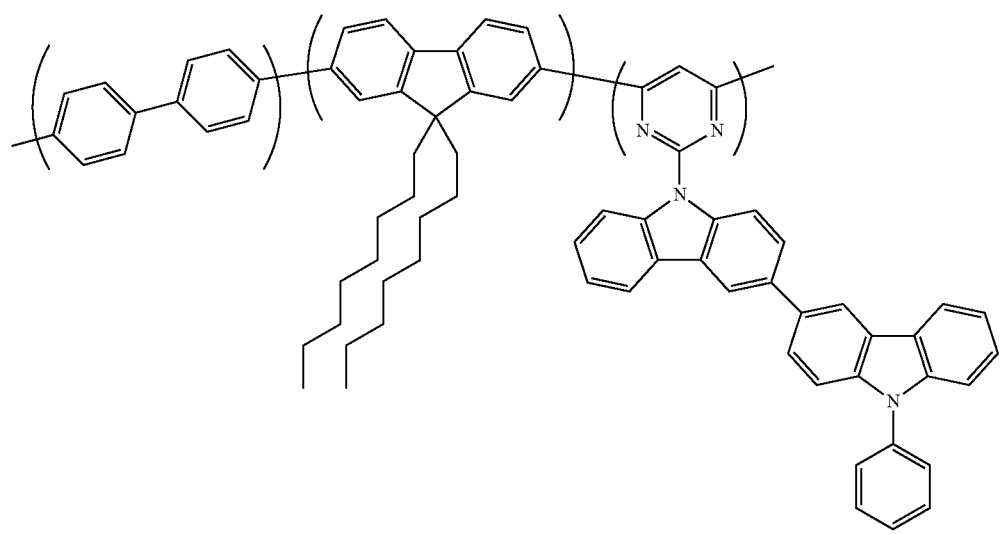
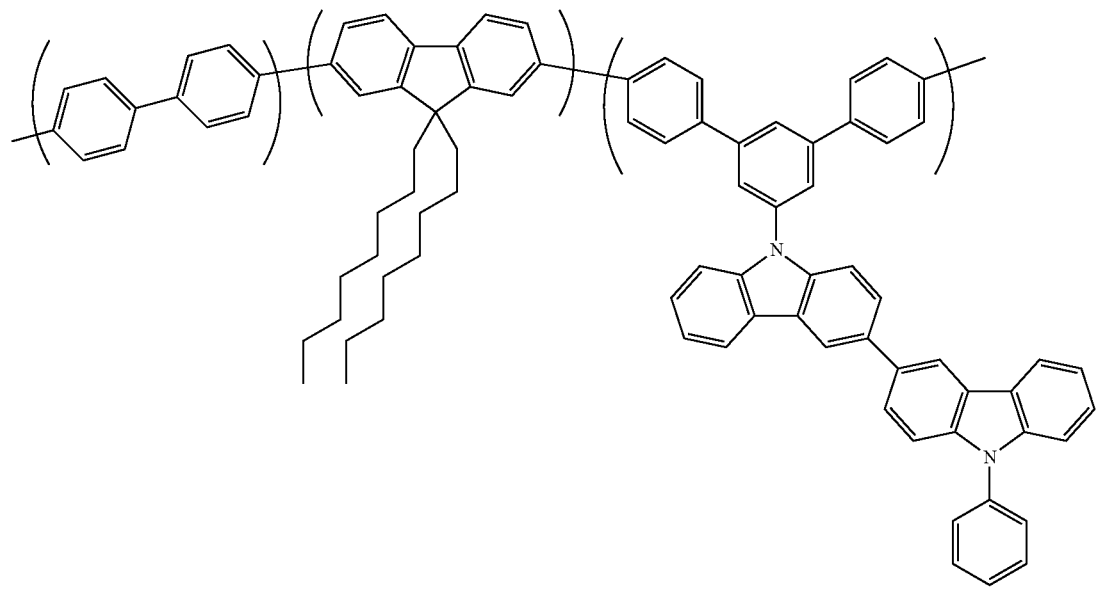

373
-continued
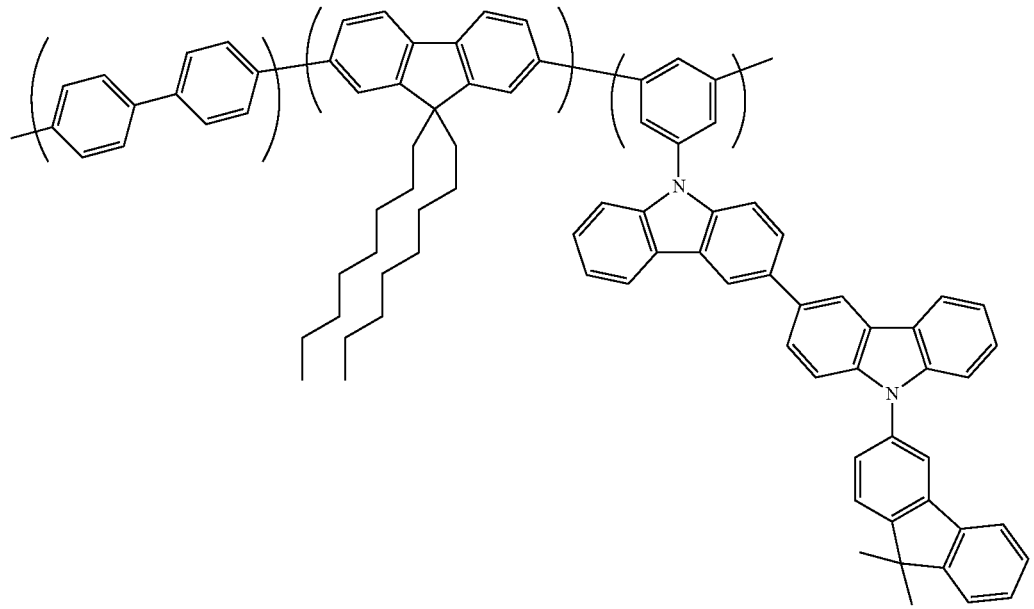
374
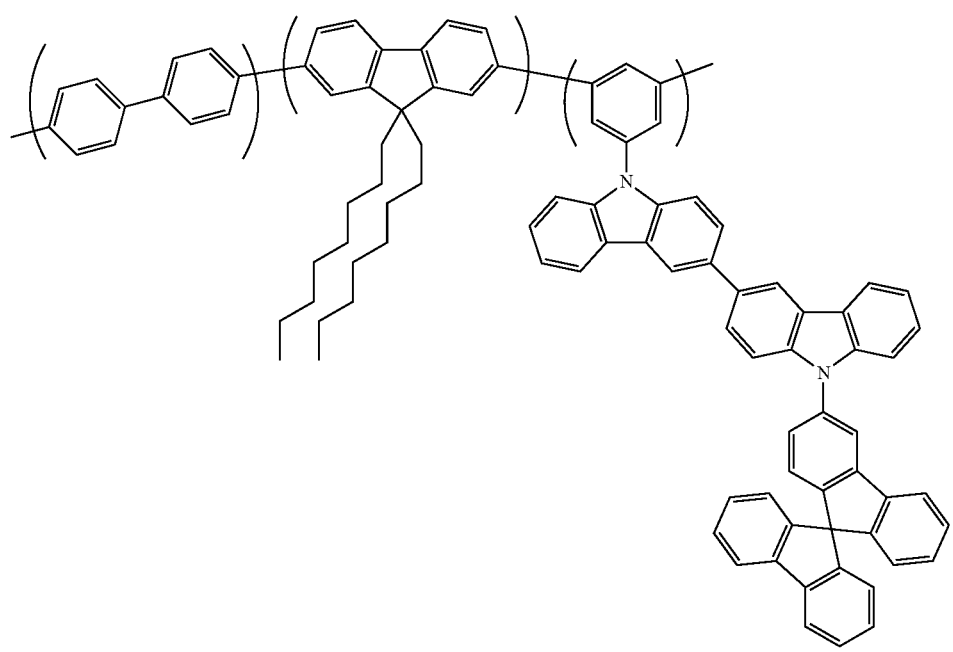

-continued
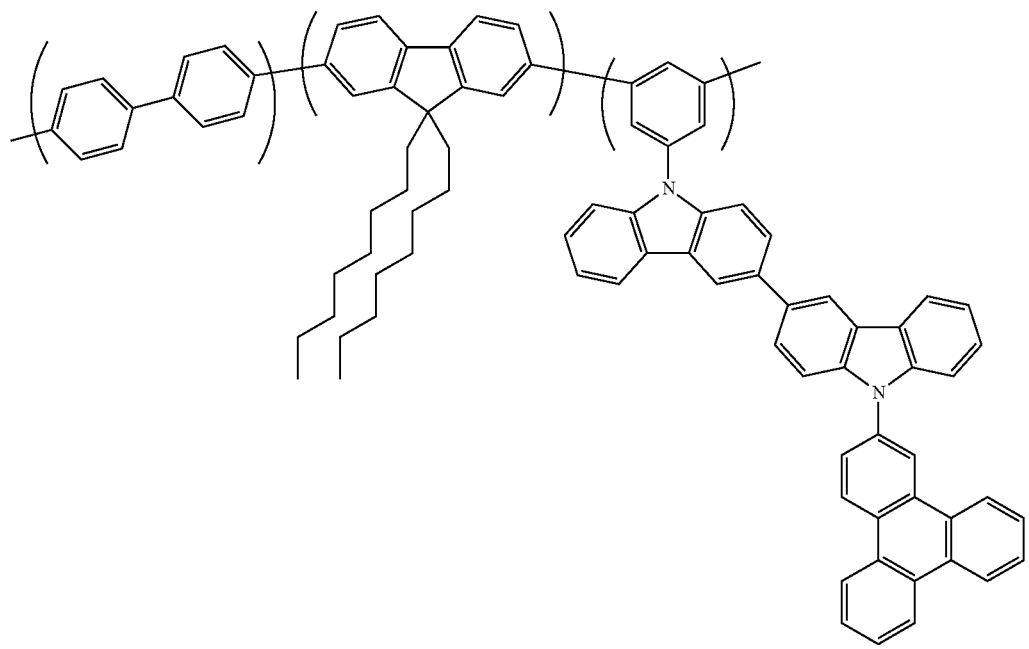
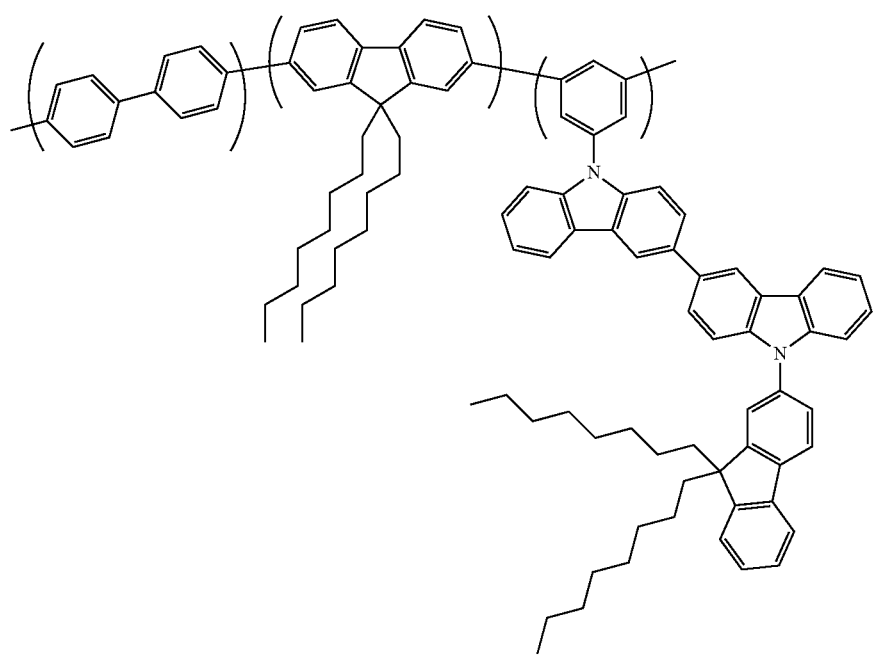

-continued
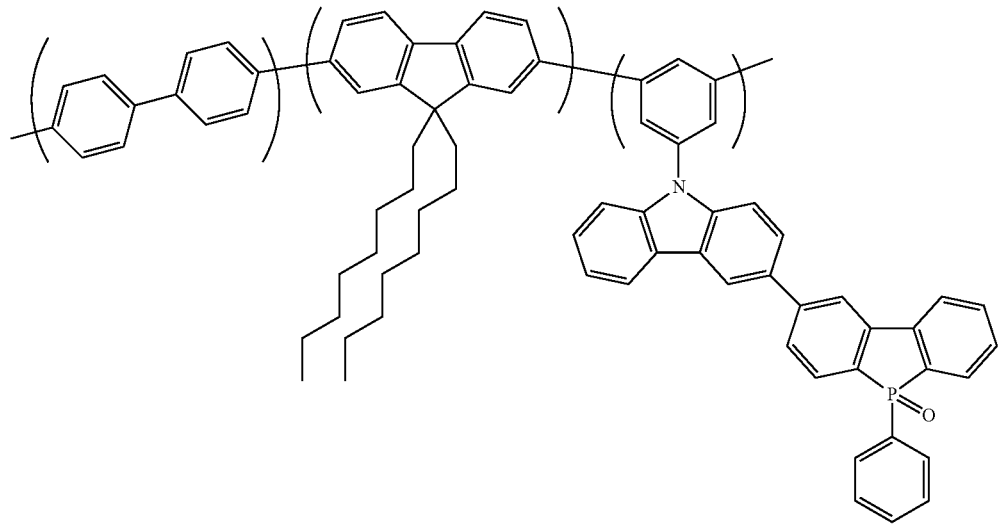
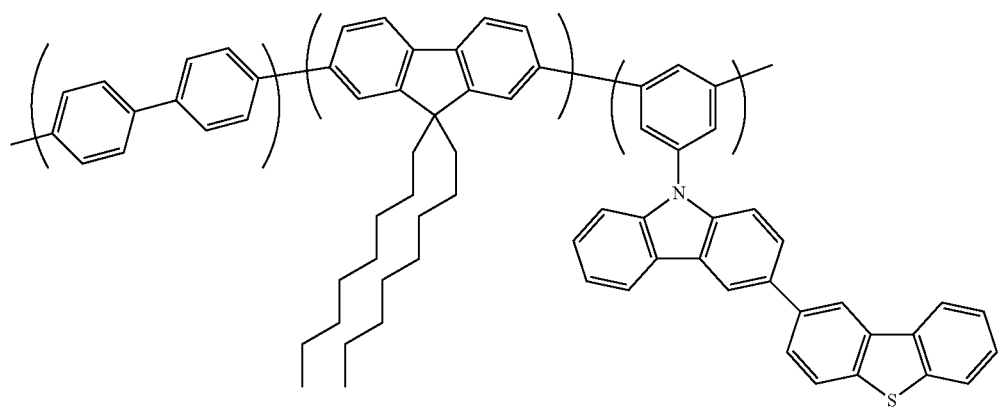
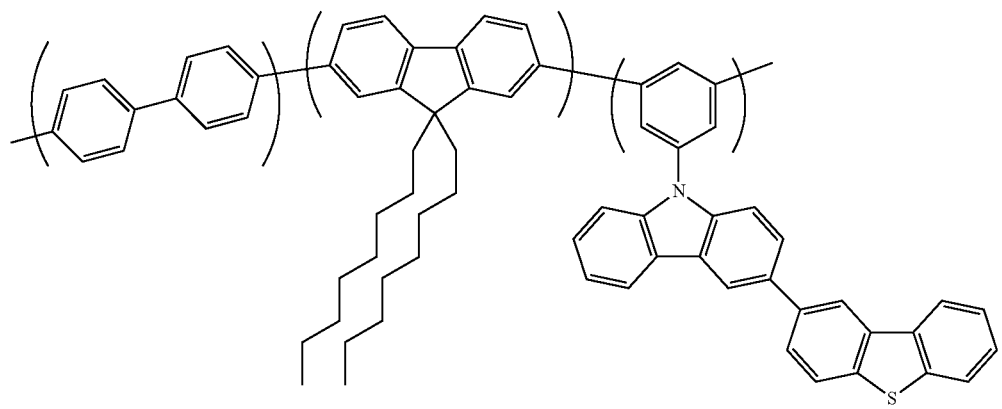

-continued
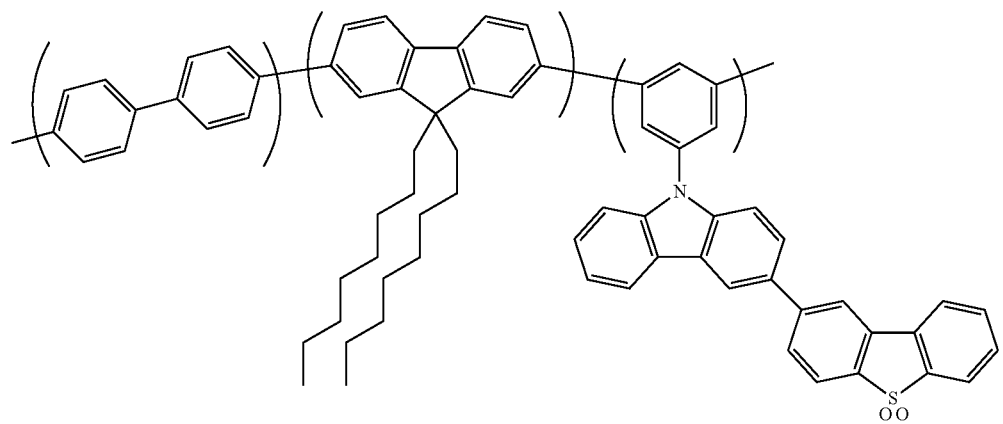
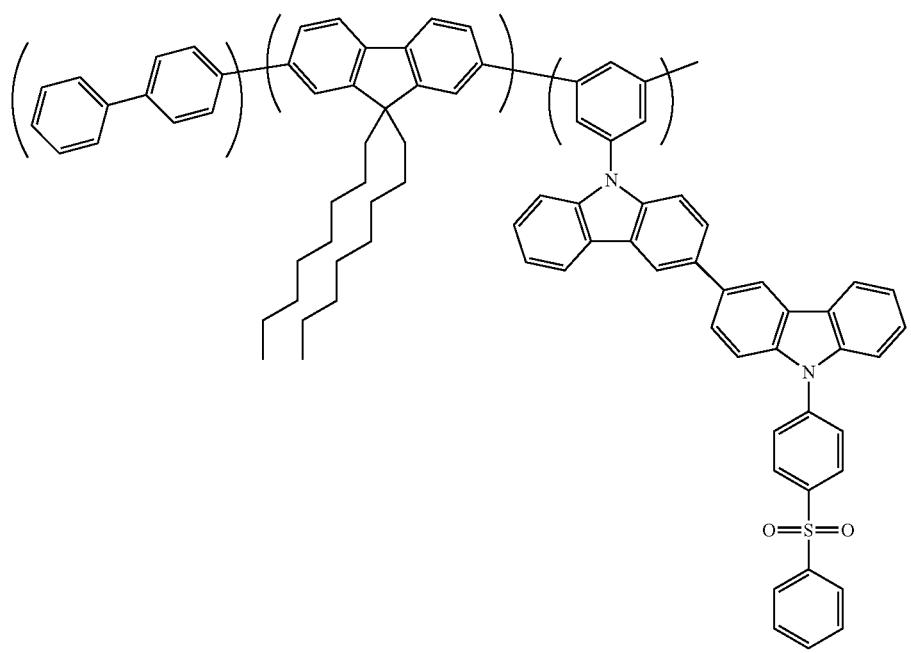
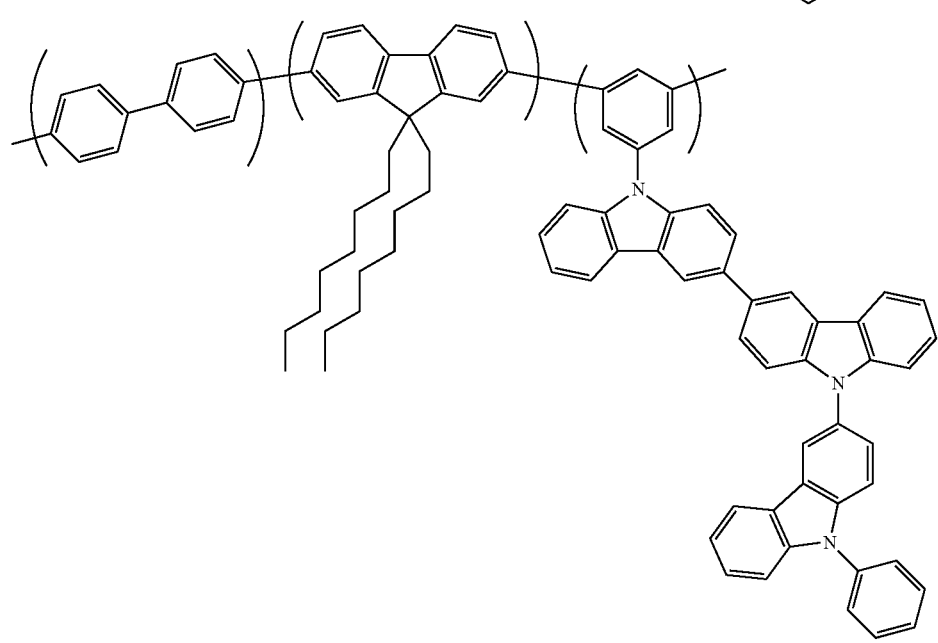

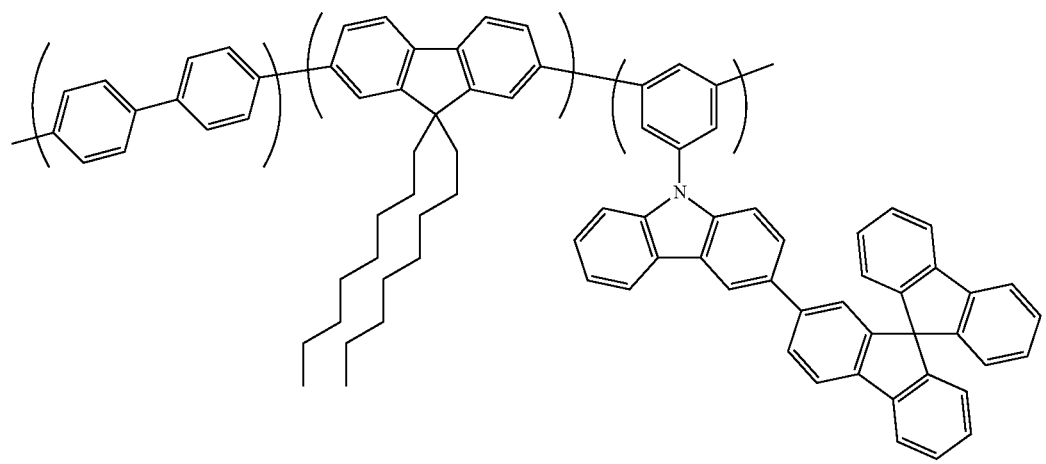
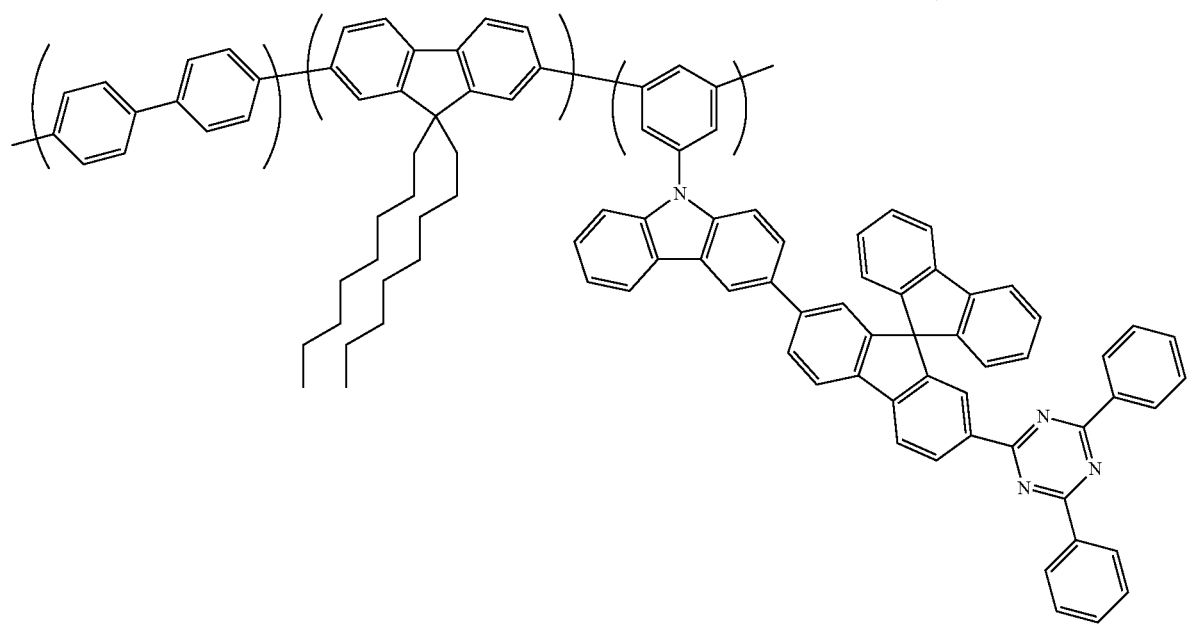
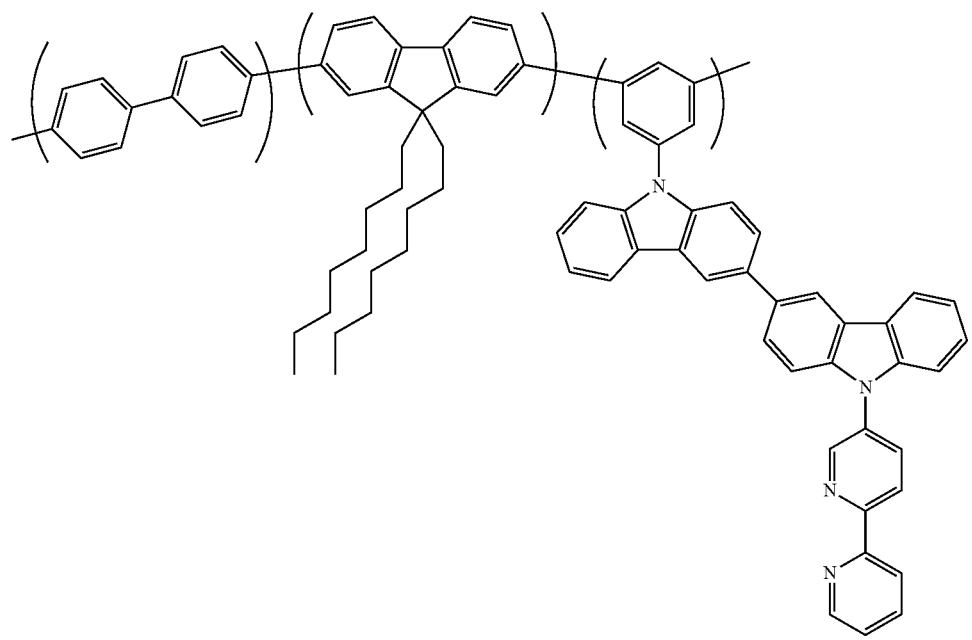

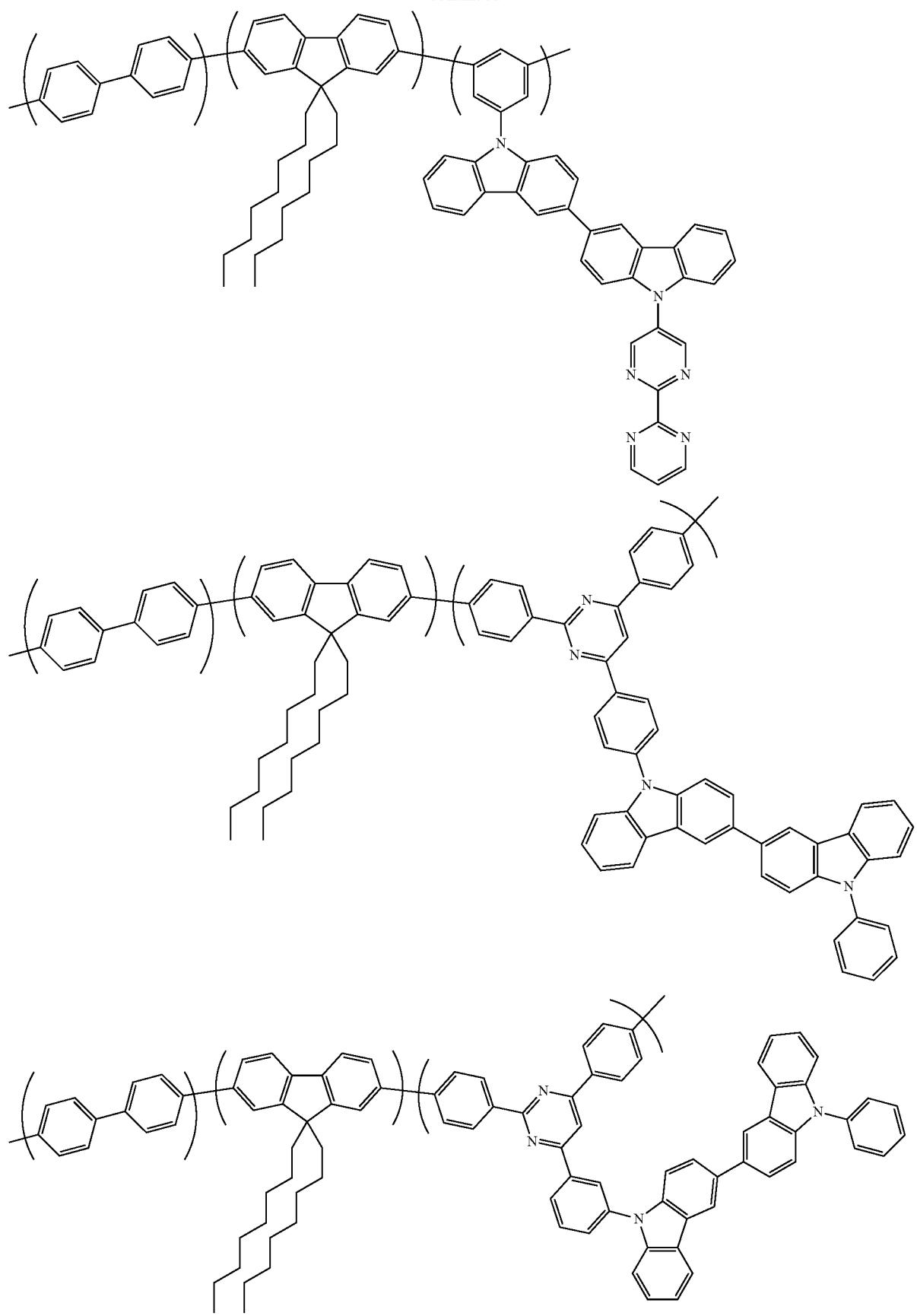

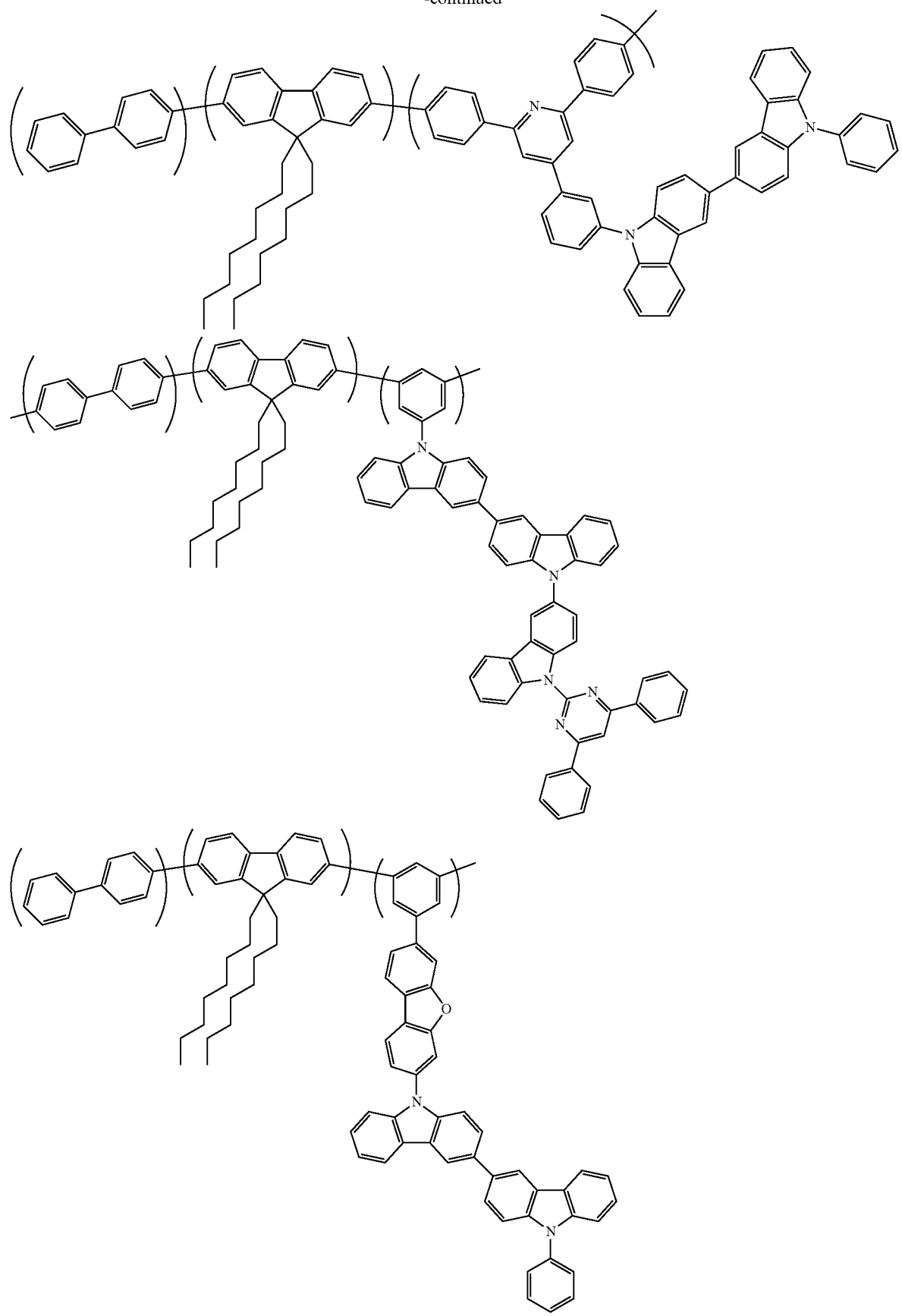

387
-continued
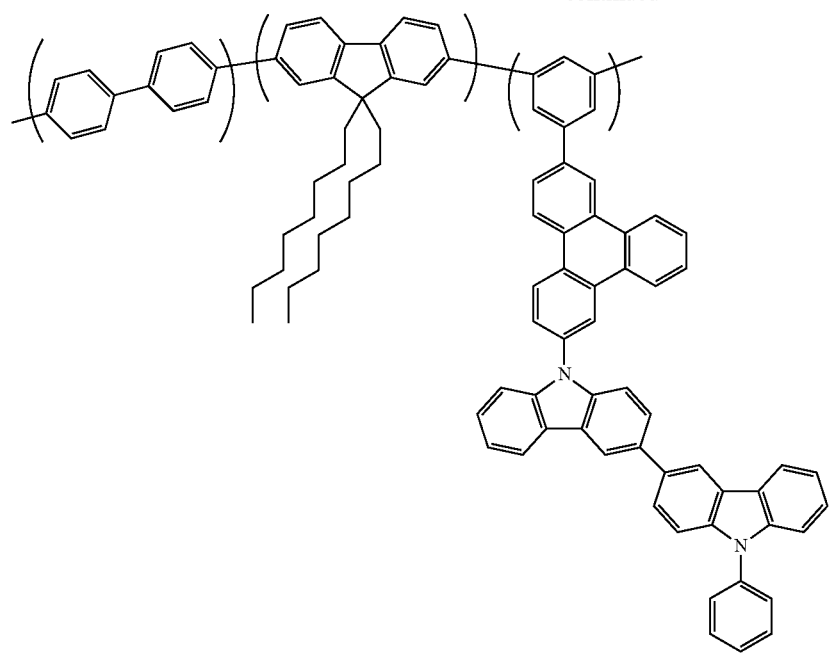
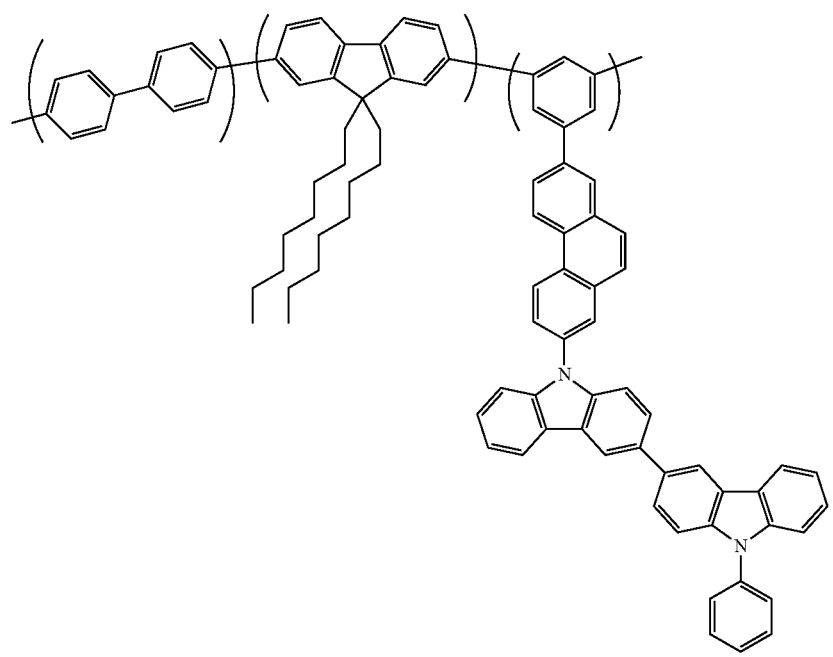

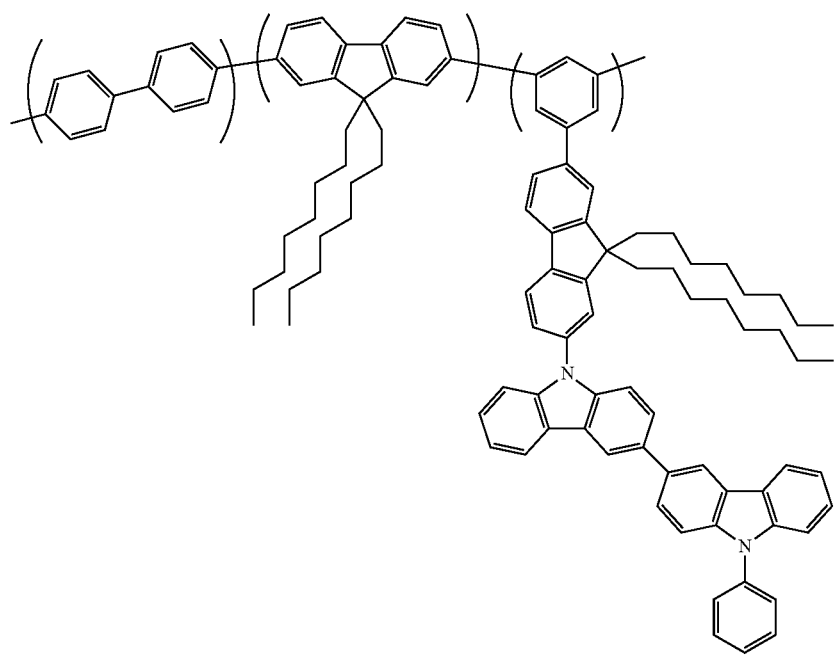
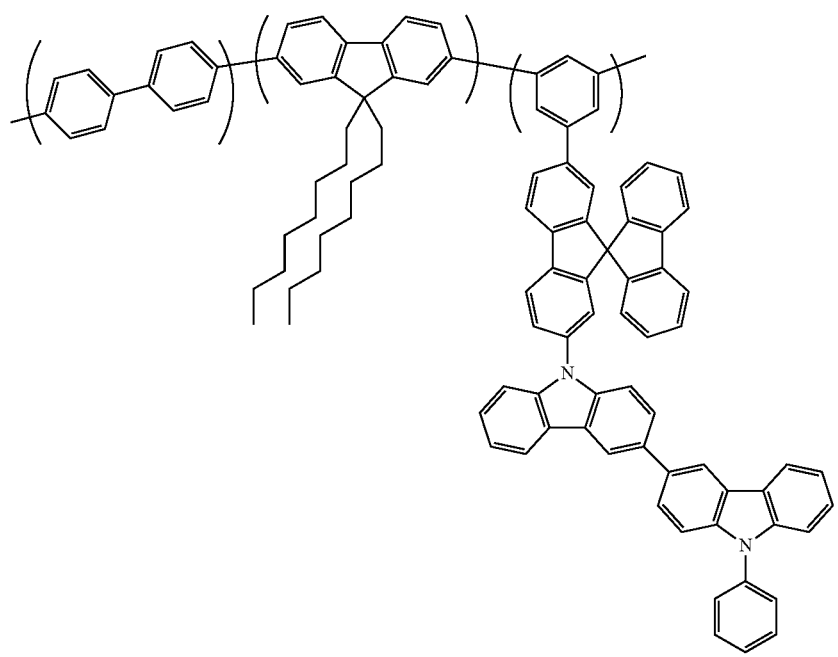

391
392
-continued
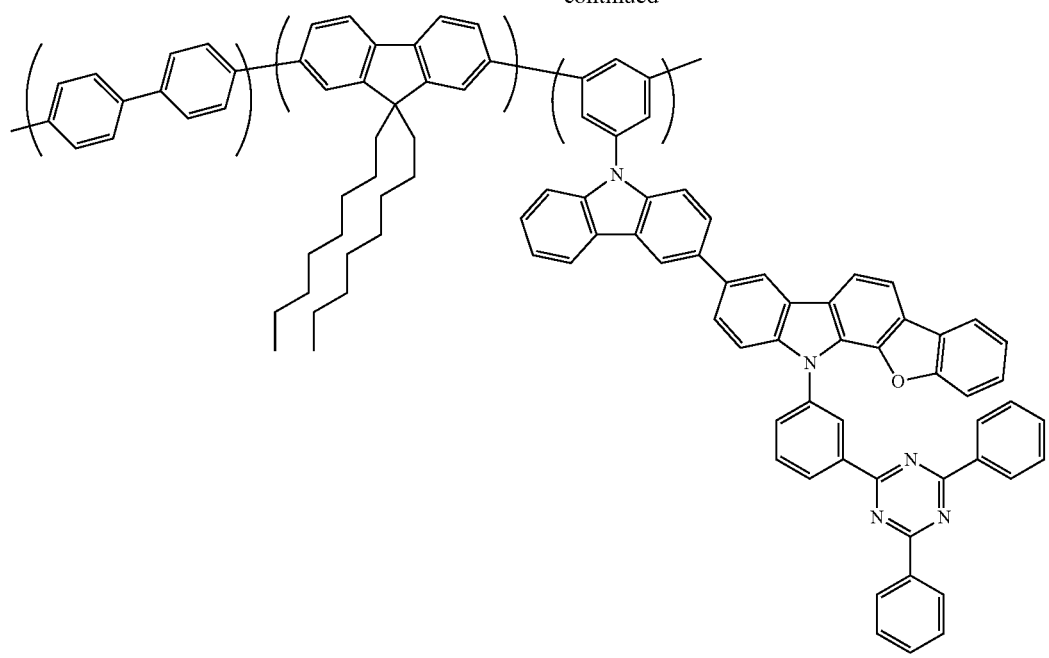
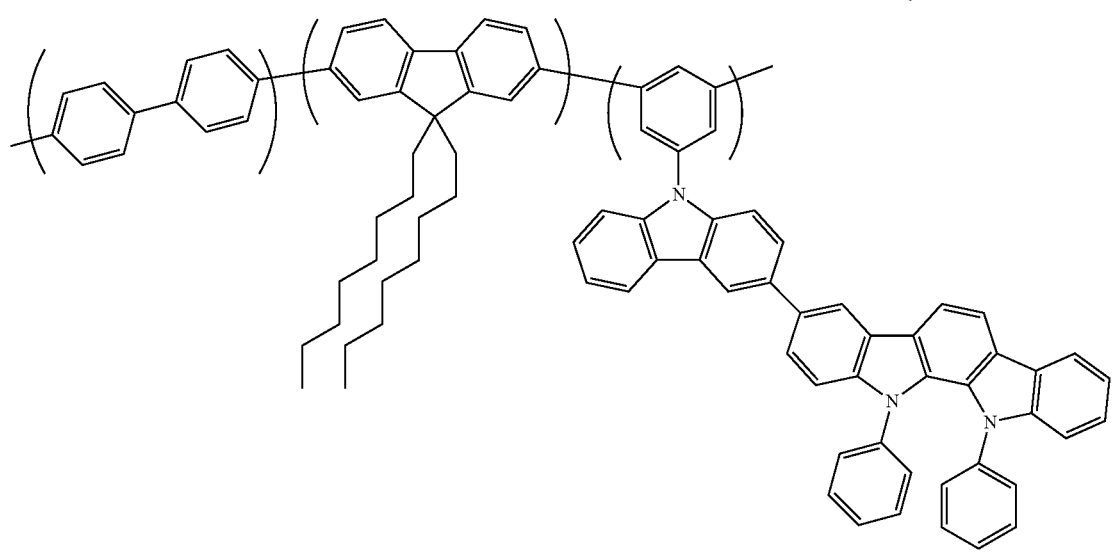
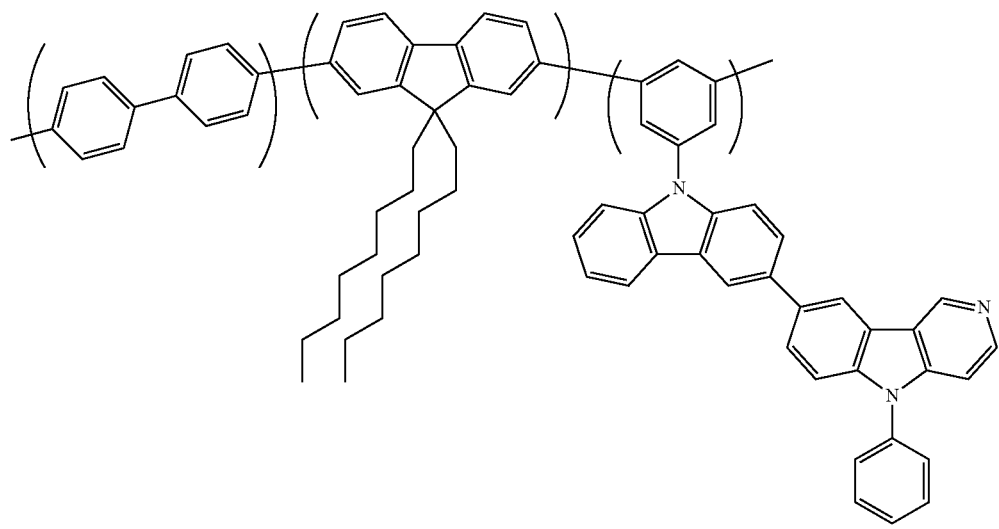

-continued
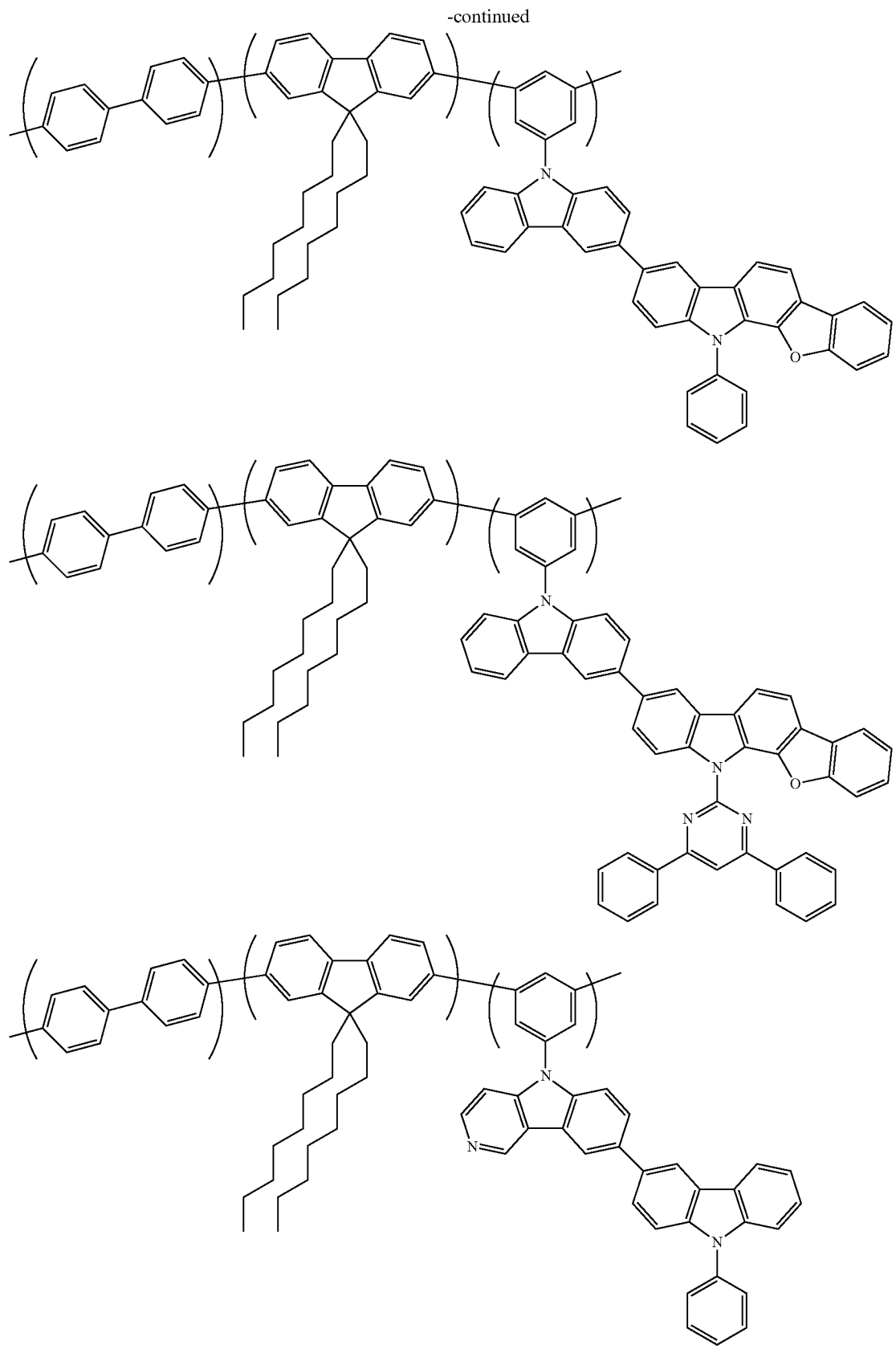

-continued
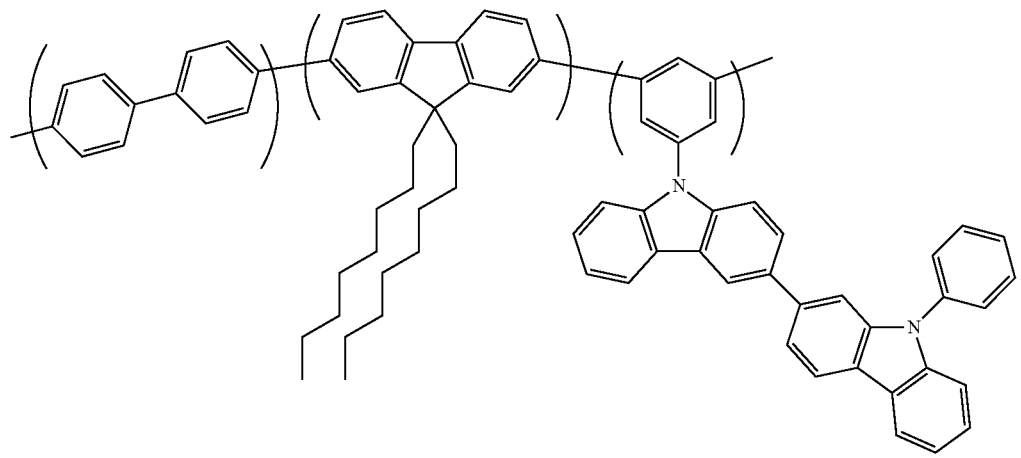
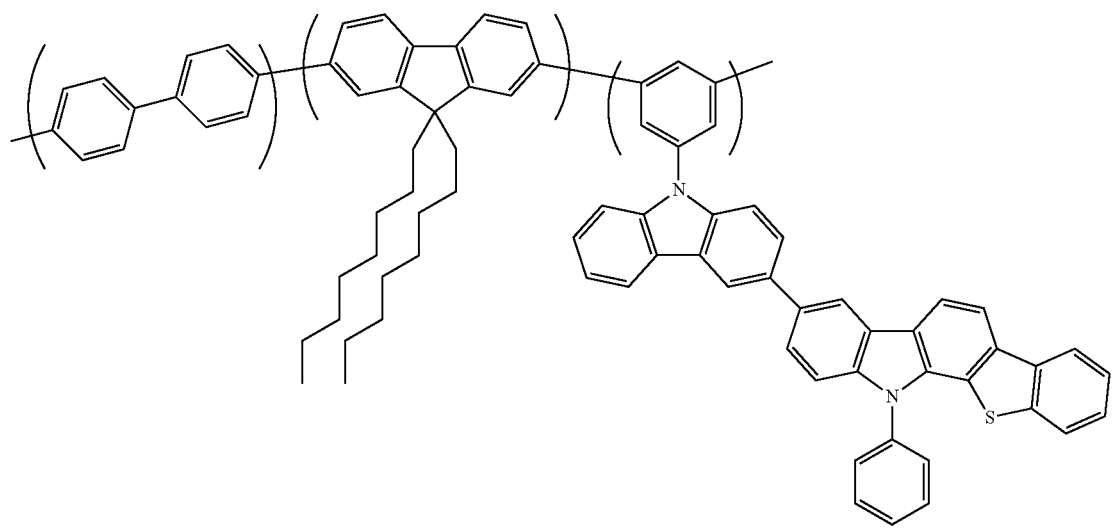
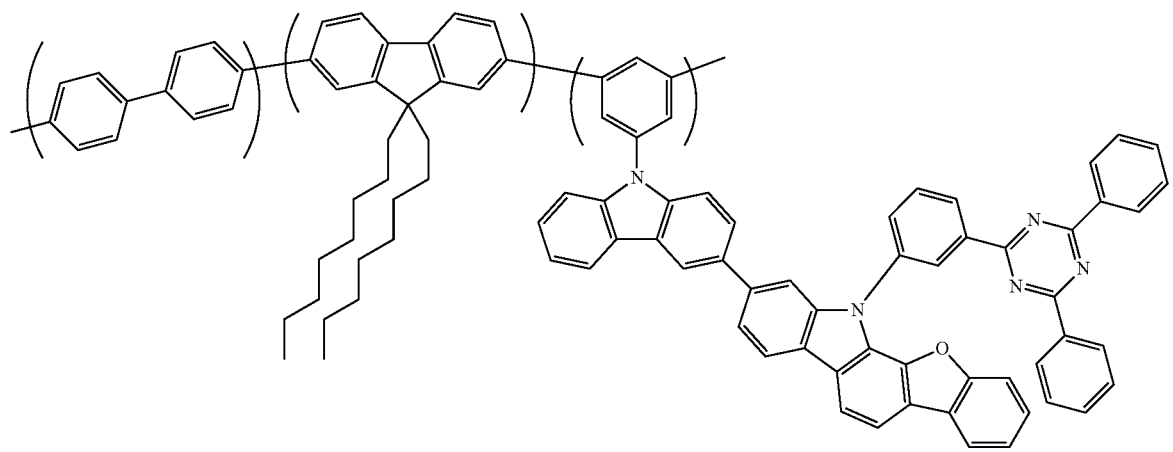

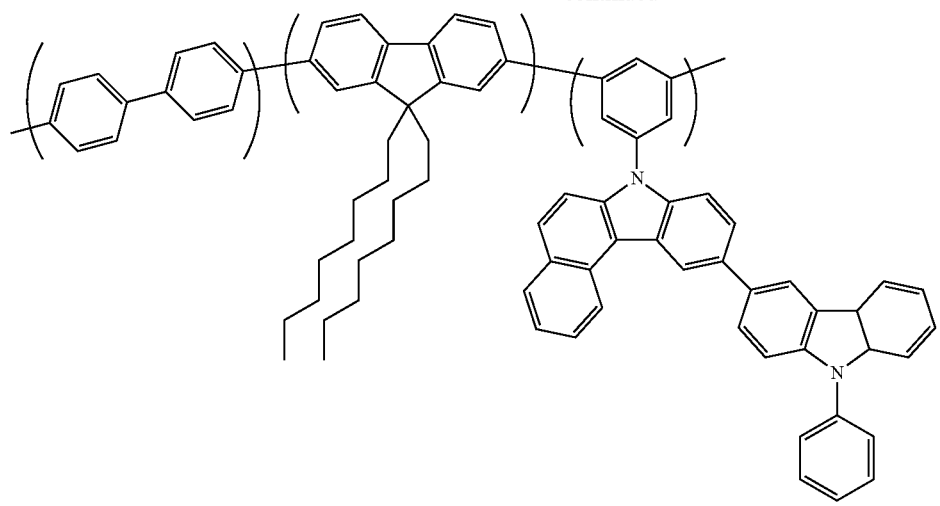
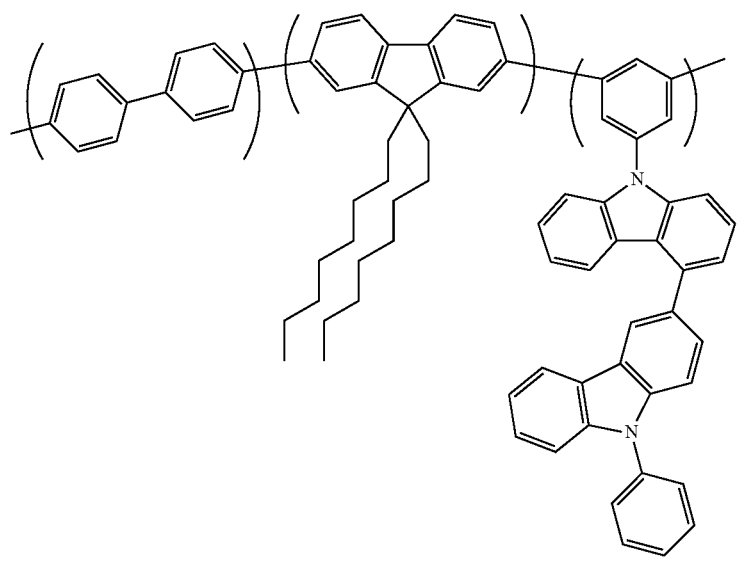
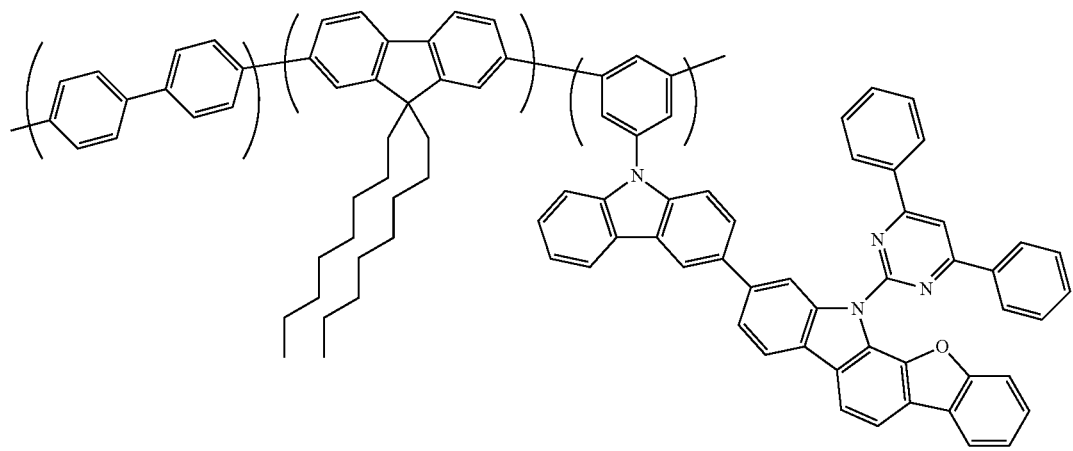

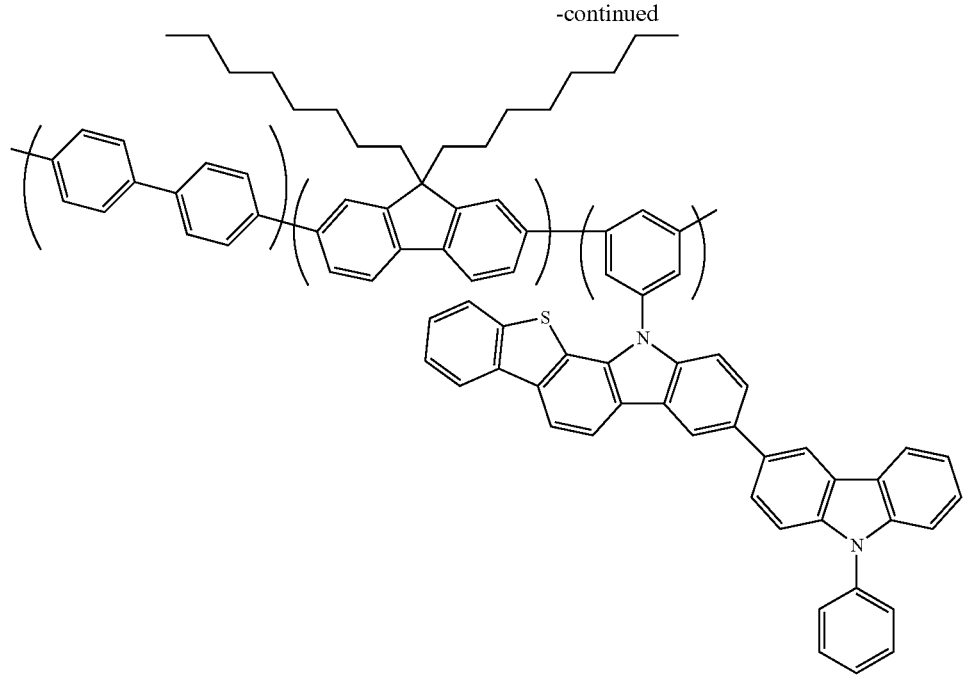
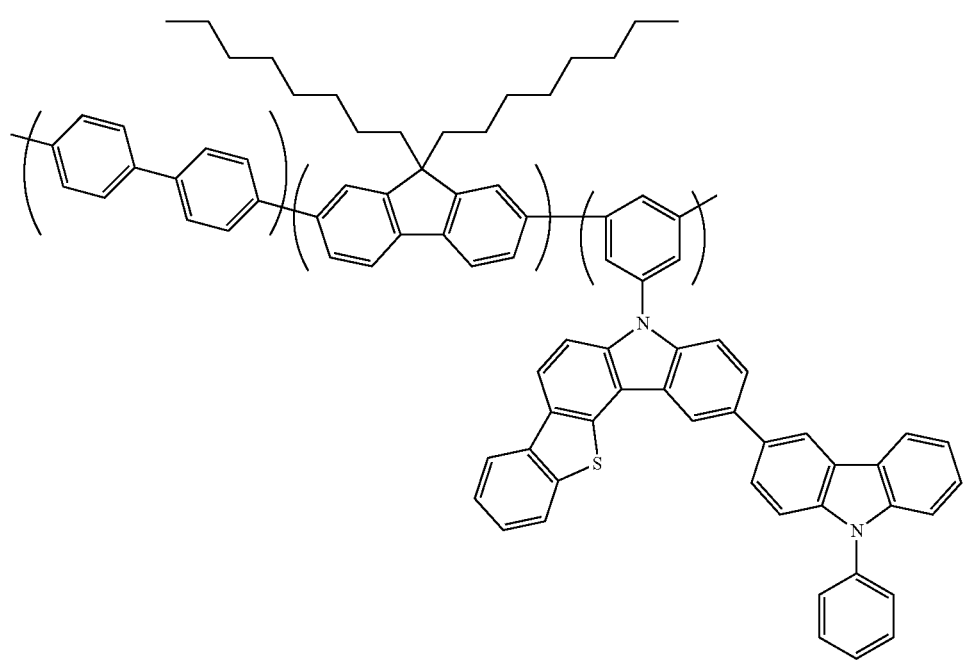

-continued
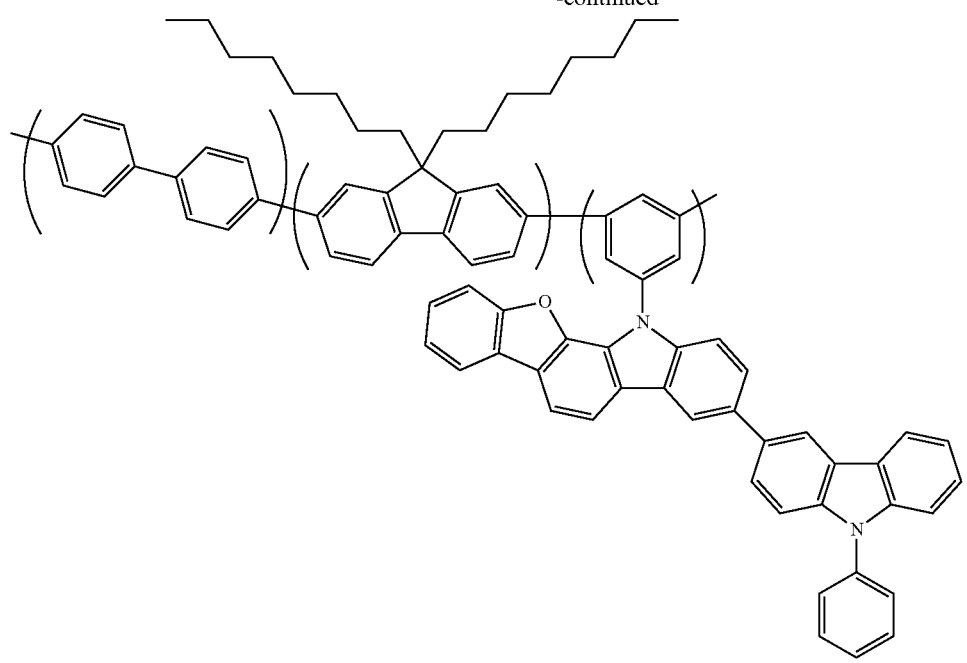
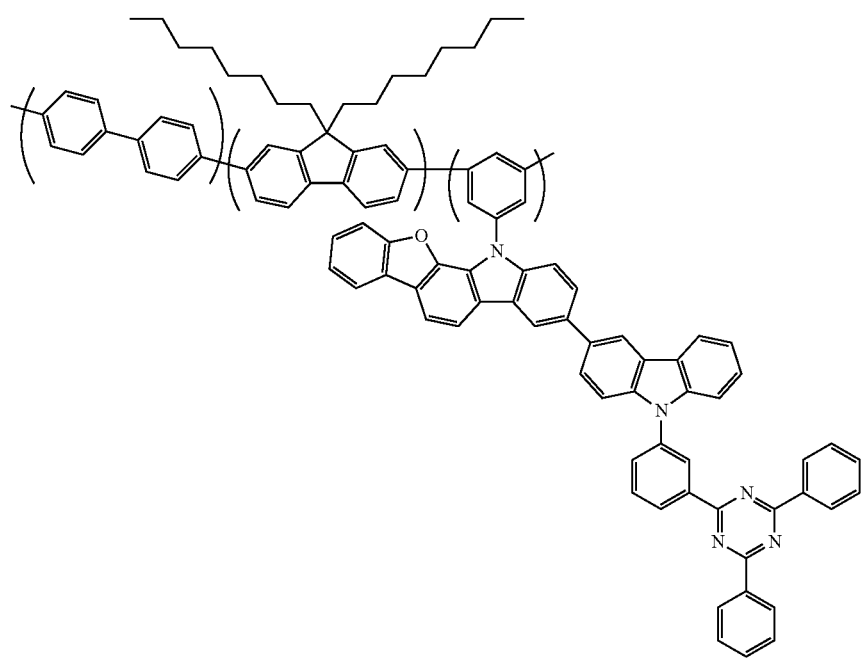

-continued
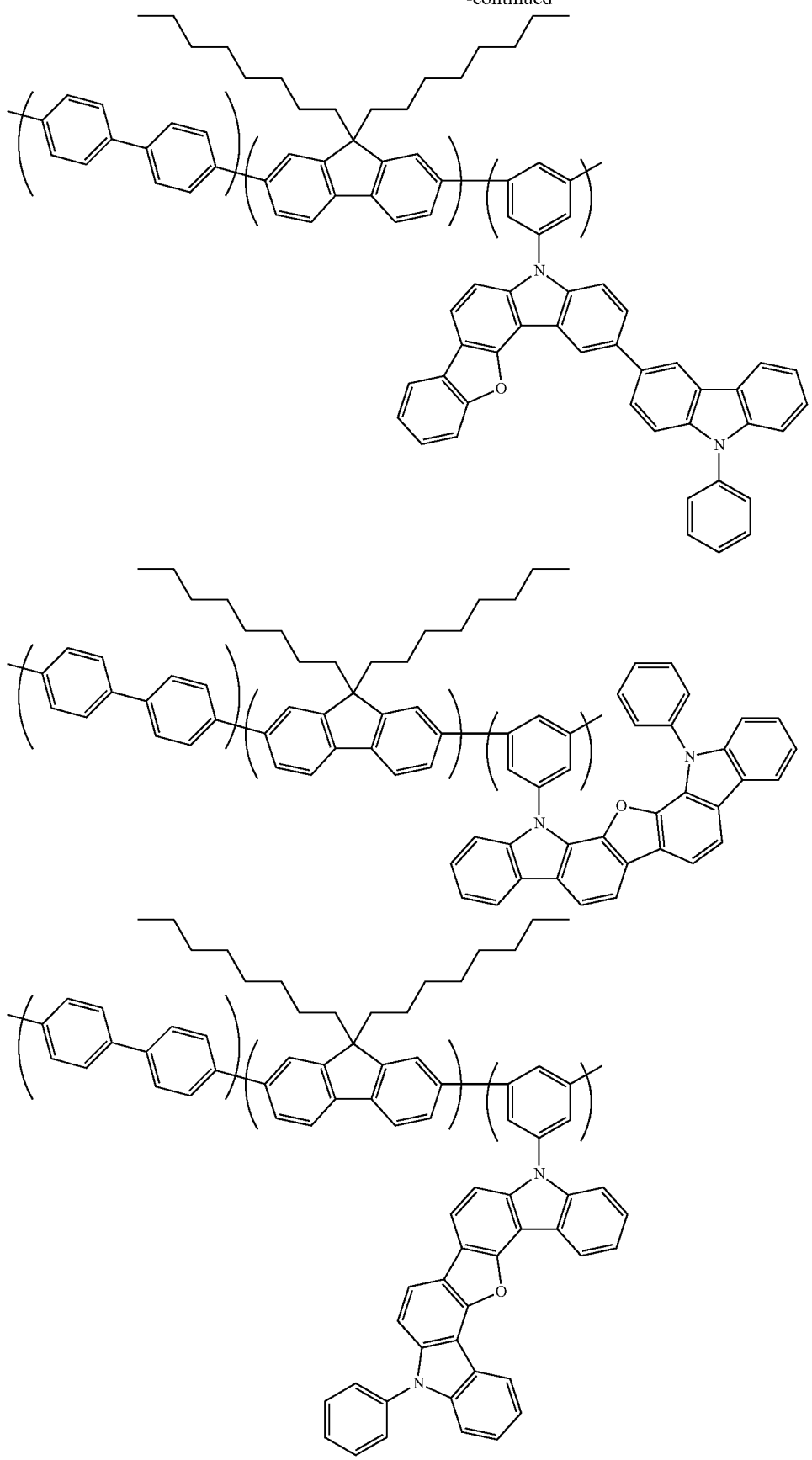

405
406
-continued
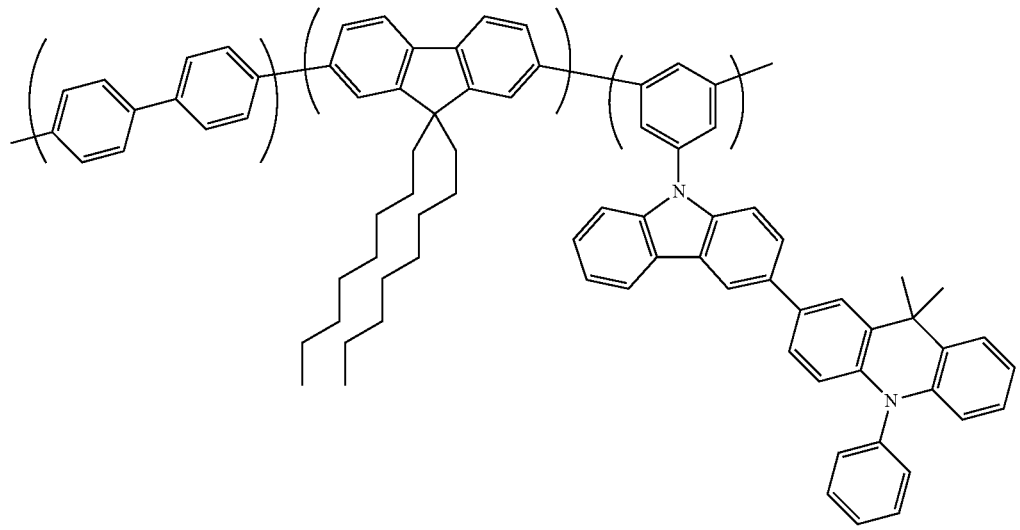
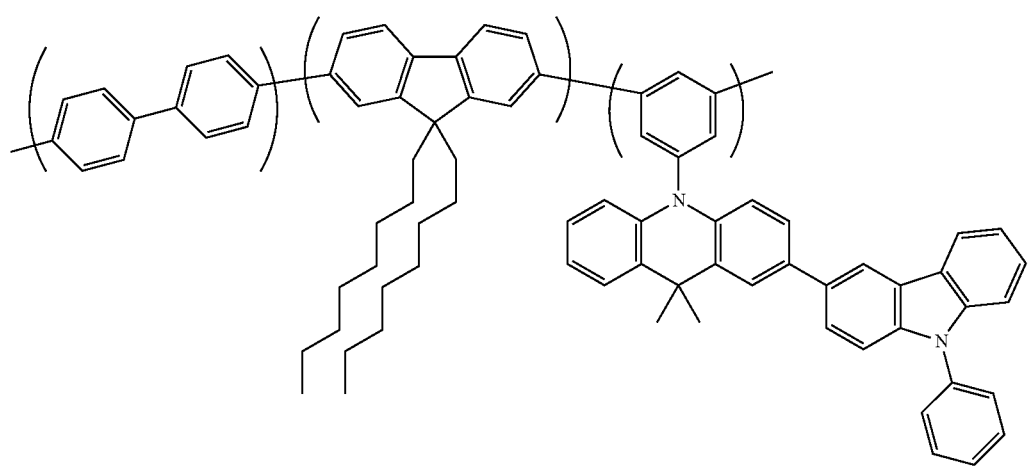
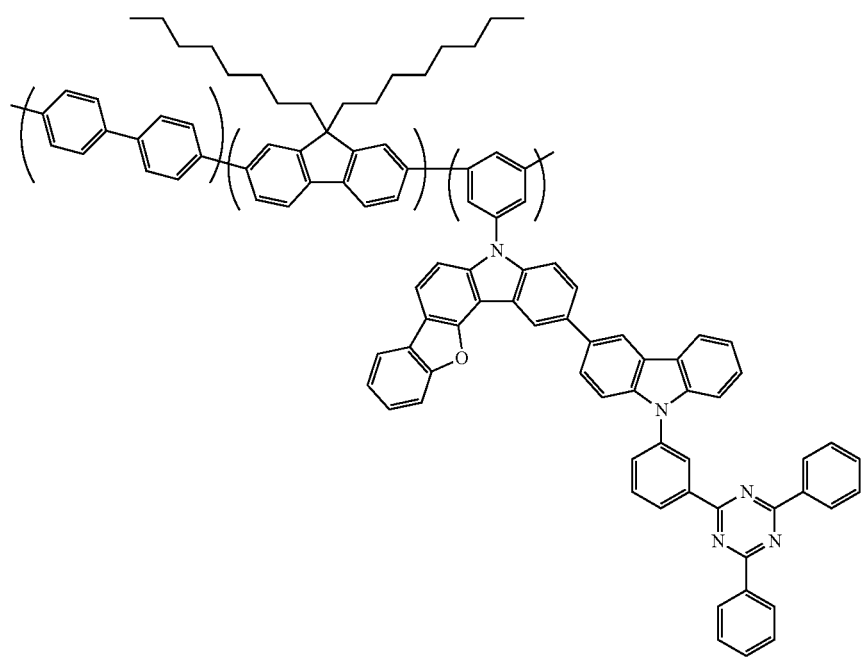

-continued
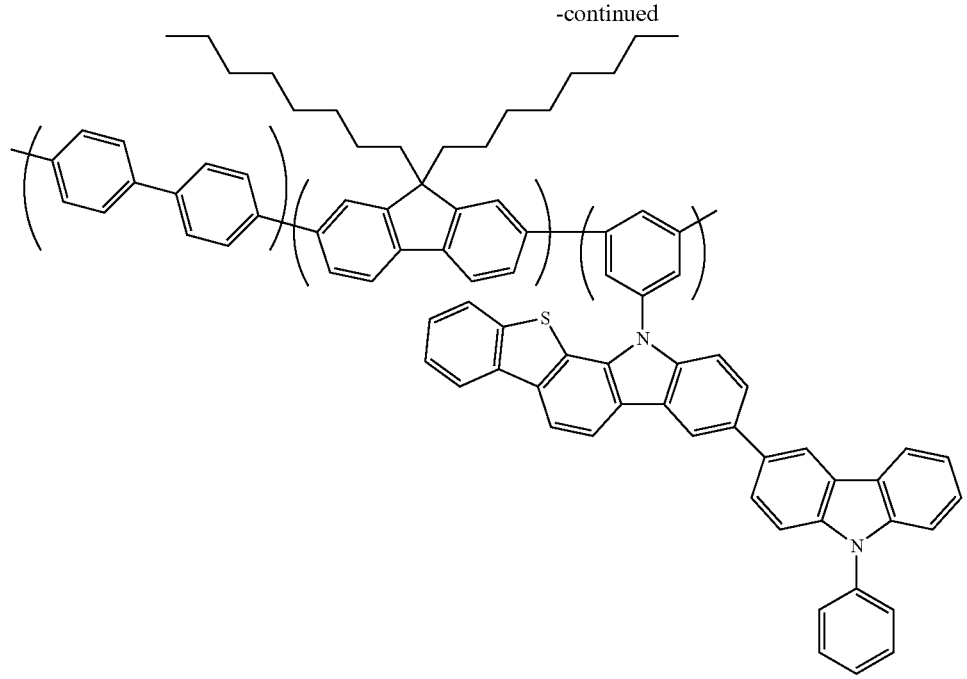
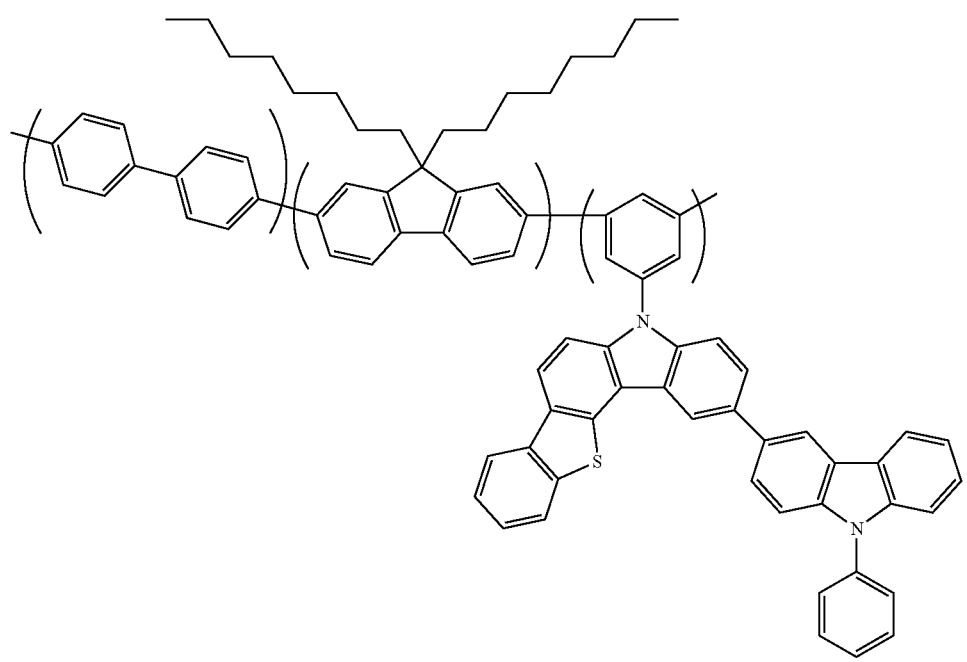

-continued
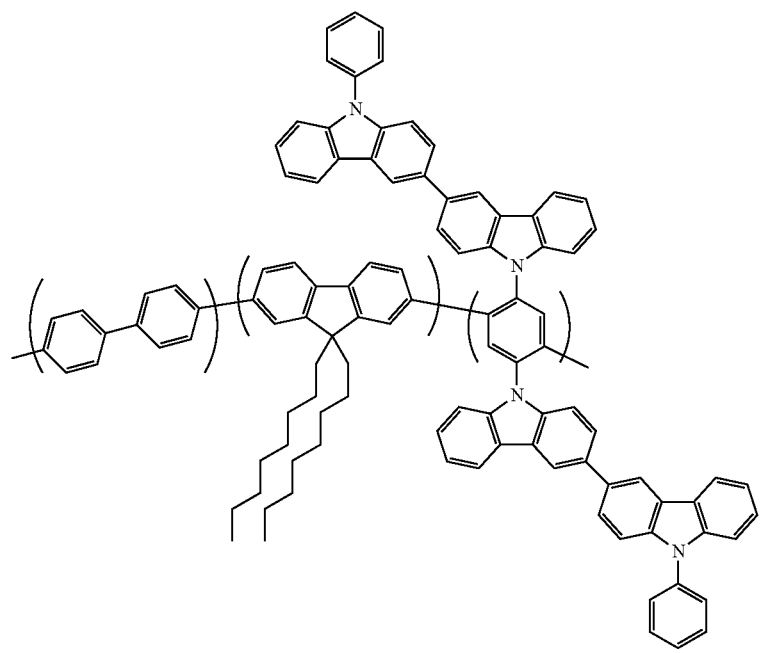
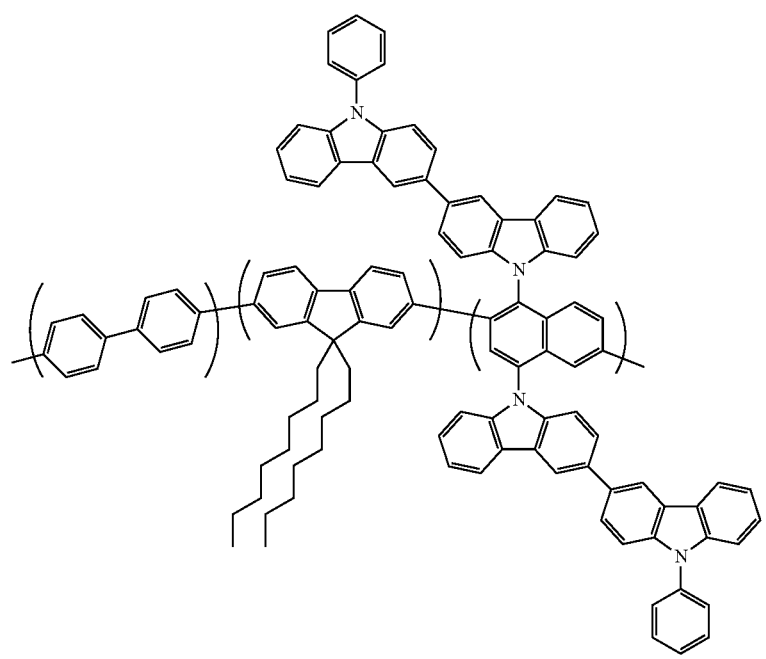

411 412
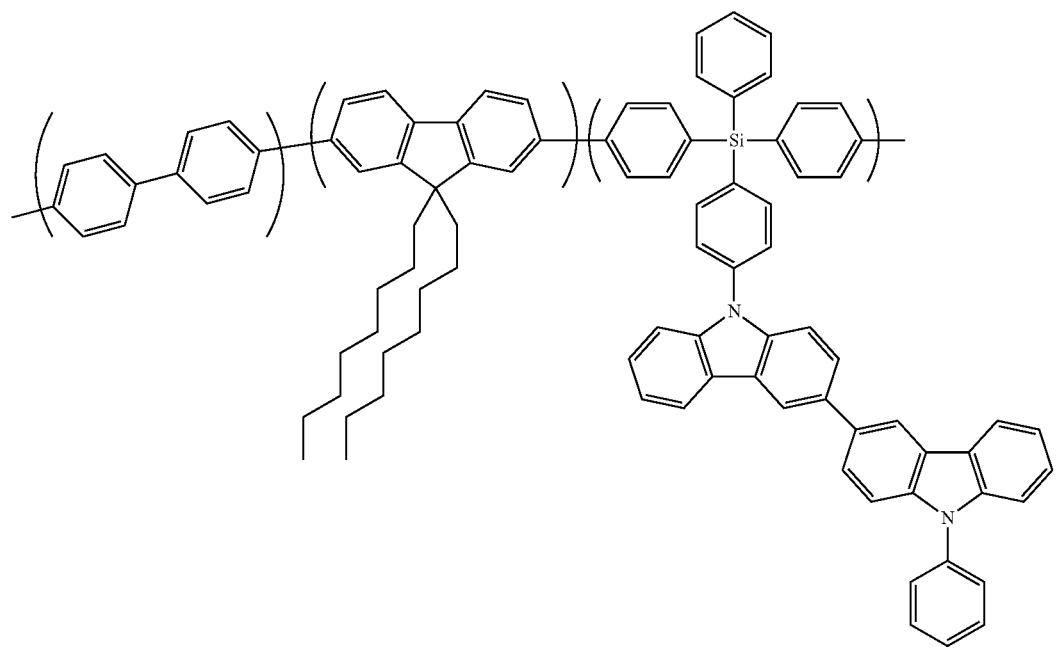
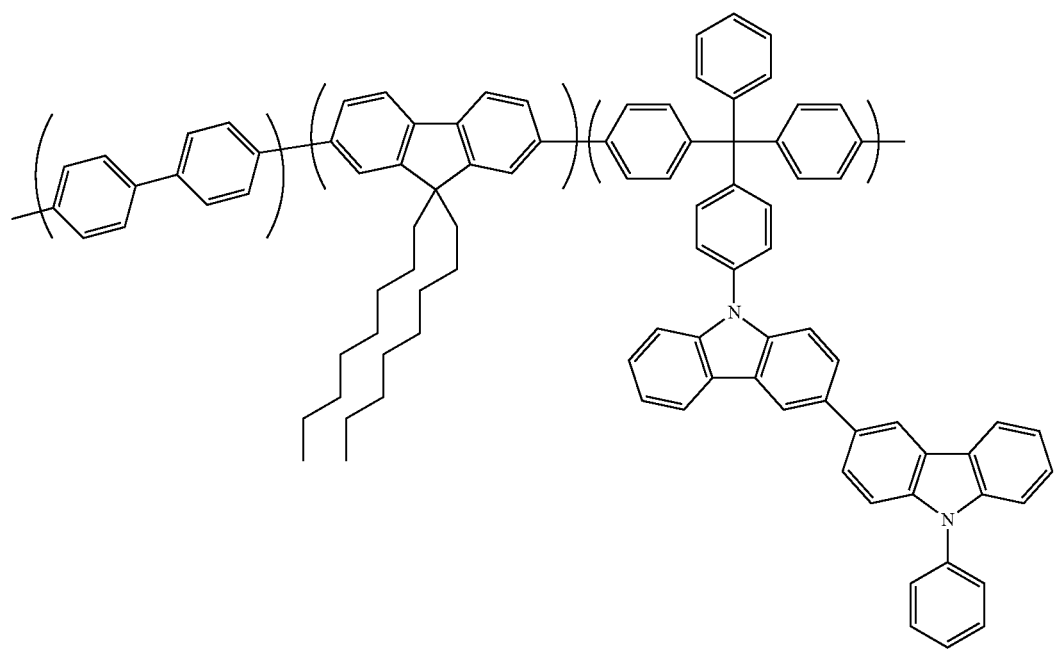

-continued
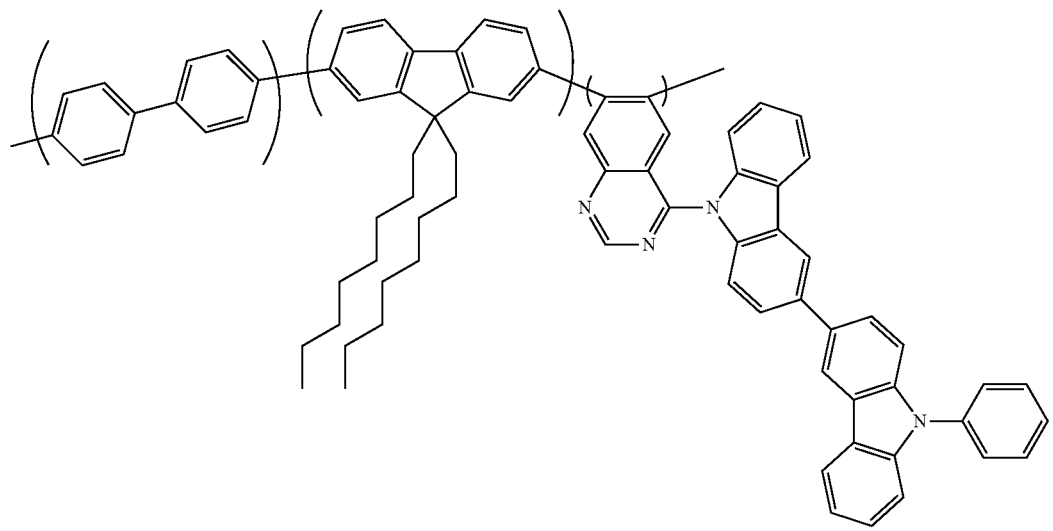
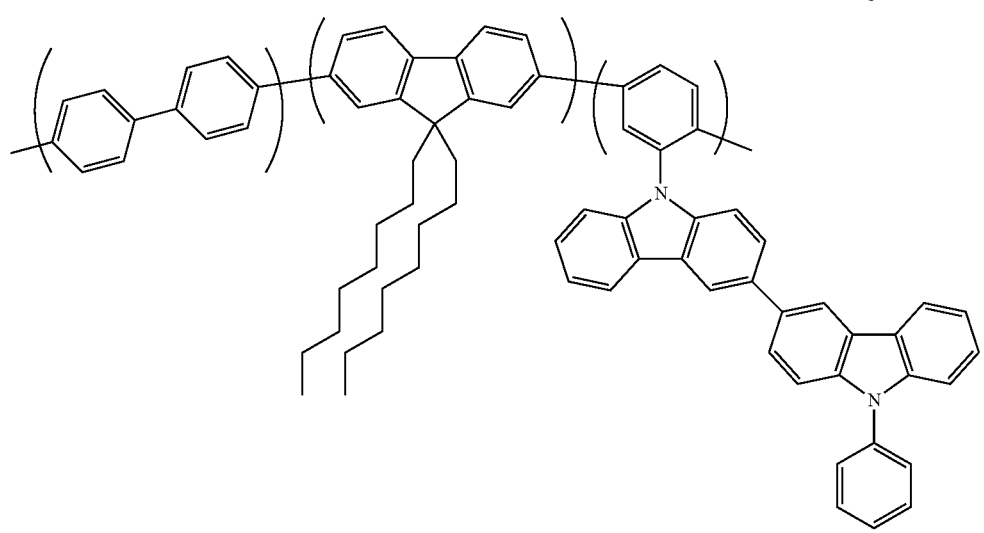
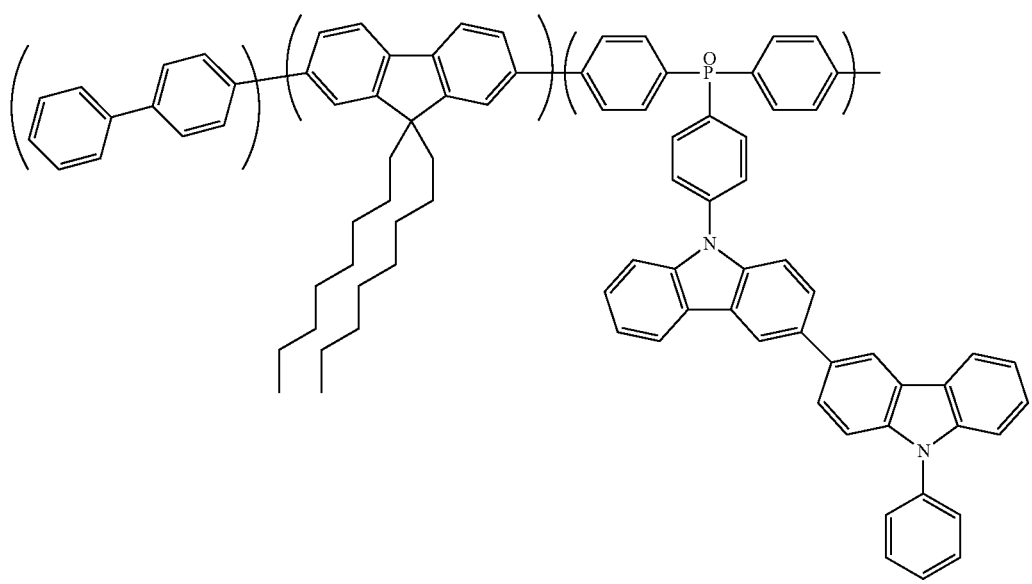

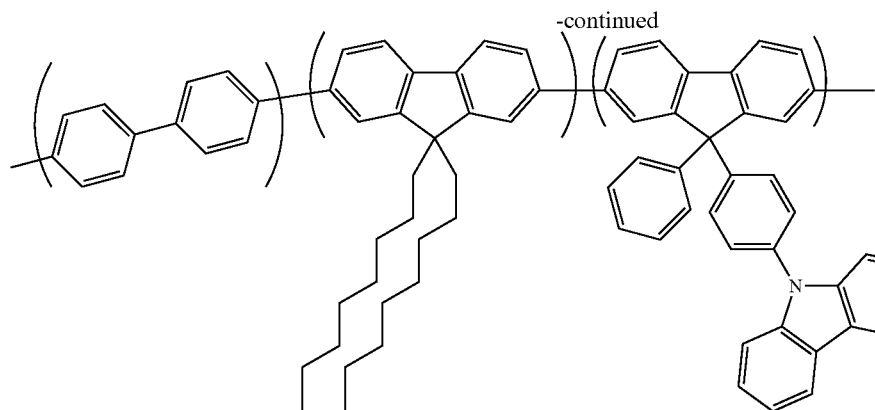
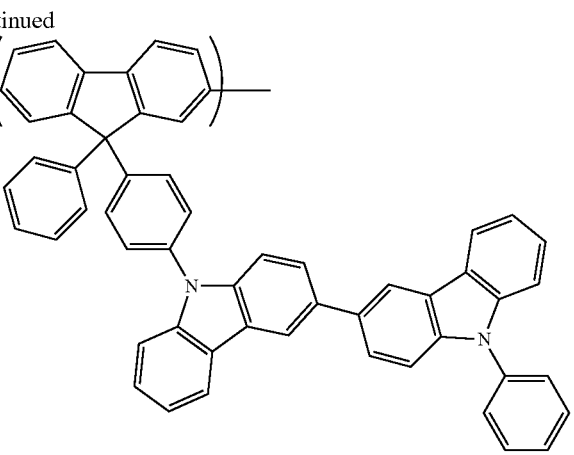

-continued

When the polymer compound of the present invention is a binary polymer of A-B not containing the unit C, it is desirable that any of the unit A or B has a structure having a high linearity similar to the unit C, since the polymer compound of the type secures viscosity increase.

When the polymer compound is a binary polymer of B-C not containing the unit A, it is desirable that the unit B has, as the substituent therein, those described in the section of the unit A, such as an alkyl group, a cycloalkyl group, an alkyl ether group, or a substituent selected from bulky groups such as those shown as the substituent in the unit A, in the part except L in the formula (1) or (2), since the polymer compound of the type secures improved solubility.

The polymer compound of the present invention must have a weight-average molecular weight of from 50,000 to 1,500,000, preferably from 50,000 to 1,000,000 in order to have a viscosity suitable for a coating method.

When the weight-average molecular weight is more than 1,500,000, then homogeneous film formation would be impossible owing to gelation in production of devices. On the other hand, when less than 50,000, then it may be difficult to control the solubility. The molecular weight distribution represented by Mw/Mn (where Mw is a weight-average molecular weight, and Mn is a number-average molecular weight) of the compound is, though not specifically defined, preferably smaller.

The number-average molecular weight and the weight-average molecular weight may be determined through calibration with standard polyethylene, according to size exclusion chromatography (SEC).

In the polymer compound of the present invention, the quantitative ratio of the unit A, the unit B and the unit C is not specifically defined. In general, the unit A accounts for from 0 to 95 mol %, the unit B accounts for from 5 to 95 mol %, and the unit C accounts for from 0 to 95 mol %. In the case of a binary copolymer of A-B, preferably, the unit A accounts for from 5 to 95 mol % and the unit B accounts for from 95 to 5 mol %. In the case of a binary copolymer of B-C, preferably, the unit B accounts for from 5 to 95 mol % and the unit C accounts for from 95 to 5 mol %.

The polymer compound of the present invention may contain any other constitutive unit than the above-mentioned unit A, unit B and unit C within a range not detracting from the advantageous effects of the present invention.

A method for producing the polymer compound of the present invention is not specifically defined. The compound may be produced through ordinary Suzuki coupling, using monomers corresponding to the above-mentioned unit A, unit B and unit C.

Regarding the polymerization catalyst to be used in the method, a palladium compound such as a Pd(II) salt, a Pd(0) complex or the like may be used. As the Pd(II) salt, preferred is Pd acetate, and as the Pd(0) complex, preferred is Pd(Ph$_3$P)$_4$ [Ph is a phenyl group]. When a Pd(II) salt is used, it is advantageous to add a phosphine derivative to the reaction mixture in an amount of from 2 to 8 molar equivalent relative to 1 mol of the Pd salt. Alternatively, a Pd(II)-Ph$_3$P complex, for example, PdCl$_2$(Ph$_3$P)$_2$ is used. The amount of Pd relative to the halide functional monomer (for example, monomer corresponding to the unit A, the unit B or the unit C) is preferably from $1\times10^{-6}$ mol to $1\times10^{-2}$ mol, more preferably from $1\times10^{-5}$ mol to $1\times10^{-2}$ mol, most preferably from $1\times10^{-4}$ mol to $5\times10^{-3}$ mol relative to one mol of the monomer. Falling within the range, there is a high possibility that a polymer compound having a weight-average molecular weight falling within a range of from 50,000 to 1,500,000 can be produced.

The solvent in polymerization is not specifically defined. For example, there are mentioned aromatic hydrocarbon solvents, aliphatic hydrocarbon solvent, ether solvents, N-methylpyrrolidone, N,N-dimethylformamide, N,N-dimethylacetamide, dimethylsulfoxide, acetonitrile, etc. One alone or two or more of these may be used here either singly or as combined.

The aromatic hydrocarbon solvents include benzene, toluene, xylene, mesitylene, etc.; the aliphatic hydrocarbon solvents include hexane, heptane, cyclohexane, methylcyclohexane, ethylcyclohexane, etc.; the ether solvents include diethyl ether, diisopropyl ether, ethylene glycol dimethyl ether, diethylene glycol dimethyl ether, 1,4-dioxane, tetrahydrofuran, etc.

Using a mixed solvent prepared by mixing an aromatic hydrocarbon solvent such as toluene or the like and an ether solvent such as 1,4-dioxane or the like is preferred as increasing the probability of providing a polymer compound having a weight-average molecular weight of from 50,000 to 1,500,000.

The pressure during polymerization is preferably from 0.01 to 10 MPa as an absolute pressure, more preferably from normal pressure to 1 MPa. A too high pressure is problematic in safety, therefore requiring a specific apparatus and lacking industrial applicability.

The reaction temperature is preferably from 0 to 200° C., more preferably from 50 to 150° C. When the temperature is too low, then the reaction rate lowers and the reaction time becomes long. When the temperature is too high, then the catalyst deactivates greatly and therefore a desired polymer could not be obtained.

In the present invention, typical polymerization modes are shown below.

The following is a polymerization example to give a polymer compound having an alternate copolymer structure.

thereby giving an alternate copolymer. In this, it is desirable that the molar number of the monomer Bm and the total molar number of the monomer Am and the monomer Cm are the same. When the supply of the monomer Am or the supply of monomer Cm is made to be zero, then a copolymer of A-B units alone or B-C units alone may be obtained.

The ratio of the A-B unit and the B-C unit may be controlled by controlling the source supply ratio of the monomer Am and the monomer Cm. For example, when the

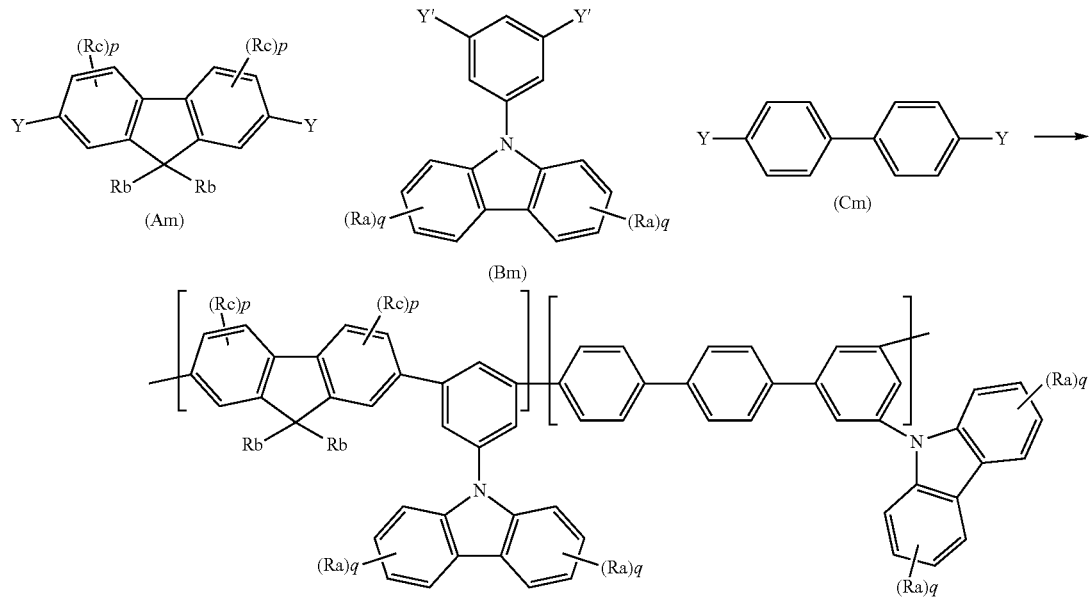

In the above, Ra, Rb and Rc are the same as those of the above-mentioned R, p and q each indicate an integer of from 0 to 3. When Y is I, Br, Cl, or $OSO_2(C_6H_4)CH_3$, Y' is a boronic acid or a boronate. When Y is a boronic acid or a boronate, Y' is made to be I, Br, Cl, or $OSO_2(C_6H_4)CH_3$, supply of the monomers Am, Bm and Cm is 0.6 mol, 1 mol and 0.4 mol, respectively, then a polymer containing 60 mol % of A-B units, and 40 mol % of B-C units is obtained.

On the other hand, for obtaining a random copolymer, monomers may be selected to be polymerized as follows.

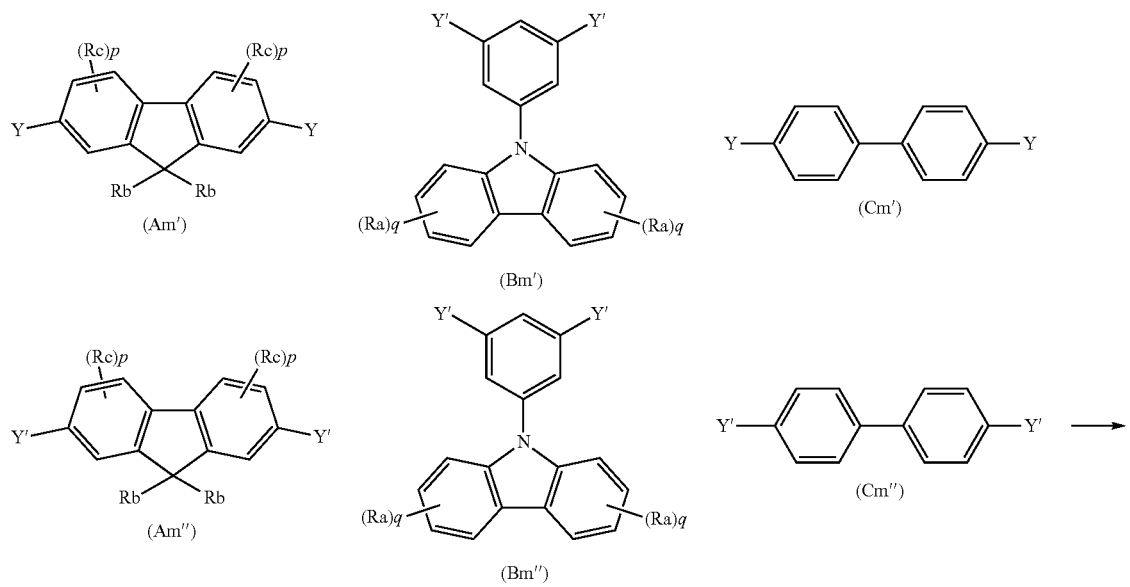

-continued

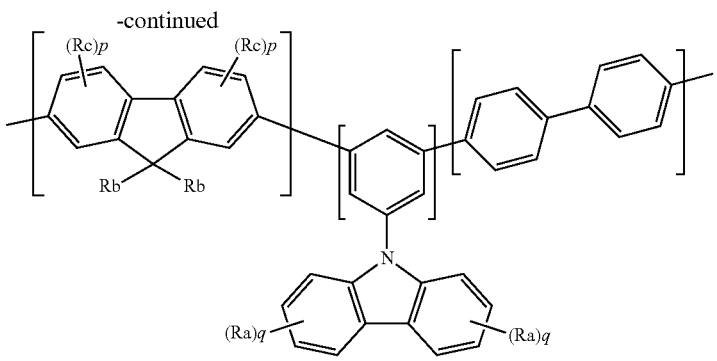

In the above, Ra, Rb, Rc, p and q are the same as described above. Y represents I, Br, Cl, or $OSO_2(C_6H_4)CH_3$, Y' represents a boronic acid or a boronate. For example, using (Am'), (Am"), (Bm'), (Bm"), (Cm') and (Cm") all in the same amount, then a complete random copolymer can be obtained.

The use of the polymer compound of the present invention enables a thin film to be formed according to a coating method. As the coating method, preferably employed is a wet-process film formation method. Concretely, employable here are a letterpress method, an intaglio printing method, a planographic printing method, a stencil printing method, a printing method comprising a combination of any of these methods and an offset printing method, an inkjet printing method, a dispenser coating method, a spin coating method, a bar coating method, a dip coating method, a spray coating method a slit coating method, a roll coating method, a cap coating method, a gravure roll coating method, a meniscus coating method, etc.

In particular, when micropatterning is required, preferred are a letterpress method, an intaglio printing method, a planographic printing method, a stencil printing method, a printing method comprising a combination of any of these methods and an offset printing method, an inkjet printing method, a dispenser coating method, etc. Also employable here is a method that comprises forming a film of the polymer compound on a transfer precursor substrate according to the above-mentioned wet-process film formation method followed by transferring the film onto a circuit board having intended electrodes, through laser irradiation or thermal pressing. The film formation according to these methods can be carried out according to conditions well known to those skilled in the art.

The coating liquid of the present invention contains the polymer compound of the present invention and a solvent. The polymer compound in the coating liquid may be dissolved or dispersed in the solvent therein.

The solvent is preferably an organic solvent, and its examples include, for example, chlorine-containing solvents such as chloroform, chlorobenzene, chlorotoluene, chloroxylene, chloroanisole, dichloromethane, dichlorobenzene, dichlorotoluene, dichloroethane, trichloroethane, trichlorobenzene, trichloromethylbenzene, bromobenzene, dibromobenzene, bromoanisole, etc.; ether solvents such as tetrahydrofuran, dioxane, dioxolane, oxazole, methylbenzoxazole, benzisoxazole, furan, furazane, benzofuran, dihydrobenzofuran, etc.; aromatic hydrocarbon solvents such as ethylbenzene, diethylbenzene, triethylbenzene, trimethylbenzene, trimethoxybenzene, propylbenzene, isopropylbenzene, diisopropylbenzene, dibutylbenzene, amylbenzene, dihexylbenzene, cyclohexylbenzene, tetramethylbenzene, dodecylbenzene, benzonitrile, acetophenone, methylacetophenone, methoxyacetophenone, ethyl toluate, toluene, ethyltoluene, methoxytoluene, dimethoxytoluene, trimethoxytoluene, isopropyltoluene, xylene, butylxylene, isopropylxylene, anisole, ethylanisole, dimethylanisole, trimethylanisole, propylanisole, isopropylanisole, butylanisole, methylethylanisole, anethole, anisyl alcohol, methyl benzoate, ethyl benzoate, propyl benzoate, butyl benzoate, diphenyl ether, butyl phenyl ether, benzyl methyl ether, benzyl ethyl ether, methylenedioxybenzene, methylnaphthalene, tetrahydronaphthalene, aniline, methylaniline, ethylaniline, butylaniline, biphenyl, methylbiphenyl, isopropylbiphenyl, etc.; aliphatic hydrocarbon solvents such as cyclohexane, methylcyclohexane, n-pentane, n-hexane, n-heptane, n-octane, n-nonane, n-decane, tetradecane, decalin, isopropylcyclohexane, etc.; ketone solvents such as acetone, methyl ethyl ketone, cyclohexanone, acetophenone, etc.; ester solvents such as ethyl acetate, butyl acetate, ethyl cellosolve acetate, methyl benzoate, phenyl acetate, etc.; polyalcohols and their derivatives such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol, etc.; alcohol solvents such as methanol, ethanol, propanol, isopropanol, cyclohexanol, etc.; sulfoxide solvents such as dimethyl sulfoxide, etc.; amide solvents such as N-methyl-2-pyrrolidone, N,N-dimethylformamide, etc. One alone or two or more of these organic solvents may be used here either singly or as combined.

Of those, preferred are toluene, xylene, ethylbenzene, amylbenzene, anisole, 4-methoxytoluene, 2-methoxytoluene, 1,2-dimethoxybenzene, mesitylene, tetrahydrofuran, cyclohexylbenzene, 2,3-dihydrobenzofuran, cyclohexanone, and methylcyclohexanone, from the viewpoint of the solubility, the uniformity in film formation and the viscosity characteristics thereof.

If desired, a viscosity regulator and a surface tension regulator may be added to the coating liquid. It is desirable that the viscosity regulator and the surface tension regulator are so selected that, even though remaining in films, they would not have any influence on the characteristics of devices, or those capable of being removed from films in the film formation step are preferably selected.

In the present invention, it is preferred that at least one polymer compound is contained in a solvent and the polymer compound is dispersed or dissolved therein to be a dispersion or a solution thereof.

In thin film formation, an antioxidant not having any influence on the performance of organic EL devices, such as a phosphorus-containing antioxidant or the like may be incorporated. Depending on the intended use, any other compound (for example, acceptor material) or the like may also be incorporated.

The polymer compound of the present invention is useful as a material for electronic devices, and a material for organic electroluminescent devices. As other electronic devices than organic electroluminescent devices, there are mentioned organic thin film solar cells and organic thin film transistors. The polymer compound of the present invention is especially favorable for a material for organic electroluminescent devices, particularly for a material for use in a light-emitting layer or a hole transportation area (hole transport layer, hole injection layer, etc.).

The organic EL device of the present invention is an organic electroluminescent device having an anode, a cathode and an organic thin film layer, in which at least one organic thin film layer contains the polymer compound of the present invention. The method for producing an organic EL device of the present invention is a method using the above-mentioned coating liquid containing the polymer compound of the present invention to form an organic thin film according to a coating method.

Preferably, the organic thin film containing the polymer compound of the present invention forms a hole transport region. The layer to be formed in the hole transport region includes a hole transport layer, a hole injection layer, etc. Preferably, the hole transport layer or the hole injection layer is adjacent to the above-mentioned light-emitting layer.

In the present invention, more preferably, the above-mentioned polymer compound is contained as the main component in at least one layer of the hole transport layer and the hole injection layer. Concretely, in the hole transport layer or the hole injection layer, the content of the polymer compound of the present invention is preferably from 51 to 100% by mass.

Typical device configurations of the organic EL device of the present invention include the following configurations (1) to (13).
(1) Anode/light-emitting layer/cathode
(2) Anode/hole injection layer/light-emitting layer/cathode
(3) Anode/light-emitting layer/electron injection layer/cathode
(4) Anode/hole injection layer/light-emitting layer/electron injection layer/cathode
(5) Anode/organic semiconductor layer/light-emitting layer/cathode
(6) Anode/organic semiconductor layer/electron barrier layer/light-emitting layer/cathode
(7) Anode/organic semiconductor layer/light-emitting layer/adhesion-improving layer/cathode
(8) Anode/hole injection layer/hole transport layer/light-emitting layer/electron injection layer/cathode
(9) Anode/insulation layer/light-emitting layer/insulation layer/cathode
(10) Anode/inorganic semiconductor layer/insulation layer/light-emitting layer/insulation layer/cathode
(11) Anode/organic semiconductor layer/insulation layer/light-emitting layer/insulation layer/cathode
(12) Anode/insulation layer/hole injection layer/hole transport layer/light-emitting layer/insulation layer/cathode
(13) Anode/insulation layer/hole injection layer/hole transport layer/light-emitting layer/electron injection layer/cathode Of those, in general, preferably used here is the configuration (8), which, however, is not limitative.

In the organic EL device of the present invention, any known one may be used for the other constitutive components than the organic thin film layer containing the polymer compound of the present invention. For example, for the light-emitting layer, there may be exemplified an embodiment containing a styrylamine compound, an arylamine compound or a fluoranthene compound.

To formation of the other layers than the organic thin film layer containing the polymer compound of the present invention, applicable here is any known method of a dry-process film formation method such as vacuum vapor deposition, sputtering, plasma, ion plating, etc.; a wet-process film formation method such as a coating method, e.g., spin coating, dipping, and flow coating, and a printing method, etc.

The thickness of each layer is not specifically defined, but each layer must be formed to have a suitable thickness. When the thickness is too large, then large voltage application is needed for obtaining a constant light output and the efficiency would be therefore poor. When the thickness is too small, then pin holes would form and a sufficient light emission brightness could not be realized even though an electric field is given to the device. In general, the film thickness is preferably from 5 nm to 10 µm, but is more preferably from 5 nm to 0.2 µm.

Using various materials and according to various layer formation methods, an anode, a light-emitting layer and optionally a hole injection/transport layer and further optionally an electron injection/transport layer are formed, and a cathode is formed thereby providing an organic EL device. An organic EL device may also be produced in the reverse order opposite to the above, or that is, from a cathode to an anode.

EXAMPLES

The present invention is described in more detail with reference to the following Examples, however, not overstepping the scope and the spirit thereof, the present invention is not limited to the following Examples.

The molecular weight and the viscosity of the polymer compound produced were measured in the manner mentioned below.
(1) Measurement of Molecular Weight For molecular weight measurement, employed was size exclusion chromatography (SEC). For the measurement, 10 mg of a sample was dissolved in 10 ml of THF (tetrahydrofuran), and 100 µl of the resultant solution was injected into the column. The flow rate was 1 ml/min, and the column temperature was set at 40° C. As the SEC apparatus, used here was Tosoh Corporation's HLC-8220. As the detector, used was a differential refractometric (RI) detector or a ultraviolet-visible light (UV) detector. As the columns, used were two columns of Tosoh Corporation's TSKgel GMH-XL and one column of TSKgel G2000-XL. As the standard sample polystyrene, used was Tosoh Corporation's TSK standard polystyrene.
(2) Measurement of Viscosity The produced polymer compound and anisole were weighed to provide 2% by mass in a vial tube, and heated with stirring therein at 90° C. to prepare a solution for viscosity measurement. For viscosity measurement, used was an oscillating viscometer under a condition of room temperature (in a clean room set at 23.5° C.).

Synthesis Example 1

Synthesis of 9-(3,5-dibromophenyl)-9H-carbazole

The above compound was synthesized according to the synthesis method described in non-patent literature (Tetrahedron Letters, 52, (2011), 6942-6947). 25.08 g of carbazole [MW 167.21; 150 mmol], 70.83 g of 1,3,5-tribromobenzene [MW 314.80; 225 mmol], 2.86 g of cuprous iodide [MW 190.45; 15 mmol], 2.97 g of 1,10-phenanthroline monohydrate [MW 198.22; 15 mmol], 41.46 g of potassium carbonate [MW 138.21; 300 mmol] and 300 mL of N,N-dimethylformamide (DMF) were put into a 1,000-mL three-necked flask equipped with a condenser tube, and purged with argon. With stirring, this was heated up to 165° C. in an oil bath (DMF reflux), and reacted for 5.5 hours. The reaction liquid was cooled to room temperature and 120 mL of water was added thereto, and then this was extracted with 1,200 mL of toluene. The organic layer was washed twice with 600 mL of pure water, and then the solvent was evaporated away to give a crude product of 9-(3,5-dibromophenyl)-9H-carbazole. This was column-purified to give 29.90 g of 9-(3,5-dibromophenyl)-9H-carbazole [Mw 401.1; 74.5 mmol] represented by the following structural formula. The nuclear magnetic resonance spectrum of this compound was measured with JEOL's GSX-400 (trade name, resolution 400 MHz).

1H NMR (CDCl$_3$): 7.25-7.55 (m, 6H), 7.68 (d, 211, J=1.5 Hz), 7.75 (s, 1H), 8.1 (d, 2H, J=7.5 Hz)

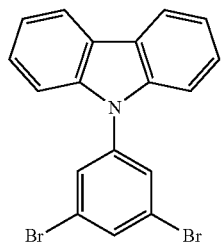 [SMILES: Brc1cc(Br)cc(-n2c3ccccc3c3ccccc32)c1]

Synthesis Example 2

Synthesis of 5-(9-carbazolyl)-1,3-bis(2-chloropyrimidin-5-yl)benzene 10.03 g [25 mmol] of 9-(3,5-dibromophenyl)-9H-carbazole synthesized in Synthesis Example 1, 9.50 g of 2-chloropyrimidine-5-boronic acid (by Luminescence Technology) [MW 158.35; 60 mmol], 722 mg of tetrakistriphenylphosphine palladium [MW 1155.6; 0.625 mmol], 10.60 g of sodium carbonate [MW 105.99; 100 mmol], 150 mL of dimethoxyethane and 50 mL of pure water were put in a 300-mL three-neck flask equipped with a condenser tube, and purged with argon. With stirring, this was heated up to 100° C. in an oil bath, and reacted for 8 hours. The reaction liquid was cooled to room temperature, and 500 mL of toluene was added thereto to separate the aqueous layer. The organic layer was washed twice with 200 mL of pure water, and the solvent was evaporated away to give a crude product of 5-(9-carbazolyl)-1,3-bis(2-chloropyrimidin-5-yl)benzene. This was column-purified to give 6.79 g of 5-(9-carbazolyl)-1,3-bis(2-chloropyrimidin-5-yl)benzene [Mw 468.34; 14.5 mmol] represented by the following structural formula.

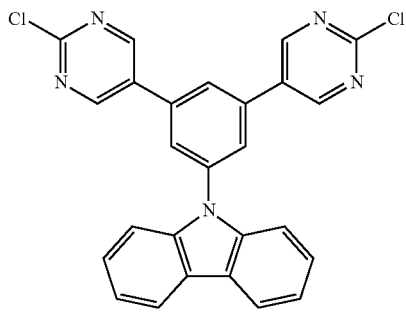 [SMILES: Clc1ncc(-c2cc(-c3cnc(Cl)nc3)cc(-n3c4ccccc4c4ccccc43)c2)cn1]

Synthesis Example 3

Synthesis of 2-(3,6-di-tert-butylcarbazol-9-yl-4,6-dichloropyrimidine 864 mg of sodium hydride [MW 23.99; 36 mmol] and 60 mL of N,N-dimethylformamide (DMF) were put in a 200-mL three-neck flask equipped with a stirrer and a thermometer, and purged with argon. After this was cooled in an ice bath, 8.38 g of 3,6-di-tert-butylcarbazole (by Sigma Aldrich) [MW 279.42; 30 mmol] dissolved in 60 mL of DMF was dropwise added thereto in such a manner that the inner temperature was controlled to be not higher than 5° C. After the dropwise addition, the ice bath was removed, and this was restored to room temperature and kept stirred for 1 hour to prepare an Na reagent.

6.05 g of 2,4,6-trichloropyrimidine [MW 183.42; 33 mmol] and 90 mL of DMF were put in a 300-mL flask equipped with a stirrer and a thermometer, purged with argon, and stirred with cooling in an ice bath. The previously-prepared Na reagent was dropwise added to this in such a manner that the reaction temperature was controlled to be not higher than 5° C. After the dropwise addition, the ice bath was removed, and this was restored to room temperature and kept stirred for 1 hour.

The reaction liquid was slowly added to 420 mL of pure water, then 500 mL of toluene was further added thereto, and stirred. After the aqueous layer was removed, the toluene layer was washed twice with 200 mL of pure water. After liquid-liquid separation, toluene was evaporated away to give a crude product of 2-(3,6-di-tert-butylcarbazol-9-yl)-4,6-dichloropyrimidine.

This was column-purified to give 7.04 g of 2-(3,6-di-tert-butylcarbazol-9-yl)-4,6-dichloropyrimidine [MW 426.38; 16.5 mmol] represented by the following structural formula.

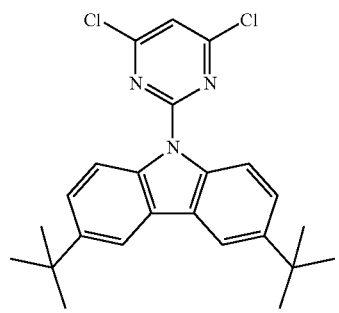 [SMILES: CC(C)(C)c1ccc2c(c1)c1cc(C(C)(C)C)ccc1n2-c1nc(Cl)cc(Cl)n1]

Synthesis Example 4

Synthesis of 5,5'-dibromo-2,2'-bipyridine

The above compound was synthesized according to the synthesis method described in non-patent literature (Journal of Chemical Society, Perkin Transactions 1, 10, (2002), 1226-1231). 9.48 g of 2,5-dibromopyridine [MW 236.89; 40 mmol], 6.55 g of hexamethyl ditin [MW 327.63; 20 mmol], 924 mg of tetrakistriphenylphosphine palladium [MW 1155.6; 0.8 mmol] and 300 mL of benzene were put into a 500-mL three-neck flask equipped with a condenser tube, and purged with argon. After heated under reflux for 65 hours, this was cooled to room temperature, and 300 mL of ether was added thereto whereupon a white solid precipitated out. The filtered precipitate was column-purified to give 4.74 g of 5,5'-dibromo-2,2'-bipyridine [MW 313.98; 15.1 mmol] represented by the following structural formula.

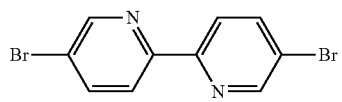

Synthesis Example 5

Synthesis of 1,4-dioctylbenzene-2,5-diboronic acid bispinacol ester 11.76 g of 1,4-dichlorobenzene [MW 147.00; 80 mmol], 49 mg of [1,3-bis(diphenylphosphino)propane]nickel(II) dichloride [MW 542.04; 0.09 mmol] and 60 mL of anhydrous diethyl ether were put into a 300-mL flask equipped with a stirrer and an thermometer, purged with argon, and cooled in an ice bath. To this, dropwise added was 200 mL of 1.0 M n-octylmagnesium bromide tetrahydrofuran solution (by Tokyo Chemical Industry) in such a manner that the reaction temperature was controlled to be not higher than 5° C. After the dropwise addition, the reaction liquid was refluxed for 8 hours. After cooled, the reaction liquid was added to 100 mL of 1 N HCl to cause deactivation, and then extracted with 300 mL of ether. The ether layer was washed twice with 200 mL of pure water, and the organic layer was dried over anhydrous magnesium sulfate. Magnesium sulfate was removed, and ether was distilled away to give a crude product of 1,4-octylbenzene. This was further distilled to give 21.84 g of 1,4-dioctylbenzene [MW 302.54: 72.2 mmol] represented by the following structural formula.

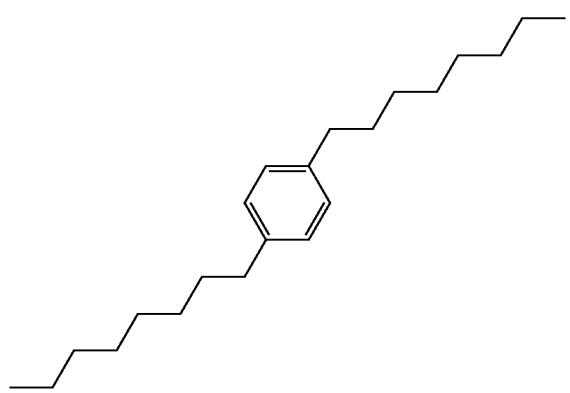 [SMILES: CCCCCCCCc1ccc(CCCCCCCC)cc1]

21.84 g of 1,4-dioctylbenzene produced according to the above-mentioned method, 92 mg of iodine [MW 126.90; 0.72 mmol] and 50 mL of dichloromethane were put into a 200-mL flask equipped with a stirrer and a thermometer, and purged with argon. To this, dropwise added was 24.23 g of bromine [MW 159.81: 151.6 mmol], and stirred for one day at room temperature. A aqueous 20% KOH solution was added thereto until the bromine color disappeared, and then the aqueous layer was removed. The organic layer was washed twice with 50 mL of pure water, and then dichloromethane was distilled away to give a crude product of 2,5-dibromo-1,4-dioctylbenzene. Further, this was column-purified to give 27.90 g of 2,5-dibromo-1,4-dioctylbenzene [MW 460.33; 60.6 mmol] represented by the following structural formula.

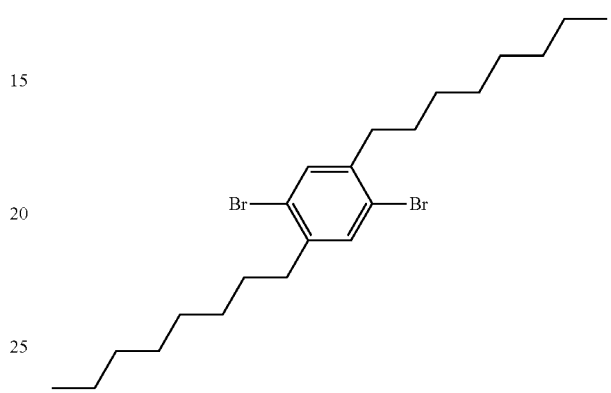

27.90 g of 2,5-dibromo-1,4-dioctylbenzene produced according to the above-mentioned method, 23.27 g of 4,4, 5,5-tetramethyl-1,3,2-dioxabororan [MW 127.98; 181.8 mmol], 24.53 g of triethylamine [MW 101.19; 242.4 mmol], 2.11 g of bis(triphenylphosphine) palladium(II) dichloride [MW 701.90; 3.0 mmol] and 250 mL of toluene were put into a 500-mL flask equipped with a reflux condenser, a stirrer and a thermometer, and purged with argon. This was heated in an oil bath and reacted at a reaction temperature of 100° C. for 1 hour. The reaction liquid was cooled, and then the organic layer was washed twice with 100 mL of diluted hydrochloric acid and 100 mL of pure water. The solvent was evaporated away to give a crude product of 1,4-dioctylbenzene-2,5-diboronic acid bispinacol ester. This was column-purified to give 26.56 g of 1,4-dioctylbenzene-2,5-diboronic acid bispinacol ester [MW 554.46; 47.9 mmol] represented by the following structural formula.

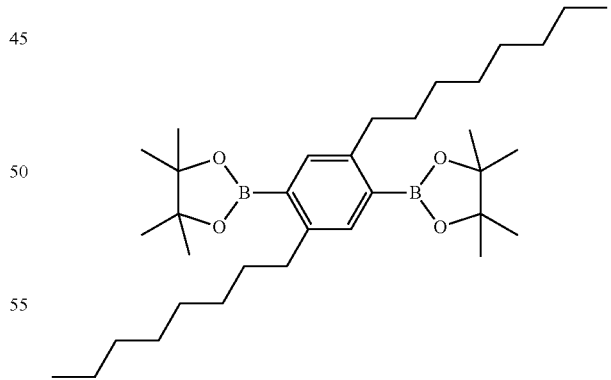

Example 1

Synthesis of copolymer of 9.9-dioctylfluorene and phenylcarbazole (Polymerization)

2.570 g of 2,2'-(9,9-dioctyl-9H-fluorene-2,7-diyl)bis(4,4, 5,5-tetramethyl-1,3,2-dioxaborane) (by Luminescence Technology) [Mw 642.60; 4 mmol], 1.604 g of 9-(3,5-dibromophenyl)-9H-carbazole [Mw 401.10; 4 mmol] synthesized in Synthesis Example 1, 1.8 mg of palladium acetate [MW 224.51; 8 μmol], 9.7 mg of tris(2-methylphenyl)phosphine [Mw 304.37; 32 μmol], 2.764 g of potassium carbonate [Mw 138.21; 20 mmol], 9 mL of toluene, 36 mL of 1,4-dioxane and 7.6 mL of pure water were put into a 100-mL three-neck flask equipped with a condenser tube, and purged with argon with stirring. This was polymerized by heating in an oil bath at 100° C. for 12 hours. After 12 hours, the reaction liquid was transferred to a separatory funnel, 100 mL of toluene was added thereto, left statically as such, and the aqueous layer was removed. This was washed twice with 50 mL of pure water, and the organic layer was filtered through 5 C filter paper. The organic layer was concentrated to dryness, then 50 g of toluene was added thereto and the polymer was dissolved under heat, and then the toluene solution was reprecipitated with 500 mL of methanol. The precipitated solid was filtered and dried to give 2.438 g of a polymer having a repeating unit mentioned below.

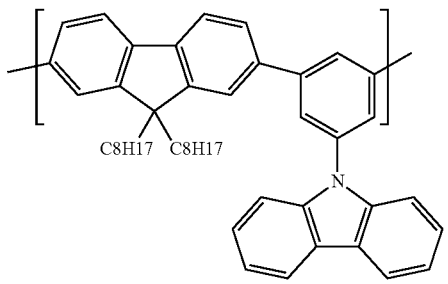

(Capping Treatment: Capping of Polymer Terminal)

2.00 g of the polymer produced according to the above-mentioned operation, 1.570 g of phenyl bromide [Mw 157.01; 10 mmol], 45 mg [0.2 mmol] of palladium acetate, 244 mg [0.8 mmol] of tris(2-methylphenyl)phosphine, 2.764 g [20 mmol] of potassium carbonate, 22.5 mL of toluene, 22.5 mL of 1,4-dioxane and 22.5 m of pure water were put into a 100-mL three-neck flask equipped with a condenser tube, and substituted with argon with stirring. This was reacted by heating in an oil bath at 100° C. for 8 hours. After 12 hours, the reaction liquid was transferred into a separatory funnel, then 100 mL of toluene was added thereto, and left statically as such, and then the aqueous layer was removed. This was washed twice with 50 mL of pure water, and the organic layer was filtered through 5 C filter paper. The organic layer was concentrated to dryness, 50 g of toluene was added to dissolve the polymer under heat, and the toluene solution was reprecipitated with 500 mL of methanol. The precipitated solid was filtered to give 1.90 g of a polymer.

1.80 g of the polymer resulting from the above-mentioned operation, 1.219 g of phenylboronic acid [Mw 121.93; 10 mmol], 45 mg [0.2 mmol] of palladium acetate, 244 mg [0.8 mmol] of tris(2-methylphenyl)phosphine, 2.764 g [20 mmol] of potassium carbonate, 22.5 mL of toluene, 22.5 mL of 1,4-dioxane and 22.5 m of pure water were put into a 100-mL three-neck flask equipped with a condenser tube, and substituted with argon with stirring. This was reacted by heating in an oil bath at 100° C. for 8 hours. After 8 hours, the reaction liquid was transferred into a separatory funnel, then 100 mL of toluene was added thereto, and left statically as such, and then the aqueous layer was removed. This was washed twice with 50 mL of pure water, and the organic layer was filtered through 5 C filter paper. The organic layer was concentrated to dryness, 50 g of toluene was added to dissolve the polymer under heat, and the toluene solution was reprecipitated with 500 mL of methanol. The precipitated solid was filtered to give 1.80 g of a polymer.

Mw of the resultant polymer was $3.5 \times 10^5$, and the molecular weight distribution expressed by Mw/Mn thereof was 13.3.

The viscosity (solution viscosity) of the resultant polymer was measured, and was 4.1 mPa·s.

The solution viscosity was measured using an oscillating viscometer. An anisole solution of 2% by mass of the polymer was prepared, and the viscosity thereof was measured at room temperature. In the following Examples, the same method shall apply to the viscosity measurement.

Comparative Example 1

Synthesis of copolymer of 9,9-dioctylfluorene and phenylcarbazole

A copolymer was synthesized according to the same method as in Example 1 except that the polymerization was carried out according to the method mentioned below. The polymerization condition was determined with reference to non-patent literature (Advanced Functional Materials, 2007, 17, 3808-3815).

(Polymerization)

2.570 g of 2,2'-(9,9-dioctyl-9H-fluorene-2,7-diyl)bis(4,4,5,5-tetramethyl-1,3,2-dioxaborane) (by Luminescence Technology) [MW 642.60; 4 mmol], 1.604 g of 9-(3,5-dibromophenyl)-9H-carbazole [MW 401.10; 4 mmol] synthesized in Synthesis Example 1, 185 mg of tetrakistriphenylphosphine palladium [MW 1155.59; 0.16 mmol], 2.764 g of potassium carbonate [MW 138.21: 20 mmol], 45 mL of toluene, 100 mg of methyltri-n-octylammonium chloride [by Aldrich, trade name: Aliquat 336] and 7.6 mL of pure water were put into a 100-mL three-neck flask equipped with a condenser tube, and purged with argon with stirring. This was polymerized by heating in an oil bath at 100° C. for 12 hours. After 12 hours, the reaction liquid was transferred to a separatory funnel, 100 mL of toluene was added thereto, left statically as such, and the aqueous layer was removed. This was washed twice with 50 mL of pure water, and the organic layer was filtered through 5 C filter paper. The organic layer was concentrated to dryness, then 50 g of toluene was added thereto and the polymer was dissolved under heat, and then the toluene solution was reprecipitated with 500 mL of methanol. The precipitated solid was filtered and dried to give 2.344 g of a polymer having a repeating unit mentioned above.

After capping treatment, the resultant polymer weighed 1.26 g.

Mw of the resultant polymer was $3.7 \times 10^4$, and the molecular weight distribution expressed by Mw/Mn thereof was 2.64.

The viscosity of the resultant polymer was measured, and was 2.8 mPa·s. As compared with that in Example 1, the molecular weight was small and the viscosity was low.

Example 2

Synthesis of terpolymer of 9,9-dioctylfluorene, phenylcarbazole and 4,4-biphenyl (Polymerization)

2.570 g of 2,2'-(9,9-dioctyl-9H-fluorene-2,7-diyl)bis(4,4,5,5-tetramethyl-1,3,2-dioxaborane) (by Luminescence Technology) [MW 642.60; 4 mmol], 0.802 g of 9-(3,5-dibromophenyl)-9H-carbazole synthesized in Synthesis Example 1, 0.624 g of 4,4'-dibromobiphenyl [MW 312.00; 2 mmol], 1.8 mg of palladium acetate [MW 224.51; 8 μmol], 19.5 mg of tris(2-methylphenyl)phosphine [Mw 304.37; 32 μmol], 2.764 g of potassium carbonate [Mw 138.21; 20 mmol], 15 mL of toluene, 30 mL of 1,4-dioxane and 7.6 mL of pure water were put into a 100-mL three-neck flask equipped with a condenser tube, and purged with argon with stirring. This was polymerized by heating in an oil bath at 100° C. for 12 hours. After 12 hours, the reaction liquid was transferred to a separatory funnel, 100 mL of toluene was added thereto, left statically as such, and the aqueous layer was removed. This was washed twice with 50 mL of pure water, and the organic layer was filtered through 5 C filter paper. The organic layer was concentrated to dryness, then 75 g of toluene was added thereto and the polymer was dissolved under heat, and then the toluene solution was reprecipitated with 500 mL of methanol. The precipitated solid was filtered and dried to give 2.319 g of a polymer having a repeating unit mentioned below.

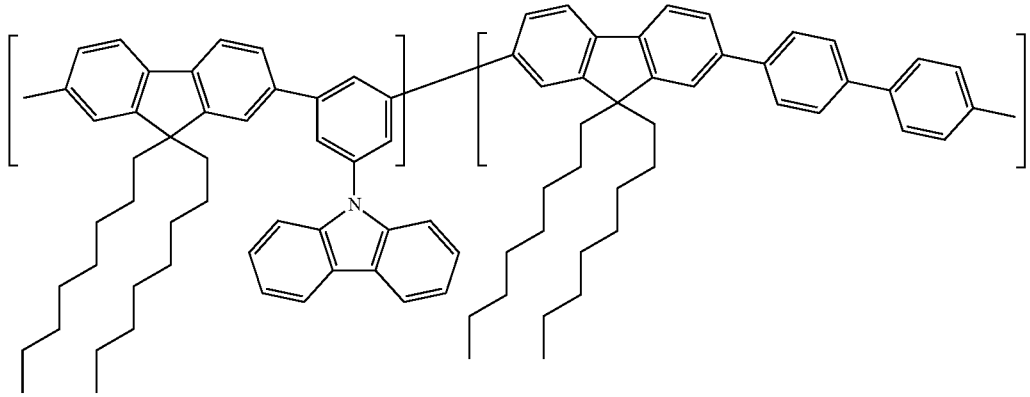

Mw of the resultant polymer was $3.7 \times 10^5$, and the molecular weight distribution expressed by Mw/Mn thereof was 7.3.

The viscosity of the resultant polymer was measured, and was 46.6 mPa·s. Relative to the molecular weight thereof, the polymer has a large viscosity, which indicates the effect of the introduction of the biphenylene group (unit C) in addition to the conversion to high molecular weight.

Example 3

Synthesis of copolymer of 9,9-dioctylfluorene, phenylcarbazole and trans-stilbene 2.196 of a polymer having a repeating unit mentioned below was produced according to the same method as in Example 2 except that 0.676 g of 4,4'-dibromotrans-stilbene (by Tokyo Chemical Industry) [MW 338.0; 2 mmol] was used in place of 0.624 g of 4,4'-dibromobiphenyl.

Mw of the resultant polymer was $1.8 \times 10^5$, and the molecular weight distribution expressed by Mw/Mn thereof was 4.9. The viscosity of the resultant polymer was measured, and was 31.8 mPa·s.

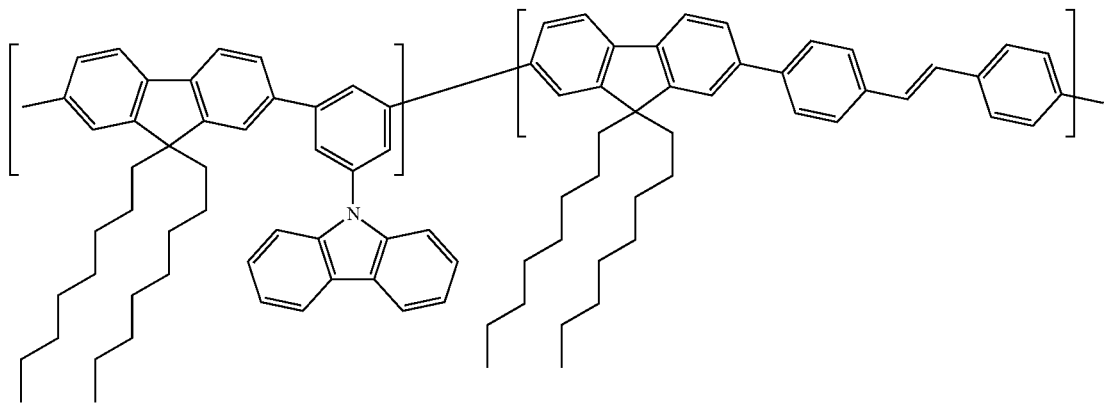

Example 4

Synthesis of copolymer of 9,9-dioctylfluorene and 5-(9-carbazolyl)-1,3-(bispyrimidin-2-yl)benzene 2.945 of a polymer having a repeating unit mentioned below was produced according to the same method as in Example 1 except that 1.873 g of 5-(9-carbazolyl)-1,3-bis(2-chloropyrimidin-5-yl)benzene synthesized in Synthesis Example 2 [MW 468.30; 4.0 mmol] was used in place of 1.604 g of 9-(3,5-dibromophenyl)-9H-carbazole.

Mw of the resultant polymer was $1.8 \times 10^5$, and the molecular weight distribution expressed by Mw/Mn thereof was 7.1.

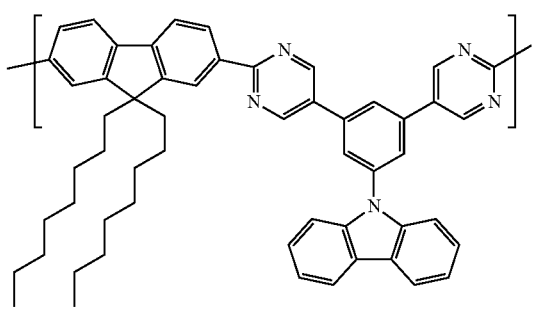

Example 5

Synthesis of copolymer of 9,9-dioctylfluorene and 5-(3,6-di-tert-butyl-9-carbazolyl)pyrimidine 2.815 of a polymer having a repeating unit mentioned below was produced according to the same method as in Example 1 except that 1.706 g of 2-(3,6-di-tert-butylcarbazol-9-yl)-4,6-dichloropyrimidine synthesized in Synthesis Example 3 [MW 426.40; 4.0 mmol] was used in place of 1.604 g of 9-(3,5-dibromophenyl)-9H-carbazole.

Mw of the resultant polymer was $2.1 \times 10^5$, and the molecular weight distribution expressed by Mw/Mn thereof was 10.9.

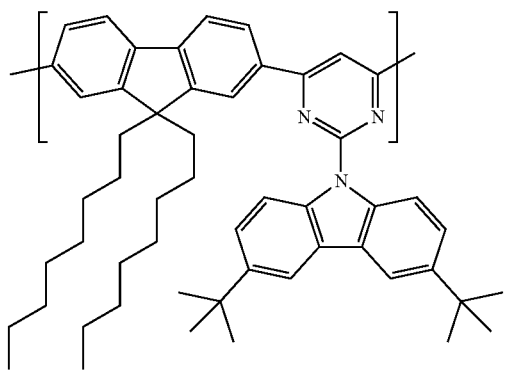

Example 6

Synthesis of copolymer of 9,9-dioctylfluorene, 5-(3,6-di-tert-butyl-9-carbazolyl)pyrimidine and 2,2'-bipyridine 2.423 of a polymer having a repeating unit mentioned below was produced according to the same method as in Example 2 except that 0.853 g of 2-(3,6-di-tert-butylcarbazol-9-yl)-4,6-dichloropyrimidine synthesized in Synthesis Example 3 [MW 426.40; 2.0 mmol] was used in place of 0.802 g of 9-(3,5-dibromophenyl)-9H-carbazole and that 0.628 g of 5,5'-dibromo-2,2'-bipyridine synthesized in Synthesis Example 4 [MW 313.98; 2.0 mmol] was used in place of 0.624 g of 4,4'-dibromobiphenyl.

Mw of the resultant polymer was $1.5 \times 10^5$, and the molecular weight distribution expressed by Mw/Mn thereof was 5.9.

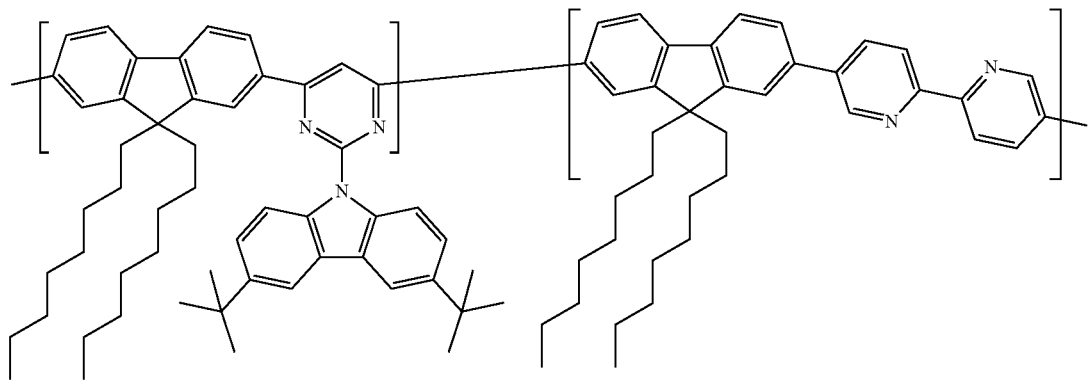

Example 7

Synthesis of copolymer of 1,4-dioctylbenzene, phenylcarbazole and biphenyl 1.790 of a polymer having a repeating unit mentioned below was produced according to the same method as in Example 2 except that 2.218 g of 1,4-dioctylbenzene-2,5-diboronic acid bispinacol ester synthesized in Synthesis Example 5 [MW 554.46; 4.0 mmol] was used in place of 2.570 g of 2,2'-(9,9-dioctyl-9H-fluorene-2,7-diyl)bis(4,4,5,5-tetramethyl-1,3,2-dioxaborane).

Mw of the resultant polymer was $2.5 \times 10^5$, and the molecular weight distribution expressed by Mw/Mn thereof was 4.5.

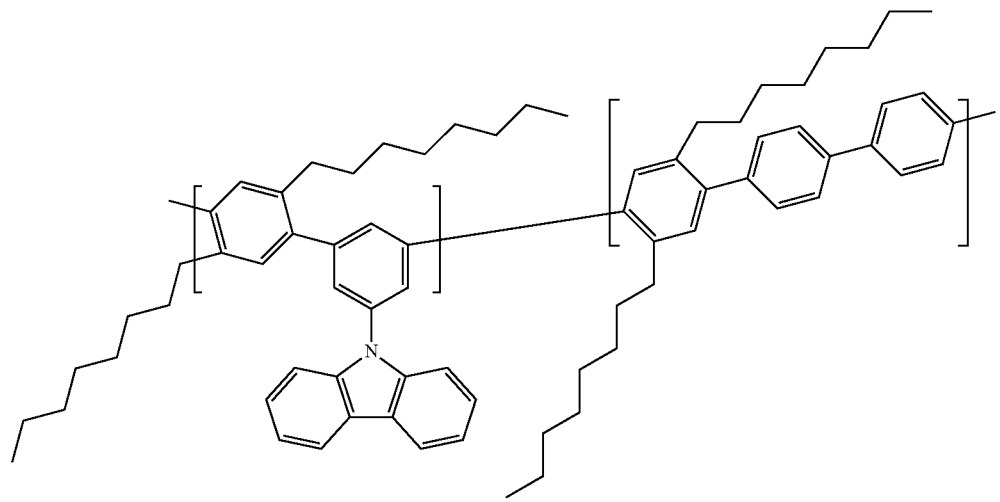

Example 8

Synthesis of copolymer of 9,9-dioctylfluorene, 5-(-9-carbazolyl)-1,3-(bispyrimidin-2-yl)benzene and 2,2'-bipyridine 2.525 of a polymer having a repeating unit mentioned below was produced according to the same method as in Example 6 except that 0.937 g of [5-(9-carbazolyl)-1,3-bis(2-chloropyrimidin-5-yl)benzene synthesized in Synthesis Example 2 [MW 468.30; 2.0 mmol] was used in place of 0.853 g of (3,6-di-tert-butylcarbazol-9-yl)-4,6-dichloropyrimidine Mw of the resultant polymer was $1.1 \times 10^5$, and the molecular weight distribution expressed by Mw/Mn thereof was 3.1.

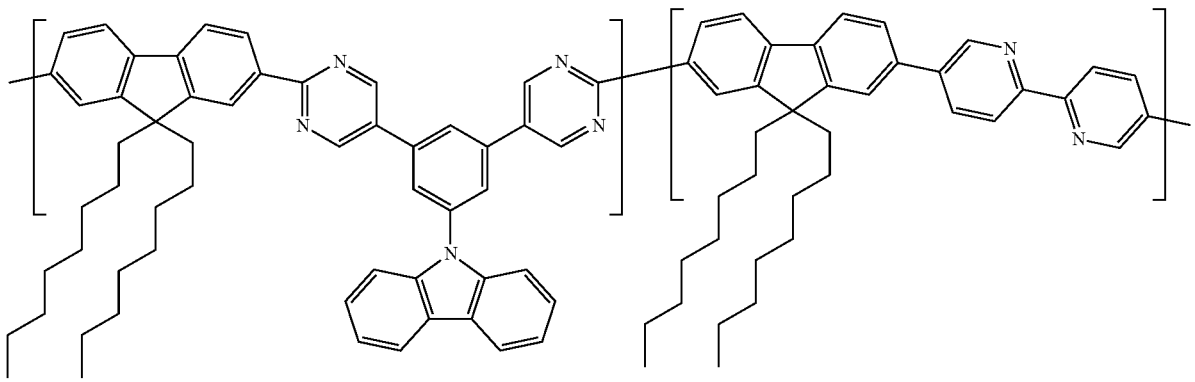

Example 9

Synthesis of copolymer of 9,9-dioctylfluorene and 1,2-biphenylbenzimidazole 2.499 of a polymer having a repeating unit mentioned below was produced according to the same method as in Example 1 except that 1.712 g of 2-(3,5-dibromophenyl)-1-phenyl-1H-benzimidazole (by Aglaia Technology) [MW 428.12; 4.0 mmol] was used in place of 1.604 g of 9-(3,5-dibromophenyl)-9H-carbazole.

Mw of the resultant polymer was $3.0 \times 10^5$, and the molecular weight distribution expressed by Mw/Mn thereof was 10.0.

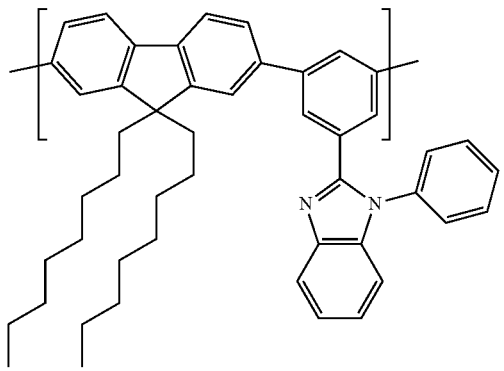

Example 10

Synthesis of copolymer of 9,9-dioctylfluorene and 2,4,6-triphenylpyrimidine 2.654 of a polymer having a repeating unit mentioned below was produced according to the same method as in Example 1 except that 1.865 g of 4-(3,5-dibromophenyl)-2,6-diphenylpyrimidine (by Aglaia Technology) [MW 466.17; 4.0 mmol] was used in place of 1.604 g of 9-(3,5-dibromophenyl)-9H-carbazole.

Mw of the resultant polymer was $3.3 \times 10^5$, and the molecular weight distribution expressed by Mw/Mn thereof was 12.0.

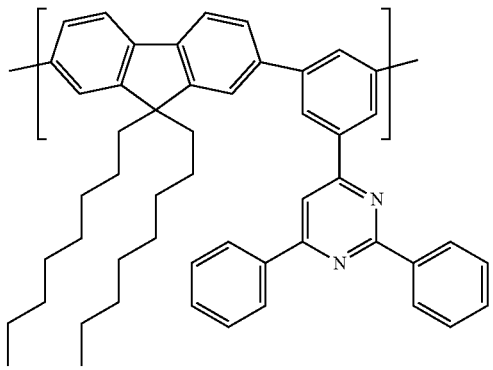

Example 11

Synthesis of copolymer of 9,9-dioctylfluorene, phenylcarbazole and phenanthrene 2.196 of a polymer having a repeating unit mentioned below was produced according to the same method as in Example 2 except that 0.672 g of 2,7-dibromophenanthrene (by Aglaia Technology) [MW 336.02; 2 mmol] was used in place of 0.624 g of 4,4'-dibromobiphenyl.

Mw of the resultant polymer was $1.5 \times 10^5$, and the molecular weight distribution expressed by Mw/Mn thereof was 4.2.

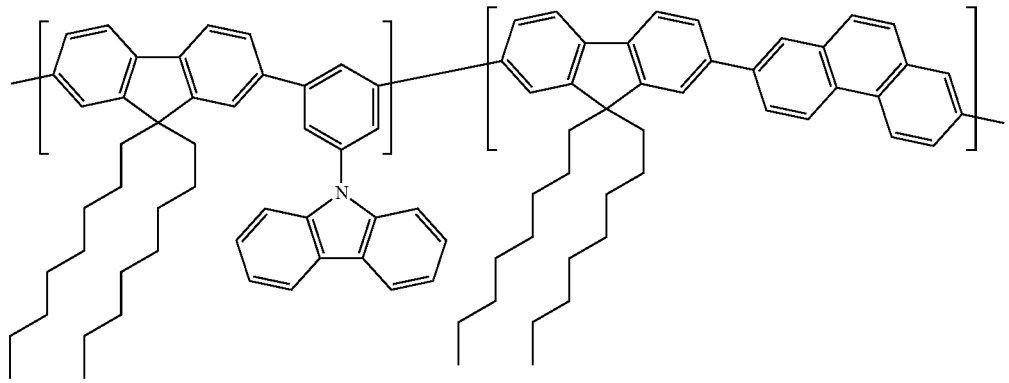

Example 12

Synthesis of copolymer of 9,9-dioctylfluorene, phenylcarbazole and phenanthroline 2.293 of a polymer having a repeating unit mentioned below was produced according to the same method as in Example 2 except that 0.676 g of 3,8-dibromophenanthroline (by Aglaia Technology) [MW 338.00; 2 mmol] was used in place of 0.624 g of 4,4'-dibromobiphenyl.

Mw of the resultant polymer was $1.4 \times 10^5$, and the molecular weight distribution expressed by Mw/Mn thereof was 3.9.

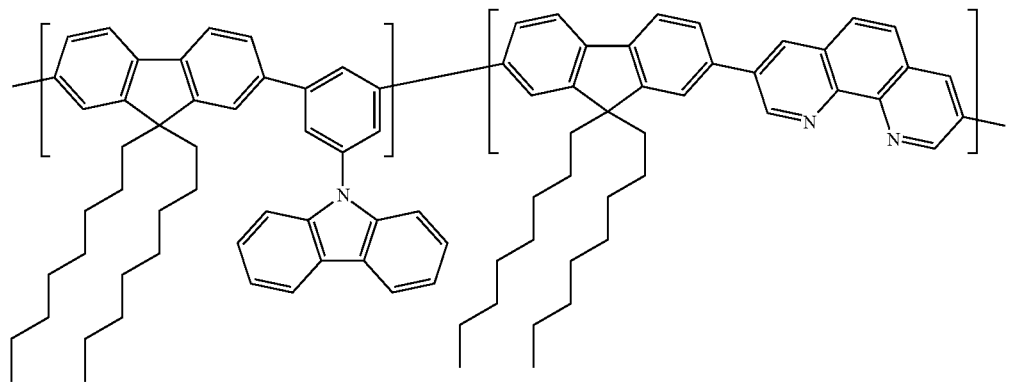

Example 13

<Production of Organic EL Device Using Organic EL Device Material Solution>
(Production of PEDOT:PSS Coated Substrate)

An aqueous dispersion of PEDOT:PSS (H. C. Starck's Clevious A14083), water and isopropyl alcohol were mixed in a ratio of 5/3/2 to prepare a PEDOT:PSS dispersion. An ITO substrate of 25 mm×25 mm×0.7 mm with an electrode wiring pattern formed thereon (by Geomatec) was ultrasonically washed for 5 minutes in isopropyl alcohol, and further UV (ultraviolet)-ozone washed for 30 minutes, and then the previous PEDO:PSS dispersion was applied thereto to form a film having a thickness of 40 nm, according to a spin coating method. After the film formation, this was taken out and the electrode part was wiped away with water, and thereafter baked in air at 200° C. for 30 minutes to prepare a PEDOT:PSS coated substrate.

(Preparation of Organic EL Device Material Solution and Formation of Organic EL Light-emitting Layer)

As a solvent, used here was dewatered toluene that had been purified through distillation; as a host, the polymer prepared in Example 4 was used; and as a dopant, Ir(n-BuPPy)$_3$ mentioned below was added in an amount of 15% by mass relative to the host. These were stirred under heat at 90° C. to prepare a solution having a total solid content of 1.8% by mass. Next, using this solution, an organic EL light-emitting layer was formed on the above-mentioned, PEDOT:PSS coated substrate according to a spin coating method (500 rpm×3 sec, next 2200 rpm×60 sec). After the formation of the organic EL light-emitting layer, this was taken out, the electrode part was wiped away with toluene, and thereafter this was heated and dried on a hot plate at 100° C. for 30 minutes. Preparing the solution and forming the organic EL light-emitting layer was carried out all in a nitrogen atmosphere in a glove box.

(Production of Organic EL Device)

The substrate having the organic EL light-emitting layer formed thereon was placed on a substrate holder in a vacuum evaporation apparatus, and the following compound A as an electron-transporting material was applied thereto at a vapor deposition rate of 1 angstrom/sec to form thereon a film having a thickness of 20 nm. Subsequently, lithium fluoride (LiF) was applied thereto at a vapor deposition rate of 0.1 angstrom/sec to form thereon a film having a thickness of 1 nm, and aluminium (Al) was applied thereto at 3 angstrom/sec to form a film having a thickness of 150 nm.

(Method of Evaluation of Organic EL Device)

The organic EL device produced in the above was driven with direct current for light emission, and the voltage (V) and the emission efficiency (cd/A) at a current density of 1 mA/cm$^2$, as well as the life of the device until the brightness thereof reduced to 50% (LT50, initial brightness 5000 cd/cm$^2$) were measured. As a result of evaluation thereof, the device was confirmed to have organic EL characteristics of 32 cd/A [CIE chromaticity (0.32, 0.64)] at 6.5 V, and LT50: 120 hours.

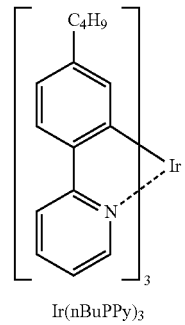

Ir(nBuPPy)$_3$

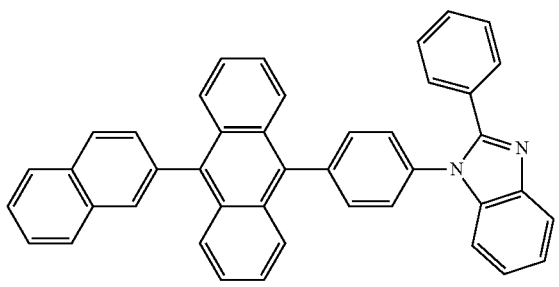

Compound A

What is claimed is:

1. A polymer compound, which comprises a copolymer comprising a unit B, and a unit A and/or a unit C, and which has a weight-average molecular weight of from 50,000 to 1,500,000, wherein:
   the unit A is a unit comprising, in a main chain thereof, a group selected from the group consisting of an aromatic hydrocarbon cyclic group and an aromatic heterocyclic group, where the groups may be substituted, and
   the unit B is a divalent unit of formula (b1), (b2), b3), or (b4):

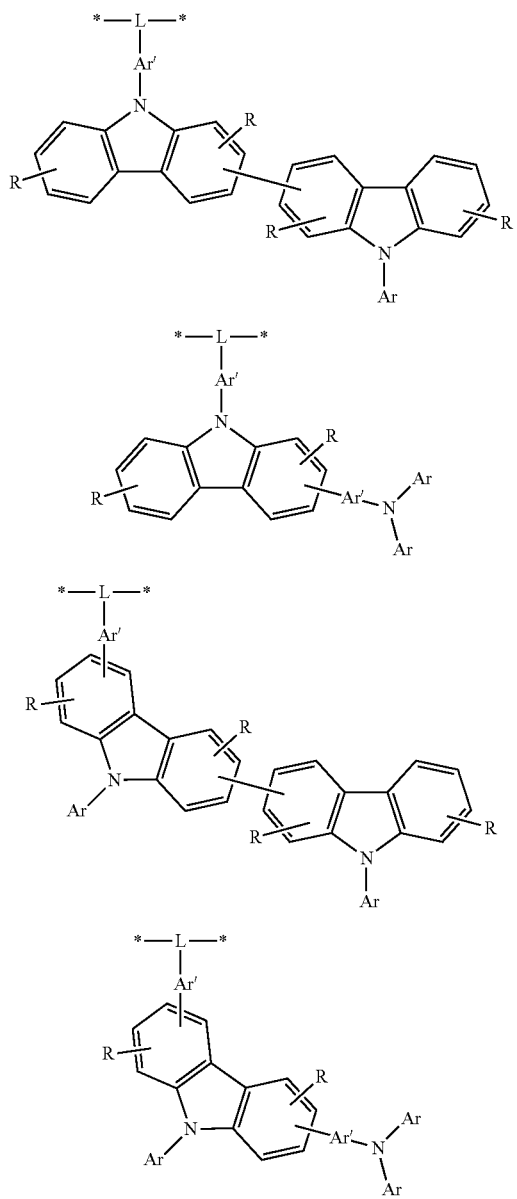

wherein in the formulae (b1), (b2), (b3), and (b4), * is a position at which the formula bonds to the unit A, B or C;

L is a linking group that constitutes the polymer main chain and bonds the structure of the formula (b1), the formula (b2), the formula (b3), or the formula (b4) except L and the polymer main chain, and is a substituted or unsubstituted aromatic hydrocarbon cyclic group, a substituted or unsubstituted aromatic heterocyclic group, or a combination thereof; with the proviso that when L is an aromatic heterocyclic group comprising an N atom, a number of the N atoms in the atoms constituting one ring of the group is 1 or 2;

each R is independently a substituted or unsubstituted, linear or branched alkyl group having a carbon number of from 1 to 20, a substituted or unsubstituted cycloalkyl group having a ring carbon atoms of from 3 to 16, a substituted or unsubstituted alkyl ether group having a carbon number of from 1 to 20, a substituted or unsubstituted aryl group having a ring carbon atoms of from 6 to 30, a substituted or unsubstituted alkoxy group having a carbon number of from 1 to 20, a substituted or unsubstituted cycloalkoxy group having a ring carbon atoms of from 3 to 10, a substituted or unsubstituted aryloxy group having a ring carbon atoms of from 6 to 30, a substituted or unsubstituted aralkyl group having a carbon number of from 7 to 40, a substituted or unsubstituted heteroaryl group having a ring atoms of from 3 to 30, a substituted or unsubstituted alkylamino group, a substituted or unsubstituted arylamino group, a substituted silyl group substituted with an aryl group and/or an alkyl group, a halogen atom, a nitro group, a cyano group or a hydroxyl group; and Ar is a substituted or unsubstituted monovalent aromatic hydrocarbon cyclic group having a ring carbon atoms of from 6 to 30, or a substituted or unsubstituted monovalent aromatic heterocyclic group having a ring atoms of from 5 to 30, Ar' is a substituted or unsubstituted divalent aromatic hydrocarbon cyclic group having a ring carbon atoms of from 6 to 30 or a substituted or unsubstituted divalent aromatic heterocyclic group having a ring atoms of from 5 to 30, the unit C is a unit constituting the polymer main chain and represented by formula (3), (4) or (5); where in the case of formula (5), the formula bonds to the neighboring unit at any of $Z_5$, $Z_6$, $X_3$ and $Y_3$:

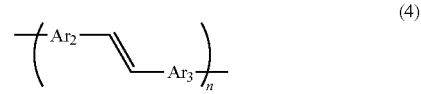

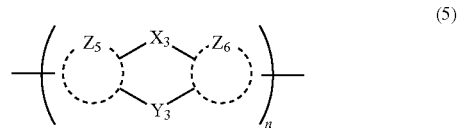

wherein in the formulae (3), (4), and (5), $Ar_1$ to $Ar_3$ are each independently a substituted or unsubstituted aromatic hydrocarbon cyclic group, or a substituted or unsubstituted aromatic heterocyclic group;

$X_3$ and $Y_3$ are each independently a single bond, $CR^1_2$, $NR^1$, O, S, or $SiR^1_2$;

$R^1$ is a hydrogen atom, a substituted or unsubstituted alkyl group, a substituted or unsubstituted cycloalkyl group, a substituted or unsubstituted aromatic hydrocarbon cyclic group, or a substituted or unsubstituted aromatic heterocyclic group;

$Z_5$ and $Z_6$ are each independently a substituted or unsubstituted aliphatic hydrocarbon cyclic group, a substituted or unsubstituted aliphatic heterocyclic group, a substituted or unsubstituted divalent aromatic hydrocarbon cyclic group, or a substituted or unsubstituted aromatic heterocyclic group; and n is an integer of from 1 to 50, and when n is 2 or more, the parenthesized moieties may be the same or different.

2. The polymer compound according to claim 1, wherein the unit A is present and the unit A has an unsubstituted alkyl group having a carbon number of from 3 to 16, an alkyl group having one or more phenyl group and having a carbon number of from 1 to 4, a cycloalkyl group having a ring carbon atoms of from 3 to 16 and unsubstituted or substituted with an alkyl group having a carbon number of from 1 to 6, a linear or branched alkyl ether group having a carbon number of from 1 to 20, or a substituted silyl group substituted with at least group selected from the group consisting of alkyl and aryl.

3. The polymer compound according to claim 1, wherein the unit C is present and the unit C is represented by any of the following formulae (1) to (10):

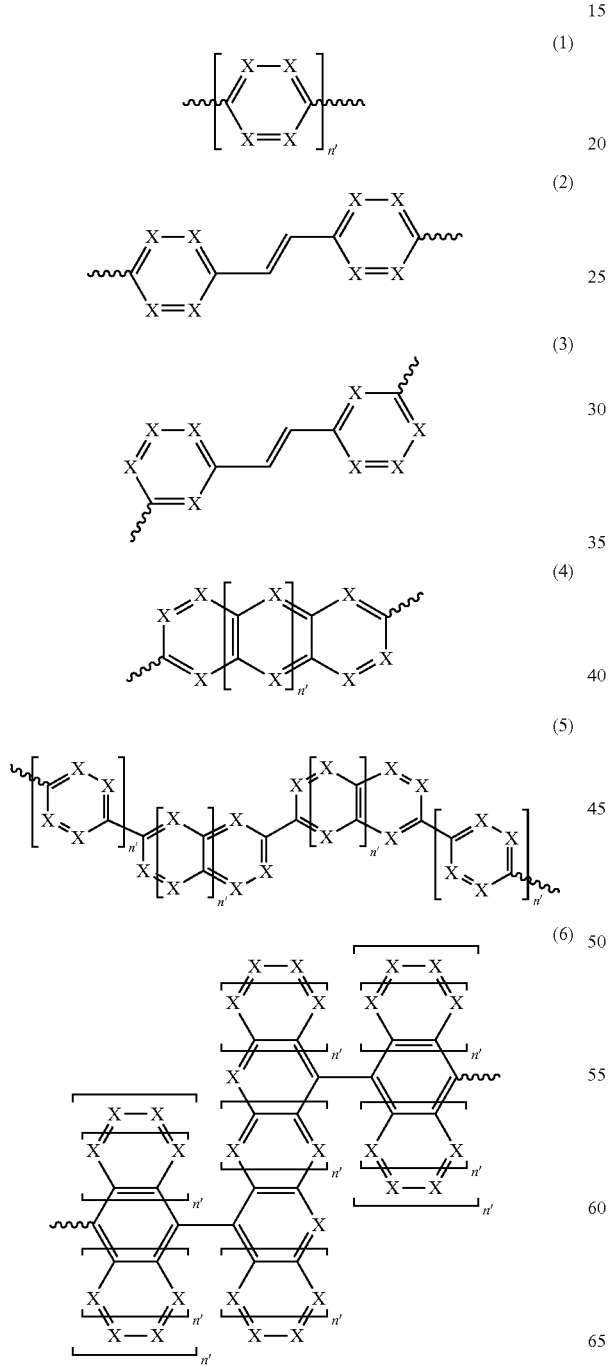

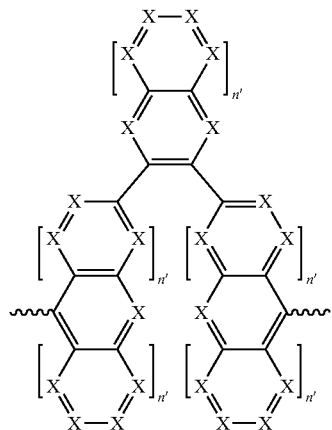

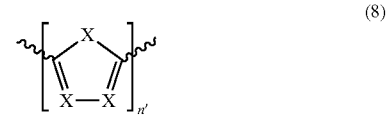

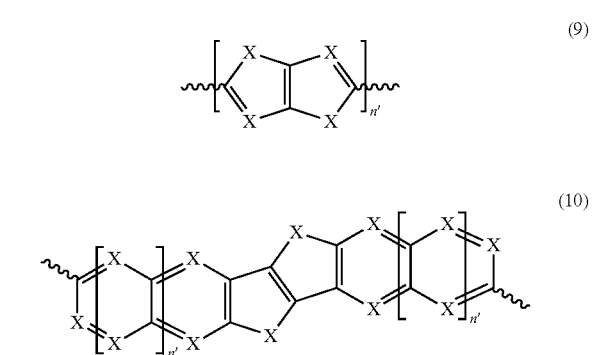

wherein

X is $CR^3$,

X' is $CR^3_2$, a nitrogen atom in a divalent case $NR^3$, a phosphorus atom in a divalent case $PR^3$, PO in a divalent case, $P(=O)R^3$, O in a divalent case, S in a divalent case, or $SiR^3_2$ in a divalent case, $R^3$ is a hydrogen atom, a substituted or unsubstituted alkyl group having a carbon number of from 1 to 20, a substituted or unsubstituted cycloalkyl group having a ring carbon atoms of from 3 to 16, a substituted or unsubstituted aryl group having a ring carbon acorns of from 6 to 30, or a substituted or unsubstituted heteroaryl group having a ring atoms of from 5 to 30;

multiple $R^3$'s may bond to form a ring; and n' is an integer of from 0 to 5;

with the proviso that instances in which a ring is not formed when n' is 0 are excluded.

4. The polymer compound according to claim 1, wherein L, in formulae (b1) to (b4), is a substituted or unsubstituted benzene ring, pyridine ring or pyrimidine ring that bonds at the 1,3-positions to form a main chain, or a structure of formula (a):

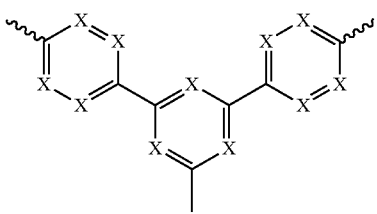

(a)

wherein X is independently N or CH; and X's on one aromatic ring are not N at the same time, with the proviso that when L is a benzene ring, the 2-position of the benzene ring is unsubstituted.

5. The polymer compound according to claim 1, which is a polymer compound having the A, the unit B and the unit C.

6. A material for electronic device, comprising the polymer compound according to claim 1.

7. A material for organic electroluminescent devices, comprising the polymer compound according to claim 1.

8. An organic electroluminescent device, comprising an anode, a cathode and an organic thin film layer, wherein the organic thin film layer comprises the polymer compound according to claim 1.

9. The organic electroluminescent device according to claim 8, comprising a light-emitting layer as the organic thin film layer and the light-emitting layer comprises the polymer compound.

10. A coating liquid comprising the polymer compound according to claim 1 and a solvent.

11. A method for producing an organic electroluminescent device, comprising applying the coating liquid according to claim 10.

12. The method for producing an organic electroluminescent device according to claim 11, comprising forming a thin film with the coating liquid by a wet film formation method.

* * * * *